US011696496B2

(12) United States Patent
Kim et al.

(10) Patent No.: US 11,696,496 B2
(45) Date of Patent: Jul. 4, 2023

(54) ORGANIC LIGHT-EMITTING DEVICE

(71) Applicant: SAMSUNG DISPLAY CO., LTD., Yongin-si (KR)

(72) Inventors: Seulong Kim, Yongin-si (KR); Younsun Kim, Yongin-si (KR); Dongwoo Shin, Yongin-si (KR); Jungsub Lee, Yongin-si (KR); Naoyuki Ito, Yongin-si (KR); Jino Lim, Yongin-si (KR); Hyein Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/177,360

(22) Filed: Jun. 9, 2016

(65) Prior Publication Data

US 2017/0179395 A1 Jun. 22, 2017

(30) Foreign Application Priority Data

Dec. 22, 2015 (KR) ........................ 10-2015-0184084

(51) Int. Cl.

*H01L 51/00* (2006.01)
*H10K 85/60* (2023.01)

(Continued)

(52) U.S. Cl.

CPC .......... *H10K 85/626* (2023.02); *C09K 11/025* (2013.01); *C09K 11/06* (2013.01);

(Continued)

(58) Field of Classification Search

CPC ............. H01L 51/0058; H01L 51/0056; H01L 51/0067; H01L 51/0071; H01L 51/0072;

(Continued)

(56) References Cited

U.S. PATENT DOCUMENTS

| | | | |
|---|---|---|---|
| 5,393,614 | A | 2/1995 | Nakada |
| 6,387,544 | B1 | 5/2002 | Thompson |

(Continued)

FOREIGN PATENT DOCUMENTS

| | | | |
|---|---|---|---|
| CN | 1708475 | A | 12/2005 |
| CN | 101079472 | A | 11/2007 |

(Continued)

OTHER PUBLICATIONS

Rodrigo, et al., "Cancentrine. IV. Acetolysis Products of Cancentrine Methiodide" Canadian Journal of Chemistry, 50, 3900-3910 (1972).

(Continued)

*Primary Examiner* — John E Uselding

(74) *Attorney, Agent, or Firm* — Lewis Roca Rothgerber Christie LLP

(57) ABSTRACT

An organic light-emitting device including a first electrode; a second electrode facing the first electrode; an emission layer between the first electrode and the second electrode; a hole transport region between the first electrode and the emission layer; and an electron transport region between the emission layer and the second electrode, wherein: the emission layer includes a first compound, at least one of the hole transport region and the electron transport region includes a second compound, the first compound is represented by (Continued)

Formula 1A or 1B, and the second compound is represented by Formula 2A or 2B:

<Formula 1A>

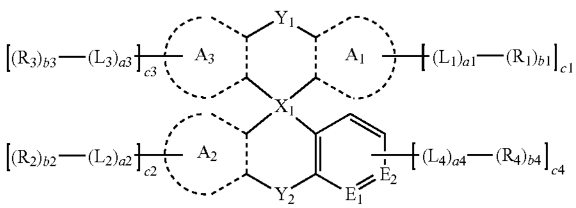

<Formula 1B>

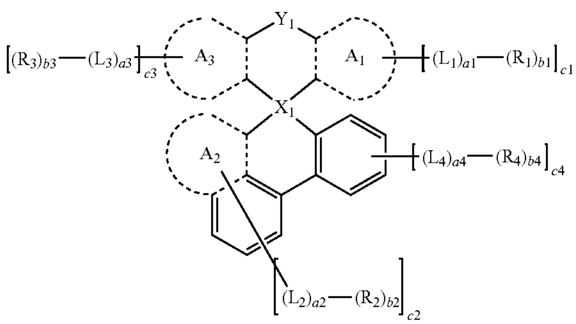

<Formula 2A>

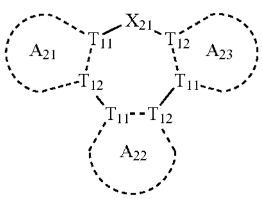

<Formula 2B>

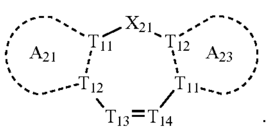

20 Claims, 2 Drawing Sheets

(51) Int. Cl.

| | |
|---|---|
| ***C09K 11/06*** | (2006.01) |
| ***C09K 11/02*** | (2006.01) |
| ***H10K 50/11*** | (2023.01) |
| ***H10K 85/30*** | (2023.01) |
| *H01G 9/20* | (2006.01) |
| *H10K 50/13* | (2023.01) |
| *H10K 50/15* | (2023.01) |
| *H10K 50/16* | (2023.01) |
| *H10K 50/155* | (2023.01) |
| *H10K 101/10* | (2023.01) |
| *H10K 101/30* | (2023.01) |
| *H10K 101/00* | (2023.01) |

(52) U.S. Cl.

CPC ........... *H10K 50/11* (2023.02); *H10K 85/342* (2023.02); *H10K 85/624* (2023.02); *H10K 85/654* (2023.02); *H10K 85/657* (2023.02); *H10K 85/6572* (2023.02); *H10K 85/6574* (2023.02); *H10K 85/6576* (2023.02); *C09K 2211/1007* (2013.01); *C09K 2211/1029* (2013.01); *C09K 2211/185* (2013.01); *H01G 9/2013* (2013.01); *H10K 50/13* (2023.02); *H10K 50/15* (2023.02); *H10K 50/155* (2023.02); *H10K 50/16* (2023.02); *H10K 2101/10* (2023.02); *H10K 2101/30* (2023.02); *H10K 2101/90* (2023.02)

(58) Field of Classification Search

CPC ............. H01L 51/0073; H01L 51/0074; H01L 51/0085; C09K 11/025; C09K 11/06

See application file for complete search history.

(56) References Cited

U.S. PATENT DOCUMENTS

| | | | |
|---|---|---|---|
| 7,833,632 B2 | 11/2010 | Kawamura et al. | |
| 8,154,195 B2 | 4/2012 | Nishimura et al. | |
| 8,512,875 B2 | 8/2013 | Kawamura et al. | |
| 8,859,111 B2 | 10/2014 | Parham et al. | |
| 9,076,978 B2 | 7/2015 | Lee et al. | |
| 9,093,652 B2 | 7/2015 | Jung et al. | |
| 9,224,969 B2 | 12/2015 | Song et al. | |
| 9,331,287 B2 | 5/2016 | Hong et al. | |
| 9,520,567 B2 | 12/2016 | Lee et al. | |
| 9,691,991 B2 | 6/2017 | Hong et al. | |
| 10,164,195 B2 | 12/2018 | Kim et al. | |
| 10,297,756 B2 | 5/2019 | Lee et al. | |
| 2002/0096995 A1 | 7/2002 | Mishima et al. | |
| 2003/0039858 A1 | 2/2003 | Igarashi et al. | |
| 2003/0072965 A1 | 4/2003 | Kimura | |
| 2003/0157364 A1 | 8/2003 | Senoo et al. | |
| 2005/0089717 A1 | 4/2005 | Cosimbescu et al. | |
| 2006/0061265 A1 | 3/2006 | Kawamura et al. | |
| 2006/0105202 A1 | 5/2006 | Kitamura | |
| 2006/0269781 A1 | 11/2006 | Lai et al. | |
| 2007/0054151 A1 | 3/2007 | Iwakuma et al. | |
| 2007/0200490 A1 | 8/2007 | Kawamura et al. | |
| 2007/0215867 A1 | 9/2007 | Kawakami et al. | |
| 2007/0267958 A1 | 11/2007 | Kitazawa et al. | |
| 2007/0273273 A1 | 11/2007 | Kim et al. | |
| 2008/0138654 A1 | 6/2008 | Kathirgamanathan et al. | |
| 2009/0009065 A1 | 1/2009 | Nishimura et al. | |
| 2009/0045730 A1 | 2/2009 | Nishimura et al. | |
| 2009/0096357 A1 | 4/2009 | Lee et al. | |
| 2009/0309492 A1 | 12/2009 | Hofmann et al. | |
| 2010/0289008 A1* | 11/2010 | Jang | H01L 51/5052 257/40 |
| 2011/0156013 A1 | 6/2011 | Kim et al. | |
| 2011/0315965 A1 | 12/2011 | Takashima et al. | |
| 2012/0091438 A1 | 4/2012 | Yabunouchi et al. | |
| 2012/0104940 A1 | 5/2012 | Shin et al. | |
| 2012/0153268 A1 | 6/2012 | Kawamura et al. | |
| 2012/0217492 A1 | 8/2012 | Kim et al. | |
| 2012/0235123 A1 | 9/2012 | Lee et al. | |
| 2012/0256174 A1 | 10/2012 | Jung et al. | |
| 2013/0207082 A1 | 8/2013 | Cho et al. | |
| 2014/0027744 A1 | 1/2014 | Yoshida et al. | |
| 2014/0054564 A1 | 2/2014 | Kim et al. | |
| 2014/0159005 A1 | 6/2014 | Kawamura et al. | |
| 2014/0183466 A1 | 7/2014 | Lee et al. | |
| 2014/0197394 A1 | 7/2014 | Kim et al. | |
| 2014/0217393 A1 | 8/2014 | Kato et al. | |
| 2014/0225072 A1 | 8/2014 | Kim et al. | |
| 2014/0291631 A1 | 10/2014 | Lee et al. | |
| 2014/0336392 A1 | 11/2014 | Kim et al. | |
| 2015/0053933 A1 | 2/2015 | Lee et al. | |
| 2015/0060808 A1 | 3/2015 | Kim et al. | |
| 2015/0102301 A1 | 4/2015 | Cho et al. | |
| 2015/0155491 A1 | 6/2015 | Mujica-Fernaud et al. | |
| 2015/0171348 A1 | 6/2015 | Stoessel et al. | |
| 2015/0194610 A1 | 7/2015 | Hwang et al. | |
| 2015/0207093 A1 | 7/2015 | Kim et al. | |
| 2015/0325794 A1 | 11/2015 | Nishimura et al. | |
| 2015/0340618 A1 | 11/2015 | Lee et al. | |
| 2015/0340621 A1* | 11/2015 | Parham | H01L 51/0072 257/40 |

(56) References Cited

U.S. PATENT DOCUMENTS

| | | | |
|---|---|---|---|
| 2016/0226000 A1 | 8/2016 | Kim et al. | |
| 2016/0308146 A1 | 10/2016 | Parham et al. | |
| 2016/0322583 A1* | 11/2016 | Kim | H01L 51/0067 |
| 2016/0351825 A1 | 12/2016 | Kim et al. | |
| 2017/0179395 A1 | 6/2017 | Kim et al. | |
| 2017/0179396 A1 | 6/2017 | Kim et al. | |

FOREIGN PATENT DOCUMENTS

| | | | |
|---|---|---|---|
| CN | 101159316 | A | 4/2008 |
| CN | 101384560 | A | 3/2009 |
| CN | 101400757 | A | 4/2009 |
| CN | 102803437 | A | 11/2012 |
| CN | 103140564 | A | 6/2013 |
| CN | 103833507 | A | 6/2014 |
| CN | 103904252 | A | 7/2014 |
| CN | 104103765 | A | 10/2014 |
| CN | 104520308 | A | 4/2015 |
| CN | 104835921 | A | 8/2015 |
| CN | 106981576 | B | 1/2020 |
| EP | 2163550 | A1 | 3/2010 |
| EP | 2484665 | A1 | 8/2012 |
| EP | 2599851 | A2 | 6/2013 |
| JP | 10-88119 | A | 4/1998 |
| JP | 2002234888 | A | 8/2002 |
| JP | 2006256979 | A | 9/2006 |
| JP | 2008-177455 | A | 7/2008 |
| JP | 2008-243932 | A | 10/2008 |
| JP | 2011-100942 | A | 5/2011 |
| JP | 2015-13804 | A | 1/2015 |
| KR | 10-2007-0023676 | A | 2/2007 |
| KR | 10-2008-0080513 | A | 9/2008 |
| KR | 10-2010-0017136 | A | 2/2010 |
| KR | 10-2010-0039369 | A | 4/2010 |
| KR | 10-2010-0040901 | A | 4/2010 |
| KR | 10-2011-0008619 | A | 1/2011 |
| KR | 10-2011-0106193 | A | 9/2011 |
| KR | 10-2011-0117549 | | 10/2011 |
| KR | 10-2012-0022861 | A | 3/2012 |
| KR | 10-2012-0052316 | A | 5/2012 |
| KR | 10-2012-0092550 | A | 8/2012 |
| KR | 10-2012-0092555 | A | 8/2012 |
| KR | 10-2012-0100709 | A | 9/2012 |
| KR | 10-2013-0028813 | A | 3/2013 |
| KR | 10-2013-0093327 | A | 8/2013 |
| KR | 10-2013-0098225 | A | 9/2013 |
| KR | 10-2013-0098229 | A | 9/2013 |
| KR | 10-2014-0034709 | A | 3/2014 |
| KR | 10-2014-0074286 | A | 6/2014 |
| KR | 10-2014-0085110 | A | 7/2014 |
| KR | 10-2014-0087882 | A | 7/2014 |
| KR | 10-2014-0102089 | A | 8/2014 |
| KR | 10-2014-0103007 | A | 8/2014 |
| KR | 10-2014-0119642 | A | 10/2014 |
| KR | 10-2014-0128653 | A | 11/2014 |
| KR | 10-2014-0135525 | A | 11/2014 |
| KR | 10-2015-0001101 | | 1/2015 |
| KR | 10-2015-0008678 | A | 1/2015 |
| KR | 10-2015-0021861 | A | 3/2015 |
| KR | 10-2015-0024491 | A | 3/2015 |
| KR | 10-2015-0026114 | A | 3/2015 |
| KR | 10-2015-0034612 | A | 4/2015 |
| KR | 10-2015-0037119 | A | 4/2015 |
| KR | 10-2015-0039136 | A | 4/2015 |
| KR | 10-2015-0041931 | A | 4/2015 |
| KR | 10-2015-0070897 | A | 6/2015 |
| KR | 10-2015-0077284 | A | 7/2015 |
| KR | 10-2015-0080966 | A | 7/2015 |
| KR | 10-2015-0081736 | A | 7/2015 |
| KR | 10-2015-0086095 | A | 7/2015 |
| KR | 10-2015-0088066 | A | 7/2015 |
| KR | 10-2015-0103945 | A | 9/2015 |
| KR | 10-2015-0121394 | A | 10/2015 |
| KR | 10-2015-0124609 | A | 11/2015 |
| KR | 10-2016-0094834 | | 8/2016 |
| WO | 00/033617 | A1 | 6/2000 |
| WO | WO 2004/041774 | A1 | 5/2004 |
| WO | WO 2007/029403 | A1 | 3/2007 |
| WO | WO 2007/063986 | A1 | 6/2007 |
| WO | WO 2011/010839 | A1 | 1/2011 |
| WO | WO 2011/055932 | A2 | 5/2011 |
| WO | 2012/005364 | A1 | 1/2012 |
| WO | WO 2012/015274 | A2 | 2/2012 |
| WO | WO 2012/070233 | A1 | 5/2012 |
| WO | WO 2013/035329 | A1 | 3/2013 |
| WO | WO 2013/039184 | A1 | 3/2013 |
| WO | WO 2013/182263 | A1 | 12/2013 |
| WO | WO 2014/094964 | A1 | 6/2014 |
| WO | 2014/129869 | A1 | 8/2014 |
| WO | WO 2015/082046 | A2 | 6/2015 |
| WO | WO 2015/093812 | A1 | 6/2015 |
| WO | WO 2015/099481 | A1 | 7/2015 |
| WO | WO 2015/133804 | A1 | 9/2015 |
| WO | WO 2015/160224 | A1 | 10/2015 |
| WO | 2015/167259 | A1 | 11/2015 |
| WO | WO 2015/190718 | A1 | 12/2015 |
| WO | 2016/058504 | A1 | 4/2016 |
| WO | 2016/122178 | A2 | 8/2016 |

OTHER PUBLICATIONS

European search report issued by the European Patent Office dated May 3, 2017 in the examination of the European Patent Application No. 16191361.1.

USPTO Office action dated Oct. 16, 2018, in U.S. Appl. No. 15/220,636.

Definition of Buffer. http://www.dictionary.com., Apr. 12, 2018.

Wei et al. "Emission Mechanism of Doubly, etc . . . ", J. Am. Chem. Soc., 2009, 131, 6698-6707, 2008.

EPO Extended Search Report dated Nov. 4, 2016, corresponding to European Patent Application No. 16191351.2 (6 pages).

EPO Extended Search Report dated May 3, 2017, corresponding to European Patent Application No. 16195460.7 (8 pages).

EPO Extended Search Report dated May 3, 2017, for corresponding European Patent Application No. 16191373.6 (6 pages).

EPO Extended Search Report dated May 2, 2017, for corresponding European Patent Application No. 16195444.1 (8 pages).

EPO Extended Search Report dated May 3, 2017, for corresponding European Patent Application No. 16191328.0.

U.S. Office Action dated Oct. 16, 2018, issued in U.S. Appl. No. 15/220,636.

U.S. Office Action dated Nov. 22, 2017, issued in U.S. Appl. No. 15/197,621.

U.S. Final Office Action dated Apr. 20, 2018, issued in U.S. Appl. No. 15/197,621.

U.S. Office Action dated Dec. 17, 2018, issued in U.S. Appl. No. 15/197,621.

U.S. Office Action dated Oct. 5, 2017, issued in U.S. Appl. No. 15/187,665.

U.S. Final Office Action dated Mar. 27, 2018, issued in U.S. Appl. No. 15/187,665.

U.S. Office Action dated Oct. 25, 2018, issued in U.S. Appl. No. 15/187,665.

U.S. Office Action dated Feb. 22, 2018, issued in U.S. Appl. No. 15/284,371.

U.S. Notice of Allowance dated Jul. 18, 2018, issued in U.S. Appl. No. 15/284,371.

U.S. Office Action dated Oct. 19, 2017, issued in U.S. Appl. No. 15/192,848.

U.S. Office Action dated Apr. 23, 2018, issued in U.S. Appl. No. 15/192,848.

U.S. Office Action dated Dec. 4, 2018, issued in U.S. Appl. No. 15/192,848.

U.S. Office Action dated Feb. 21, 2019, issued in U.S. Appl. No. 15/292,040.

U.S. Office Action dated Apr. 4, 2019, issued in U.S. Appl. No. 15/294,618.

U.S. Final Office Action dated Apr. 19, 2019, issued in U.S. Appl. No. 15/187,665.

(56) References Cited

OTHER PUBLICATIONS

U.S. Final Office Action dated May 14, 2019, issued in U.S. Appl. No. 15/192,848.
U.S. Office Action dated Mar. 28, 2019, issued in U.S. Appl. No. 15/220,636.
English machine translation of CN 104835921 A, published Aug. 12, 2015, 28 pages.
English machine translation of WO2015133804 A1, published Sep. 11, 2015, 28 pages.
Office Action dated Jun. 27, 2019 by the USPTO in cross-reference U.S. Appl. No. 15/220,636, 11 pages.
Ran, Xue-Qin et al., "Structural, electronic, and optical properties of doubly ortho-linked quinoxaline/diphenylfluorene hybrids", Journal of Physical Organic Chemistry, Nov. 9, 2010, pp. 646-656, John Wiley & Sons, Ltd.
Office Action issued in U.S. Appl. No. 15/192,848 by the USPTO, dated Nov. 20, 2019, 23 pages.
Office Action issued in U.S. Appl. No. 15/220,636 by the USPTO, dated Dec. 2, 2019, 11 pages.
Office Action issued in U.S. Appl. No. 15/220,636 by the USPTO, dated Mar. 12, 2020, 12 pages.
Koene, Bryan E., et al.; Asymmetric Triaryldiamines as Thermally Stable Hole Transporting Layers for Organic Light-Emitting Devices, American Chemical Society, 1998, Chemical Materials, vol. 10, pp. 2235-2250.
Office Action issued in U.S. Appl. No. 15/292,040 by the USPTO, dated Dec. 16, 2019, 16 pages.
Office Action issued in U.S. Appl. No. 15/294,638 by the USPTO, dated Dec. 17, 2019, 14 pages.
Machine English Translation of Enomoto et al. (JP 10088119 A). Jun. 18, 2020.
U.S. Final Office action dated Apr. 10, 2020, issued in U.S. Appl. No. 15/192,848 (21 pages).
U.S. Final Office Action dated Jun. 23, 2020, issued in U.S. Appl. No. 15/292,040 (17 pages).
Hu, J-Y and Yamato, T. Synthesis and photophysical properties of pyrene-based multiply conjugated shaped light-emitting architectures: toward efficient organic-light-emitting diodes. Organic Light Emitting Diode—Material, Process and Devices. InTech. Chapter 2, pp. 21-60. Jul. 27, 2011. (Year: 2011).
U.S. Office Action dated Jul. 31, 2020, issued in U.S. Appl. No. 15/187,665 (16 pages).
Machine Translation of JP 2008-243932 A. Oct. 9, 2008. (Year: 2008).
Machine Translation of WO 2014/129869 A1. Aug. 28, 2014. (Year: 2014).
Definition of alkylenes. IUPAC Compendium of Chemical Terminology. 2014. (Year: 2014).
U.S. Advisory Action dated Aug. 24, 2020, issued in U.S. Appl. No. 15/197,621, 8 pages, citing all the references listed above.
U.S. Office Action dated Sep. 30, 2020, issued in U.S. Appl. No. 15/192,848, citing references listed above (37 pages).
U.S. Office Action dated Oct. 2, 2020, issued in U.S. Appl. No. 15/197,621, citing a reference listed above (26 pages).
Machine English translation of Huang et al. (WO-2016/058504 A1 ). Nov. 16, 2020.
Google Patents translation for WO 2016/122178 A2 (publication date: Aug. 2016). (Year: 2016).
U.S. Office Action dated Nov. 19, 2020, issued in U.S. Appl. No. 15/292,040 (17 pages).
U.S. Office Action dated Dec. 7, 2020, issued in U.S. Appl. No. 15/220,636 (10 pages).
European Patent Office Summons to attend oral proceedings pursuant to Rule 115(1) EPC, for European Patent Application No. 16191351.2, issued Sep. 8, 2020, 5 pages.
U.S. Final Office action dated Mar. 8, 2021, issued in U.S. Appl. No. 15/192,848 (29 pages).
Machine English translation of Mizuki et al. (JP 2015013804 A). May 20, 2021.
Machine Translation of KR 10-2015-0121394 A. Oct. 29, 2015. (Year: 2015).
Dyes and Pigments, vol. 114, (2015), pp. 184-195. (Year: 2015).
U.S. Advisory Action dated Mar. 29, 2021, issued in U.S. Appl. No. 15/187,665 (6 pages).
U.S. Final Office Action dated Mar. 29, 2021, issued in U.S. Appl. No. 15/197,621 (29 pages).
U.S. Final Office Action dated May 4, 2021, issued in U.S. Appl. No. 15/294,638 (18 pages).
U.S. Notice of Allowance dated May 5, 2021, issued in U.S. Appl. No. 15/220,636 (9 pages).
U.S. Final Office Action dated May 25, 2021, issued in U.S. Appl. No. 15/292,040 (16 pages).
U.S. Advisory Action dated Jun. 2, 2021, issued in U.S. Appl. No. 15/197,621 (6 pages).
Machine Translation of WO2016/122178A. Aug. 4, 2016 (Year: 2016).
Application KR10-2015-0012223. Filed Jan. 6, 2015. (Year: 2015).
Machine Translation of KR20160091735A, corresponding to application KR10-2015-0012223. Filed Jan. 6, 2015. (Year 2015).
U.S. Office Action dated Jun. 28, 2021, issued in U.S. Appl. No. 15/192,848 (23 pages).
Machine Translation of KR2015-0124609A. Nov. 6, 2015. (Year: 2015).
U.S. Final Office Action dated Jan. 25, 2022, issued in U.S. Appl. No. 15/197,621 (16 pages).
Chinese Office Action dated Jan. 6, 2022, issued in Chinese Patent Application No. 201911253625.8 (6 pages).
Advisory Action for U.S. Appl. No. 15/187,665 dated Apr. 13, 2020, 6 pages.
Advisory Action for U.S. Appl. No. 15/187,665 dated Jun. 28, 2019, 4 pages.
Advisory Action for U.S. Appl. No. 15/187,665 dated Jun. 6, 2018, 5 pages.
Advisory Action for U.S. Appl. No. 15/192,848 dated Jul. 5, 2019, 5 pages.
Advisory Action for U.S. Appl. No. 15/192,848 dated Jul. 9, 2018, 5 pages.
Advisory Action for U.S. Appl. No. 15/192,848 dated Jun. 17, 2020, 4 pages.
Advisory Action for U.S. Appl. No. 15/192,848 dated May 14, 2021, 4 pages.
Advisory Action for U.S. Appl. No. 15/197,621 dated Aug. 14, 2019, 5 pages.
Advisory Action for U.S. Appl. No. 15/197,621 dated Jul. 6, 2018, 4 pages.
Advisory Action for U.S. Appl. No. 15/220,636 dated Feb. 12, 2020, 3 pages.
Advisory Action for U.S. Appl. No. 15/220,636 dated May 24, 2019, 3 pages.
Advisory Action for U.S. Appl. No. 15/220,636 dated Oct. 19, 2020, 3 pages.
Advisory Action for U.S. Appl. No. 15/292,040 dated Jul. 26, 2021, 3 pages.
Advisory Action for U.S. Appl. No. 15/292,040 dated Sep. 4, 2020, 3 pages.
Advisory Action for U.S. Appl. No. 15/292,040 dated Sep. 26, 2019, 3 pages.
Advisory Action for U.S. Appl. No. 15/294,638 dated Jul. 12, 2021, 3 pages.
Advisory Action for U.S. Appl. No. 15/294,638 dated Nov. 12, 2019, 3 pages.
Advisory Action for U.S. Appl. No. 15/294,638 dated Sep. 8, 2020, 3 pages.
Final Office Action for U.S. Appl. No. 15/187,665 dated Feb. 7, 2020, 14 pages.
Final Office Action for U.S. Appl. No. 15/187,665 dated Jan. 19, 2021, 10 pages.
Final Office Action for U.S. Appl. No. 15/197,621 dated Jun. 4, 2020, 19 pages.
Final Office Action for U.S. Appl. No. 15/197,621 dated May 29, 2019, 17 pages.

(56) References Cited

OTHER PUBLICATIONS

Final Office Action for U.S. Appl. No. 15/220,636 dated Aug. 11, 2020, 13 pages.
Final Office Action for U.S. Appl. No. 15/292,040 dated Jul. 3, 2019, 11 pages.
Final Office Action for U.S. Appl. No. 15/294,638 dated Aug. 28, 2019, 18 pages.
Final Office Action for U.S. Appl. No. 15/294,638 dated Jun. 26, 2020, 11 pages.
Interview Summary for U.S. Appl. No. 15/220,636 dated Oct. 9, 2020, 3 pages.
Notice of Allowance for U.S. Appl. No. 15/220,636 dated Aug. 6, 2021, 7 pages.
Notice of Allowance for U.S. Appl. No. 15/220,636 dated Feb. 25, 2022, 5 pages.
Notice of Allowance for U.S. Appl. No. 15/220,636 dated Jun. 1, 2022, 9 pages.
Notice of Allowance for U.S. Appl. No. 15/220,636 dated Nov. 18, 2021, 5 pages.
Office Action for U.S. Appl. No. 15/187,665 dated Sep. 23, 2019, 12 pages.
Office Action for U.S. Appl. No. 15/197,621 dated Aug. 17, 2021, 17 pages.
Office Action for U.S. Appl. No. 15/197,621 dated Dec. 13, 2019, 18 pages.
Office Action for U.S. Appl. No. 15/197,621 dated Jul. 11, 2022, 27 pages.
Office Action for U.S. Appl. No. 15/292,040 dated Jun. 7, 2022, 15 pages.
Office Action for U.S. Appl. No. 15/294,638 dated May 10, 2022, 25 pages.
Office Action for U.S. Appl. No. 15/294,638 dated Nov. 30, 2020, 11 pages.
Restriction Requirement for U.S. Appl. No. 15/220,636 dated Jun. 22, 2018, 6 pages.
Restriction Requirement for U.S. Appl. No. 15/284,371 dated Nov. 27, 2017, 7 pages.
Restriction Requirement for U.S. Appl. No. 15/292,040 dated Oct. 4, 2018, 5 pages.
Wang, L. et al., "Synthesis and Characterization of Dibenzo[a,d]cyclohepten-5-one Derivates for Light-Emitting Diodes," Chinese Journal of Chemistry, vol. 33, Issue 8, Aug. 2015, pp. 948-954.
Final Rejection for U.S. Appl. No. 15/292,040 dated Dec. 2, 2022, 15 pages.
Final Office Action for U.S. Appl. No. 15/197,621 dated Nov. 14, 2022, 18 pages.
Final Office Action for U.S. Appl. No. 15/294,638 dated Oct. 5, 2022, 25 pages.
Notice of Allowance for U.S. Appl. No. 15/220,636 dated Sep. 29, 2022, 5 pages.
Advisory Action for U.S. Appl. No. 15/197,621 dated Jan. 23, 2023, 4 pages.
Advisory Action for U.S. Appl. No. 15/292,040 dated Jan. 26, 2023, 3 pages.
Advisory Action for U.S. Appl. No. 15/294,638 dated Dec. 19, 2022, 3 pages.
Chinese Office Action for CN Application No. 202010755903.6 dated Jan. 12, 2023, 13 pages.
Notice of Allowance for U.S. Appl. No. 15/220,636 dated Feb. 1, 2023, 5 pages.
Office Action for U.S. Appl. No. 15/294,638 dated Feb. 23, 2023, 20 pages.
Office Action for U.S. Appl. No. 15/197,621 dated Apr. 11, 2023, 19 pages.

* cited by examiner

ORGANIC LIGHT-EMITTING DEVICE

CROSS-REFERENCE TO RELATED APPLICATION

Korean Patent Application No. 10-2015-0184084, filed on Dec. 22, 2015, in the Korean Intellectual Property Office, and entitled: “Organic Light-Emitting Device,” is incorporated by reference herein in its entirety.

BACKGROUND

1. Field

Embodiments relate to an organic light-emitting device.

2. Description of the Related Art

Organic light-emitting devices are self-emission devices that have wide viewing angles, high contrast ratios, short response times, and excellent brightness, driving voltage, and response speed characteristics, compared to devices in the art.

The organic light-emitting device may include a first electrode disposed on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state, thereby generating light.

SUMMARY

Embodiments are directed to an organic light-emitting device.

One or more embodiments include an organic light-emitting device having a low driving voltage and high efficiency.

Additional aspects will be set forth in part in the description which follows and, in part, will be apparent from the description, or may be learned by practice of the presented embodiments.

According to one or more embodiments, an organic light-emitting device includes:

a first electrode;

a second electrode facing the first electrode;

an emission layer between the first electrode and the second electrode;

a hole transport region between the first electrode and the emission layer; and an electron transport region between the emission layer and the second electrode, wherein the emission layer includes a first compound, at least one selected from the hole transport region and the electron transport region includes a second compound, the first compound is represented by Formula 1A or 1B, and the second compound is represented by Formula 2A or 2B:

<Formula 1A>

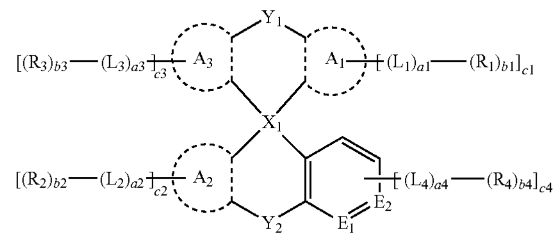

<Formula 1B>

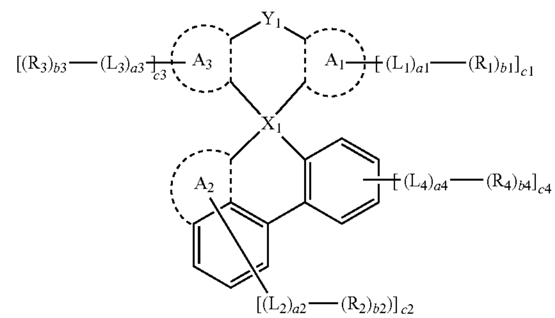

<Formula 2A>

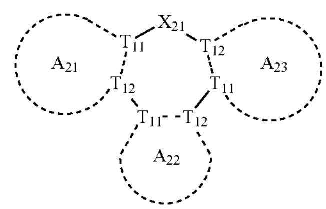

<Formula 2B>

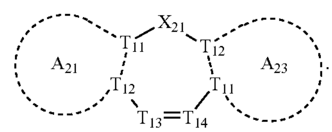

In Formulae 1A, 1B, 2A, and 2B, rings $A_1$ to $A_3$ may each independently be selected from a $C_5$-$C_{60}$ carbocyclic group and a $C_1$-$C_{60}$ heterocyclic group, rings $A_1$ to $A_3$ may each be condensed with a spiro-ring in Formulae 1A and 1B, rings $A_{21}$, $A_{22}$, and $A_{23}$ may each independently be a $C_5$-$C_{60}$ carbocyclic group or a $C_1$-$C_{60}$ heterocyclic group, each substituted with at least one *-$[(L_{22})_{a22}$-$(R_{22})_{b22}]$, $T_{11}$ and $T_{12}$ may each independently be carbon or nitrogen, two or more selected from three $T_{11}$(s) in Formula 2A may be identical to or different from each other, $T_{13}$ may be N or $C(R_{27})$, $T_{14}$ may be N or $C(R_{28})$, two or more selected from three $T_{12}$(s) in Formula 2A may be identical to or different from each other, two $T_{11}$(s) in Formula 2B may be identical to or different from each other, two $T_{12}$(s) in Formula 2B may be identical to or different from each other, $T_{11}$ and $T_{12}$ may be connected to each other via a single bond or a double bond, three $T_{11}$(s) and three $T_{12}$(s) in Formula 2A may be not all nitrogen and two $T_{11}$(s), two $T_{12}$(S), $T_{13}$, and $T_{14}$ in Formula 2B may be not all nitrogen, rings $A_{21}$, $A_{22}$, and $A_{23}$ may each be condensed (e.g., fused) with a central 7-membered ring in Formulae 2A and 2B, such that they each share a $T_{11}$ and a $T_{12}$ with the central 7-membered ring, $X_1$ may be a silicon (Si) atom or a carbon (C) atom, $Y_1$ may be selected from a single bond, $N[(L_{11})_{a11}$-$(R_{11})_{b11}]$, $C(R_{11})(R_{13})$, $Si(R_{11})(R_{13})$, O, S, and Se, $Y_2$ may be selected from a single bond, $N[(L_{12})_{a12}-(R_{12})_{b12}]$, $C(R_{12})(R_{14})$, $Si(R_{12})(R_{14})$, O, S, and Se, $E_1$ and $E_2$ may each independently be a nitrogen (N) atom, or may each independently be a carbon (C) atom substituted with $*-(L_4)_{a4}-(R_4)_{b4}$, $X_{21}$ may be selected from O, S, Se, $C(R_{23})(R_{24})$, $Si(R_{23})(R_{24})$, and $N[(L_{21})_{a21}-(R_{21})_{b21}]$, $L_1$ to $L_4$, $L_{11}$, $L_{12}$, $L_{21}$, and $L_{22}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1 to a4, a11, a12, a21, and a22 may each independently be an integer selected from 0 to 5, $R_1$ to $R_4$, $R_{11}$ to $R_{14}$, $R_{21}$ to $R_{24}$, $R_{27}$, and $R_{28}$ may each independently be selected from hydrogen, deuterium (-D), —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$, $R_{11}$ and $R_{13}$ may be optionally connected to each other to form a saturated or unsaturated ring, $R_{12}$ and $R_{14}$ may be optionally connected to each other to form a saturated or unsaturated ring, b1 to b4, b11, b12, b21, and b22 may each independently be an integer selected from 1 to 3, c1 and c2 may each independently be an integer selected from 0 to 8, and c3 and c4 may each independently be an integer selected from 0 to 4, and at least one substituent selected from the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, and $—P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, and $—P(=O)(Q_{21})(Q_{22})$; and $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted with a $C_1$-$C_{60}$ alkyl group, a $C_1$-$C_{60}$ heteroaryl group substituted with a $C_6$-$C_{60}$ aryl group, a monovalent non-aromatic condensed polycyclic group, and a monovalent non-aromatic condensed heteropolycyclic group.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
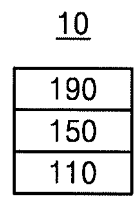
FIGS. 1 to 5 illustrate schematic views of organic light-emitting devices according to various embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

An organic light-emitting device according to an embodiment may include a first electrode, a second electrode facing the first electrode, an emission layer between the first electrode and the second electrode, a hole transport region between the first electrode and the emission layer, and an electron transport region between the emission layer and the second electrode, wherein the emission layer may include a first compound and at least one selected from the hole transport region and the electron transport region may include a second compound.

The first compound may be represented by Formula 1A or 1B, and the second compound may be represented by Formula 2A or 2B:

<Formula 1A>

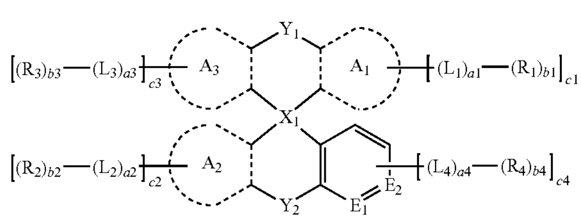

<Formula 1B>

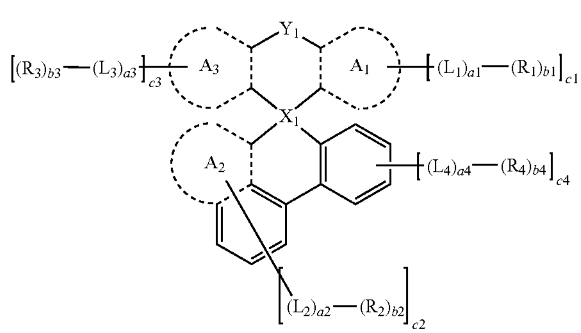

-continued

<Formula 2A>

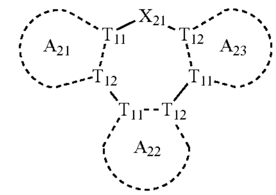

<Formula 2B>

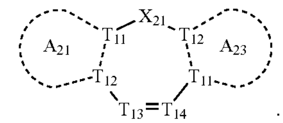

In Formulae 1A and 1B, rings $A_1$ to $A_3$ may each independently be selected from a $C_5$-$C_{60}$ carbocyclic group and a $C_1$-$C_{60}$ heterocyclic group, and rings $A_1$ to $A_3$ may each be condensed with a spiro-ring in Formulae 1A and 1B.

For example, rings $A_1$ to $A_3$ in Formulae 1A and 1B may each independently be selected from a benzene group, a naphthalene group, an anthracene group, a phenanthrene group, an indene group, an indenopyridine group, a fluorene group, a pyridine group, a pyrimidine group, a pyrazine group, a pyrrole group, an imidazole group, a quinoline group, an isoquinoline group, a quinazoline group, a phenanthroline group, a phenanthridine group, a furan group, a thiophene group, an indole group, an indolocarbazole group, a benzofuran group, a benzofurocarbazole group, a benzofuropyrimidine group, a benzothiophene group, a benzoxazole group, a benzothiazole group, a benzoimidazole group, a carbazole group, a dibenzofuran group, a dibenzothiophene group, a pyridoindole group, a dipyridofuran group, a dipyridothiophene group, a pyrimidobenzofuran group, a dipyridopyrrole group, and a pyrimidobenzothiophene group.

In various embodiments, ring $A_1$ in Formulae 1A and 1B may be selected from a benzene group, a naphthalene group, a pyridine group, a dibenzofuran group, and a pyrimidine group, and rings $A_2$ and $A_3$ may each independently be selected from a benzene group, a naphthalene group, an anthracene group, a phenanthrene group, an indene group, an indenopyridine group, a fluorene group, a pyridine group, a pyrimidine group, a pyrazine group, a pyrrole group, an imidazole group, a quinoline group, an isoquinoline group, a quinazoline group, a phenanthroline group, a phenanthridine group, a furan group, a thiophene group, an indole group, an indolocarbazole group, a benzofuran group, a benzofurocarbazole group, a benzofuropyrimidine group, a benzothiophene group, a benzoxazole group, a benzothiazole group, a benzoimidazole group, a carbazole group, a dibenzofuran group, a dibenzothiophene group, a pyridoindole group, a dipyridofuran group, a dipyridothiophene group, a pyrimidobenzofuran group, a dipyridopyrrole group, and a pyrimidobenzothiophene group.

Rings $A_{21}$, $A_{22}$, and $A_{23}$ in Formulae 2A and 2B may each independently be a $C_5$-$C_{60}$ carbocyclic group or a $C_1$-$C_{60}$ heterocyclic group, each substituted with at least one *-[$(L_{22})_{a22}$-$(R_{22})_{b22}$]. $L_{22}$, a22, $R_{22}$, and b22 are the same as described below.

$T_{11}$ and $T_{12}$ in Formulae 2A and 2B may each independently be carbon or nitrogen, two or more selected from three $T_{11}$(s) in Formula 2A may be identical to or different from each other, $T_{13}$ may be N or $C(R_{27})$, $T_{14}$ may be N or $C(R_{28})$, two or more selected from three $T_{12}$(s) in Formula 2A may be identical to or different from each other, two $T_{11}$(s) in Formula 2B may be identical to or different from each other, two $T_{12}$(S) in Formula 2B may be identical to or different from each other, $T_{11}$ and $T_{12}$ may be connected to each other via a single bond or a double bond, three $T_{11}$(s) and three $T_{12}$(s) in Formula 2A may be not all nitrogen and two $T_{11}$(s), two $T_{12}$(s), $T_{13}$, and $T_{14}$ in Formula 2B may be not all nitrogen, and rings $A_{21}$, $A_{22}$, and $A_{23}$ may each be condensed (e.g., fused) with a central 7-membered ring in Formulae 2A and 2B, such that they each share a $T_{11}$ and a $T_{12}$ with the central 7-membered ring.

*-[$(L_{22})_{a22}$-$(R_{22})_{b22}$] substituted in ring $A_{21}$, *-[$(L_{22})_{a22}$-$(R_{22})_{b22}$] substituted in ring $A_{22}$, and *-[$(L_{22})_{a22}$-$(R_{22})_{b22}$] substituted in ring $A_{23}$ may be identical to or different from one another.

In addition, when the number of *-[$(L_{22})_{a22}$-$(R_{22})_{b22}$](s) substituted in ring $A_{21}$ is two or more, two or more *-[$(L_{22})_{a22}$-$(R_{22})_{b22}$](s) may be identical to or different from each other, when the number of *-[$(L_{22})_{a22}$-$(R_{22})_{b22}$](s) substituted in ring $A_{22}$ is two or more, two or more *-[$(L_{22})_{a22}$-$(R_{22})_{b22}$](s) may be identical to or different from each other, and when the number of *-[$(L_{22})_{a22}$-$(R_{22})_{b22}$] (s) substituted in ring $A_{23}$ is two or more, two or more *-[$(L_{22})_{a22}$-$(R_{22})_{b22}$](s) may be identical to or different from each other.

In various embodiments, rings $A_{21}$, $A_{22}$, and $A_{23}$ in Formulae 2A and 2B may each independently be selected from a benzene group, a naphthalene group, an anthracene group, an indene group, a fluorene group, a pyridine group, a pyrimidine group, a pyrazine group, a pyridazine group, a quinoline group, an isoquinoline group, a pyrrole group, a pyrazole group, an imidazole group, an oxazole group, a thiazole group, a cyclopentadiene group, a silole group, a selenophene group, a furan group, a thiophene group, an indole group, a benzoimidazole group, a benzoxazole group, a benzothiazole group, an indene group, a benzosilole group, a benzoselenophene group, a benzofuran group, a benzothiophene group, a carbazole group, a fluorene group, a dibenzosilole group, a dibenzoselenophene group, a dibenzofuran group, a dibenzothiophene group, a pyrrolopyridine group, a cyclopentapyridine group, a silolopyridine group, a selenophenopyridine group, a furopyridine group, a thienopyridine group, a pyrrolopyrimidine group, a cyclopentapyrimidine group, a silolopyrimidine group, a selenophenopyrimidine group, a furopyrimidine group, a thienopyrimidine group, a pyrrolopyrazine group, a cyclopentapyrazine group, a silolopyrazine group, a selenophenopyrazine group, a furopyrazine group, a thienopyrazine group, a naphthopyrrole group, a cyclopentanaphthalene group, a naphthosilole group, a naphthoselenothiophene group, a naphthofuran group, a naphthothiophene group, a pyrroloquinoline group, a cyclopentaquinoline group, a siloloquinoline group, a selenophenoquinoline group, a furoquinoline group, a thienoquinoline group, a pyrroloisoquinoline group, a cyclopentaisoquinoline group, a siloloisoquinoline group, a selenophenoisoquinoline group, a furoisoquinoline group, a thienoisoquinoline group, an azacarbazole group, an azafluorene group, an azadibenzosilole group, an azadibenzoselenophene group, an azadibenzofuran group, an azadibenzothiophene group, an indenoquinoline group, an indenoisoquinoline group, an indenoquinoxaline group, a phenanthroline group, and a naphthoindole group, each substituted with at least one *-[$(L_{22})_{a22}$-$(R_{22})_{b22}$].

In various embodiments, in the second compound represented by Formulae 2A and 2B, a case where rings $A_{21}$, $A_{22}$, and $A_{23}$ are all a benzene group substituted with at least one *-[$(L_{22})_{a22}$-$(R_{22})_{b22}$] may be excluded.

In various embodiments, rings $A_{21}$, $A_{22}$, and $A_{23}$ in Formulae 2A and 2B may each independently be selected from groups represented by Formulae 2-1 to 2-36, each substituted with at least one *-[$(L_{22})_{a22}$-$(R_{22})_{b22}$]:

Formula 2-1

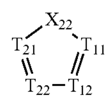

Formula 2-2

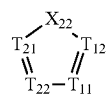

Formula 2-3

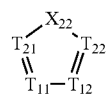

Formula 2-4

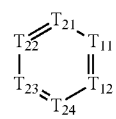

Formula 2-5

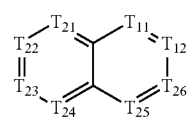

Formula 2-6

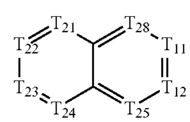

Formula 2-7

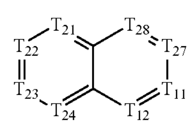

Formula 2-8

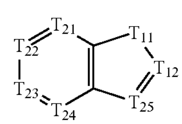

Formula 2-9

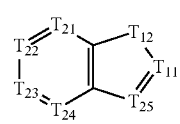

Formula 2-10

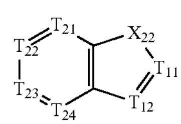

Formula 2-11

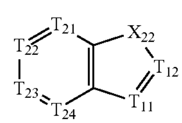

Formula 2-12

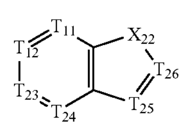

-continued
Formula 2-13
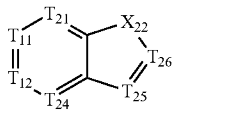
Formula 2-14
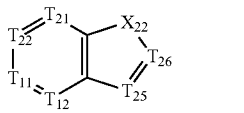
Formula 2-15
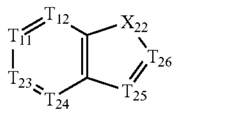
Formula 2-16
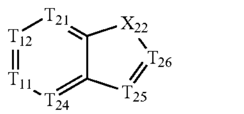
Formula 2-17
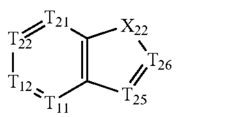
Formula 2-18
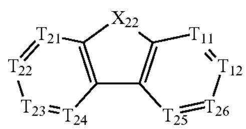
Formula 2-19
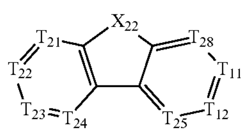
Formula 2-20
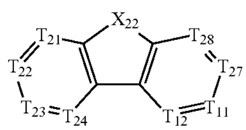
Formula 2-21
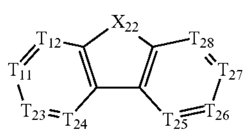
Formula 2-22
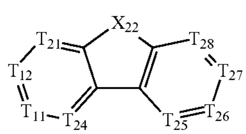
Formula 2-23
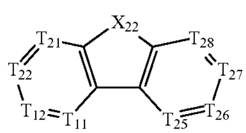
Formula 2-24
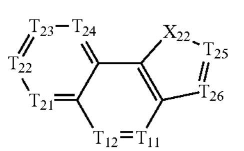
-continued
Formula 2-25
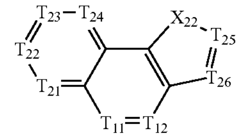
Formula 2-26
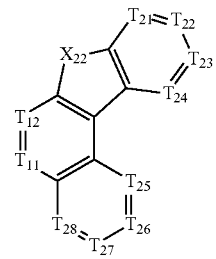
Formula 2-27
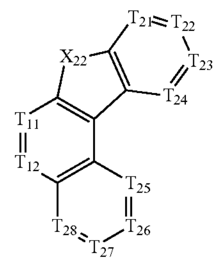
Formula 2-28
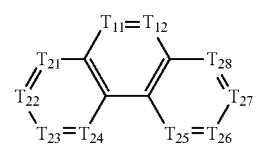
Formula 2-29
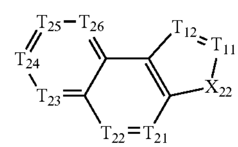
Formula 2-30
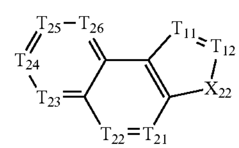
Formula 2-31
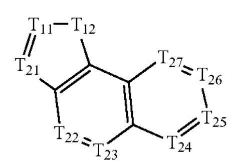
Formula 2-32
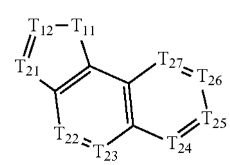
Formula 2-33
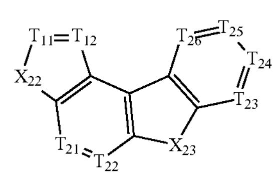

-continued

Formula 2-34

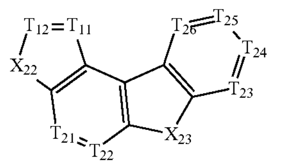

Formula 2-35

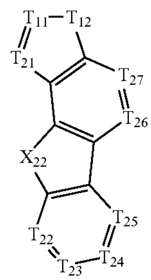

Formula 2-36

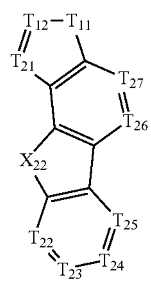

In Formulae 2-1 to 2-36, $T_{11}$ and $T_{12}$ are the same as described above, $X_{22}$ and $X_{23}$ may each independently be selected from O, S, Se, a moiety including C, a moiety including N, and a moiety including Si, and $T_{21}$ to $T_{28}$ may each independently be selected from N and a moiety including C.

When both $X_{22}$ and $X_{23}$ are included in rings $A_{21}$ to $A_{23}$, $X_{22}$ and $X_{23}$ may be identical to or different from each other.

For example, in Formulae 2-1 to 2-36, $X_{22}$ and $X_{23}$ may each independently be O, S, Se, $C(R_{25})(R_{26})$, $N\text{-}[(L_{22})_{a22}\text{-}(R_{22})_{b22}]$, or $Si(R_{25})(R_{26})$, and $T_{21}$ to $T_{28}$ may each independently be N or $C\text{-}[(L_{22})_{a22}\text{-}(R_{22})_{b22}]$. $R_{25}$ and $R_{26}$ may each independently be selected from groups represented by $*\text{-}[(L_{22})_{a22}\text{-}(R_{22})_{b22})]$ as described herein.

For example, in Formulae 2-1 to 2-36, $X_{22}$ and $X_{23}$ may each independently be O, S, Se, $C(R_{25})(R_{26})$, $N\text{-}[(L_{22})_{a22}\text{-}(R_{22})_{b22}]$, or $Si(R_{25})(R_{26})$, and $T_{21}$ to $T_{28}$ may each independently be N or $C\text{-}[(L_{22})_{a22}\text{-}(R_{22})_{b22}]$. $R_{25}$ and $R_{26}$ may each independently be selected from groups represented by $*\text{-}[(L_{22})_{a22}\text{-}(R_{22})_{b22})]$ as described herein.

In various embodiments, rings $A_{21}$, $A_{22}$, and $A_{23}$ in Formulae 2A and 2B may each independently be selected from groups represented by Formulae 2-101 to 2-229:

Formula 2-101

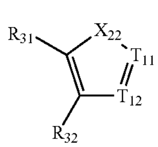

-continued

Formula 2-102

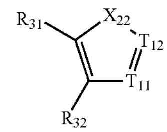

Formula 2-103

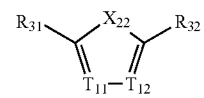

Formula 2-104

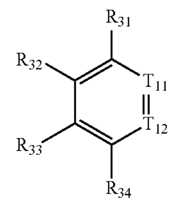

Formula 2-105

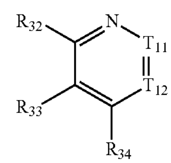

Formula 2-106

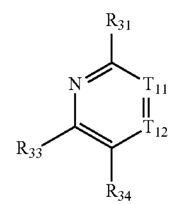

Formula 2-107

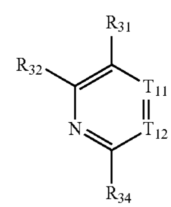

Formula 2-108

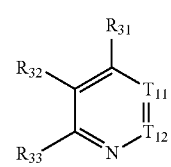

Formula 2-109

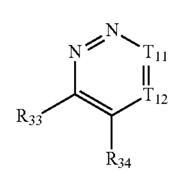

Formula 2-110

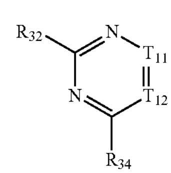

Formula 2-111
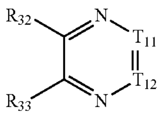
Formula 2-112
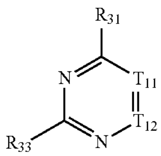
Formula 2-113
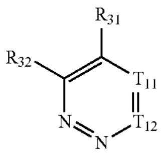
Formula 2-114
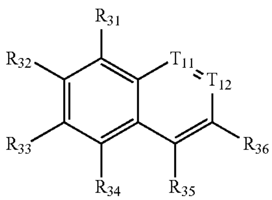
Formula 2-115
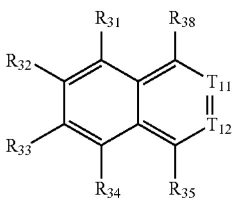
Formula 2-116
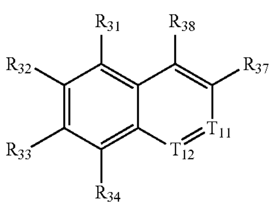
Formula 2-117
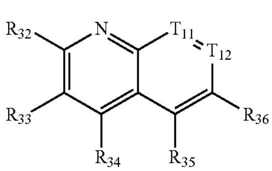
Formula 2-118
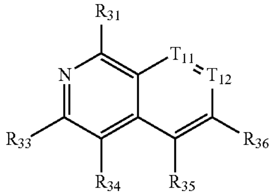
Formula 2-119
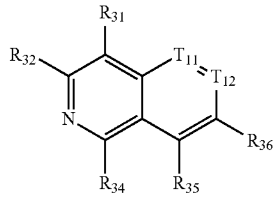
Formula 2-120
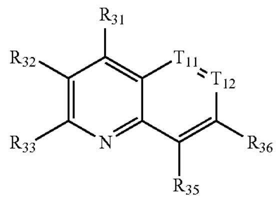
Formula 2-121
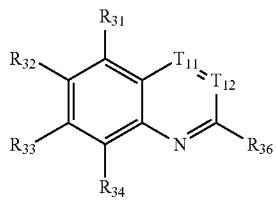
Formula 2-122
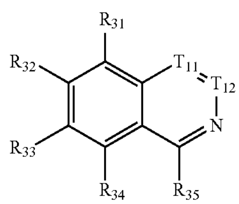
Formula 2-123
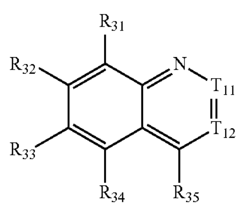
Formula 2-124
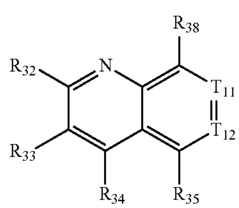
Formula 2-125
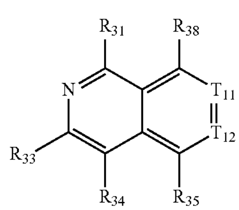

-continued
Formula 2-126
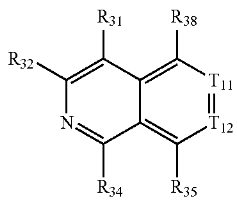
Formula 2-127
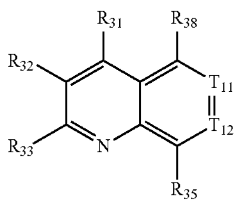
Formula 2-128
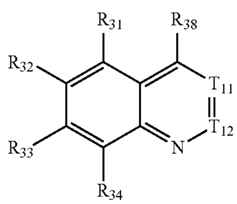
Formula 2-129
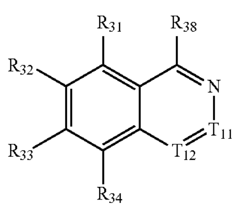
Formula 2-130
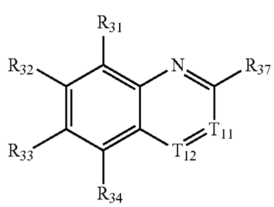
Formula 2-131
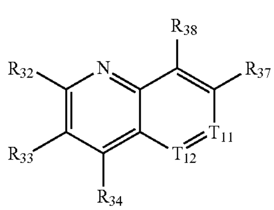
Formula 2-132
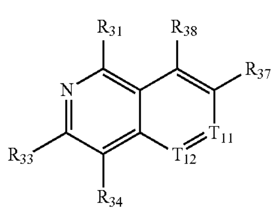
-continued
Formula 2-133
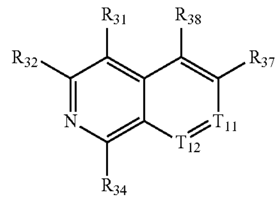
Formula 2-134
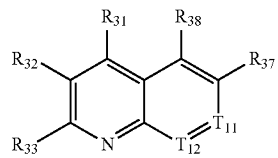
Formula 2-135
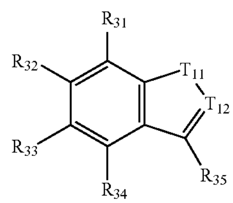
Formula 2-136
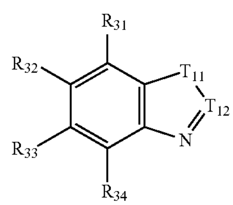
Formula 2-137
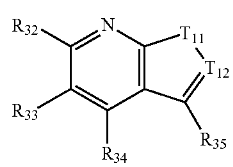
Formula 2-138
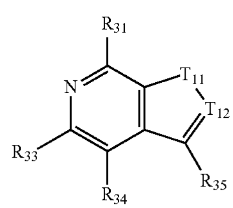
Formula 2-139
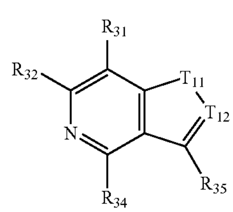
Formula 2-140
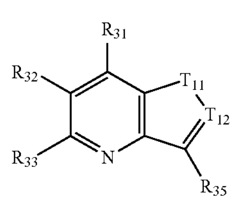

-continued
Formula 2-141
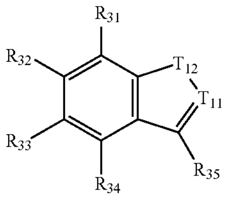
Formula 2-142
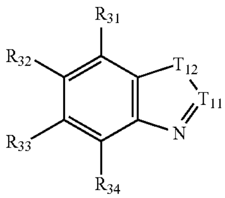
Formula 2-143
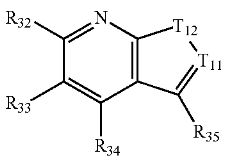
Formula 2-144
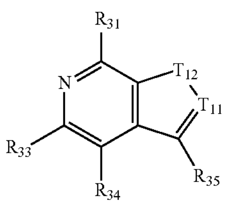
Formula 2-145
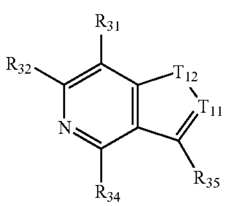
Formula 2-146
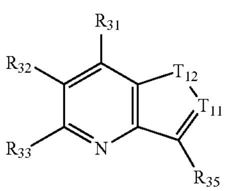
Formula 2-147
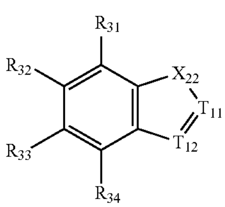
Formula 2-148
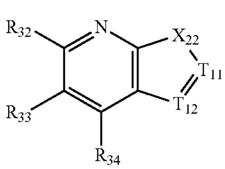
-continued
Formula 2-149
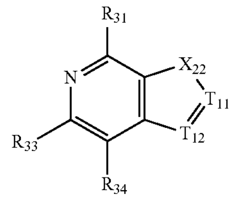
Formula 2-150
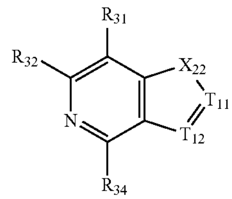
Formula 2-151
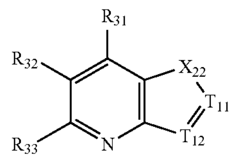
Formula 2-152
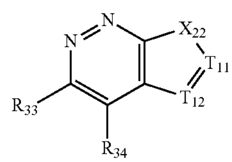
Formula 2-153
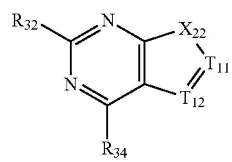
Formula 2-154
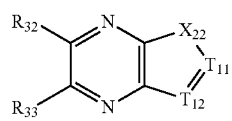
Formula 2-155
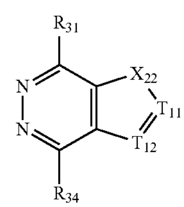
Formula 2-156
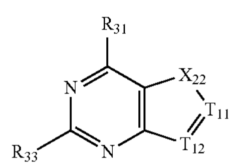
Formula 2-157
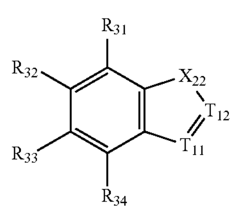

-continued
Formula 2-158
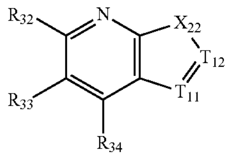
Formula 2-159
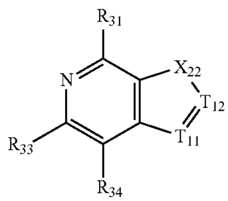
Formula 2-160
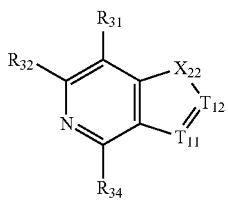
Formula 2-161
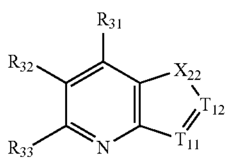
Formula 2-162
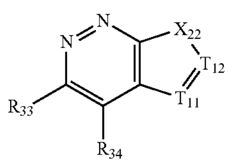
Formula 2-163
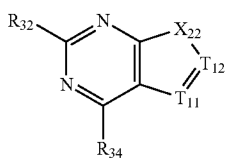
Formula 2-164
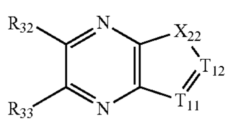
Formula 2-165
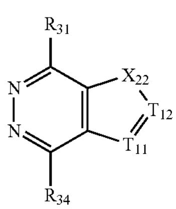
Formula 2-166
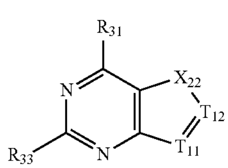
-continued
Formula 2-167
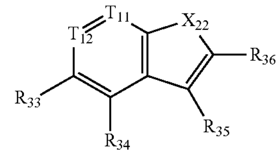
Formula 2-168
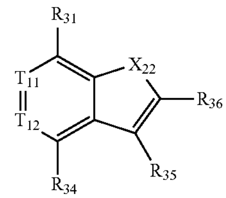
Formula 2-169
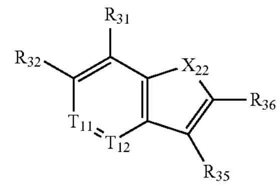
Formula 2-170
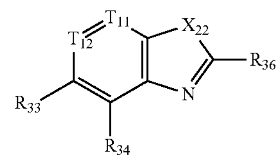
Formula 2-171
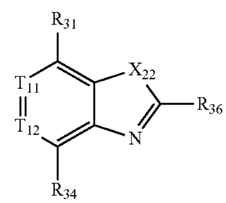
Formula 2-172
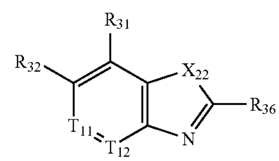
Formula 2-173
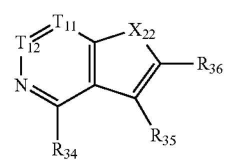
Formula 2-174
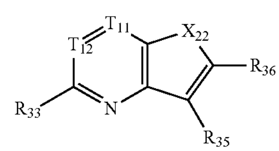
Formula 2-175
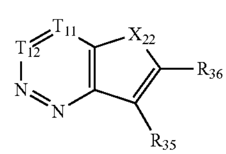

-continued
Formula 2-176
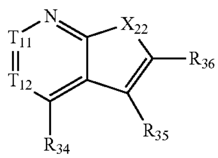
Formula 2-177
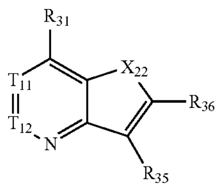
Formula 2-178
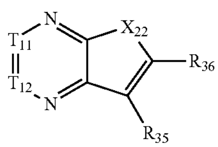
Formula 2-179
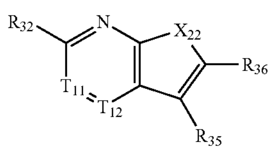
Formula 2-180
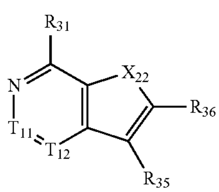
Formula 2-181
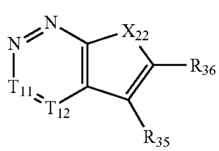
Formula 2-182
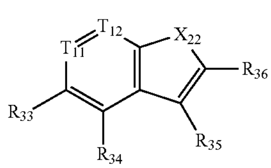
Formula 2-183
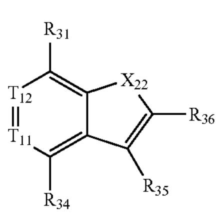
Formula 2-184
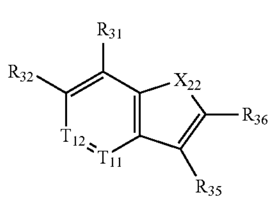
-continued
Formula 2-185
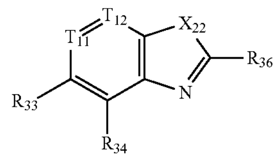
Formula 2-186
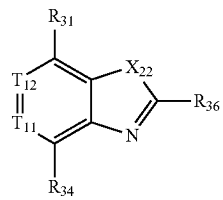
Formula 2-187
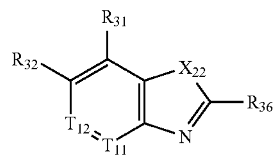
Formula 2-188
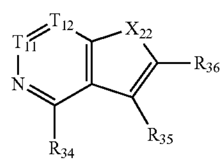
Formula 2-189
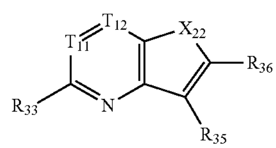
Formula 2-190
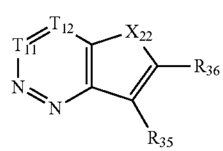
Formula 2-191
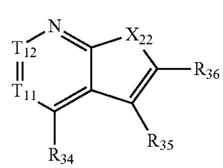
Formula 2-192
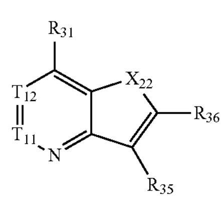
Formula 2-193
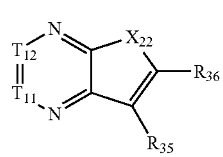

Formula 2-194
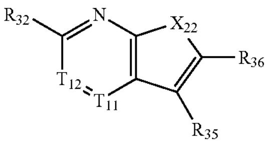
Formula 2-195
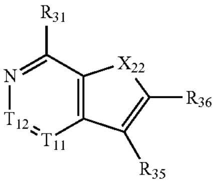
Formula 2-196
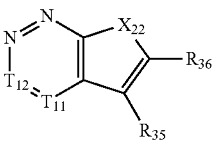
Formula 2-197
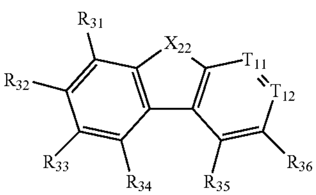
Formula 2-198
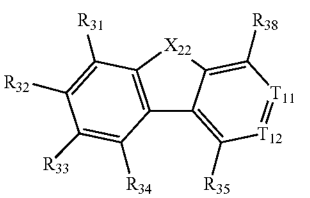
Formula 2-199
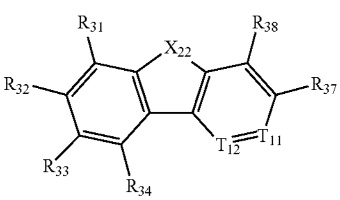
Formula 2-200
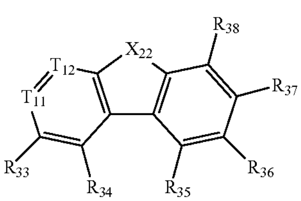
Formula 2-201
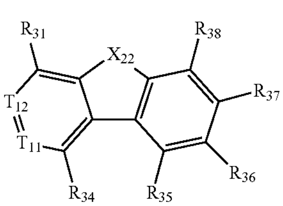
Formula 2-202
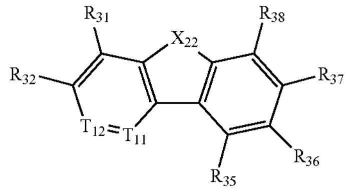
Formula 2-203
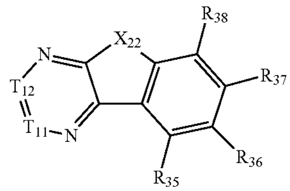
Formula 2-204
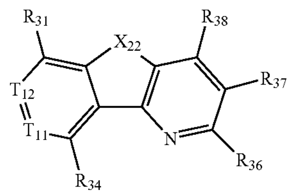
Formula 2-205
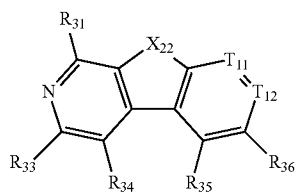
Formula 2-206
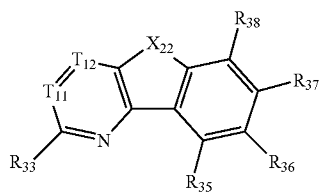
Formula 2-207
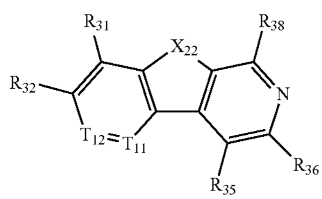
Formula 2-208
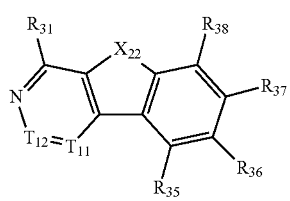
Formula 2-209
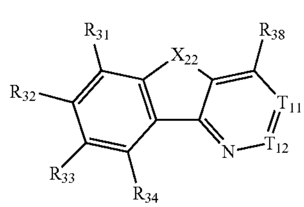

Formula 2-210
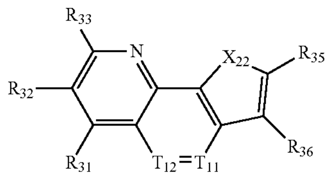
Formula 2-211
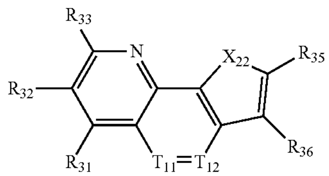
Formula 2-212
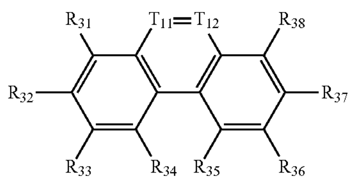
Formula 2-213
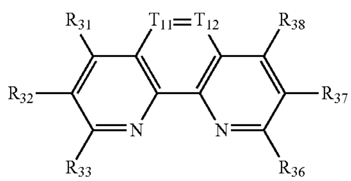
Formula 2-214
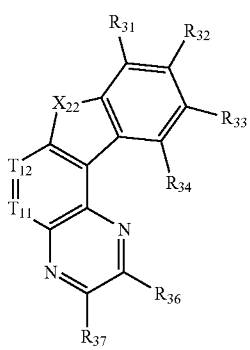
Formula 2-215
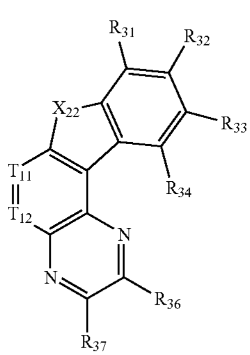
Formula 2-216
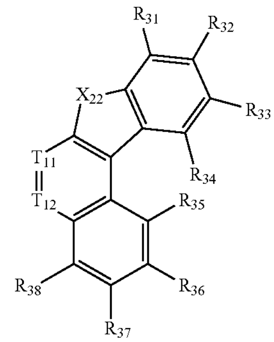
Formula 2-217
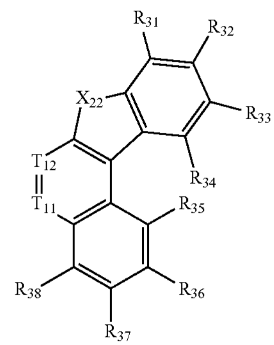
Formula 2-218
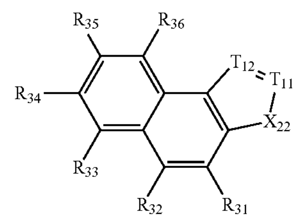
Formula 2-219
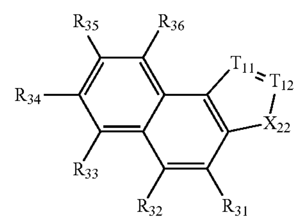
Formula 2-220
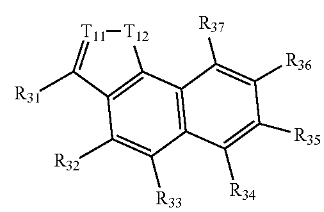
Formula 2-221
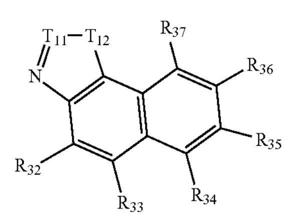

-continued

Formula 2-222

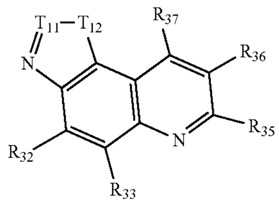

Formula 2-223

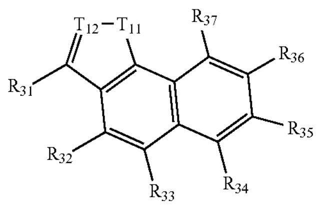

Formula 2-224

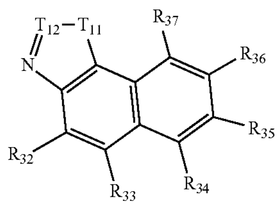

Formula 2-225

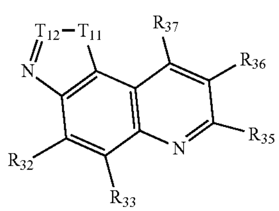

Formula 2-226

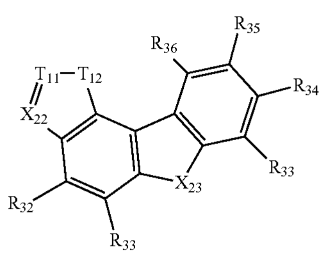

Formula 2-227

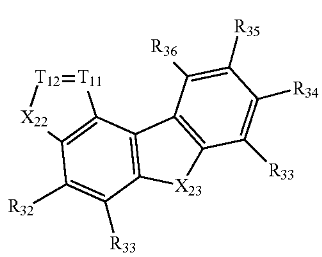

-continued

Formula 2-228

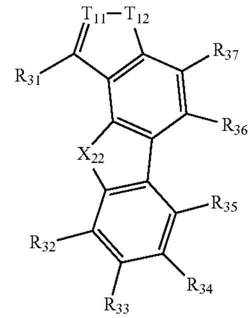

Formula 2-229

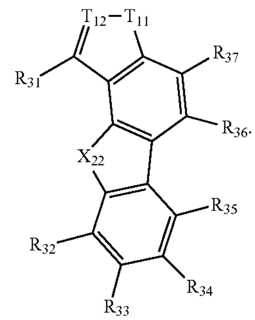

In Formulae 2-101 to 2-229, $T_{11}$ and $T_{12}$ are the same as described above, $X_{22}$ and $X_{23}$ are the same as described above, and $R_{31}$ to $R_{38}$ may each independently be selected from substituents represented by $*\text{-}[(L_{22})_{a22}\text{-}(R_{22})_{b22}]$ as described herein.

In $R_{31}$ to $R_{38}$, when the number of $*\text{-}[(L_{22})_{a22}\text{-}(R_{22})_{b22}]$ (S) is two or more, two or more $*\text{-}[(L_{22})_{a22}\text{-}(R_{22})_{b22}]$(s) may be identical to or different from each other.

For example, in Formulae 2A to 2B, a case where rings $A_{21}$, $A_{22}$, and $A_{23}$ are all represented by Formula 2-104 may be excluded.

In various embodiments, the second compound may be represented by one selected from Formulae 2-201A to 2-269A, and rings $A_{21}$, $A_{22}$, and $A_{23}$ in Formulae 2-201A to 2-269A may each be selected from Formulae shown in Table 1.

TABLE 1

| Formula No. | Formula No. of ring $A_{21}$ | Formula No. of ring $A_{22}$ | Formula No. of ring $A_{23}$ |
|---|---|---|---|
| 2-201A | 2-2 | 2-4 | 2-4 |
| 2-202A | 2-4 | 2-4 | 2-1 |
| 2-203A | 2-4 | 2-4 | 2-2 |
| 2-204A | 2-4 | 2-4 | 2-3 |
| 2-205A | 2-4 | 2-1 | 2-4 |
| 2-206A | 2-4 | 2-2 | 2-4 |
| 2-207A | 2-4 | 2-4 | 2-10 |
| 2-208A | 2-11 | 2-4 | 2-4 |
| 2-209A | 2-4 | 2-4 | 2-11 |
| 2-210A | 2-4 | 2-10 | 2-4 |
| 2-211A | 2-4 | 2-4 | 2-8 |
| 2-212A | 2-4 | 2-9 | 2-4 |
| 2-213A | 2-4 | 2-4 | 2-14 |
| 2-214A | 2-17 | 2-4 | 2-4 |
| 2-215A | 2-4 | 2-4 | 2-15 |
| 2-216A | 2-13 | 2-4 | 2-4 |
| 2-217A | 2-4 | 2-4 | 2-16 |
| 2-218A | 2-4 | 2-4 | 2-13 |

TABLE 1-continued

| Formula No. | Formula No. of ring $A_{21}$ | Formula No. of ring $A_{22}$ | Formula No. of ring $A_{23}$ |
|---|---|---|---|
| 2-219A | 2-16 | 2-4 | 2-4 |
| 2-220A | 2-4 | 2-4 | 2-12 |
| 2-221A | 2-4 | 2-4 | 2-17 |
| 2-222A | 2-4 | 2-16 | 2-4 |
| 2-223A | 2-4 | 2-15 | 2-4 |
| 2-224A | 2-4 | 2-14 | 2-4 |
| 2-225A | 2-4 | 2-17 | 2-4 |
| 2-226A | 2-19 | 2-4 | 2-4 |
| 2-227A | 2-22 | 2-4 | 2-4 |
| 2-228A | 2-18 | 2-4 | 2-4 |
| 2-229A | 2-23 | 2-4 | 2-4 |
| 2-230A | 2-21 | 2-4 | 2-4 |
| 2-231A | 2-20 | 2-4 | 2-4 |
| 2-232A | 2-4 | 2-23 | 2-4 |
| 2-233A | 2-4 | 2-18 | 2-4 |
| 2-234A | 2-4 | 2-21 | 2-4 |
| 2-235A | 2-4 | 2-19 | 2-4 |
| 2-236A | 2-5 | 2-2 | 2-4 |
| 2-237A | 2-5 | 2-1 | 2-4 |
| 2-238A | 2-2 | 2-2 | 2-4 |
| 2-239A | 2-4 | 2-23 | 2-1 |
| 2-240A | 2-6 | 2-10 | 2-4 |
| 2-241A | 2-4 | 2-4 | 2-29 |
| 2-242A | 2-7 | 2-4 | 2-10 |
| 2-243A | 2-11 | 2-4 | 2-10 |
| 2-244A | 2-4 | 2-10 | 2-6 |
| 2-245A | 2-11 | 2-11 | 2-4 |
| 2-246A | 2-11 | 2-11 | 2-5 |
| 2-247A | 2-11 | 2-11 | 2-10 |
| 2-248A | 2-7 | 2-9 | 2-4 |
| 2-249A | 2-4 | 2-4 | 2-25 |
| 2-250A | 2-11 | 2-15 | 2-4 |
| 2-251A | 2-18 | 2-28 | 2-4 |
| 2-252A | 2-23 | 2-10 | 2-4 |
| 2-253A | 2-4 | 2-27 | 2-4 |
| 2-254A | 2-6 | 2-18 | 2-4 |
| 2-255A | 2-4 | 2-23 | 2-5 |
| 2-256A | 2-23 | 2-4 | 2-14 |
| 2-257A | 2-17 | 2-4 | 2-14 |
| 2-258A | 2-14 | 2-4 | 2-12 |
| 2-259A | 2-17 | 2-4 | 2-12 |
| 2-260A | 2-14 | 2-16 | 2-2 |
| 2-261A | 2-17 | 2-5 | 2-14 |
| 2-262A | 2-17 | 2-13 | 2-17 |
| 2-263A | 2-17 | 2-14 | 2-12 |
| 2-264A | 2-17 | 2-12 | 2-12 |
| 2-265A | 2-5 | 2-1 | 2-18 |
| 2-266A | 2-4 | 2-29 | 2-4 |
| 2-267A | 2-4 | 2-31 | 2-4 |
| 2-268A | 2-4 | 2-33 | 2-4 |
| 2-269A | 2-4 | 2-35 | 2-4 |

In various embodiments, the second compound may be represented by one selected from Formulae 2-201B to 2-215B, and rings $A_{21}$ and $A_{23}$ in Formulae 2-201B to 2-215B may each be selected from Formulae shown in Table 2.

TABLE 2

| Formula No. | Formula No. of ring $A_{21}$ | Formula No. of ring $A_{22}$ | Formula No. of ring $A_{23}$ |
|---|---|---|---|
| 2-201B | 2-4 | — | 2-19 |
| 2-202B | 2-4 | — | 2-22 |
| 2-203B | 2-4 | — | 2-18 |
| 2-204B | 2-4 | — | 2-23 |
| 2-205B | 2-4 | — | 2-21 |
| 2-206B | 2-4 | — | 2-20 |
| 2-207B | 2-5 | — | 2-23 |
| 2-208B | 2-7 | — | 2-23 |
| 2-209B | 2-4 | — | 2-26 |

TABLE 2-continued

| Formula No. | Formula No. of ring $A_{21}$ | Formula No. of ring $A_{22}$ | Formula No. of ring $A_{23}$ |
|---|---|---|---|
| 2-210B | 2-7 | — | 2-22 |
| 2-211B | 2-13 | — | 2-16 |
| 2-212B | 2-5 | — | 2-19 |
| 2-213B | 2-7 | — | 2-20 |
| 2-214B | 2-19 | — | 2-18 |
| 2-215B | 2-18 | — | 2-18 |

In various embodiments, the second compound may be represented by one selected from Formulae 2-301A to 2-421A, and rings $A_{21}$, $A_{22}$, and $A_{23}$ in Formulae 2-301A to 2-419A and 2-421A to 2-431A may each be selected from Formulae shown in Table 3.

TABLE 3

| Formula No. | Formula No. of ring $A_{21}$ | Formula No. of ring $A_{22}$ | Formula No. of ring $A_{23}$ |
|---|---|---|---|
| 2-301A | 2-104 | 2-147 | 2-104 |
| 2-302A | 2-102 | 2-104 | 2-104 |
| 2-303A | 2-104 | 2-104 | 2-101 |
| 2-304A | 2-104 | 2-104 | 2-102 |
| 2-305A | 2-104 | 2-104 | 2-103 |
| 2-306A | 2-104 | 2-101 | 2-104 |
| 2-307A | 2-104 | 2-102 | 2-104 |
| 2-308A | 2-104 | 2-104 | 2-147 |
| 2-309A | 2-157 | 2-104 | 2-104 |
| 2-310A | 2-104 | 2-104 | 2-157 |
| 2-311A | 2-104 | 2-147 | 2-107 |
| 2-312A | 2-104 | 2-149 | 2-104 |
| 2-313A | 2-104 | 2-156 | 2-104 |
| 2-314A | 2-107 | 2-147 | 2-106 |
| 2-315A | 2-104 | 2-151 | 2-104 |
| 2-316A | 2-104 | 2-147 | 2-106 |
| 2-317A | 2-104 | 2-148 | 2-104 |
| 2-318A | 2-104 | 2-150 | 2-104 |
| 2-319A | 2-106 | 2-147 | 2-104 |
| 2-320A | 2-104 | 2-106 | 2-147 |
| 2-321A | 2-157 | 2-107 | 2-104 |
| 2-322A | 2-106 | 2-104 | 2-147 |
| 2-323A | 2-104 | 2-107 | 2-147 |
| 2-324A | 2-107 | 2-104 | 2-147 |
| 2-325A | 2-104 | 2-104 | 2-160 |
| 2-326A | 2-104 | 2-111 | 2-157 |
| 2-327A | 2-108 | 2-104 | 2-158 |
| 2-328A | 2-111 | 2-104 | 2-157 |
| 2-329A | 2-107 | 2-147 | 2-104 |
| 2-330A | 2-104 | 2-104 | 2-135 |
| 2-331A | 2-104 | 2-141 | 2-104 |
| 2-332A | 2-104 | 2-142 | 2-104 |
| 2-333A | 2-107 | 2-104 | 2-135 |
| 2-334A | 2-104 | 2-111 | 2-135 |
| 2-335A | 2-104 | 2-143 | 2-104 |
| 2-336A | 2-106 | 2-142 | 2-104 |
| 2-337A | 2-107 | 2-142 | 2-106 |
| 2-338A | 2-104 | 2-104 | 2-169 |
| 2-339A | 2-184 | 2-104 | 2-104 |
| 2-340A | 2-104 | 2-104 | 2-182 |
| 2-341A | 2-168 | 2-104 | 2-104 |
| 2-342A | 2-104 | 2-104 | 2-183 |
| 2-343A | 2-104 | 2-104 | 2-168 |
| 2-344A | 2-183 | 2-104 | 2-104 |
| 2-345A | 2-104 | 2-104 | 2-167 |
| 2-346A | 2-104 | 2-104 | 2-184 |
| 2-347A | 2-104 | 2-183 | 2-104 |
| 2-348A | 2-104 | 2-182 | 2-104 |
| 2-349A | 2-104 | 2-169 | 2-104 |
| 2-350A | 2-104 | 2-184 | 2-104 |
| 2-351A | 2-107 | 2-104 | 2-179 |
| 2-352A | 2-111 | 2-104 | 2-169 |
| 2-353A | 2-104 | 2-111 | 2-182 |
| 2-354A | 2-106 | 2-104 | 2-185 |

TABLE 3-continued

| Formula No. | Formula No. of ring $A_{21}$ | Formula No. of ring $A_{22}$ | Formula No. of ring $A_{23}$ |
|---|---|---|---|
| 2-355A | 2-171 | 2-104 | 2-104 |
| 2-356A | 2-104 | 2-104 | 2-115 |
| 2-357A | 2-104 | 2-104 | 2-178 |
| 2-358A | 2-104 | 2-106 | 2-167 |
| 2-359A | 2-108 | 2-105 | 2-167 |
| 2-360A | 2-105 | 2-104 | 2-167 |
| 2-361A | 2-112 | 2-104 | 2-184 |
| 2-362A | 2-104 | 2-192 | 2-104 |
| 2-363A | 2-107 | 2-182 | 2-106 |
| 2-364A | 2-104 | 2-169 | 2-105 |
| 2-365A | 2-105 | 2-184 | 2-104 |
| 2-366A | 2-105 | 2-169 | 2-105 |
| 2-367A | 2-198 | 2-104 | 2-104 |
| 2-368A | 2-201 | 2-104 | 2-104 |
| 2-369A | 2-197 | 2-104 | 2-104 |
| 2-370A | 2-202 | 2-104 | 2-104 |
| 2-371A | 2-200 | 2-104 | 2-104 |
| 2-372A | 2-199 | 2-104 | 2-104 |
| 2-373A | 2-104 | 2-202 | 2-104 |
| 2-374A | 2-104 | 2-197 | 2-104 |
| 2-375A | 2-104 | 2-200 | 2-104 |
| 2-376A | 2-104 | 2-198 | 2-104 |
| 2-377A | 2-209 | 2-104 | 2-104 |
| 2-378A | 2-207 | 2-104 | 2-104 |
| 2-379A | 2-200 | 2-106 | 2-104 |
| 2-380A | 2-104 | 2-208 | 2-104 |
| 2-381A | 2-105 | 2-198 | 2-108 |
| 2-382A | 2-202 | 2-102 | 2-104 |
| 2-383A | 2-202 | 2-101 | 2-106 |
| 2-384A | 2-102 | 2-102 | 2-107 |
| 2-385A | 2-104 | 2-202 | 2-101 |
| 2-386A | 2-123 | 2-147 | 2-104 |
| 2-387A | 2-104 | 2-104 | 2-218 |
| 2-388A | 2-116 | 2-104 | 2-147 |
| 2-389A | 2-157 | 2-104 | 2-147 |
| 2-390A | 2-107 | 2-147 | 2-115 |
| 2-391A | 2-157 | 2-157 | 2-104 |
| 2-392A | 2-157 | 2-157 | 2-114 |
| 2-393A | 2-157 | 2-157 | 2-147 |
| 2-394A | 2-116 | 2-147 | 2-104 |
| 2-395A | 2-104 | 2-104 | 2-210 |
| 2-396A | 2-157 | 2-182 | 2-104 |
| 2-397A | 2-197 | 2-213 | 2-104 |
| 2-398A | 2-202 | 2-167 | 2-104 |
| 2-399A | 2-104 | 2-216 | 2-104 |
| 2-400A | 2-124 | 2-197 | 2-104 |
| 2-401A | 2-104 | 2-202 | 2-114 |
| 2-402A | 2-168 | 2-104 | 2-169 |
| 2-403A | 2-184 | 2-104 | 2-169 |
| 2-404A | 2-169 | 2-104 | 2-167 |
| 2-405A | 2-184 | 2-106 | 2-167 |
| 2-406A | 2-169 | 2-183 | 2-102 |
| 2-407A | 2-184 | 2-114 | 2-169 |
| 2-408A | 2-184 | 2-168 | 2-184 |
| 2-409A | 2-184 | 2-104 | 2-167 |
| 2-410A | 2-184 | 2-167 | 2-167 |
| 2-411A | 2-114 | 2-101 | 2-197 |
| 2-412A | 2-104 | 2-149 | 2-104 |
| 2-413A | 2-106 | 2-104 | 2-147 |
| 2-414A | 2-104 | 2-104 | 2-168 |
| 2-415A | 2-200 | 2-106 | 2-104 |
| 2-416A | 2-104 | 2-104 | 2-183 |
| 2-417A | 2-104 | 2-104 | 2-101 |
| 2-418A | 2-105 | 2-169 | 2-105 |
| 2-419A | 2-104 | 2-147 | 2-107 |
| 2-421A | 2-104 | 2-218 | 2-104 |
| 2-422A | 2-104 | 2-226 | 2-104 |
| 2-423A | 2-104 | 2-222 | 2-104 |
| 2-424A | 2-104 | 2-228 | 2-104 |
| 2-425A | 2-104 | 2-151 | 2-104 |
| 2-426A | 2-106 | 2-147 | 2-107 |
| 2-427A | 2-104 | 2-147 | 2-106 |
| 2-428A | 2-107 | 2-150 | 2-104 |
| 2-429A | 2-104 | 2-143 | 2-104 |

TABLE 3-continued

| Formula No. | Formula No. of ring $A_{21}$ | Formula No. of ring $A_{22}$ | Formula No. of ring $A_{23}$ |
|---|---|---|---|
| 2-430A | 2-107 | 2-142 | 2-106 |
| 2-431A | 2-104 | 2-142 | 2-104 |

In various embodiments, the second compound may be represented by one selected from Formulae 2-301B to 2-320B, and rings $A_{21}$ and $A_{23}$ in Formulae 2-301B to 2-320B may each be selected from Formulae shown in Table 4.

TABLE 4

| Formula No. | Formula No. of ring $A_{21}$ | Formula No. of ring $A_{22}$ | Formula No. of ring $A_{23}$ |
|---|---|---|---|
| 2-301B | 2-104 | — | 2-198 |
| 2-302B | 2-104 | — | 2-201 |
| 2-303B | 2-104 | — | 2-197 |
| 2-304B | 2-104 | — | 2-202 |
| 2-305B | 2-104 | — | 2-200 |
| 2-306B | 2-104 | — | 2-199 |
| 2-307B | 2-104 | — | 2-203 |
| 2-308B | 2-104 | — | 2-204 |
| 2-309B | 2-106 | — | 2-205 |
| 2-310B | 2-104 | — | 2-206 |
| 2-311B | 2-112 | — | 2-199 |
| 2-312B | 2-114 | — | 2-202 |
| 2-313B | 2-116 | — | 2-202 |
| 2-314B | 2-104 | — | 2-214 |
| 2-315B | 2-130 | — | 2-201 |
| 2-316B | 2-168 | — | 2-183 |
| 2-317B | 2-114 | — | 2-198 |
| 2-318B | 2-116 | — | 2-199 |
| 2-319B | 2-198 | — | 2-197 |
| 2-320B | 2-197 | — | 2-197 |

$X_1$ in Formulae 1A and 1B may be silicon (Si) or carbon (C).

For example, $X_1$ in Formulae 1A and 1B may be C.

In Formulae 1A and 1B, $Y_1$ may be selected from a single bond, $N[(L_{11})_{a11}-(R_{11})_{b11}]$, $C(R_{11})(R_{13})$, $Si(R_{11})(R_{13})$, O, S, and Se, and $Y_2$ may be selected from a single bond, $N[(L_{12})_{a12}-(R_{12})_{b12}]$, $C(R_{12})(R_{14})$, $Si(R_{12})(R_{14})$, O, S, and Se.

For example, in Formulae 1A and 1B, $Y_1$ and $Y_2$ may be a single bond, $Y_1$ may be a single bond, and $Y_2$ may be selected from $N[(L_{12})_{a12}-(R_{12})_{b12}]$, $C(R_{12})(R_{14})$, $Si(R_{12})(R_{14})$, O, S, and Se, or $Y_1$ may be selected from $N[(L_{11})_{a11}-(R_{11})_{b11}]$, $C(R_{11})(R_{13})$, $Si(R_{11})(R_{13})$, O, S, and Se, and $Y_2$ may be a single bond.

In various embodiments, in Formulae 1A and 1B, $Y_1$ and $Y_2$ may be a single bond, $Y_1$ may be a single bond, and $Y_2$ may be selected from $N[(L_{12})_{a12}-(R_{12})_{b12}]$, $C(R_{12})(R_{14})$, O, and S, or $Y_1$ may be selected from $N[(L_{11})_{a11}-(R_{11})_{b11}]$, $C(R_{11})(R_{13})$, O, and S, and $Y_2$ may be a single bond.

For example, in Formula 1B, $Y_1$ may be selected from a single bond, $N[(L_{11})_{a11}-(R_{11})_{b11}]$, $C(R_{11})(R_{15})$, O, and S.

$E_1$ and $E_2$ in Formulae 1A and 1B may each independently be a nitrogen (N) atom, or may each independently be a carbon (C) atom substituted with $*-(L_4)_{a4}-(R_4)_{b4}$.

When $E_1$ and $E_2$ in Formulae 1A and 1B are a carbon (C) atom substituted with $*-(L_4)_{a4}-(R_4)_{b4}$, two $*-(L_4)_{a4}-(R_4)_{b4}$(s) may be identical to or different from each other.

$X_{21}$ in Formulae 2A and 2B may be selected from O, S, Se, $C(R_{23})(R_{24})$, $Si(R_{23})(R_{24})$, and $N-[(L_{21})_{a21}-(R_{21})_{b21}]$.

In various embodiments, $X_{21}$ in Formulae 2A and 2B may be $N[(L_{21})_{a21}-(R_{21})_{b21}]$.

In various embodiments, $X_{21}$ in Formulae 2A and 2B may be O, S, Se, $C(R_{23})(R_{24})$, or $Si(R_{23})(R_{24})$, and at least one selected from rings $A_{21}$, $A_{22}$, and $A_{23}$ in Formula 2A and at least one selected from rings $A_{21}$ and $A_{23}$ in Formula 2B may each independently be selected from groups represented by Formulae 2-1 to 2-3, 2-10 to 2-27, and 2-33 to 2-36, and $X_{22}$ or $X_{23}$ in Formulae 2-1 to 2-3, 2-10 to 2-27, and 2-33 to 2-36 may be $N-[(L_{22})_{a22}-(R_{22})_{b22}]$.

In various embodiments, $X_{21}$ in Formulae 2A and 2B may be O, S, Se, $C(R_{23})(R_{24})$, or $Si(R_{23})(R_{24})$, at least one selected from rings $A_{21}$, $A_{22}$, and $A_{23}$ in Formula 2A and at least one selected from rings $A_{21}$ and $A_{23}$ in Formula 2B may each independently be selected from groups represented by Formulae 2-101 to 2-103, 2-147 to 2-211, 2-214 to 2-219, and 2-226 to 2-229, and $X_{22}$ or $X_{23}$ in Formulae 2-101 to 2-103, 2-147 to 2-211, 2-214 to 2-219, and 2-226 to 2-229 may be $N-[(L_{22})_{a22}-(R_{22})_{b22}]$.

In Formulae 2A and 2B, $X_{21}$ may be O, S, Se, $C(R_{23})(R_{24})$, $Si(R_{23})(R_{24})$, or $N-[(L_{21})_{a21}-(R_{21})_{b21}]$, and $X_{22}$ and $X_{23}$ may each independently be O, S, Se, $C(R_{25})(R_{26})$, $Si(R_{25})(R_{26})$, or $N-[(L_{22})_{a22}-(R_{22})_{b22}]$. $L_{21}$, $L_{22}$, a21, a22, $R_{21}$ to $R_{26}$, b21, and b22 are the same as described below.

$L_1$ to $L_4$, $L_{11}$, $L_{12}$, $L_{21}$, and $L_{22}$ in Formulae 1A, 1B, 2A, and 2B may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

For example, in Formulae 1A, 1B, 2A, and 2B, $L_1$ to $L_4$, $L_{11}$, $L_{12}$, $L_{21}$, and $L_{22}$ may each independently be selected from a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzoimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzoimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group.

In various embodiments, $L_1$ to $L_4$, $L_{11}$, $L_{12}$, $L_{21}$, and $L_{22}$ in Formulae 1A, 1B, 2A, and 2B may each independently be selected from groups represented by Formulae 3-1 to 3-100:

Formula 3-1

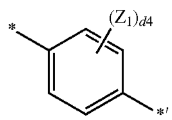

Formula 3-2

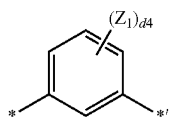

Formula 3-3

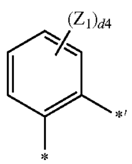

Formula 3-4

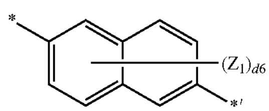

Formula 3-5

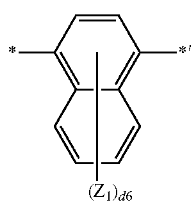

Formula 3-6

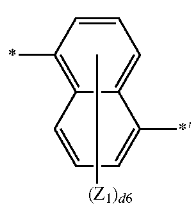

Formula 3-7

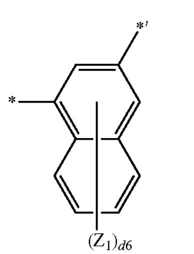

-continued

Formula 3-8

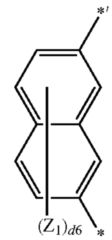

Formula 3-9

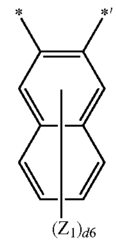

Formula 3-10

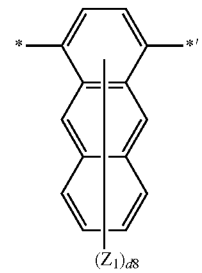

Formula 3-11

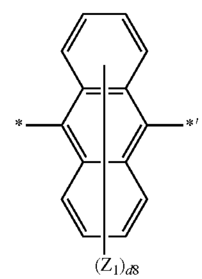

Formula 3-12

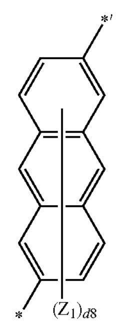

Formula 3-13

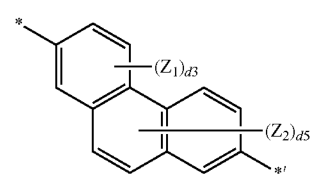

-continued
Formula 3-14
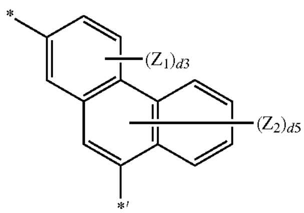
Formula 3-15
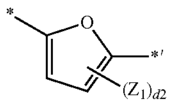
Formula 3-16
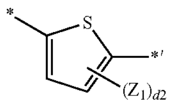
Formula 3-17
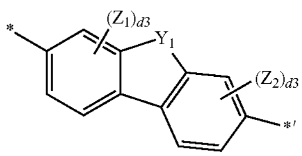
Formula 3-18
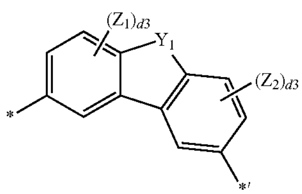
Formula 3-19
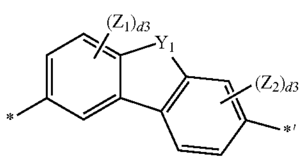
Formula 3-20
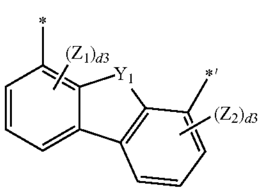
Formula 3-21
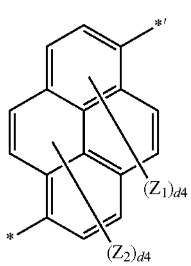
-continued
Formula 3-22
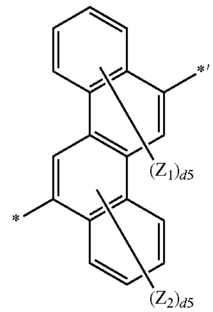
Formula 3-23
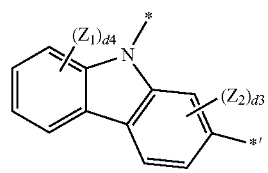
Formula 3-24
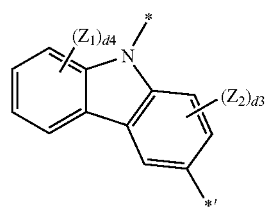
Formula 3-25
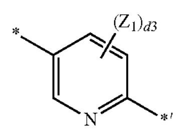
Formula 3-26
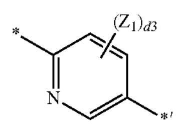
Formula 3-27
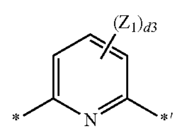
Formula 3-28
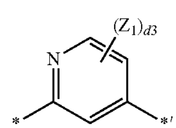
Formula 3-29
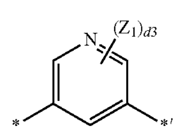
Formula 3-30
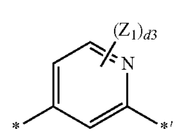
Formula 3-31
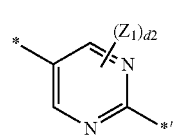

-continued
Formula 3-32
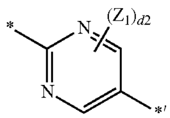
Formula 3-33
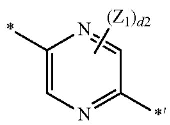
Formula 3-34
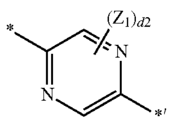
Formula 3-35
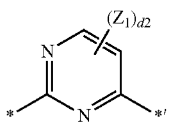
Formula 3-36
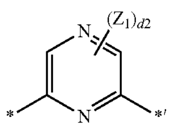
Formula 3-37
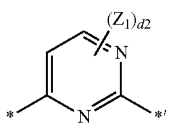
Formula 3-38
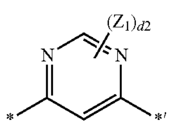
Formula 3-39
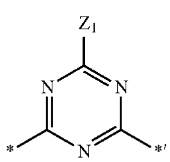
Formula 3-40
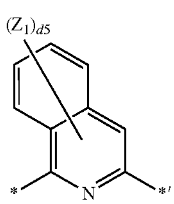
Formula 3-41
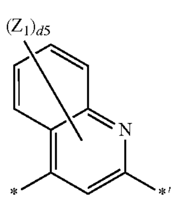
-continued
Formula 3-42
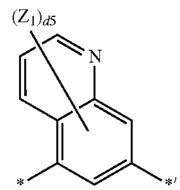
Formula 3-43
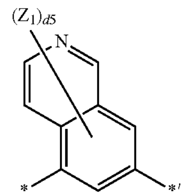
Formula 3-44
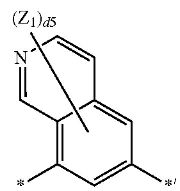
Formula 3-45
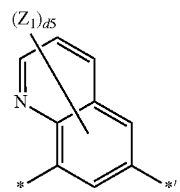
Formula 3-46
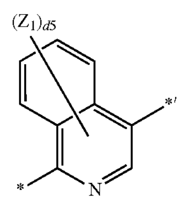
Formula 3-47
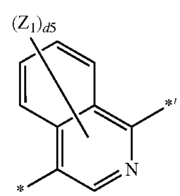
Formula 3-48
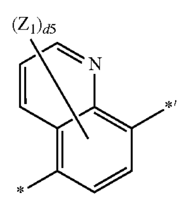
Formula 3-49
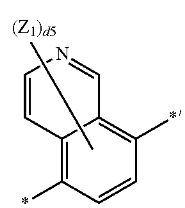

-continued
Formula 3-50
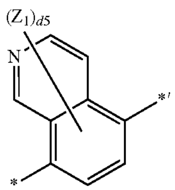
Formula 3-51
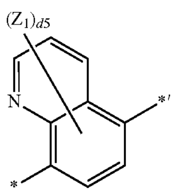
Formula 3-52
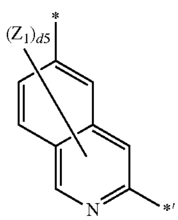
Formula 3-53
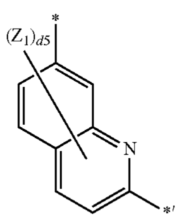
Formula 3-54
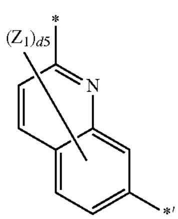
Formula 3-55
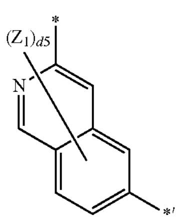
Formula 3-56
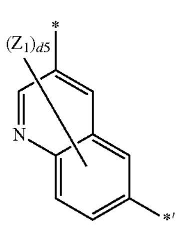
-continued
Formula 3-57
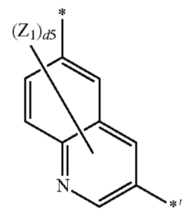
Formula 3-58
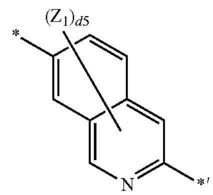
Formula 3-59
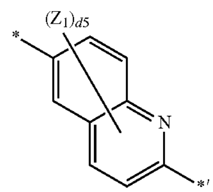
Formula 3-61
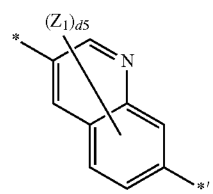
Formula 3-62
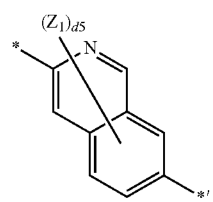
Formula 3-63
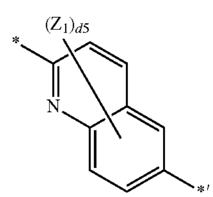
Formula 3-64
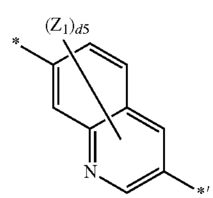
Formula 3-65
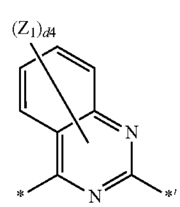

-continued
Formula 3-66
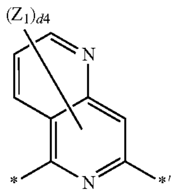
Formula 3-67
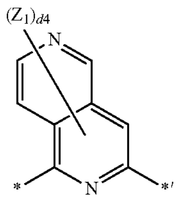
Formula 3-68
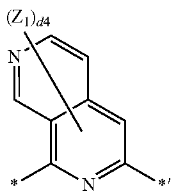
Formula 3-69
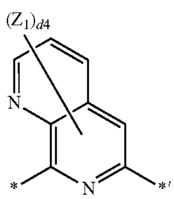
Formula 3-70
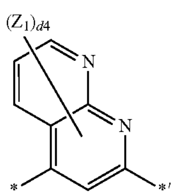
Formula 3-71
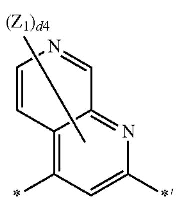
Formula 3-72
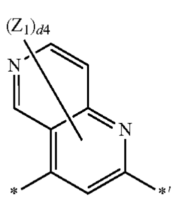
Formula 3-73
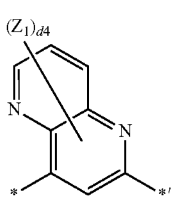
-continued
Formula 3-74
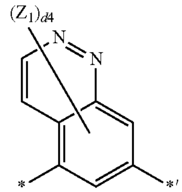
Formula 3-75
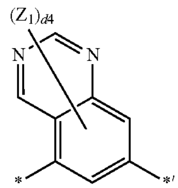
Formula 3-76
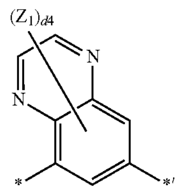
Formula 3-77
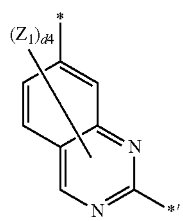
Formula 3-78
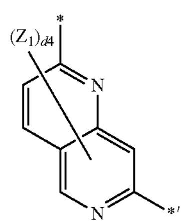
Formula 3-79
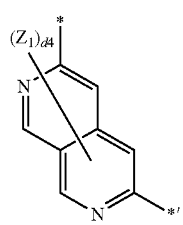
Formula 3-80
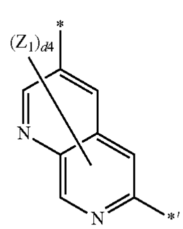

-continued
Formula 3-81
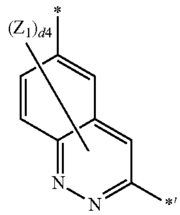
Formula 3-82
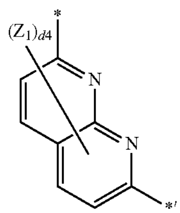
Formula 3-83
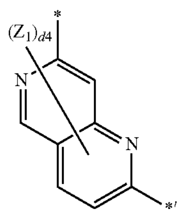
Formula 3-84
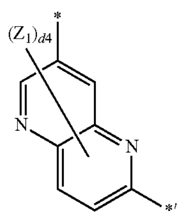
Formula 3-85
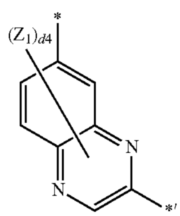
Formula 3-86
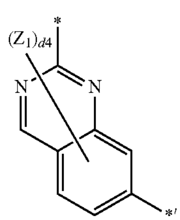
Formula 3-87
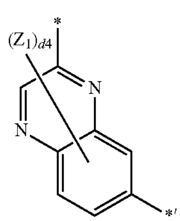
-continued
Formula 3-88
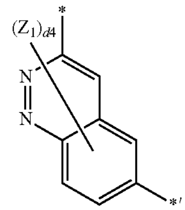
Formula 3-89
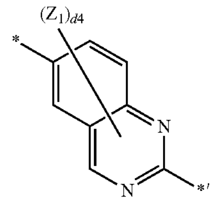
Formula 3-90
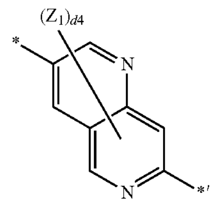
Formula 3-91
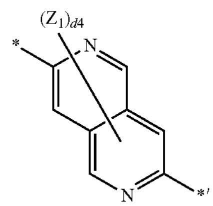
Formula 3-92
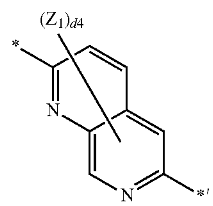
Formula 3-93
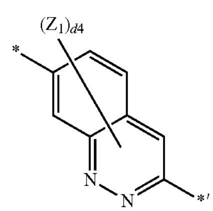
Formula 3-94
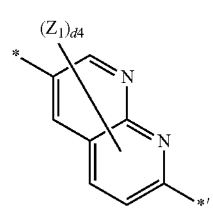

-continued

Formula 3-95

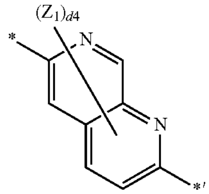

Formula 3-96

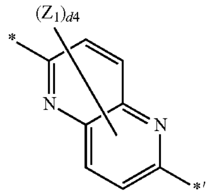

Formula 3-97

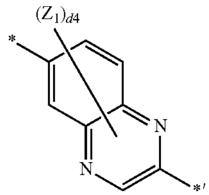

Formula 3-98

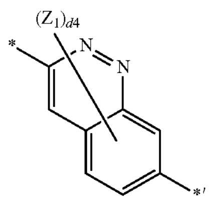

Formula 3-99

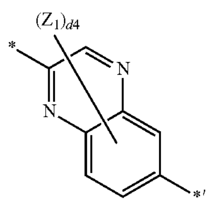

Formula 3-100

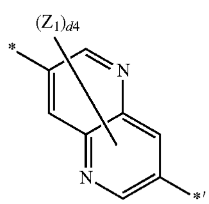

In Formulae 3-1 to 3-100, $Y_1$ may be O, S, $C(Z_3)(Z_4)$, $N(Z_5)$, or $Si(Z_6)(Z_7)$, $Z_1$ to $Z_7$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group, d2 may be an integer selected from 0 to 2, d3 may be an integer selected from 0 to 3, d4 may be an integer selected from 0 to 4, d5 may be an integer selected from 0 to 5, d6 may be an integer selected from 0 to 6, d8 may be an integer selected from 0 to 8, and

* and *' indicate a binding site to a neighboring atom.

In Formulae 1A, 1B, 2A, and 2B, a1 to a4, a11, a12, a21, and a22 indicate the number of $L_1$(s), the number of $L_2$(s), the number of $L_3$(s), the number of $L_4$(s), the number of $L_{11}$(s), the number of $L_{12}$(s), the number of $L_{21}$(s), and the number of $L_{22}$(s), respectively. In Formulae 1A, 1B, 2A, and 2B, a1 to a4, a11, a12, a21, and a22 may each independently be an integer selected from 0 to 5. When a1 is two or more, two or more $L_1$(s) may be identical to or different from each other, when a2 is two or more, two or more $L_2$(s) may be identical to or different from each other, when a3 is two or more, two or more $L_3$(s) may be identical to or different from each other, when a4 is two or more, two or more $L_4$(s) may be identical to or different from each other, when a11 is two or more, two or more $L_1$ (s) may be identical to or different from each other, when a12 is two or more, two or more $L_{12}$(s) may be identical to or different from each other, when a21 is two or more, two or more $L_{21}$(s) may be identical to or different from each other, and when a22 is two or more, two or more $L_{22}$(s) may be identical to or different from each other.

When a1 is zero, *-$(L_1)_{a1}$-*' may be a single bond, when a2 is zero, *-$(L_2)_{a2}$-*' may be a single bond, when a3 is zero, *-$(L_3)_{a3}$-*' may be a single bond, when a4 is zero, *-$(L_4)_{a4}$-*' may be a single bond, when a11 is zero, *-$(L_1)_{a11}$-*' may be a single bond, when a12 is zero, *-$(L_{12})_{a12}$-*' may be a single bond, when a21 is zero, *-$(L_{21})_{a21}$-*' may be a single bond, and when a22 is a zero, *-$(L_{22})_{a22}$-*' may be a single bond.

In various embodiments, a1 to a4, a11, a12, a21, and a22 in Formulae 1A, 1B, 2A, and 2B may each independently be an integer selected from 0 to 3.

In Formulae 1A, 1B, 2A, and 2B, $R_1$ to $R_4$, $R_{11}$ to $R_{14}$, $R_{21}$ to $R_{24}$, $R_{27}$, and $R_{28}$ may each independently be selected from hydrogen, deuterium (-D), —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$(Q), and —P(=O)($Q_1$)($Q_2$).

In an implementation, $R_{11}$ and $R_{13}$ may be separate or may be connected to each other to form a saturated or unsaturated ring.

In an implementation, $R_{12}$ and $R_{14}$ may be separate or may be connected to each other to form a saturated or unsaturated ring.

For example, in Formulae 1A, 1B, 2A, and 2B, $R_1$ to $R_4$, $R_{11}$ to $R_{14}$, $R_{21}$ to $R_{24}$, $R_{27}$, and $R_{28}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group; and a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_1$ to $Q_3$ and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group.

In various embodiments, in Formulae 1A, 1B, 2A, and 2B, $R_1$ to $R_4$, $R_{11}$ to $R_{14}$, $R_{21}$ to $R_{24}$, $R_{27}$, and $R_{28}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

groups represented by Formulae 5-1 to 5-45 and Formulae 6-1 to 6-124; and

—$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_1)$:

Formula 5-1

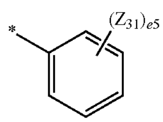

Formula 5-2

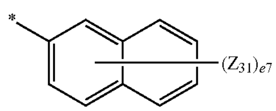

Formula 5-3

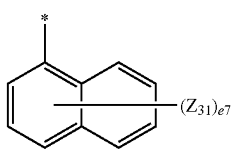

Formula 5-4

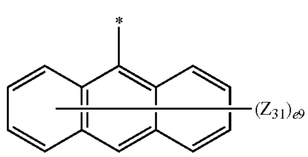

Formula 5-5

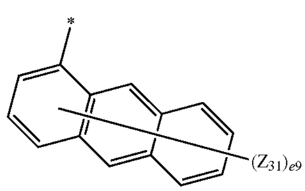

Formula 5-6

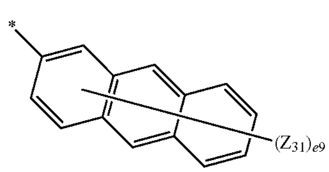

-continued

Formula 5-7

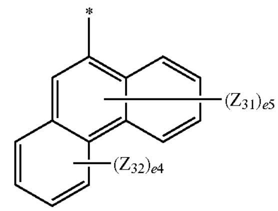

Formula 5-8

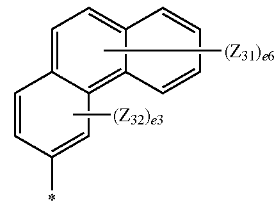

Formula 5-9

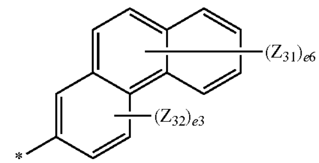

Formula 5-10

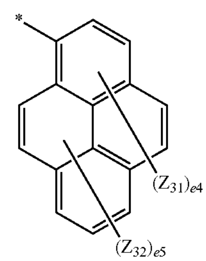

Formula 5-11

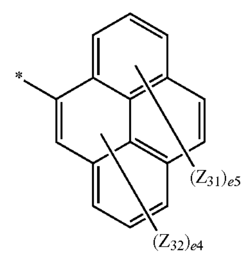

Formula 5-12

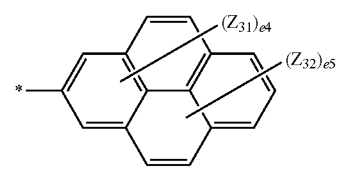

Formula 5-13

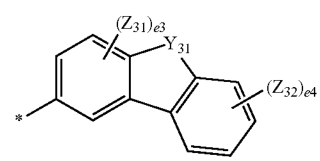

Formula 5-14

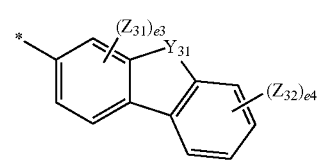

-continued
Formula 5-15
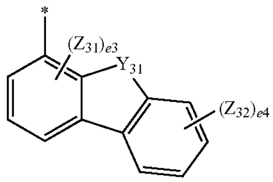
Formula 5-16
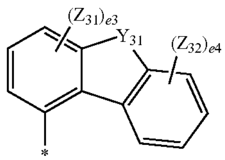
Formula 5-17
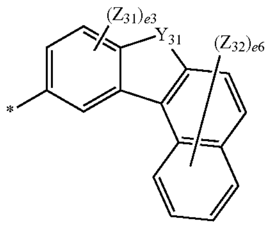
Formula 5-18
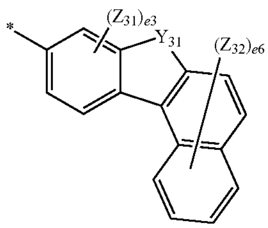
Formula 5-19
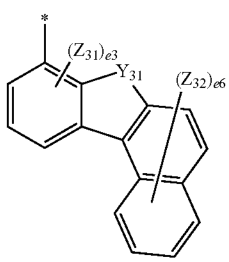
Formula 5-20
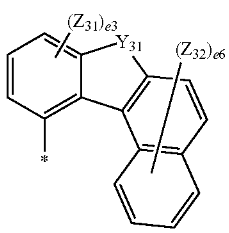
Formula 5-21
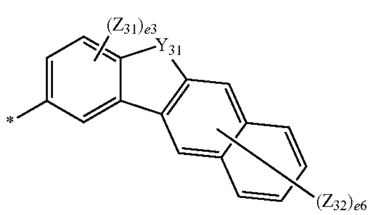
-continued
Formula 5-22
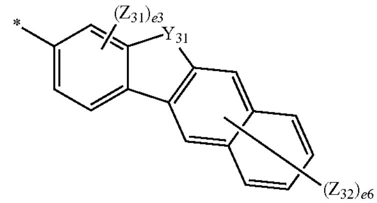
Formula 5-23
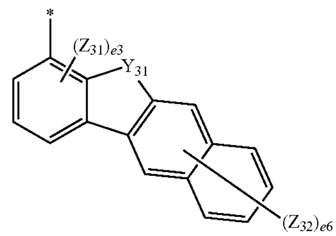
Formula 5-24
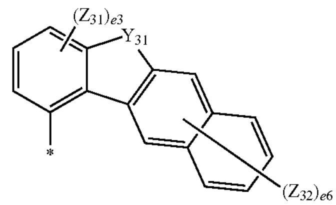
Formula 5-25
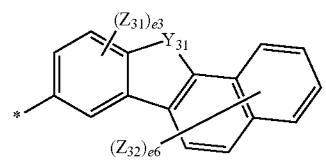
Formula 5-26
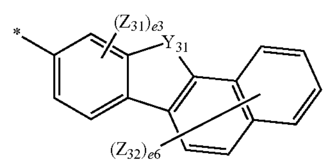
Formula 5-27
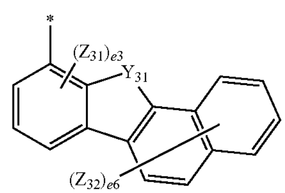
Formula 5-28
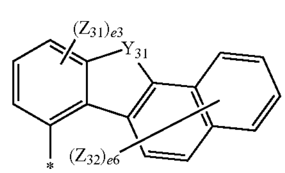
Formula 5-29
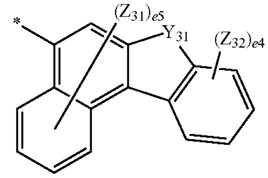

-continued
Formula 5-30
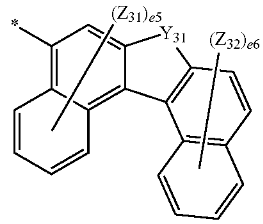
Formula 5-31
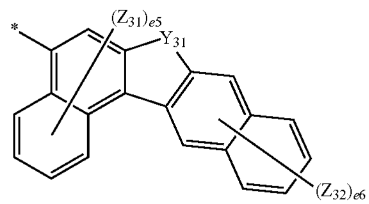
Formula 5-32
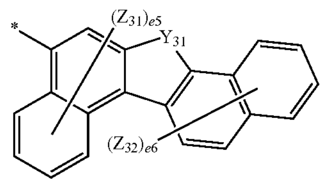
Formula 5-33
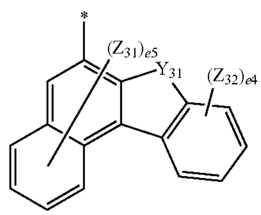
Formula 5-34
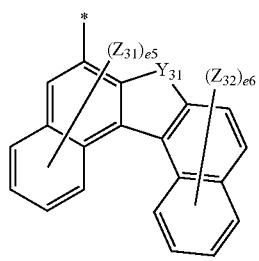
Formula 5-35
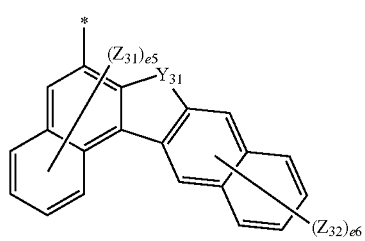
Formula 5-36
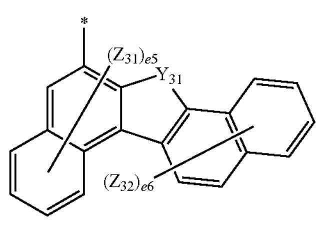
-continued
Formula 5-37
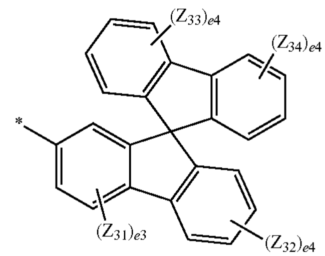
Formula 5-38
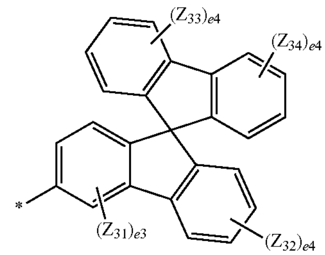
Formula 5-39
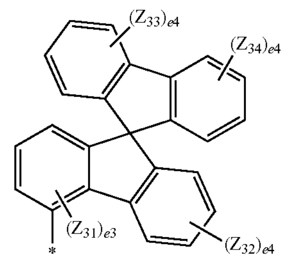
Formula 5-40
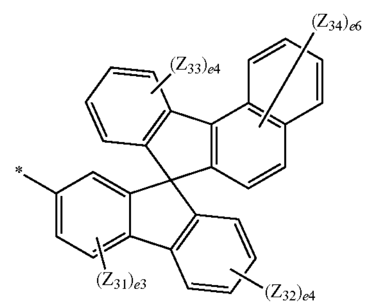
Formula 5-41
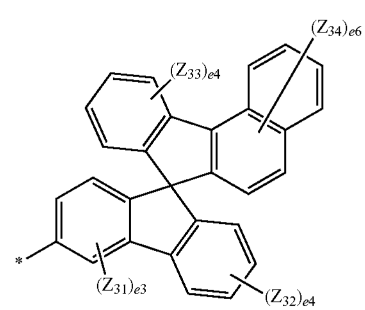

-continued
Formula 5-42
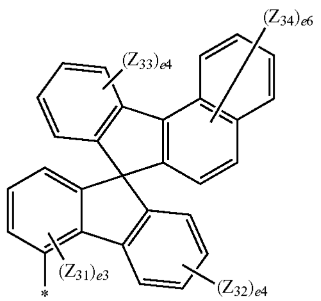
Formula 5-43
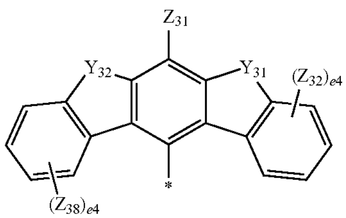
Formula 5-44
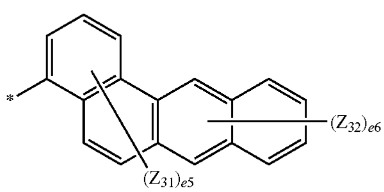
Formula 5-45
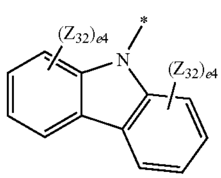
Formula 6-1
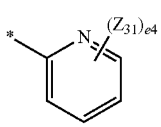
Formula 6-2
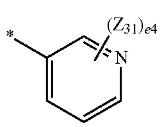
Formula 6-3
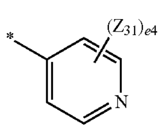
Formula 6-4
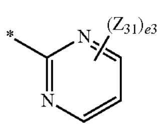
Formula 6-5
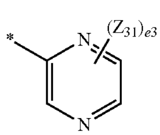
-continued
Formula 6-6
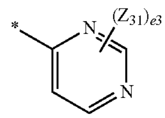
Formula 6-7
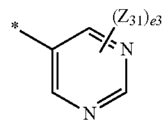
Formula 6-8
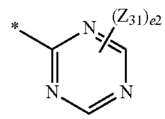
Formula 6-9
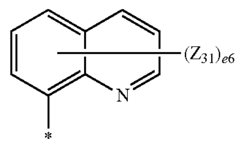
Formula 6-10
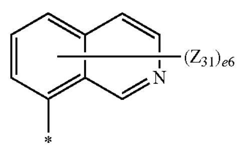
Formula 6-11
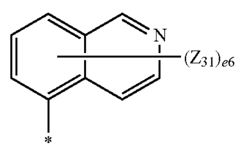
Formula 6-12
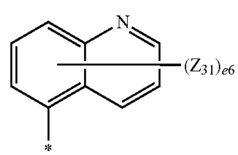
Formula 6-13
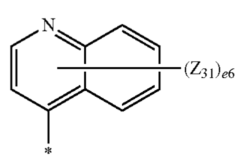
Formula 6-14
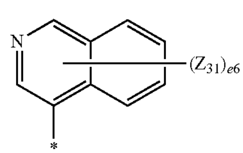
Formula 6-15
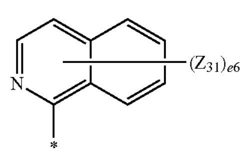
Formula 6-16
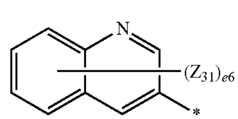

-continued
Formula 6-17
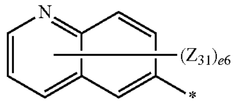
Formula 6-18
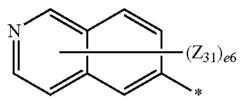
Formula 6-19
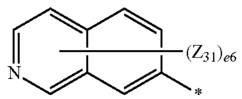
Formula 6-20
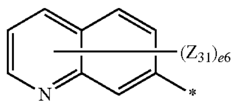
Formula 6-21
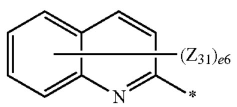
Formula 6-22
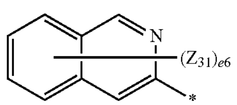
Formula 6-23
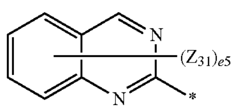
Formula 6-24
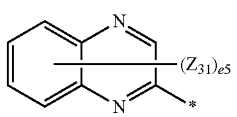
Formula 6-25
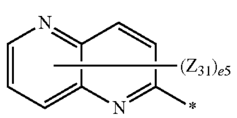
Formula 6-26
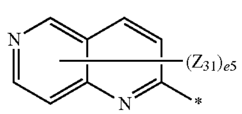
Formula 6-27
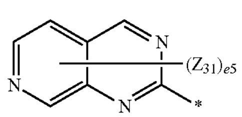
Formula 6-28
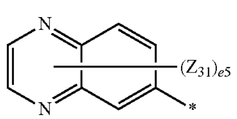
Formula 6-29
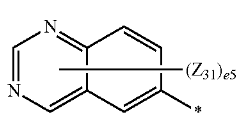
Formula 6-30
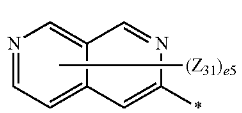
-continued
Formula 6-31
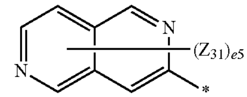
Formula 6-32
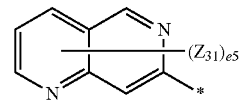
Formula 6-33
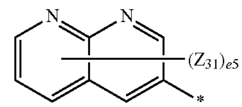
Formula 6-34
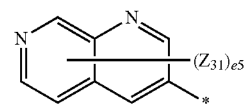
Formula 6-35
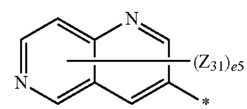
Formula 6-36
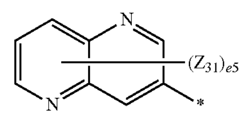
Formula 6-37
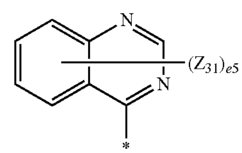
Formula 6-38
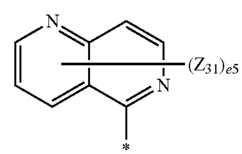
Formula 6-39
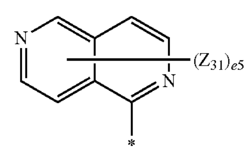
Formula 6-40
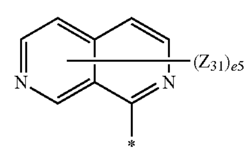
Formula 6-41
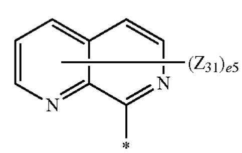
Formula 6-42
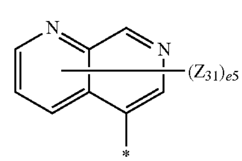

-continued
Formula 6-43
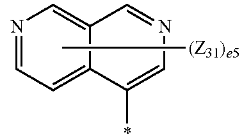
Formula 6-44
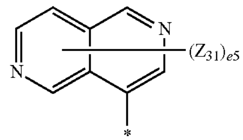
Formula 6-45
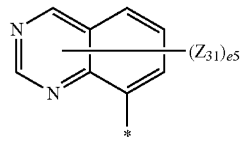
Formula 6-46
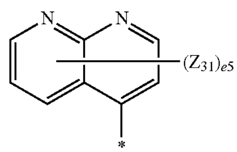
Formula 6-47
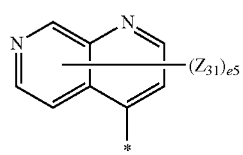
Formula 6-48
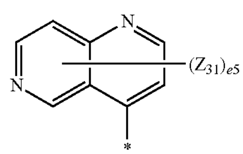
Formula 6-49
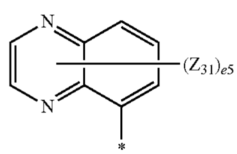
Formula 6-50
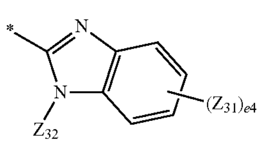
Formula 6-51
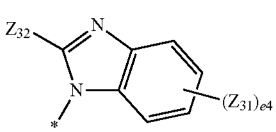
Formula 6-52
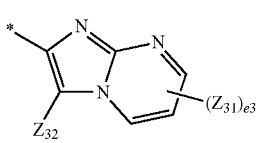
Formula 6-53
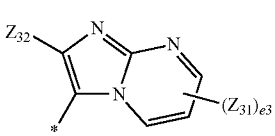
-continued
Formula 6-54
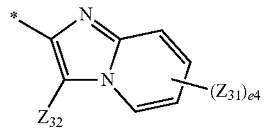
Formula 6-55
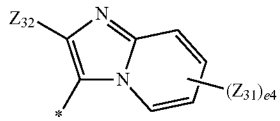
Formula 6-56
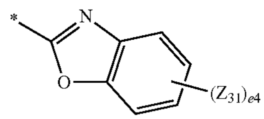
Formula 6-57
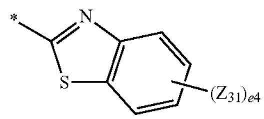
Formula 6-58
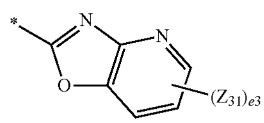
Formula 5-59
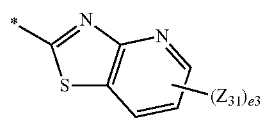
Formula 6-60
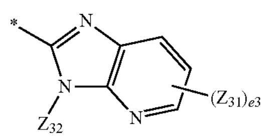
Formula 6-61
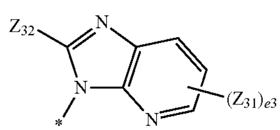
Formula 6-62
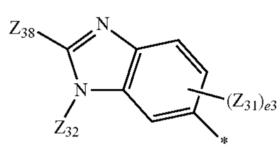
Formula 6-63
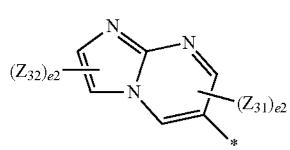
Formula 6-64
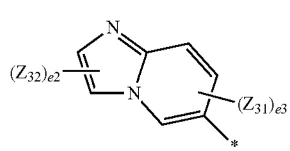

-continued
Formula 6-65
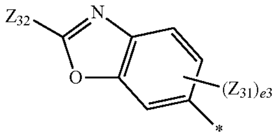
Formula 6-66
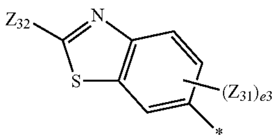
Formula 6-67
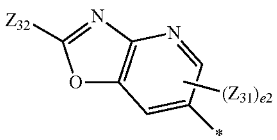
Formula 6-68
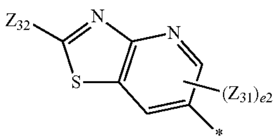
Formula 6-69
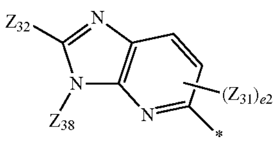
Formula 6-70
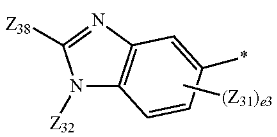
Formula 6-71
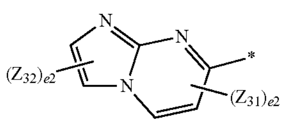
Formula 6-72
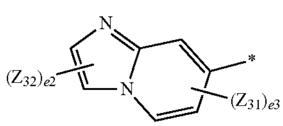
Formula 6-73
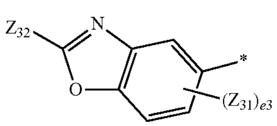
Formula 6-74
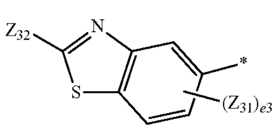
Formula 6-75
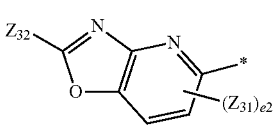
Formula 6-76
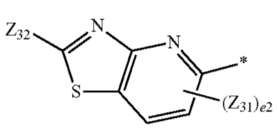
-continued
Formula 6-77
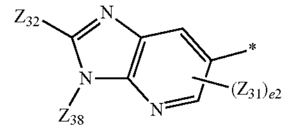
Formula 6-78
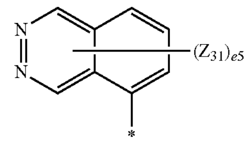
Formula 6-79
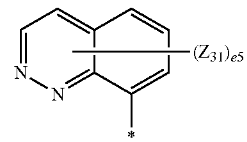
Formula 6-80
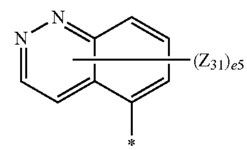
Formula 6-81
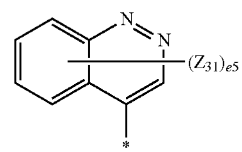
Formula 6-82
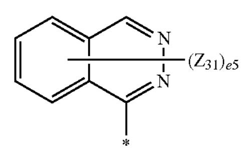
Formula 6-83
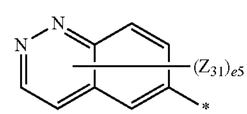
Formula 6-84
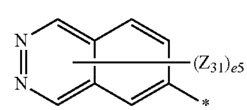
Formula 6-85
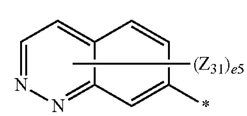
Formula 6-86
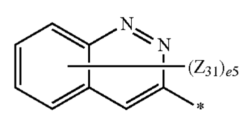
Formula 6-87
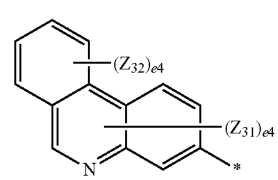

-continued
Formula 6-88
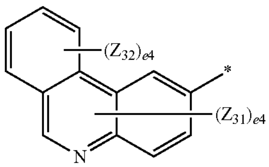
Formula 6-89
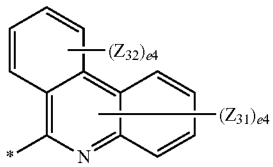
Formula 6-90
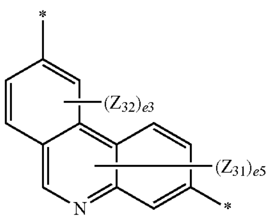
Formula 6-91
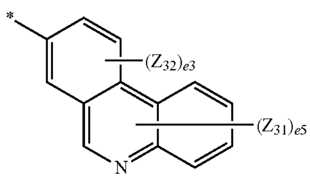
Formula 6-92
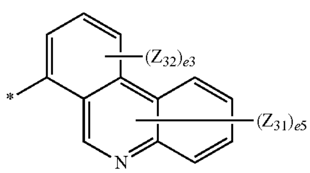
Formula 6-93
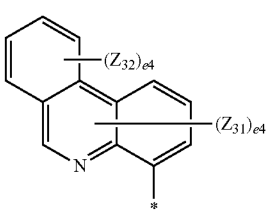
Formula 6-94
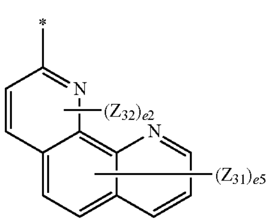
Formula 6-95
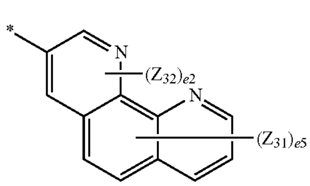
-continued
Formula 6-96
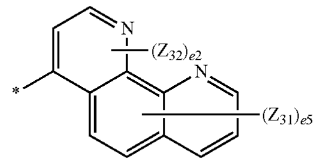
Formula 6-97
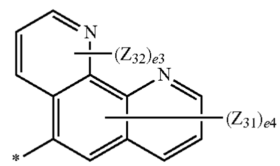
Formula 6-98
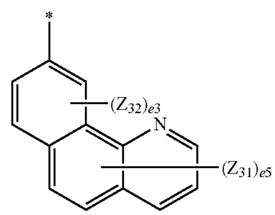
Formula 6-99
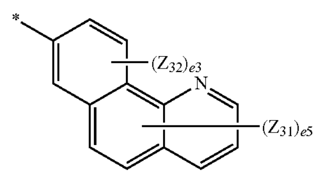
Formula 6-100
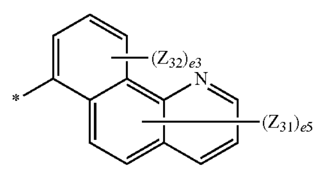
Formula 6-101
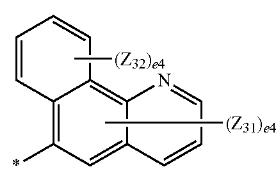
Formula 6-102
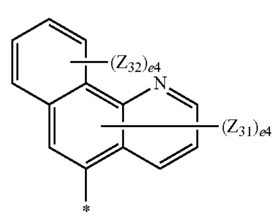
Formula 6-103
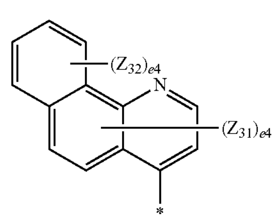

-continued
Formula 6-104
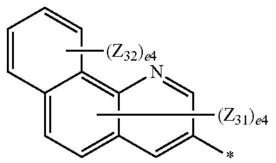
Formula 6-105
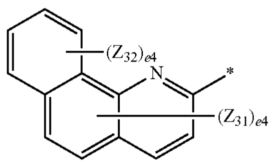
Formula 6-106
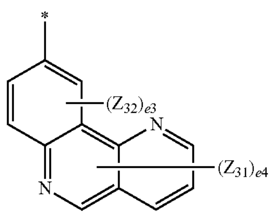
Formula 6-107
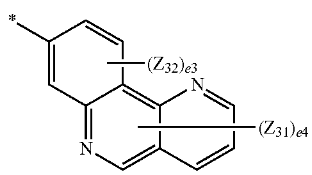
Formula 6-108
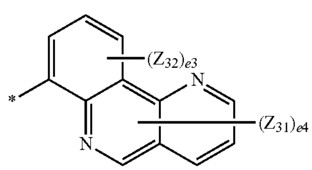
Formula 6-109
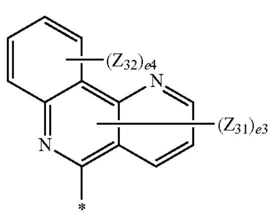
Formula 6-110
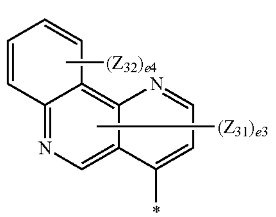
Formula 6-111
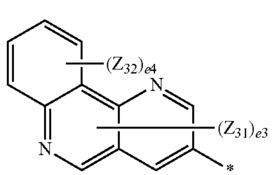
-continued
Formula 6-112
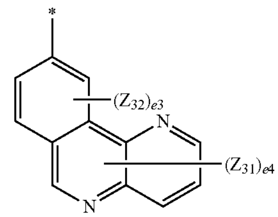
Formula 6-113
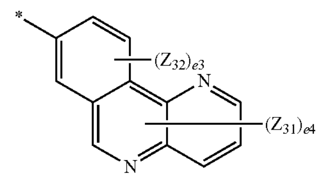
Formula 6-114
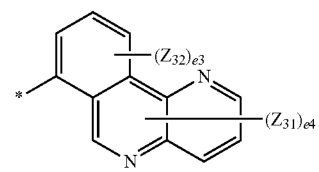
Formula 6-115
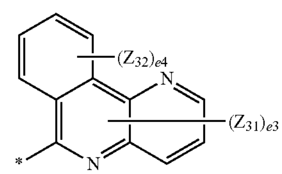
Formula 6-116
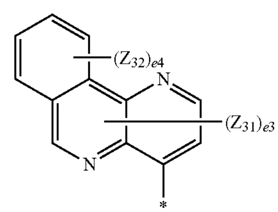
Formula 6-117
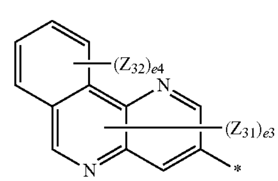
Formula 6-118
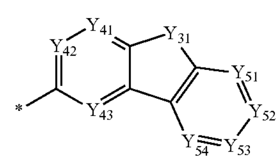
Formula 6-119
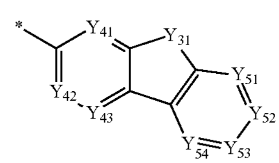

-continued

Formula 6-120

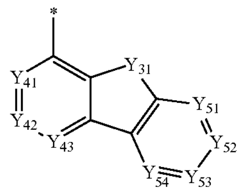

Formula 6-121

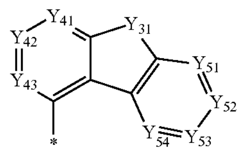

Formula 6-122

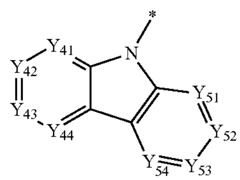

Formula 6-123

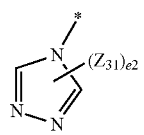

Formula 6-124

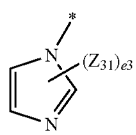

In Formulae 5-1 to 5-45 and 6-1 to 6-124, $Y_{31}$ and $Y_{32}$ may each independently be O, S, $C(Z_{33})(Z_{34})$, $N(Z_{35})$, or $Si(Z_{36})(Z_{37})$, $Y_{41}$ may be N or $C(Z_{41})$, $Y_{42}$ may be N or $C(Z_{42})$, $Y_{43}$ may be N or $C(Z_{43})$, $Y_{44}$ may be N or $C(Z_{44})$, $Y_{51}$ may be N or $C(Z_{51})$, $Y_{52}$ may be N or $C(Z_{52})$, $Y_{53}$ may be N or $C(Z_{53})$, $Y_{54}$ may be N or $C(Z_{54})$, at least one selected from $Y_{41}$ to $Y_{43}$ and $Y_{51}$ to $Y_{54}$ in Formulae 5-118 to 5-121 may be N, and at least one selected from $Y_{41}$ to $Y_{44}$ and $Ys_{51}$ to $Y_{54}$ in Formula 5-122 may be N, $Z_{31}$ to $Z_{37}$, $Z_{41}$ to $Z_{44}$, and $Z_{51}$ to $Z_{54}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, and $—Si(Q_{31})(Q_{32})(Q_{33})$, wherein $Q_1$ to $Q_3$ and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group, e3 may be an integer selected from 0 to 3, e2 may be an integer selected from 0 to 2, e4 may be an integer selected from 0 to 4, e5 may be an integer selected from 0 to 5, e6 may be an integer selected from 0 to 6, e7 may be an integer selected from 0 to 7, e9 may be an integer selected from 0 to 9, and

* indicates a binding site to a neighboring atom.

In various embodiments, in Formulae 1A to 1E, 2A, and 2B, $R_1$ to $R_4$, $R_{22}$ to $R_{24}$, $R_{27}$, and $R_{28}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

groups represented by Formulae 9-1 to 9-100 and 10-1 to 10-121; and $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$, and $R_{11}$ to $R_{14}$ and $R_{21}$ may each independently be selected from groups represented by Formulae 9-1 to 9-100 and 10-1 to 10-121; and $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$:

Formula 9-1

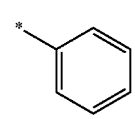

-continued
Formula 9-2
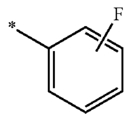
Formula 9-3
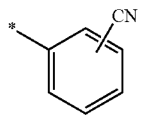
Formula 9-4
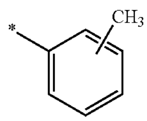
Formula 9-5
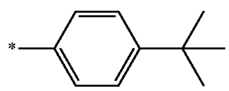
Formula 9-6
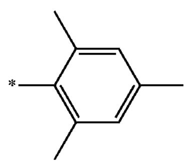
Formula 9-7
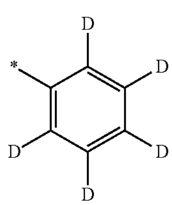
Formula 9-8
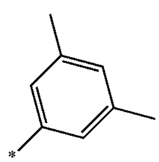
Formula 9-9
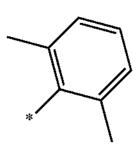
Formula 9-10
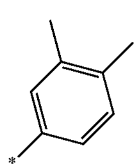
Formula 9-11
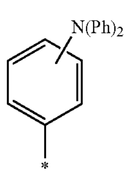
-continued
Formula 9-12
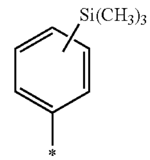
Formula 9-13
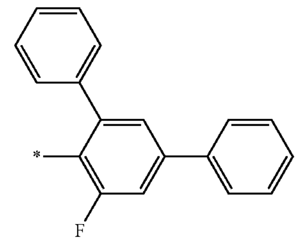
Formula 9-14
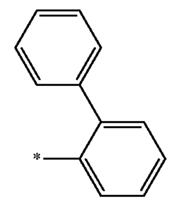
Formula 9-15
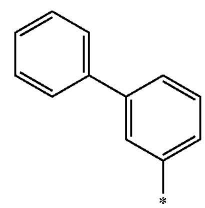
Formula 9-16
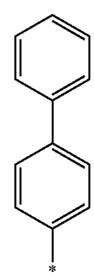
Formula 9-17
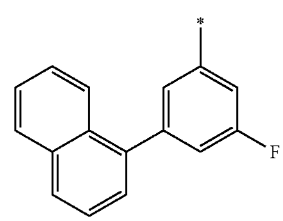
Formula 9-18
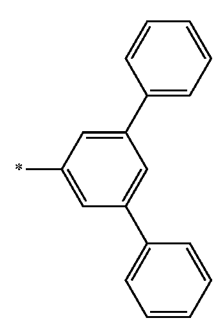

-continued
Formula 9-19
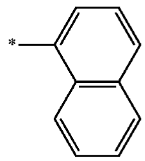
Formula 9-20
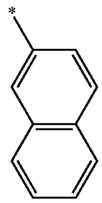
Formula 9-21
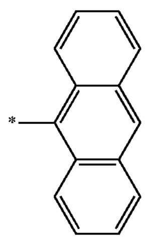
Formula 9-22
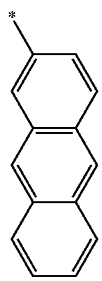
Formula 9-23
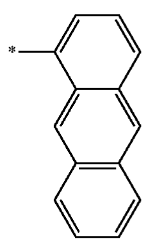
Formula 9-24
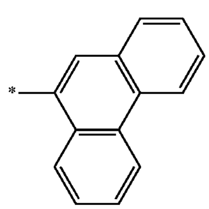
Formula 9-25
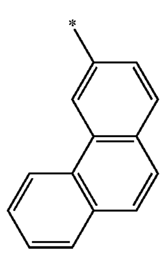
-continued
Formula 9-26
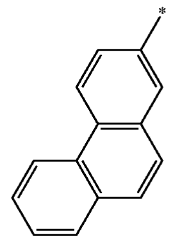
Formula 9-27
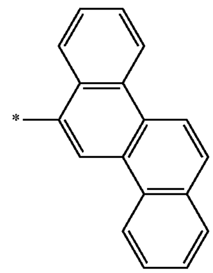
Formula 9-28
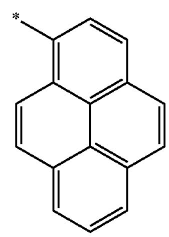
Formula 9-29
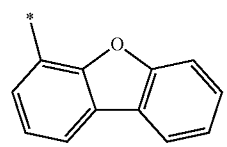
Formula 9-30
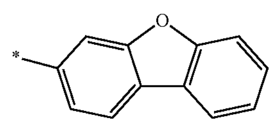
Formula 9-31
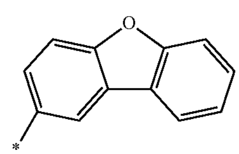
Formula 9-32
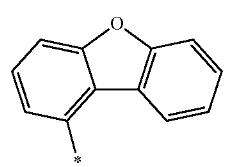
Formula 9-33
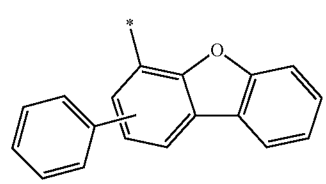

-continued
Formula 9-34
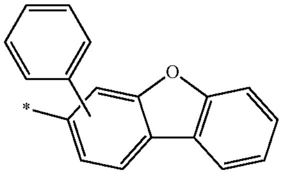
Formula 9-35
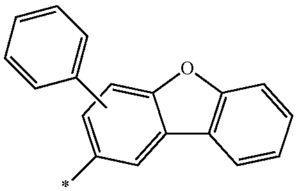
Formula 9-36
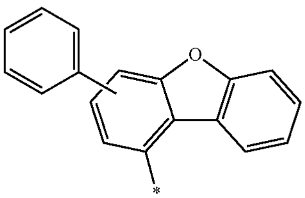
Formula 9-37
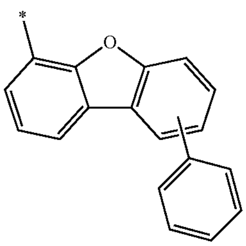
Formula 9-38
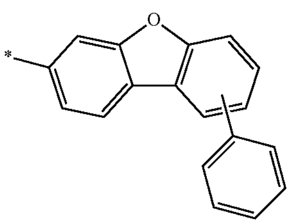
Formula 9-39
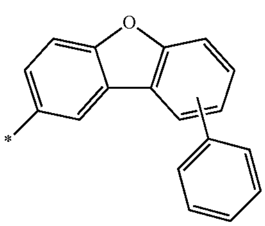
Formula 9-40
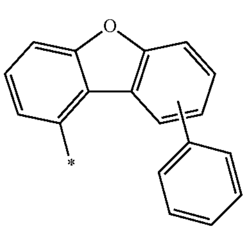
-continued
Formula 9-41
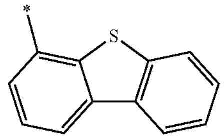
Formula 9-42
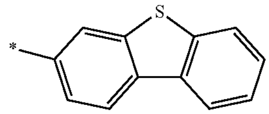
Formula 9-43
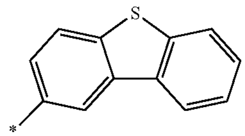
Formula 9-44
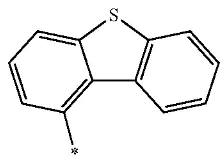
Formula 9-45
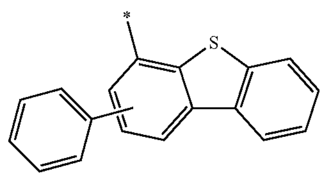
Formula 9-46
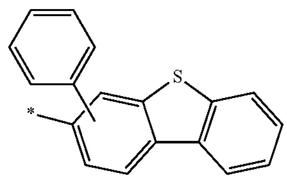
Formula 9-47
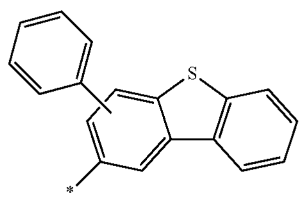
Formula 9-48
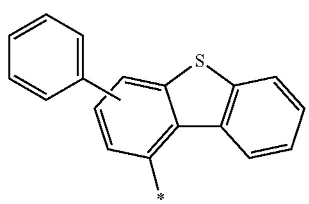
Formula 9-49
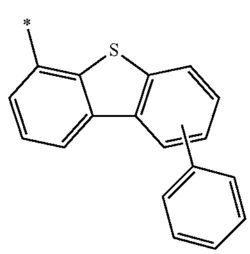

-continued
Formula 9-50
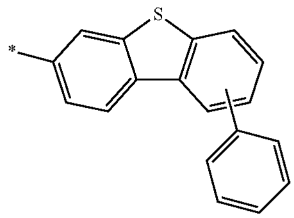
Formula 9-51
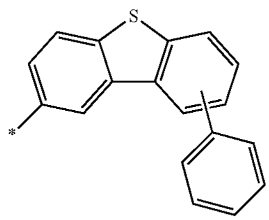
Formula 9-52
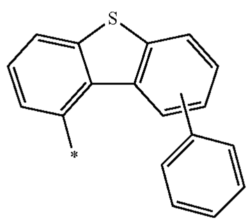
Formula 9-53
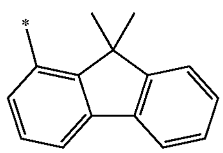
Formula 9-54
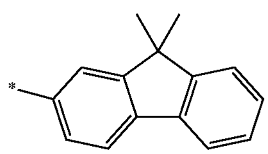
Formula 9-55
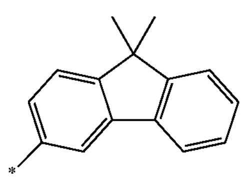
Formula 9-56
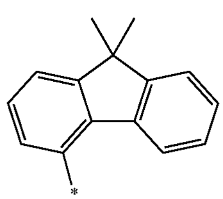
Formula 9-57
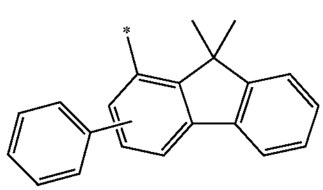
-continued
Formula 9-58
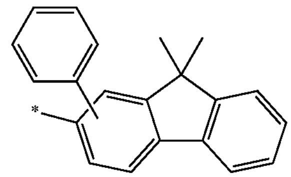
Formula 9-59
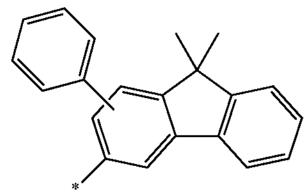
Formula 9-60
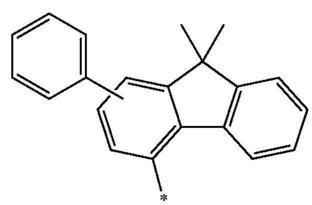
Formula 9-61
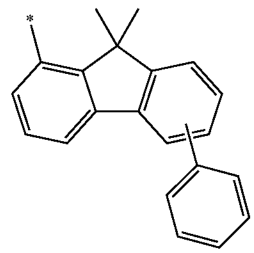
Formula 9-62
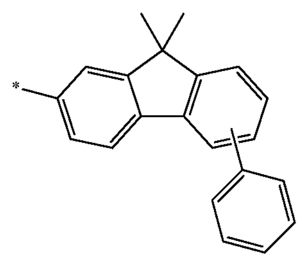
Formula 9-63
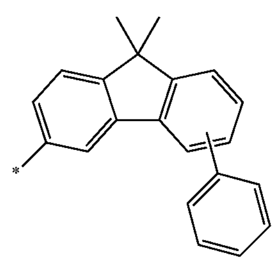
Formula 9-64
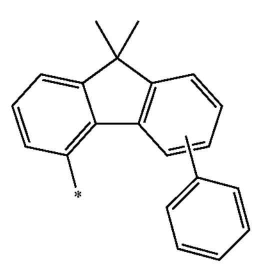

-continued
Formula 9-65
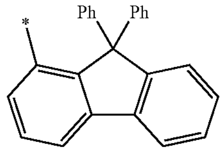
Formula 9-66
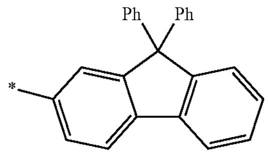
Formula 9-67
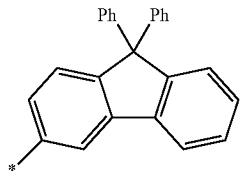
Formula 9-68
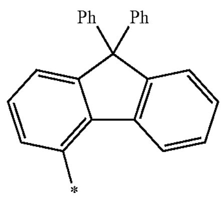
Formula 9-69
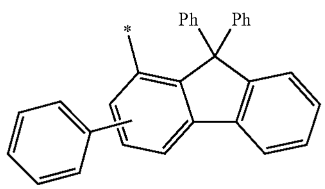
Formula 9-70
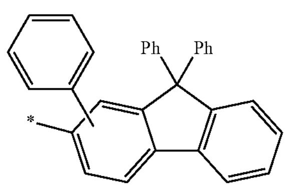
Formula 9-71
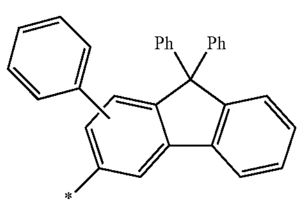
Formula 9-72
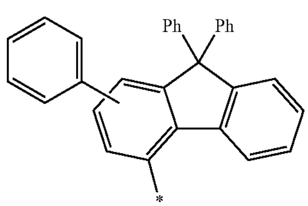
-continued
Formula 9-73
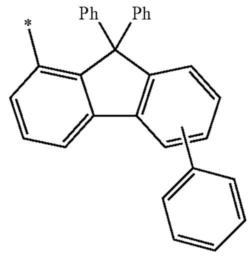
Formula 9-74
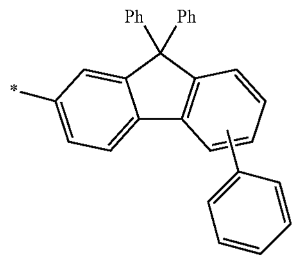
Formula 9-75
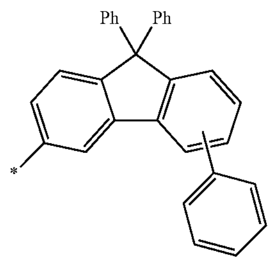
Formula 9-76
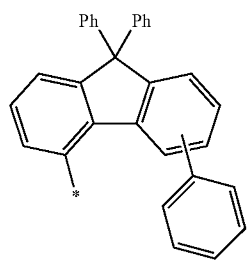
Formula 9-77
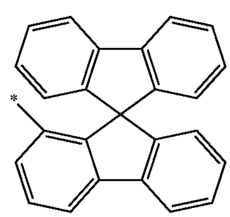
Formula 9-78
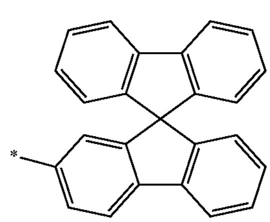

-continued
Formula 9-79
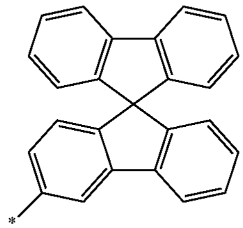
Formula 9-80
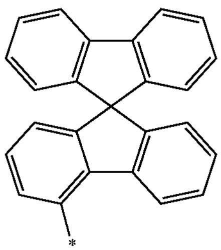
Formula 9-81
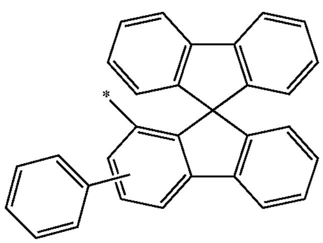
Formula 9-82
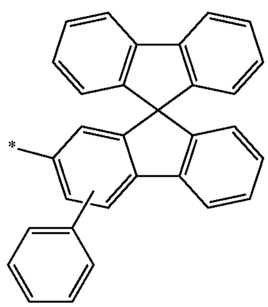
Formula 9-83
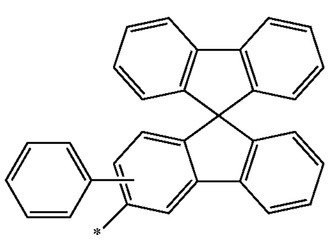
Formula 9-84
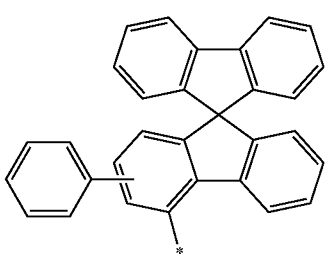
-continued
Formula 9-85
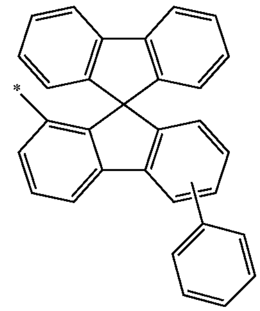
Formula 9-86
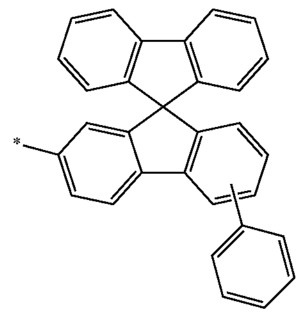
Formula 9-87
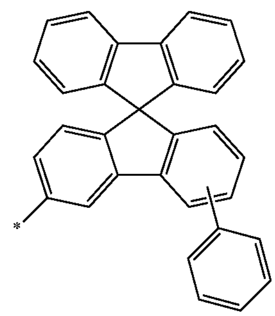
Formula 9-88
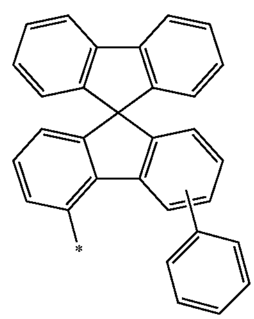
Formula 9-89
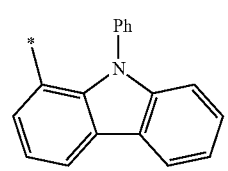
Formula 9-90
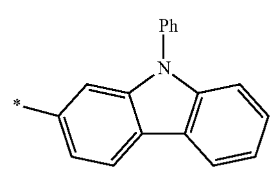

Formula 9-91
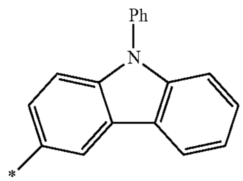
Formula 9-92
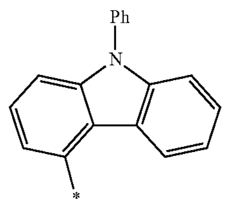
Formula 9-93
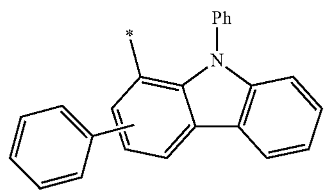
Formula 9-94
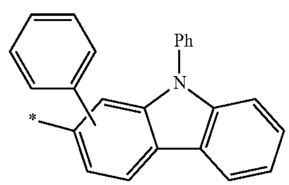
Formula 9-95
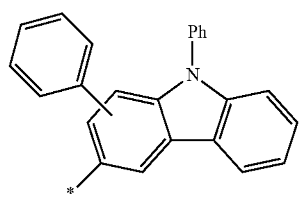
Formula 9-96
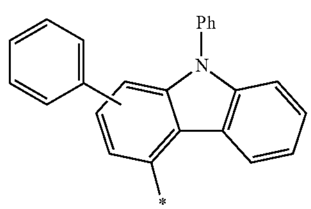
Formula 9-97
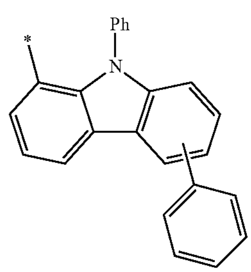
Formula 9-98
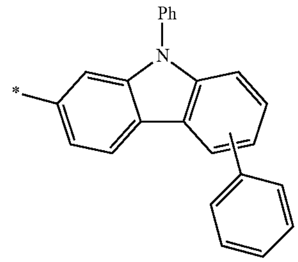
Formula 9-99
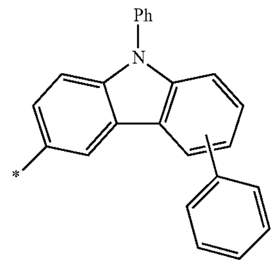
Formula 9-100
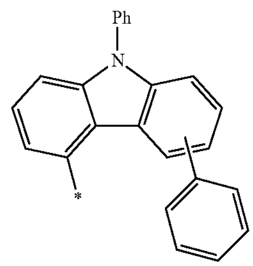
Formula 10-1
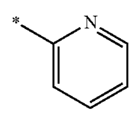
Formula 10-2
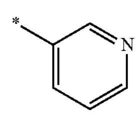
Formula 10-3
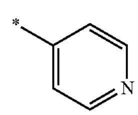
Formula 10-4
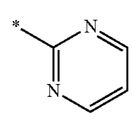
Formula 10-5
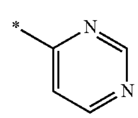
Formula 10-6
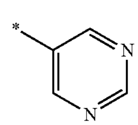
Formula 10-7
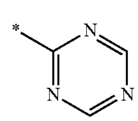

-continued
Formula 10-8
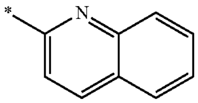
Formula 10-9
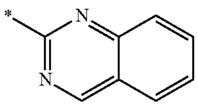
Formula 10-10
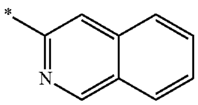
Formula 10-11
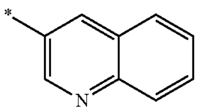
Formula 10-12
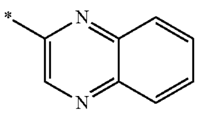
Formula 10-13
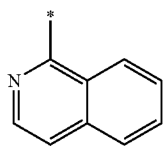
Formula 10-14
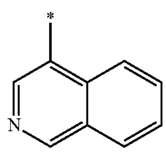
Formula 10-15
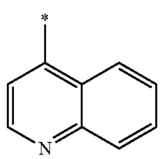
Formula 10-16
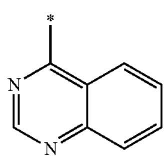
Formula 10-17
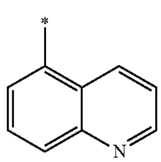
Formula 10-18
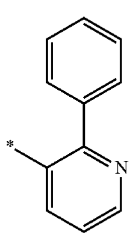
-continued
Formula 10-19
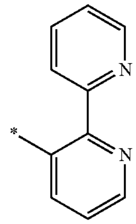
Formula 10-20
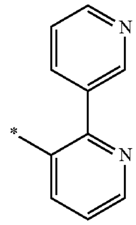
Formula 10-21
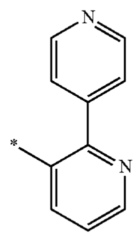
Formula 10-22
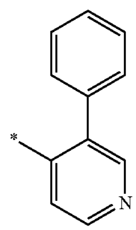
Formula 10-23
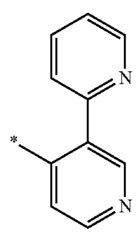
Formula 10-24
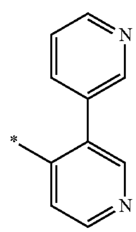
Formula 10-25
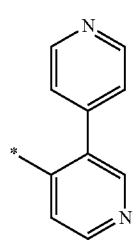

-continued
Formula 10-26
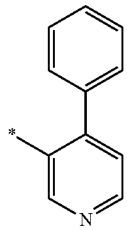
Formula 10-27
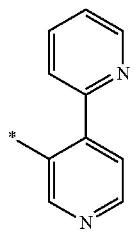
Formula 10-28
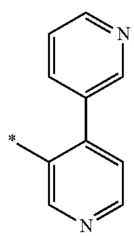
Formula 10-29
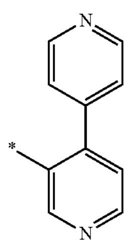
Formula 10-30
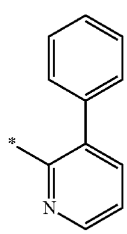
Formula 10-31
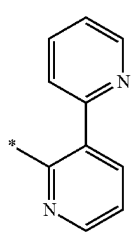
-continued
Formula 10-32
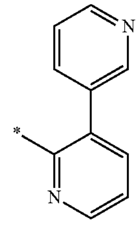
Formula 10-33
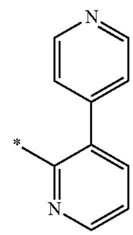
Formula 10-34
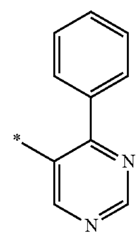
Formula 10-35
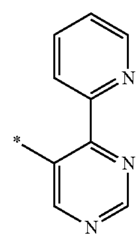
Formula 10-36
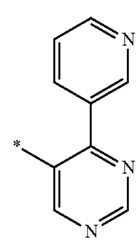
Formula 10-37
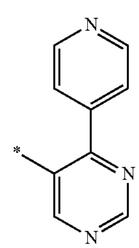

-continued
Formula 10-38
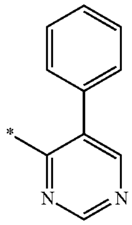
Formula 10-39
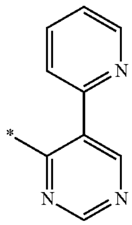
Formula 10-40
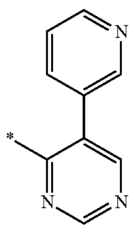
Formula 10-41
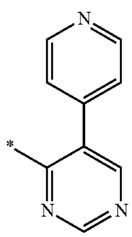
Formula 10-42
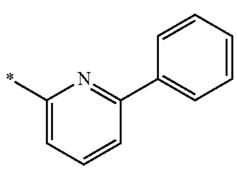
Formula 10-43
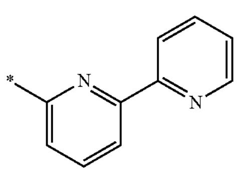
Formula 10-44
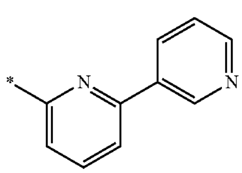
Formula 10-45
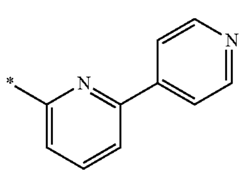
-continued
Formula 10-46
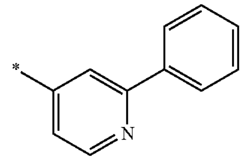
Formula 10-47
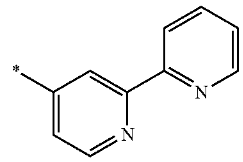
Formula 10-48
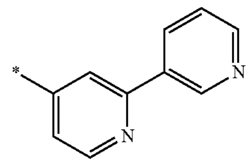
Formula 10-49
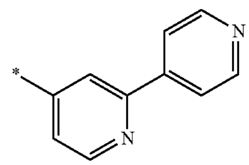
Formula 10-50
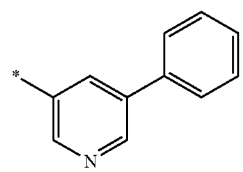
Formula 10-51
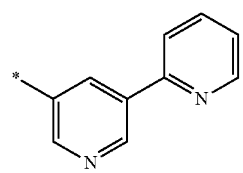
Formula 10-52
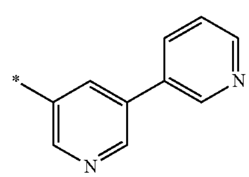
Formula 10-53
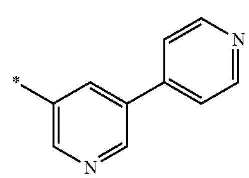
Formula 10-54
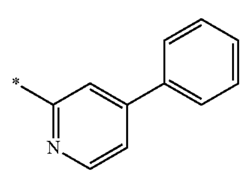

-continued
Formula 10-55
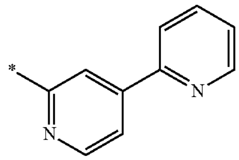
Formula 10-56
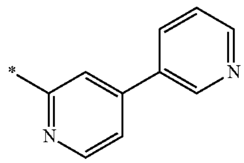
Formula 10-57
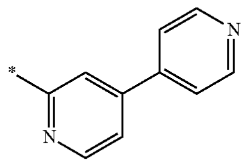
Formula 10-58
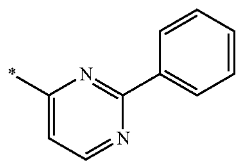
Formula 10-59
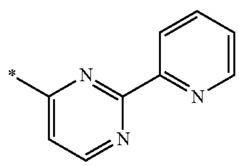
Formula 10-60
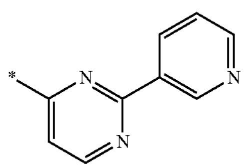
Formula 10-61
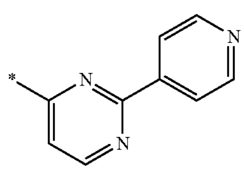
Formula 10-62
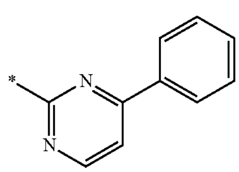
Formula 10-63
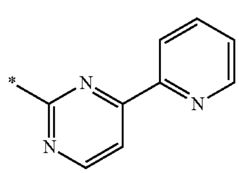
-continued
Formula 10-64
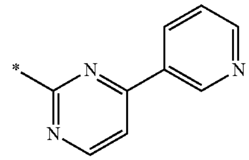
Formula 10-65
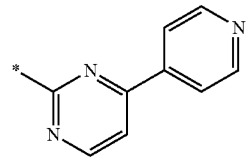
Formula 10-66
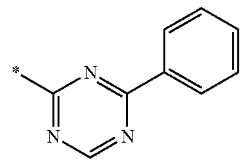
Formula 10-67
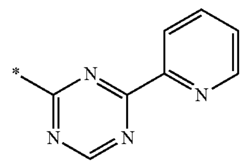
Formula 10-68
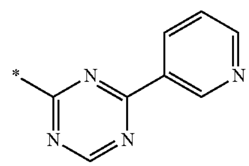
Formula 10-69
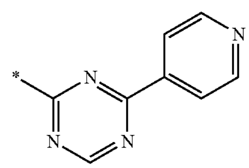
Formula 10-70
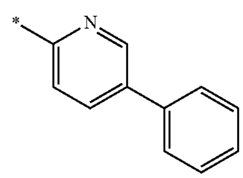
Formula 10-71
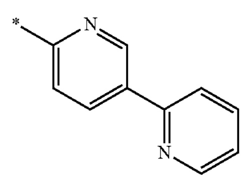
Formula 10-72
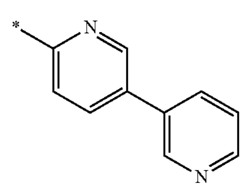

-continued
Formula 10-73
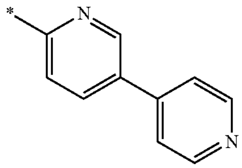
Formula 10-74
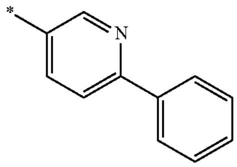
Formula 10-75
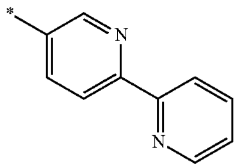
Formula 10-76
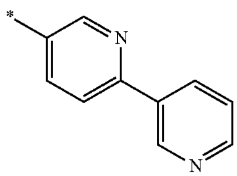
Formula 10-77
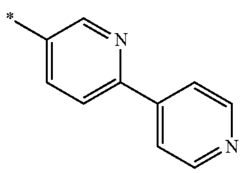
Formula 10-78
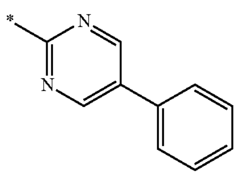
Formula 10-79
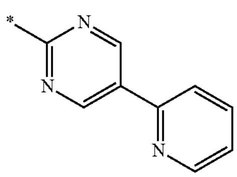
Formula 10-80
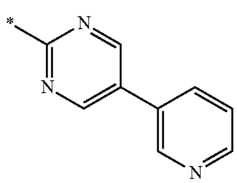
Formula 10-81
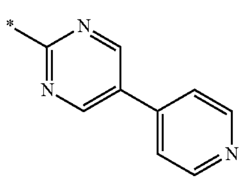
-continued
Formula 10-82
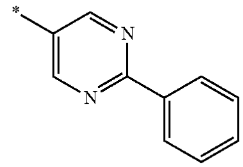
Formula 10-83
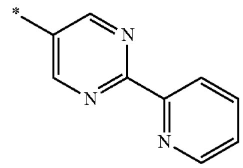
Formula 10-84
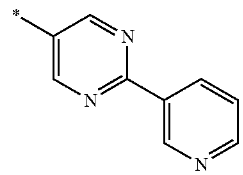
Formula 10-85
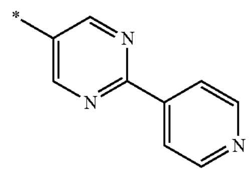
Formula 10-86
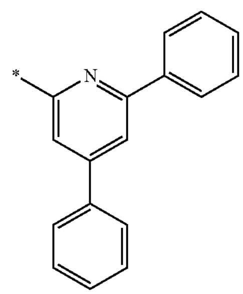
Formula 10-87
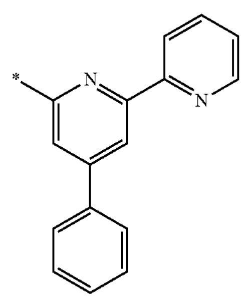
Formula 10-88
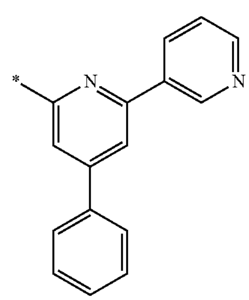

-continued
Formula 10-89
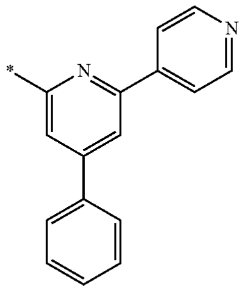
Formula 10-90
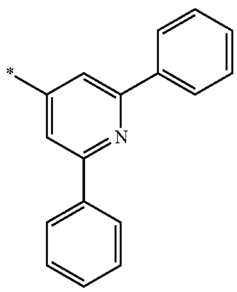
Formula 10-91
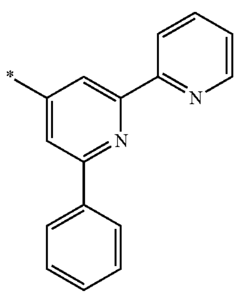
Formula 10-92
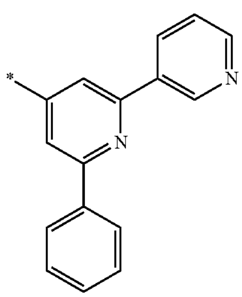
Formula 10-93
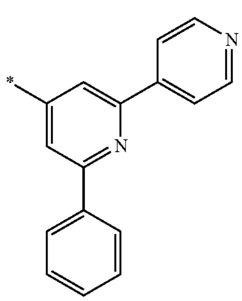
-continued
Formula 10-94
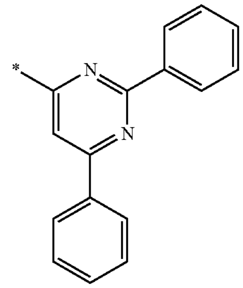
Formula 10-95
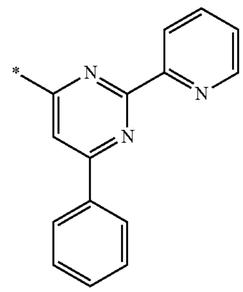
Formula 10-96
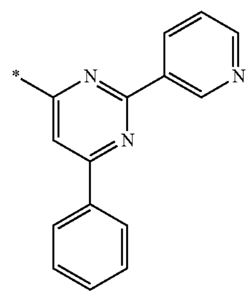
Formula 10-97
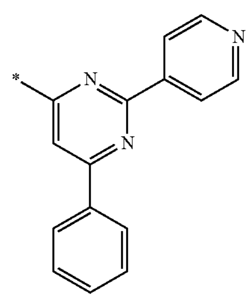
Formula 10-98
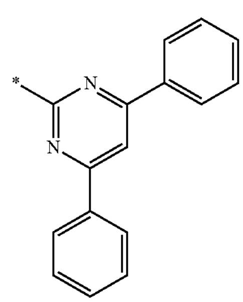

Formula 10-99
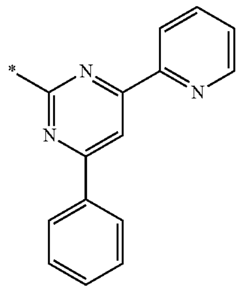
Formula 10-100
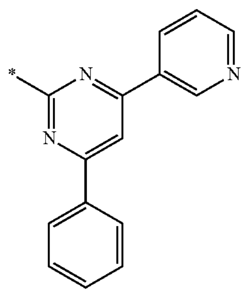
Formula 10-101
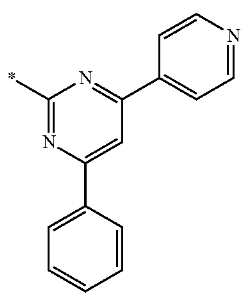
Formula 10-102
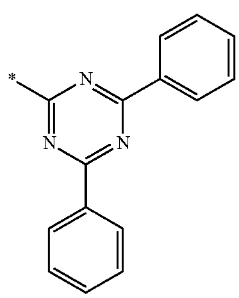
Formula 10-103
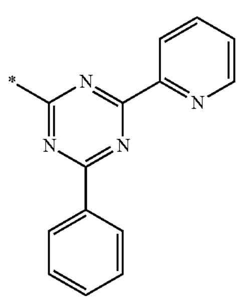
Formula 10-104
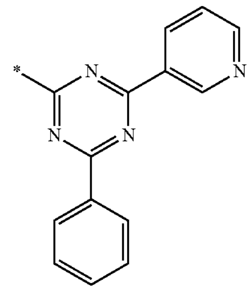
Formula 10-105
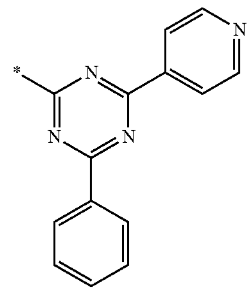
Formula 10-106
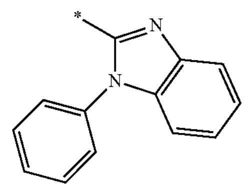
Formula 10-107
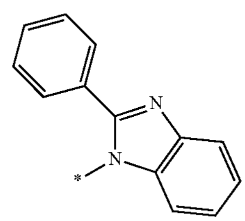
Formula 10-108
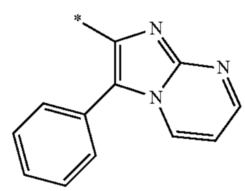
Formula 10-109
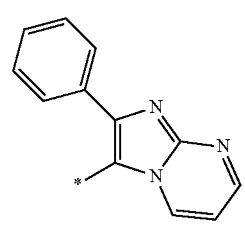
Formula 10-110
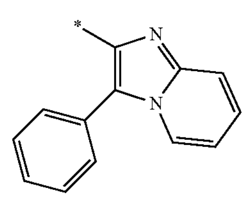

-continued

Formula 10-111

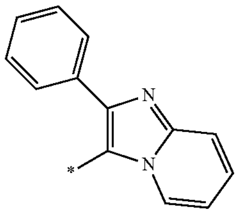

Formula 10-112

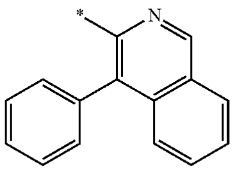

Formula 10-113

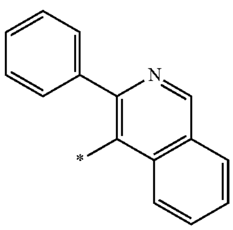

Formula 10-114

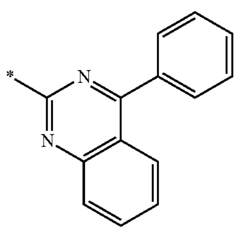

Formula 10-115

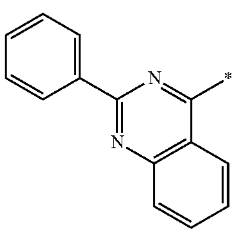

Formula 10-116

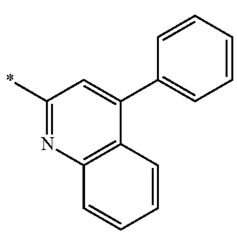

Formula 10-117

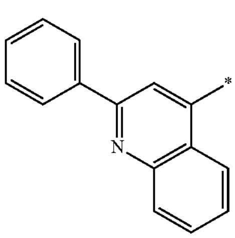

-continued

Formula 10-118

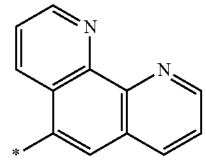

Formula 10-119

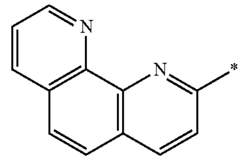

Formula 10-120

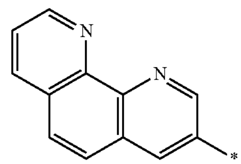

Formula 10-121

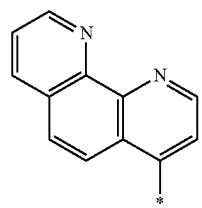

In Formulae 9-1 to 9-100 and 10-1 to 10-121, Ph refers to a phenyl group, and * indicates a binding site to a neighboring atom.

In Formulae 1A, 1B, 2A, and 2B, b to b4, b11, b12, b21, and b22 indicate the number of $R_1$(s), the number of $R_2$(s), the number of $R_3$(s), the number of $R_4$(s), the number of $R_{11}$(s), the number of $R_{12}$(s), the number of $R_{21}$(s), and the number of $R_{22}$(s), respectively. b1 to b4, b11, b12, b21, and b22 may each independently be an integer selected from 1 to 3.

When b1 is two or more, two or more $R_1$ (s) may be identical to or different from each other, when b2 is two or more, two or more $R_2$(s) may be identical to or different from each other, when b3 is two or more, two or more $R_3$(s) may be identical to or different from each other, when b4 is two or more, two or more $R_4$(s) may be identical to or different from each other, when b11 is two or more, two or more $R_{11}$(s) may be identical to or different from each other, when b12 is two or more, two or more $R_{12}$(s) may be identical to or different from each other, when b21 is two or more, two or more $R_{21}$(s) may be identical to or different from each other, and when b22 is two or more, two or more $R_{22}$(s) may be identical to or different from each other.

In Formulae 1A, 1B, 2A, and 2B, c1 to c4 indicate the number of $*-[(L_1)_{a1}-(R_1)_{b1}]$(s), the number of $*-[(L_2)_{a2}-(R_2)_{b2}]$(s), the number of $*-[(L_3)_{a3}-(R_3)_{b3}]$(s), and the number of $*-[(L_4)_{a4}-(R_4)_{b4}]$(s), respectively. c1 and c2 may each independently be an integer selected from 0 to 8, and c3 and c4 may each independently be an integer selected from 0 to 4.

When c1 is two or more, two or more $*-[(L_1)_{a1}-(R_1)_{b1}]$(s) may be identical to or different from each other, when c2 is two or more, two or more $*-[(L_2)_{a2}-(R_2)_{b2}]$(S) may be identical to or different from each other, when c3 is two or more, two or more $*-[(L_3)_{a3}-(R_3)_{b3}]$(s) may be identical to or different from each other, and when c4 is two or more, two or more *-[$(L_4)_{a4}$-$(R_4)_{b4}$](s) may be identical to or different from each other.

For example, in Formulae 1A, 1B, 2A, and 2B, the sum of c1 to c4 may be 1, 2, or 3.

In various embodiments, the first compound may be represented by one selected from Formulae 1-1 to 1-3:

<Formula 1-1>

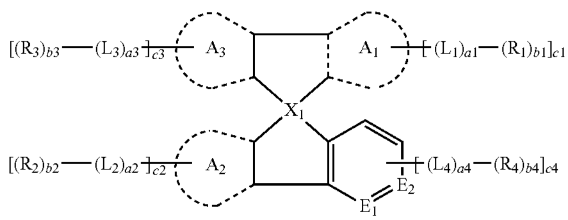

<Formula 1-2>

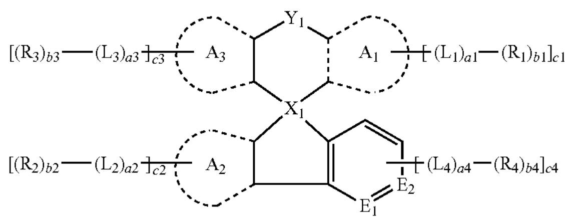

<Formula 1-3>

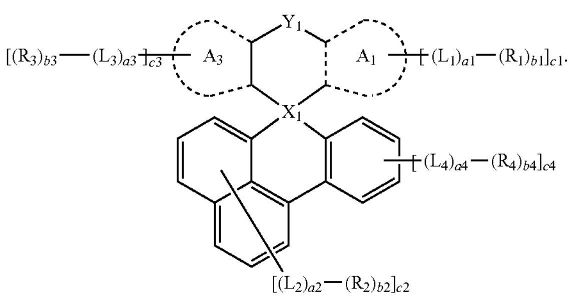

In Formulae 1-1 to 1-3, rings $A_1$ to $A_3$, $X_1$, $Y_1$, $E_1$, $E_2$, $L_1$ to $L_4$, a1 to a4, $R_1$ to $R_4$, b1 to b4, c1, c2, and c4 are the same as described above, c2 may be an integer selected from 0 to 6, $Y_1$ may be selected from N[$(L_{11})_{a11}$-$(R_{11})_{b11}$], C($R_{11}$)($R_{13}$), Si($R_{11}$)($R_{13}$), O, S, and Se, and $L_{11}$, a11, $R_{11}$, $R_{13}$, and b11 are the same as described above.

For example, in Formulae 1-1 to 1-3, ring $A_1$ may be selected from a benzene group, a naphthalene group, a pyridine group, a dibenzofuran group, and a pyrimidine group, rings $A_2$ and $A_3$ may each independently be selected from a benzene group, a naphthalene group, an anthracene group, a phenanthrene group, an indene group, an indenopyridine group, a fluorene group, a pyridine group, a pyrimidine group, a pyrazine group, a pyrrole group, an imidazole group, a quinoline group, an isoquinoline group, a quinazoline group, a phenanthroline group, a phenanthridine group, a furan group, a thiophene group, an indole group, an indolocarbazole group, a benzofuran group, a benzofurocarbazole group, a benzofuropyrimidine group, a benzothiophene group, a benzoxazole group, a benzothiazole group, a benzoimidazole group, a carbazole group, a dibenzofuran group, a dibenzothiophene group, a pyridoindole group, a dipyridofuran group, a dipyridothiophene group, a pyrimidobenzofuran group, a dipyridopyrrole group, and a pyrimidobenzothiophene group, and $R_1$ to $R_4$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$).

In various embodiments, the first compound may be selected from Compounds 1-1 to 1-160:

1-1

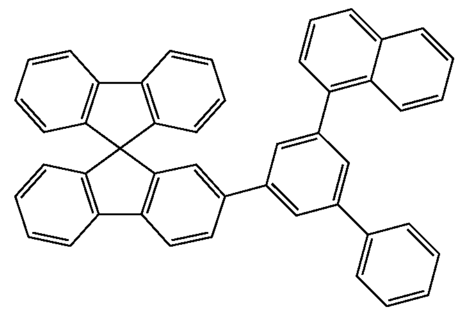

1-2

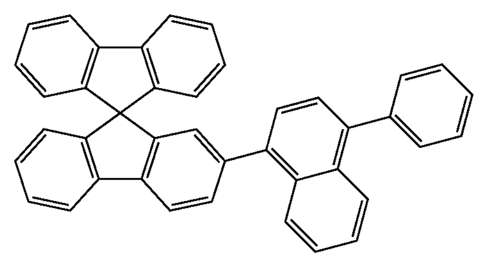

1-3

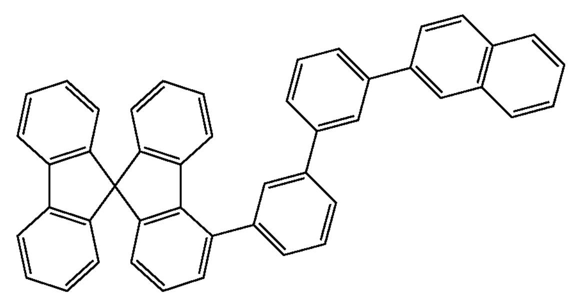

1-4

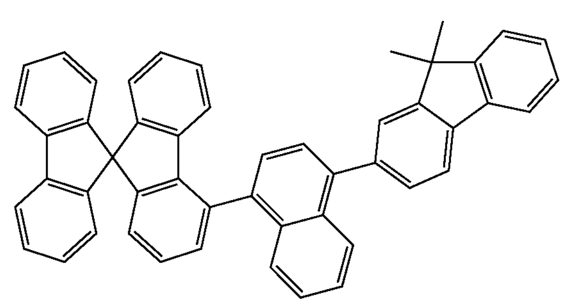

-continued
1-5
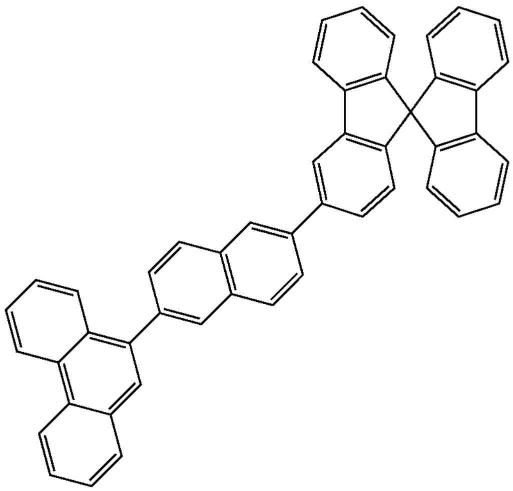
1-6
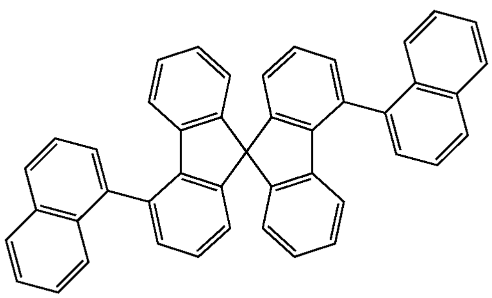
1-7
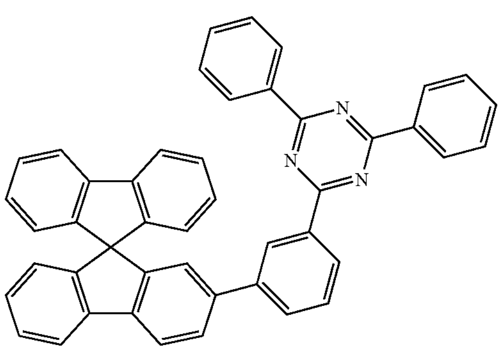
-continued
1-8
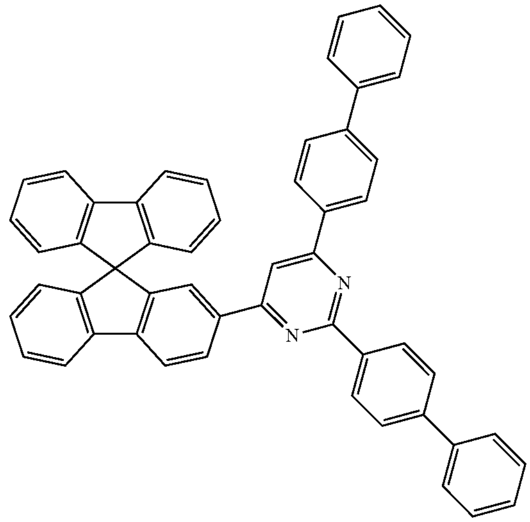
1-9
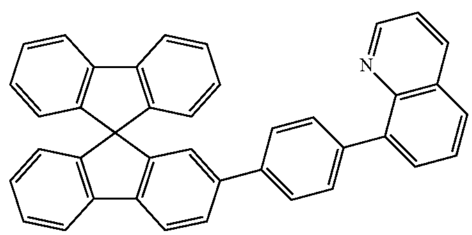
1-10
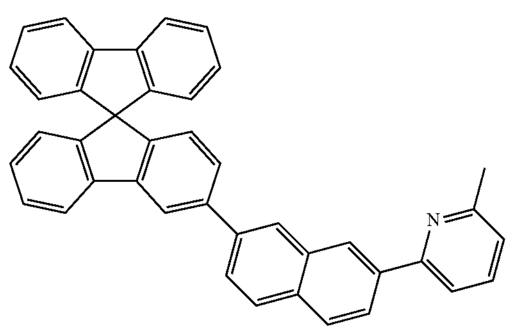
1-11
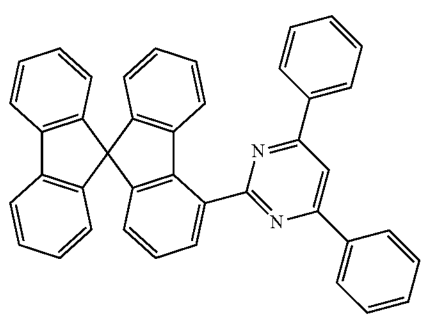

1-12
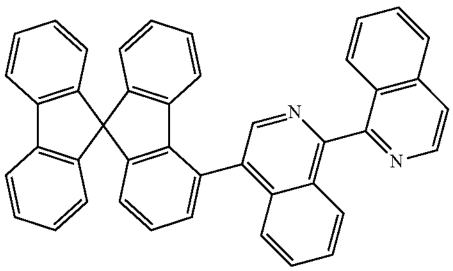
1-13
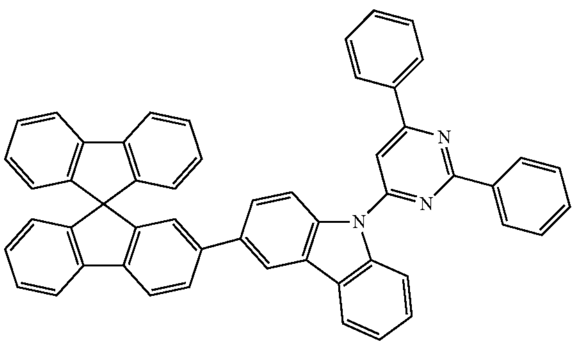
1-14
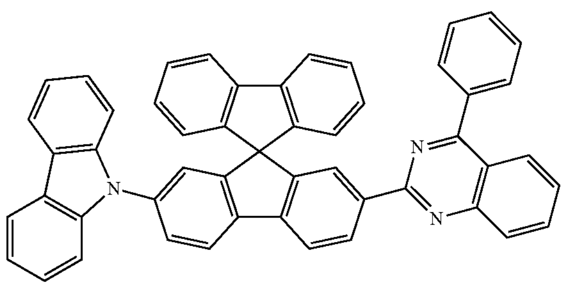
1-15
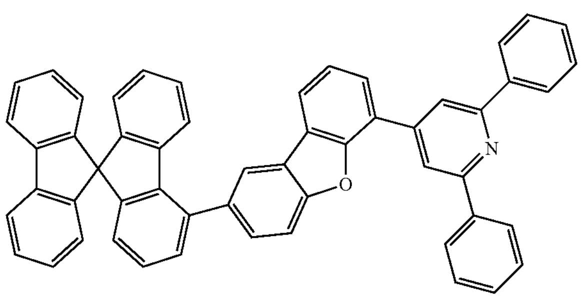
1-16
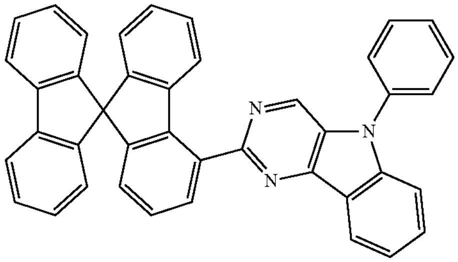
1-17
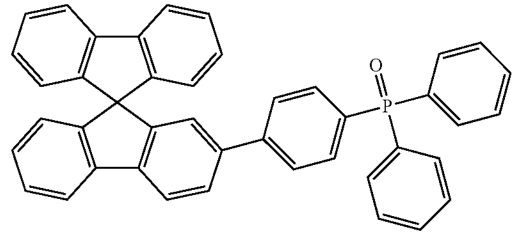
1-18
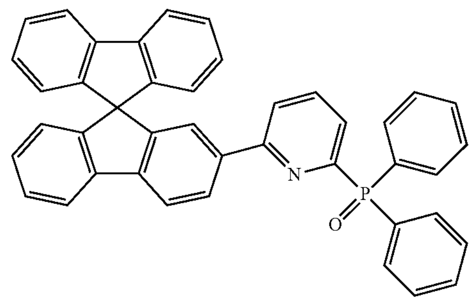
1-19
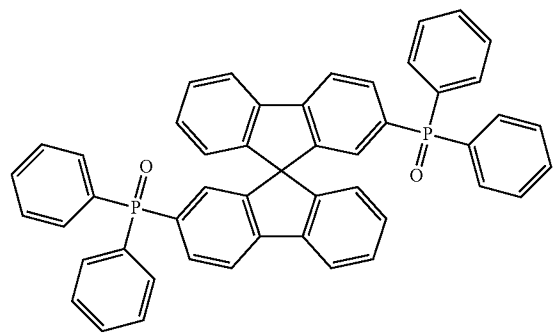
1-20
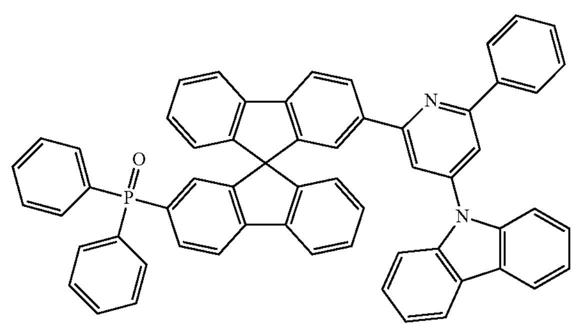
1-21
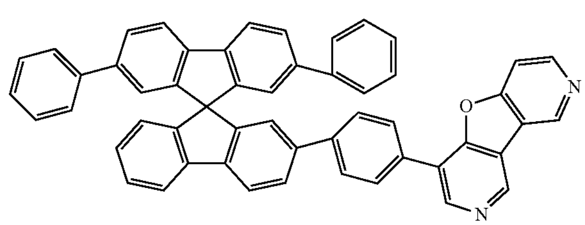

-continued
1-22
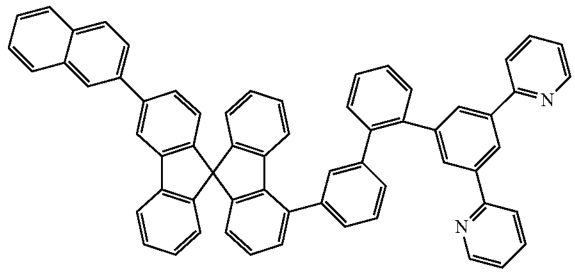
1-23
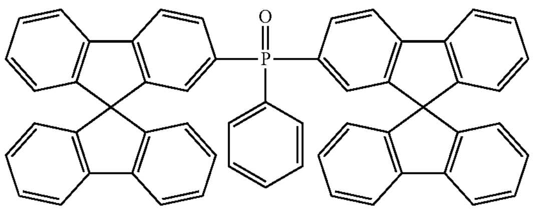
1-24
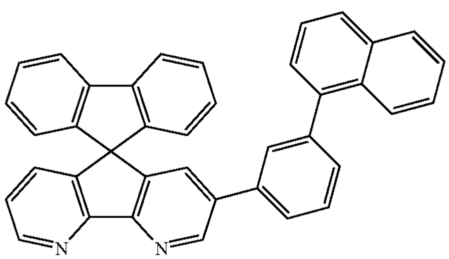
1-25
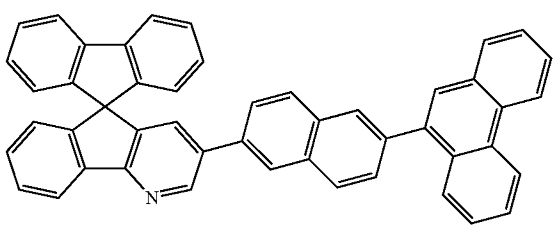
1-26
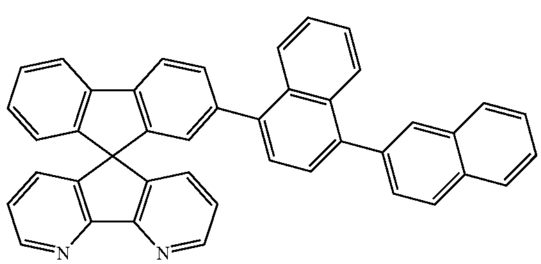
1-27
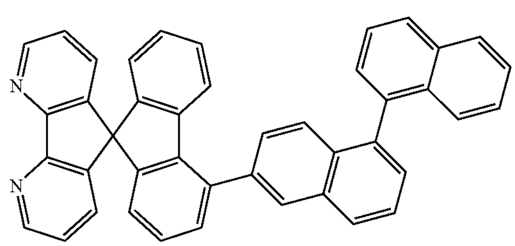
-continued
1-28
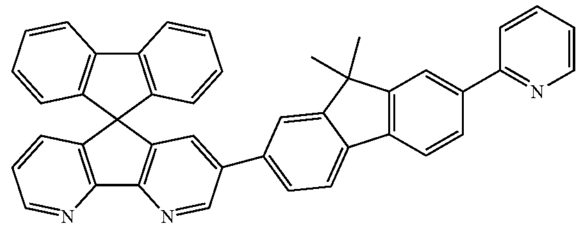
1-29
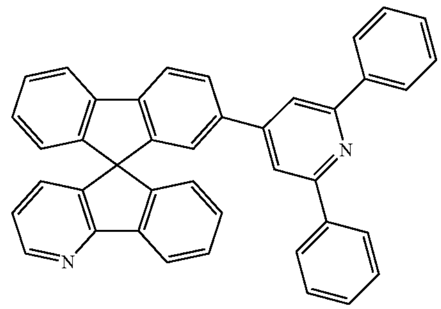
1-30
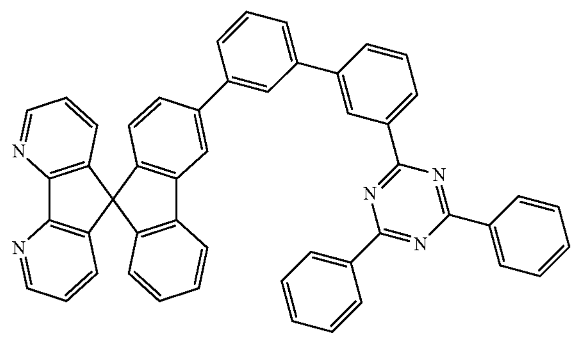
1-31
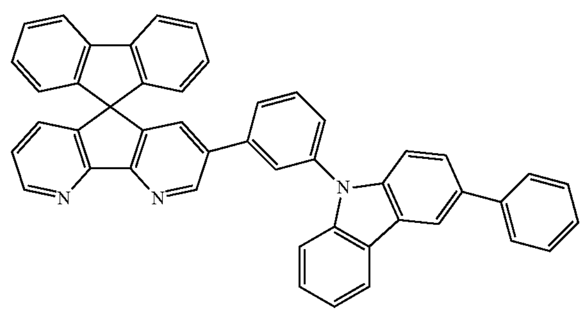
1-32
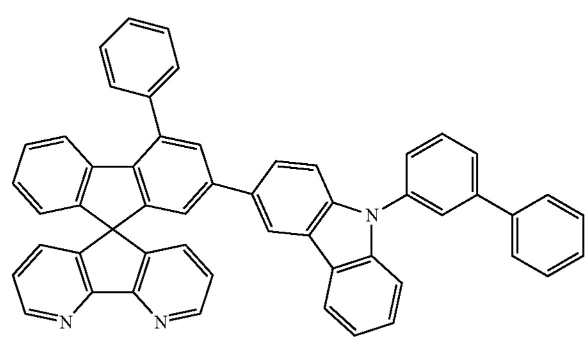

-continued
1-33
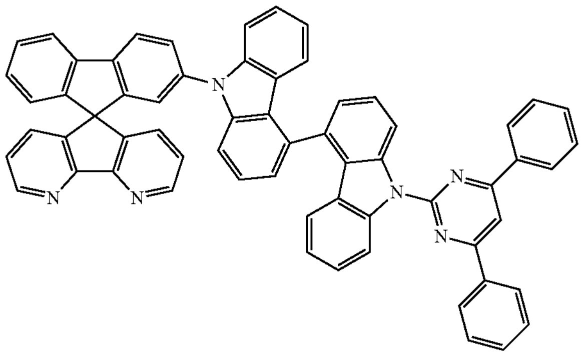
1-34
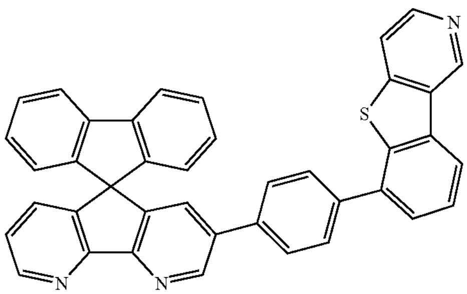
1-35
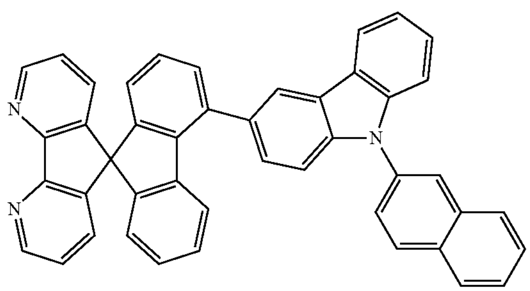
1-36
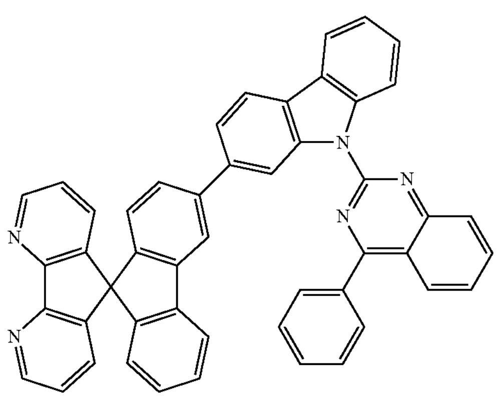
-continued
1-37
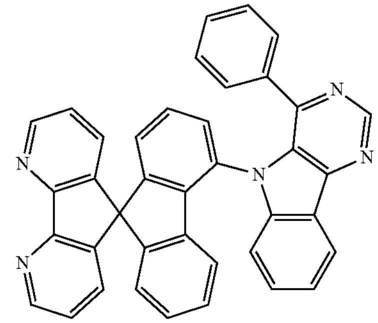
1-38
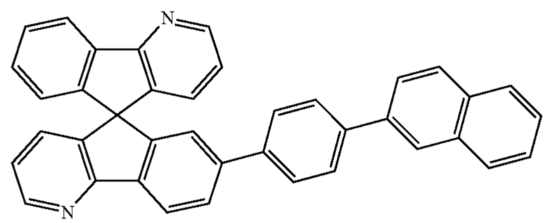
1-39
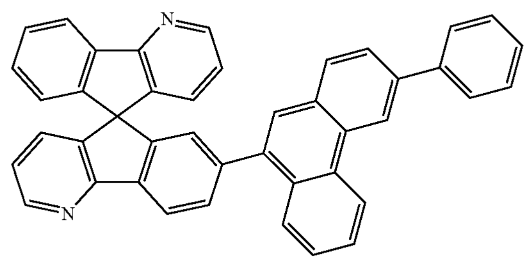
1-40
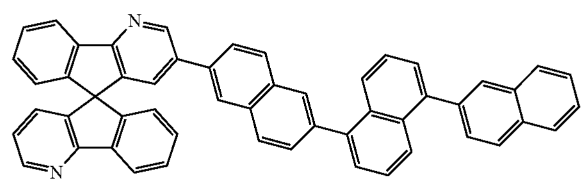
1-41
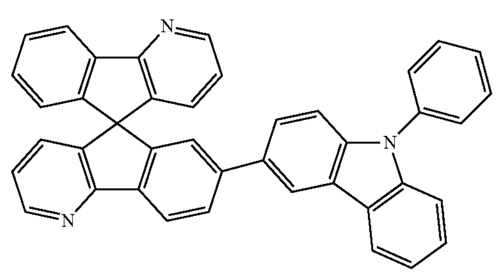
1-42
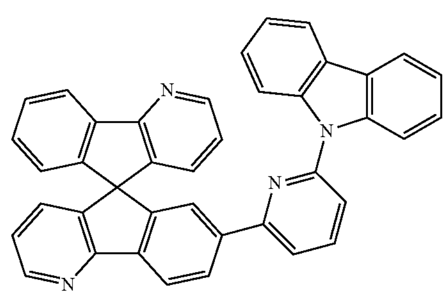

-continued
1-43
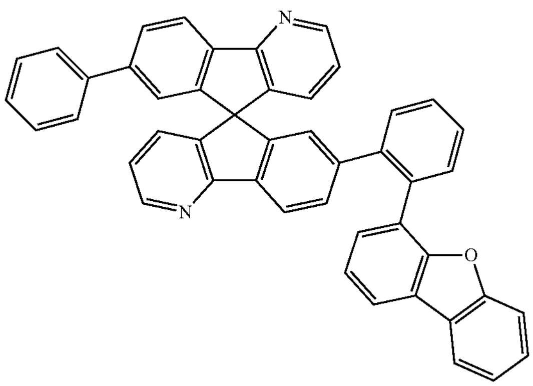
1-44
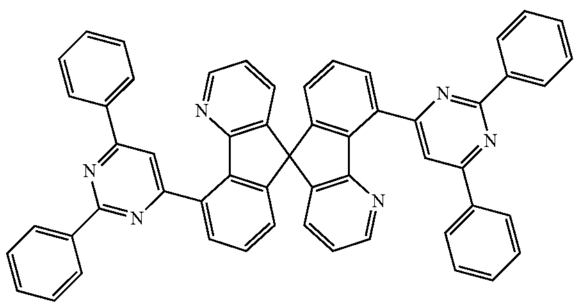
1-45
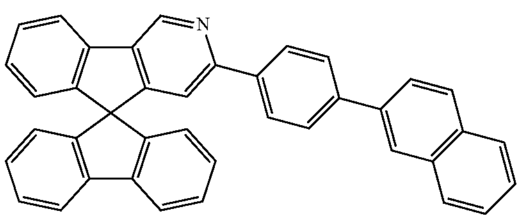
1-46
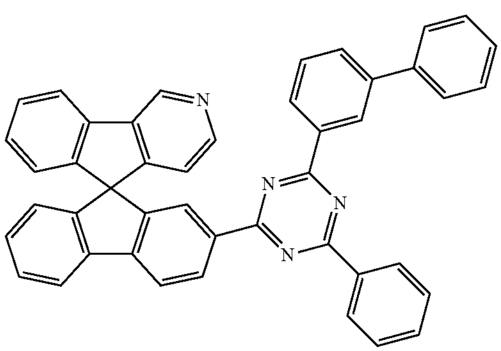
1-47
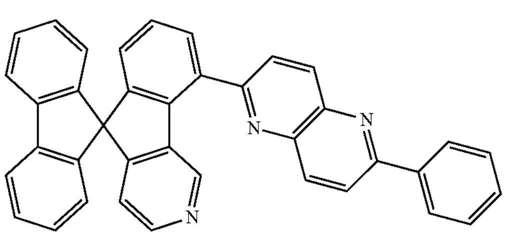
-continued
1-48
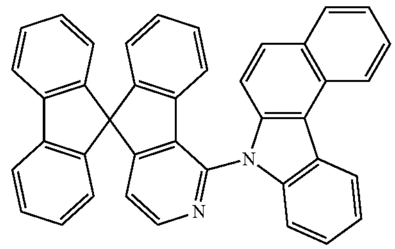
1-49
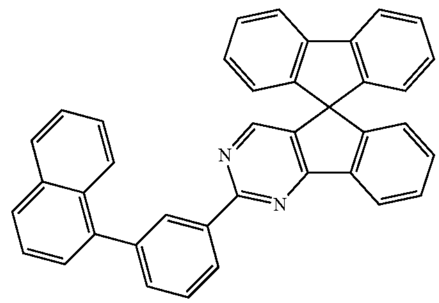
1-50
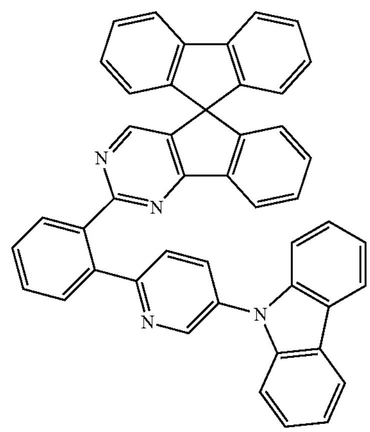
1-51
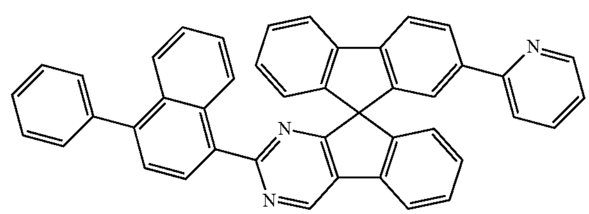
1-52
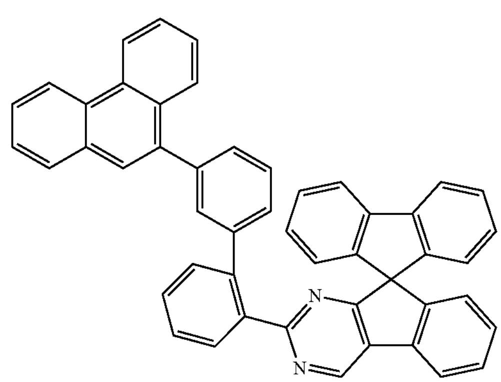

-continued
1-53
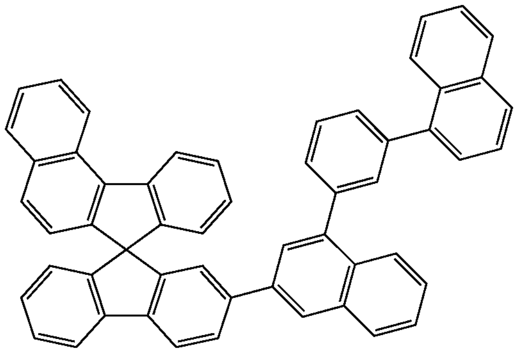
1-54
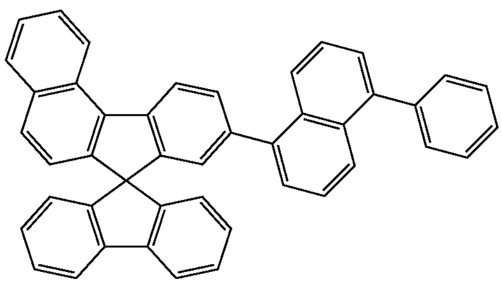
1-55
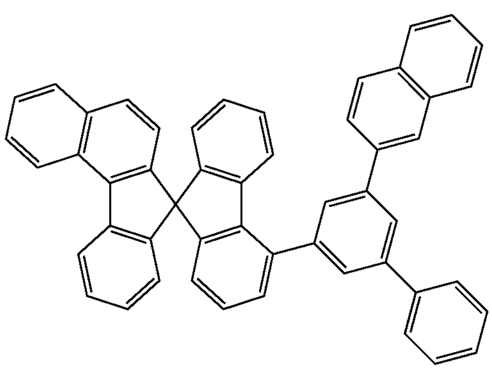
1-56
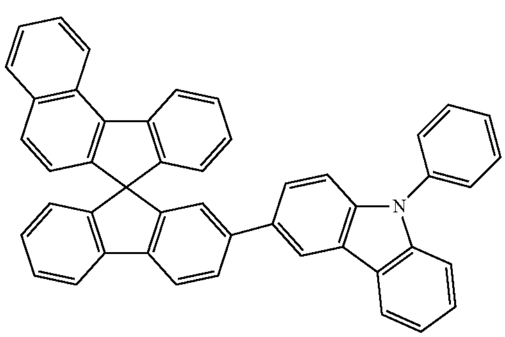
-continued
1-57
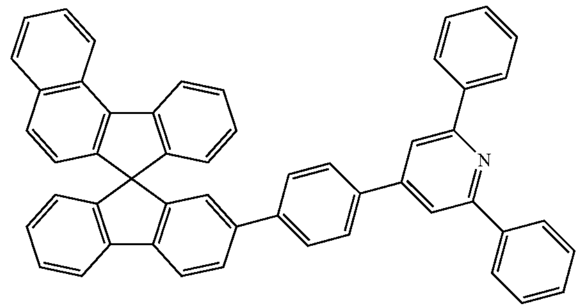
1-58
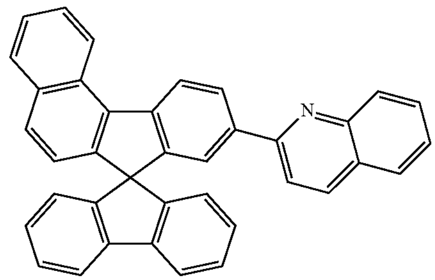
1-59
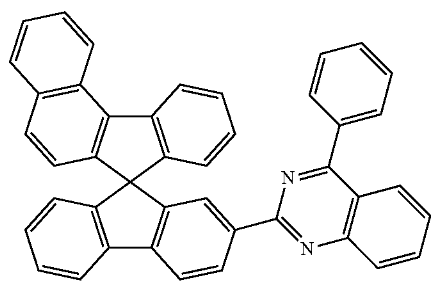
1-60
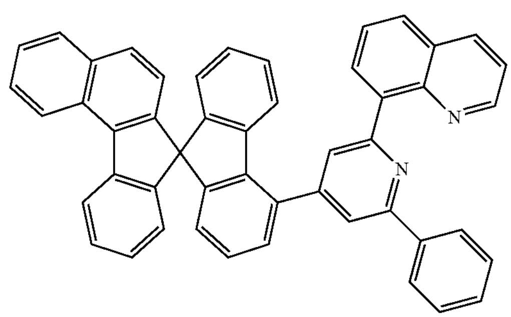
1-61
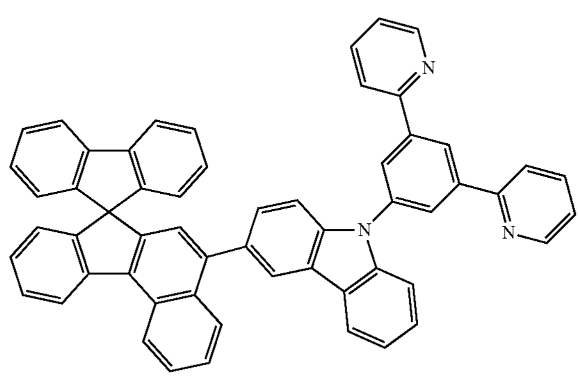

-continued
1-62
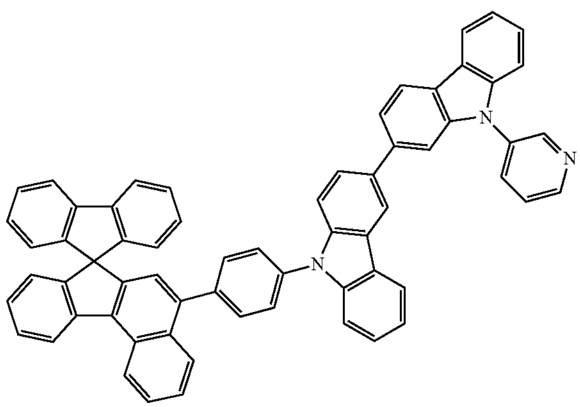
1-63
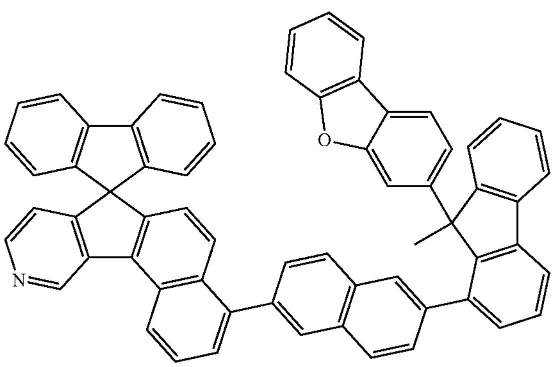
1-64
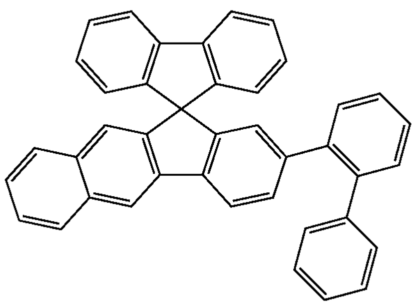
1-65
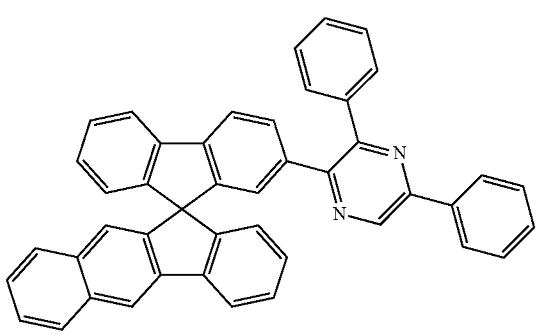
-continued
1-66
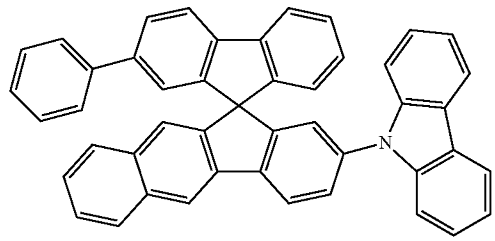
1-67
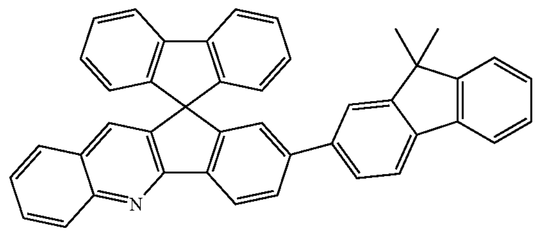
1-68
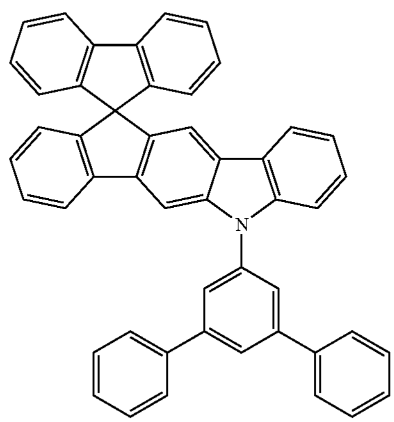
1-69
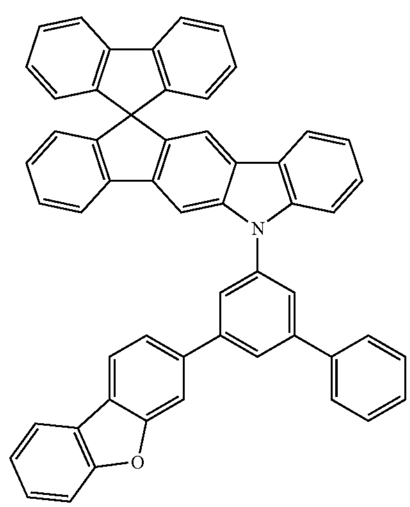

-continued
1-70
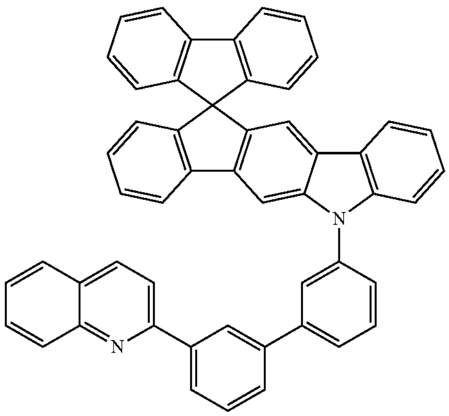
1-71
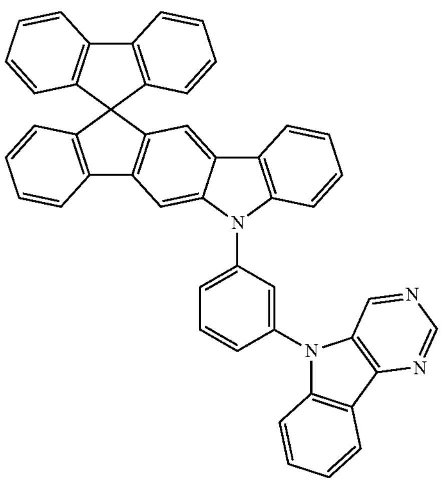
1-72
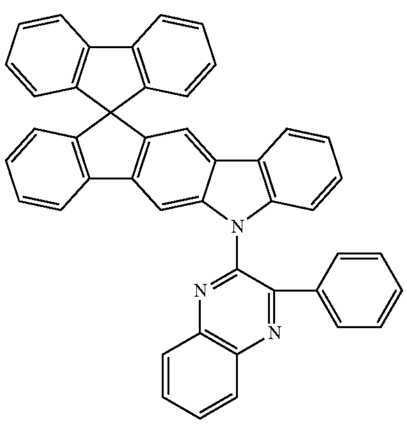
-continued
1-73
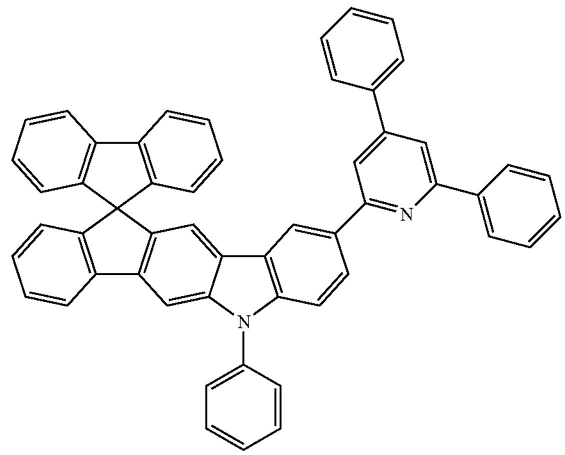
1-74
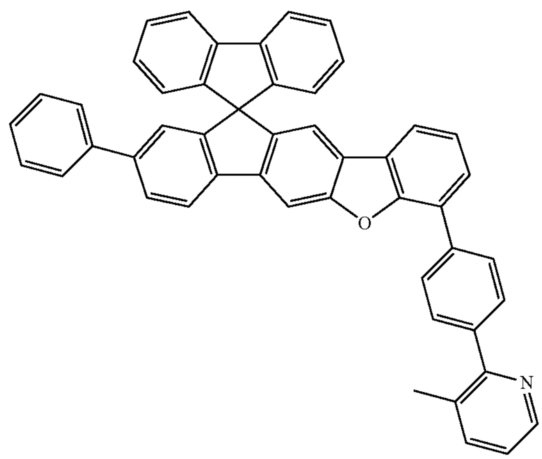
1-75
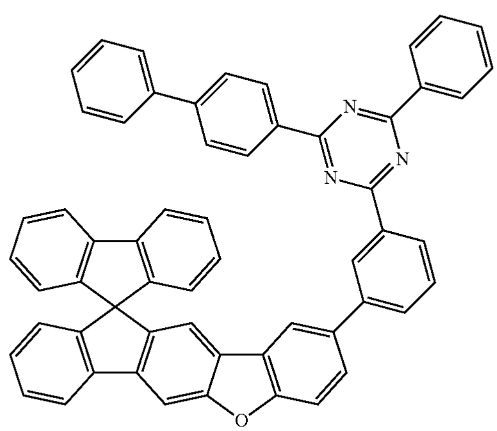

1-76
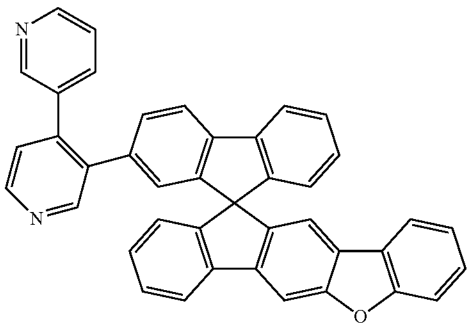
1-77
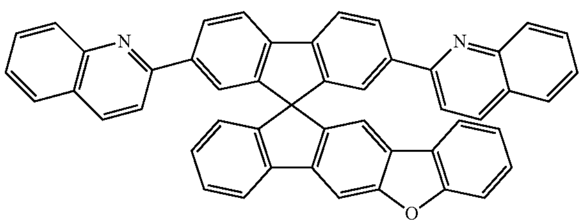
1-78
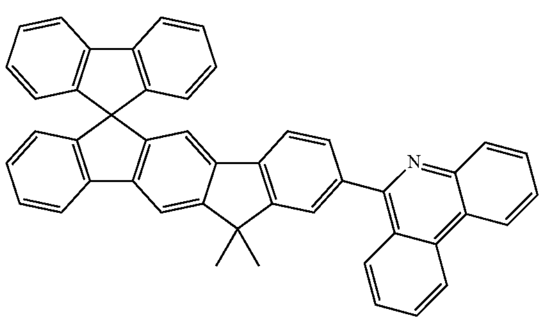
1-79
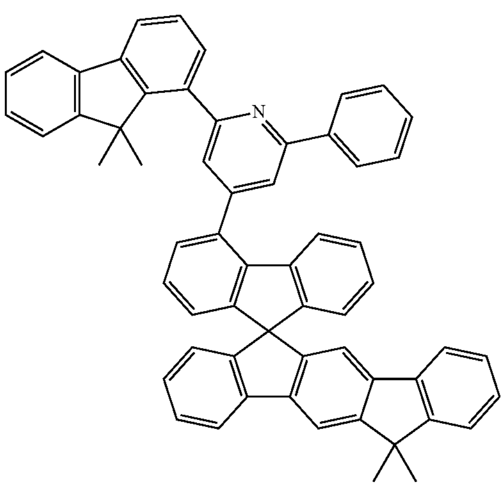
1-80
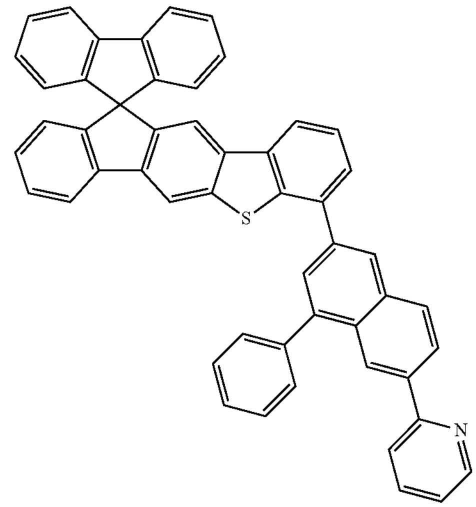
1-81
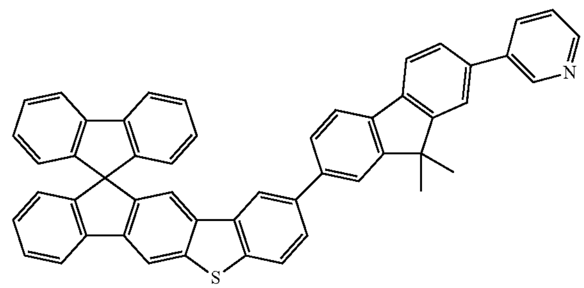
1-82
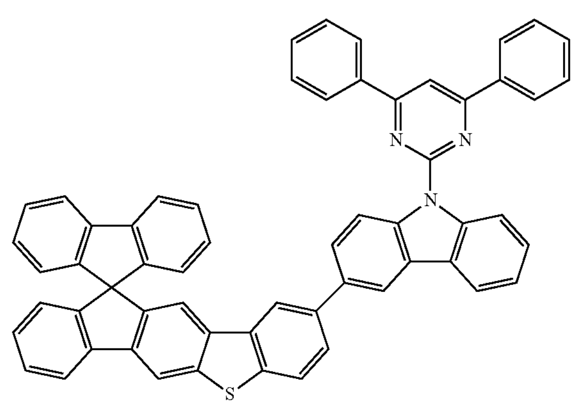

-continued
1-83
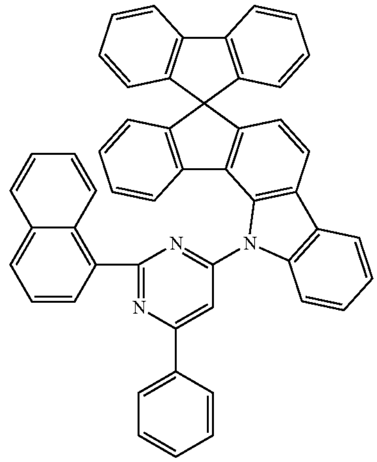
1-84
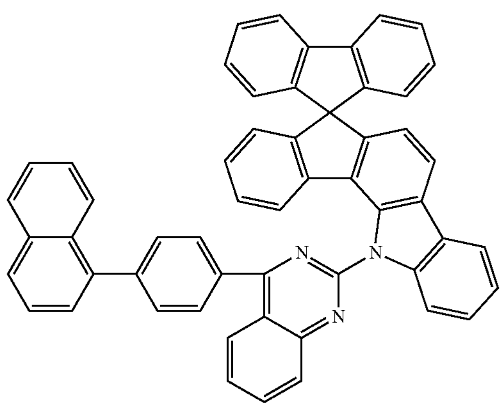
1-85
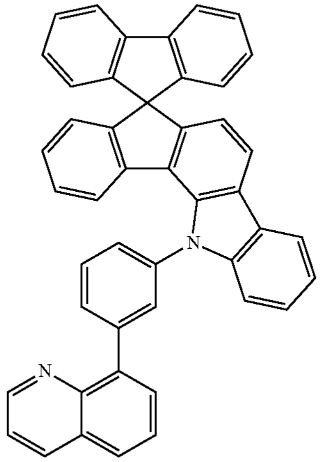
-continued
1-86
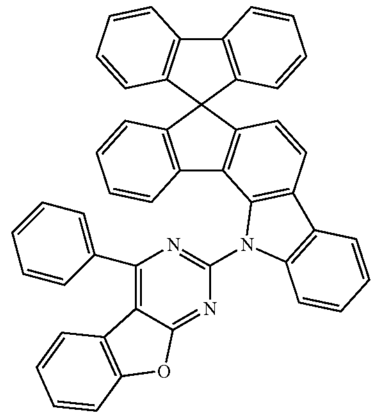
1-87
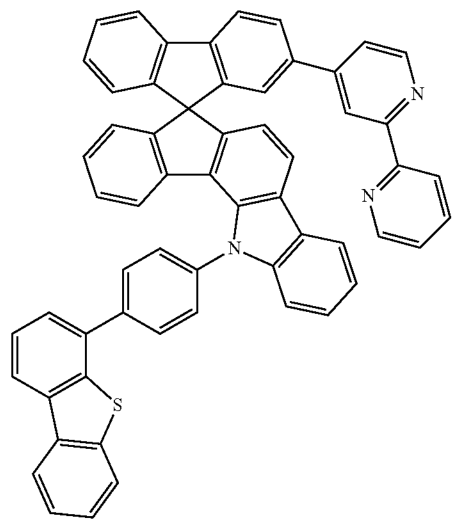
1-88
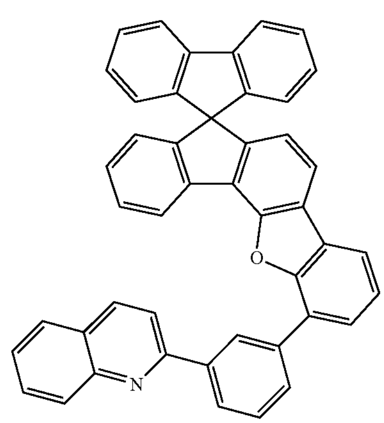

-continued
1-89
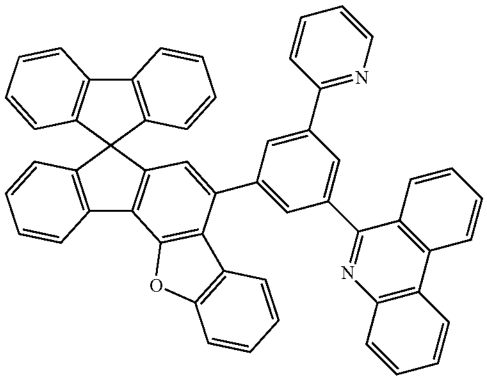
1-90
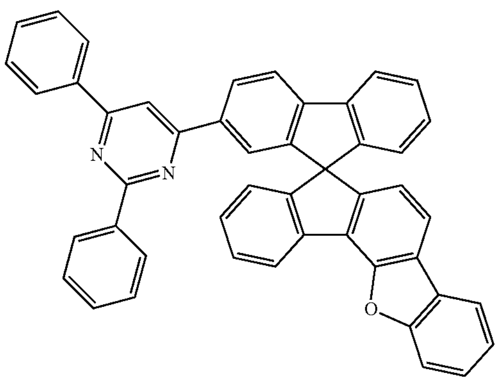
1-91
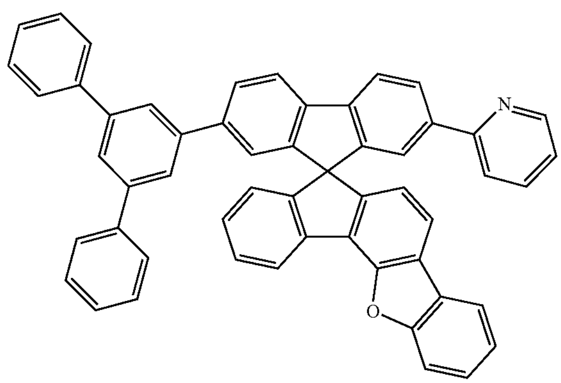
1-92
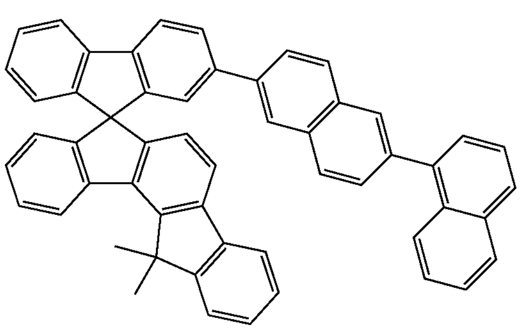
-continued
1-93
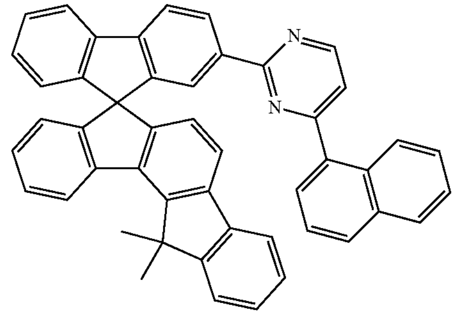
1-94
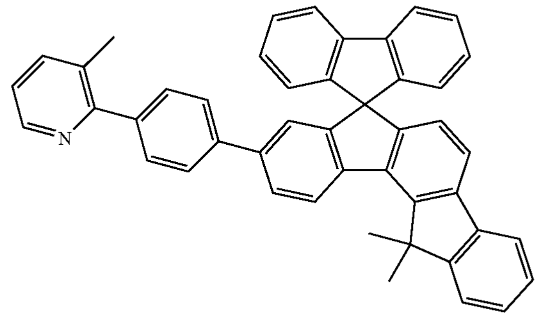
1-95
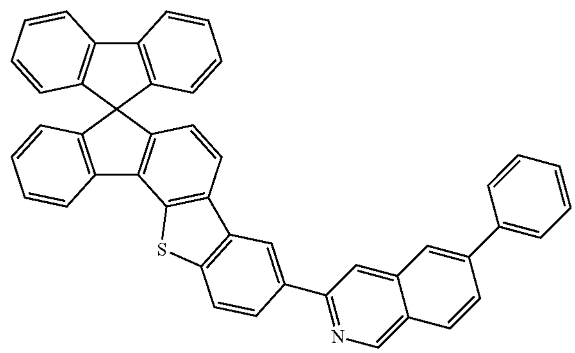
1-96
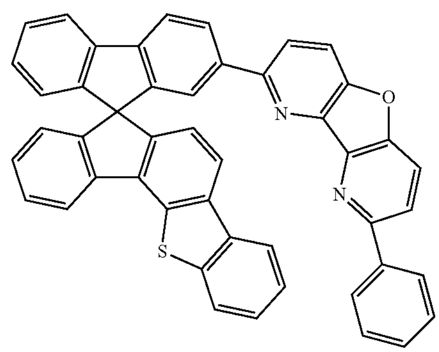
1-97
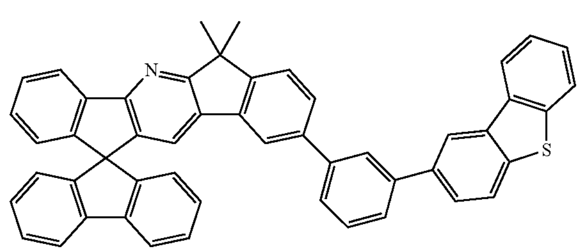

1-98
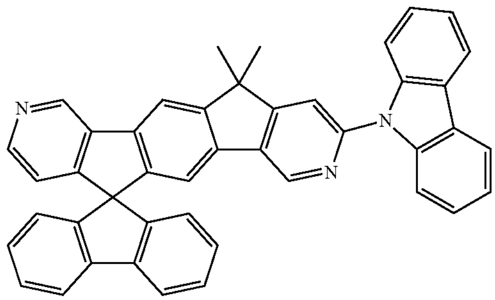
1-99
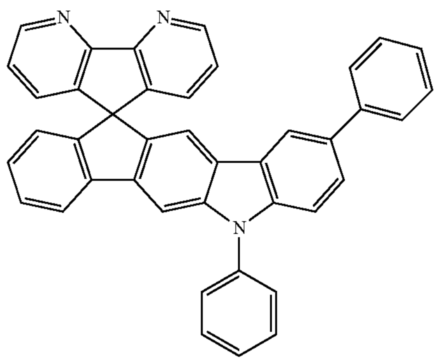
1-100
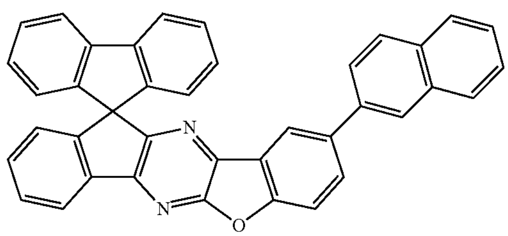
1-101
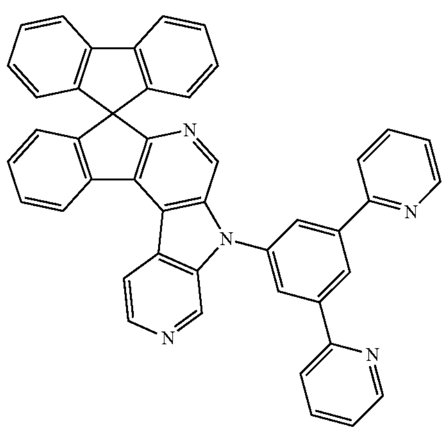
1-102
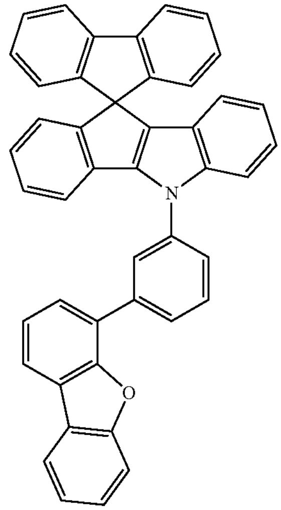
1-103
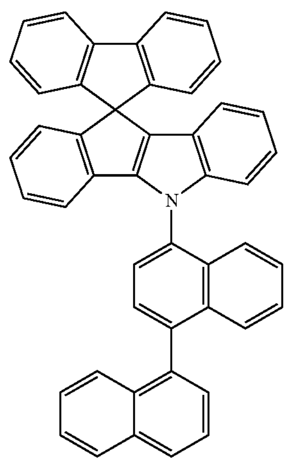
1-104
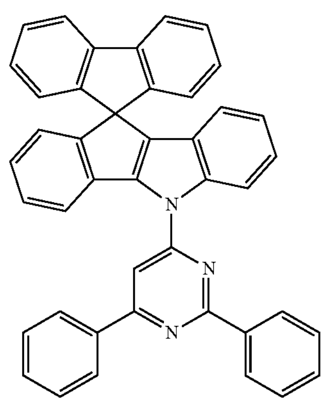

-continued
1-105
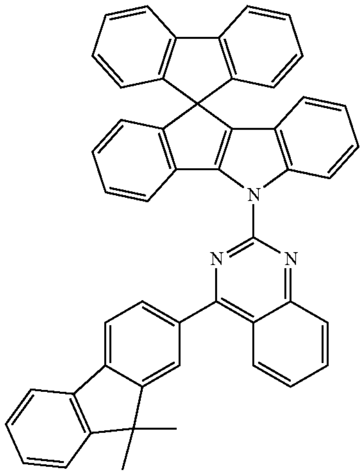
1-106
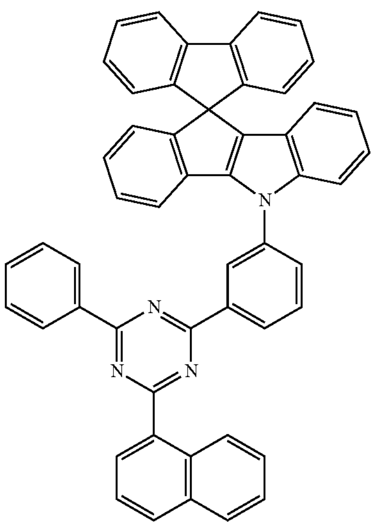
1-107
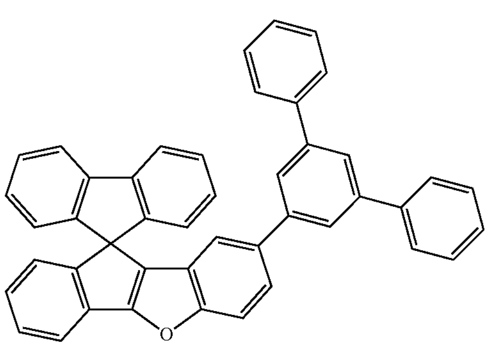
-continued
1-108
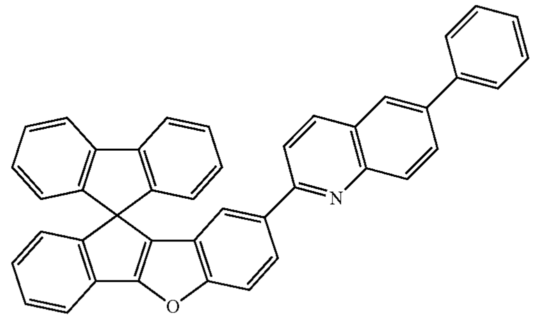
1-109
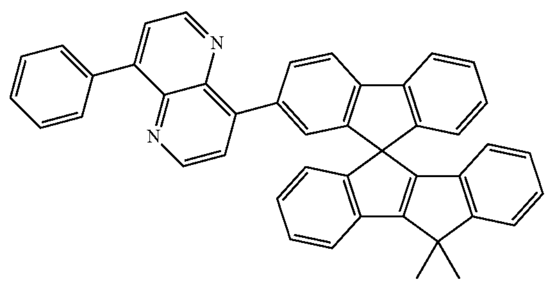
1-110
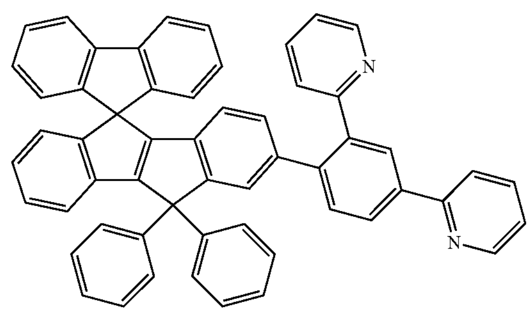
1-111
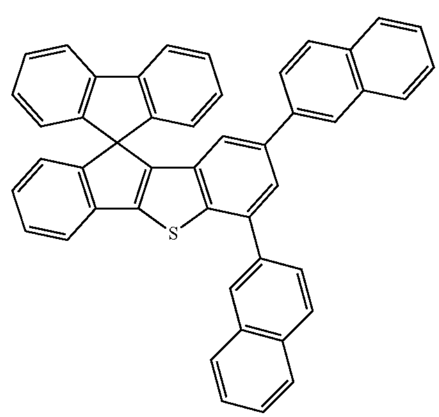

1-112
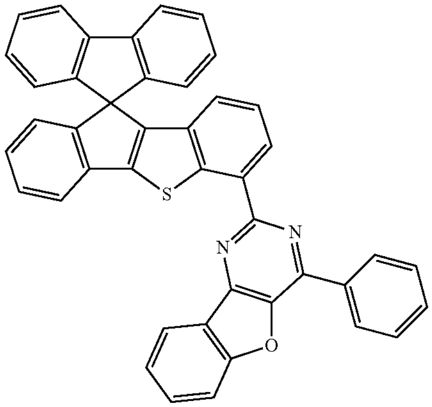
1-113
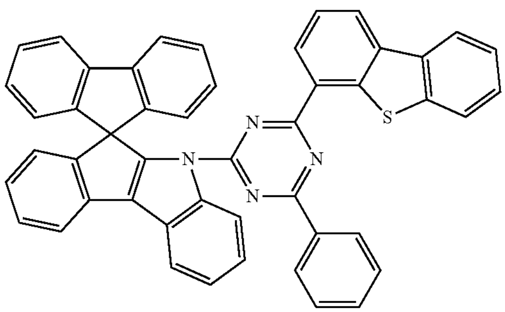
1-114
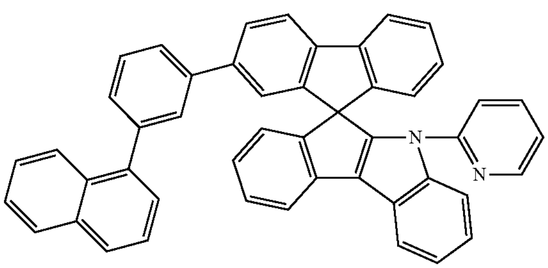
1-115
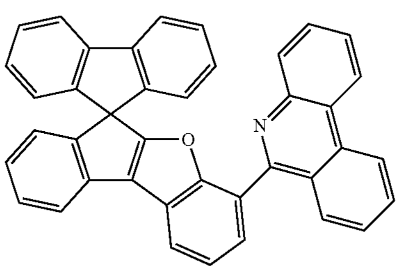
1-116
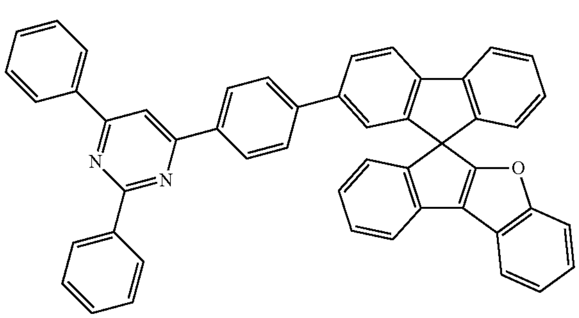
1-117
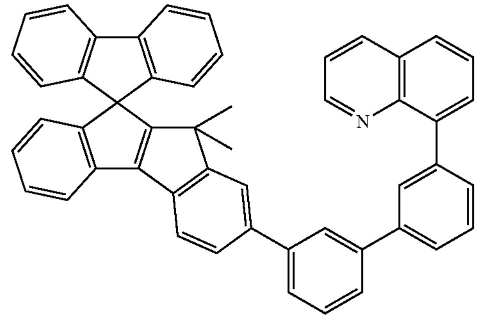
1-118
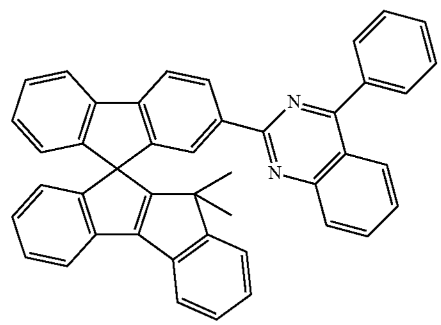
1-119
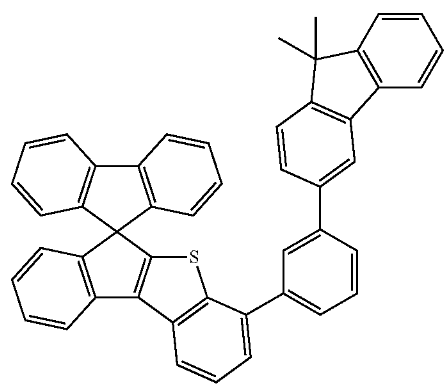
1-120
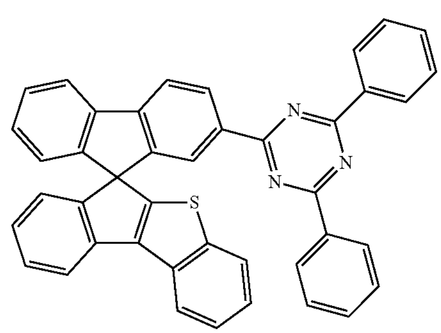

-continued
1-121
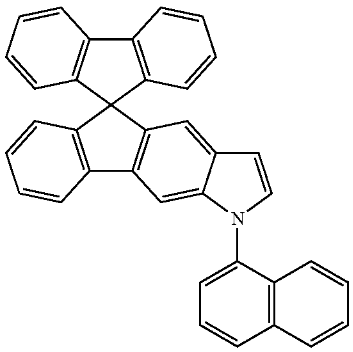
1-122
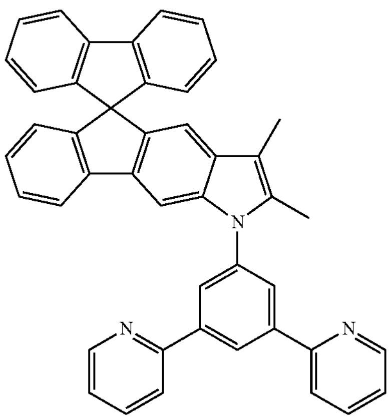
1-123
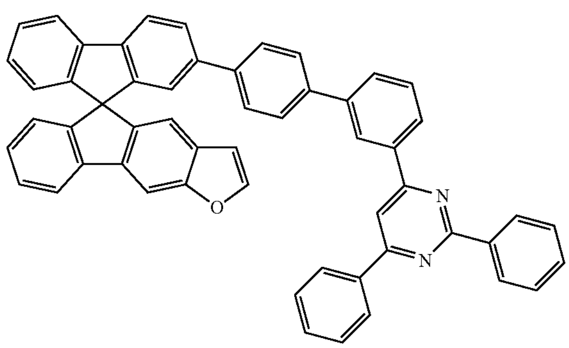
1-124
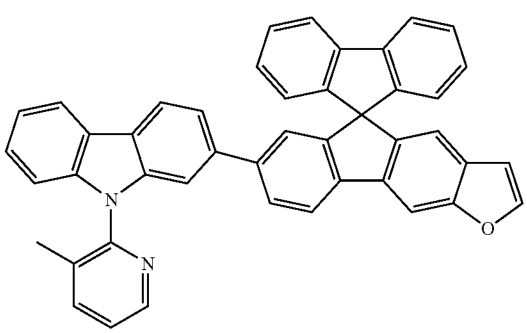
-continued
1-125
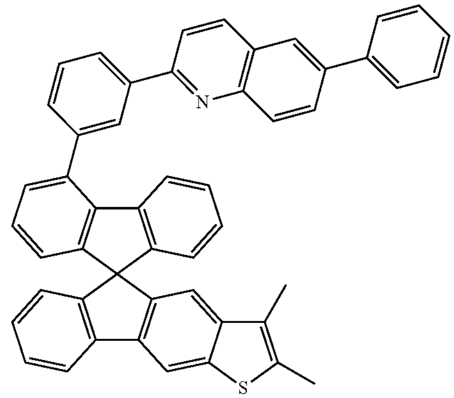
1-126
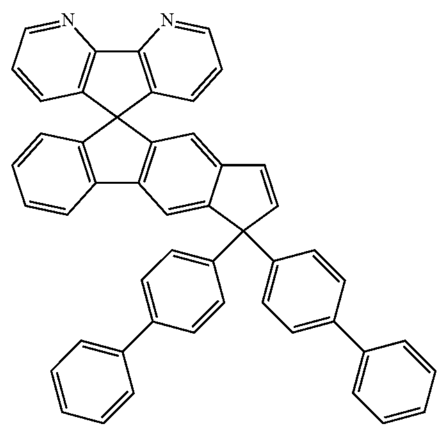
1-127
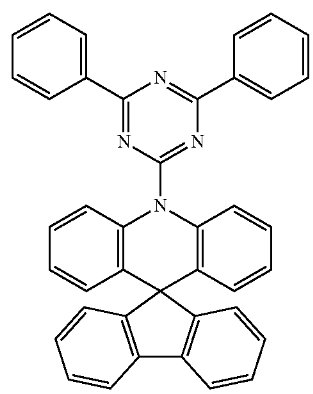
1-128
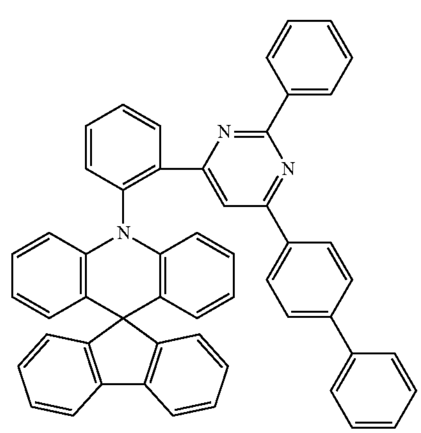

1-129
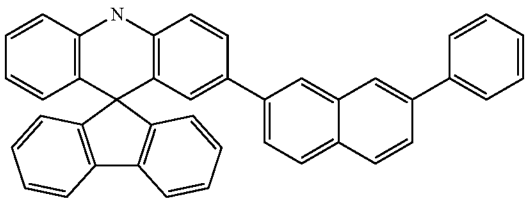
1-130
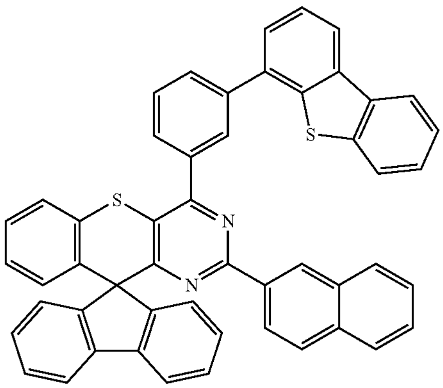
1-131
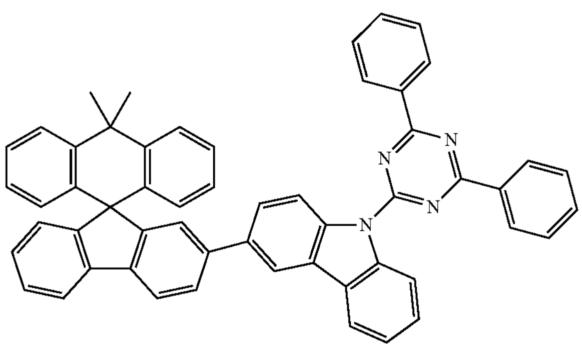
1-132
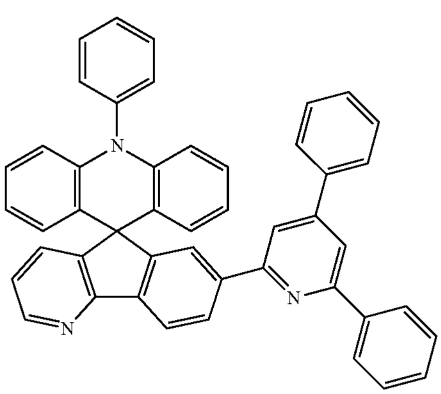
1-133
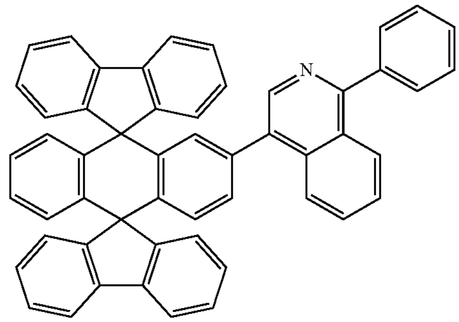
1-134
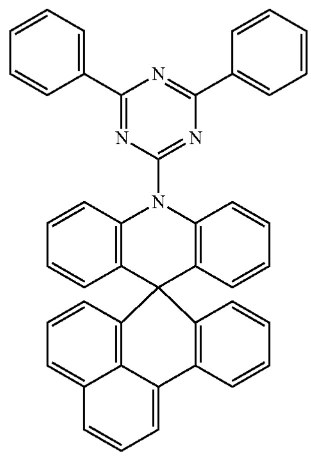
1-135
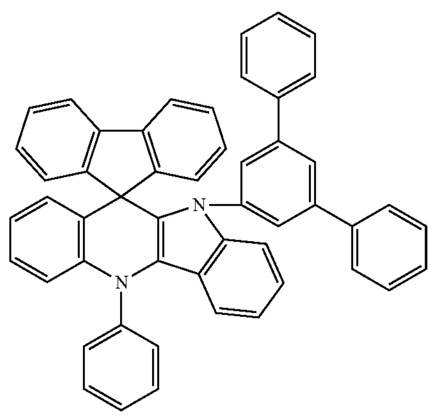
1-136
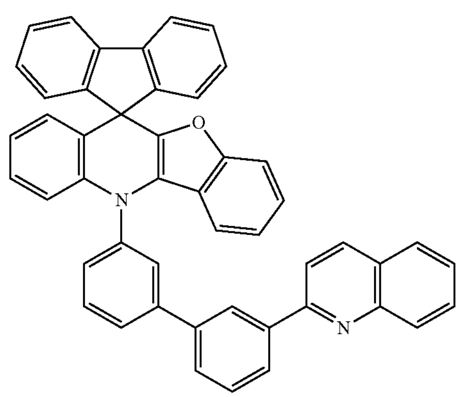

-continued
1-137
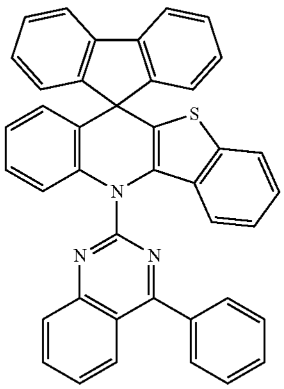
1-138
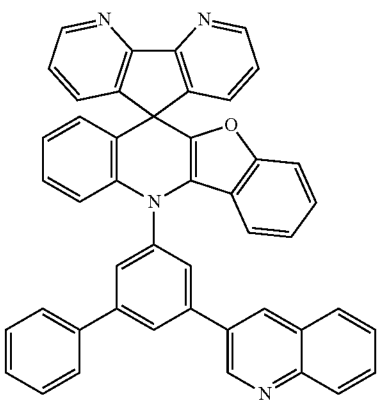
1-139
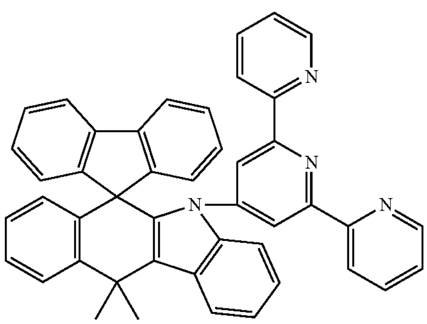
1-140
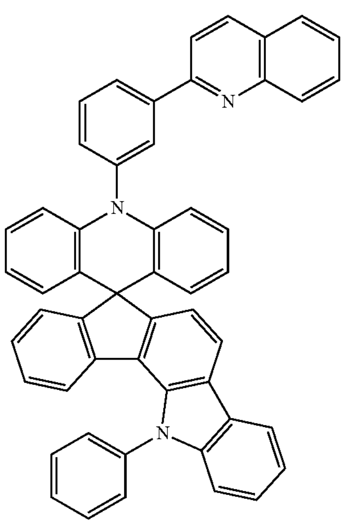
-continued
1-141
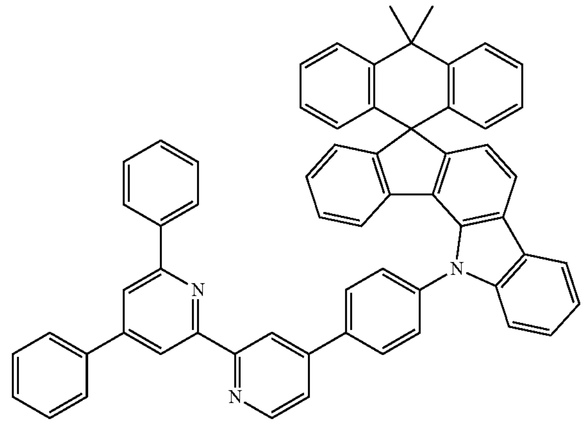
1-142
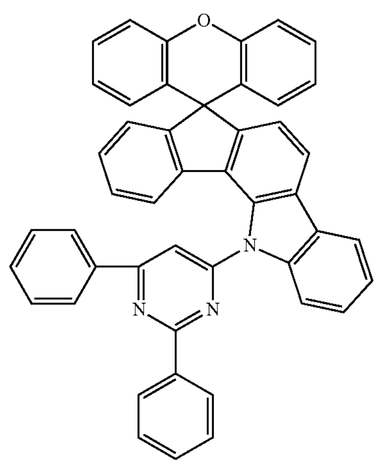
1-143
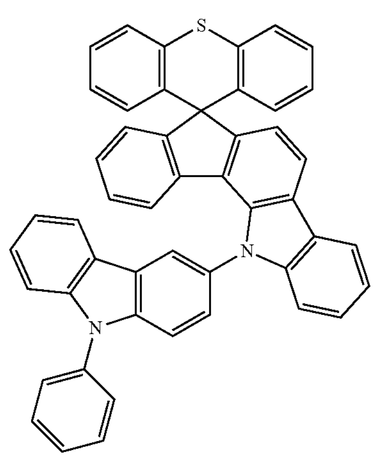

-continued
1-144
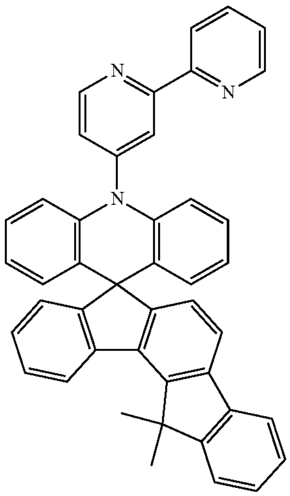
1-145
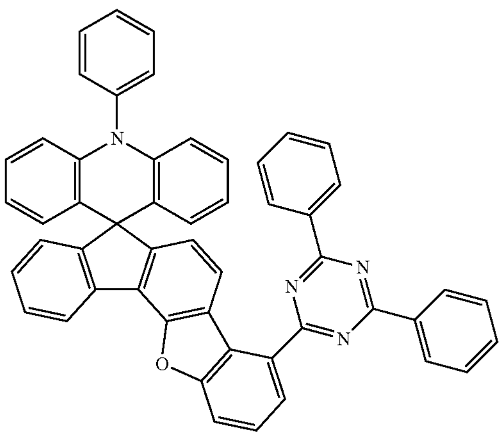
1-146
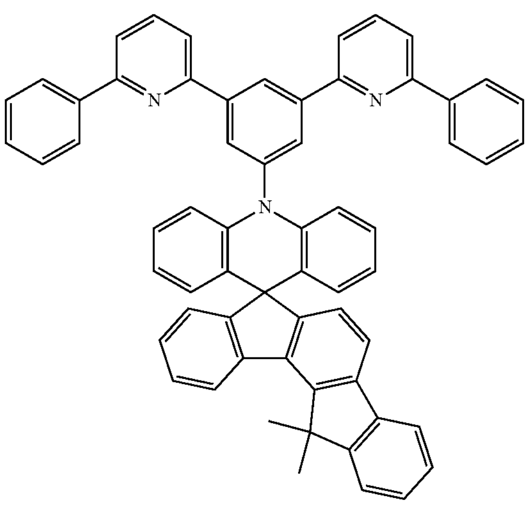
-continued
1-147
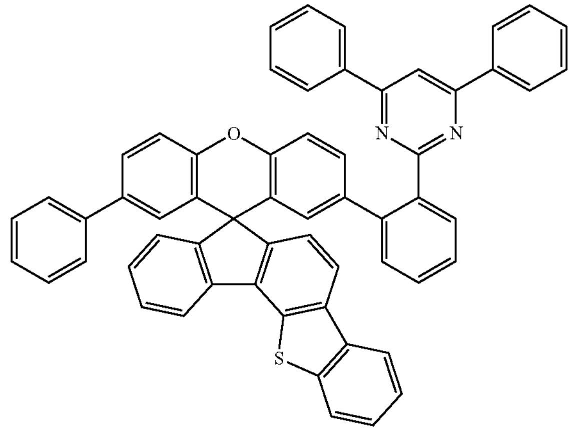
1-148
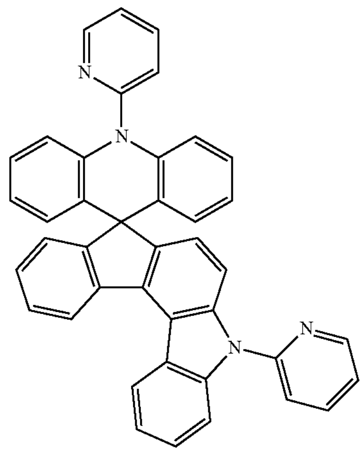
1-149
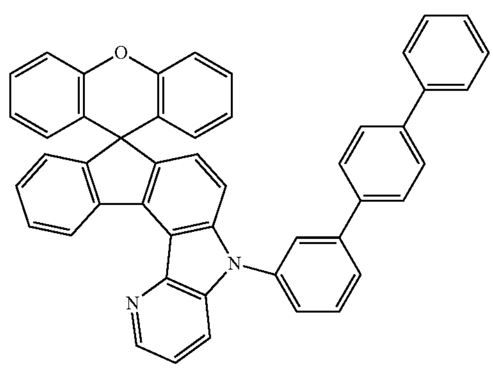

1-150
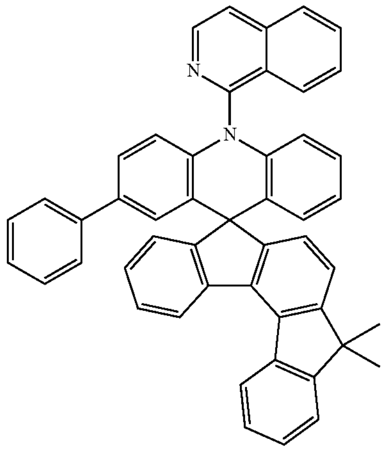
1-151
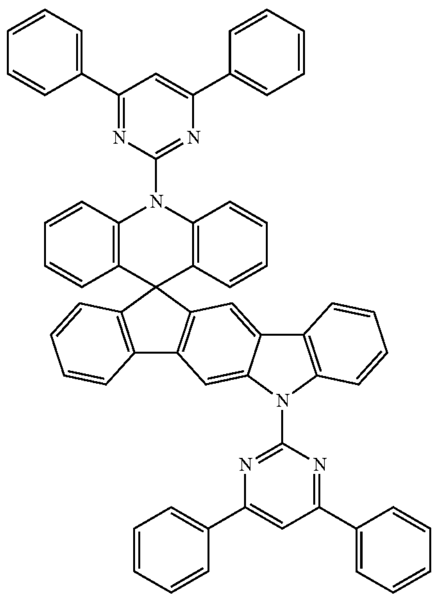
1-152
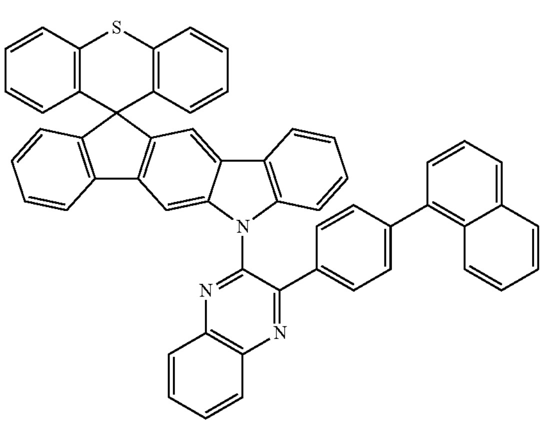
1-153
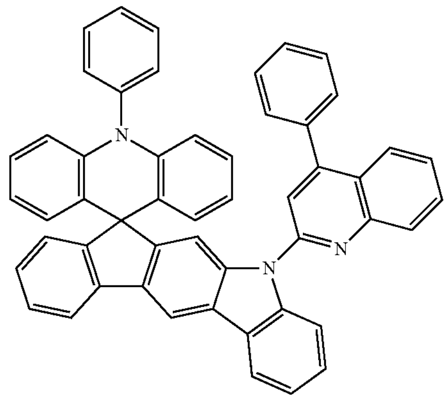
1-154
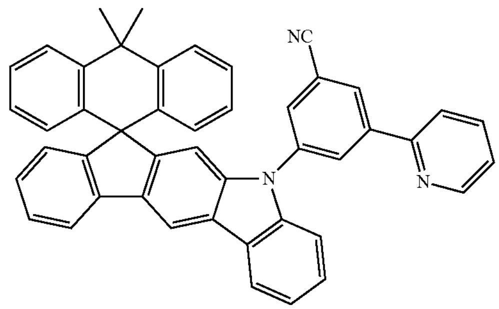
1-155
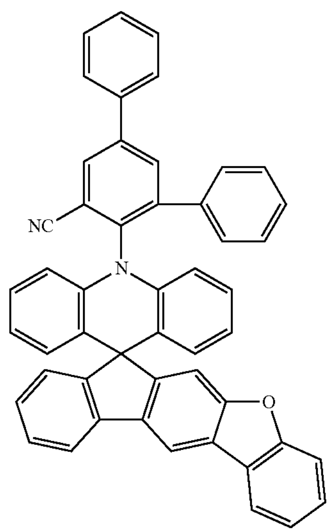
1-156
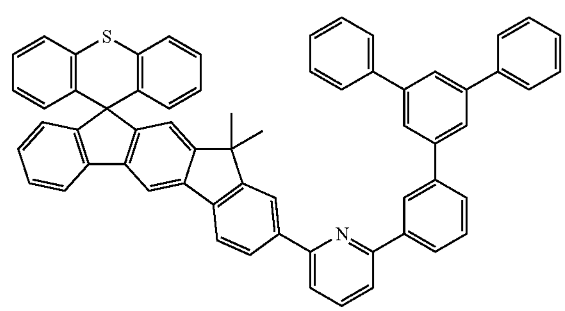

-continued
1-157
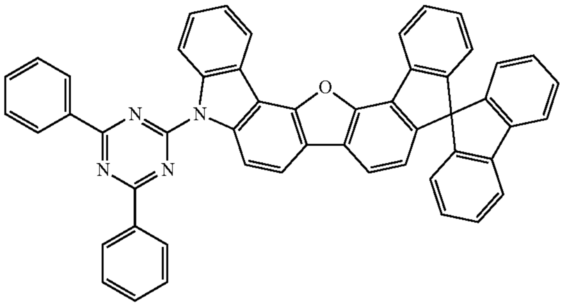
1-158
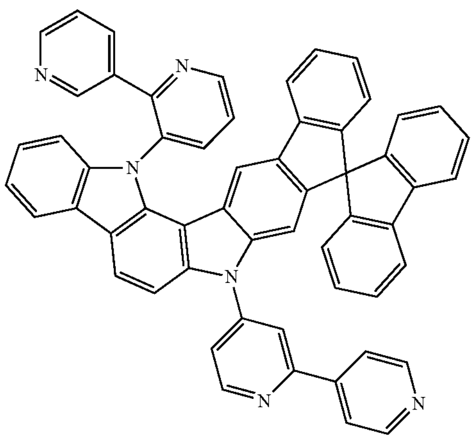
1-159
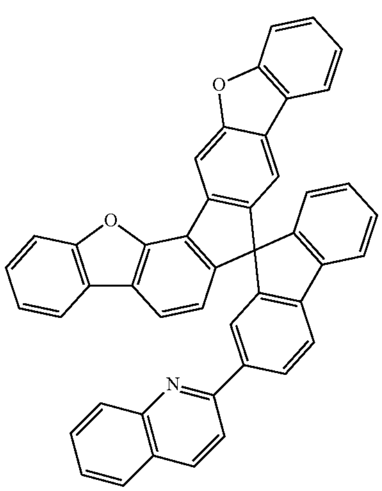
-continued
1-160
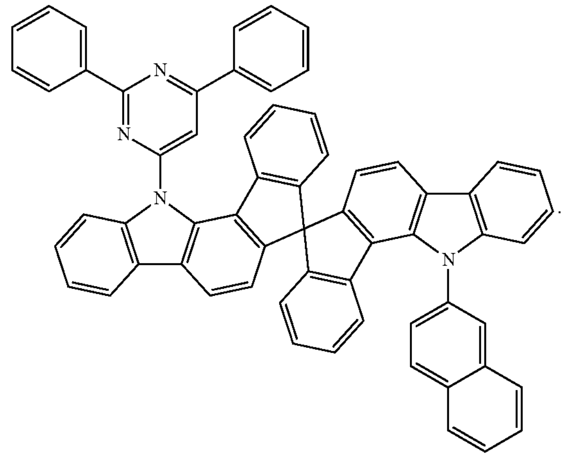
In various embodiments, the second compound may be selected from Compounds 2-1a to 2-172a and 2-1 to 2-262:
2-1a
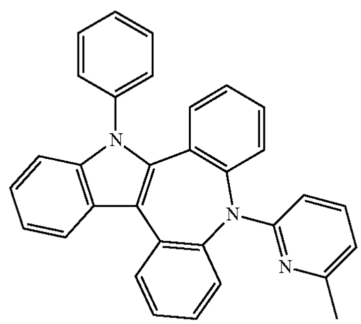
2-2a
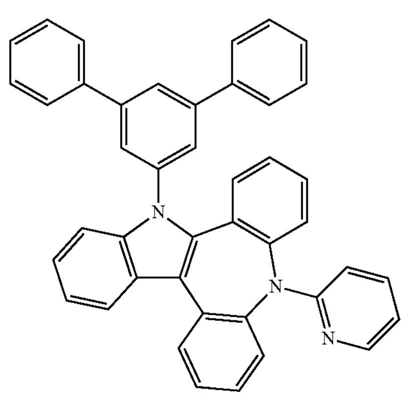

2-3a
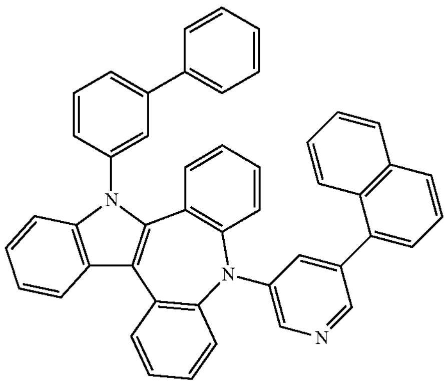
2-4a
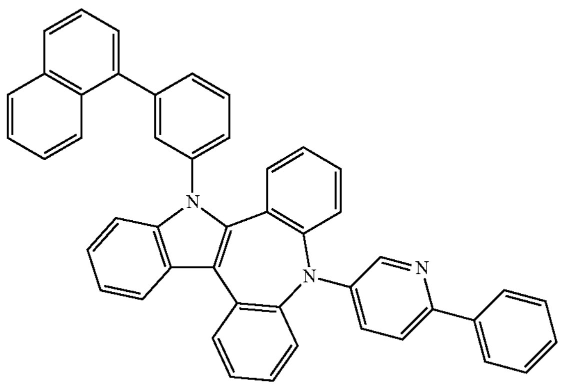
2-5a
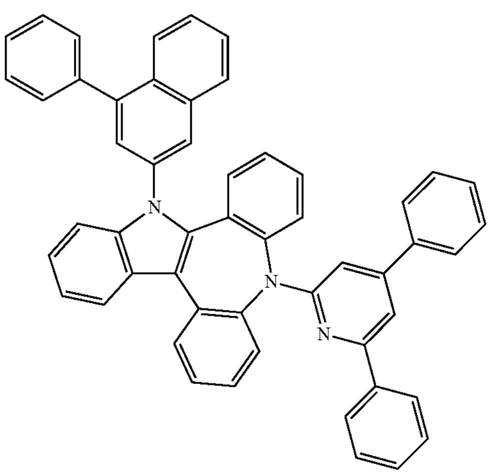
2-6a
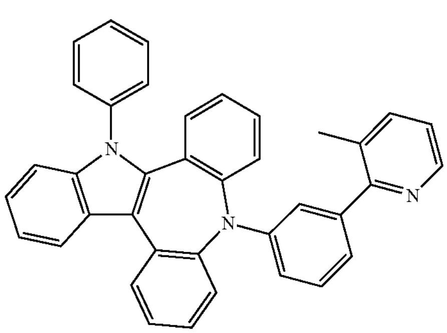
2-7a
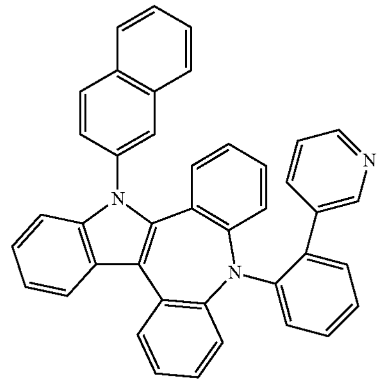
2-8a
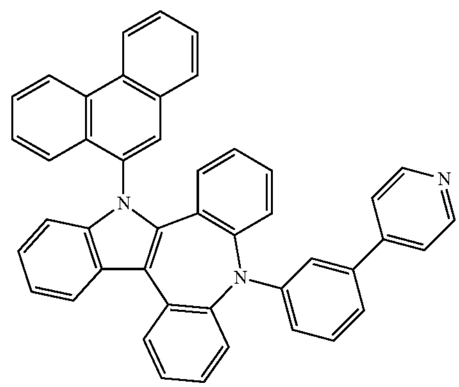
2-9a
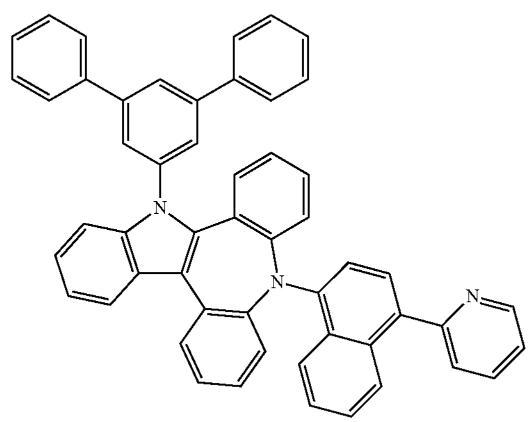
2-10a
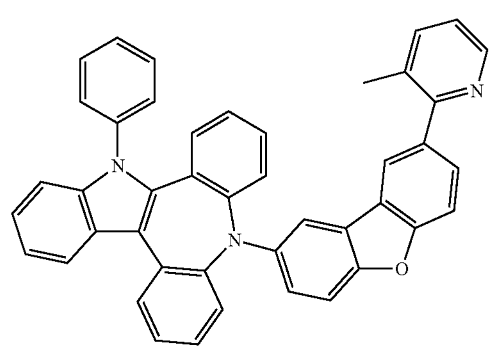

-continued
2-11a
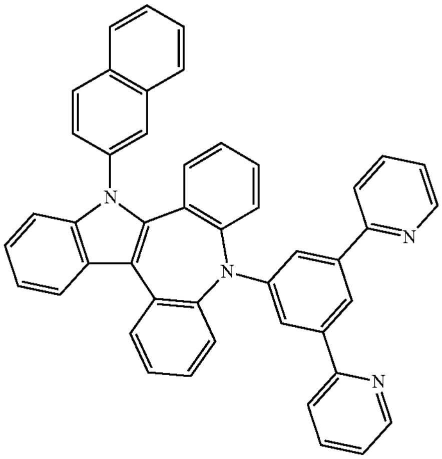
2-12a
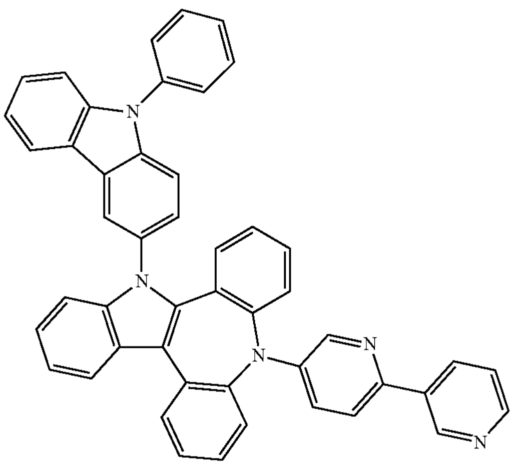
2-13a
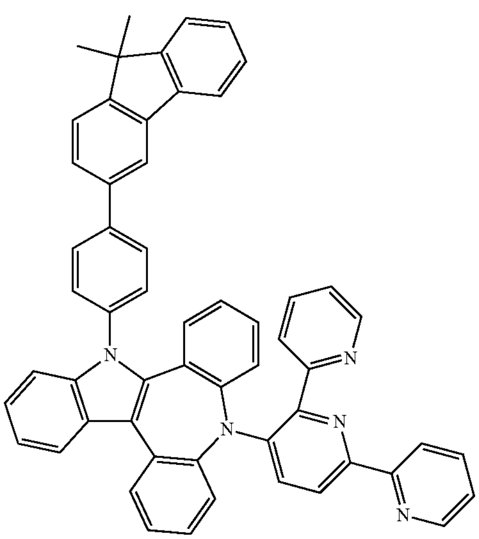
-continued
2-14a
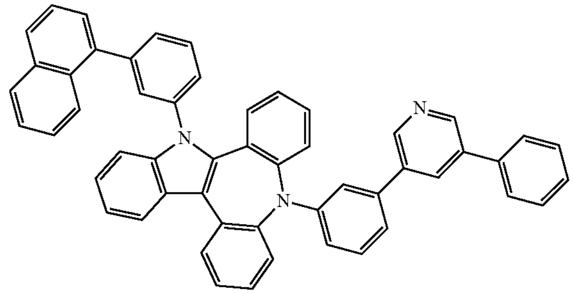
2-15a
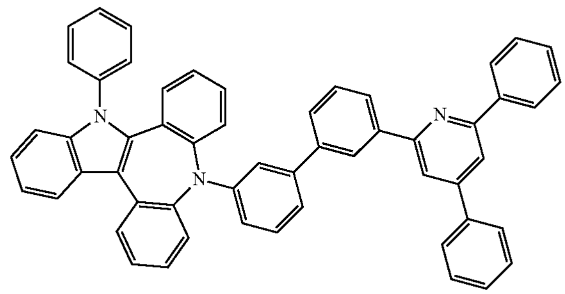
2-16a
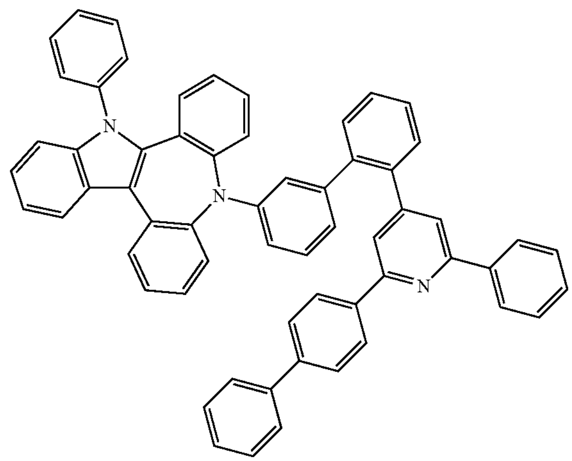
2-17a
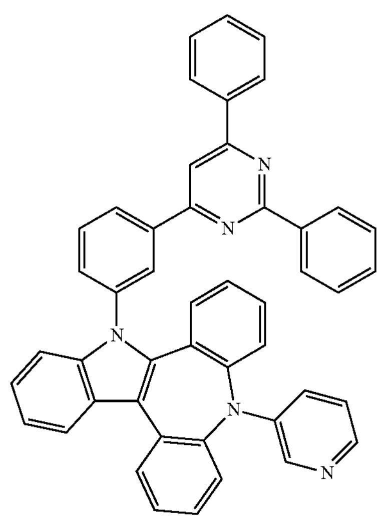

-continued
2-18a
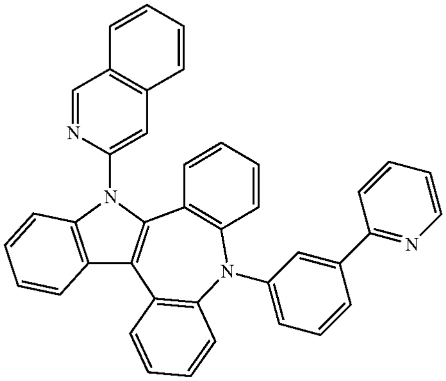
2-19a
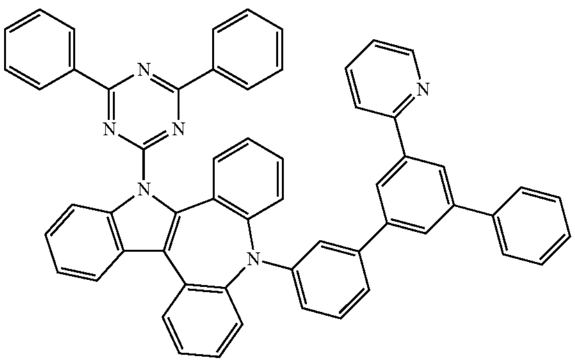
2-20a
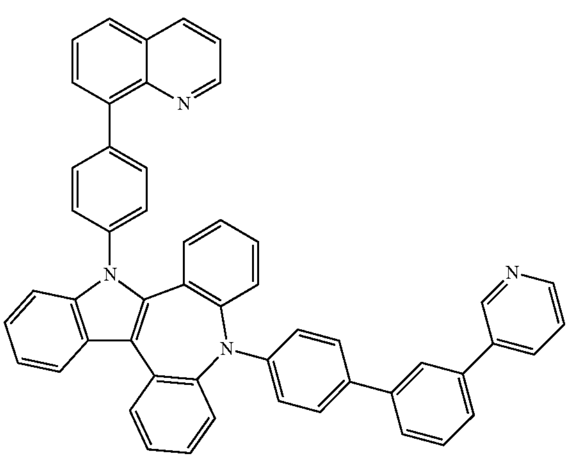
-continued
2-21a
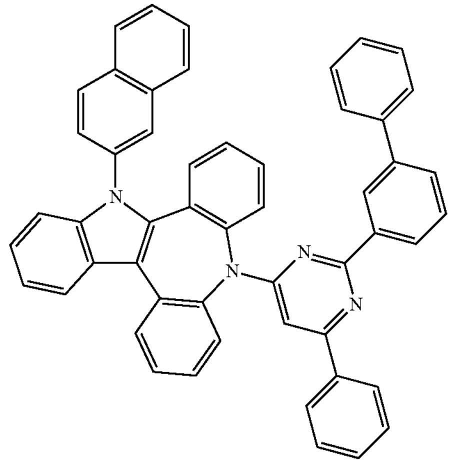
2-22a
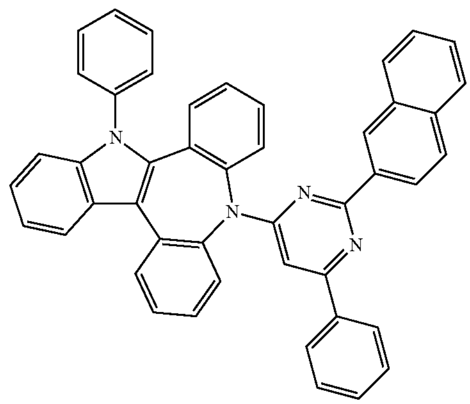
2-23a
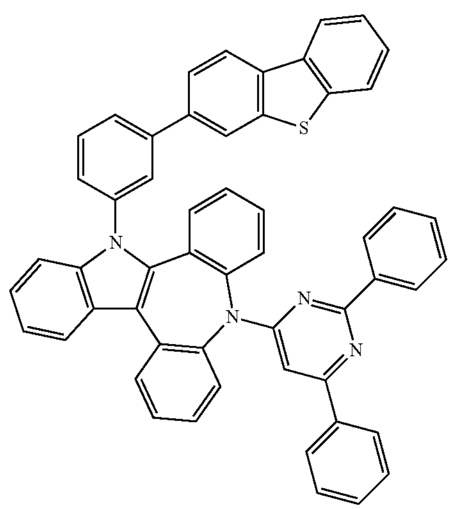

-continued
2-24a
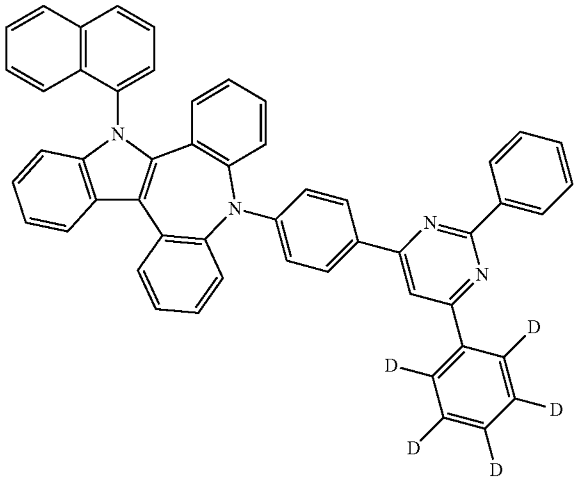
2-25a
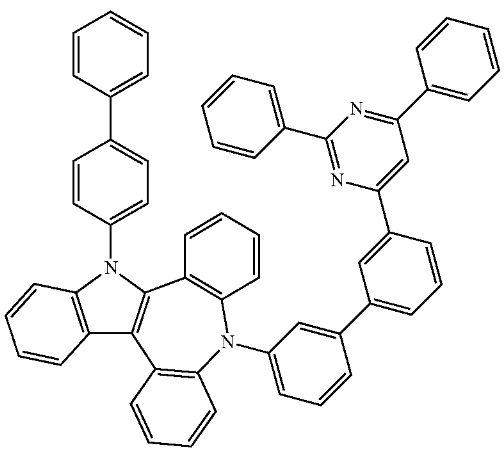
2-26a
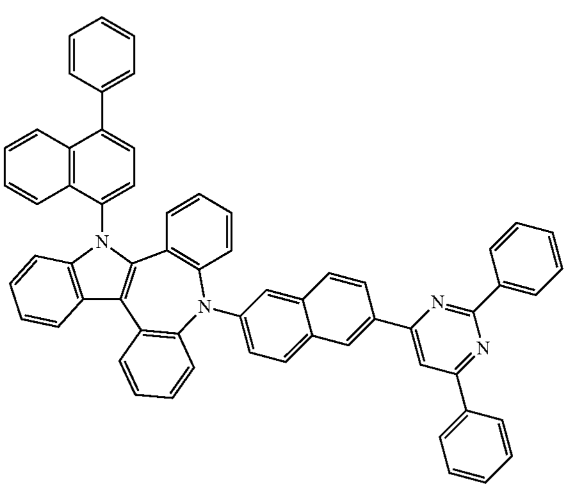
-continued
2-27a
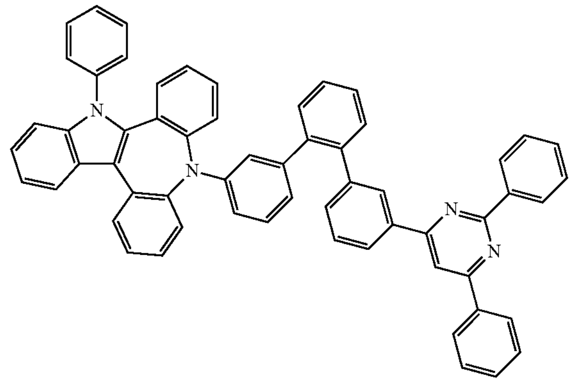
2-28a
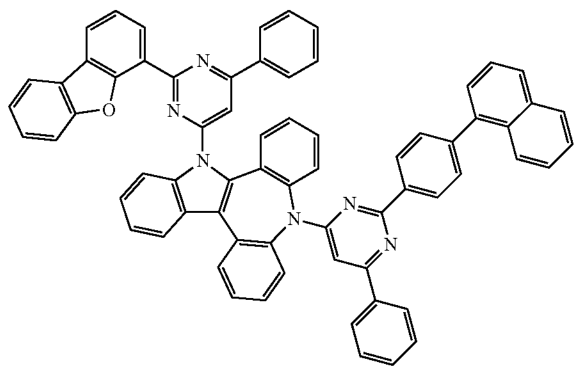
2-29a
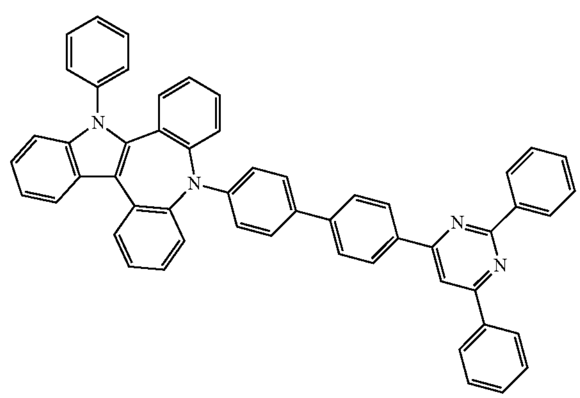

-continued
2-30a
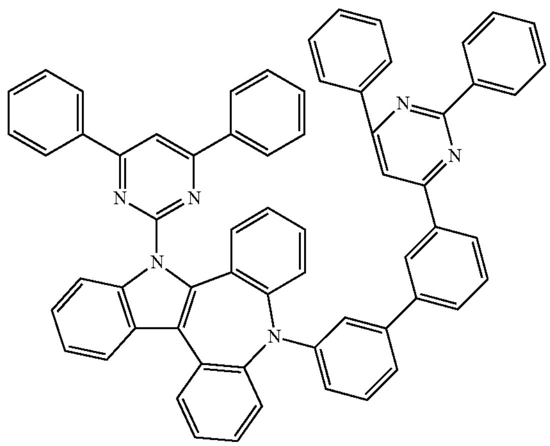
2-31a
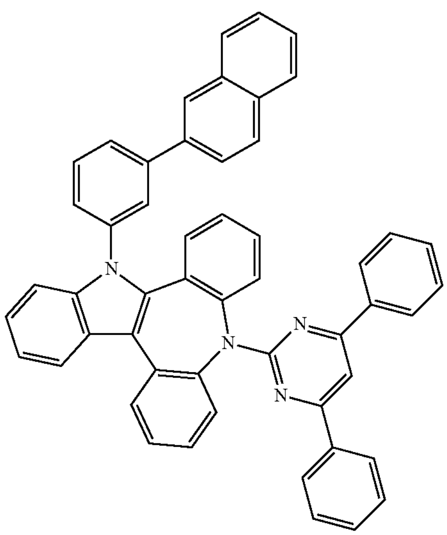
2-32a
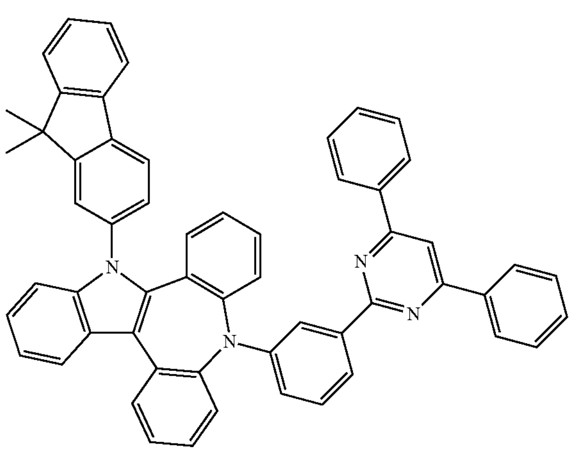
-continued
2-33a
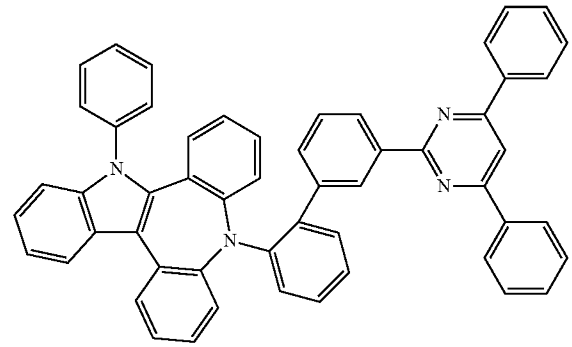
2-34a
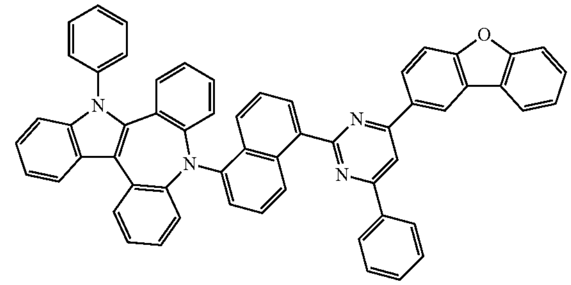
2-35a
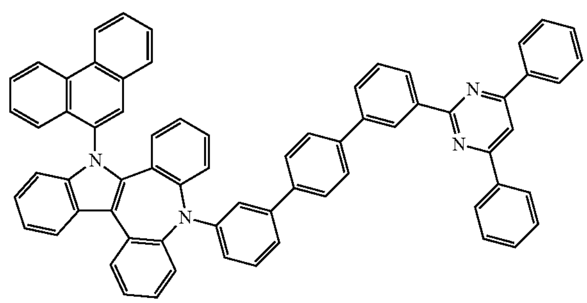
2-36a
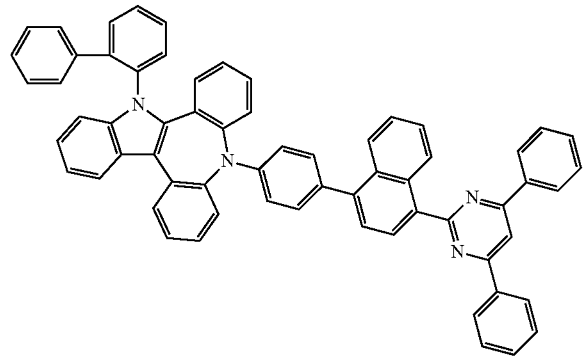

2-37a
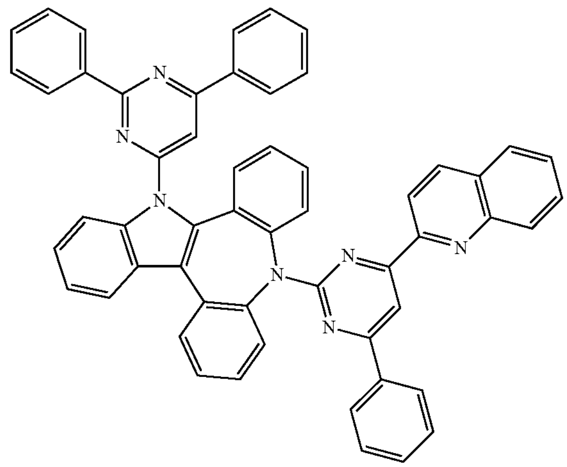
2-38a
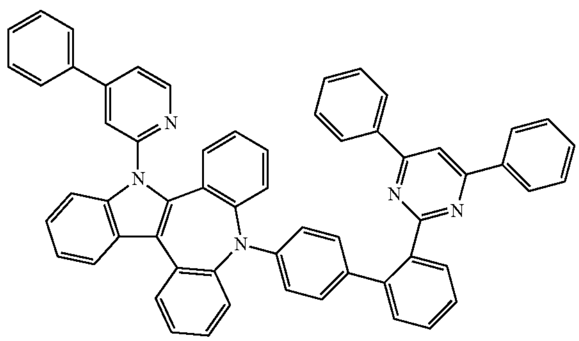
2-39a
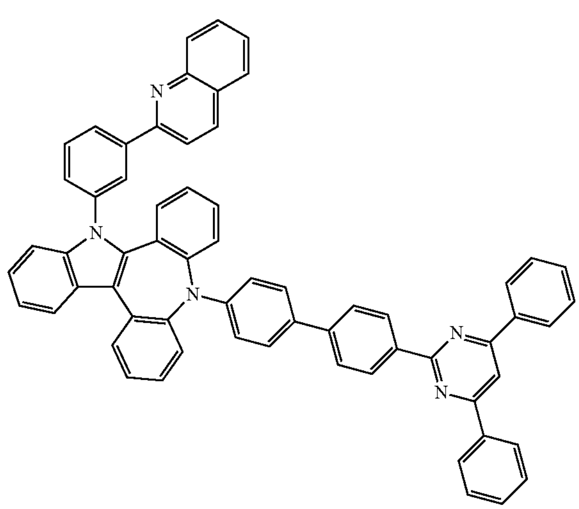
2-40a
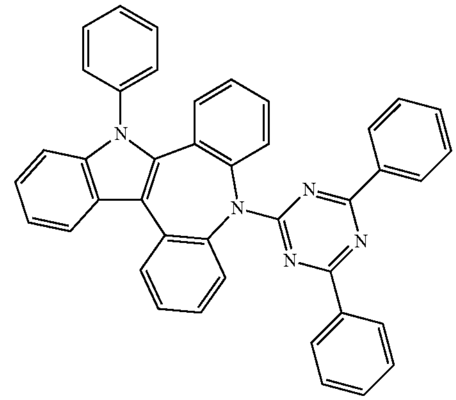
2-41a
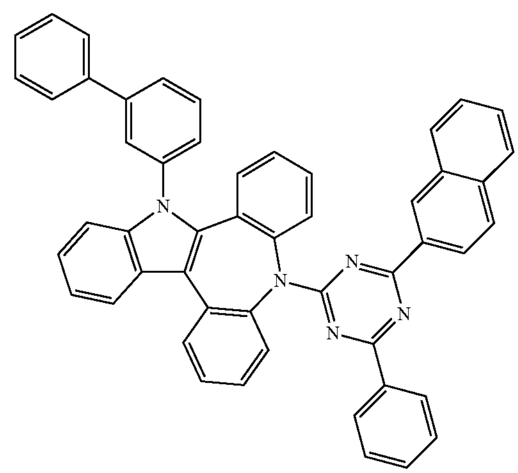
2-42a
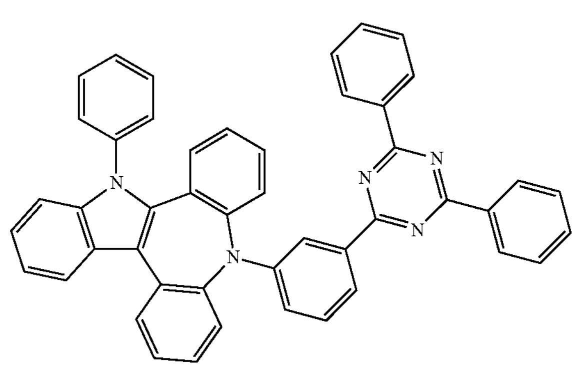

-continued
2-43a
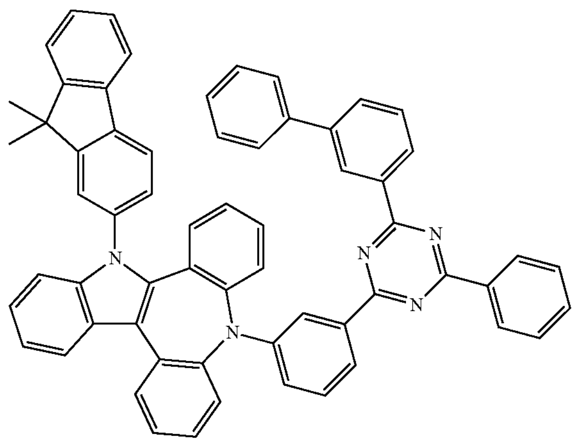
2-44a
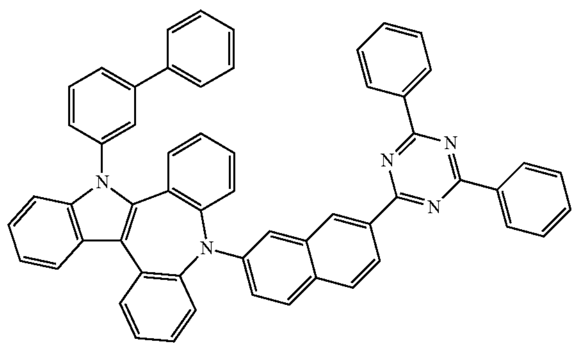
2-45a
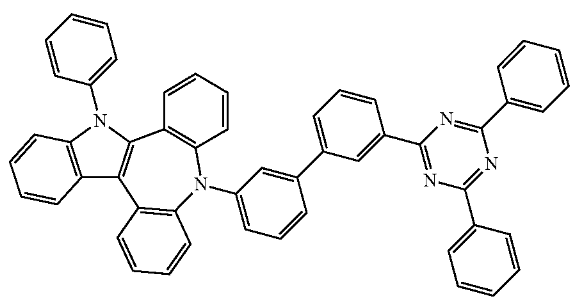
2-46a
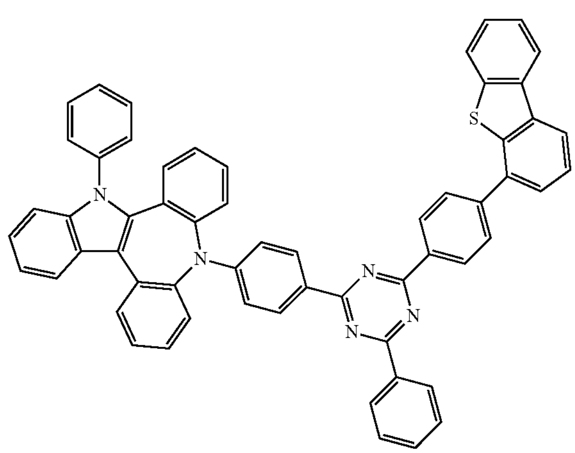
-continued
2-47a
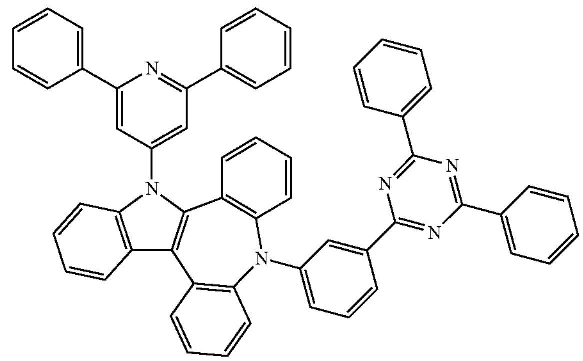
2-48a
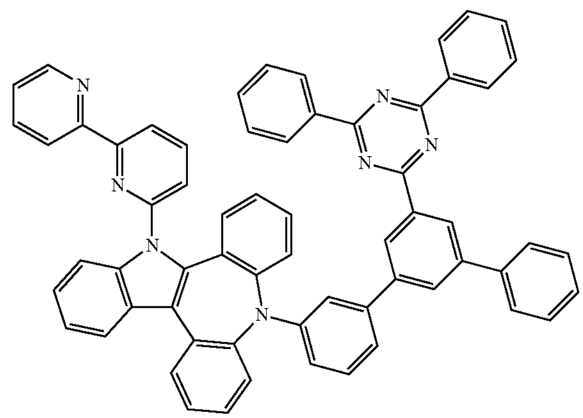
2-49a
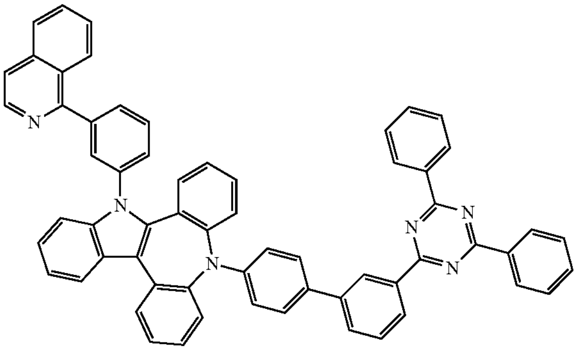
2-50a
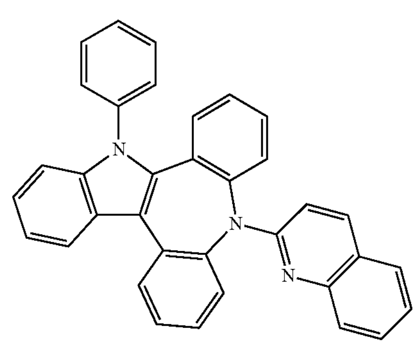

-continued
2-51a
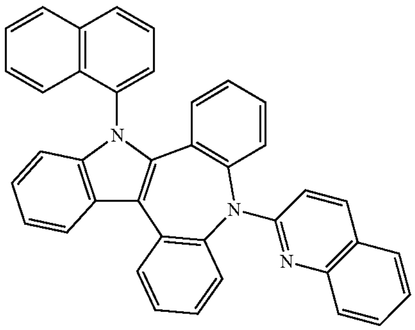
2-52a
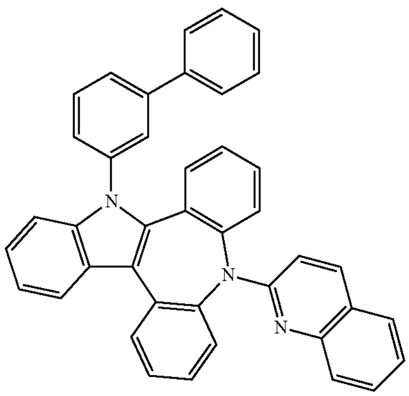
2-53a
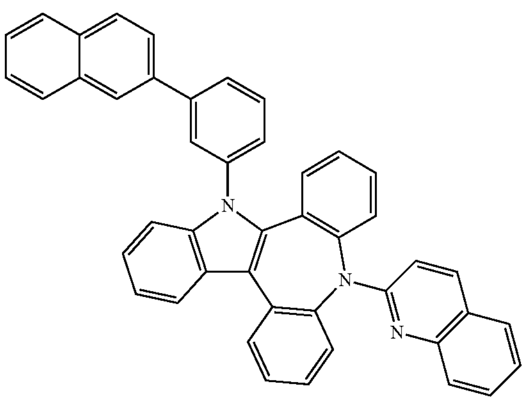
2-54a
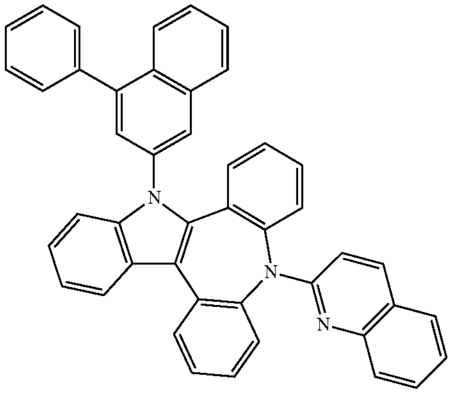
-continued
2-55a
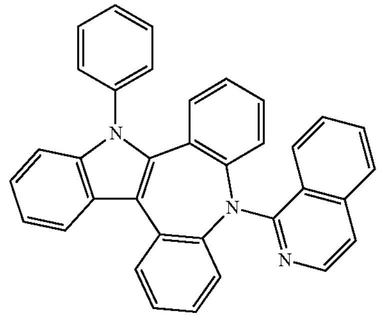
2-56a
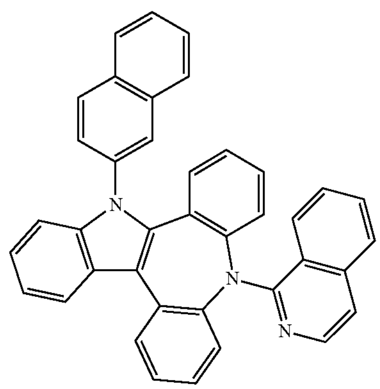
2-57a
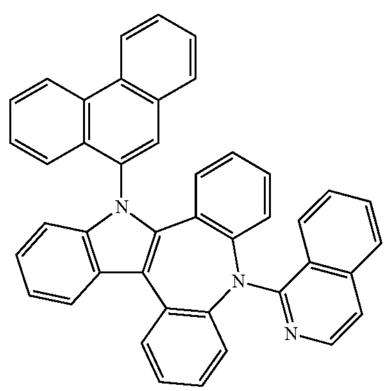
2-58a
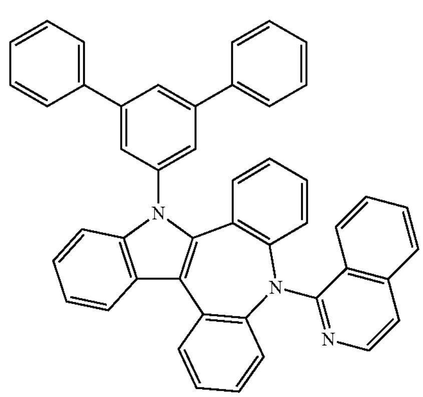

2-59a
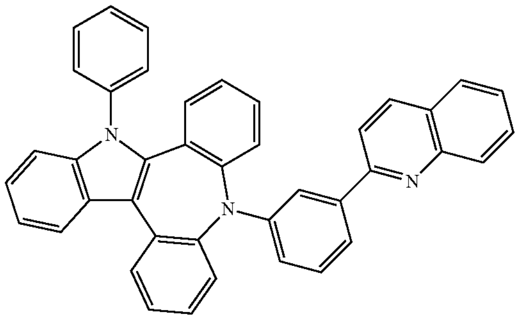
2-60a
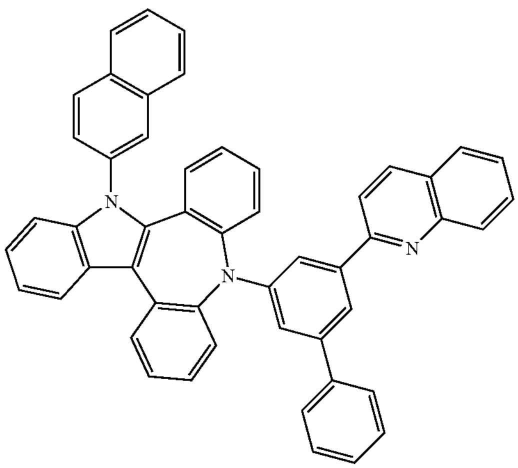
2-61a
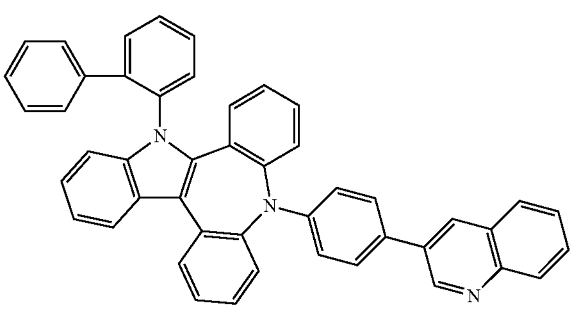
2-62a
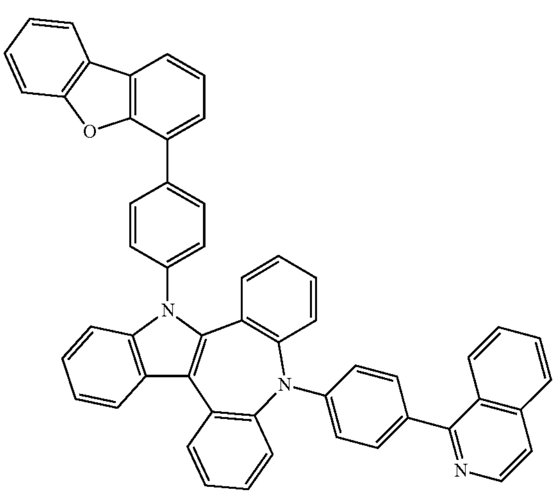
2-63a
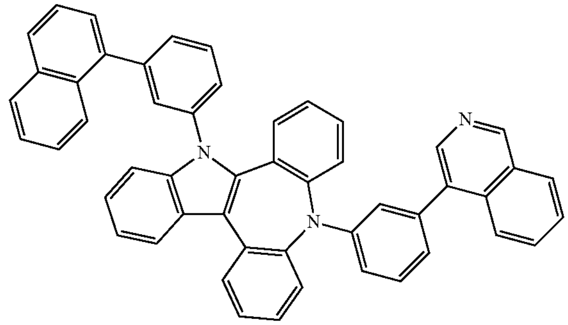
2-64a
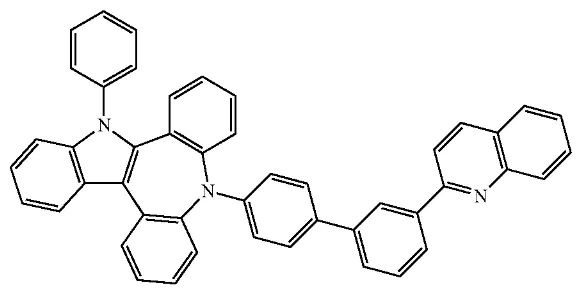
2-65a
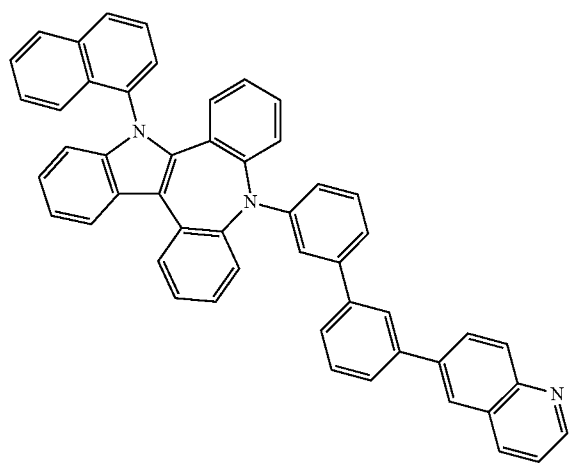
2-66a
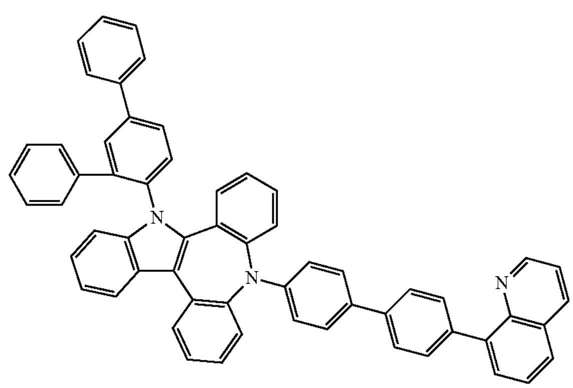

-continued
2-67a
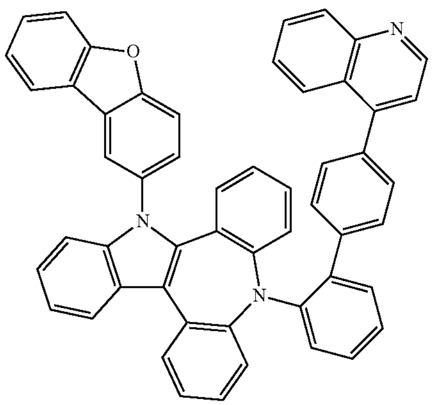
2-68a
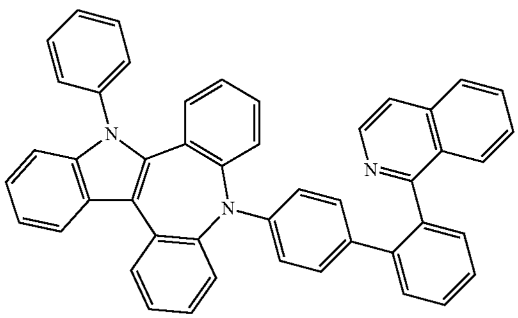
2-69a
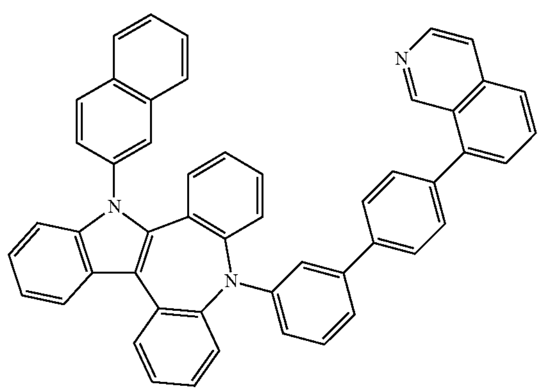
2-70a
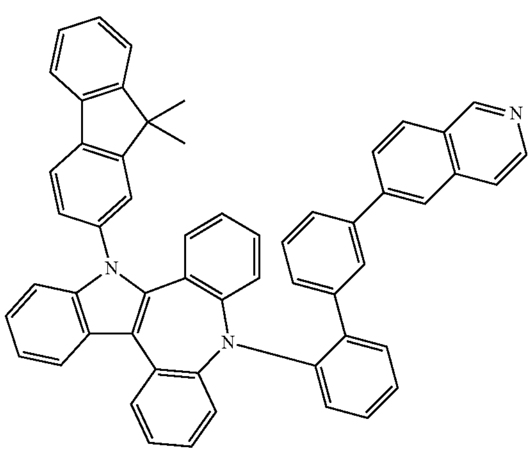
-continued
2-71a
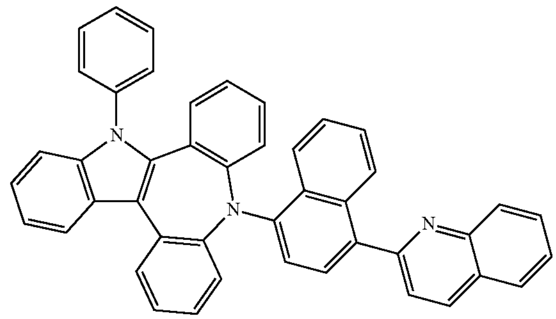
2-72a
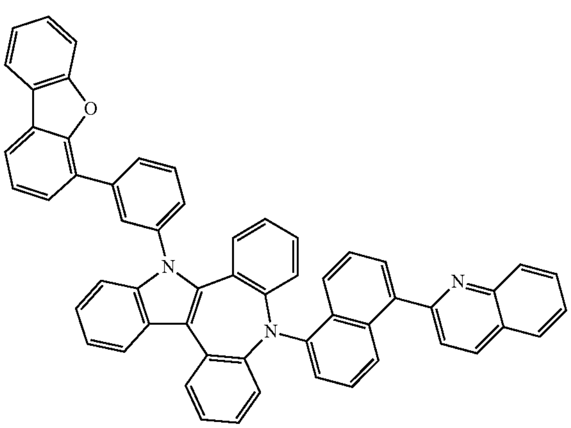
2-73a
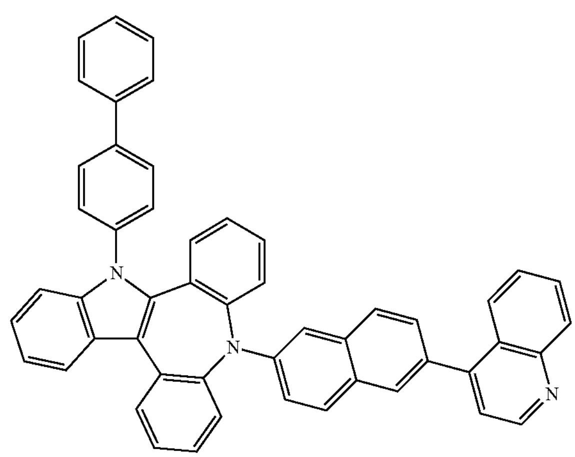

2-74a
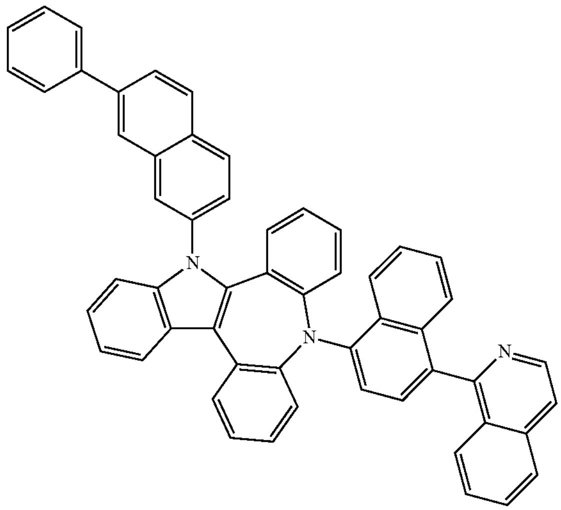
2-75a
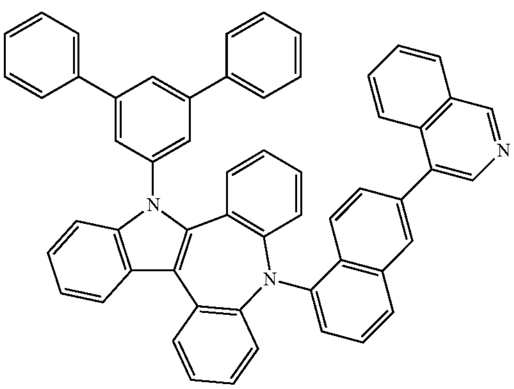
2-76a
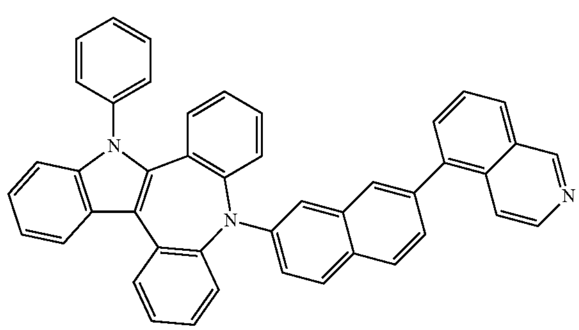
2-77a
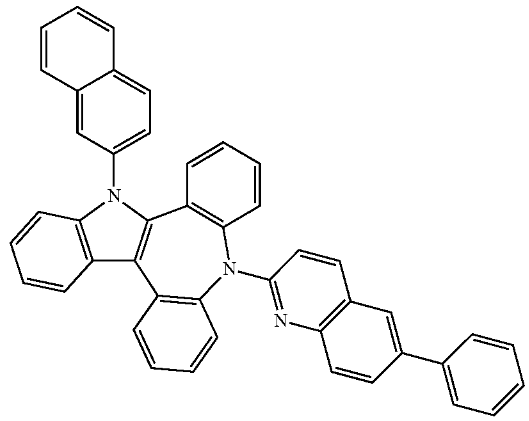
2-78a
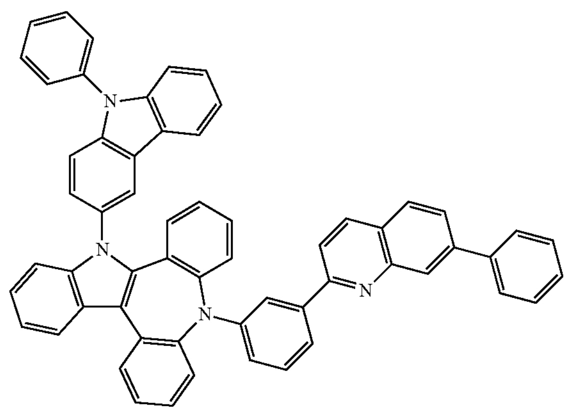
2-79a
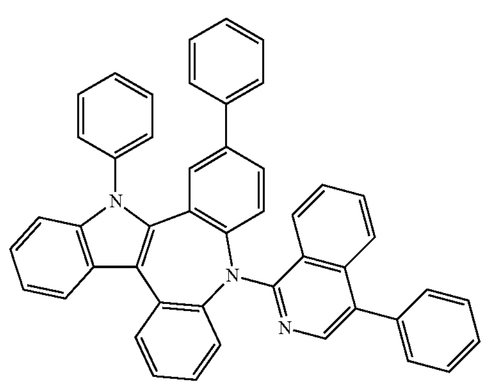

-continued
2-80a
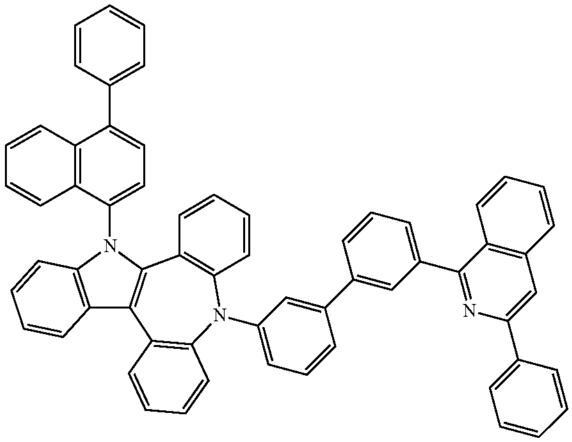
2-81a
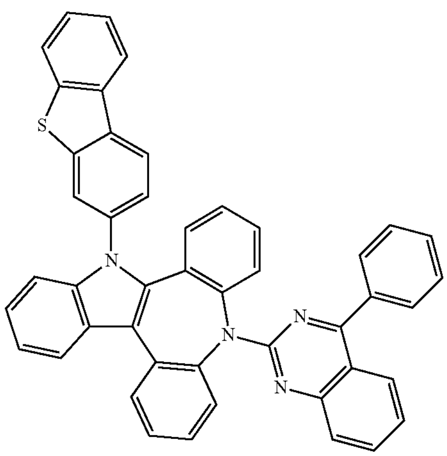
2-82a
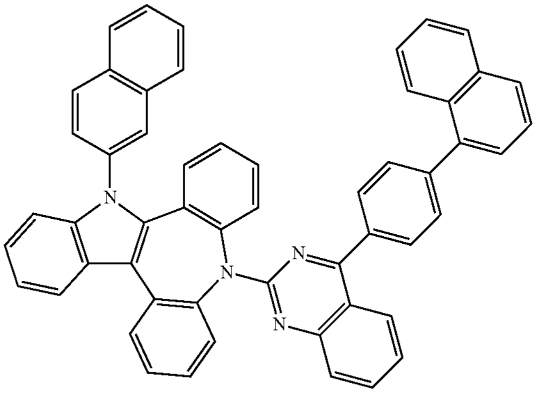
-continued
2-83
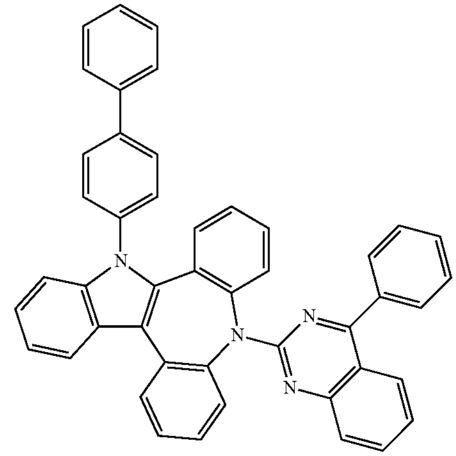
2-84a
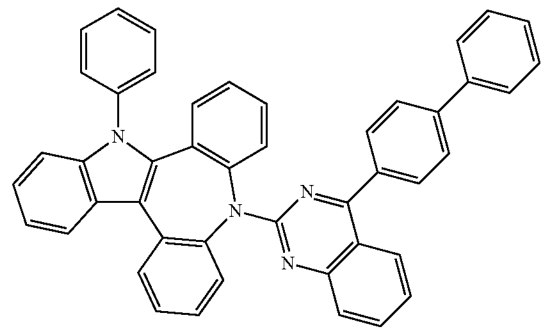
2-85a
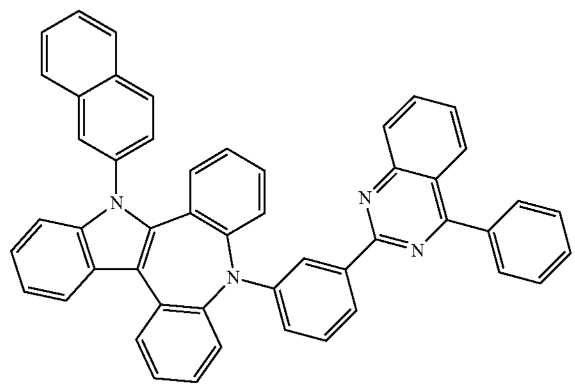
2-86a
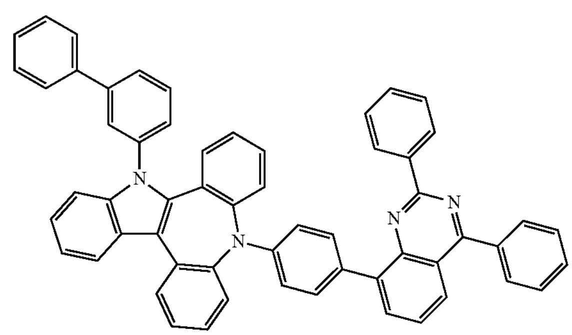

2-87a
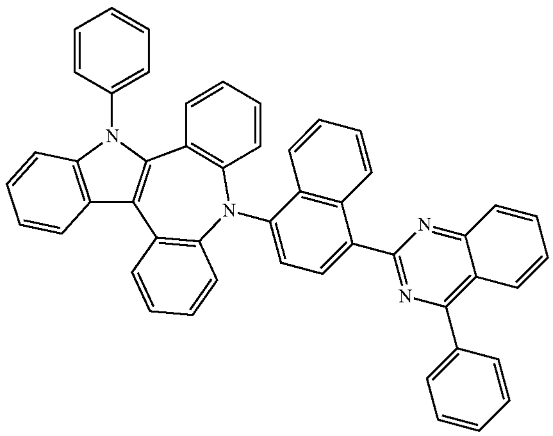
2-88a
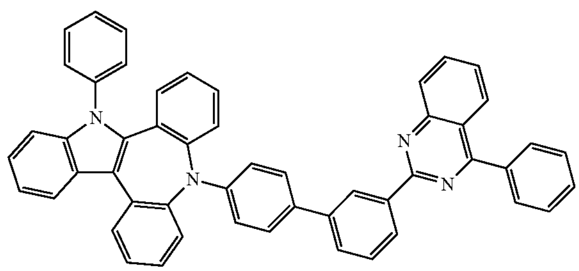
2-89a
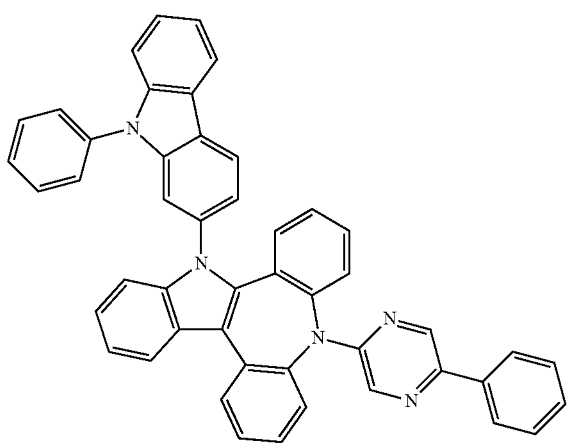
2-90a
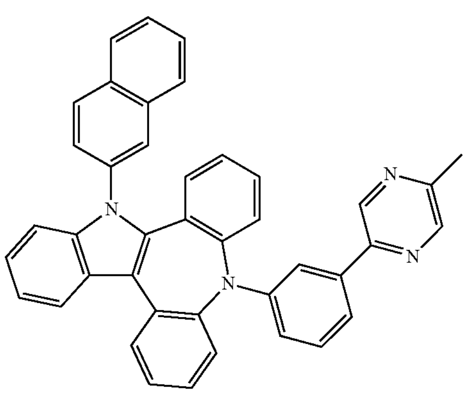
2-91a
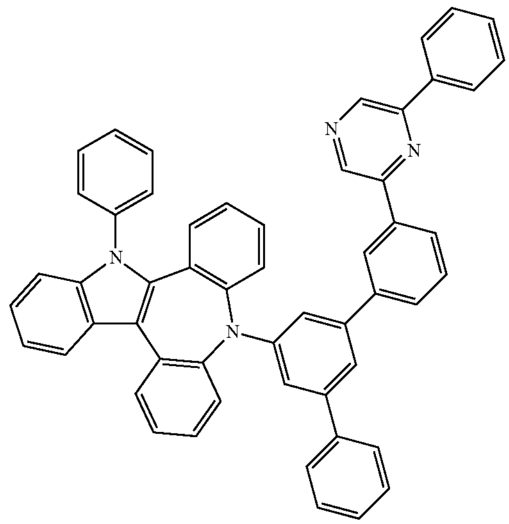
2-92a
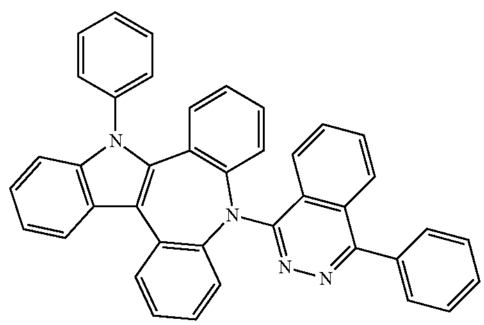
2-93a
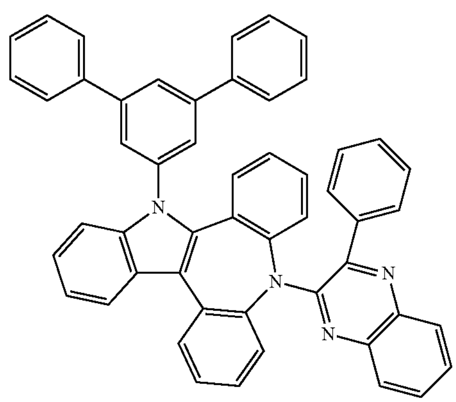
2-94a
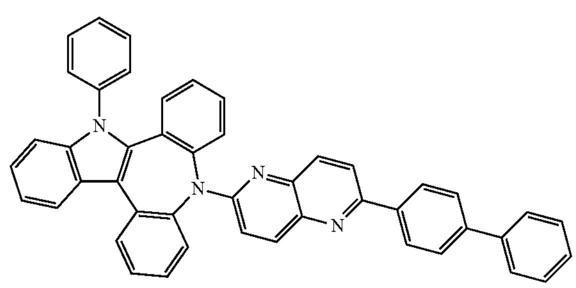

-continued
2-95a
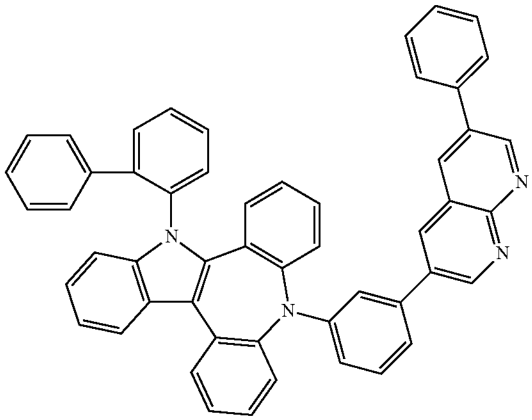
2-96a
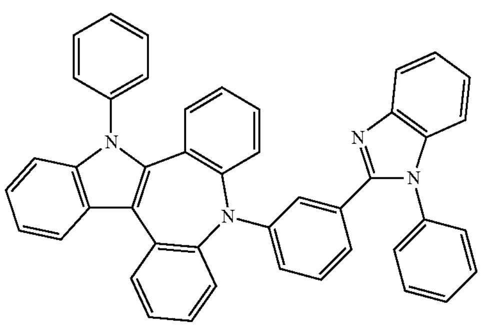
2-97a
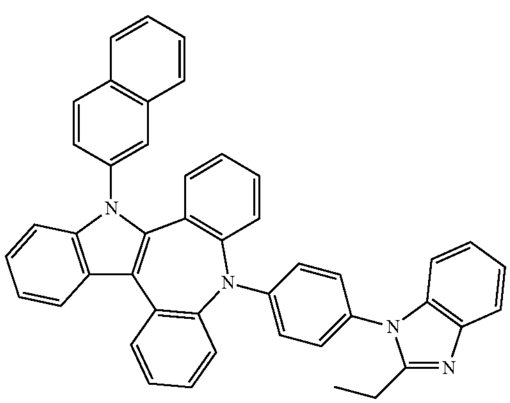
-continued
2-98a
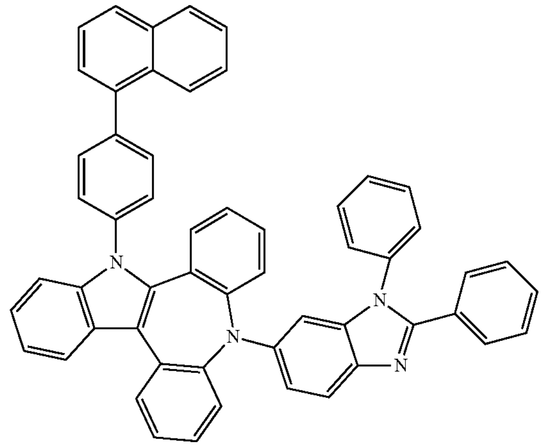
2-99a
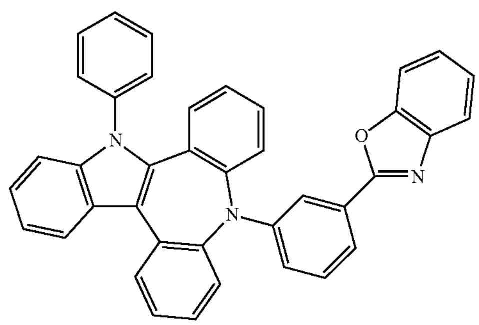
2-100a
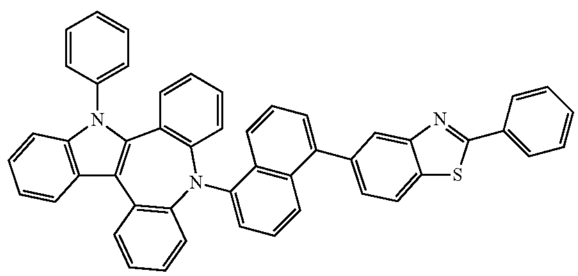
2-101a
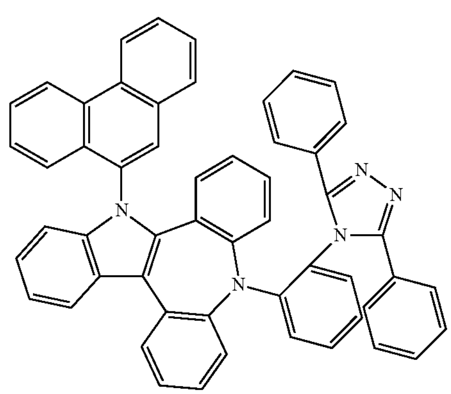

2-102a
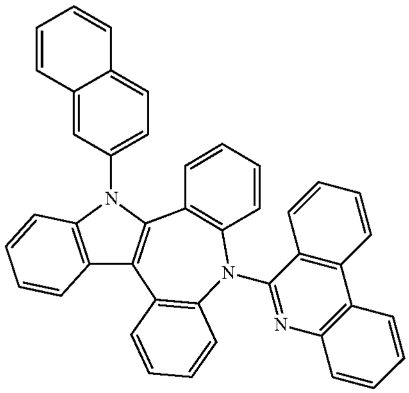
2-103a
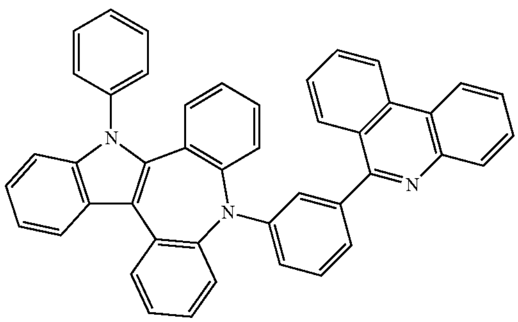
2-104a
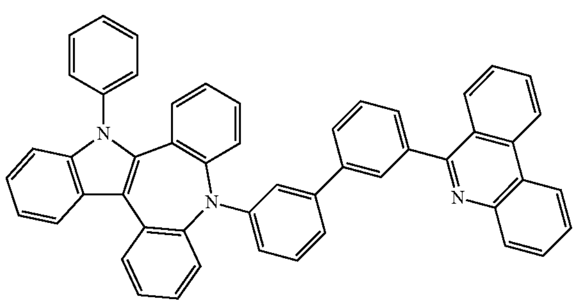
2-105a
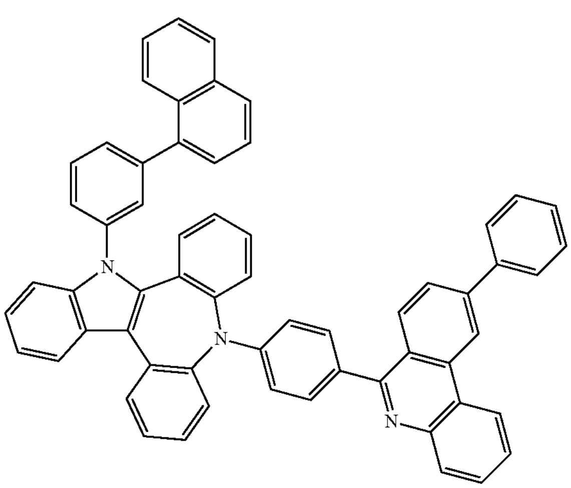
2-106a
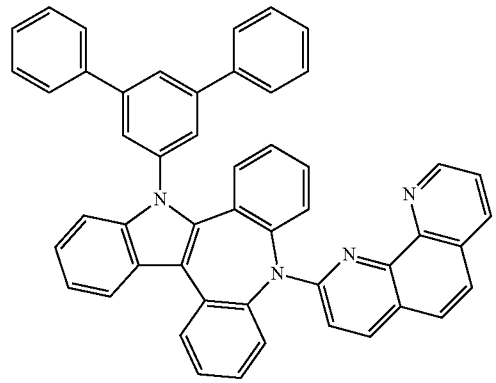
2-107a
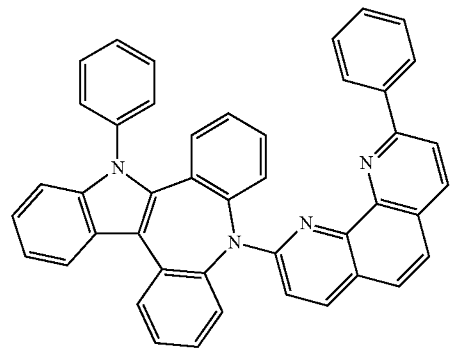
2-108a
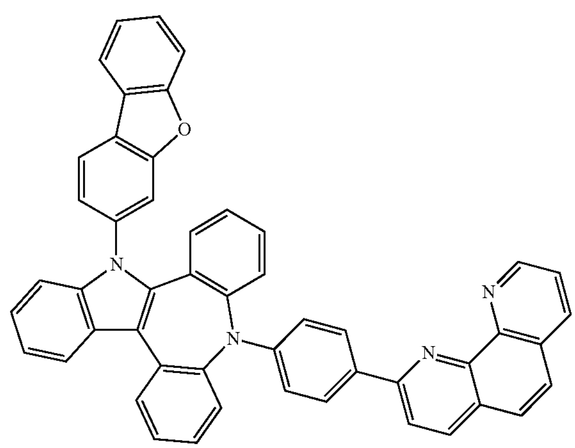
2-109a
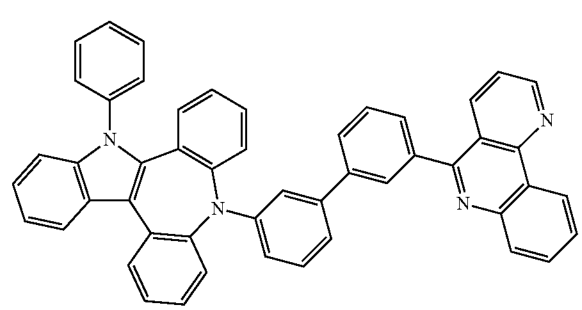

-continued
2-110a
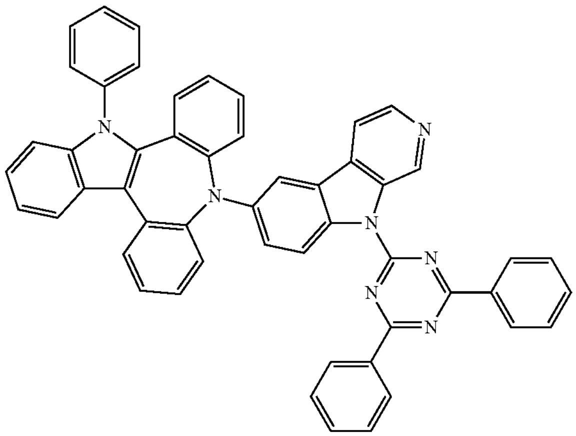
2-111a
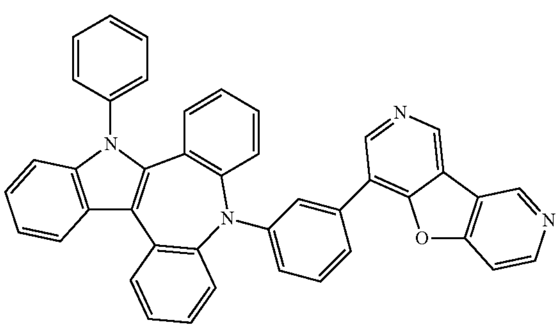
2-112a
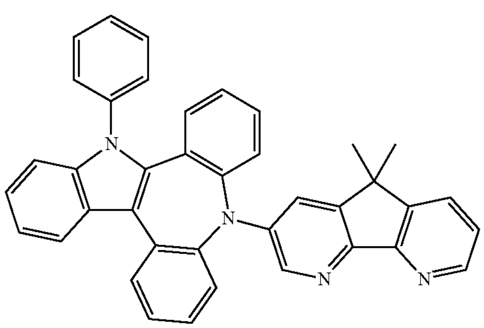
2-113a
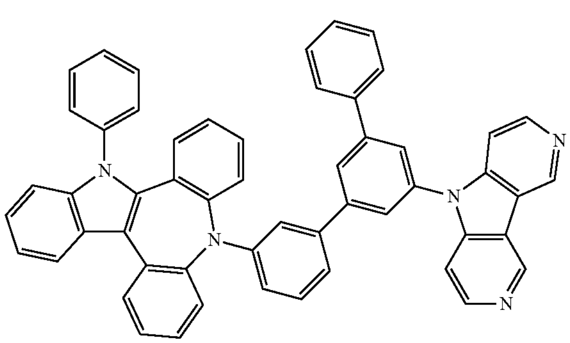
-continued
2-114a
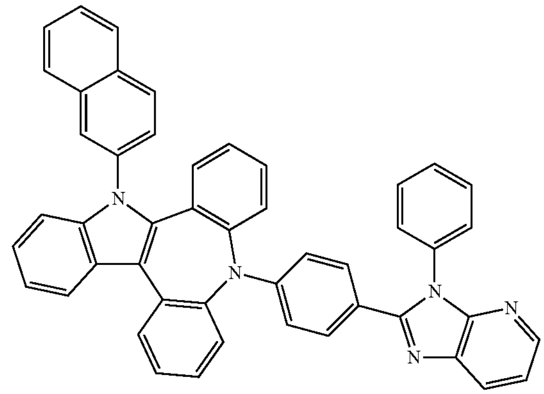
2-115a
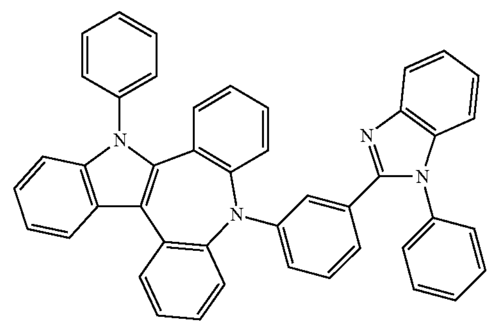
2-116a
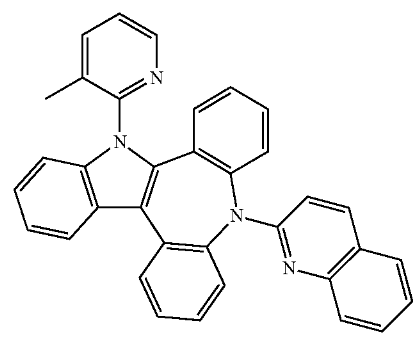
2-117a
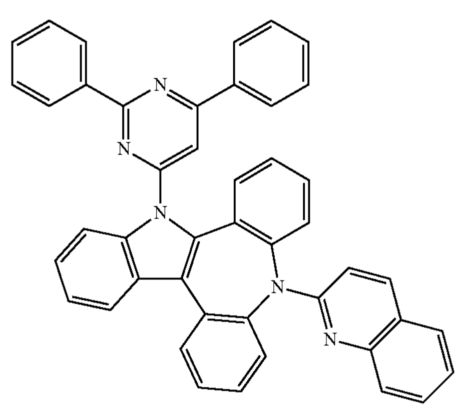

-continued
2-118a
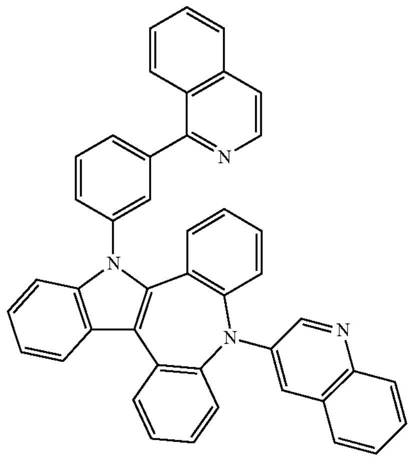
2-119a
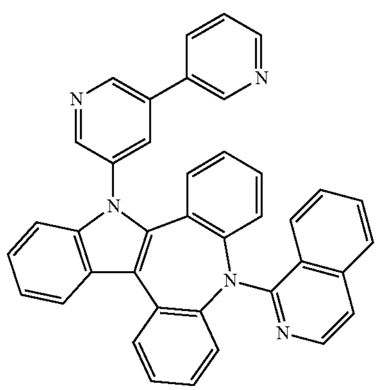
2-120a
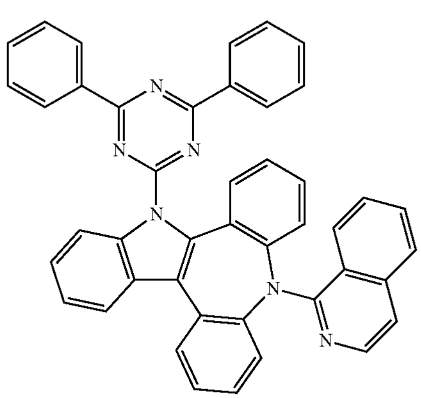
-continued
2-121a
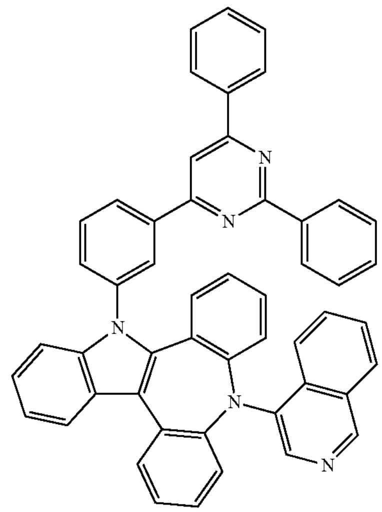
2-122a
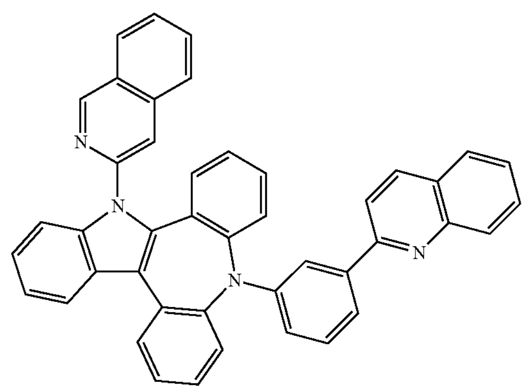
2-123a
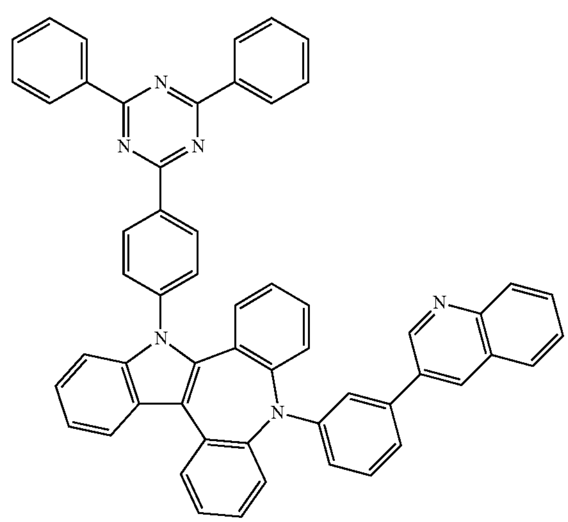

-continued
2-124a
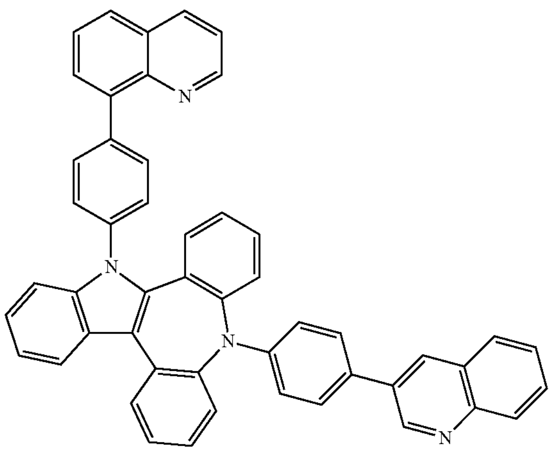
2-125a
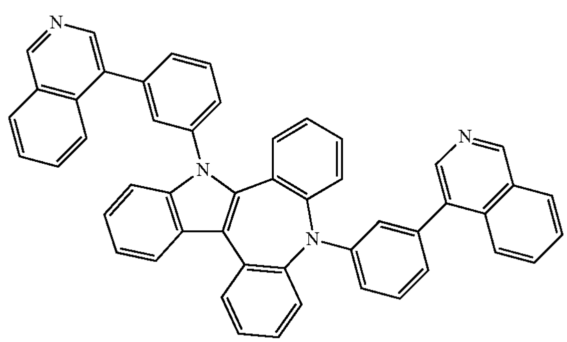
2-126a
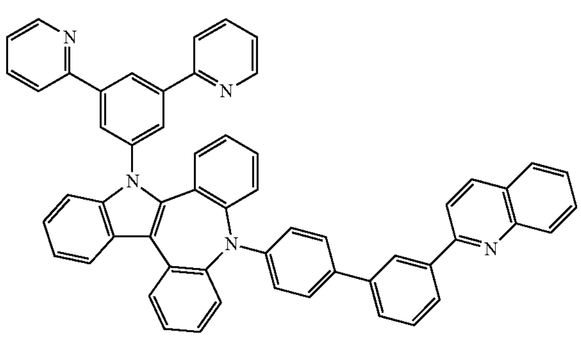
2-127a
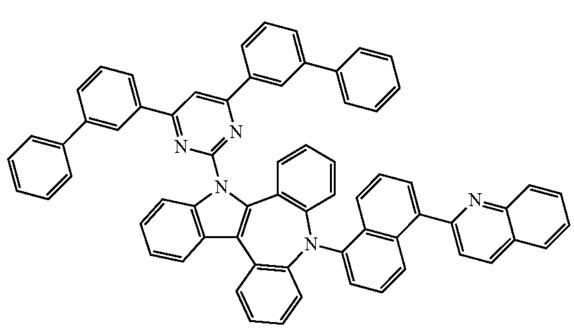
-continued
2-128a
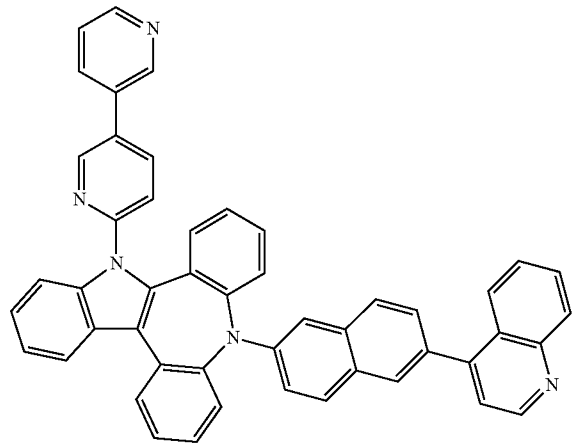
2-129a
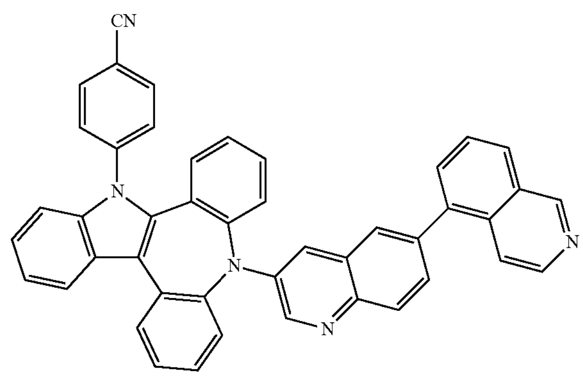
2-130a
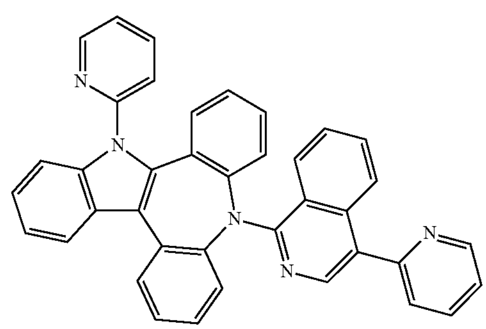
2-131a
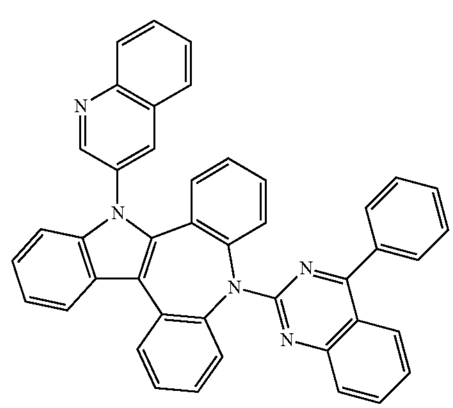

-continued
2-132a
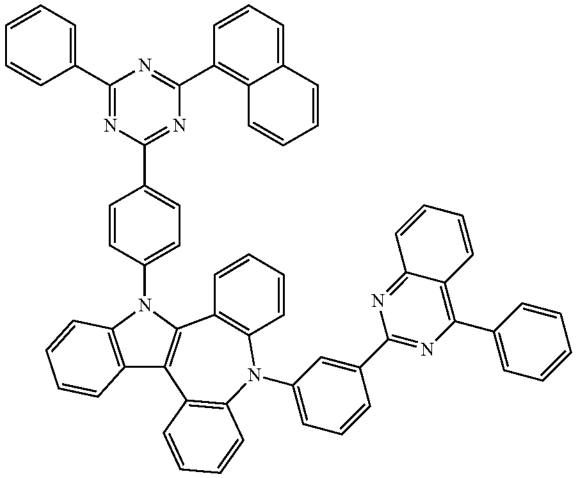
2-133a
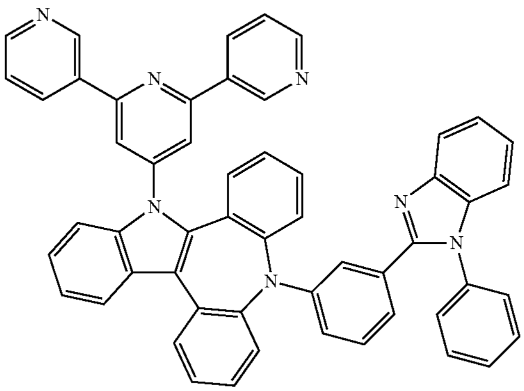
2-134a
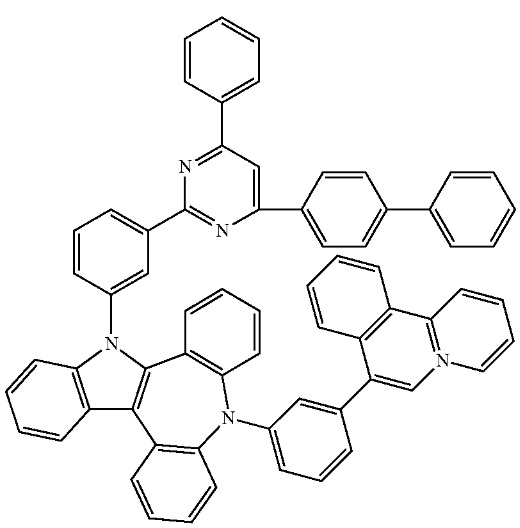
-continued
2-135a
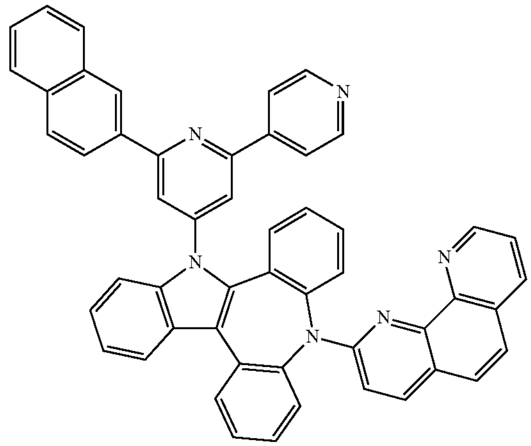
2-136a
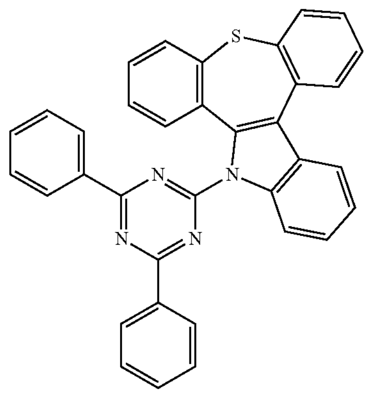
2-137
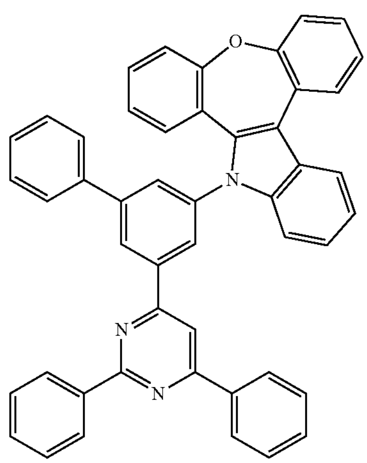
2-138a
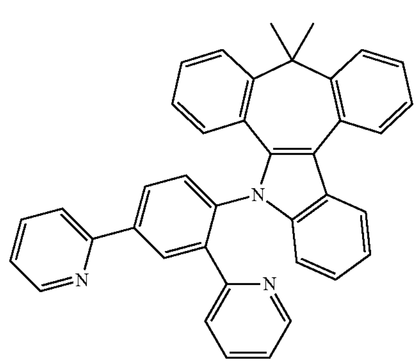

-continued
2-139a
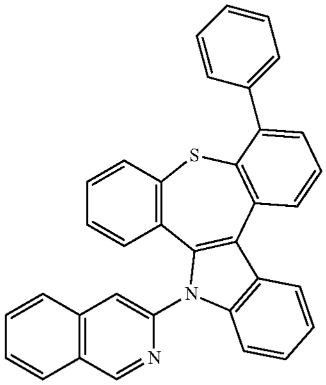
2-140a
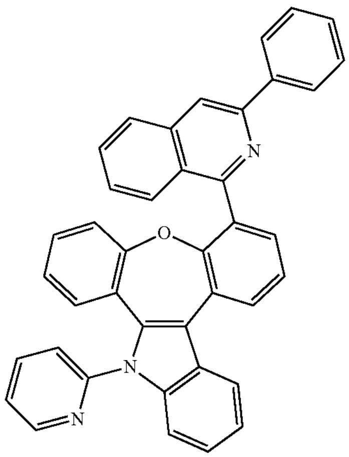
2-141a
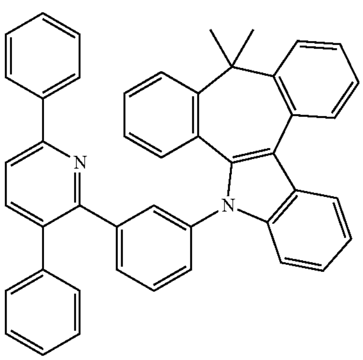
2-142a
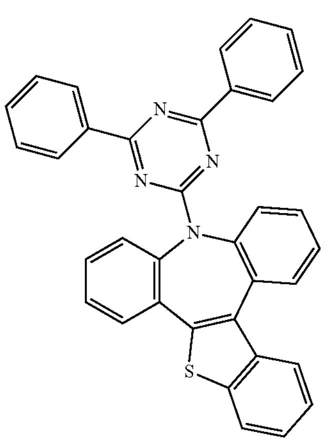
-continued
2-143a
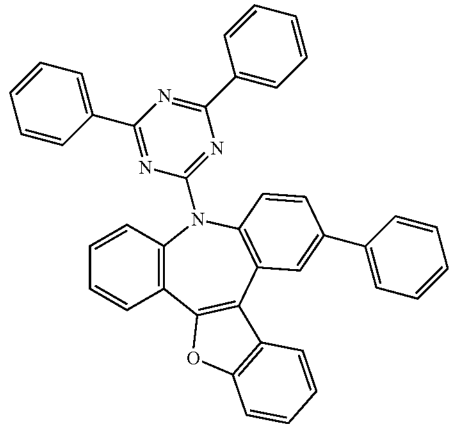
2-144a
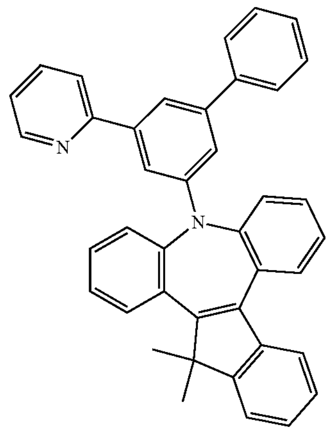
2-145a
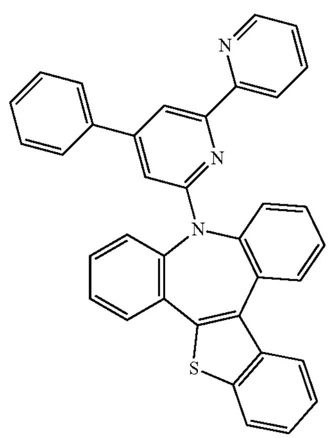

-continued
2-146a
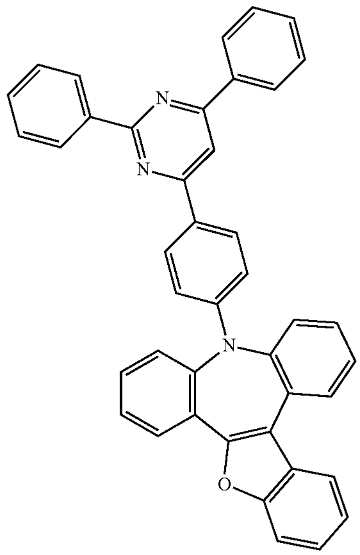
2-147a
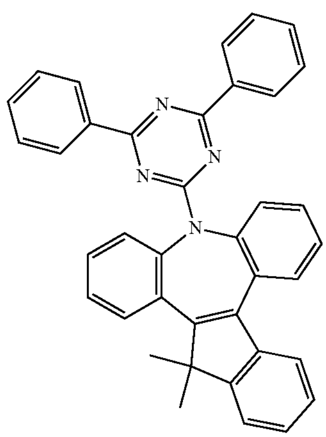
2-148a
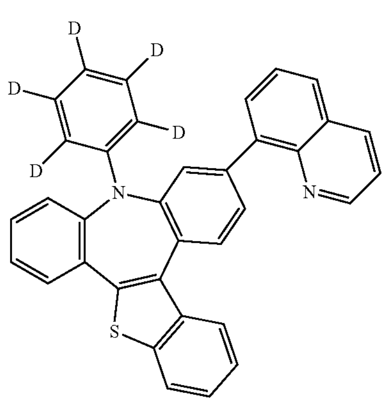
-continued
2-149a
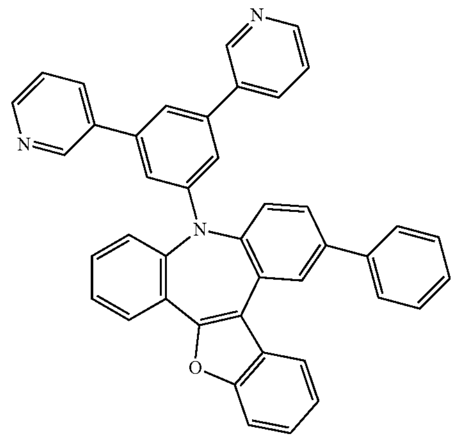
2-150a
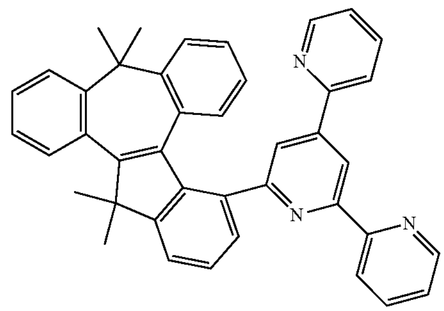
2-151a
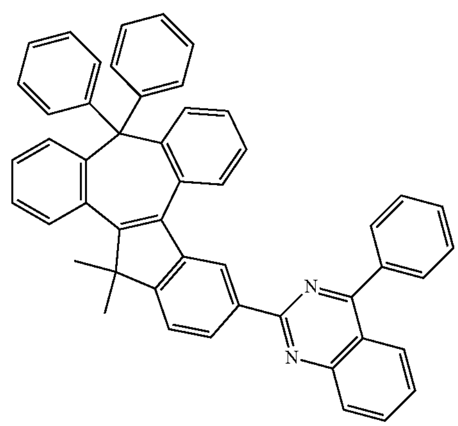
2-152a
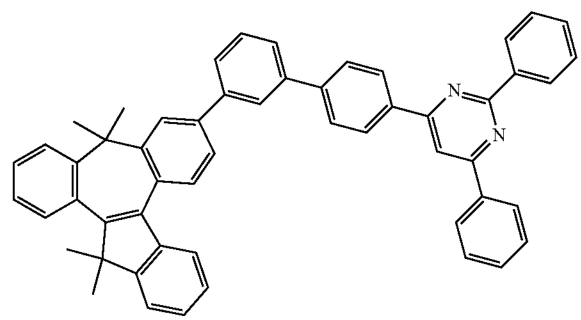

-continued
2-153a
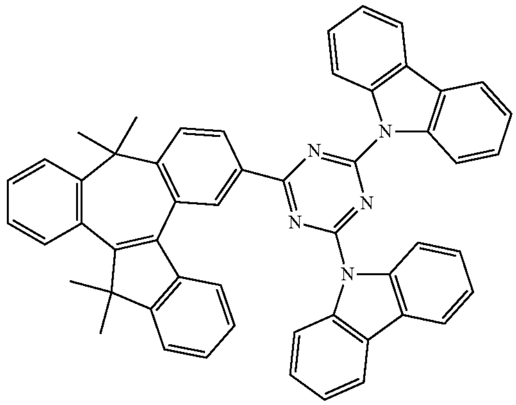
2-154a
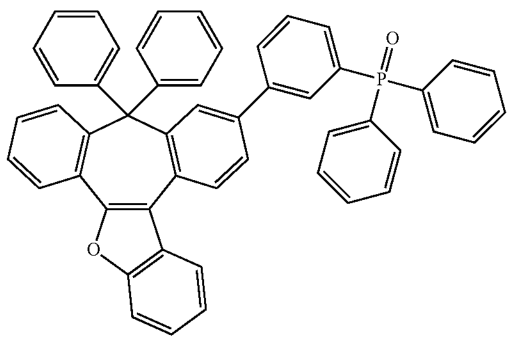
2-155a
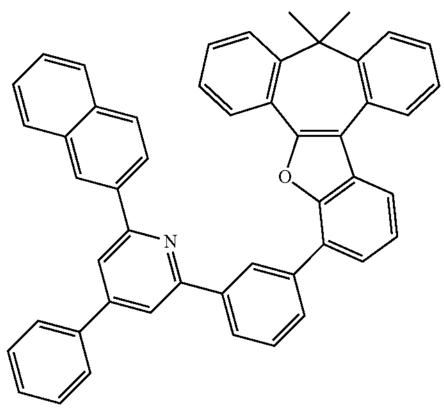
2-156a
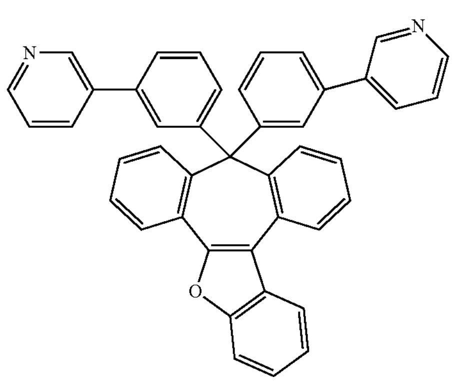
-continued
2-157a
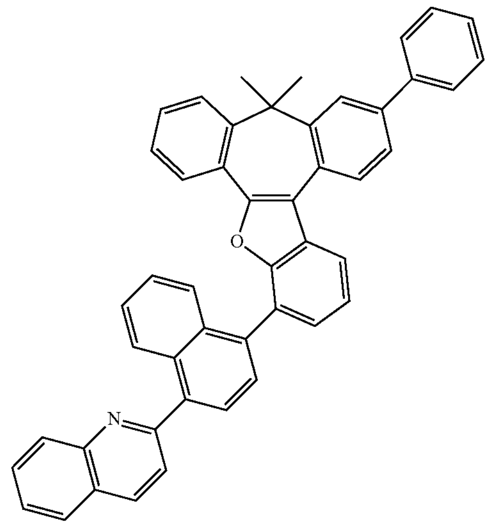
2-158a
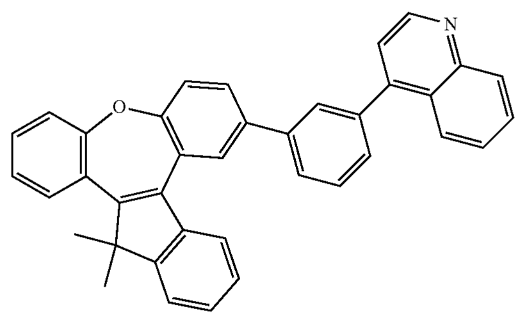
2-159a
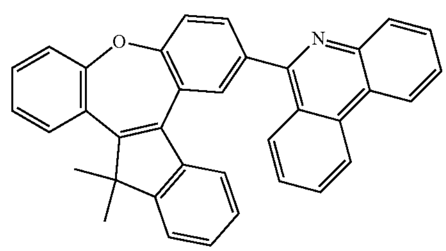
2-160a
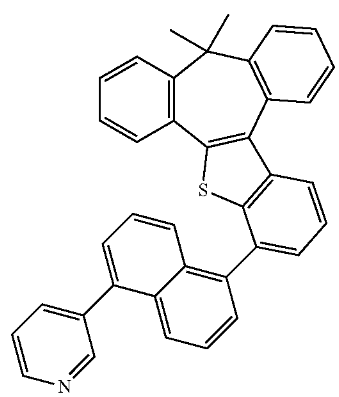

-continued
2-161a
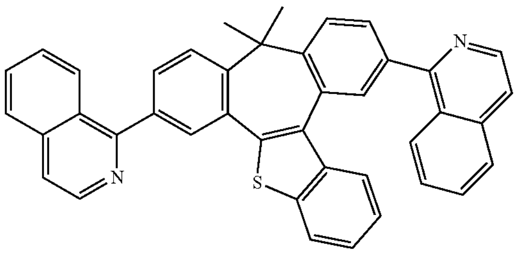
2-162a
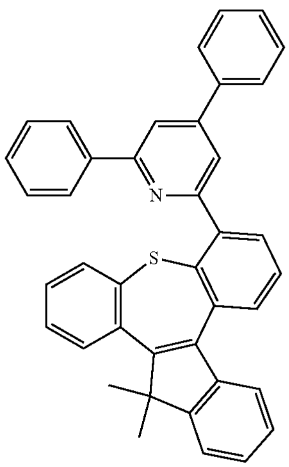
2-163a
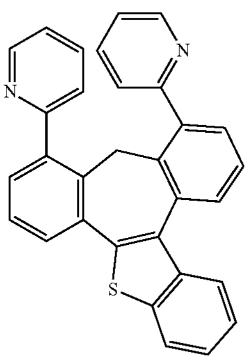
2-164a
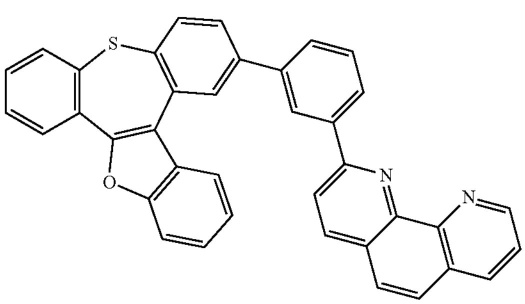
-continued
2-165a
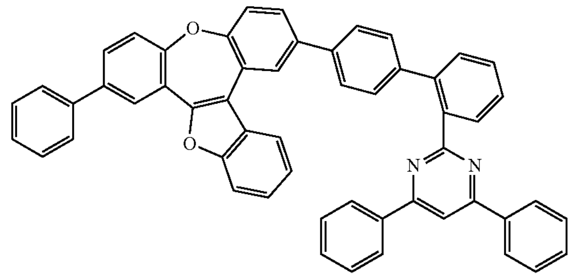
2-166a
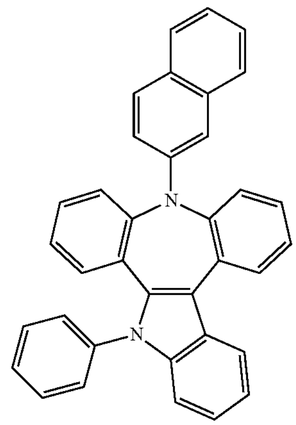
2-167a
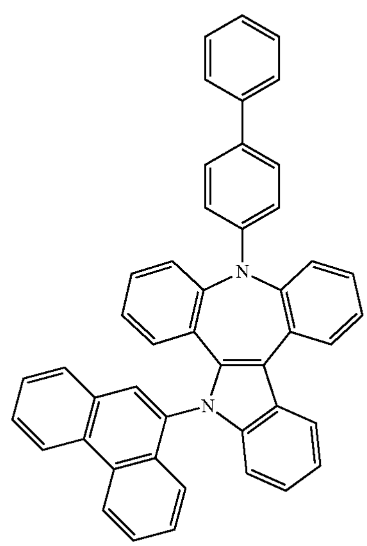

-continued
2-168a
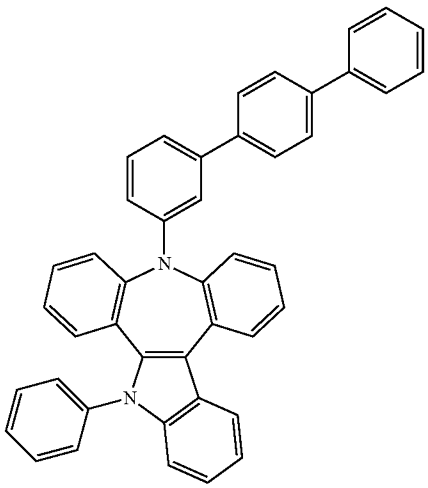
2-169a
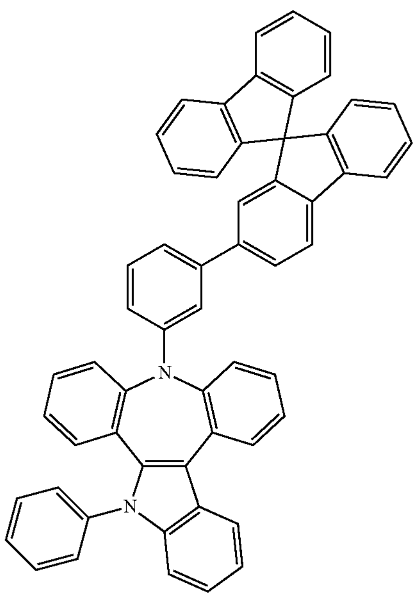
2-170a
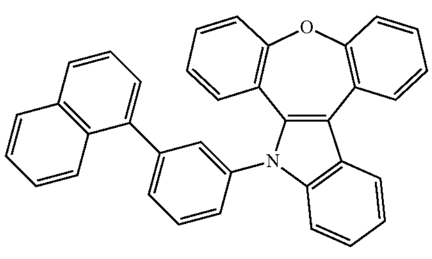
-continued
2-171a
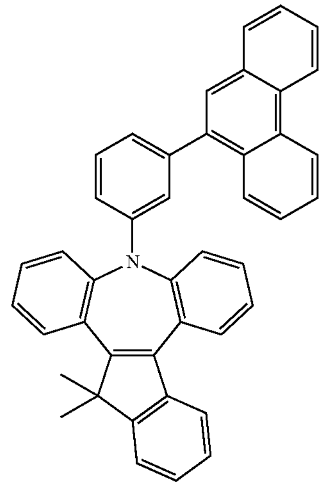
2-172a
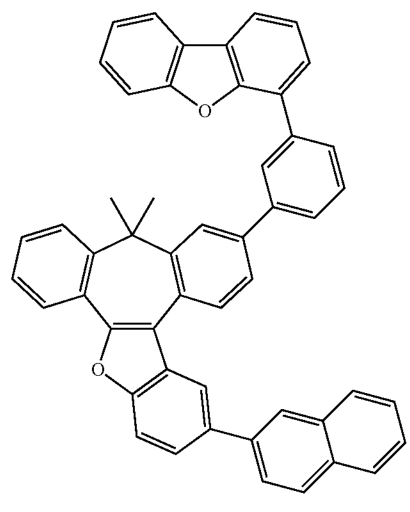
2-1
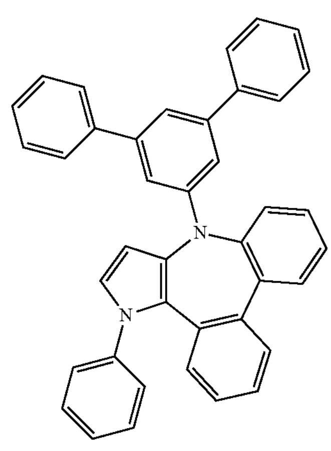

2-2
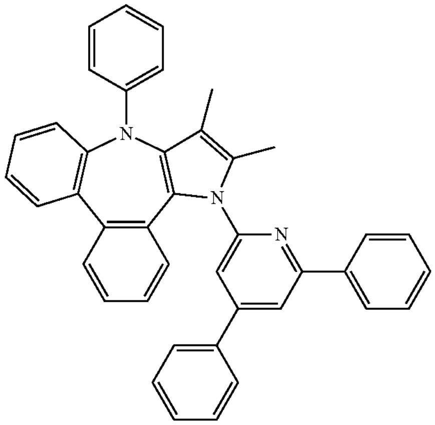
2-3
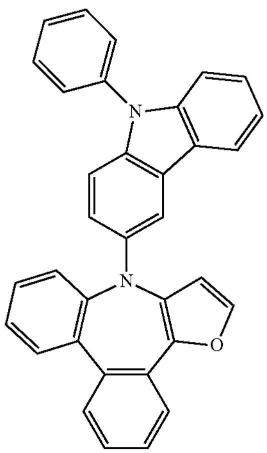
2-4
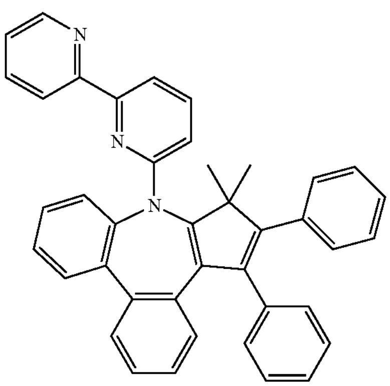
2-5
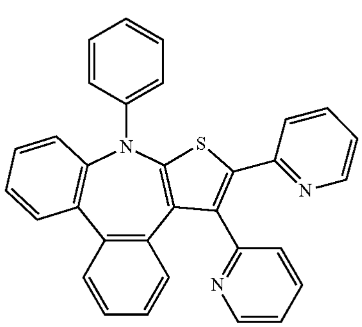
2-6
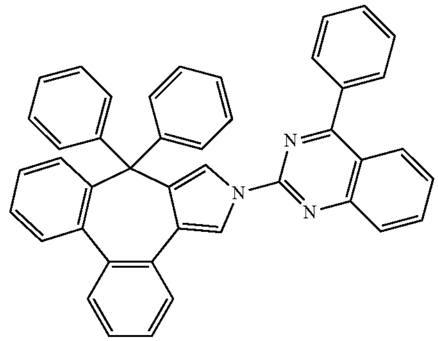
2-7
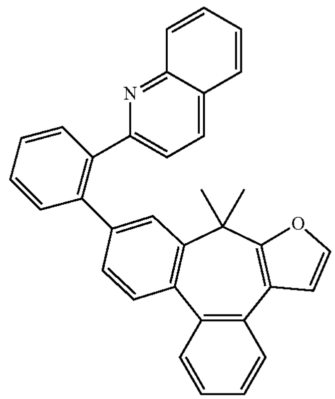
2-8
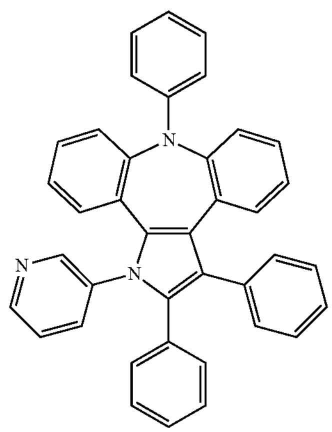
2-9
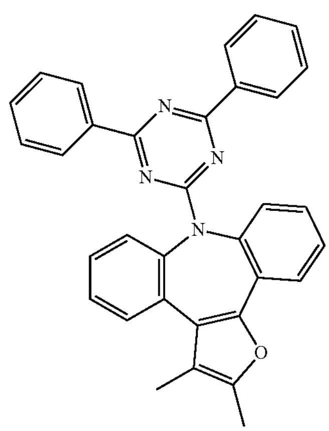

2-10
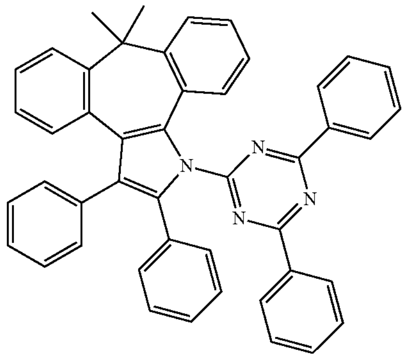
2-11
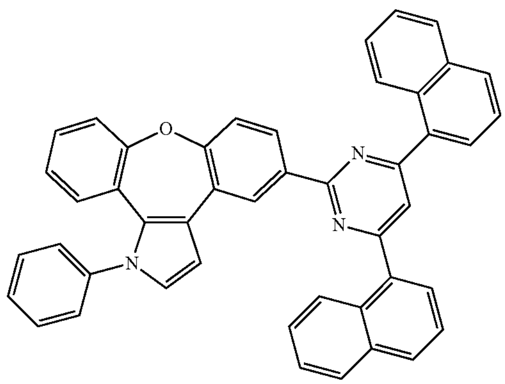
2-12
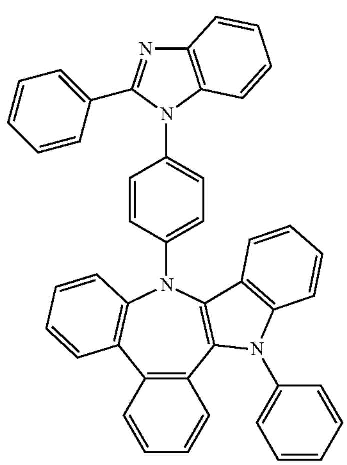
2-13
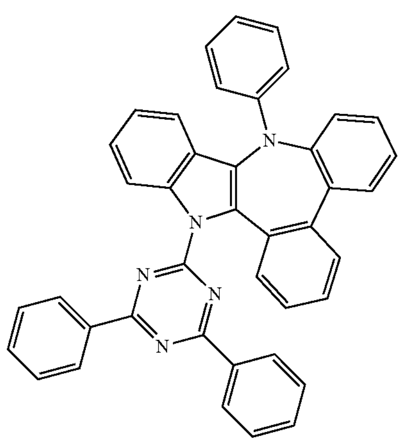
2-14
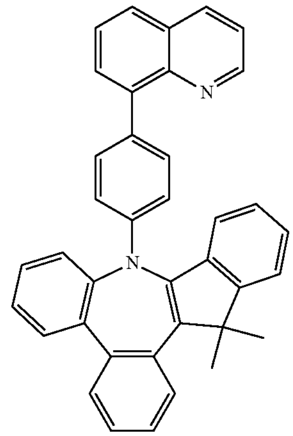
2-15
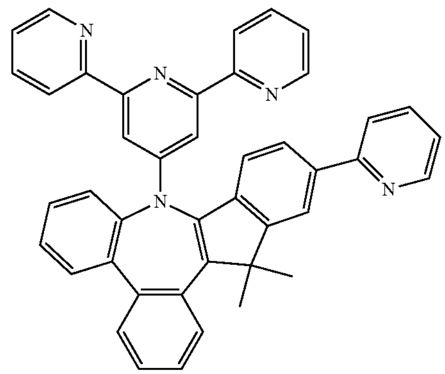
2-16
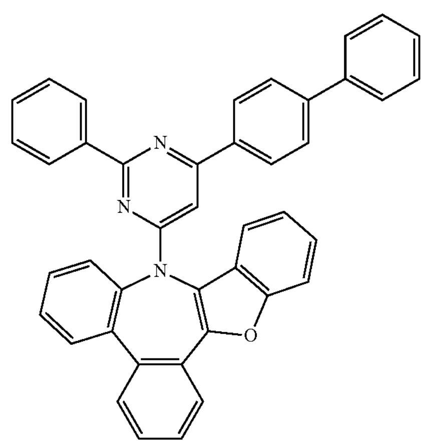
2-17
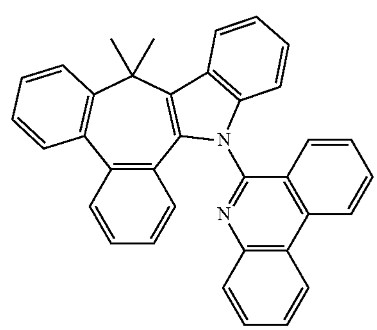

2-18
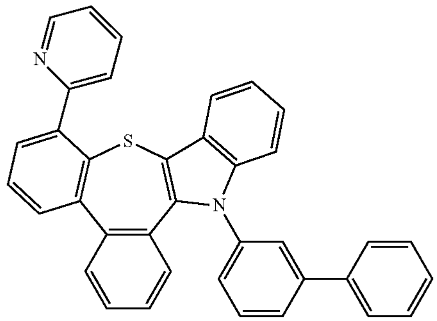
2-19
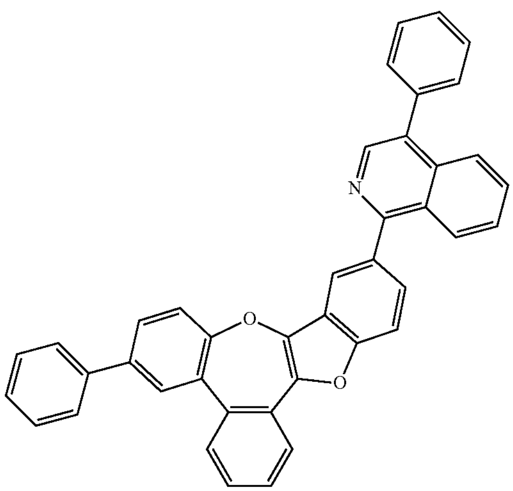
2-20
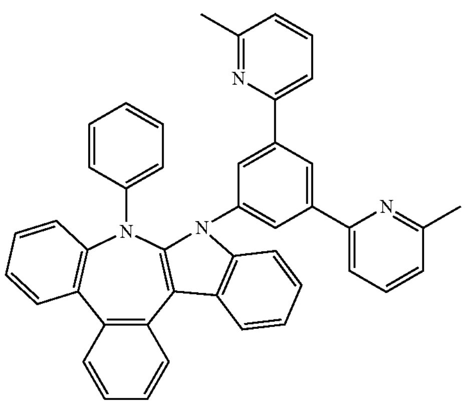
2-21
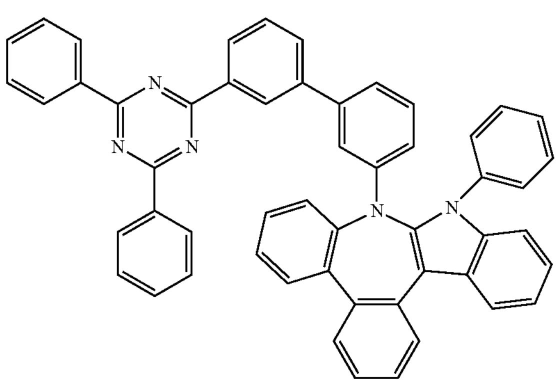
2-22
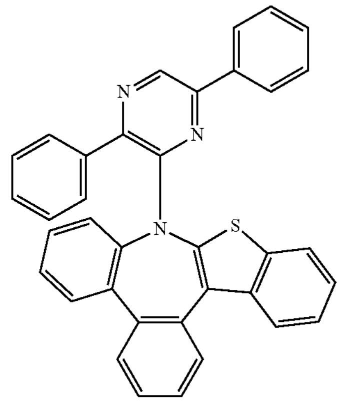
2-23
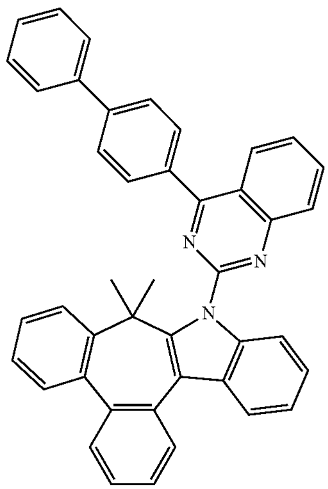
2-24
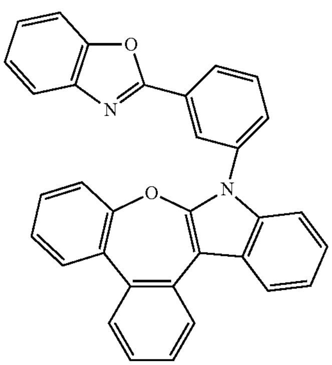
2-25
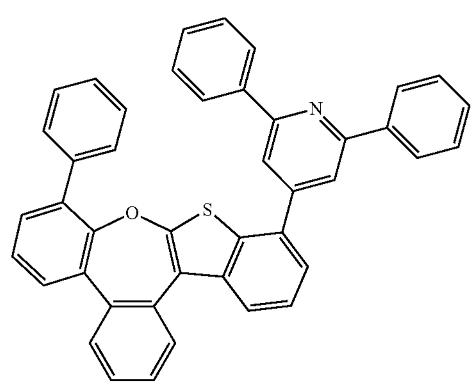

-continued
2-26
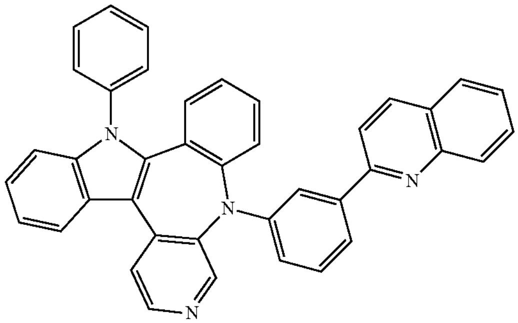
2-27
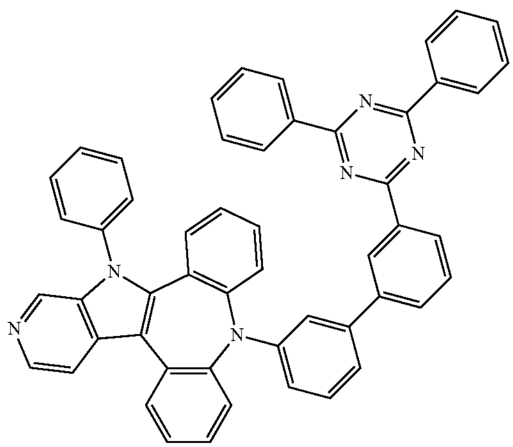
2-28
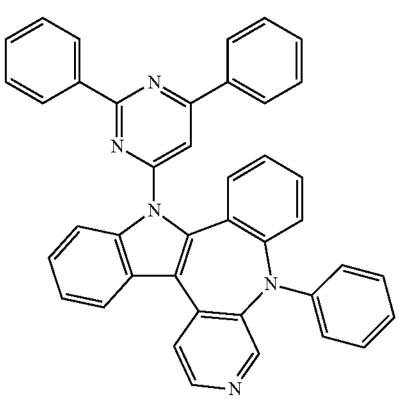
-continued
2-29
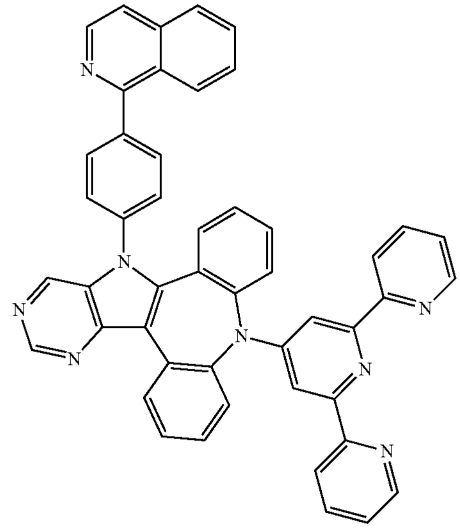
2-30
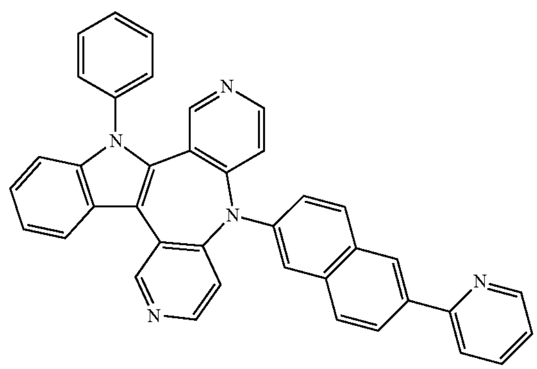
2-31
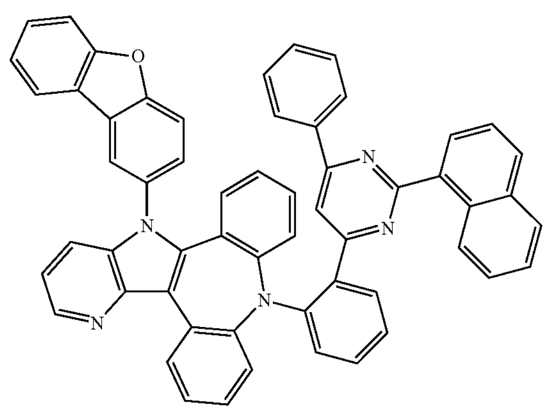

-continued
2-32
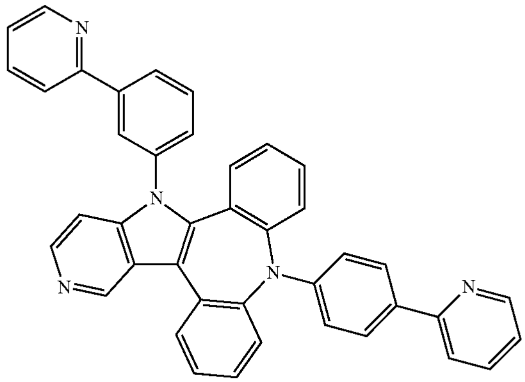
2-33
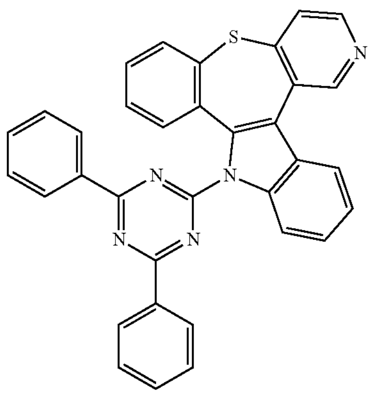
2-34
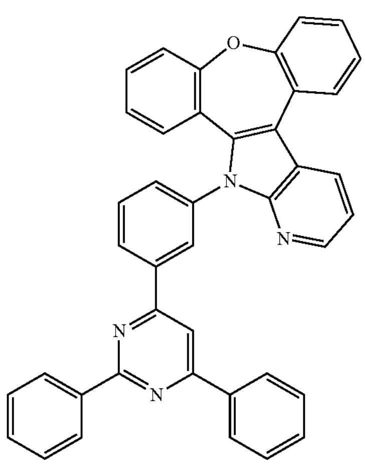
2-35
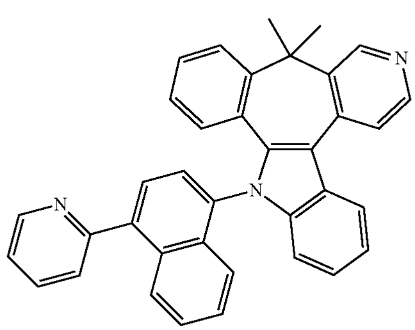
-continued
2-36
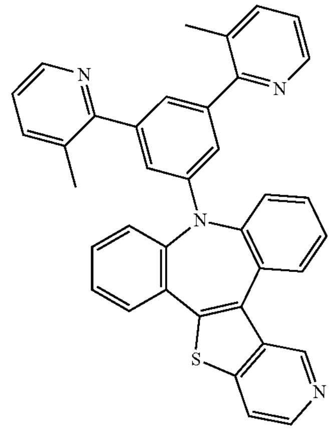
2-37
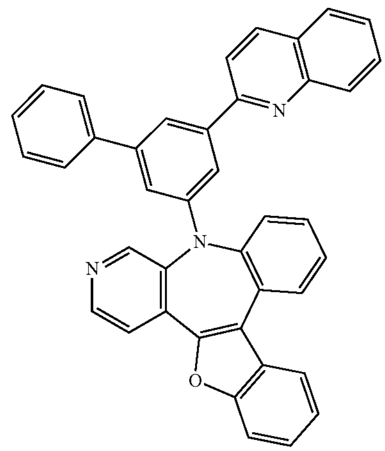
2-38
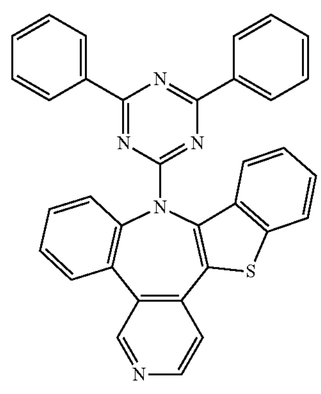
2-39
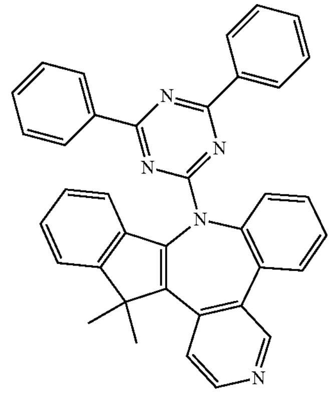

2-40
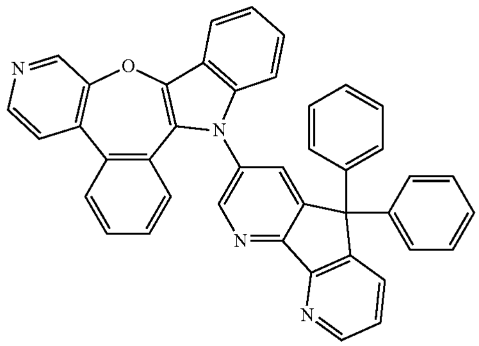
2-41
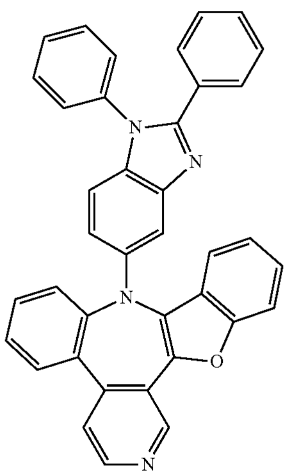
2-42
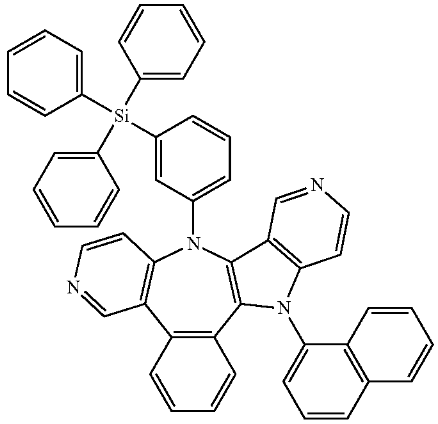
2-43
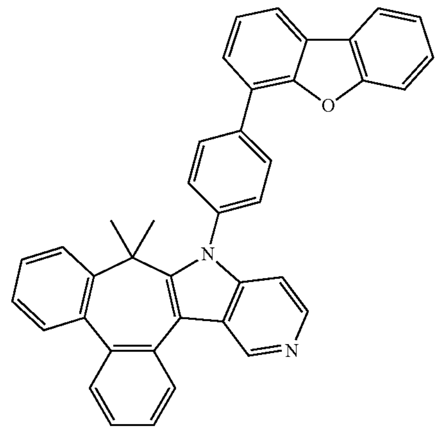
2-44
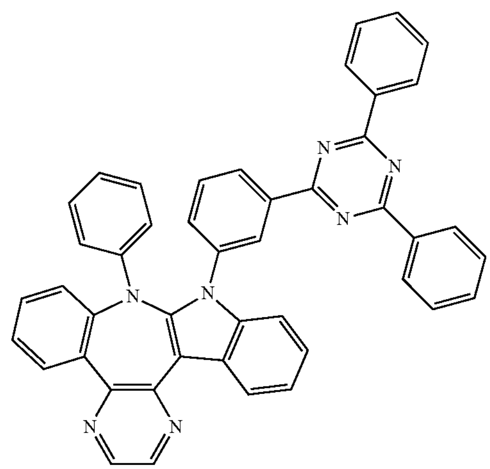
2-45
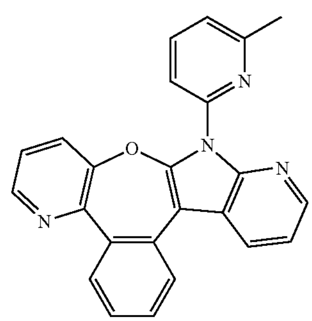
2-46
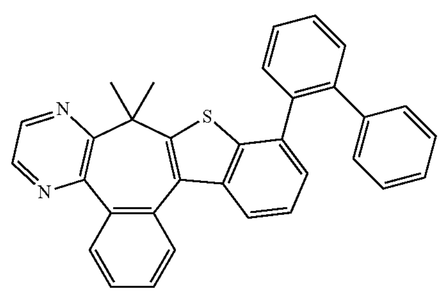

2-47
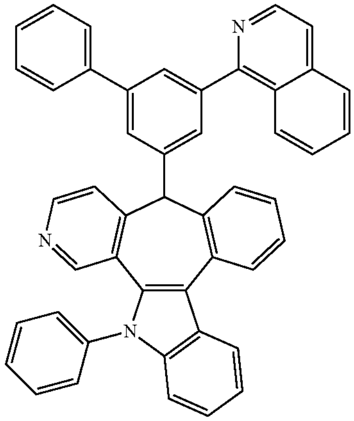
2-48
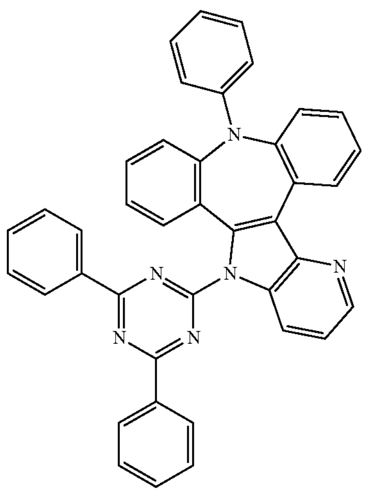
2-49
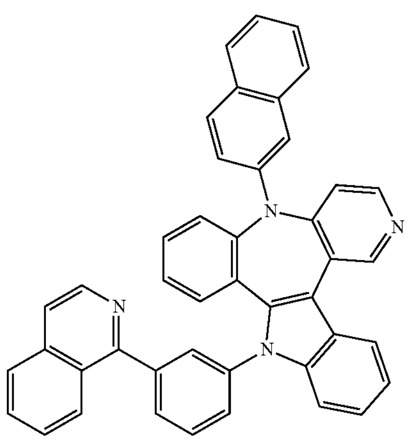
2-50
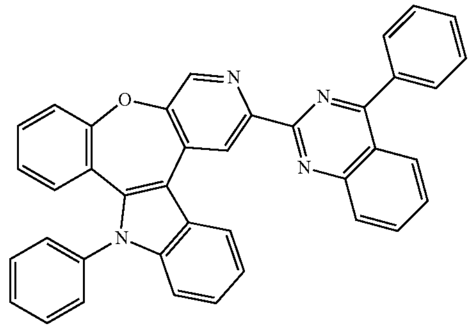
2-51
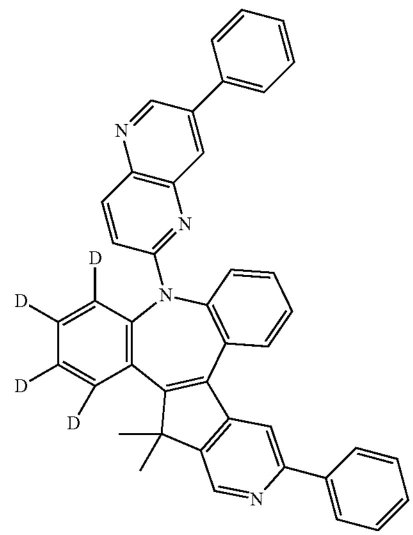
2-52
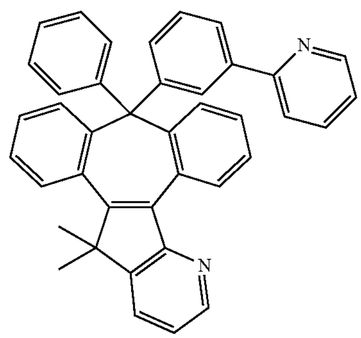
2-53
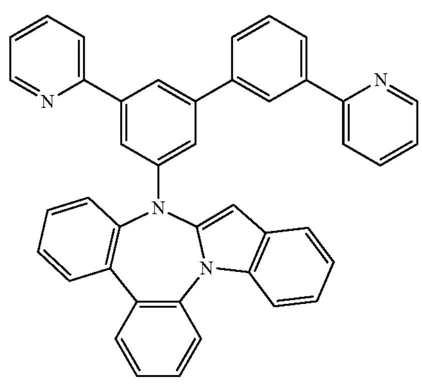

-continued
2-54
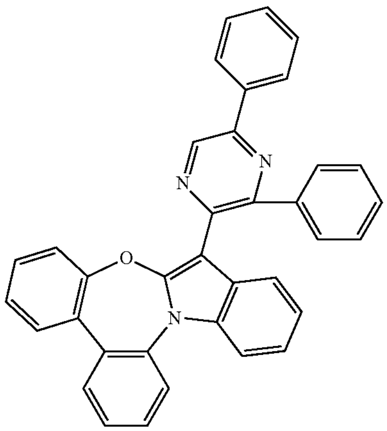
2-55
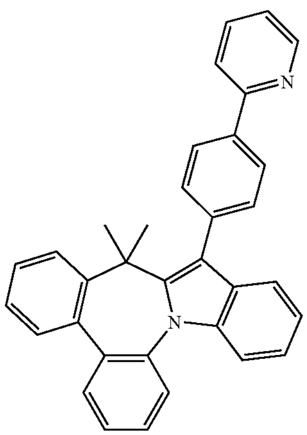
2-56
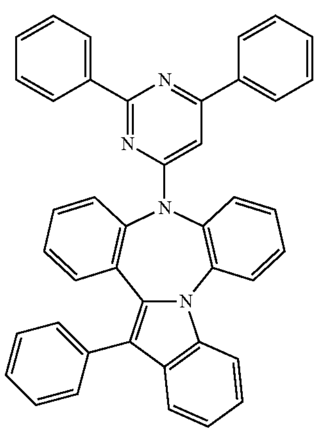
-continued
2-57
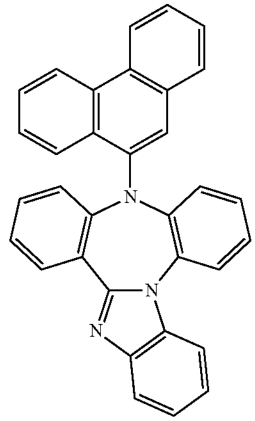
2-58
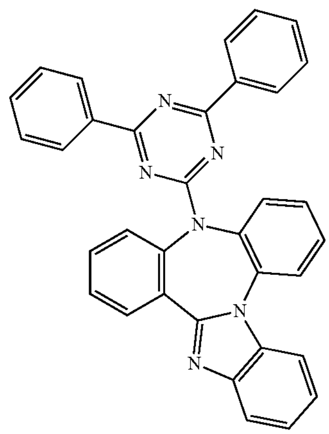
2-59
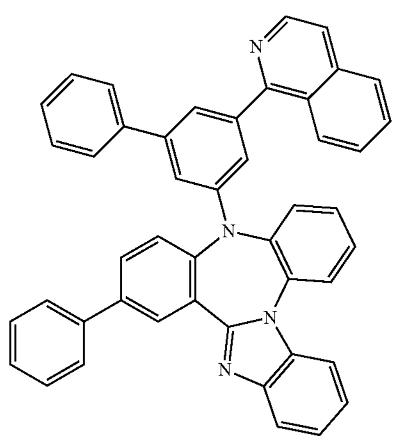

-continued
2-60
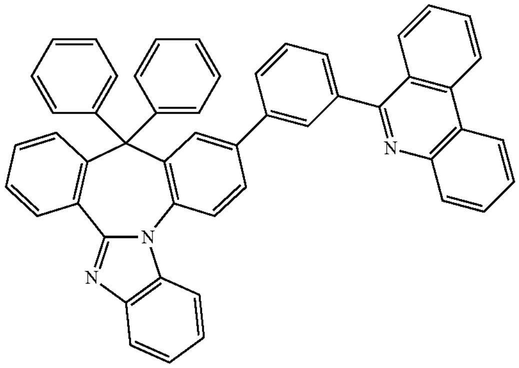
2-61
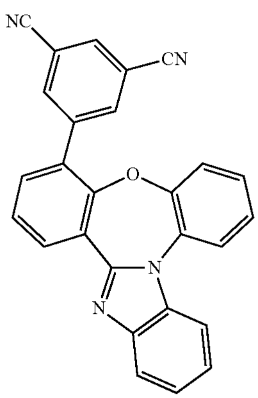
2-62
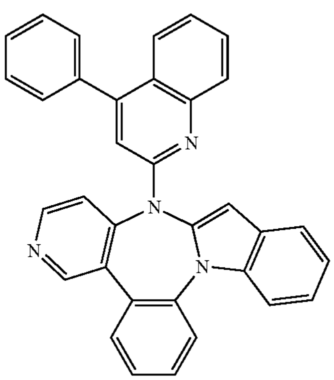
2-63
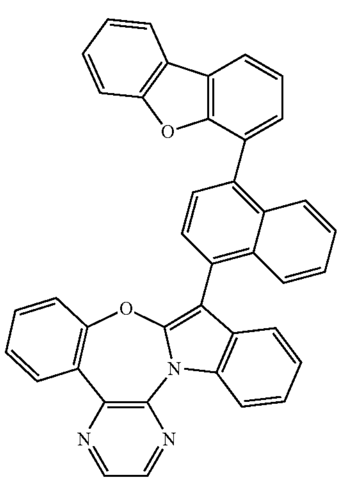
-continued
2-64
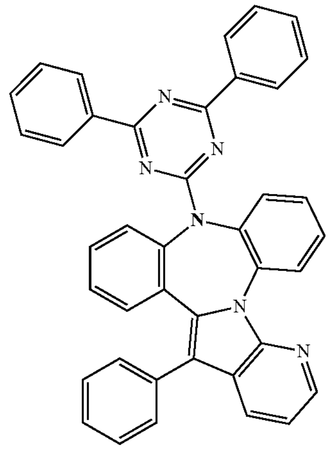
2-65
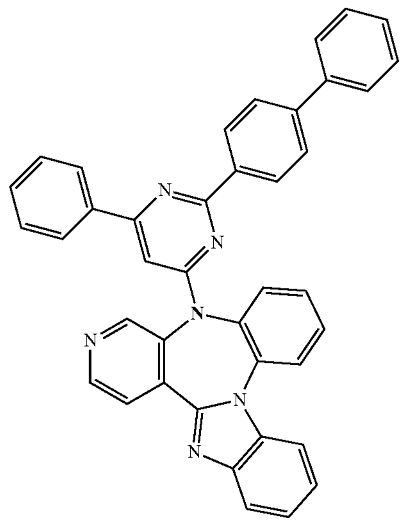
2-66
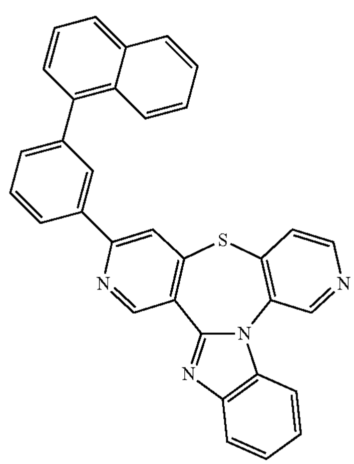

-continued
2-67
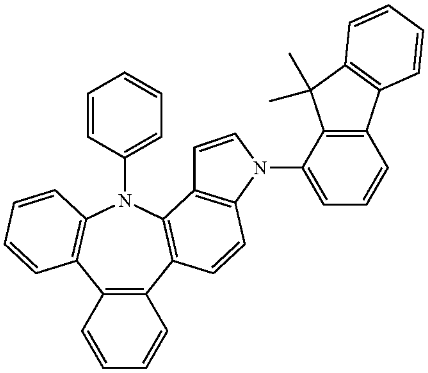
2-68
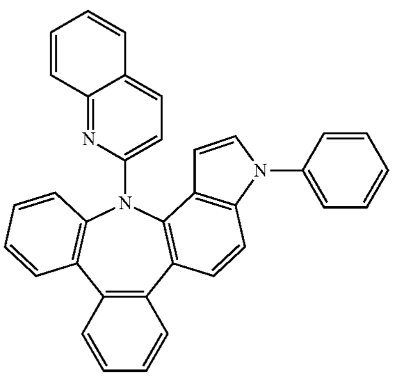
2-69
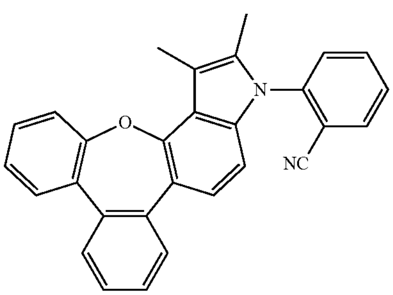
2-70
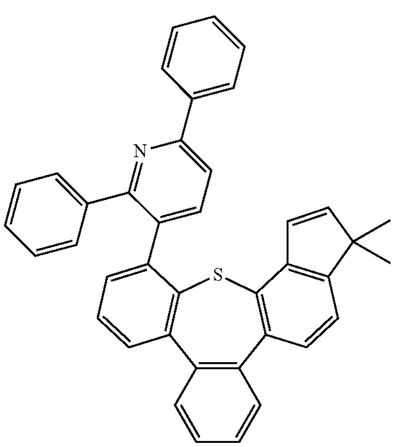
-continued
2-71
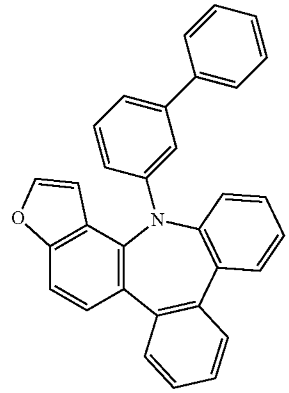
2-72
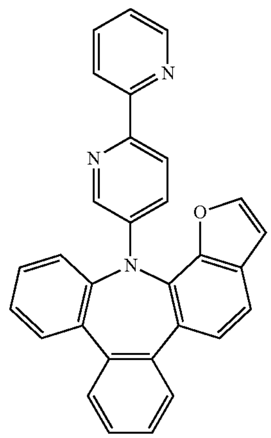
2-73
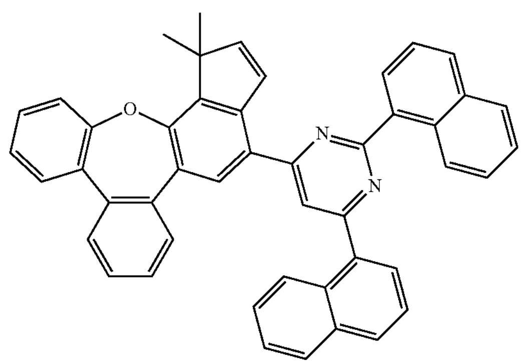
2-74
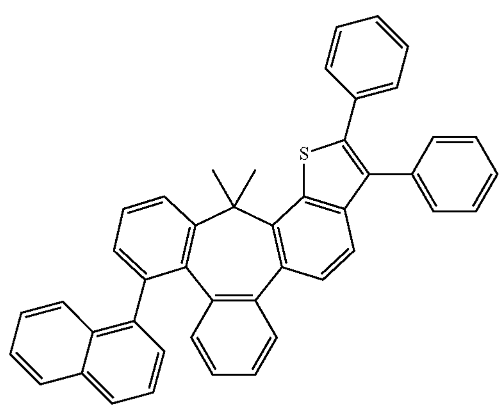

-continued
2-75
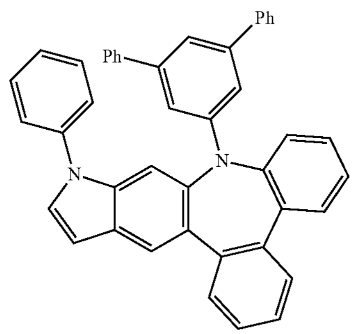
2-76
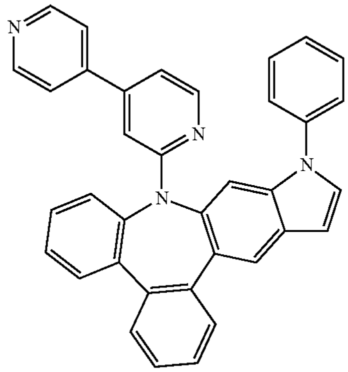
2-77
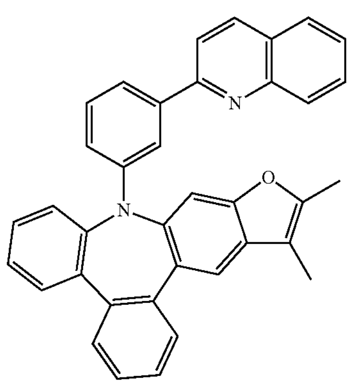
2-78
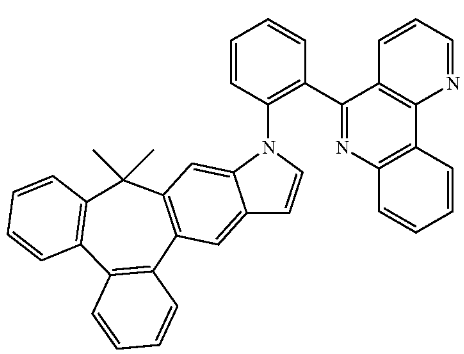
-continued
2-79
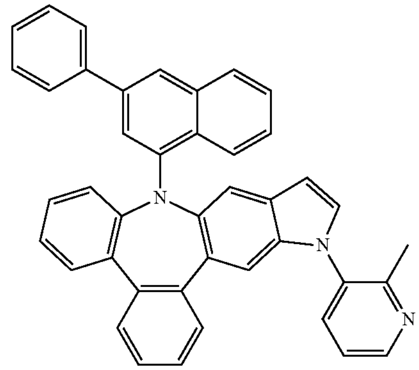
2-80
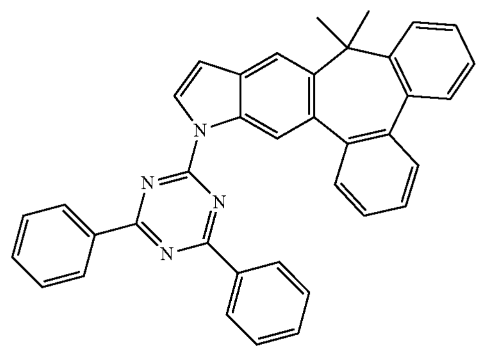
2-81
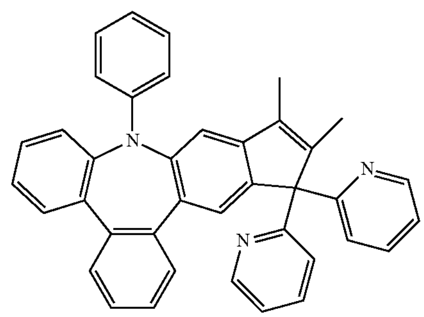
2-82
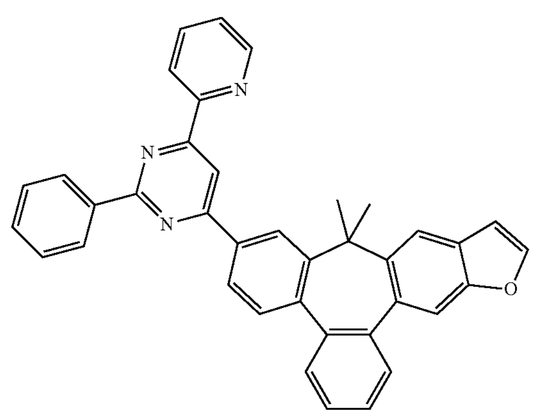

2-83
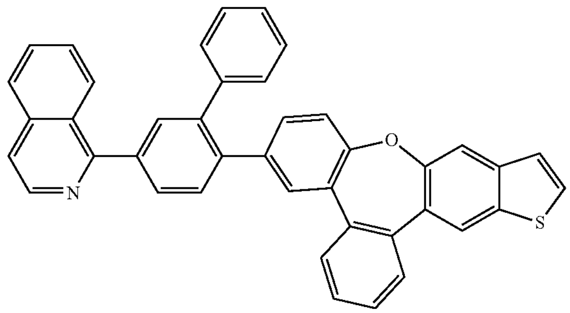
2-84
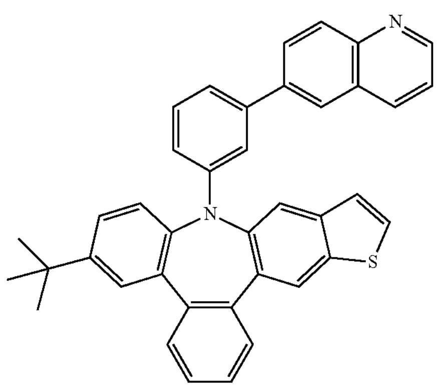
2-85
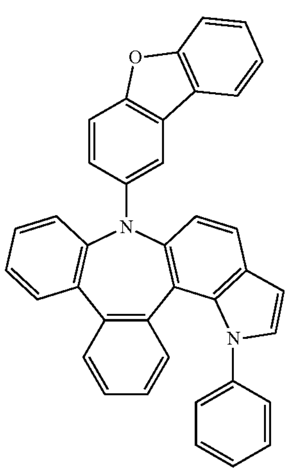
2-86
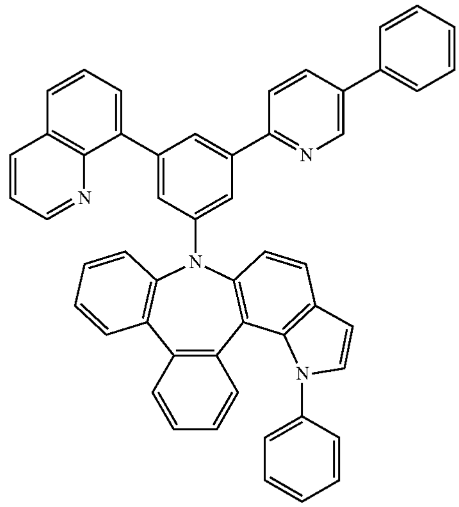
2-87
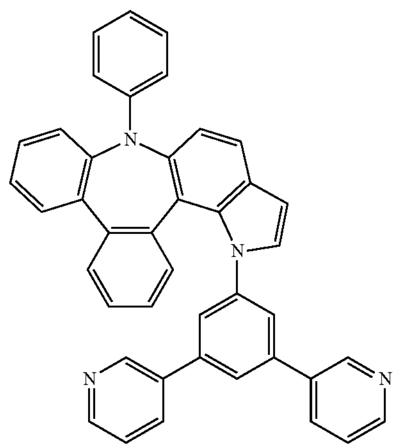
2-88
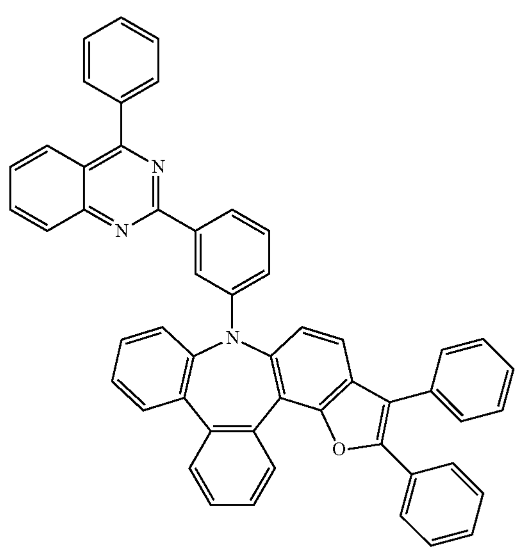

-continued
2-89
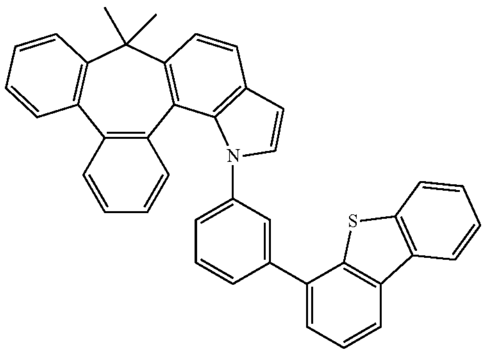
2-90
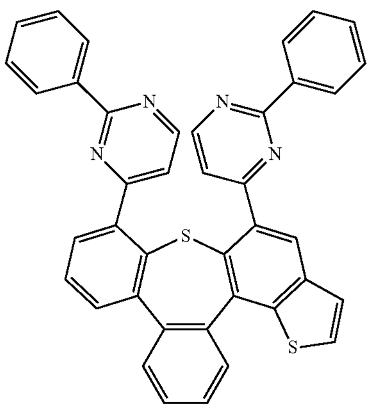
2-91
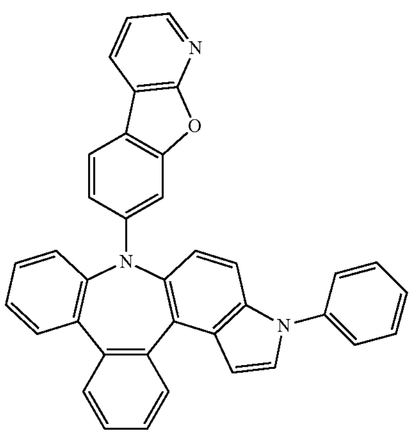
2-92
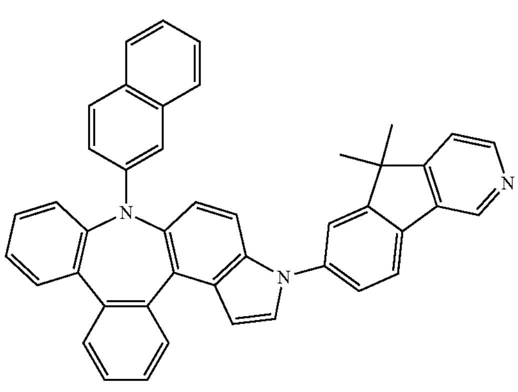
-continued
2-93
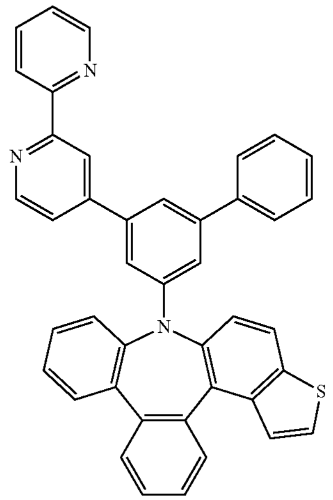
2-94
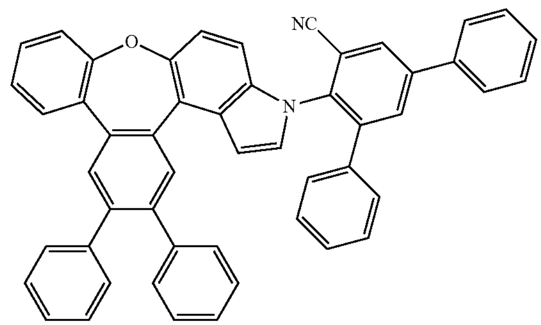
2-95
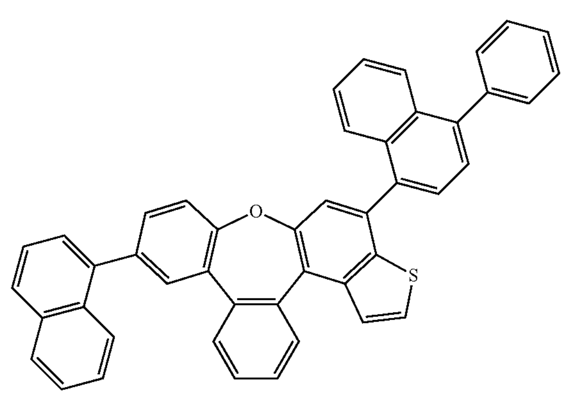

-continued
2-96
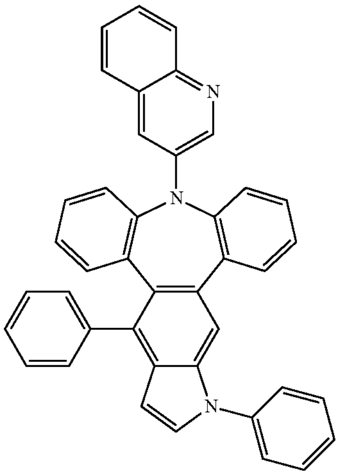
2-97
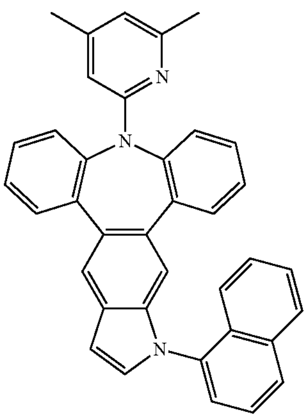
2-98
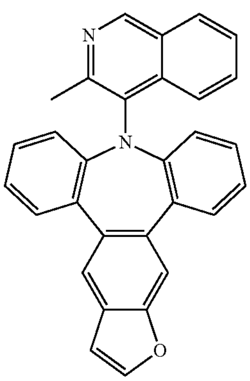
2-99
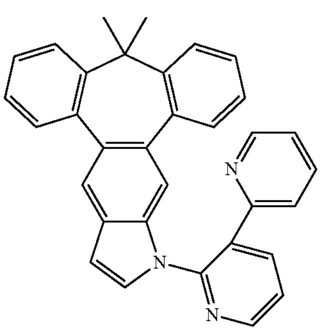
-continued
2-100
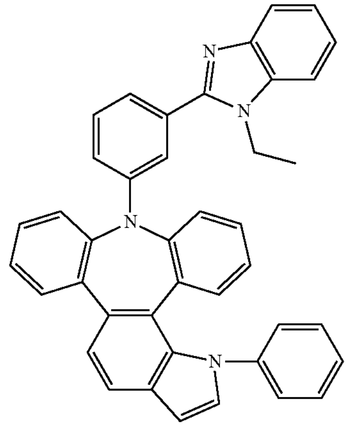
2-101
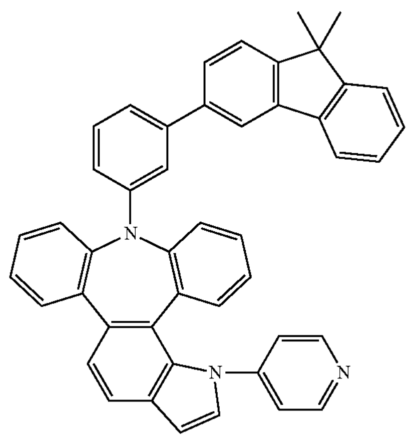
2-102
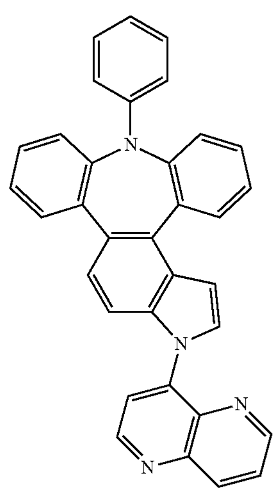

-continued
2-103
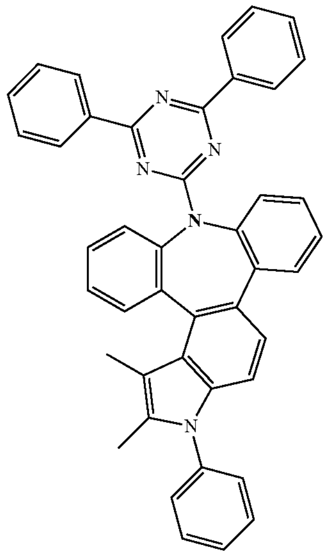
2-104
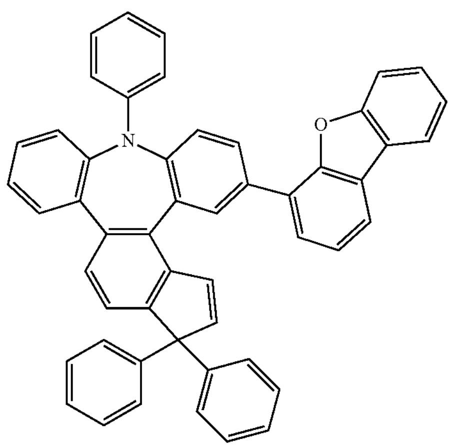
2-105
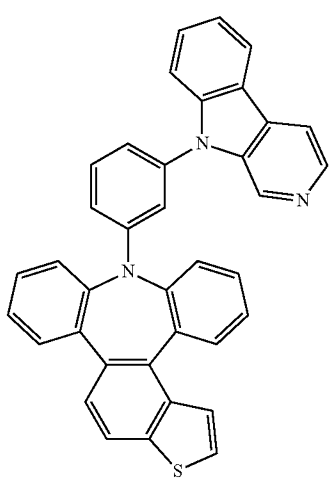
-continued
2-106
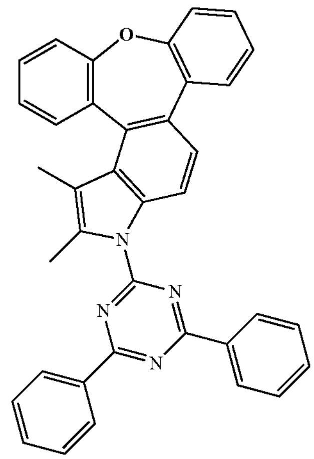
2-107
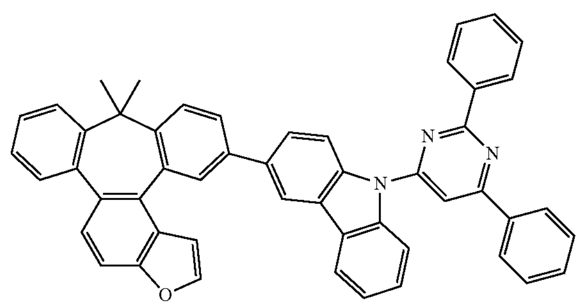
2-108
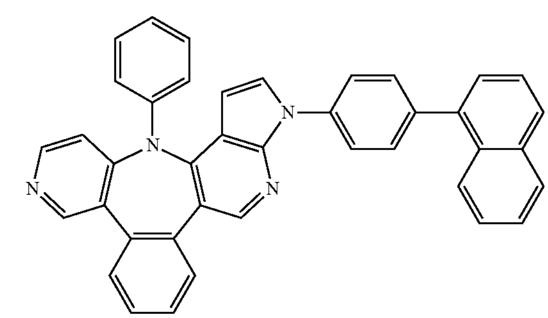
2-109
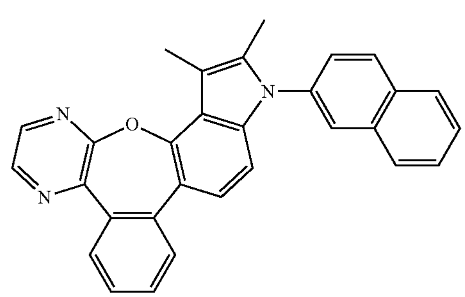

-continued
2-110
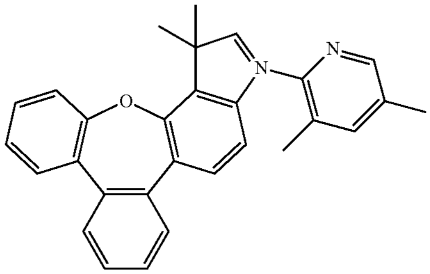
2-111
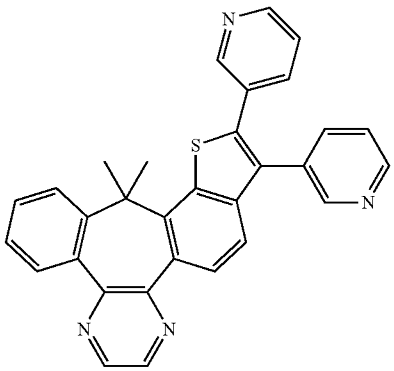
2-112
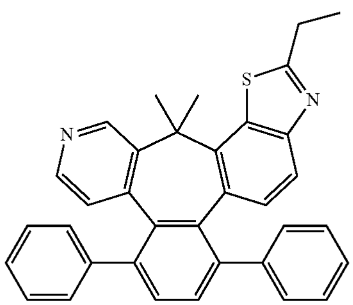
2-113
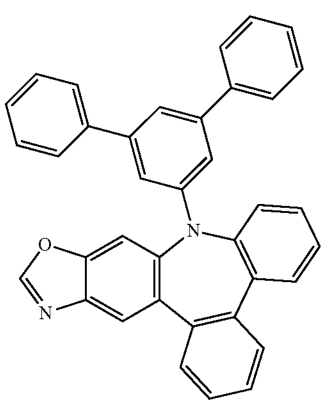
-continued
2-114
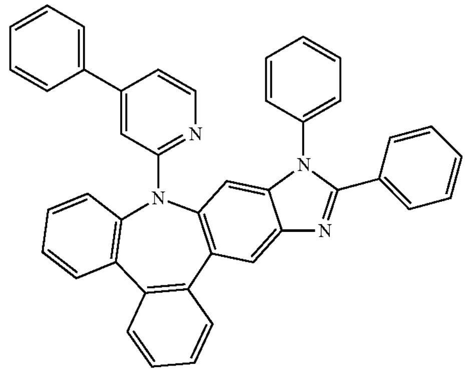
2-115
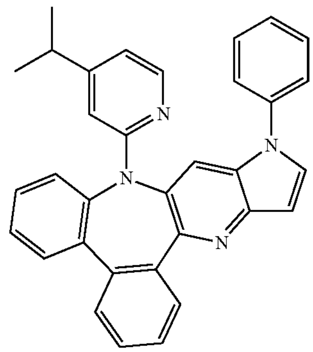
2-116
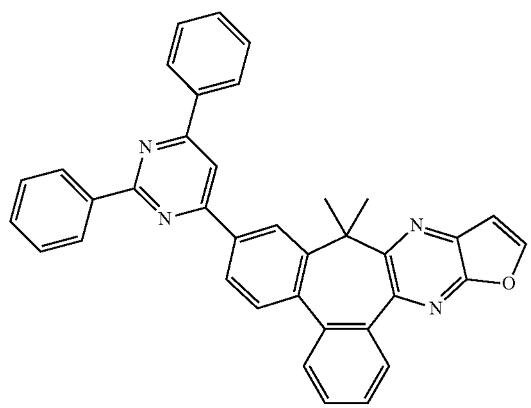
2-117
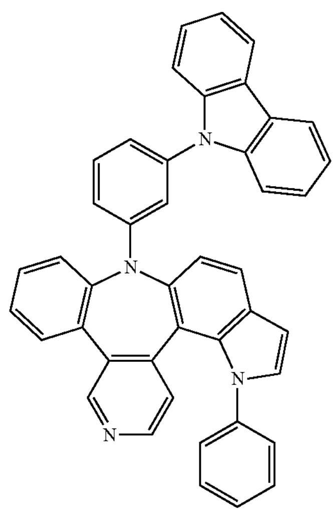

-continued
2-118
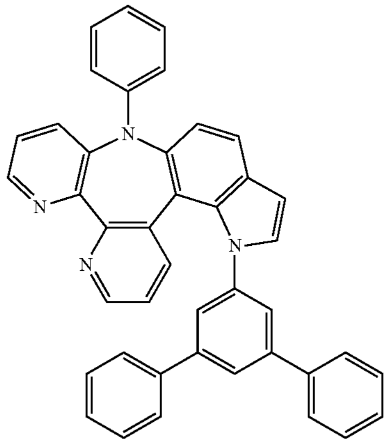
2-119
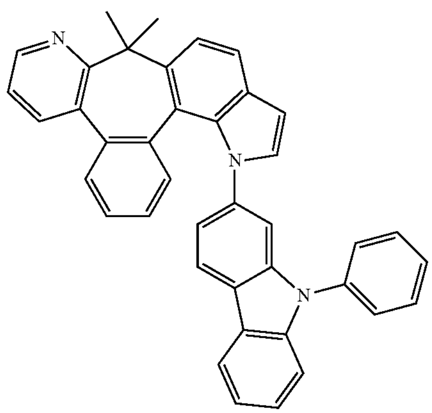
2-120
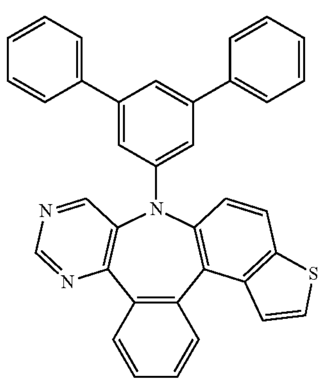
-continued
2-121
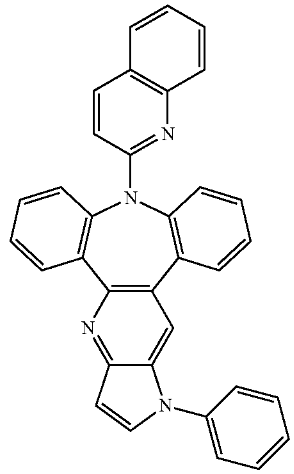
2-122
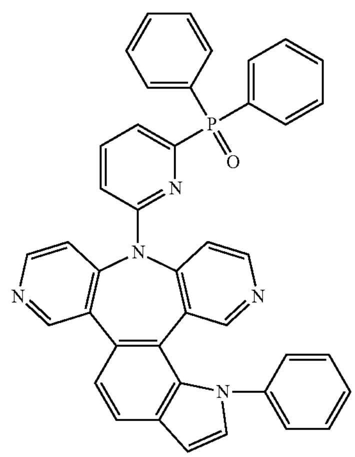
2-123
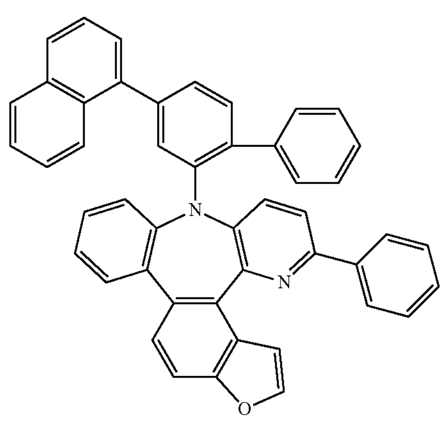

2-124
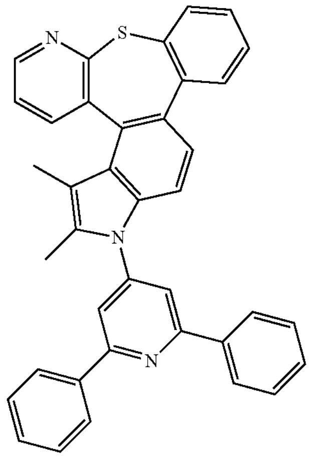
2-125
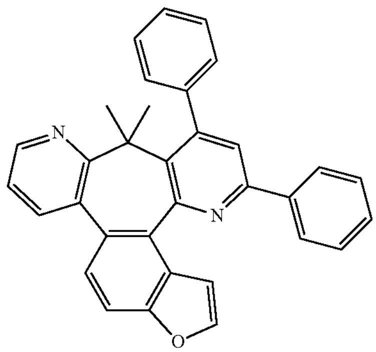
2-126
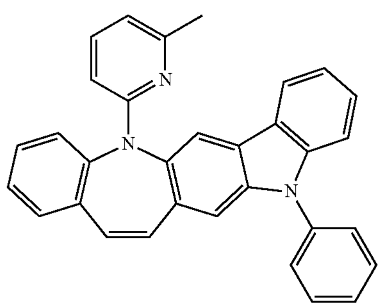
2-127
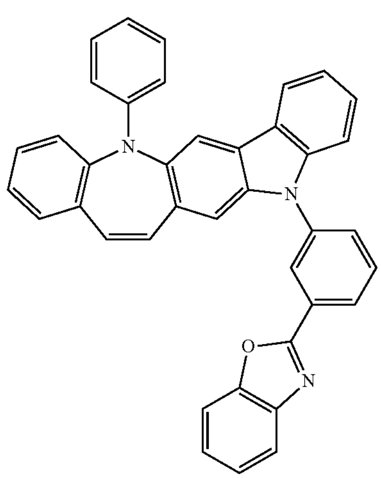
2-128
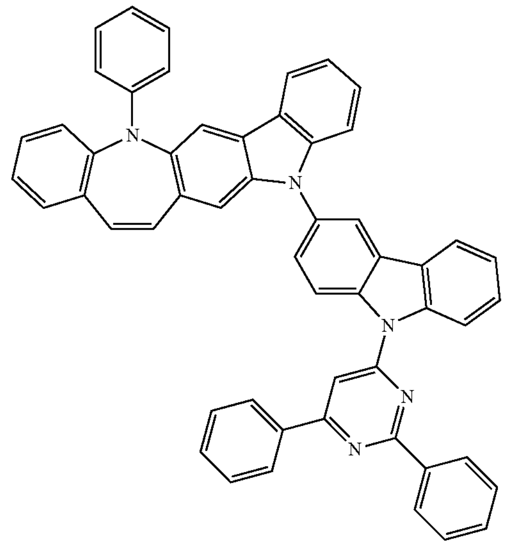
2-129
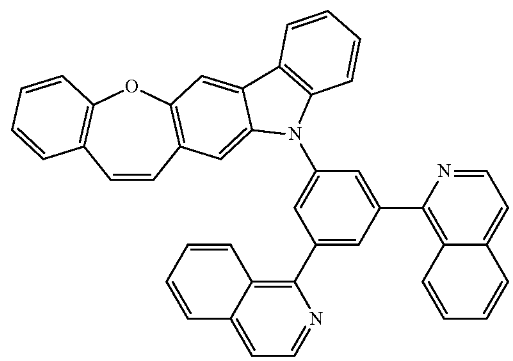
2-130
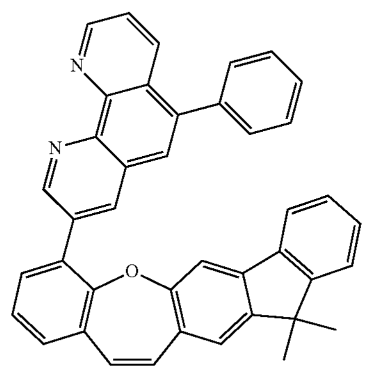
2-131
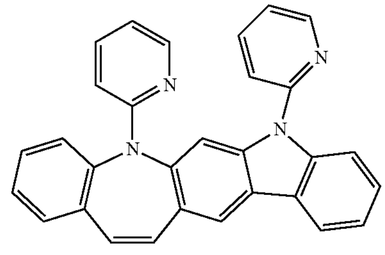

-continued
2-132
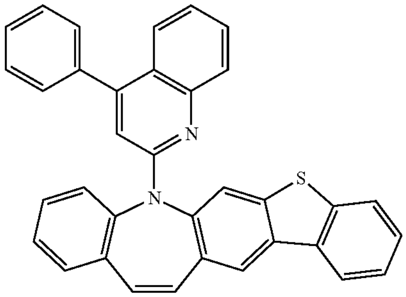
2-133
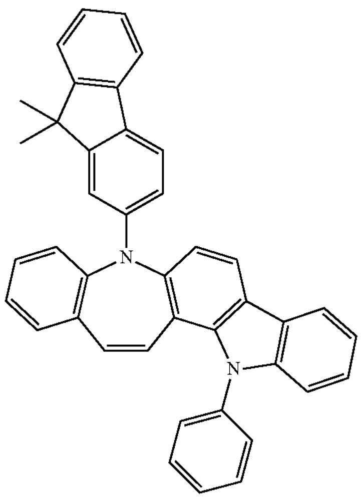
2-134
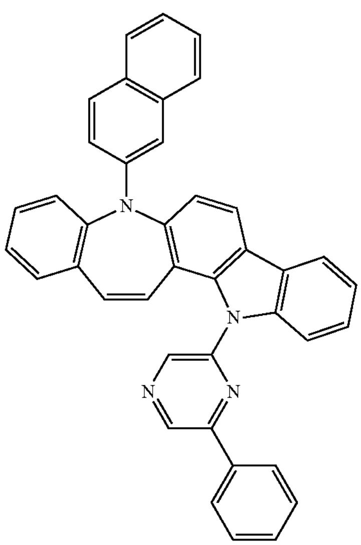
2-135
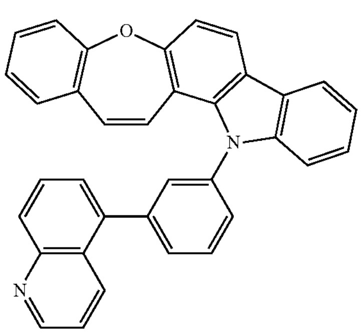
-continued
2-136
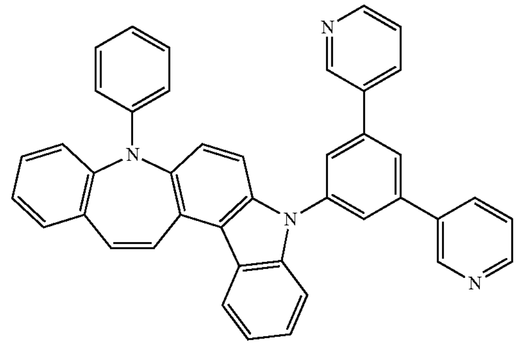
2-137
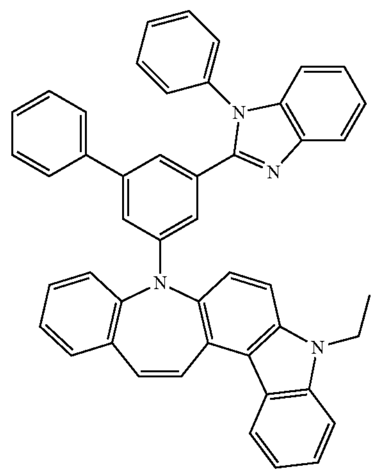
2-138
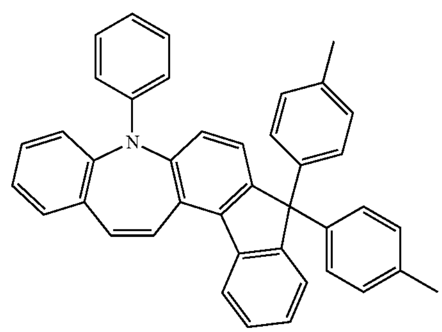
2-139
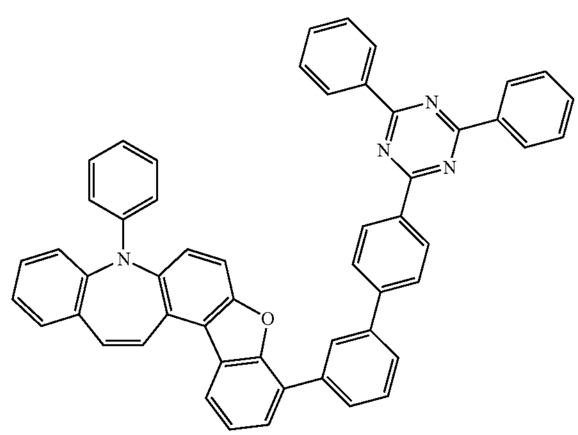

-continued
2-140
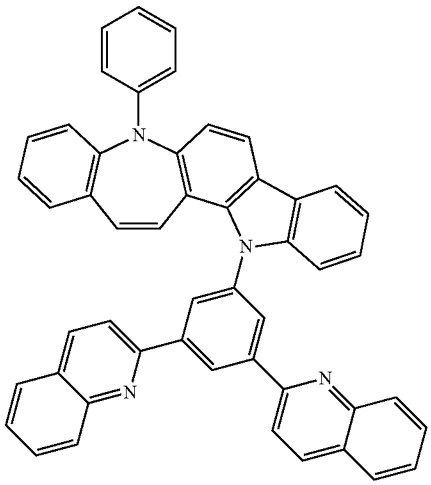
2-141
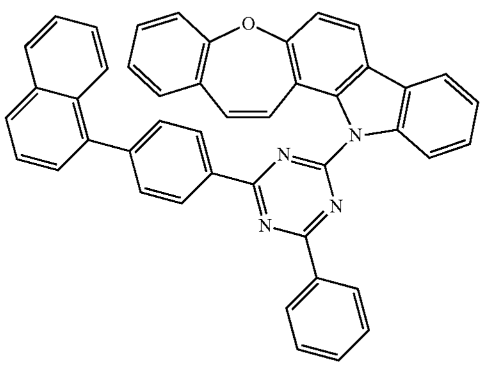
2-142
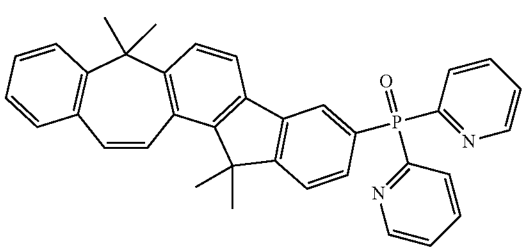
2-143
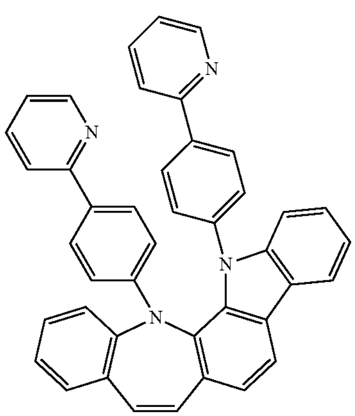
-continued
2-144
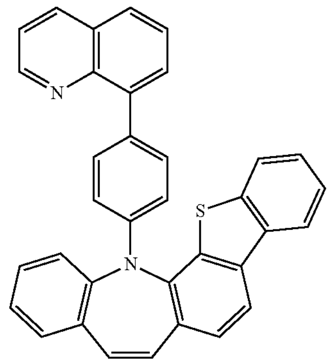
2-145
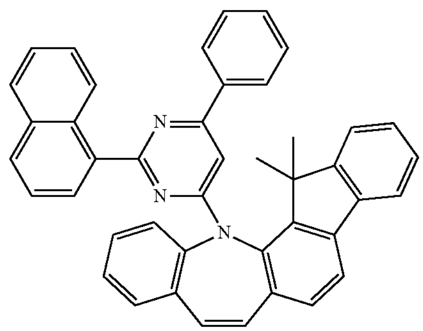
2-146
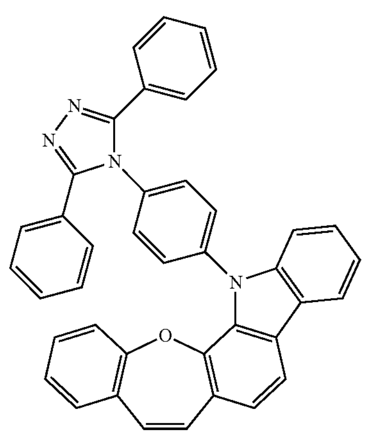
2-147
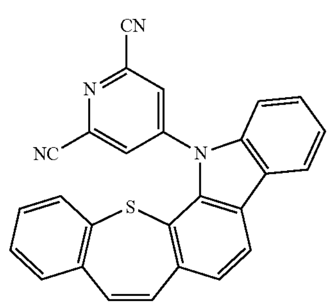

-continued
2-148
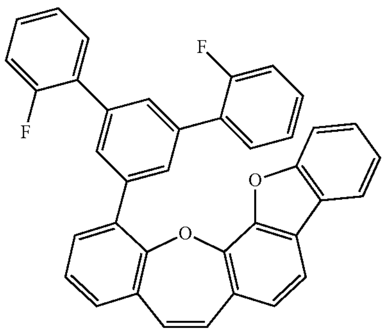
2-149
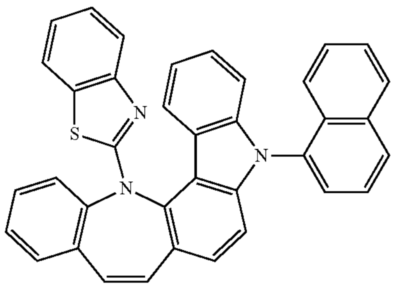
2-150
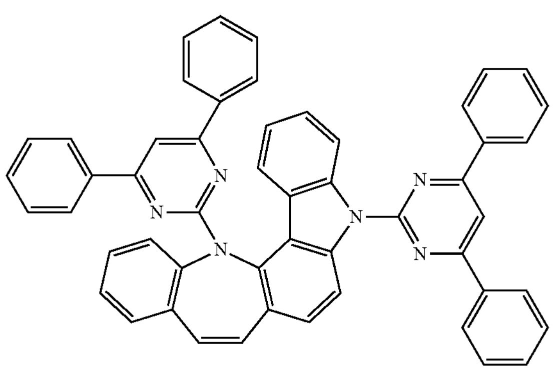
2-151
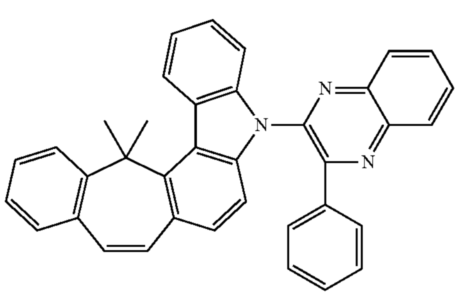
-continued
2-152
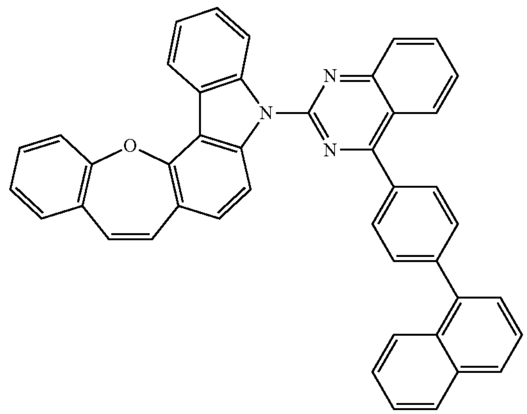
2-153
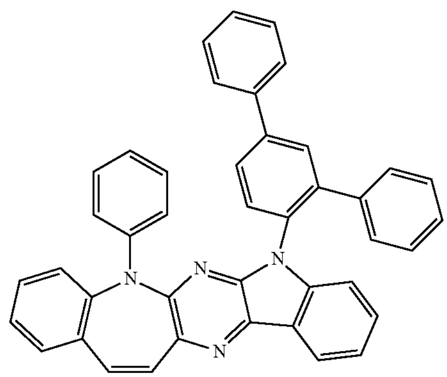
2-154
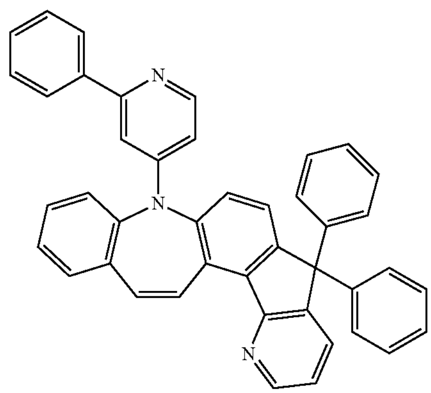
2-155
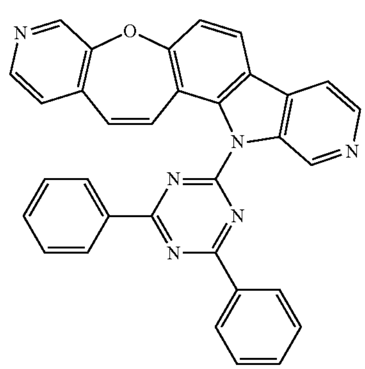

-continued
2-156
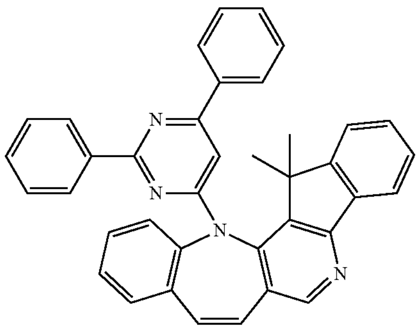
2-157
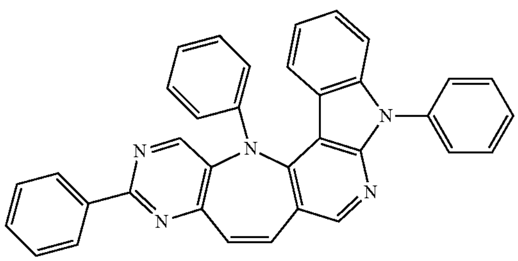
2-158
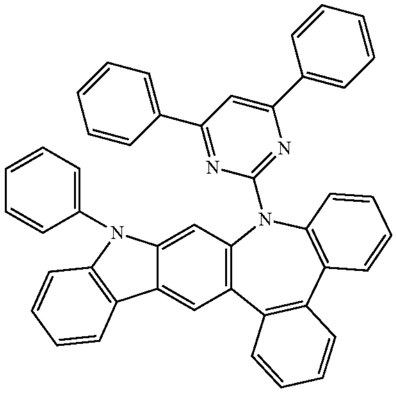
2-159
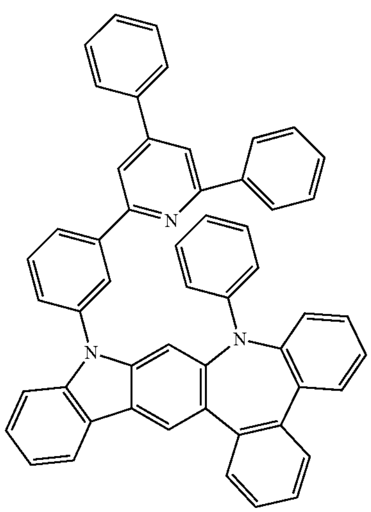
-continued
2-160
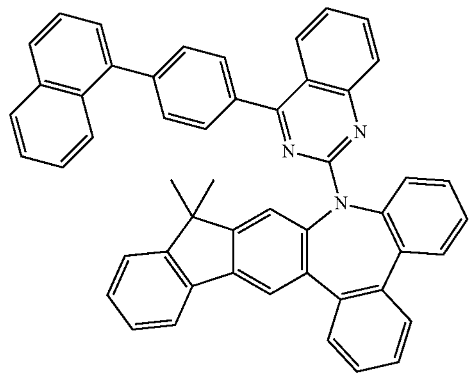
2-161
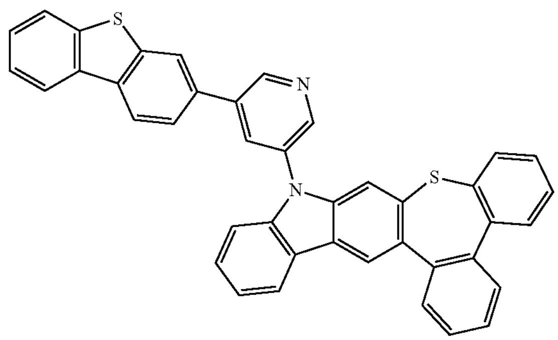
2-162
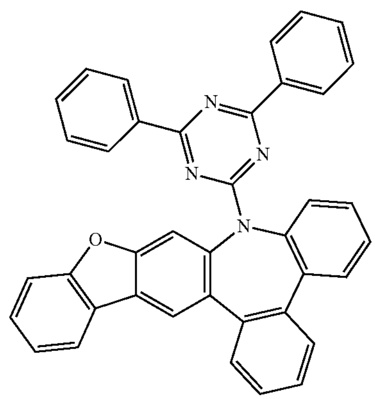
2-163
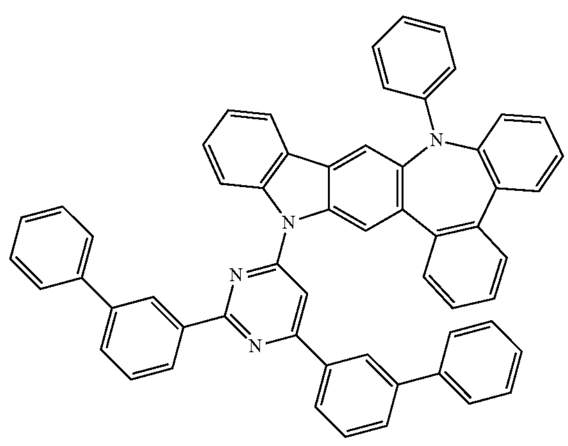

-continued
2-164
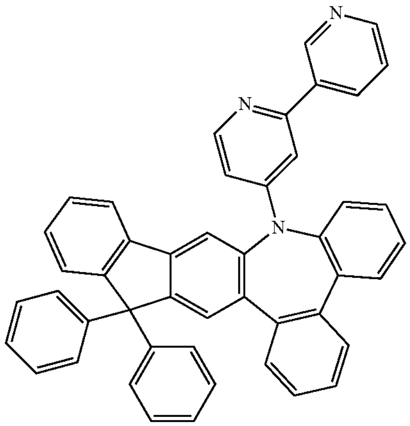
2-165
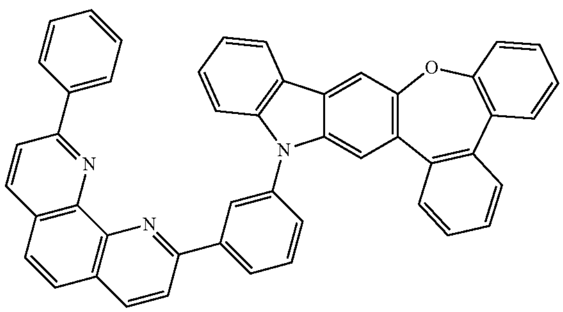
2-166
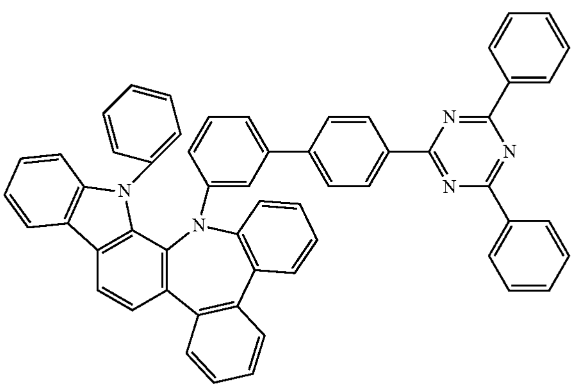
2-167
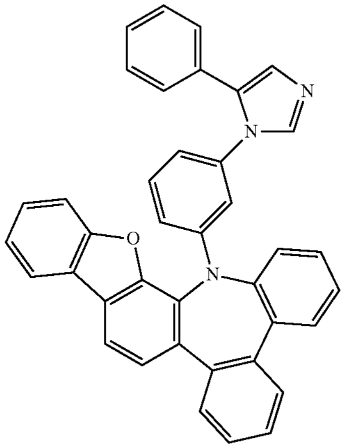
-continued
2-168
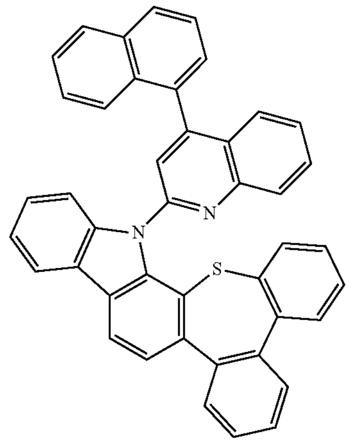
2-169
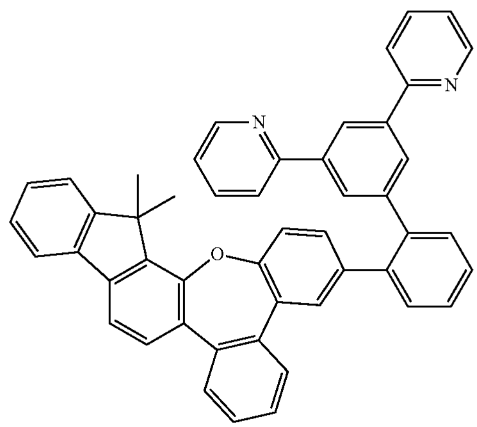
2-170
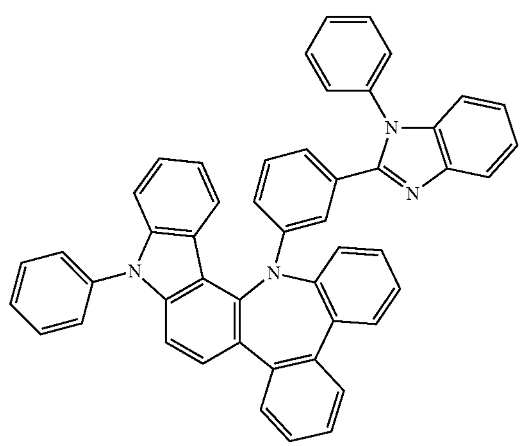

-continued
2-171
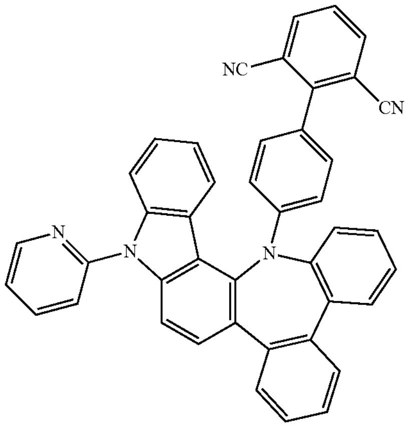
2-172
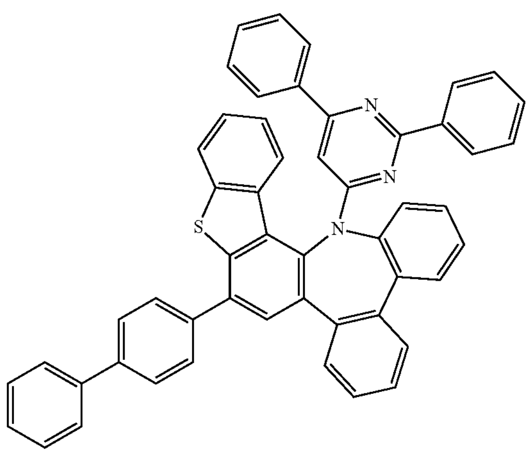
2-173
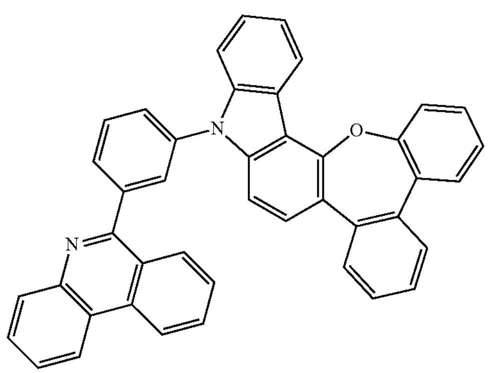
-continued
2-174
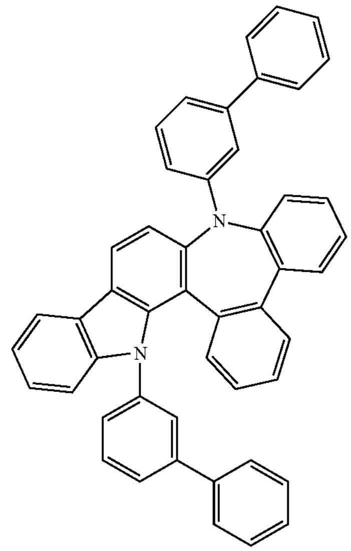
2-175
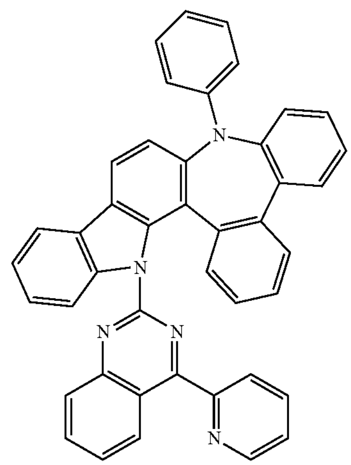
2-176
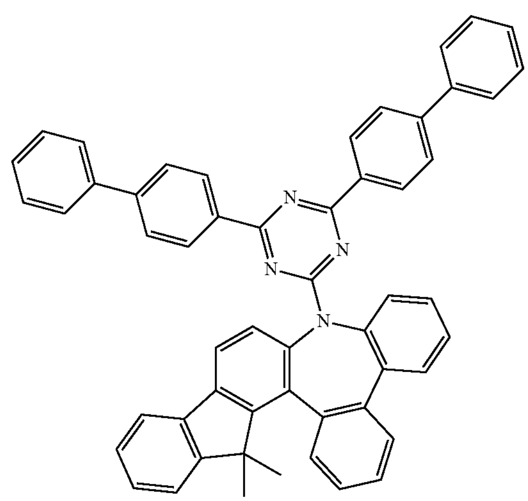

-continued
2-177
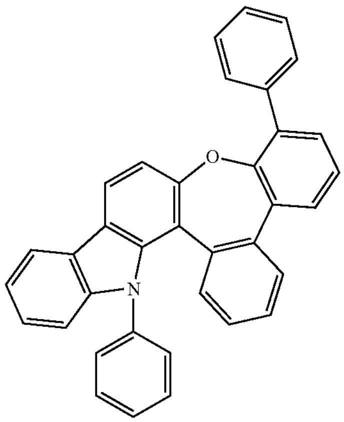
2-178
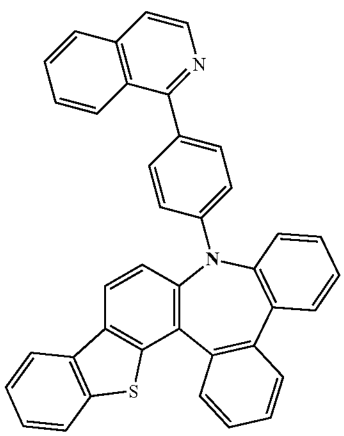
2-179
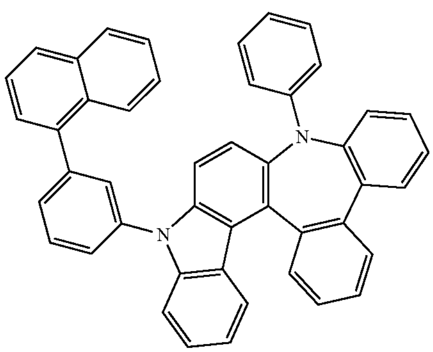
2-180
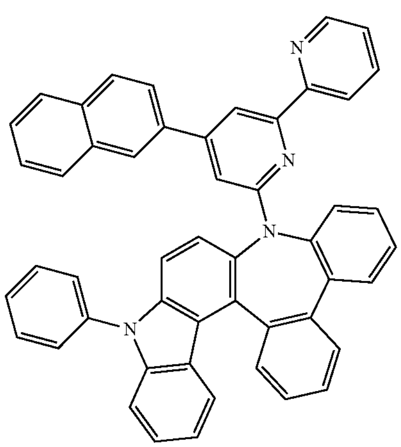
-continued
2-181
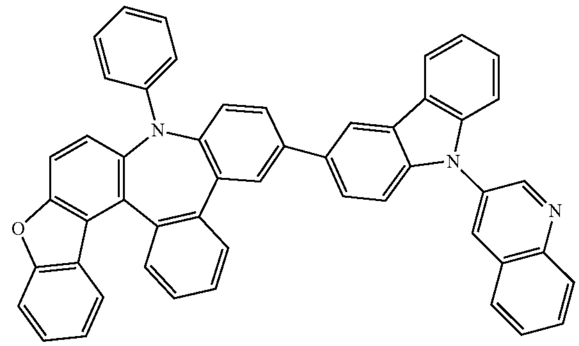
2-182
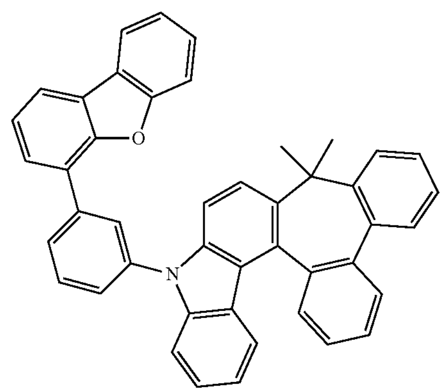
2-183
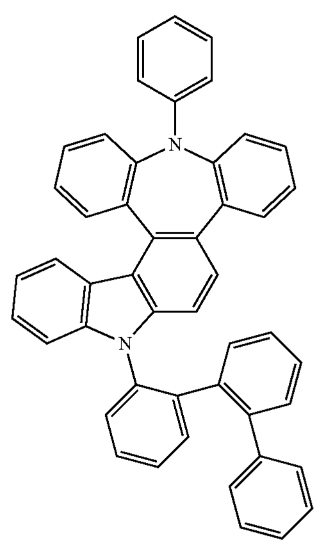

-continued
2-184
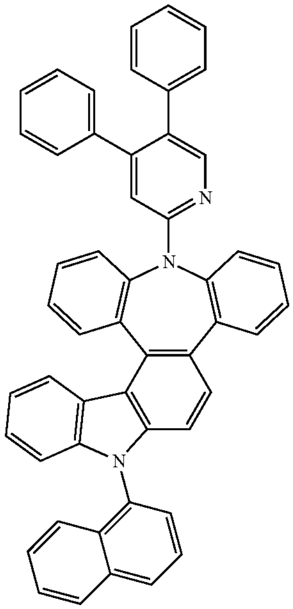
2-185
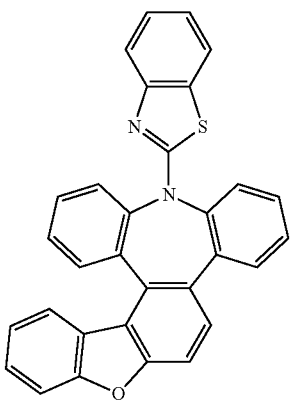
2-186
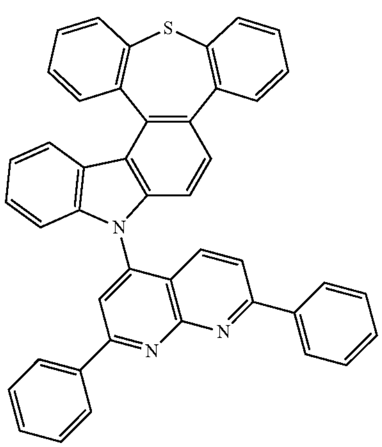
-continued
2-187
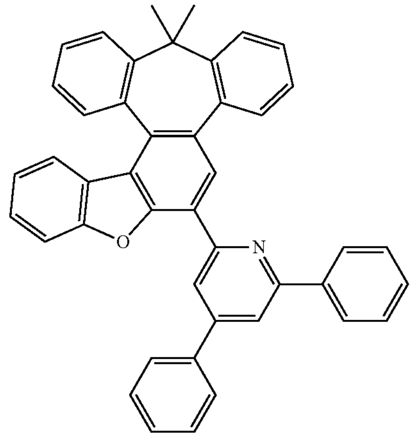
2-188
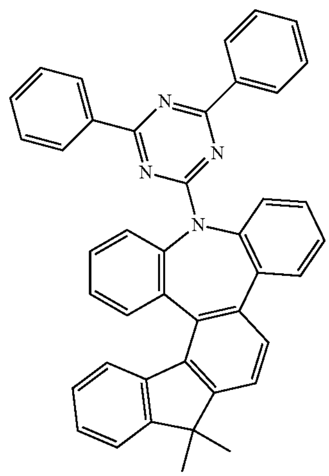
2-189
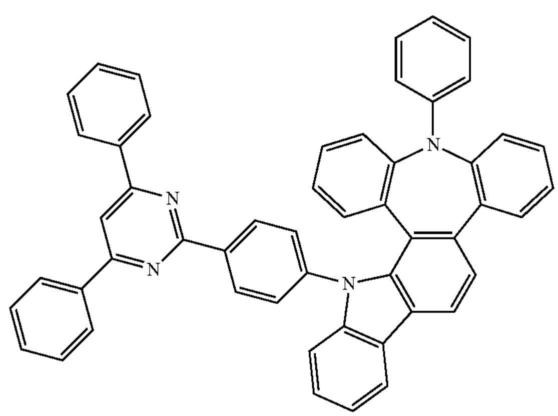

-continued
2-190
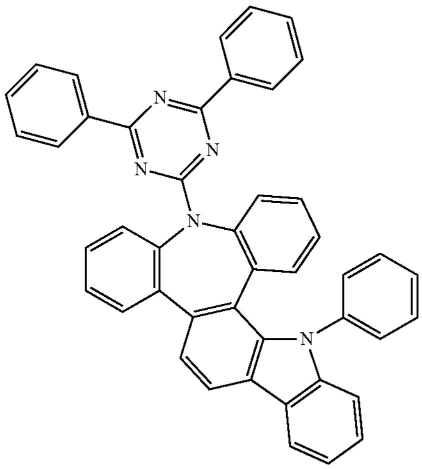
2-191
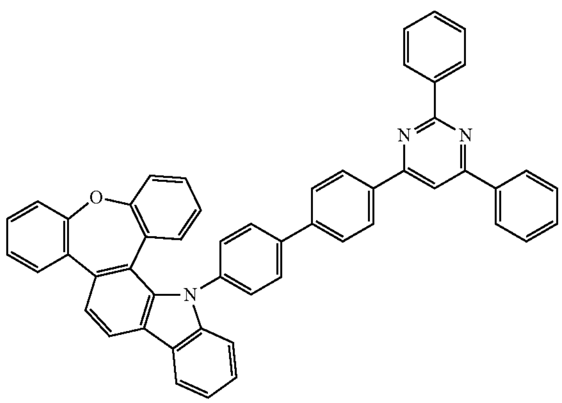
2-192
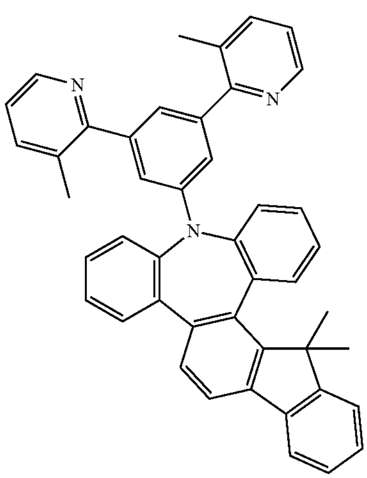
-continued
2-193
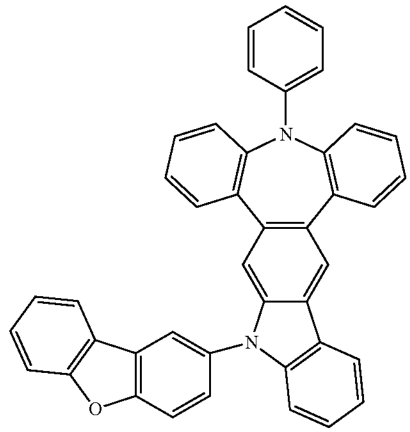
2-194
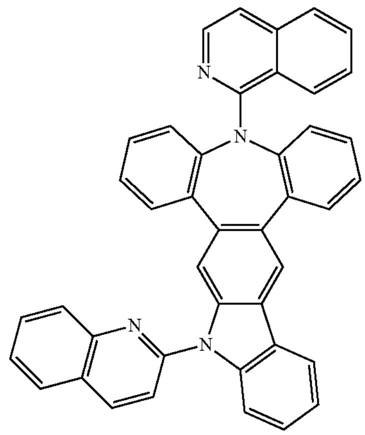
2-195
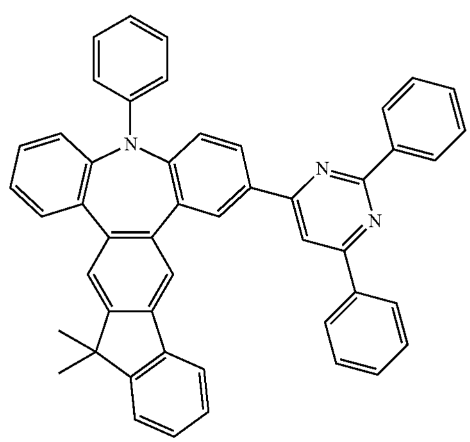

-continued
2-196
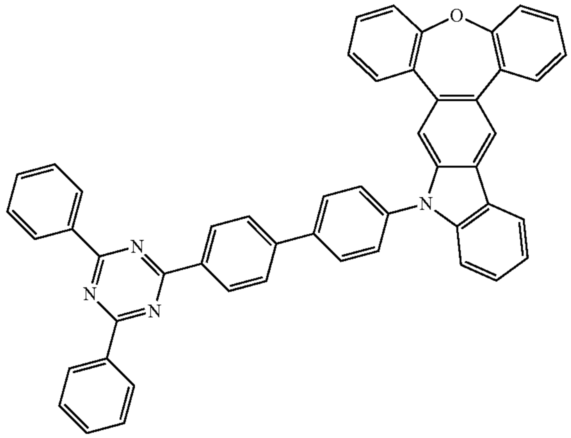
2-197
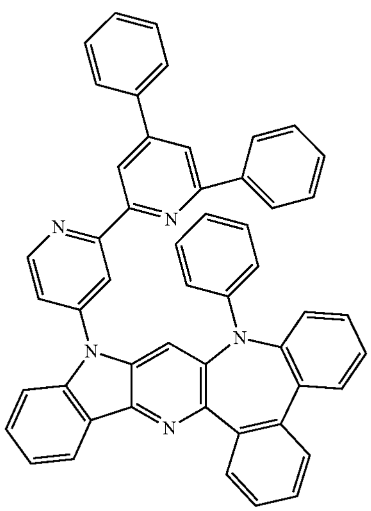
2-198
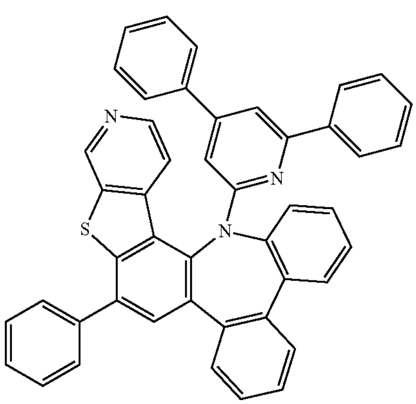
-continued
2-199
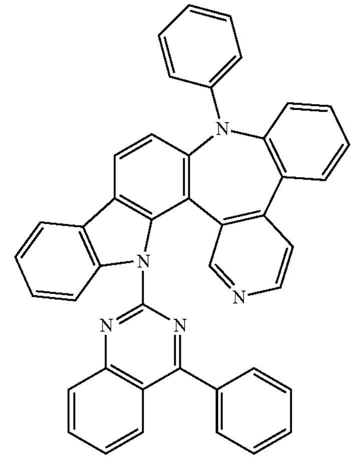
2-200
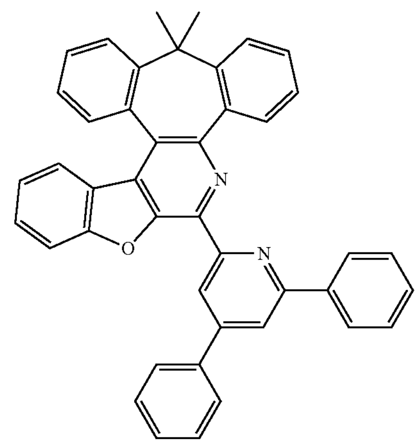
2-201
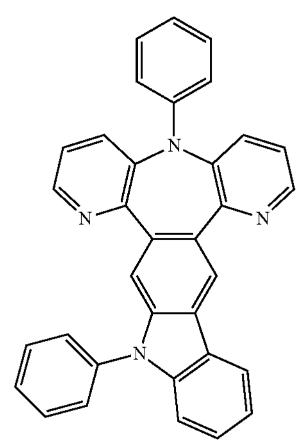

-continued
2-202
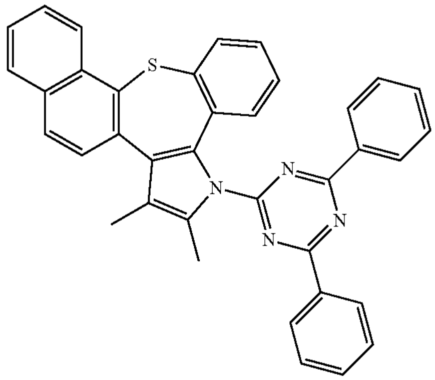
2-203
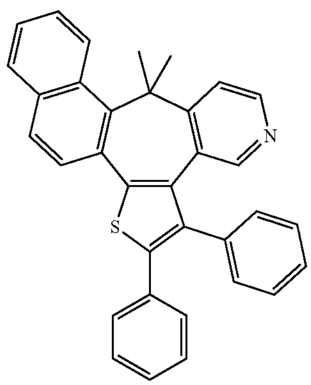
2-204
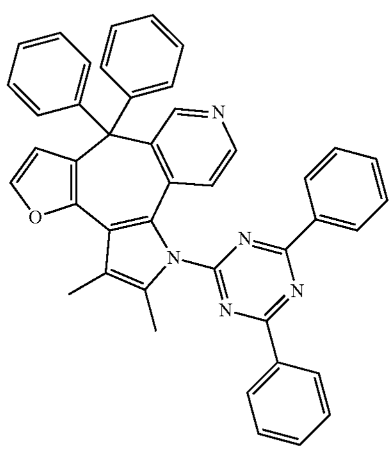
2-205
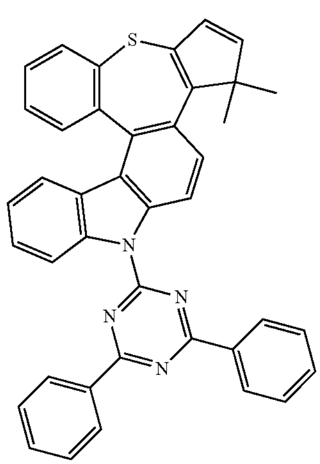
-continued
2-206
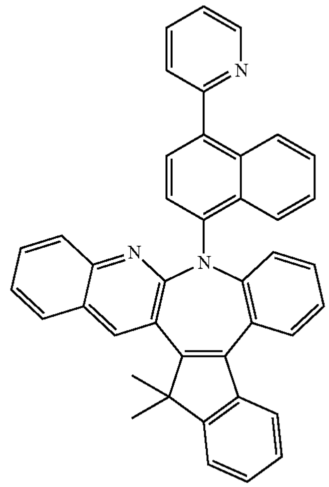
2-207
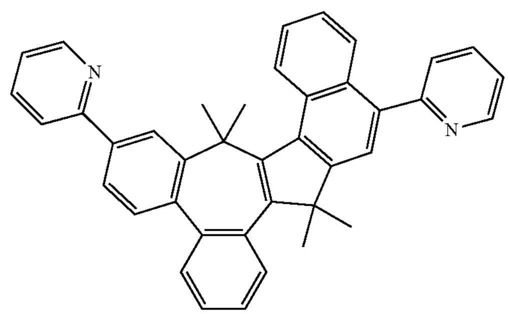
2-208
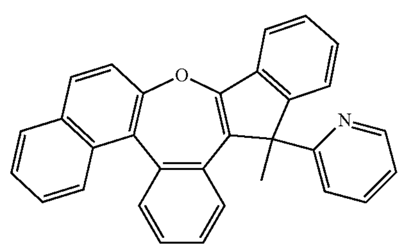
2-209
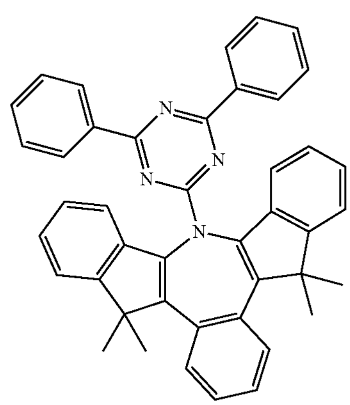

-continued
2-210
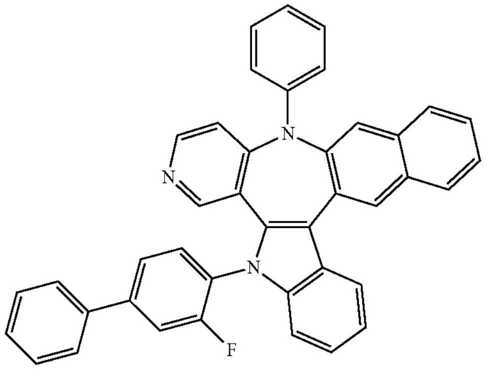
2-211
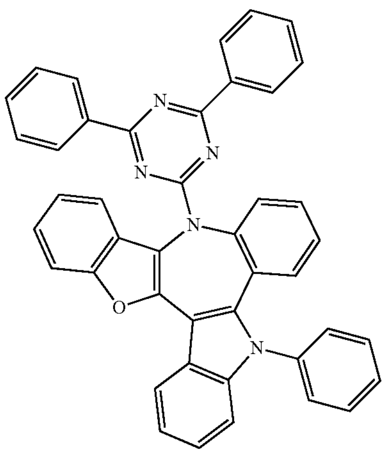
2-212
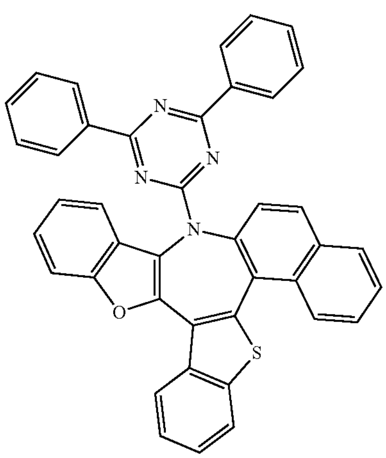
-continued
2-213
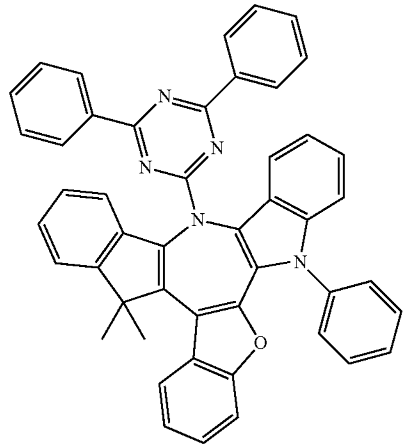
2-214
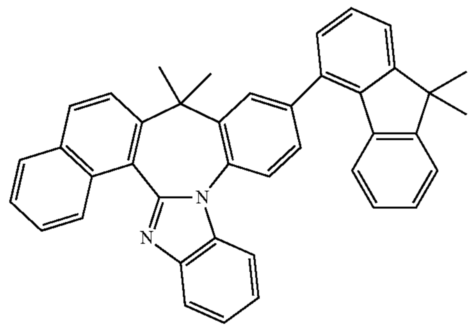
2-215
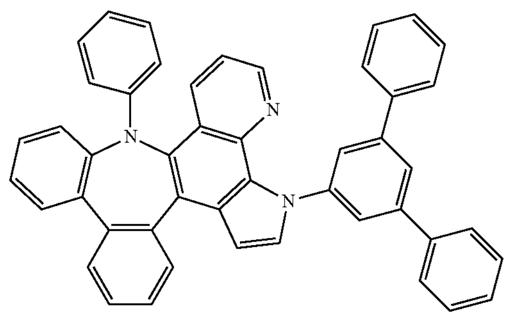
2-216
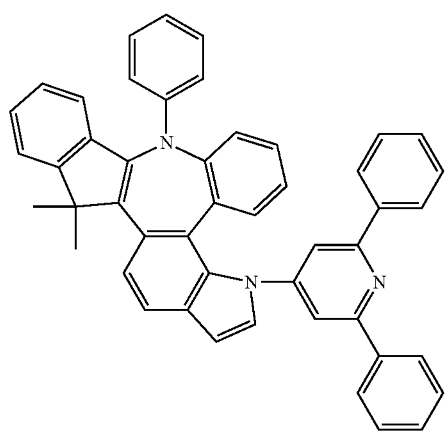

-continued
2-217
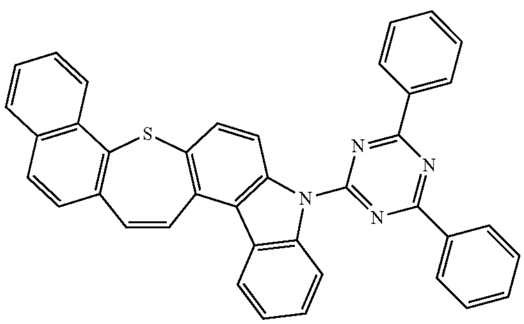
2-218
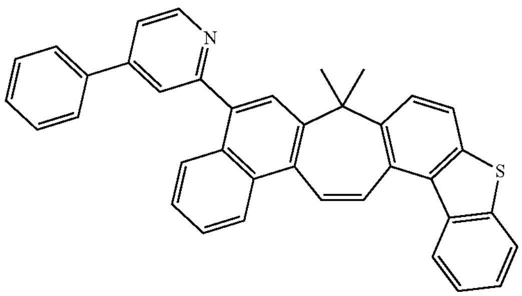
2-219
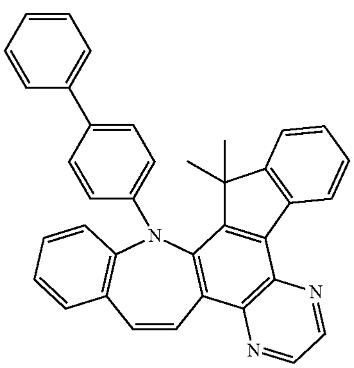
2-220
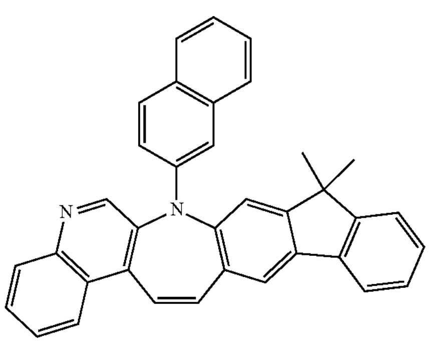
-continued
2-221
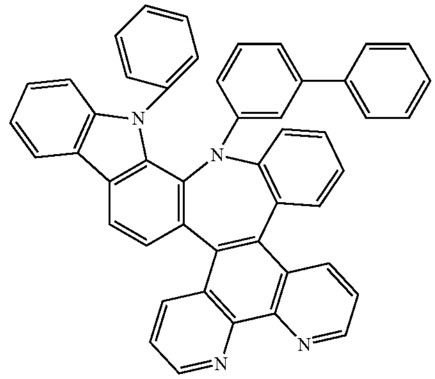
2-222
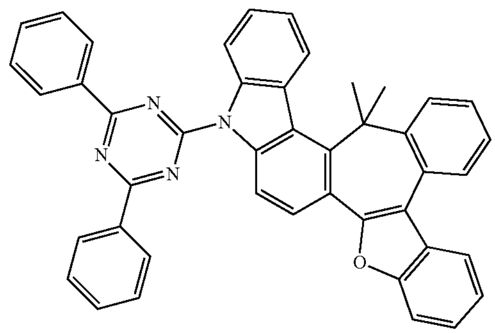
2-223
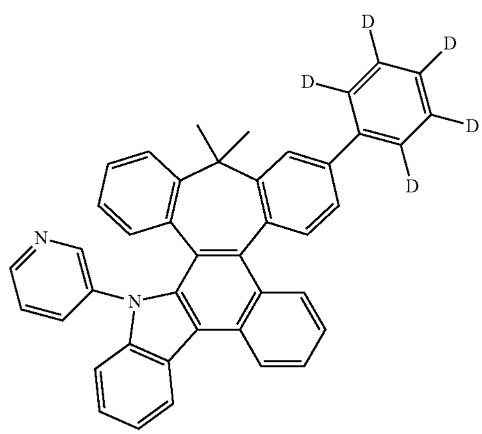
2-224
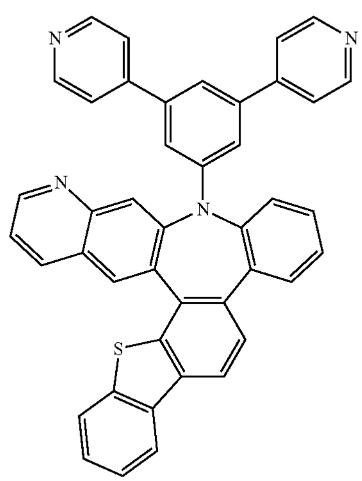

-continued
2-225
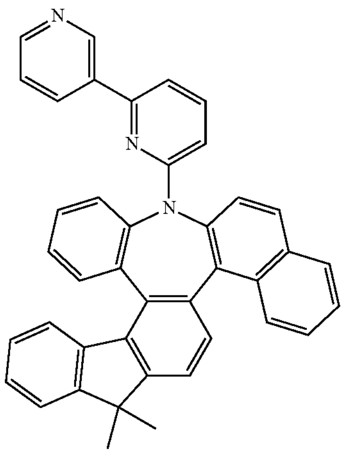
2-226
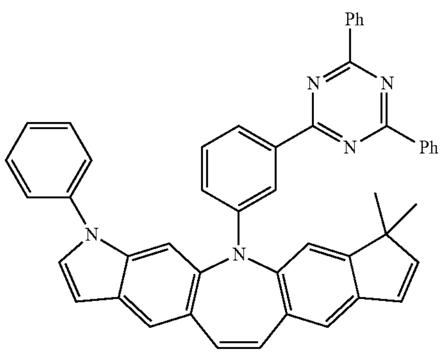
2-227
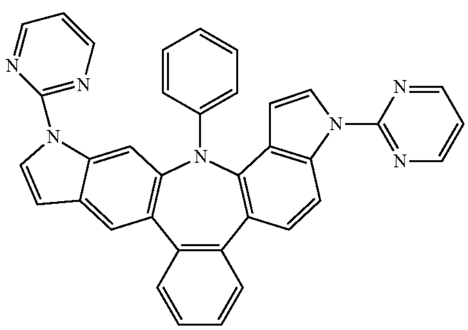
2-228
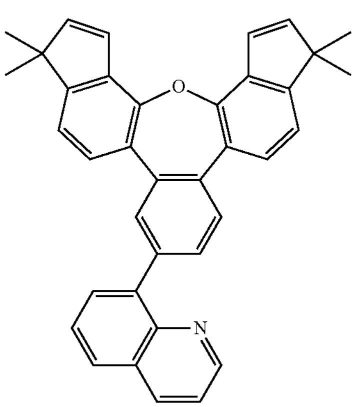
-continued
2-229
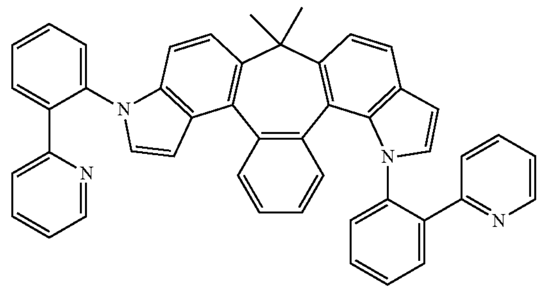
2-230
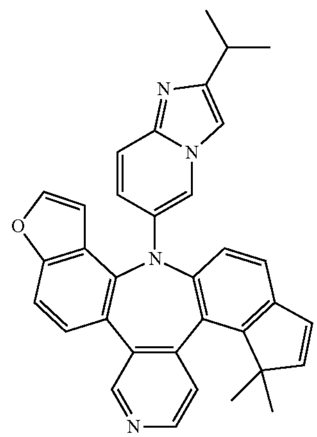
2-231
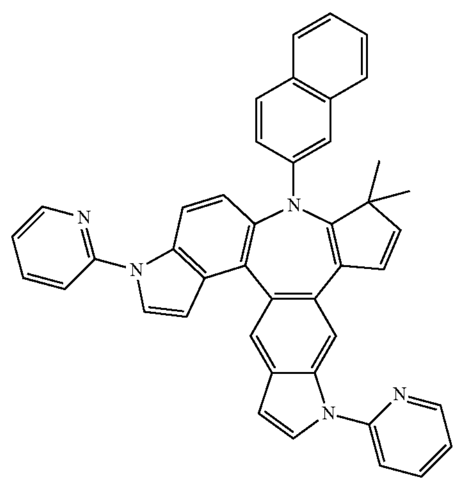
2-232
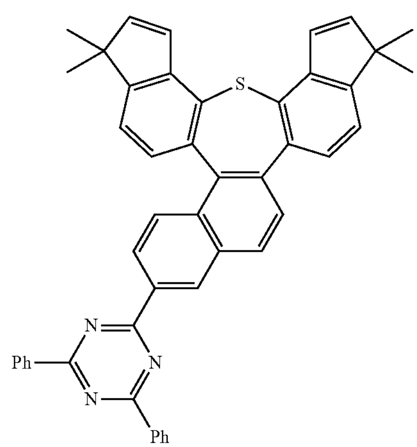

-continued
2-233
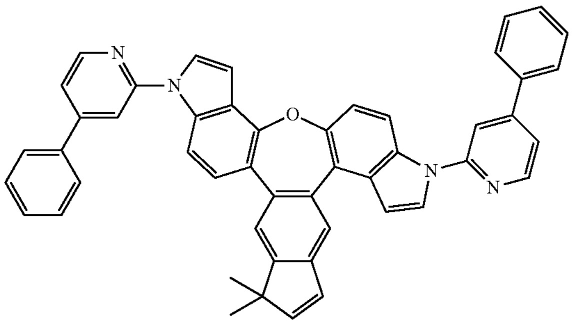
2-234
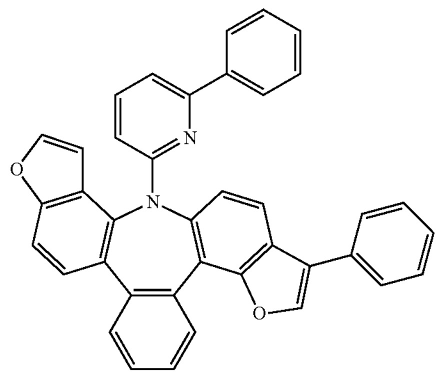
2-235
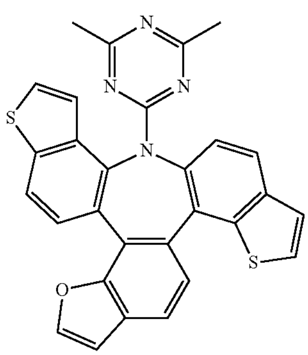
2-236
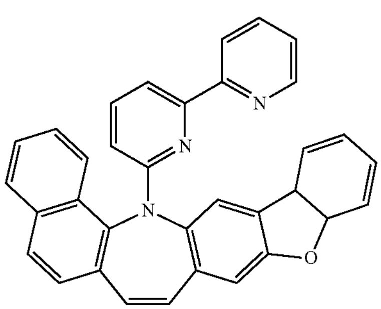
-continued
2-237
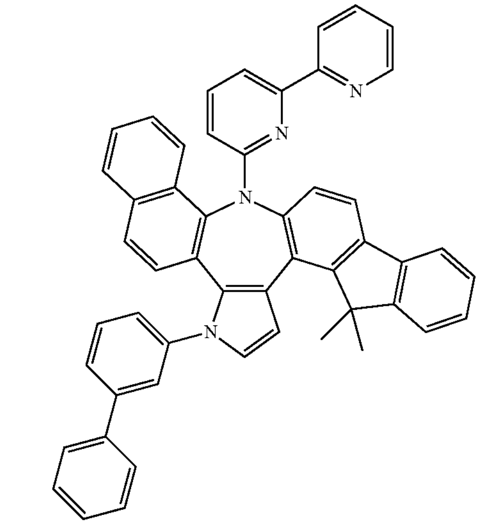
2-238
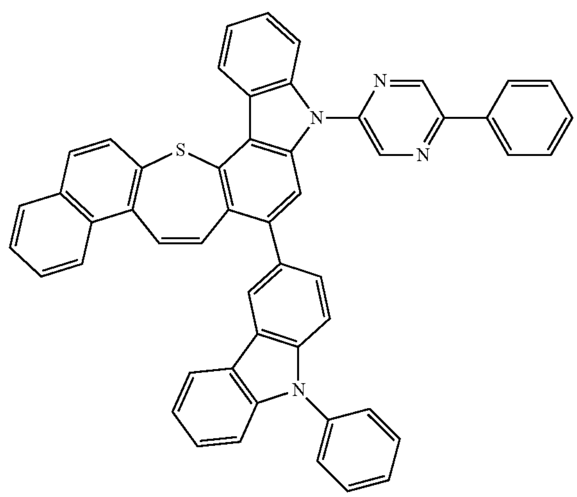
2-239
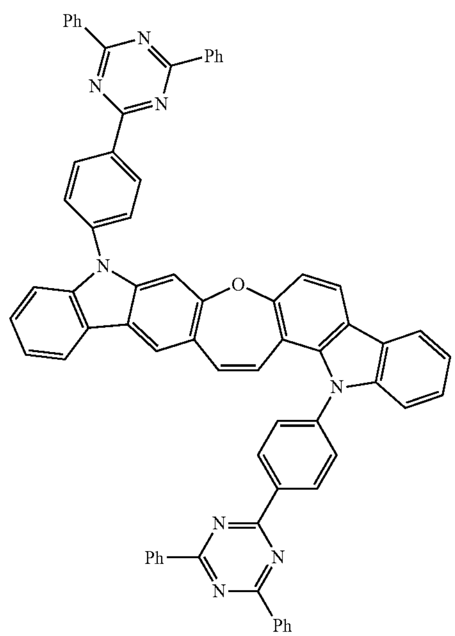

-continued
2-240
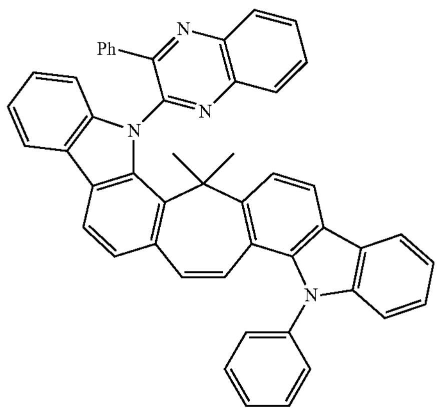
2-241
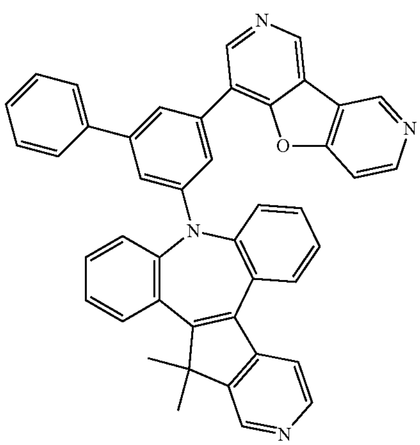
2-242
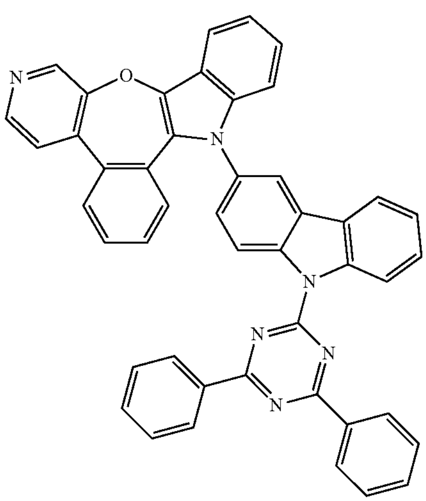
-continued
2-243
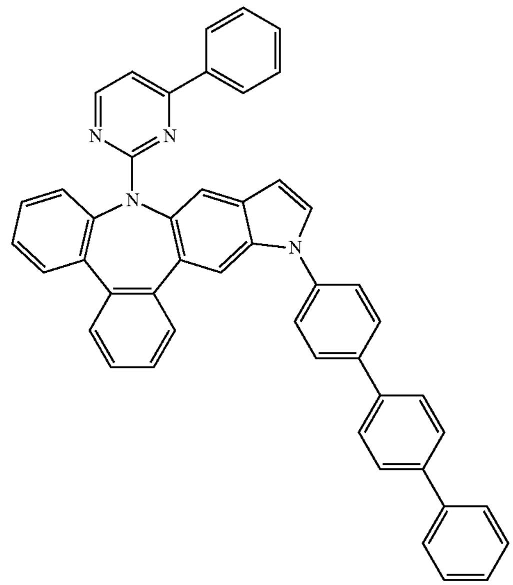
2-244
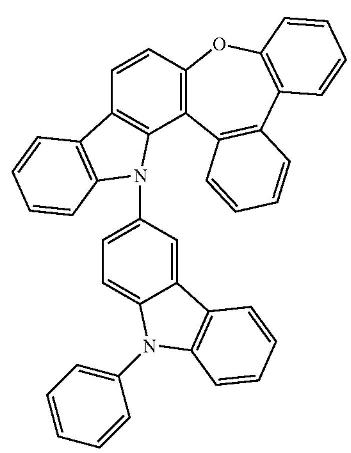
2-245
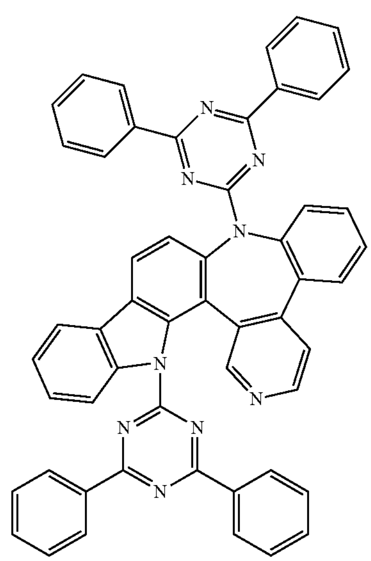

-continued
2-246
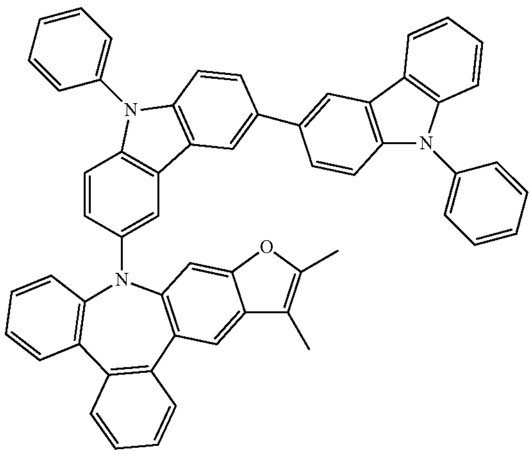
2-247
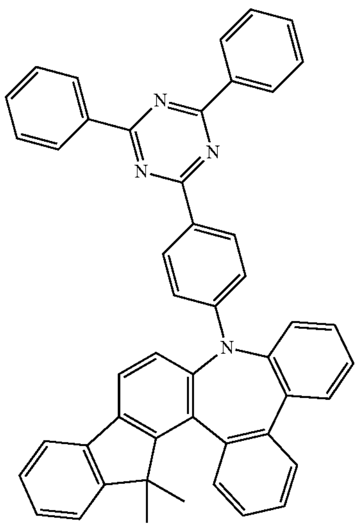
2-248
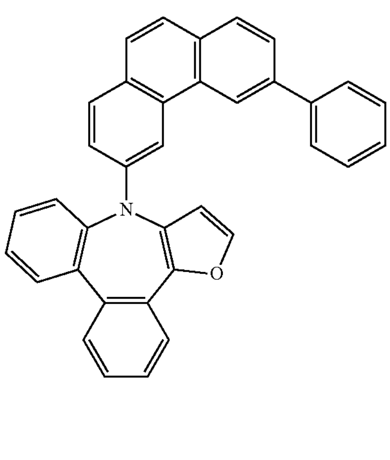
-continued
2-249
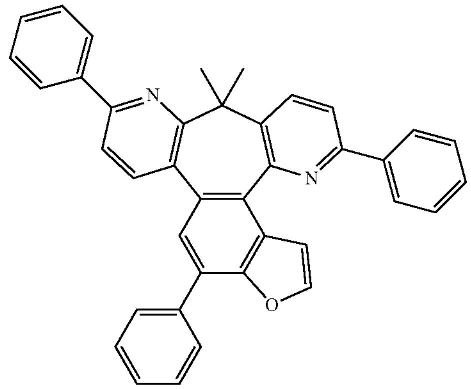
2-250
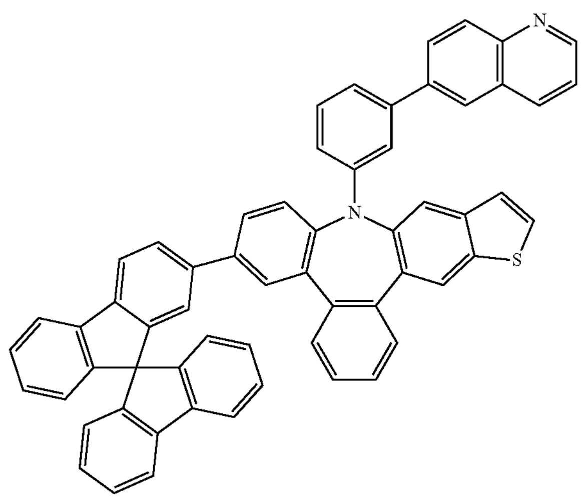
2-251
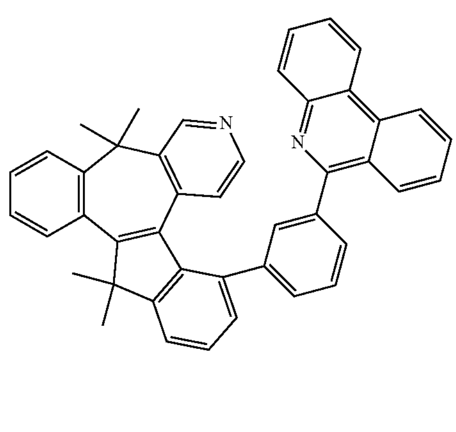

-continued
2-252
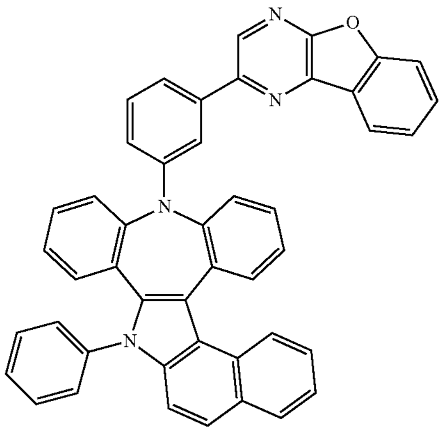
2-253
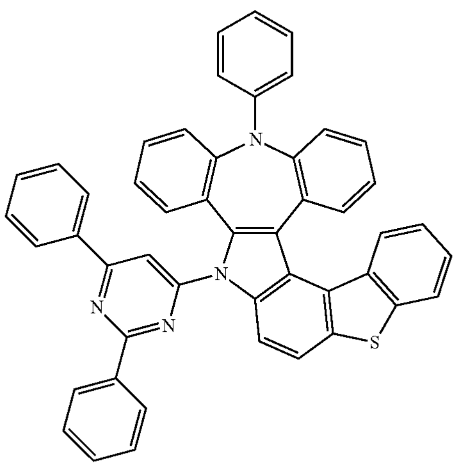
2-254
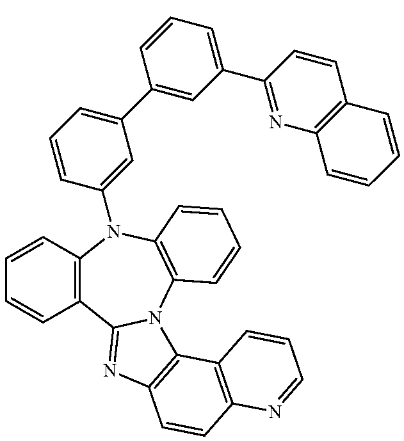
-continued
2-255
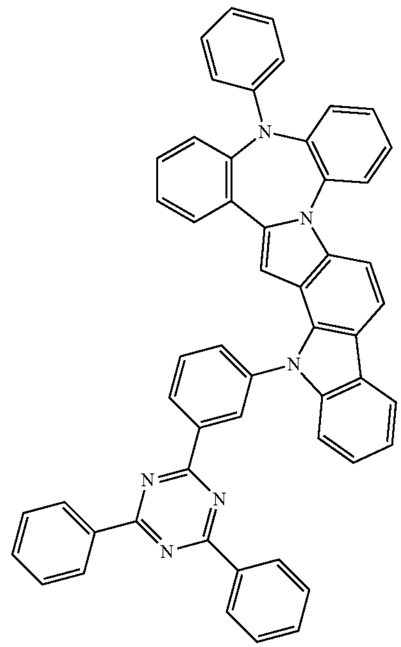
2-256
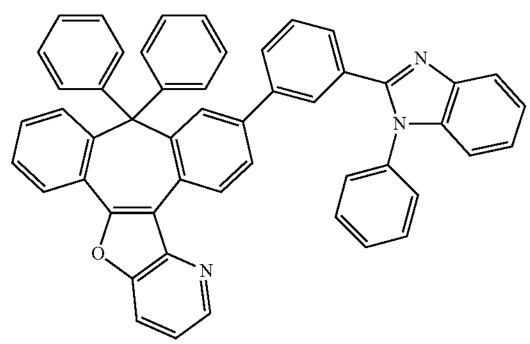
2-257
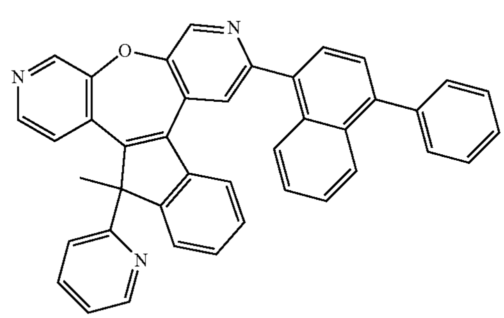

2-258

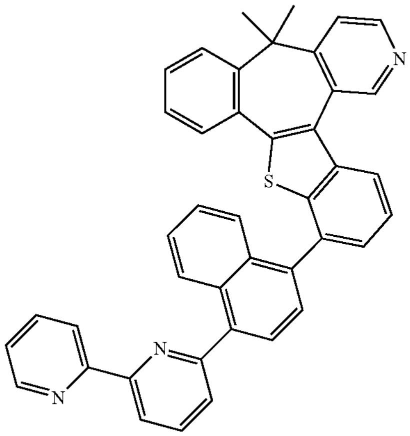

2-259

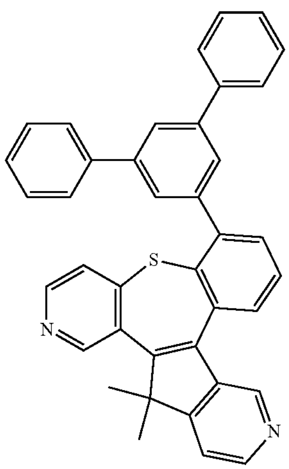

2-260

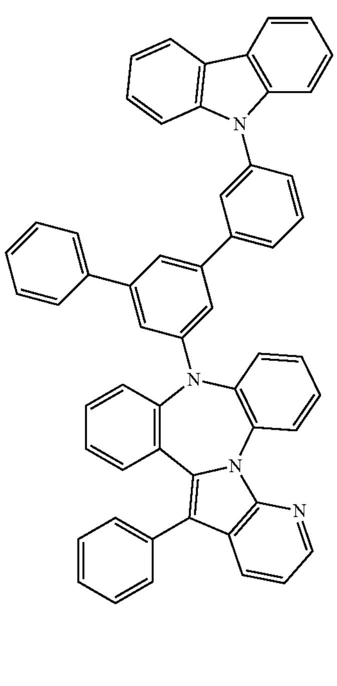

-continued 2-261

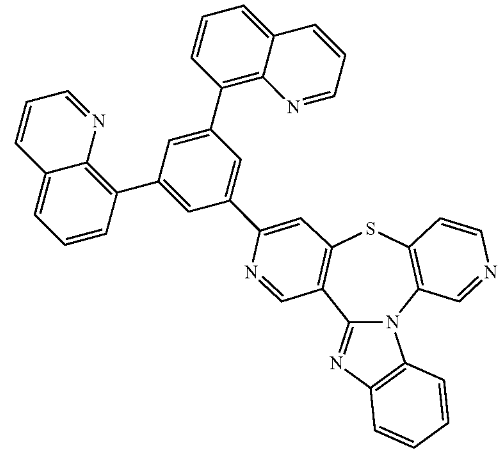

2-262

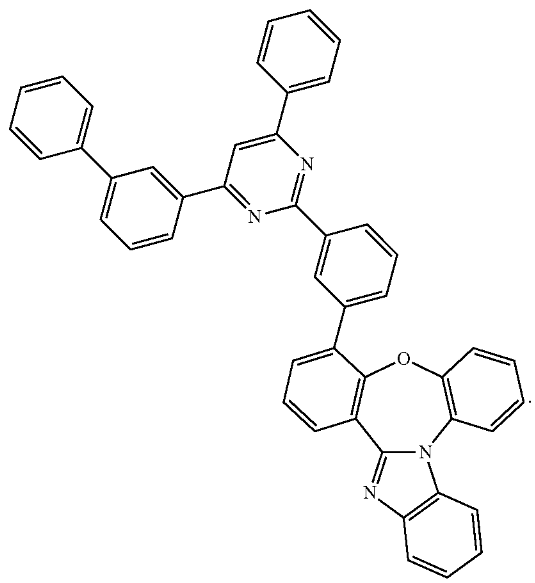

Any combinations of rings $A_1$ to $A_3$, $X_1$, $E_1$, $E_2$, $Y_1$, $Y_2$, $L_1$ to $L_4$, a1 to a4, $R_1$ to $R_4$, b1 to b4, and c1 to c4 in Formulae 1A and 1B may be applicable within the scope described herein.

Any combinations of ring $A_{21}$, ring $A_{22}$, ring $A_{23}$, $X_{21}$, and $T_{11}$ to $T_{14}$ in Formulae 2A and 2B may be applicable within the scope described herein.

Any combinations of *-$[(L_{22})_{a22}$-$(R_{22})_{b22}]$, $C(R_{23})(R_{24})$, $Si(R_{23})(R_{24})$, and N-$[(L_{21})_{a21}$-$(R_{21})_{b21}]$ may be applicable within the scope of $L_{21}$, $L_{22}$, a21, a22, $R_{21}$ to $R_{24}$, b21, and b22 described herein.

The emission layer of the organic light-emitting device according to an embodiment may include the first compound and at least one selected from the hole transport region and the electron transport region may include the second compound, and adjustment of a balance of electrons and/or holes injected or transported into the emission layer may be facilitated, thereby reducing the possibility of and/or preventing a leakage current from occurring. Accordingly, the organic light-emitting device according to an embodiment may have low driving voltage and high efficiency characteristics.

In various embodiment, triplet energy of the second compound may be about 2.2 eV or more. For example, the triplet energy of the second compound may be about 2.3 eV or more, or may be about 2.4 eV or more.

When the triplet energy of the second compound is within these ranges, the emission efficiency of a fluorescent organic light-emitting device may be be improved due to triplet-triplet fusion (TTF). In a phosphorescent organic light-emitting device, it is possible to prevent a reduction in efficiency of an organic light-emitting device by blocking transition of triplet excitons formed in an emission layer.

For example, the emission layer may include a first host and a second host, and the first host may include the first compound.

In various embodiments, the hole transport region may include an emission auxiliary layer, the emission auxiliary layer may directly contact the emission layer, and the second compound may be included in the emission auxiliary layer.

In various embodiments, the electron transport region may include a buffer layer, the buffer layer may directly contact the emission layer, and the second compound may be included in the buffer layer.

When both the hole transport region and the electron transport region in the organic light-emitting device include the second compound described above, the second compound included in the hole transport region and the second compound included in the electron transport region may be identical to or different from each other.

The emission layer may include a dopant, and the dopant may be an organometallic complex.

[Description of FIG. 1]

FIG. 1 illustrates a schematic view of an organic light-emitting device 10 according to an embodiment. The organic light-emitting device 10 may include a first electrode 110, an organic layer 150, and a second electrode 190.

Hereinafter, the structure of the organic light-emitting device 10 according to an embodiment and a method of manufacturing the organic light-emitting device 10 will be described in connection with FIG. 1.

[First electrode 110]

In FIG. 1, a substrate may be additionally disposed under the first electrode 110 or above the second electrode 190. The substrate may be a glass substrate or a plastic substrate, each having excellent mechanical strength, thermal stability, transparency, surface smoothness, ease of handling, and water-resistance.

The first electrode 110 may be formed by depositing or sputtering a material for forming the first electrode 110 on the substrate. When the first electrode 110 is an anode, the material for forming the first electrode 110 may be selected from materials with a high work function to facilitate hole injection.

The first electrode 110 may be a reflective electrode, a semi-transmissive electrode, or a transmissive electrode. When the first electrode 110 is a transmissible electrode, a material for forming the first electrode 110 may be selected from indium tin oxide (ITO), indium zinc oxide (IZO), tin oxide ($SnO_2$), zinc oxide (ZnO), and any combinations thereof. When the first electrode 110 is a semi-transmissive electrode or a reflective electrode, as a material for forming the first electrode 110, magnesium (Mg), silver (Ag), aluminum (Al), aluminum-lithium (Al—Li), calcium (Ca), magnesium-indium (Mg—In), magnesium-silver (Mg—Ag), or any combination thereof may be used.

The first electrode 110 may have a single-layered structure, or a multi-layered structure including two or more layers. For example, the first electrode 110 may have a three-layered structure of ITO/Ag/ITO.

[Organic layer 150]

The organic layer 150 is disposed on the first electrode 110. The organic layer 150 may include an emission layer.

The organic layer 150 may include a hole transport region between the first electrode 110 and the emission layer, and an electron transport region between the emission layer and the second electrode 190.

[Hole Transport Region in Organic Layer 150]

The hole transport region may have, e.g., i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

For example, the hole transport region may have a single-layered structure including a single layer including a plurality of different materials, or a multi-layered structure having a structure of hole injection layer/hole transport layer, hole injection layer/hole transport layer/emission auxiliary layer, hole injection layer/emission auxiliary layer, hole transport layer/emission auxiliary layer or hole injection layer/hole transport layer/electron blocking layer, wherein, in each of these structures, constituting layers are sequentially stacked from the first electrode 110 in this stated order.

The hole transport region may include the second compound as described above.

In various embodiments, the hole transport region may include an emission auxiliary layer. The emission auxiliary layer may directly contact the emission layer.

In various embodiments, the hole transport region may include a hole injection layer and a hole transport layer, which are stacked in this stated order on the first electrode 110, a hole injection layer and an emission auxiliary layer, which are stacked in this stated order on the first electrode 110, or a hole injection layer, a hole transport layer, and an emission auxiliary layer, which are stacked in this stated order on the first electrode 110.

When the hole transport region includes an emission auxiliary layer, the emission auxiliary layer may include the second compound.

The hole transport region may include at least one selected from m-MTDATA, TDATA, 2-TNATA, NPB (NPD), β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (Pani/DBSA), PEDOT/PSS (poly(3,4-ethylenedioxythiophene)/poly(4-styrenesulfonate)), polyaniline/camphor sulfonic acid (Pani/CSA), polyaniline/poly(4-styrenesulfonate) (Pani/PSS), a compound represented by Formula 201, and a compound represented by Formula 202:

-continued
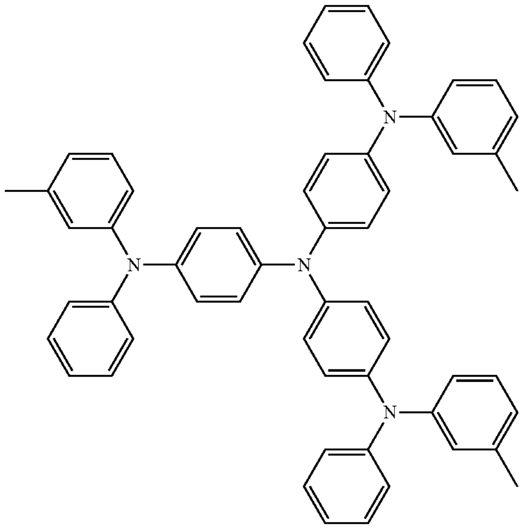
m-MTDATA
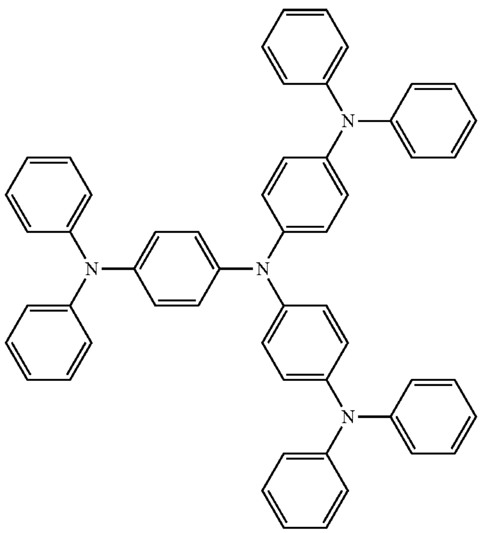
TDATA
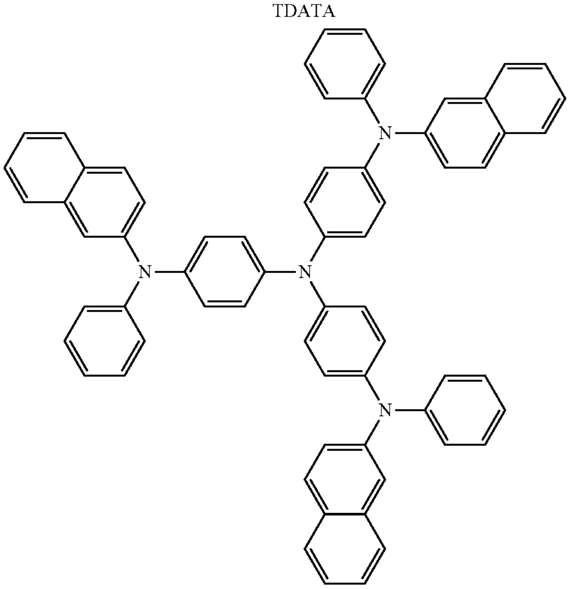
2-TNATA
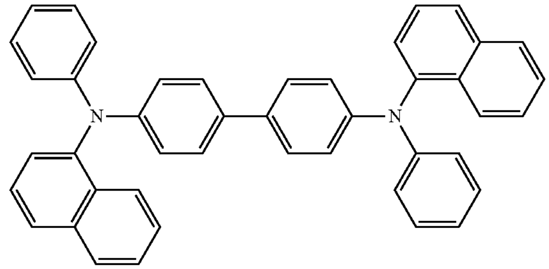
NPB
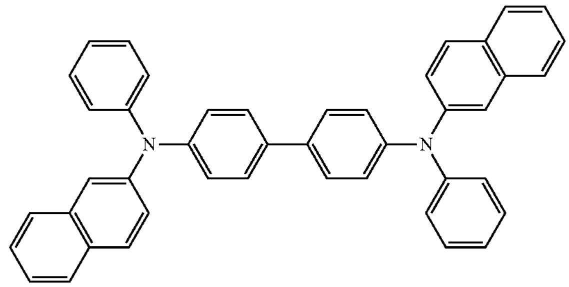
β-NPB
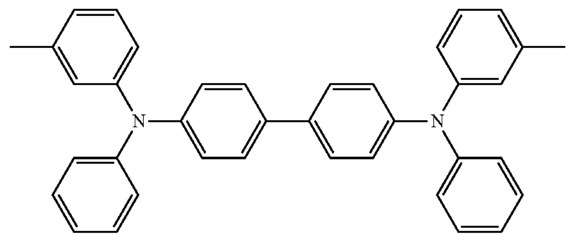
TPD
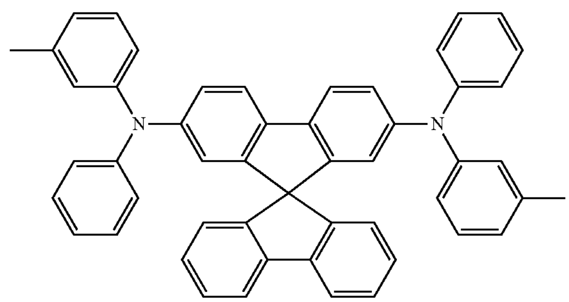
Spiro-TPD
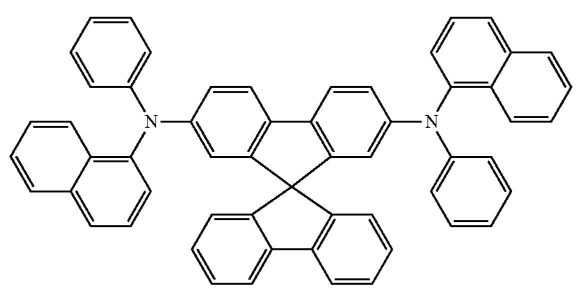
Spiro-NPB -continued

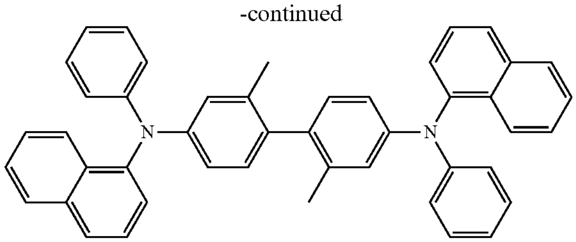

methylated NPB

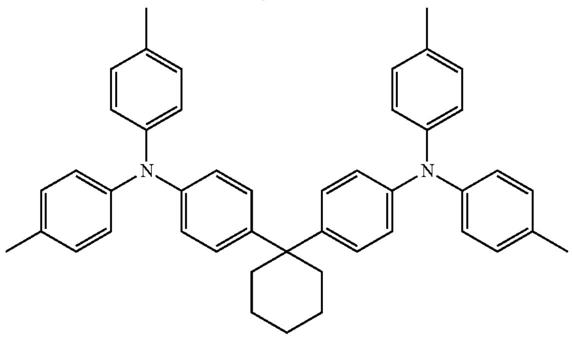

TAPC

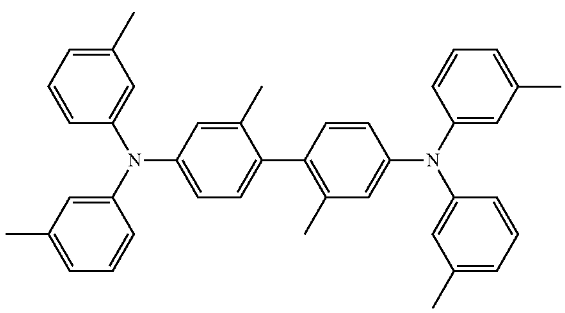

HMTPD

<Formula 201>

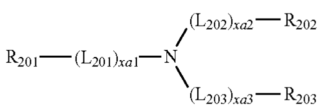

<Formula 202>

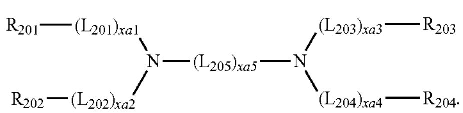

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer selected from 0 to 3, xa5 may be an integer selected from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, $R_{201}$ and $R_{202}$ may be optionally connected to each other via a single bond, a dimethyl-methylene group, or a diphenyl-methylene group, and $R_{203}$ and $R_{204}$ may be optionally connected to each other via a single bond, a dimethyl-methylene group, or a diphenyl-methylene group.

In various embodiments, in Formulae 201 and 202, $L_{201}$ to $L_{205}$ may each independently be selected from a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In various embodiments, xa1 to xa4 may each independently be 0, 1, or 2.

In various embodiments, xa5 may be 1, 2, 3, or 4.

In various embodiments, $R_{201}$ to $R_{204}$ and $Q_{201}$ may each independently be selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ are the same as described above.

In various embodiments, at least one selected from $R_{201}$ to $R_{203}$ in Formula 201 may each independently be selected from a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group.

In various embodiments, in Formula 202, i) $R_{201}$ and $R_{202}$ may be connected to each other via a single bond, and/or ii) $R_{203}$ and $R_{204}$ may be connected to each other via a single bond.

In various embodiments, at least one selected from $R_{201}$ to $R_{204}$ in Formula 202 may be selected from a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group.

The compound represented by Formula 201 may be represented by Formula 201A:

<Formula 201A>

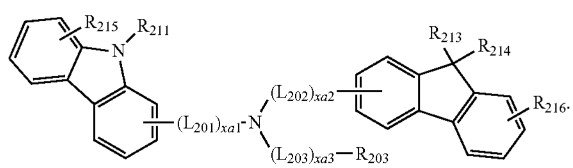

For example, the compound represented by Formula 201 may be represented by Formula 201A(1):

<Formula 201A(1)>

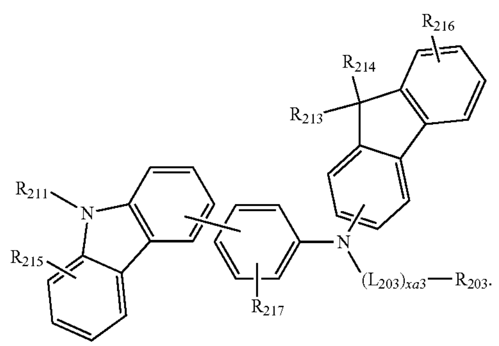

In various embodiments, the compound represented by Formula 201 may be represented by Formula 201A-1:

<Formula 201A-1>

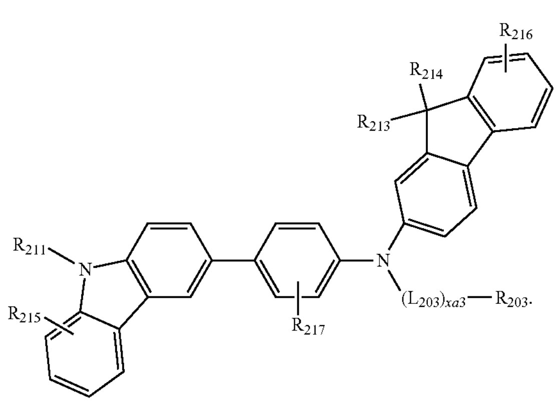

In various embodiments, the compound represented by Formula 202 may be represented by Formula 202A:

<Formula 202A>

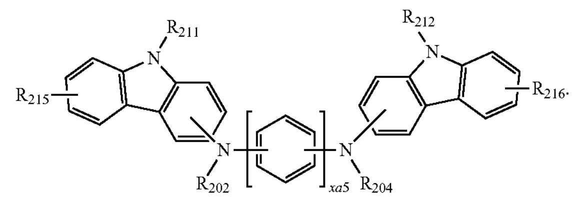

In various embodiments, the compound represented by Formula 202 may be represented by Formula 202A-1:

<Formula 202A-1>

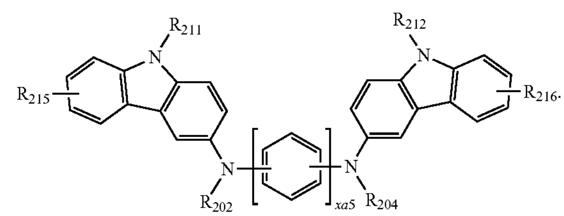

In Formulae 201A, 201A(1), 201A-1, 202A, and 202A-1, $L_{201}$ to $L_{203}$, xa1 to xa3, xa5, and $R_{202}$ to $R_{204}$ are the same as described above, $R_{211}$ and $R_{212}$ are the same as described above in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In an implementation, the hole transport region may include at least one compound selected from Compounds HT1 to HT39.

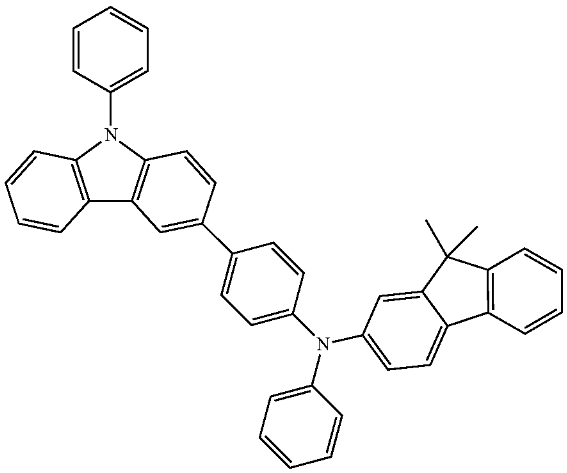
HT1
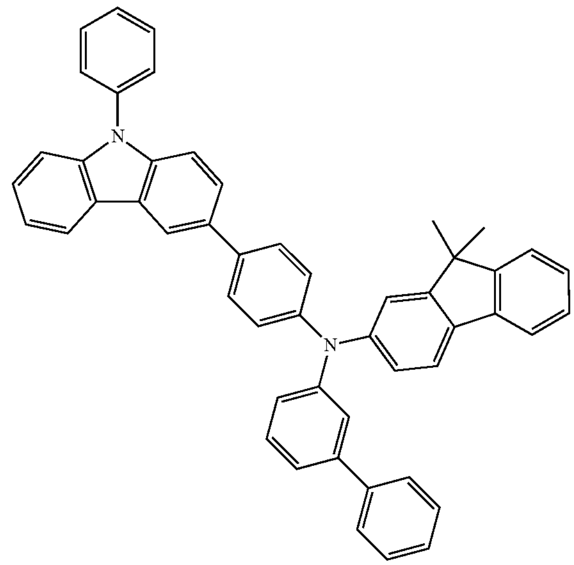
HT2
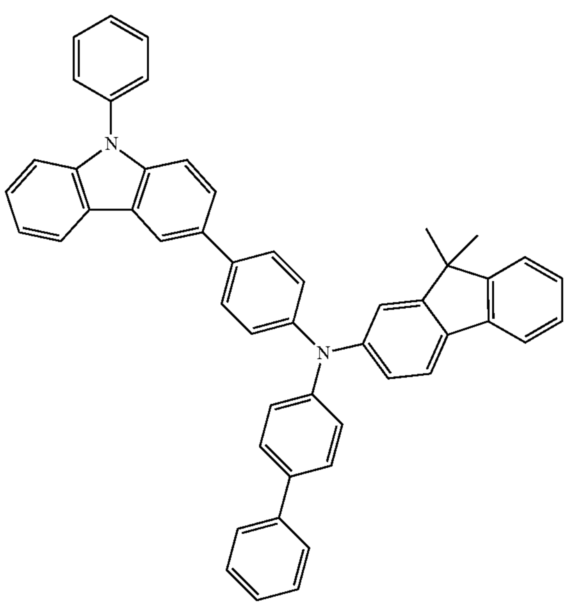
HT3
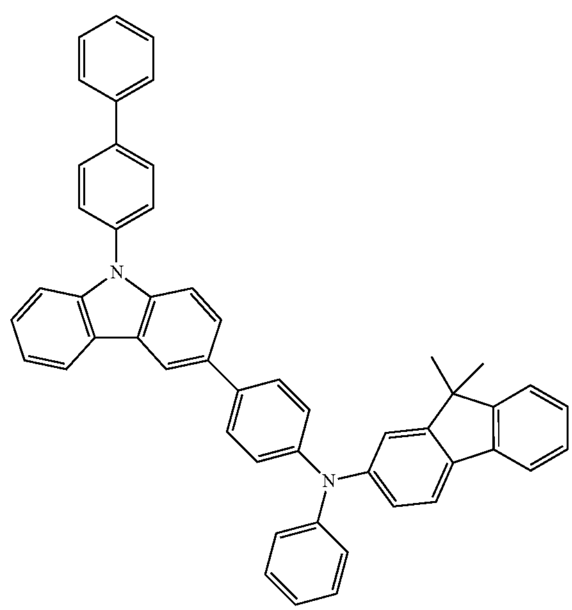
HT4

-continued
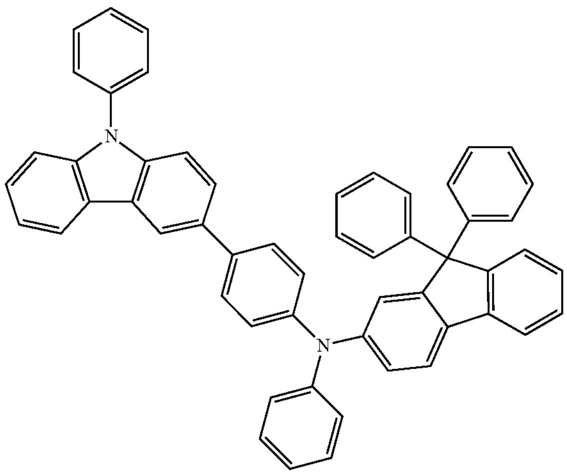
HT5
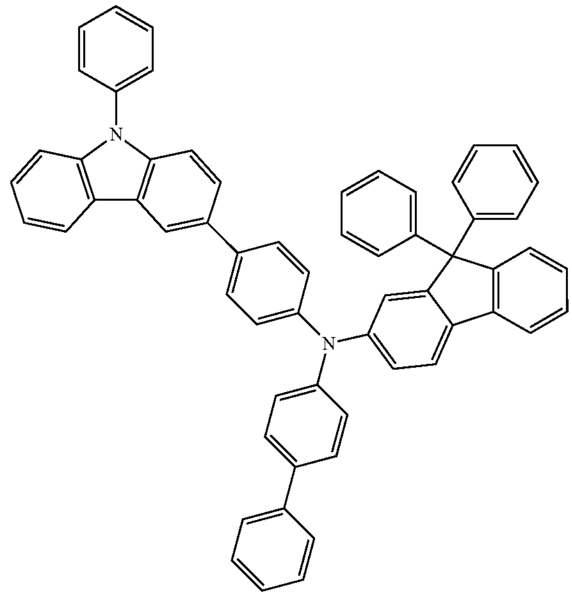
HT6
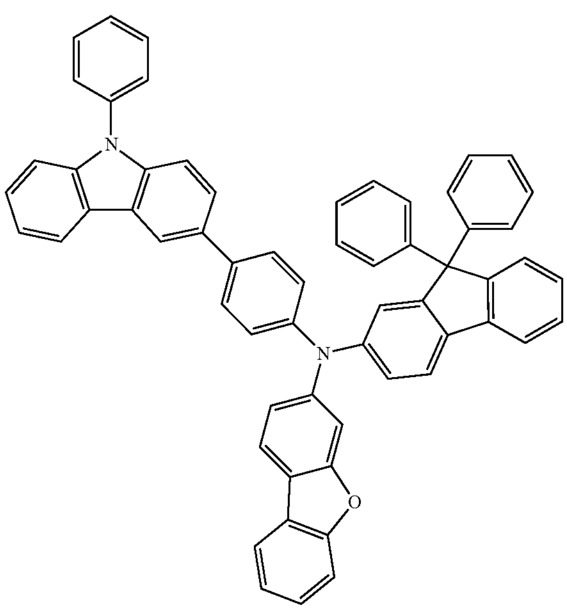
HT7
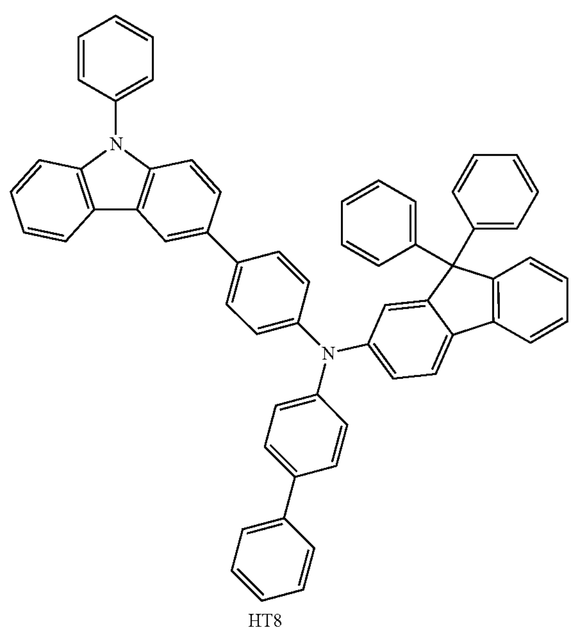
HT8

-continued
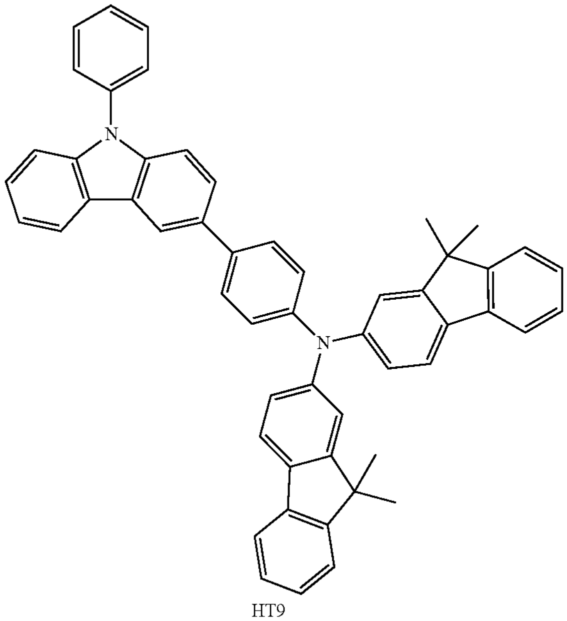
HT9
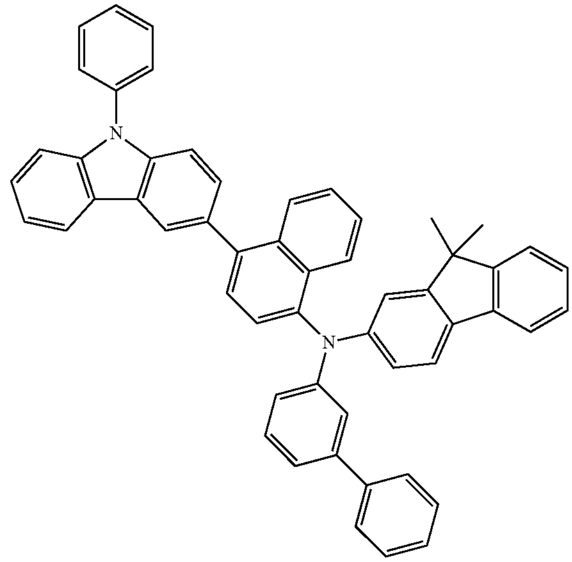
HT10
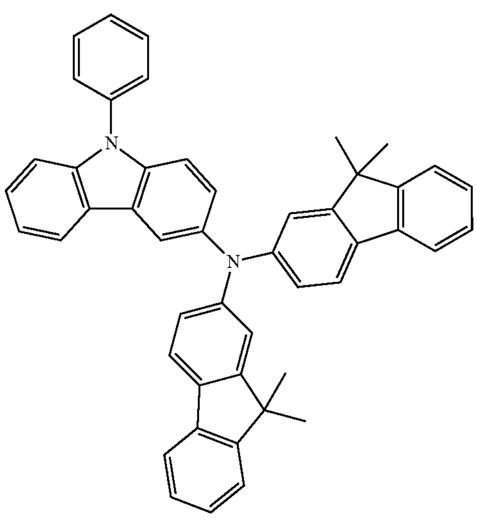
HT11
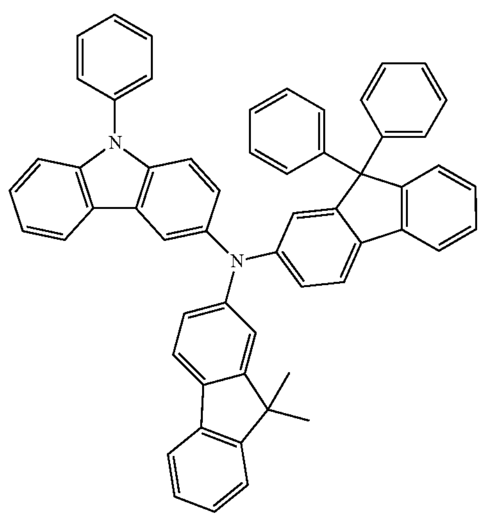
HT12

-continued
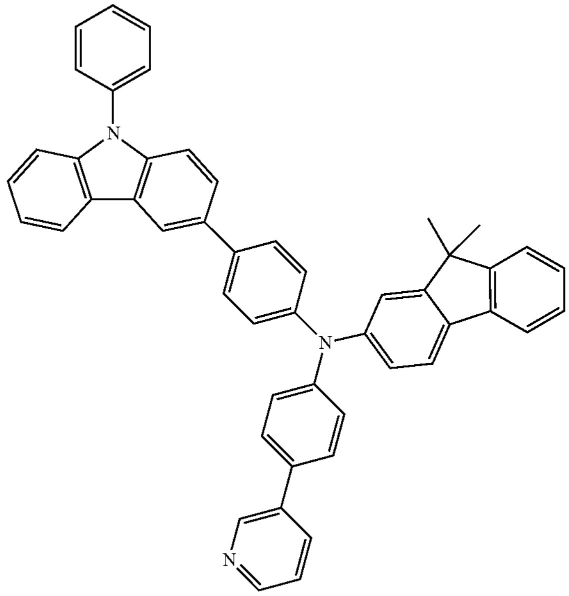
HT13
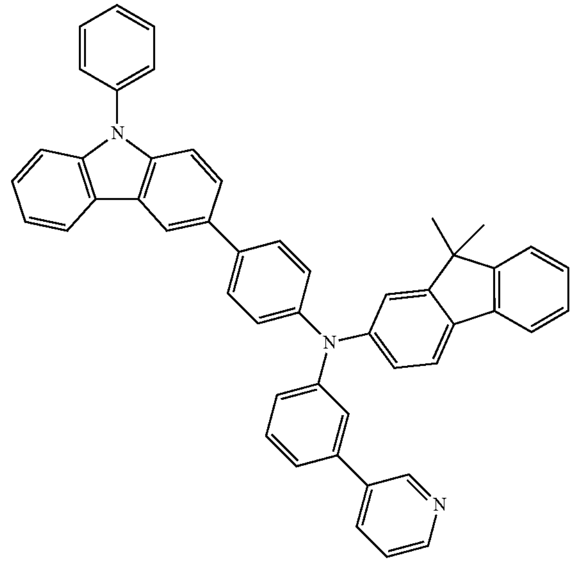
HT14
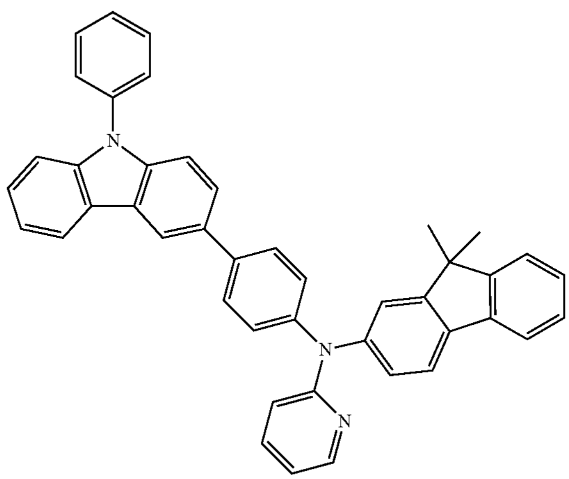
HT15
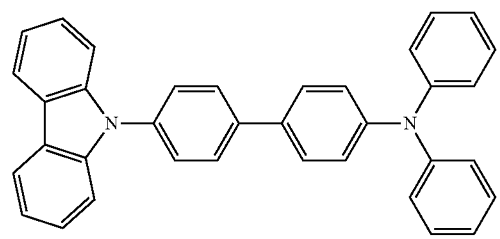
HT16
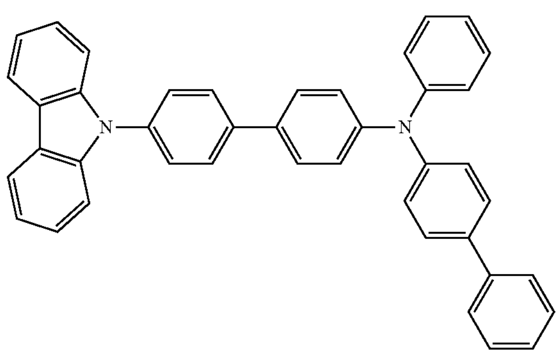
HT17
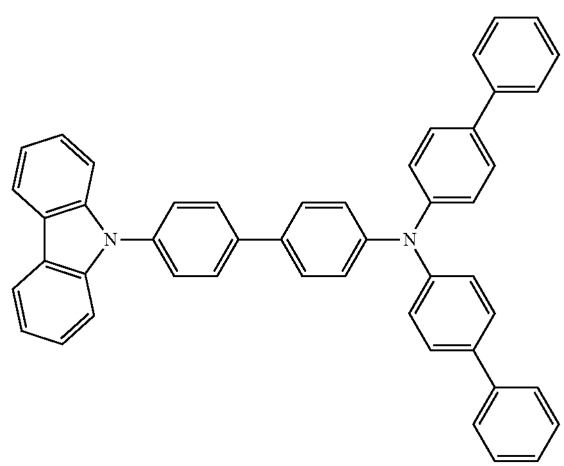
HT18

-continued
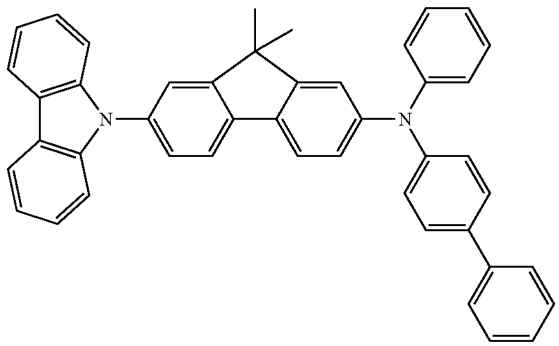
HT19
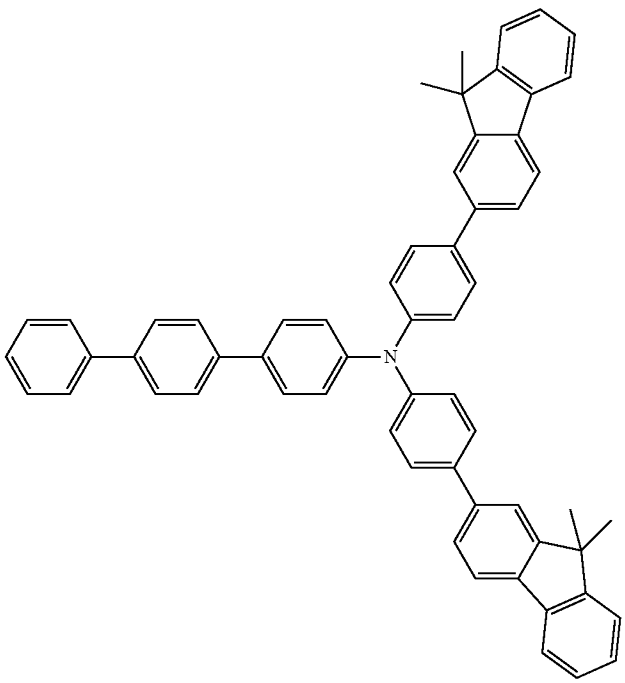
HT20
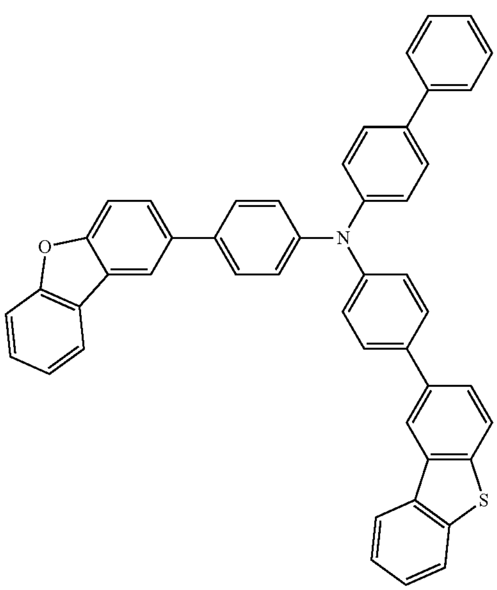
HT21

-continued
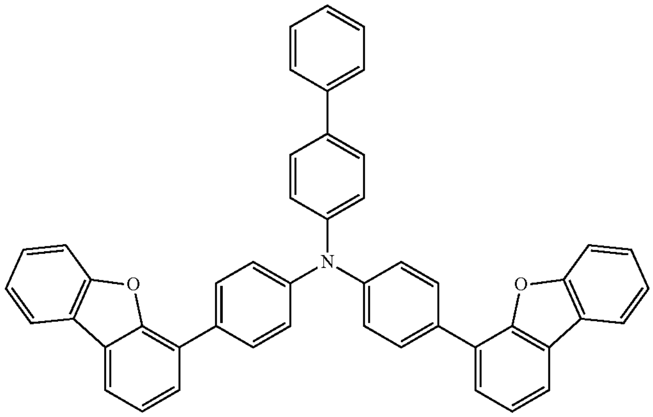
HT22
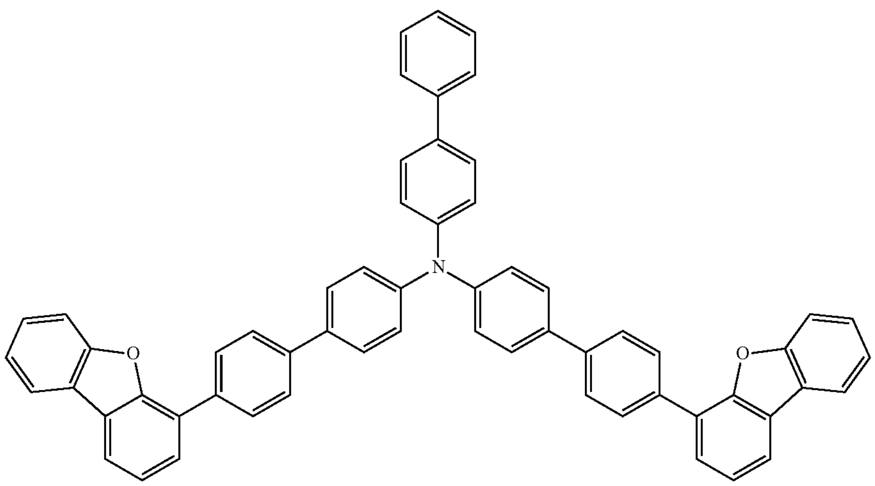
HT23
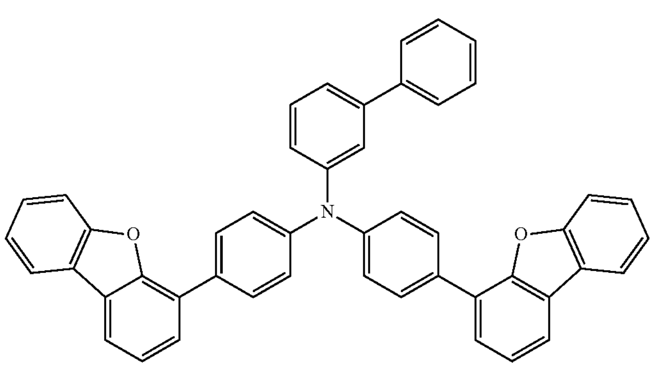
HT24

-continued
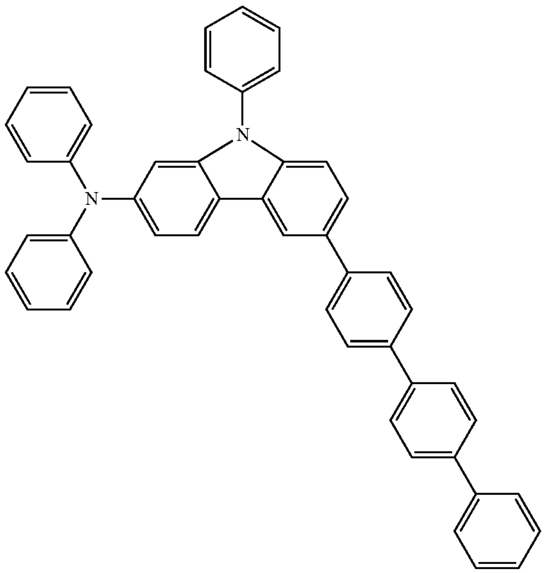
HT25
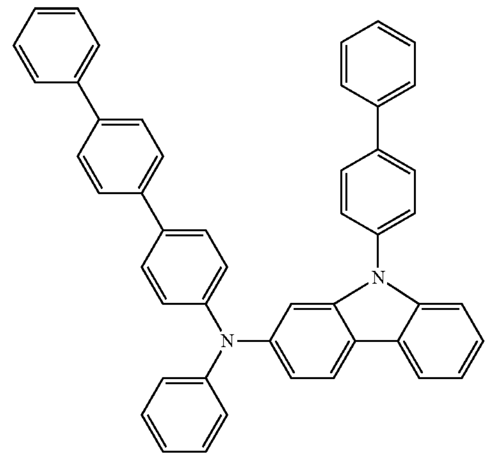
HT26
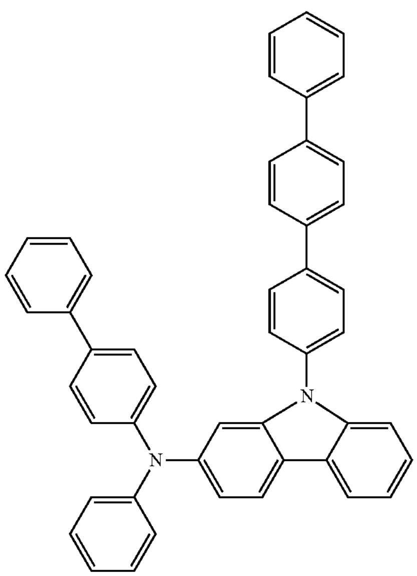
HT27
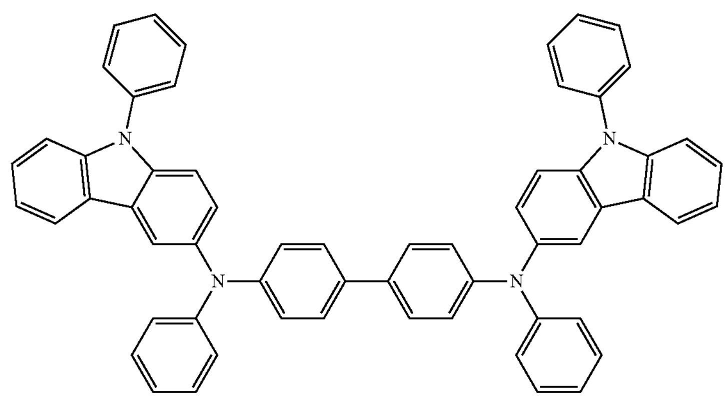
HT28
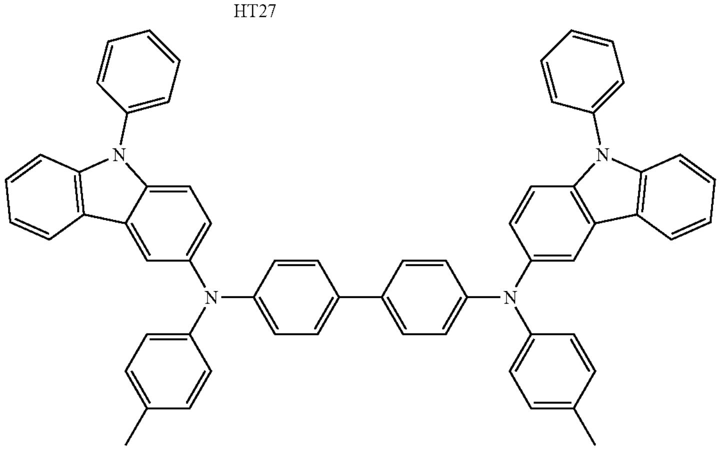
HT29

-continued
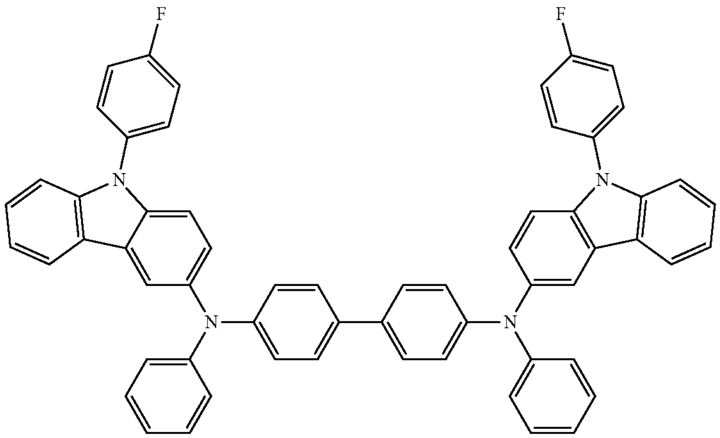
HT30
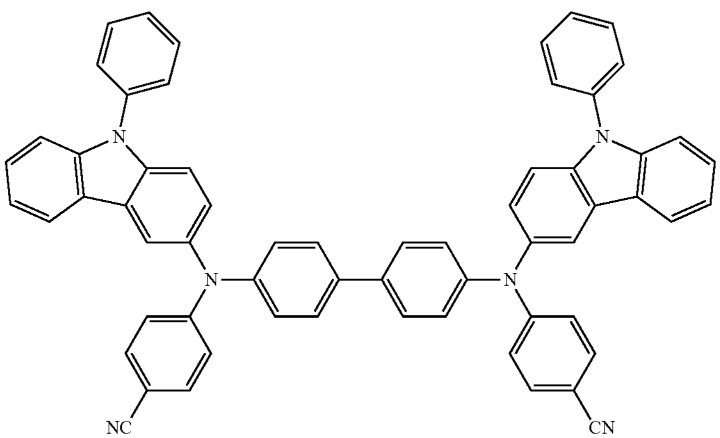
HT31
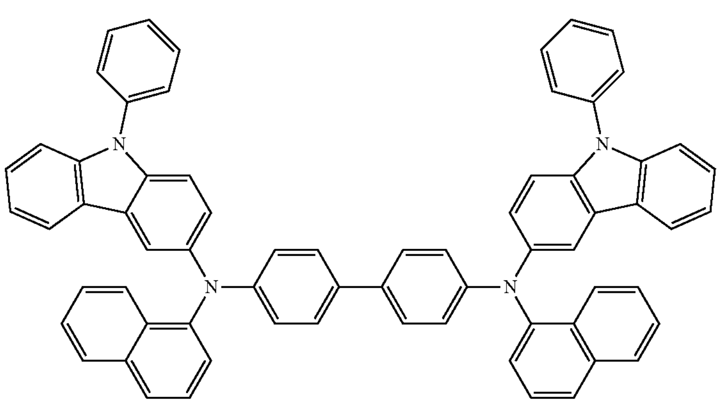
HT32

-continued
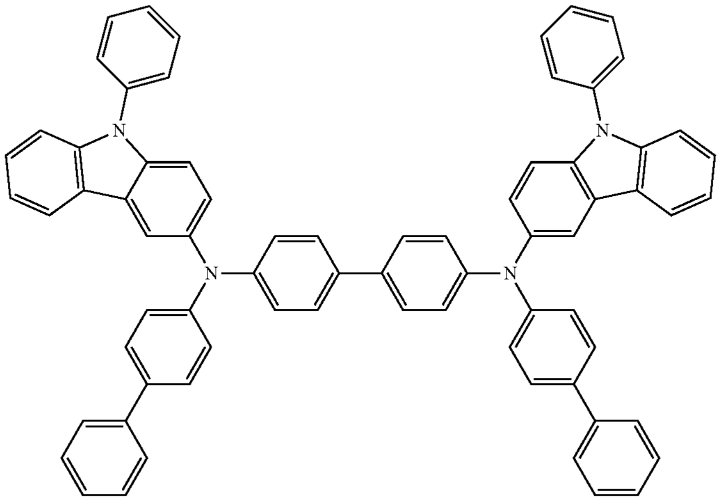
HT33
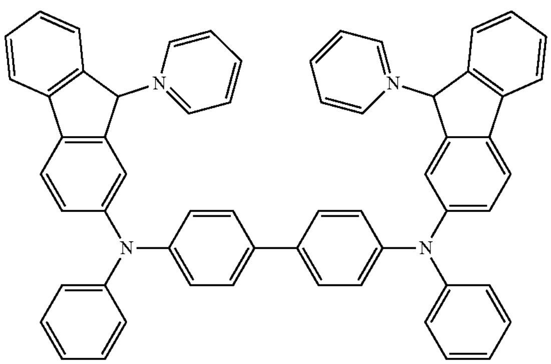
HT34
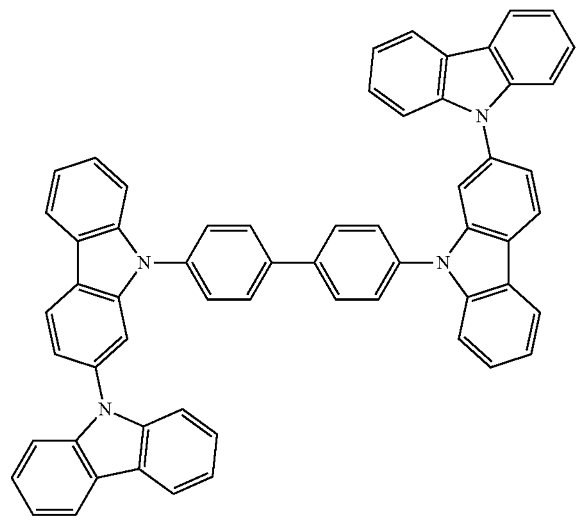
HT35
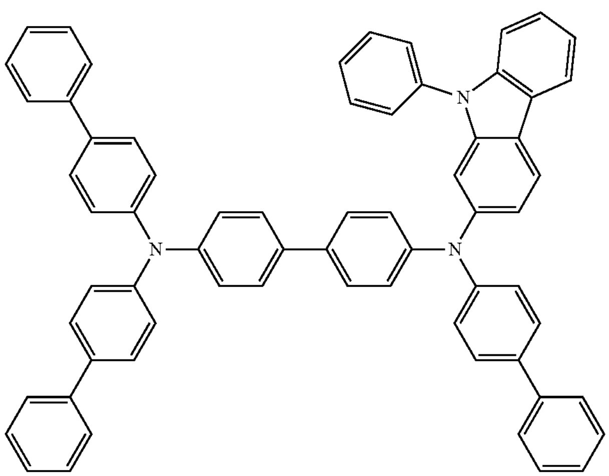
HT36
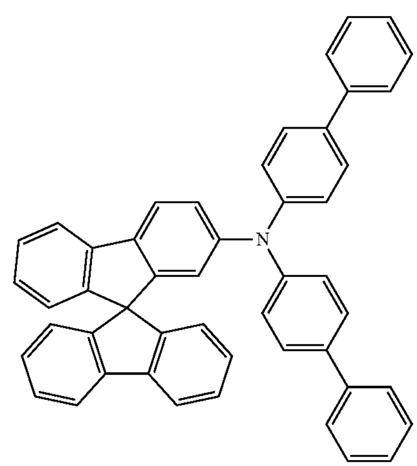
HT37

-continued

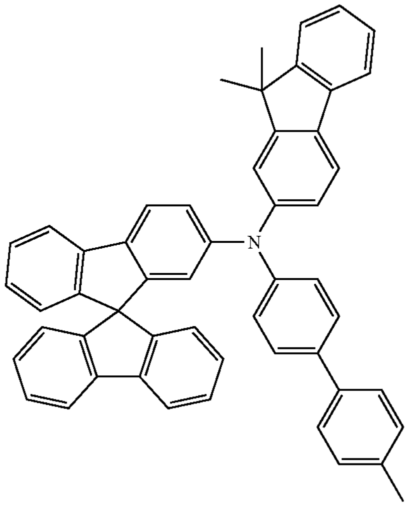

HT38

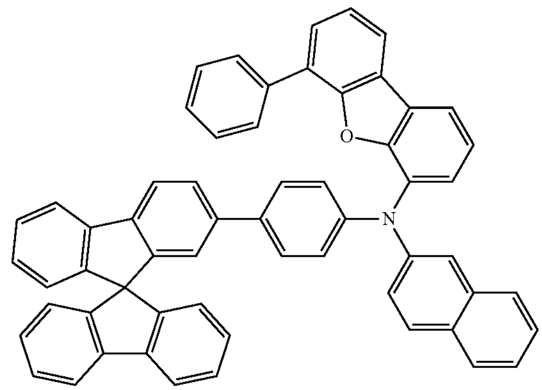

HT39

A thickness of the hole transport region may be in a range of about 100 Å to about 10,000 Å, for example, about 100 Å to about 1,000 Å. When the hole transport region includes at least one selected from a hole injection layer and a hole transport layer, the thickness of the hole injection layer may be in a range of about 100 Å to about 9,000 Å, for example, about 100 Å to about 1,000 Å, and the thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may help increase light-emission efficiency by compensating for an optical resonance distance according to the wavelength of light emitted by an emission layer, and the electron blocking layer may block the flow of electrons from an electron transport region. The emission auxiliary layer and the electron blocking layer may include those materials as described above.

[p-dopant]

The hole transport region may further include, in addition to these materials, a charge-generation material for the improvement of conductive properties. The charge-generation material may be homogeneously or non-homogeneously dispersed in the hole transport region.

The charge-generation material may be, e.g., a p-dopant.

A doping concentration of the p-dopant may be in a range of about 0.1 wt % to about 20 wt %, for example, about 0.5 wt % to about 10 wt %.

In various embodiments, a lowest unoccupied molecular orbital (LUMO) of the p-dopant may be about −3.5 eV or less.

The p-dopant may include at least one selected from a quinone derivative, a metal oxide, and a cyano group-containing compound.

For example, the p-dopant may include at least one selected from a quinone derivative, such as tetracyanoquinodimethane (TCNQ) and 2,3,5,6-tetrafluoro-7,7,8,8-tetracyanoquinodimethane (F4-TCNQ);

a metal oxide, such as a tungsten oxide or a molybdenum oxide;

1,4,5,8,9,11-hexaazatriphenylene-hexacarbonitrile (HAT-CN); and a compound represented by Formula 221 below.

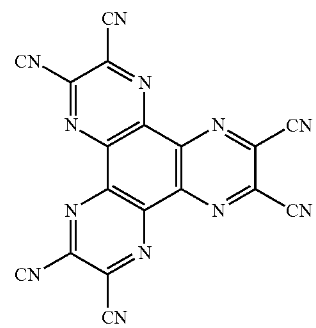

<HAT-CN>

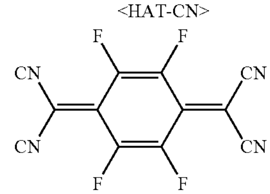

<F4-TCNQ>

<Formula 221>

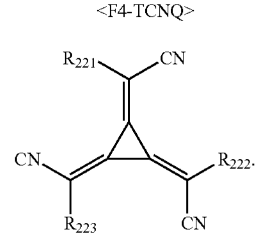

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, provided that at least one selected from $R_{221}$ to $R_{223}$ has at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

[Emission Layer in Organic Layer 150]

When the organic light-emitting device 10 is a full color organic light-emitting device, the emission layer may be patterned into a red emission layer, a green emission layer, or a blue emission layer, according to a sub-pixel. In various embodiments, the emission layer may have a stacked structure of two or more layers selected from a red emission layer, a green emission layer, and a blue emission layer, in which the two or more layers contact each other or are separated from each other. In various embodiments, the emission layer may include two or more materials selected from a red-light emission material, a green-light emission material, and a blue-light emission material, in which the two or more materials are mixed with each other in a single layer to emit white light.

In various embodiments, the emission layer of the organic light-emitting device 10 may be a first-color-light emission layer, the organic light-emitting device 10 may further include i) at least one second-color-light emission layer or ii) at least one second-color-light emission layer and at least one third-color-light emission layer, between the first electrode 110 and the second electrode 190, a maximum emission wavelength of the first-color-light emission layer, a maximum emission wavelength of the second-color-light emission layer, and a maximum emission wavelength of the third-color-light emission layer are identical to or different from each other, and the organic light-emitting device 10 may emit mixed light including first-color-light and second-color-light, or mixed light including first-color-light, second-color-light, and third-color-light.

For example, the maximum emission wavelength of the first-color-light emission layer is different from a maximum emission wavelength of the second-color-light emission layer, and the mixed light including first-color-light and second-color-light may be white light.

In various embodiments, the maximum emission wavelength of the first-color-light emission layer, the maximum emission wavelength of the second-color-light emission layer, and the maximum emission wavelength of the third-color-light emission layer may be different from one another, and the mixed light including first-color-light, second-color-light, and third-color-light may be white light.

The emission layer may include a host and a dopant. The dopant may include at least one selected from a phosphorescent dopant and a fluorescent dopant.

An amount of the dopant in the emission layer may be, in general, in a range of about 0.01 to about 15 parts by weight based on 100 parts by weight of the host.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

[Host in Emission Layer]

The emission layer may include the first compound according to an embodiment as a host. For example, the first compound is the same as described above.

In an implementation, the emission layer may include a first host and a second host, and the first host may include the first compound.

In an implementation, the second host may be selected from compounds described above as an example of the first compound.

In an implementation, the second host may be selected from 4,4'-bis(N-carbazolyl)-1,1'-biphenyl (CBP), 1,3-di-9-carbazolylbenzene (mCP), and 1,3,5-tri(carbazol-9-yl)benzene (TCP).

A weight ratio of the first host to the second host in the emission layer may be, for example, about 90:10 to about 10:90, for example, about 80:20 to about 20:80, or for example, about 50:50.

[Phosphorescent Dopant Included in Emission Layer in Organic Layer 150]

The phosphorescent dopant may include an organometallic complex represented by Formula 401 below, in which $L_{401}$ may be selected from ligands represented by Formula 402.

<Formula 401>

$$M(L_{401})_{xc1}(L_{402})_{xc2}$$

<Formula 402>

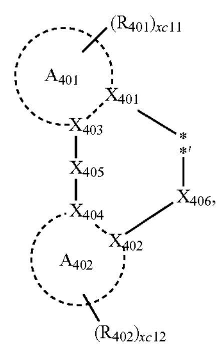

wherein, in Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), xc1 may be 1, 2, or 3, wherein when xc1 is two or more, two or more $L_{401}$(s) may be identical to or different from each other, $L_{402}$ may be an organic ligand, and xc2 may be an integer selected from 0 to 4, wherein when xc2 is two or more, two or more $L_{402}$(s) may be identical to or different from each other, $X_{401}$ to $X_{404}$ may each independently be nitrogen or carbon, $X_{401}$ and $X_{403}$ may be connected to each other via a single bond or a double bond, and $X_{402}$ and $X_{404}$ may be connected to each other via a single bond or a double bond, $A_{401}$ and $A_{402}$ may each independently be a $C_5$-$C_{60}$ carbocyclic group or a $C_1$-$C_{60}$ heterocyclic group, $X_{405}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*' wherein $Q_{411}$ and $Q_{412}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be selected from hydrogen, deuterium, —F, —Cl, —Br, —I, —$CD_3$, —$CF_3$, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer selected from 0 to 10, and

* and *' in Formula 402 indicate a binding site to M in Formula 401.

In various embodiments, $A_{401}$ and $A_{402}$ in Formula 402 may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzoimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In various embodiments, in Formula 402, i) $X_{401}$ may be nitrogen, $X_{402}$ may be carbon, or ii) both $X_{401}$ and $X_{402}$ may be nitrogen.

In various embodiments, $R_{401}$ and $R_{402}$ in Formula 402 may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantanyl group, a norbornanyl group, and a norbornenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantanyl group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group.

In various embodiments, when xc1 in Formula 401 is two or more, two $A_{401}$(s) selected from two or more $L_{401}$(s) may be optionally connected to each other via a linking group $X_{407}$, or two $A_{402}$(s) may be optionally connected to each other via a linking group $X_{408}$ (see Compounds PD1 to PD4 and PD7 below). $X_{407}$ and $X_{408}$ may each independently be a single bond, *—O—*', *—S—*', *—C(=O)—*', *—N($Q_{413}$)-*', *—C($Q_{413}$)($Q_{414}$)-*', or *—C($Q_{413}$)=C($Q_{414}$)-*' (wherein $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group).

$L_{402}$ in Formula 401 may be a suitable monovalent, divalent, or trivalent organic ligand. For example, $L_{402}$ may be selected from a halogen, a diketone (for example, an acetylacetonate), a carboxylic acid (for example, a picolinate), —C(=O), an isonitrile, —CN, and phosphorus (for example, a phosphine or a phosphite).

In various embodiments, the phosphorescent dopant may be selected from, for example, Compounds PD1 to PD25.

PD1

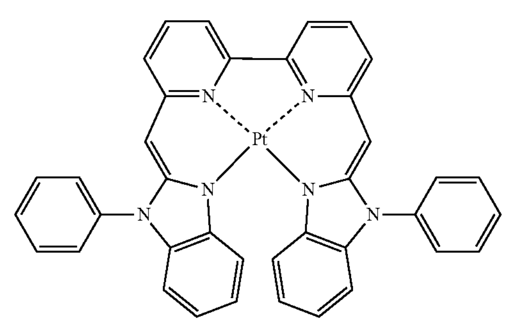

-continued
PD2
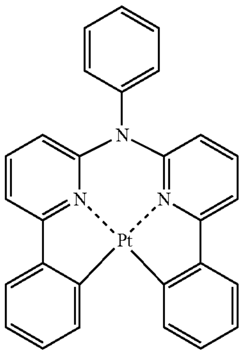
PD3
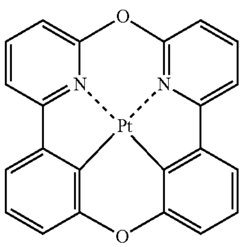
PD4
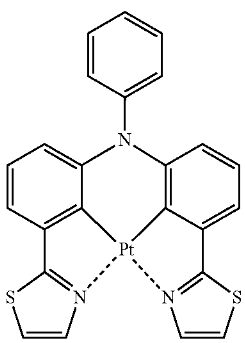
PD5
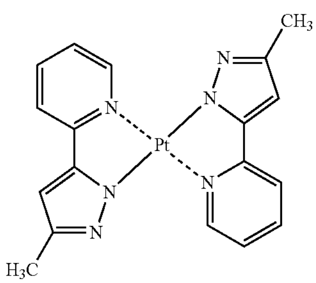
PD6
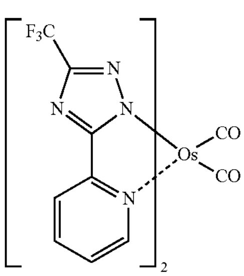
-continued
PD7
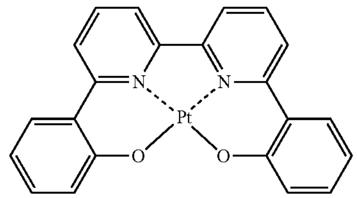
PD8
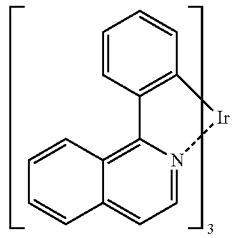
PD9
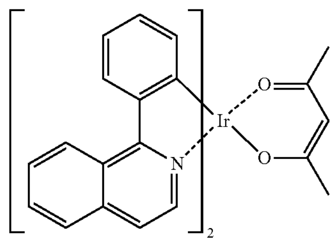
PD10
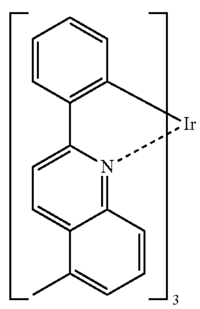
PD11
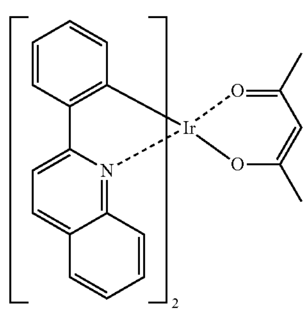

PD12
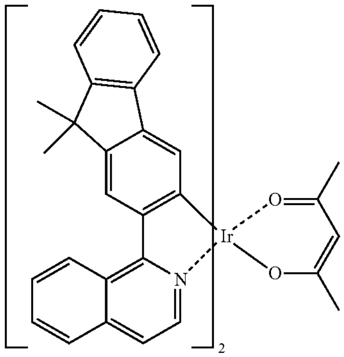
PD13
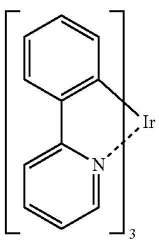
PD14
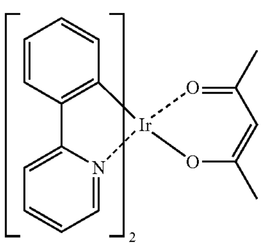
PD15
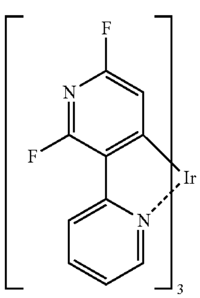
PD16
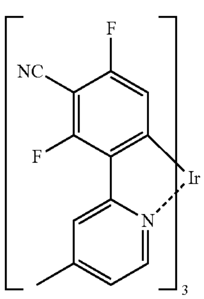
PD17
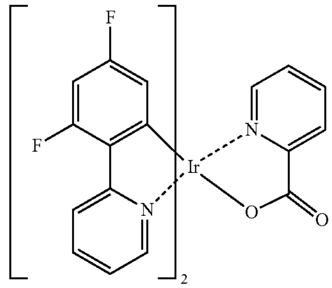
PD18
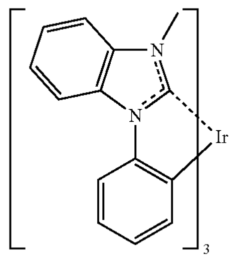
PD19
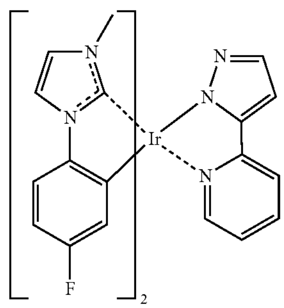
PD20
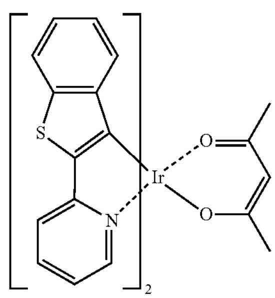
PD21
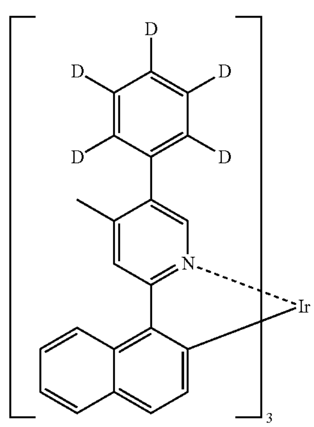

-continued

PD22

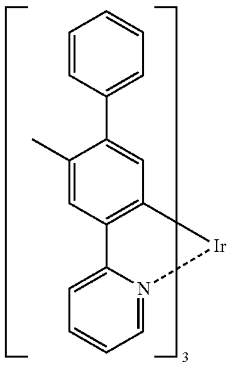

PD23

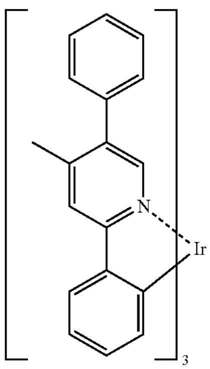

PD24

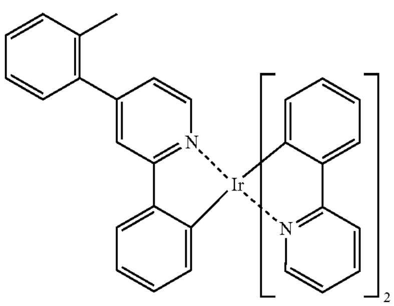

PD25

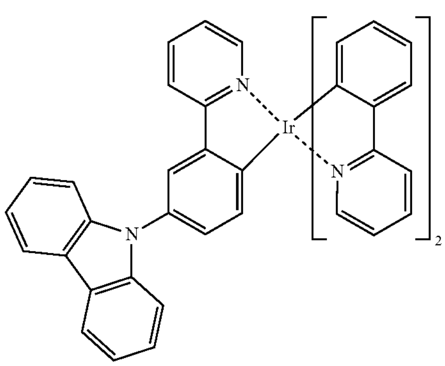

[Fluorescent Dopant in Emission Layer]

The fluorescent dopant may include an arylamine compound or a styrylamine compound.

In various embodiments, the fluorescent dopant may include a compound represented by Formula 501:

<Formula 501>

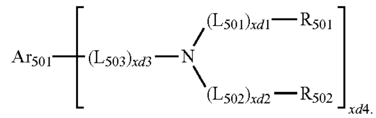

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer selected from 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer selected from 1 to 6.

In various embodiments, $Ar_{501}$ in Formula 501 may be selected from a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In various embodiments, $L_{501}$ to $L_{503}$ in Formula 501 may each independently be selected from a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In various embodiments, $R_{501}$ and $R_{502}$ in Formula 501 may each independently be selected from a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —Si($Q_{31}$)($Q_{32}$)($Q_{33}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In various embodiments, xd4 in Formula 501 may be two.

For example, the fluorescent dopant may be selected from Compounds FD1 to FD22:

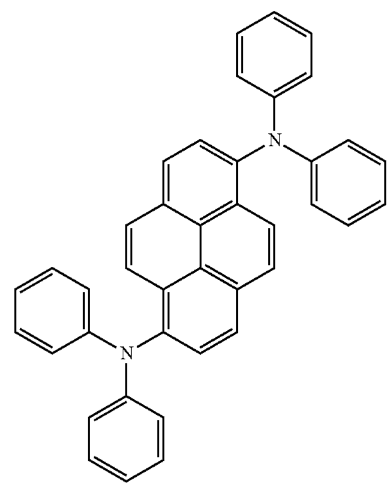

FD1

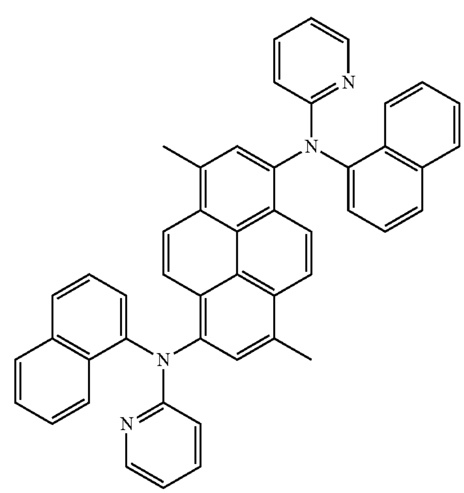

FD2

-continued
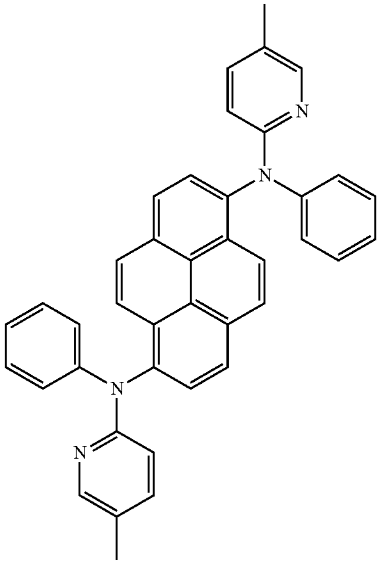
FD3
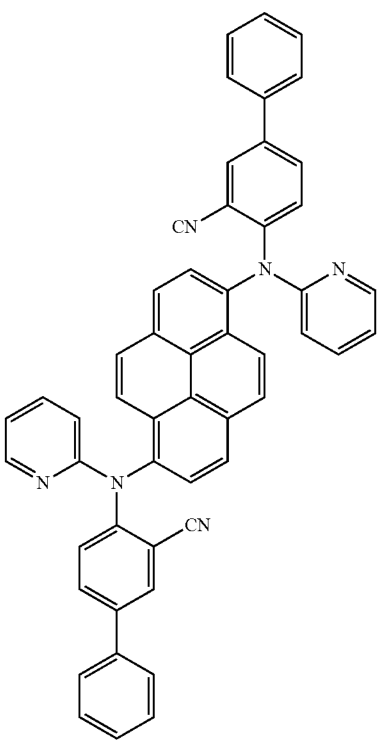
FD4
-continued
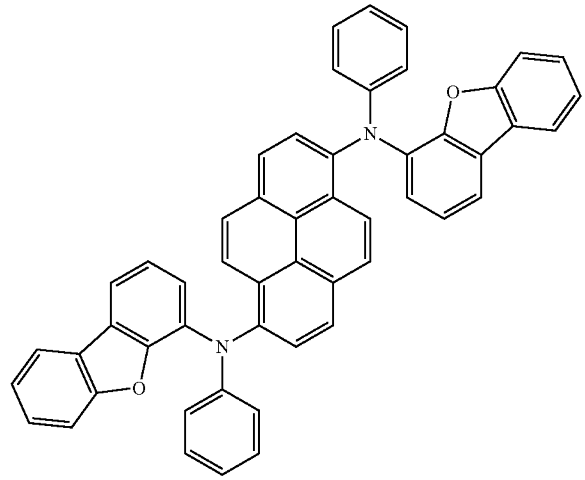
FD5
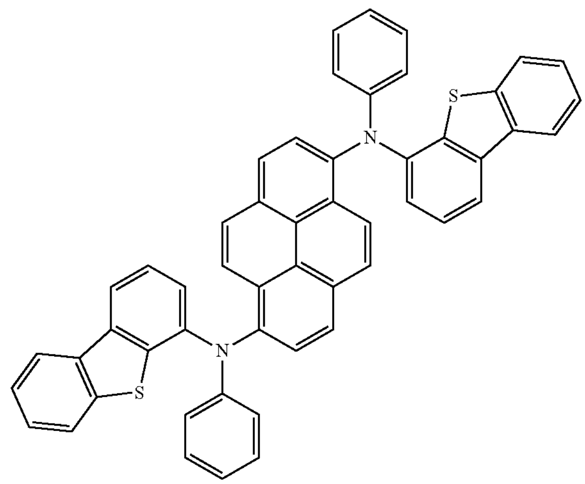
FD6
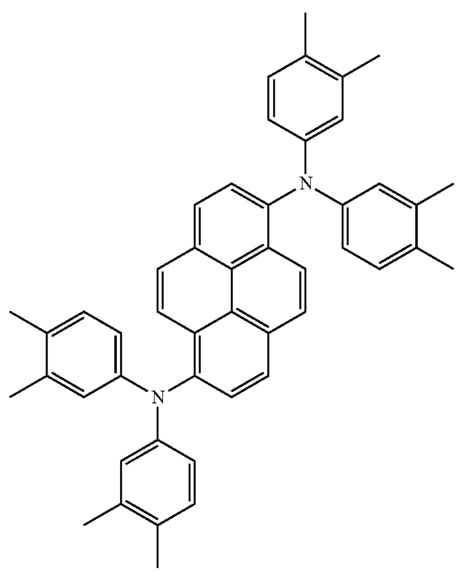
FD7

-continued
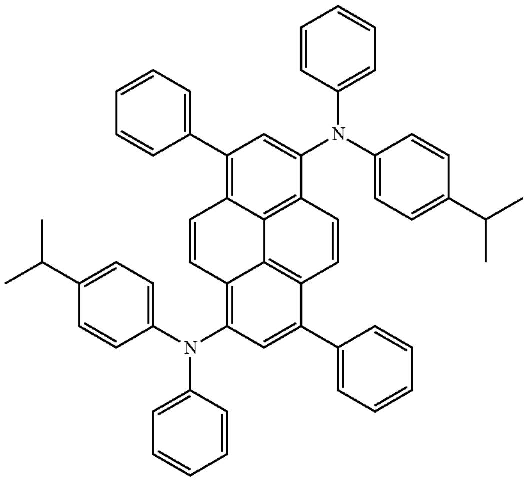
FD8
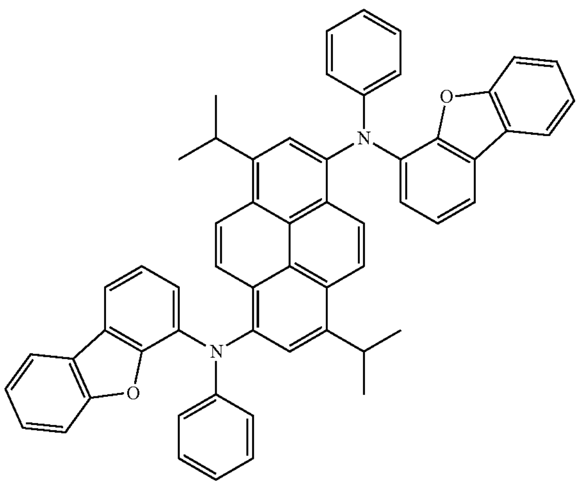
FD9
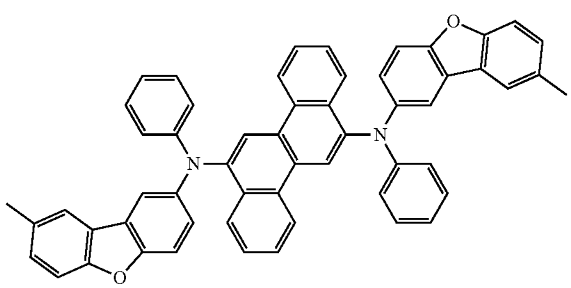
FD10
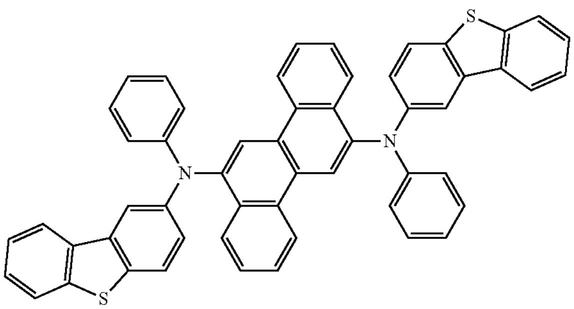
FD11
-continued
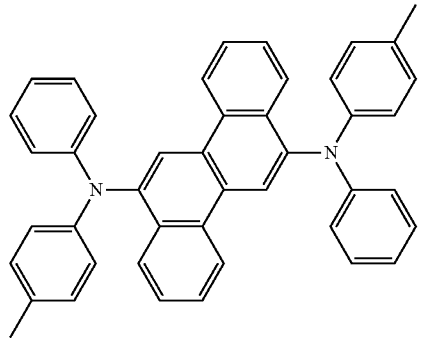
FD12
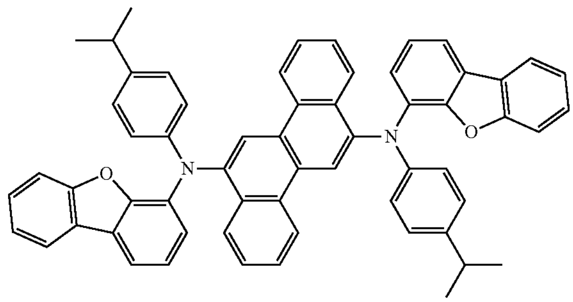
FD13
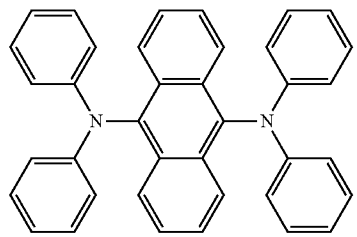
FD14
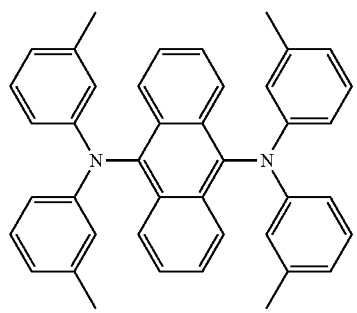
FD15
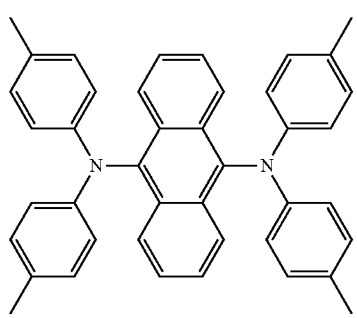
FD16

-continued
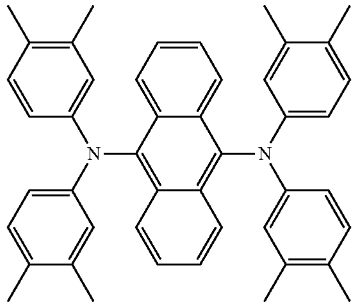
FD17
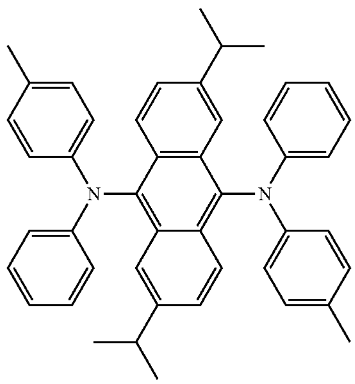
FD18
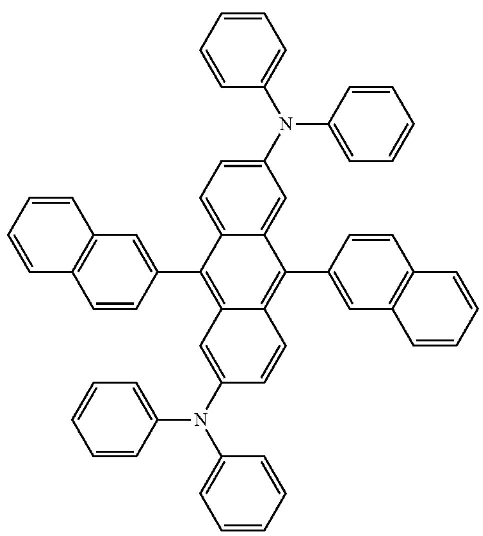
FD19
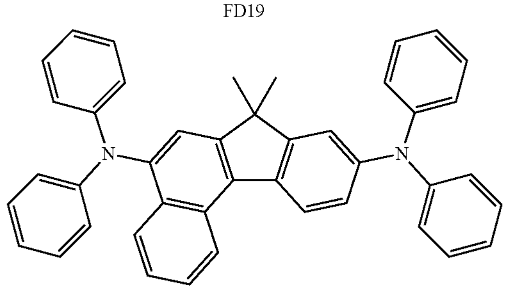
FD20
-continued
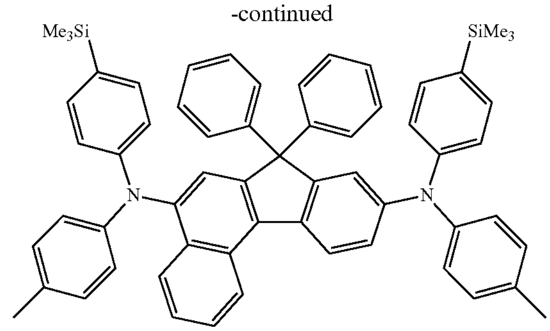
FD21
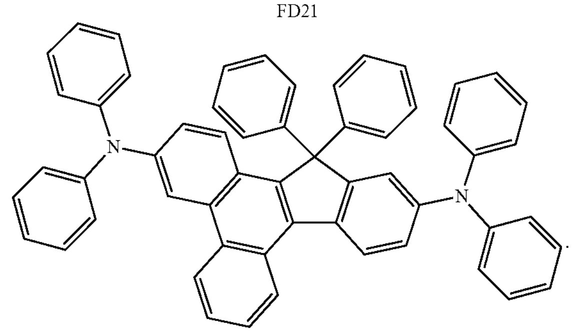
FD22
In various embodiments, the fluorescent dopant may be selected from compounds illustrated below.
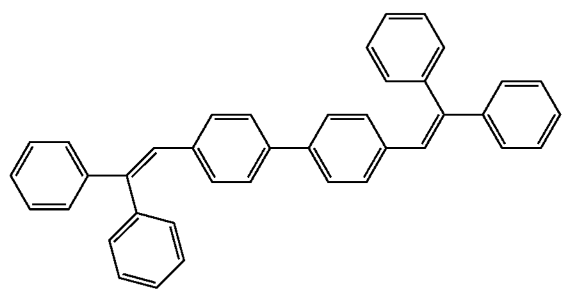
DPVBi
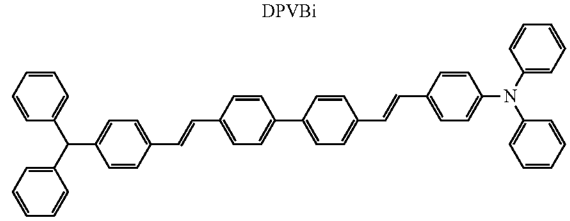
DPAVBi
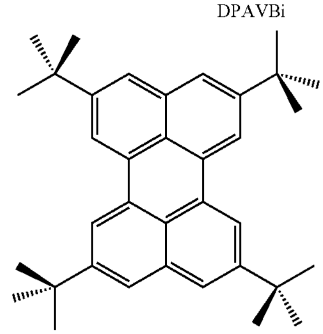
TBPe -continued

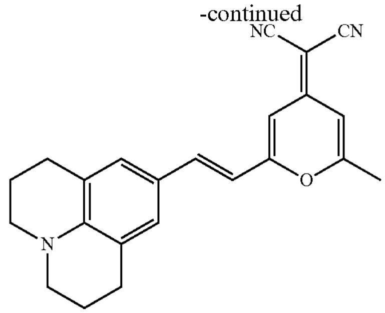

DCM

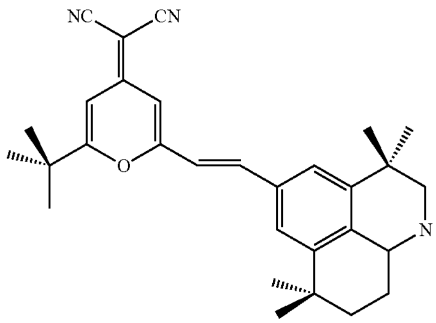

DCJTB

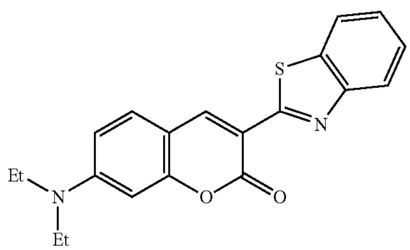

Coumarin 6

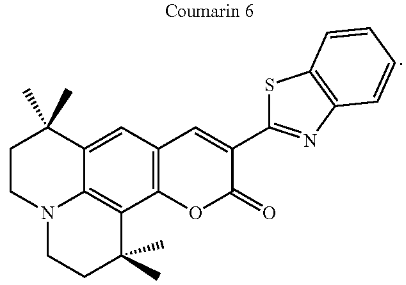

C545T

[Electron Transport Region in Organic Layer 150]

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include at least one selected from a buffer layer, a hole blocking layer, an electron control layer, an electron transport layer, and an electron injection layer.

For example, the electron transport region may have a structure of electron transport layer/electron injection layer, a structure of hole blocking layer/electron transport layer/electron injection layer, a structure of electron control layer/electron transport layer/electron injection layer, or a structure of buffer layer/electron transport layer/electron injection layer, wherein, in each of these structures, constituting layers are sequentially stacked in this stated order from an emission layer.

The electron transport region may include the second compound according to an embodiment as described above.

In various embodiments, the electron transport region may include a buffer layer, and the buffer layer may directly contact the emission layer, and the buffer layer may include the second compound according to an embodiment as described above.

In various embodiments, the electron transport region may include a buffer layer, an electron transport layer, and an electron injection layer, which are stacked in this stated order on the emission layer, and the buffer layer may include the second compound as described above.

The electron transport region (e.g., a hole blocking layer, an electron control layer, or an electron transport layer in the electron transport region) may include a metal-free compound containing at least one nt electron-depleted nitrogen-containing ring.

The "π electron-depleted nitrogen-containing ring" indicates a $C_1$-$C_{60}$ heterocyclic group having at least one *—N=*' moiety as a ring-forming moiety.

For example, the "π electron-depleted nitrogen-containing ring" may be i) a 5-membered to 7-membered hetero monocyclic group having at least one *—N=*' moiety, ii) a heteropoly cyclic group in which two or more 5-membered to 7-membered hetero monocyclic groups each having at least one *—N=*' moiety are condensed with each other, or iii) a heteropoly cyclic group in which at least one selected from 5-membered to 7-membered hetero monocyclic groups, each having at least one *—N=*' moiety, is condensed with at least one $C_5$-$C_{60}$ carbocyclic group.

Examples of the it electron-depleted nitrogen-containing ring are an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzoimidazole, an isobenzothiazole, a benzoxazole, an isobenzoxazole, a triazole, a tetrazole, an oxadiazole, a triazine, thiadiazol, an imidazopyridine, an imidazopyrimidine, and an azacarbazole.

For example, the electron transport region may include a compound represented by Formula 601:

$$[Ar_{601}]_{xe11}\text{-}[(L_{601})_{xe1}\text{-}R_{601}]_{xe21}. \quad \text{<Formula 601>}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer selected from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and $xe_{21}$ may be an integer selected from 1 to 5.

In various embodiments, at least one selected from $Ar_{601}$(s) in the number of xe11 and/or at least one selected from $R_{601}$(s) in the number of xe21 may include the π electron-depleted nitrogen-containing ring.

In various embodiments, ring $Ar_{601}$ in Formula 601 may be selected from a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, naphthyridine group, a quinoxaline group, a quinazoline group, a cinnoline group, a phenanthridine group, an acridine group, a phenanthroline group, a phenazine group, a benzoimidazole group, an iso-benzothiazole group, a benzoxazole group, an isobenzoxazole group, a triazole group, a tetrazole group, an oxadiazole group, a triazine group, a thiadiazol group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, naphthyridine group, a quinoxaline group, a quinazoline group, a cinnoline group, a phenanthridine group, an acridine group, a phenanthroline group, a phenazine group, a benzoimidazole group, an iso-benzothiazole group, a benzoxazole group, an isobenzoxazole group, a triazole group, a tetrazole group, an oxadiazole group, a triazine group, a thiadiazol group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is two or more, two or more $Ar_{601}$(s) may be linked to each other via a single bond.

In various embodiments, $Ar_{601}$ in Formula 601 may be an anthracene group.

In various embodiments, a compound represented by Formula 601 may be represented by Formula 601-1:

<Formula 601-1>

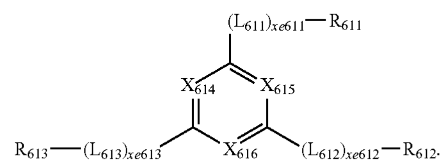

In Formula 601-1, $X_{614}$ may be N or C($R_{614}$), $X_{615}$ may be N or C($R_{615}$), $X_{616}$ may be N or C($R_{616}$), and at least one selected from $X_{614}$ to $X_{616}$ may be N, $L_{611}$ to $L_{613}$ may each independently be substantially the same as described in connection with $L_{601}$, xe611 to xe613 may each independently be substantially the same as described in connection with xe1, $R_{611}$ to $R_{613}$ may each independently be substantially the same as described in connection with $R_{601}$, $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In various embodiments, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzoimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzoimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group.

In various embodiments, xe1 and xe611 to xe613 in Formulae 601 and 601-1 may each independently be 0, 1, or 2.

In various embodiments, $R_{601}$ and $R_{611}$ to $R_{613}$ in Formulae 601 and 601-1 may each independently be selected from a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and —P(=O)(Q$_{601}$)(Q$_{602}$), wherein Q$_{601}$ and Q$_{602}$ are substantially the same as described above.

The electron transport region may include at least one compound selected from Compounds ET1 to ET36.

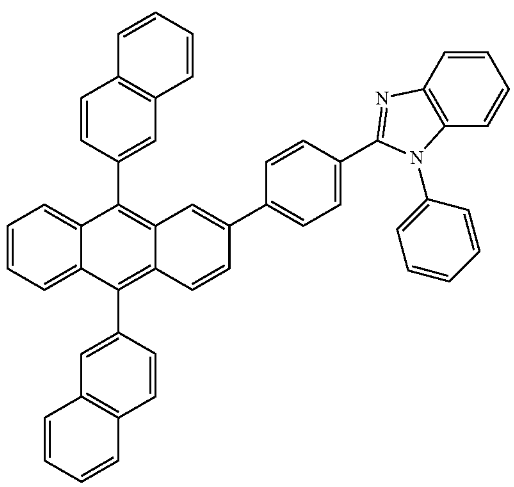

ET1

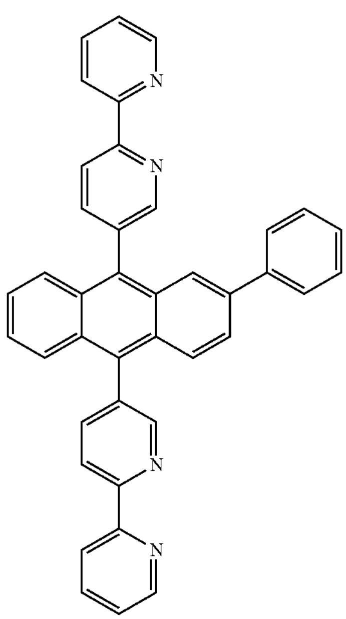

ET2

-continued

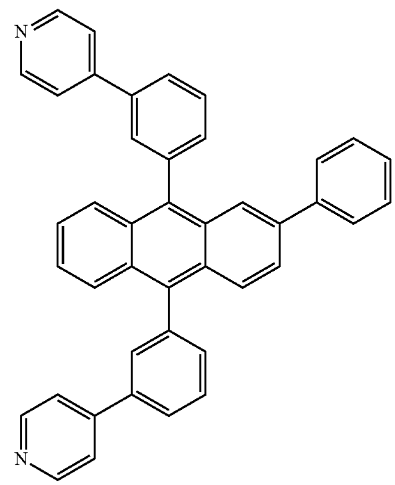

ET3

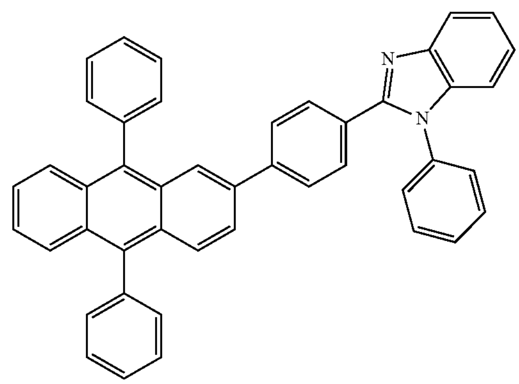

ET4

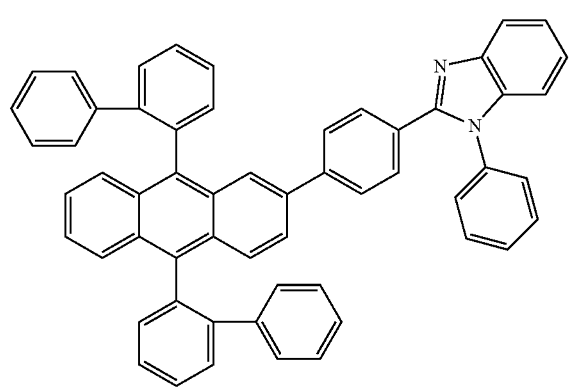

ET5

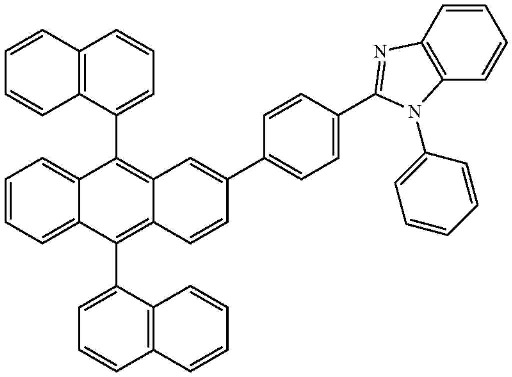
ET6
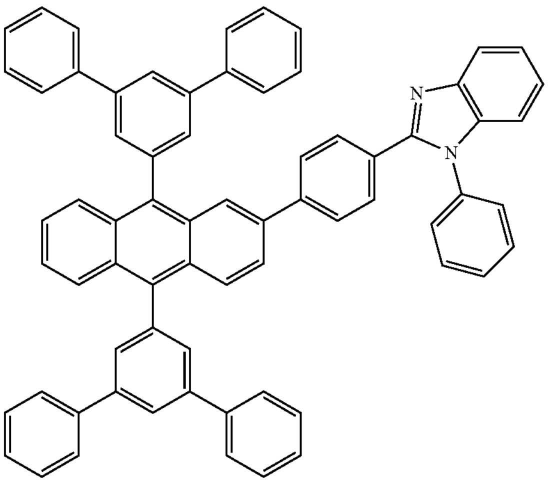
ET7
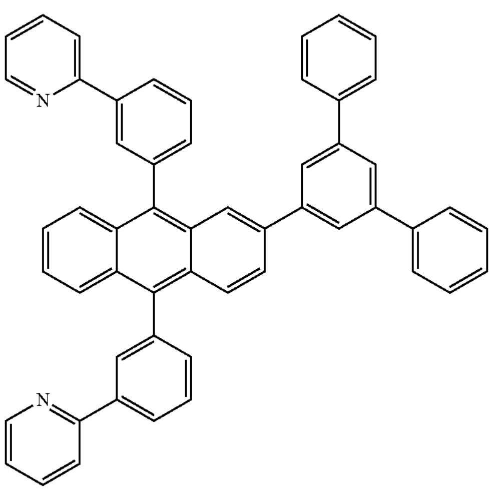
ET8
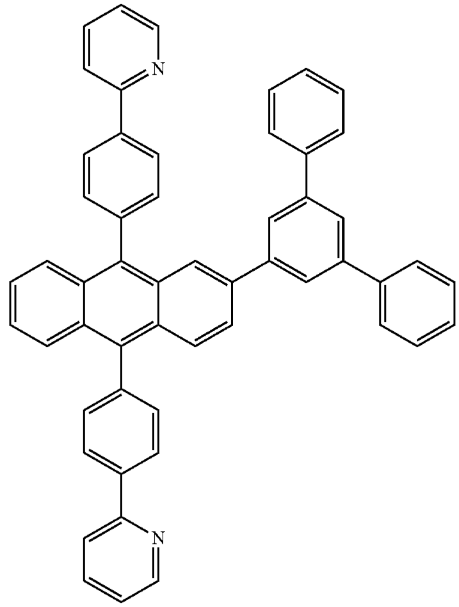
ET9
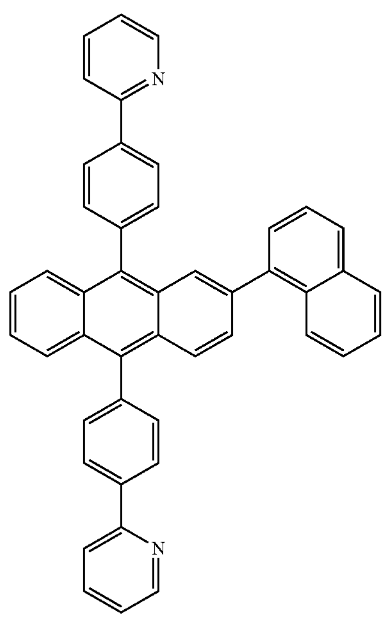
ET10

-continued
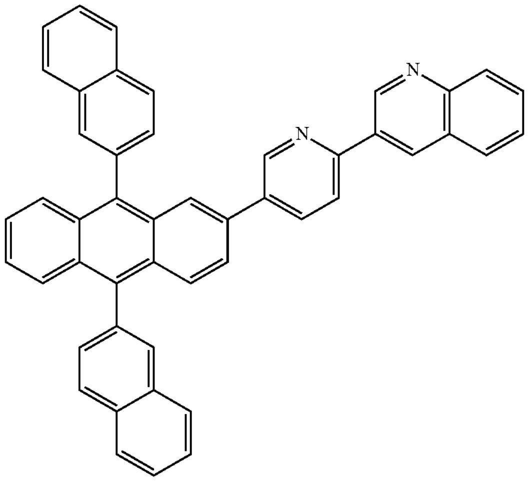
ET11
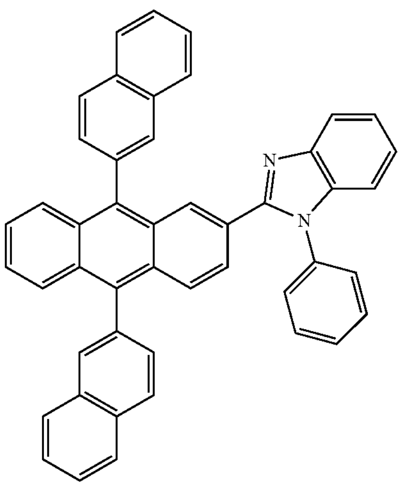
ET12
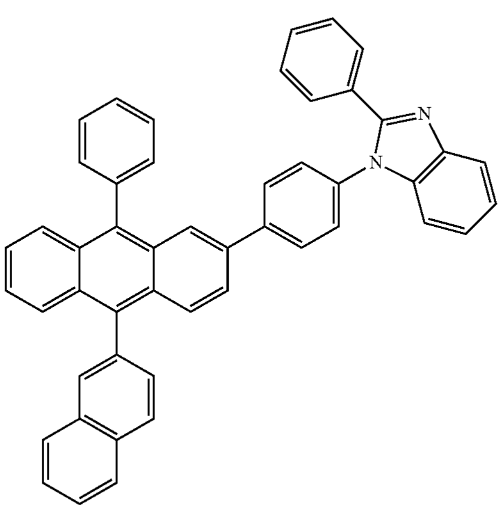
ET13
-continued
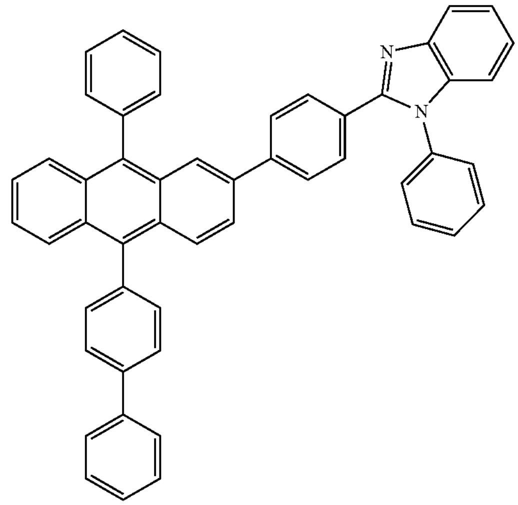
ET14
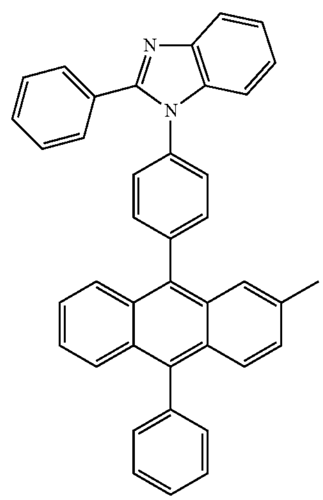
ET15
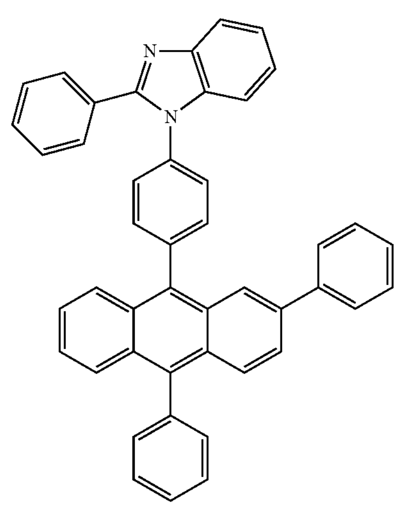
ET16

-continued
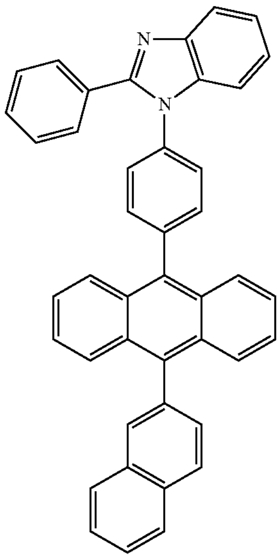
ET17
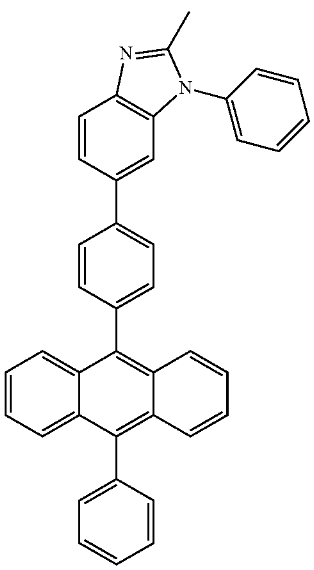
ET18
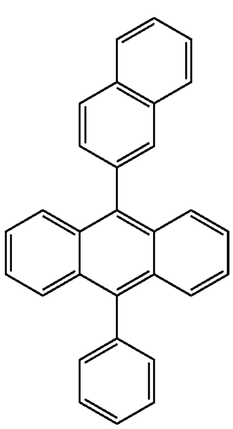
ET19
-continued
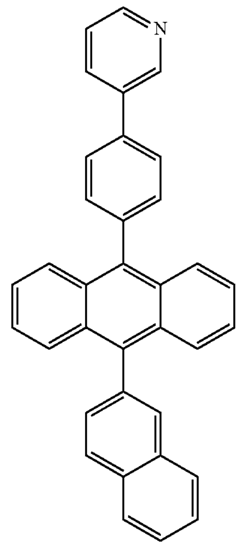
ET20
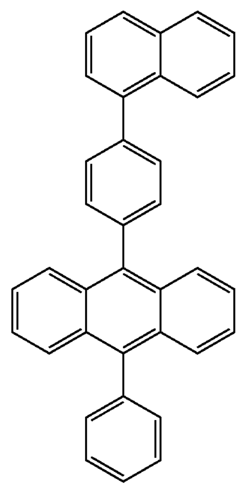
ET21
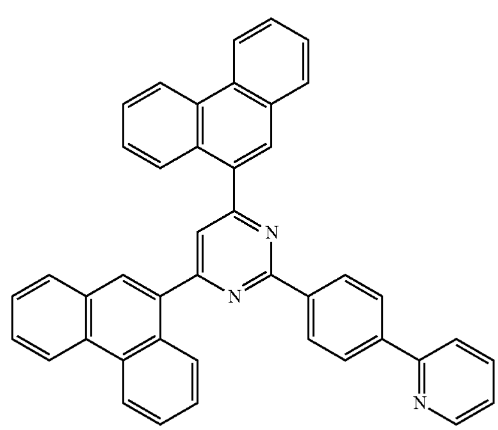
ET22

-continued
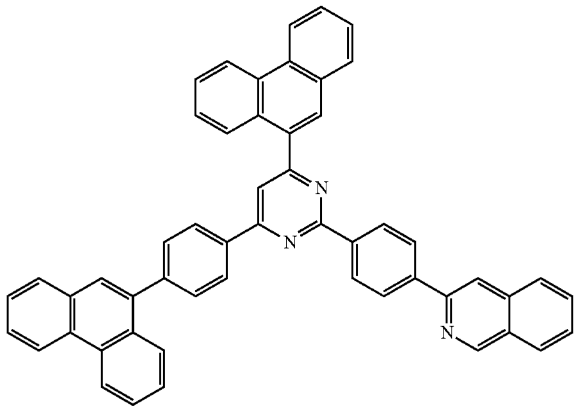
ET23
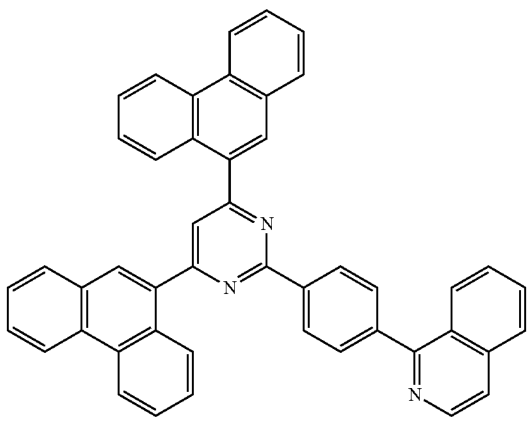
ET24
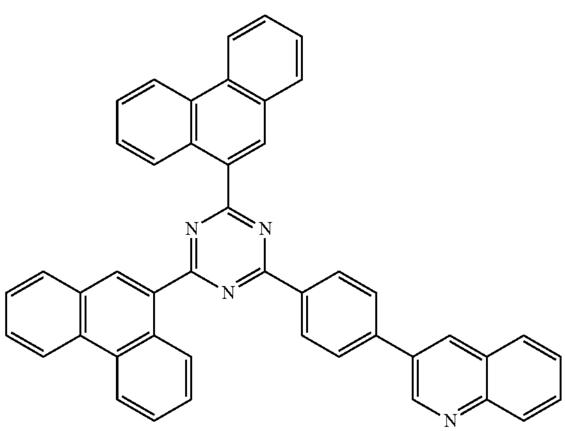
ET25
-continued
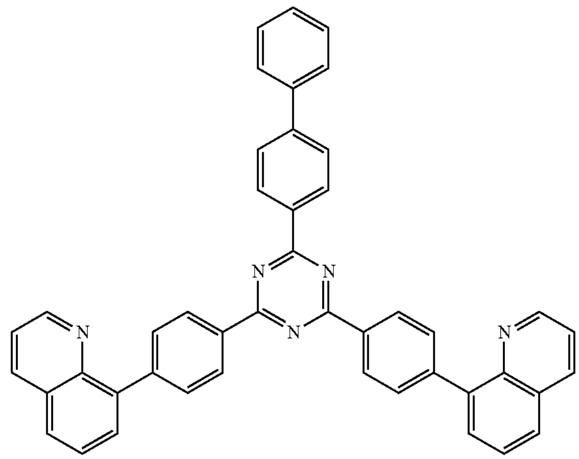
ET26
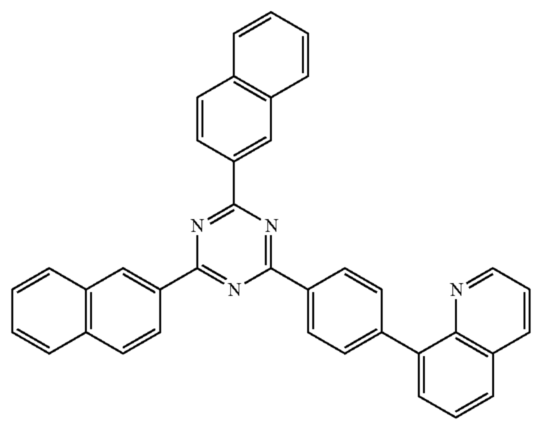
ET27
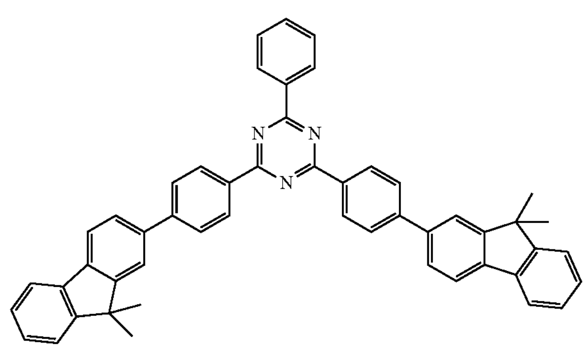
ET28

-continued
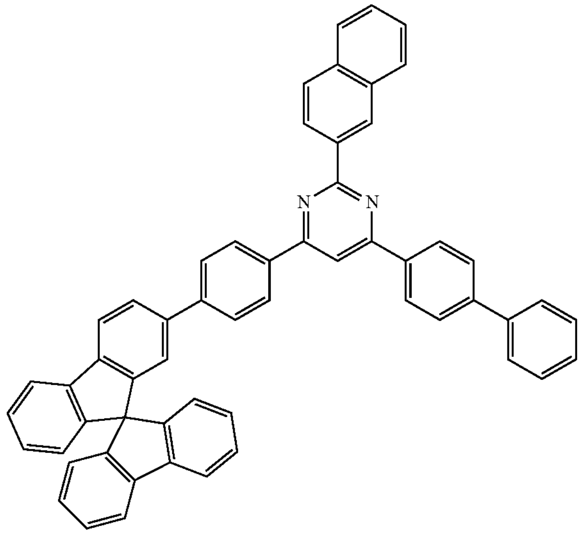
ET29
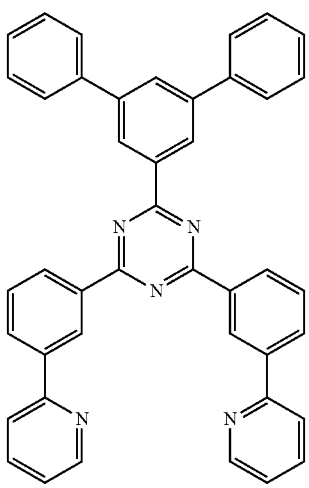
ET30
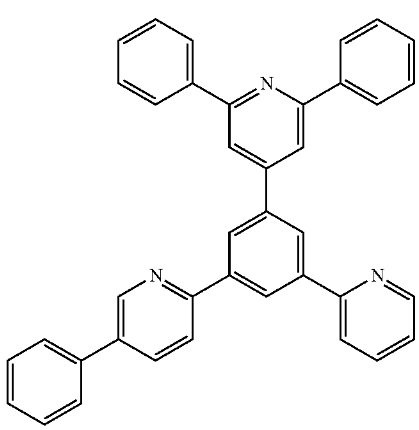
ET31
-continued
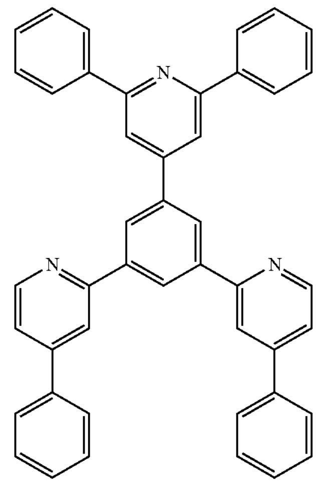
ET32
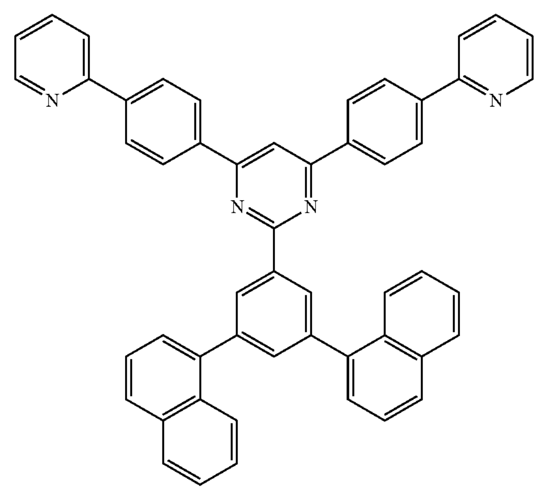
ET33
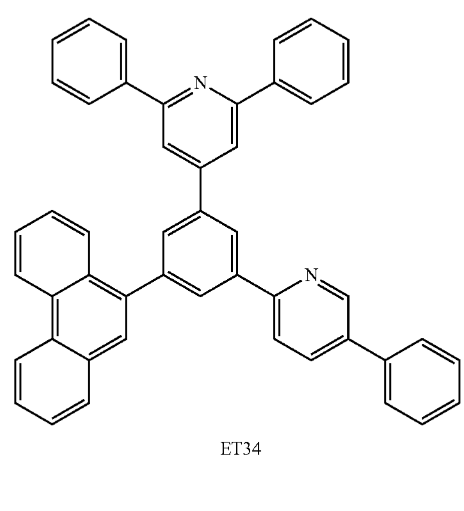
ET34

-continued

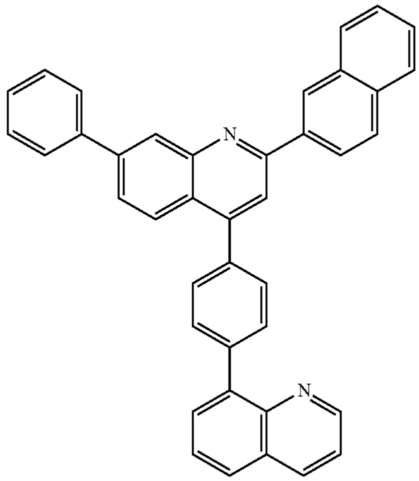

ET35

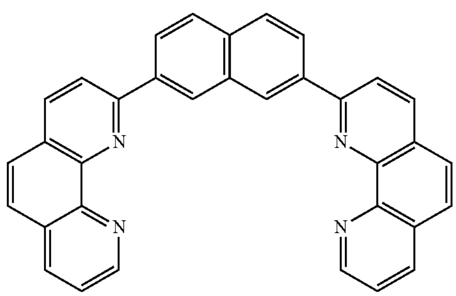

ET36

In various embodiments, the electron transport region may include at least one selected from 2,9-dimethyl-4,7-diphenyl-1,10-phenanthroline (BCP), 4,7-dphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), and NTAZ.

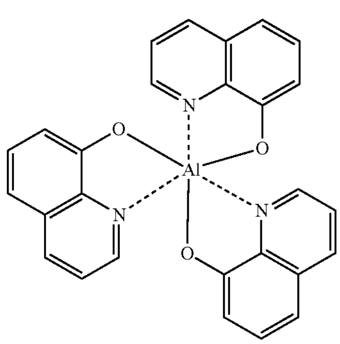

$Alq_3$

-continued

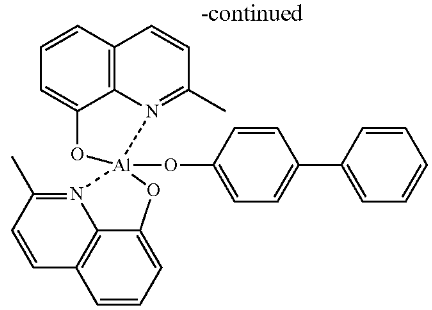

Balq

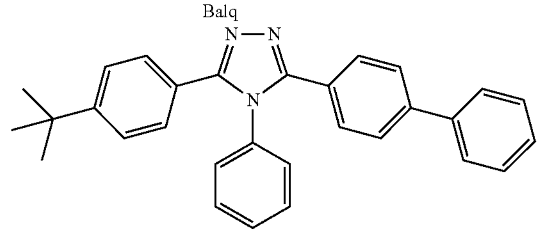

TAZ

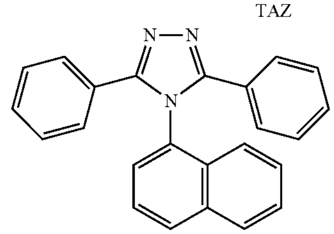

NTAZ

The thickness of the buffer layer, the hole blocking layer, or the electron control layer may each independently be in a range of about 20 Å to about 1,000 Å, for example, about 30 Å to about 300 Å. When the thicknesses of the buffer layer, the hole blocking layer, and the electron control layer are within these ranges, the electron blocking layer may have excellent electron blocking characteristics or electron control characteristics without a substantial increase in driving voltage.

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

The electron transport region (e.g., the electron transport layer in the electron transport region) may further include, in addition to the materials described above, a metal-containing material.

The metal-containing material may include at least one selected from an alkaline metal complex and an alkaline earth-metal complex. The alkaline metal complex may include a metal ion selected from an Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkaline metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenylan oxazole, a hydroxy phenylthiazole, a hydroxy diphenylan oxadiazole, a hydroxy diphenylthiadiazol, a hydroxy phenylpyridine, a hydroxy phenylbenzoimidazole, a hydroxy phenylbenzothiazole, a bipyridine, a phenanthroline, and a cyclopentadiene.

For example, the metal-containing material may include a Li complex. The Li complex may include, for example, Compound ET-D1 (lithium quinolate, LiQ) or ET-D2.

ET-D1

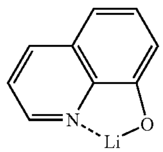

ET-D2

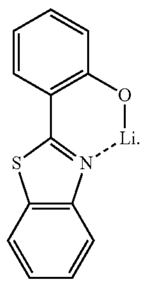

The electron transport region may include an electron injection layer that facilitates injection of electrons from the second electrode 190. The electron injection layer may directly contact the second electrode 190.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkaline metal, an alkaline earth metal, a rare-earth metal, an alkaline metal compound, an alkaline earth-metal compound, a rare-earth metal compound, an alkaline metal complex, an alkaline earth-metal complex, a rare-earth metal complex, or any combinations thereof.

In various embodiments, the electron injection layer may include Li, Na, K, Rb, Cs, Mg, Ca, Er, Tm, Yb, or any combination thereof.

The alkaline metal may be selected from Li, Na, K, Rb, and Cs. In various embodiments, the alkaline metal may be Li, Na, or Cs. In various embodiments, the alkaline metal may be Li or Cs.

The alkaline earth metal may be selected from Mg, Ca, Sr, and Ba.

The rare-earth metal may be selected from Sc, Y, Ce, Yb, Gd, and Tb.

The alkaline metal compound, the alkaline earth-metal compound, and the rare-earth metal compound may be selected from oxides and halides (for example, fluorides, chlorides, bromides, or iodines) of the alkaline metal, the alkaline earth-metal and the rare-earth metal.

The alkaline metal compound may be selected from alkaline metal oxides, such as $Li_2O$, $Cs_2O$, or $K_2O$, and alkaline metal halides, such as LiF, NaF, CsF, KF, LiI, NaI, CsI, RbI, or KI. In various embodiments, the alkaline metal compound may be selected from LiF, $Li_2O$, NaF, LiI, NaI, CsI, and KI.

The alkaline earth-metal compound may be selected from alkaline earth-metal compounds, such as BaO, SrO, CaO, $Ba_xSr_{1-x}O$ ($0<x<1$), or $Ba_xCa_{1-x}O$ ($0<x<1$). In various embodiments, the alkaline earth-metal compound may be selected from BaO, SrO, and CaO.

The rare-earth metal compound may be selected from $YbF_3$, $ScF_3$, $ScO_3$, $Y_2O_3$, $Ce_2O_3$, $GdF_3$, and $TbF_3$. In various embodiments, the rare-earth metal compound may be selected from $YbF_3$, $ScF_3$, $TbF_3$, $YbI_3$, $ScI_3$, and $TbI_3$.

The alkaline metal complex, the alkaline earth-metal complex, and the rare-earth metal complex may include an ion of alkaline metal, an alkaline earth-metal, and a rare-earth metal as described above, and a ligand coordinated with a metal ion of the alkaline metal complex, the alkaline earth-metal complex, and the rare-earth metal complex may each independently be selected from a hydroxy quinoline, a hydroxy isoquinoline, a hydroxy benzoquinoline, a hydroxy acridine, a hydroxy phenanthridine, a hydroxy phenylan oxazole, a hydroxy phenylthiazole, a hydroxy diphenylan oxadiazole, a hydroxy diphenylthiadiazol, a hydroxy a phenylpyridine, a hydroxy phenylbenzoimidazole, a hydroxy phenylbenzothiazole, a bipyridine, a phenanthroline, and a cyclopentadiene.

The electron injection layer may consist of an alkaline metal, an alkaline earth metal, a rare-earth-metal, an alkaline metal compound, an alkaline earth-metal compound, a rare-earth metal compound, an alkaline metal complex, an alkaline earth-metal complex, a rare-earth metal complex, or any combinations thereof, as described above. In various embodiments, the electron injection layer may further include an organic material. When the electron injection layer further includes an organic material, alkaline metal, alkaline earth metal, rare-earth-metal, alkaline metal compound, an alkaline earth-metal compound, a rare-earth metal compound, an alkaline metal complex, an alkaline earth-metal complex, a rare-earth metal complex, or any combinations thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage.

At least one layer selected from the electron transport layer and the electron injection layer may include an alkaline metal, an alkaline earth metal, a rare-earth-metal, an alkaline metal compound, an alkaline earth-metal compound, a rare-earth metal compound, an alkaline metal complex, an alkaline earth-metal complex, a rare-earth metal complex, or any combinations thereof.

[Second Electrode 190]

The second electrode 190 may be disposed on the organic layer 150 having such a structure. The second electrode 190 may be a cathode that is an electron injection electrode, and in this regard, a material for forming the second electrode 190 may be a material having a low work function, and such a material may be metal, alloy, an electrically conductive compound, or a combination thereof.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO. The second electrode 190 may be a transmissive electrode, a semi-transmissive electrode, or a reflective electrode.

The second electrode 190 may have a single-layered structure, or a multi-layered structure including two or more layers.

[Description of FIGS. 2 to 5]

Figure 2:
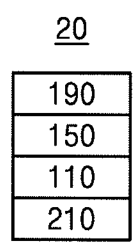
Figure 3:
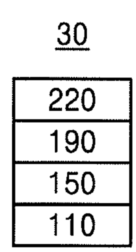
Figure 4:
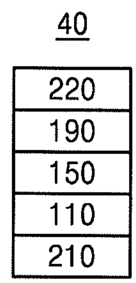

An organic light-emitting device 20 of FIG. 2 may include a first capping layer 210, a first electrode 110, an organic layer 150, and a second electrode 190 which are sequentially stacked in this stated order, an organic light-emitting device 30 of FIG. 3 may include a first electrode 110, an organic layer 150, a second electrode 190, and a second capping layer 220 which are sequentially stacked in this stated order, and an organic light-emitting device 40 of FIG. 4 may include a first capping layer 210, a first electrode 110, an organic layer 150, a second electrode 190, and a second capping layer 220.

Regarding FIGS. 2 to 4, the first electrode 110, the organic layer 150, and the second electrode 190 may be understood by referring to the description presented in connection with FIG. 1.

In the organic layer 150 of each of the organic light-emitting devices 20 and 40, light generated in an emission layer may pass through the first electrode 110, which is a semi-transmissive electrode or a transmissive electrode, and the first capping layer 210 toward the outside, and in the organic layer 150 of each of the organic light-emitting devices 30 and 40, light generated in an emission layer may pass through the second electrode 190, which is a semi-transmissive electrode or a transmissive electrode, and the second capping layer 220 toward the outside.

The first capping layer 210 and the second capping layer 220 may increase external luminescent efficiency according to the principle of constructive interference.

The first capping layer 210 and the second capping layer 220 may each independently be a capping layer including an organic material, an inorganic capping layer including an inorganic material, or a composite capping layer including an organic material and an inorganic material.

At least one selected from the first capping layer 210 and the second capping layer 220 may each independently include at least one material selected from carbocyclic compounds, heterocyclic compounds, amine-based compounds, porphine derivatives, phthalocyanine derivatives, naphthalocyanine derivatives, alkaline metal complexes, and alkaline earth-based complexes. The carbocyclic compound, the heterocyclic compound, and the amine-based compound may be optionally substituted with a substituent containing at least one element selected from O, N, S, Se, Si, F, Cl, Br, and I. In various embodiments, at least one selected from the first capping layer 210 and the second capping layer 220 may each independently include an amine-based compound.

In various embodiments, at least one selected from the first capping layer 210 and the second capping layer 220 may each independently include the compound represented by Formula 201 or the compound represented by Formula 202.

In various embodiments, at least one selected from the first capping layer 210 and the second capping layer 220 may each independently include a compound selected from Compounds HT28 to HT33 and Compounds CP1 to CP5.

CP1

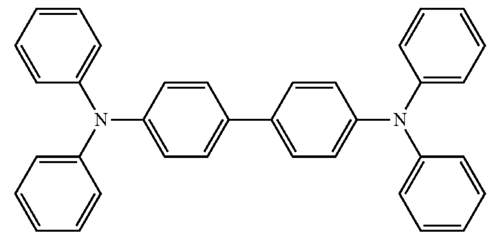

CP2

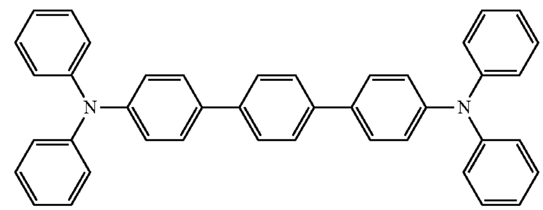

CP3

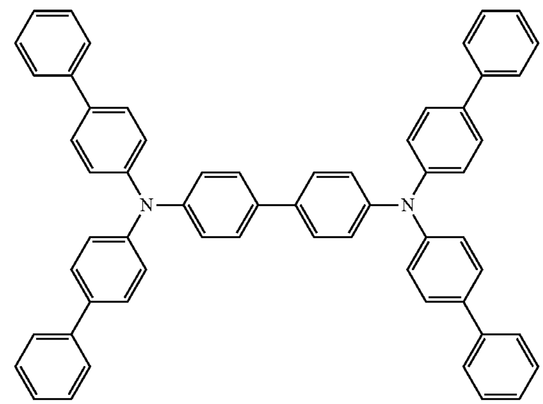

CP4

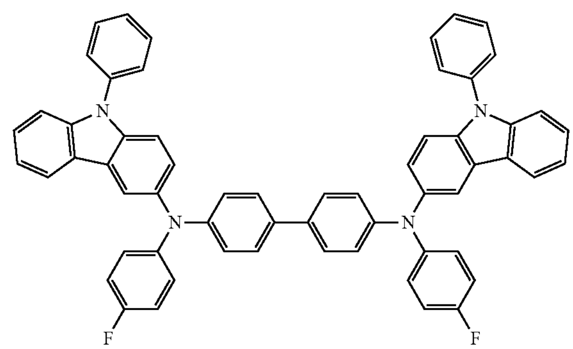

CP5

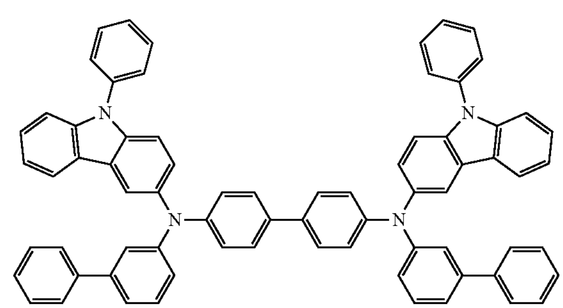

Figure 5:
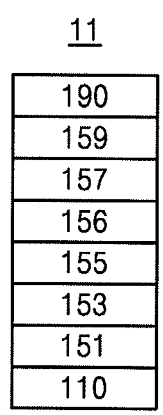

FIG. 5 illustrates a schematic view of an organic light-emitting device 11 according to an embodiment. The organic light-emitting device 11 may include a first electrode 110, a hole transport layer 151, an emission auxiliary layer 153, an emission layer 155, a buffer layer 156, an electron transport layer 157, an electron injection layer 159, and a second electrode 190, which are sequentially stacked in this stated order.

Respective layers constituting the organic light-emitting device 11 of FIG. 5 may be understood by referring to corresponding descriptions above.

Hereinbefore, the organic light-emitting device according to an embodiment has been described in connection with FIGS. 1 to 5.

Layers constituting the hole transport region, an emission layer, and layers constituting the electron transport region may be formed in a certain region by using one or more suitable methods selected from vacuum deposition, spin coating, casting, langmuir-blodgett (LB) deposition, ink-jet printing, laser-printing, and laser-induced thermal imaging.

When the respective layers of the hole transport region, the emission layer, and the respective layers of the electron transport region are formed by deposition, the deposition may be performed at a deposition temperature of about 100° C. to about 500° C., at a vacuum degree of about $10^{-8}$ torr to about $10^{-3}$ torr, and at a deposition rate of about 0.01 Å/sec to about 100 Å/sec by taking into account a material for forming a layer to be deposited and the structure of a layer to be formed.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to about 200° C. by taking into account a material to be included in a layer to be formed and the structure of a layer to be formed.

[General Definition of Substituents]

The term "$C_1$-$C_{60}$ alkyl group," as used herein, refers to a linear or branched aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group," as used herein, refers to a divalent group having the same structure as the $C_1$-$C_{60}$ alkyl group.

The term "$C_2$-$C_{60}$ alkenyl group," as used herein, refers to a hydrocarbon group formed by substituting at least one carbon-carbon double bond in the middle or at the terminal of the $C_2$-$C_{60}$ alkyl group, and non-limiting examples thereof include an ethenyl group, a propenyl group, and a butenyl group. The term "$C_2$-$C_{60}$ alkylene group," as used herein, refers to a divalent group having the same structure as the $C_2$-$C_{60}$ alkyl group.

The term "$C_2$-$C_{60}$ alkynyl group," as used herein, refers to a hydrocarbon group formed by substituting at least one carbon trip bond in the middle or at the terminal of the $C_2$-$C_{60}$ alkyl group, and non-limiting examples thereof include an ethynyl group and a propynyl group. The term "$C_2$-$C_{60}$ alkylene group," as used herein, refers to a divalent group having the same structure as the $C_2$-$C_{60}$ alkyl group.

The term "$C_1$-$C_{60}$ alkoxy group," as used herein, refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_3$-$C_{10}$ cycloalkyl group," as used herein, refers to a monovalent hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group," as used herein, refers to a divalent group having the same structure as the $C_3$-$C_{10}$ cycloalkyl group.

The term "$C_1$-$C_{10}$ heterocycloalkyl group," as used herein, refers to a monovalent saturated monocyclic group having at least one heteroatom selected from N, O, Si, P, and S as a ring-forming atom and 1 to 10 carbon atoms, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group," as used herein, refers to a divalent group having the same structure as the $C_1$-$C_{10}$ heterocycloalkyl group.

The term "$C_3$-$C_{10}$ cycloalkenyl group," as used herein, refers to a monovalent monocyclic group that has 3 to 10 carbon atoms and at least one double bond in the ring thereof and does not have aromaticity, and non-limiting examples thereof include a cyclopentenyl group, a cyclohexenyl group, and a cycloheptenyl group. The term "$C_3$-$C_{10}$ cycloalkenylene group," as used herein, refers to a divalent group having the same structure as the $C_3$-$C_{10}$ cycloalkenyl group.

The term "$C_1$-$C_{10}$ heterocycloalkenyl group," as used herein, refers to a monovalent monocyclic group that has at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group are a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group," as used herein, refers to a divalent group having the same structure as the $C_1$-$C_{10}$ heterocycloalkenyl group.

The term "$C_6$-$C_{60}$ aryl group," as used herein, refers to a monovalent group having a carbocyclic aromatic system having 6 to 60 carbon atoms, and the term "$C_6$-$C_{60}$ arylene group," as used herein, refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group," as used herein, refers to a monovalent group having a heterocyclic aromatic system that has at least one heteroatom selected from N, O, Si, P, and S as a ring-forming atom, and 1 to 60 carbon atoms. The term "$C_1$-$C_{60}$ heteroarylene group," as used herein, refers to a divalent group having a heterocyclic aromatic system that has at least one heteroatom selected from N, O, Si, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group," as used herein, refers to —$OA_{102}$ (wherein $A_{102}$ is the $C_6$-$C_{60}$ aryl group), and a $C_6$-$C_{60}$ arylthio group used herein indicates —$SA_{103}$ (wherein $A_{103}$ is the $C_6$-$C_{60}$ aryl group).

The term "monovalent non-aromatic condensed polycyclic group," as used herein, refers to a monovalent group (for example, having 8 to 60 carbon atoms) that has two or more rings condensed with each other, only carbon atoms as a ring-forming atom, and non-aromaticity in the entire molecular structure. A detailed example of the monovalent non-aromatic condensed polycyclic group is a fluorenyl group. The term "divalent non-aromatic condensed polycyclic group," used herein, refers to a divalent group having the same structure as the monovalent non-aromatic condensed polycyclic group.

The term "monovalent non-aromatic condensed heteropolycyclic group," as used herein, refers to a monovalent group (for example, having 1 to 60 carbon atoms) that has two or more rings condensed to each other, has at least one heteroatom selected from N, O, Si, P, and S, other than carbon atoms, as a ring-forming atom, and has non-aromaticity in the entire molecular structure. An example of the monovalent non-aromatic condensed heteropolycyclic group is a carbazolyl group. The term "divalent non-aromatic condensed heteropolycyclic group," used herein, refers to a divalent group having the same structure as the monovalent non-aromatic condensed heteropolycyclic group.

The term "$C_5$-$C_{60}$ carbocyclic group," as used herein, refers to a monocyclic or polycyclic group having 5 to 60 carbon atoms in which a ring-forming atom is a carbon atom only. The term "$C_5$-$C_{60}$ carbocyclic group," as used herein refers to an aromatic carbocyclic group or a non-aromatic carbocyclic group. The term "$C_5$-$C_{60}$ carbocyclic group," as used herein, refers to a ring, such as a benzene, a monovalent group, such as a phenyl group, or a divalent group, such as a phenylene group. In various embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group," as used herein, refers to a group having the same structure as the $C_1$-$C_{60}$ carbocyclic group, except that as a ring-forming atom, at least one heteroatom selected from N, O, Si, P, and S is used in addition to carbon (the number of carbon atoms may be in a range of 1 to 60).

At least one substituent selected from the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, and —$P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, and —$P(=O)(Q_{21})(Q_{22})$; and —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted with a $C_1$-$C_{60}$ alkyl group, a $C_1$-$C_{60}$ heteroaryl group substituted with a $C_6$-$C_{60}$ aryl group, a monovalent non-aromatic condensed polycyclic group, and a monovalent non-aromatic condensed heteropolycyclic group.

The term "Ph", as used herein, may refer to a phenyl group; the term "Me", as used herein, may refer to a methyl group; the term "Et", as used herein, may refer to an ethyl group; the terms "ter-Bu" or "But", as used herein, may refer to a tert-butyl group; and the term "OMe," as used herein refers to a methoxy group.

The "biphenyl group" used therein refers to "a phenyl group substituted with a phenyl group." The "biphenyl group" belongs to "a substituted phenyl group" having "a $C_6$-$C_{60}$ aryl group" as a substituent.

The "terphenyl group" used herein refers to "a phenyl group substituted with a biphenyl group." The "terphenyl group" belongs to "a substituted phenyl group" having "a $C_6$-$C_{60}$ aryl group substituted with a $C_6$-$C_{60}$ aryl group."

Symbols * and *' used herein, unless defined otherwise, refer to a binding site to a neighboring atom in a corresponding formula.

Hereinafter, a compound according to embodiments and an organic light-emitting device according to embodiments will be described in detail with reference to Synthesis Examples and Examples. The wording "B was used instead of A" used in describing Synthesis Examples means that a molar equivalent of A was identical to a molar equivalent of B.

EXAMPLE

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1-1: Manufacture of Red Organic Light-Emitting Device

An anode was prepared by cutting an ITO glass substrate (manufactured by Corning), having a thickness of 1,200 Å and sheet resistance of 15 Ω/cm$^2$, to a size of 50 mm×50 mm×0.5 mm, ultrasonically cleaning the ITO glass substrate using isopropyl alcohol and pure water each for 15 minutes, and then, exposing the ITO glass substrate to UV light irradiation for 30 minutes and ozone to clean the ITO glass substrate. Then, the ITO glass substrate was loaded into a vacuum deposition apparatus.

m-MTDATA was vacuum-deposited on the ITO glass substrate (anode) to a thickness of 700 Å to form a hole transport layer. Then, TCTA was vacuum deposited on the hole transport layer to a thickness of 100 Å to form an emission auxiliary layer.

Compound 1-1 (as a host) and PD11 (as a dopant) were co-deposited on the emission auxiliary layer at a weight ratio of 98:2 to form an emission layer having a thickness of 300 Å.

Compound 2-9 was deposited on the emission layer to form a buffer layer having a thickness of 100 Å, and then, $Alq_3$ was vacuum deposited on the buffer layer to form an electron transport layer having a thickness of 200 Å. LiF was deposited on the electron transport layer to form an electron injection layer having a thickness of 10 Å.

Al was deposited on the electron injection layer to form a cathode having a thickness of 2,000 Å, thereby completing the manufacture of an organic light-emitting device.

Examples 1-2 to 1-10 and Comparative Examples 1-1 to 1-3

Organic light-emitting devices were manufactured in the same manner as in Example 1-1, except that compounds shown in Table 5 were used in forming an emission layer and a buffer layer.

Evaluation Example 1

The driving voltage and efficiency of the organic light-emitting devices of Examples 1-1 to 1-10 and Comparative Examples 1-1 to 1-3 were evaluated at 5 mA/cm$^2$ by using a Keithley SMU 236 meter. Results thereof are shown in Table 5.

TABLE 5

| | Emission layer (host) | Buffer layer | Driving voltage (V) | Efficiency (cd/A) |
|---|---|---|---|---|
| Example 1-1 | Compound 1-1 | Compound 2-9 | 5.3 | 23.9 |
| Example 1-2 | Compound 1-6 | Compound 2-48 | 5.4 | 24.5 |
| Example 1-3 | Compound 1-124 | Compound 2-147a | 5.2 | 23.7 |
| Example 1-4 | Compound 1-97 | Compound 2-143a | 5.3 | 24.1 |
| Example 1-5 | Compound 1-41 | Compound 2-48 | 5.5 | 23.8 |
| Example 1-6 | Compound 1-19 | Compound 2-93 | 5.5 | 24.5 |
| Example 1-7 | Compound 1-57 | Compound 2-153 | 5.3 | 25.3 |
| Example 1-8 | Compound 1-64 | Compound 2-165 | 5.3 | 25.1 |
| Example 1-9 | Compound 1-126 | Compound 2-189 | 5.4 | 24.0 |
| Example 1-10 | Compound 1-137 | Compound 2-211 | 5.2 | 24.7 |
| Comparative Example 1-1 | CBP | Compound 2-9 | 5.9 | 22.3 |
| Comparative Example 1-2 | Compound 1-1 | BAlq | 5.8 | 22.7 |
| Comparative Example 1-3 | CBP | BAlq | 6.2 | 21.6 |

Referring to Table 5, it may be seen that the organic light-emitting devices of Examples 1-1 to 1-10 had a low driving voltage and high efficiency, compared to those of the organic light-emitting devices of Comparative Examples 1-1 to 1-3.

Example 2-1: Manufacture of Green (Phosphorescent) Organic Light-Emitting Device An anode was prepared by cutting an ITO glass substrate (manufactured by Corning), having a thickness of 1,200 Å and sheet resistance of 15 Ω/cm$^2$, to a size of 50 mm×50 mm×0.5 mm, ultrasonically cleaning the ITO glass substrate using isopropyl alcohol and pure water each for 15 minutes, and then, exposing to irradiation of UV light for 30 minutes and ozone to clean. Then, the ITO glass substrate was loaded into a vacuum deposition apparatus.

m-MTDATA was vacuum deposited on the ITO glass substrate (anode) to a thickness of 700 Å to form a hole transport layer. Then, TCTA was vacuum deposited on the hole transport layer to a thickness of 100 Å to form an emission auxiliary layer.

Compound 1-1 (as a host) and PD13 (as a dopant) were co-deposited on the emission auxiliary layer at a weight ratio of 90:10 to form an emission layer having a thickness of 300 Å.

Compound 2-9 was deposited on the emission layer to form a buffer layer having a thickness of 100 Å, and then, $Alq_3$ was vacuum deposited on the buffer layer to form an electron transport layer having a thickness of 200 Å. LiF was deposited on the electron transport layer to form an electron injection layer having a thickness of 10 Å.

Al was deposited on the electron injection layer to form a cathode having a thickness of 2,000 Å, thereby completing the manufacture of an organic light-emitting device.

Examples 2-2 to 2-5 and Comparative Examples 2-1 to 2-3

Organic light-emitting devices were manufactured in the same manner as in Example 2-1, except that compounds shown in Table 6 were used in forming an emission layer and a buffer layer.

Example 2-6

An organic light-emitting device was manufactured in the same manner as in Example 2-1, except that Compound 1-1 (as a first host), CBP (as a second host), and PD13 (as a dopant) were co-deposited at a weight ratio of 50:50:10 in forming an emission layer.

Examples 2-7 to 2-10

Organic light-emitting devices were manufactured in the same manner as in Example 2-6, except that compounds shown in Table 7 were used in forming an emission layer and a buffer layer.

Example 2-11: Manufacture of Green (Fluorescent) Organic Light-Emitting Device

An anode was prepared by cutting an ITO glass substrate (manufactured by Corning), having a thickness of 1,200 Å and sheet resistance of 15 Ω/cm$^2$, to a size of 50 mm×50 mm×0.5 mm, ultrasonically cleaning the ITO glass substrate using isopropyl alcohol and pure water each for 15 minutes, and then, exposing to irradiation of UV light for 30 minutes and ozone to clean. Then, the ITO glass substrate was loaded into a vacuum deposition apparatus.

m-MTDATA was vacuum deposited on the ITO glass substrate (anode) to a thickness of 700 Å to form a hole transport layer. Then, NPB was vacuum deposited on the hole transport layer to a thickness of 100 Å to form an emission auxiliary layer.

Compound 1-166 (as a host) and FD19 (as a dopant) were co-deposited on the emission auxiliary layer at a weight ratio of 95:5 to form an emission layer having a thickness of 300 Å.

Compound 2-9 was deposited on the emission layer to form a buffer layer having a thickness of 100 Å, and then, $Alq_3$ was vacuum deposited on the buffer layer to form an electron transport layer having a thickness of 200 Å. LiF was deposited on the electron transport layer to form an electron injection layer having a thickness of 10 Å.

Al was deposited on the electron injection layer to form a cathode having a thickness of 2,000 Å, thereby completing the manufacture of an organic light-emitting device.

Examples 2-12 to 2-15 and Comparative Examples 2-4 to 2-6

Organic light-emitting devices were manufactured in the same manner as in Example 2-11, except that compounds shown in Table 6 were used in forming an emission layer and a buffer layer.

Evaluation Example 2

The driving voltage and efficiency of the organic light-emitting devices of Examples 2-1 to 2-15 and Comparative Examples 2-1 to 2-6 were evaluated at 5 mA/cm$^2$ (phosphorescence) and 10 mA/cm$^2$ (fluorescence) by using a Keithley SMU 236 meter. Results thereof are shown in Tables 6 and 7.

TABLE 6

| | Emission layer (host) | Emission layer (dopant) | Buffer layer | Weight ratio (host:dopant) | Driving voltage (V) | Efficiency (cd/A) |
|---|---|---|---|---|---|---|
| Example 2-1 | Compound 1-1 | PD13 | Compound 2-9 | 90:10 | 5.5 | 41.5 |
| Example 2-2 | Compound 1-20 | PD13 | Compound 2-48 | 90:10 | 5.2 | 43.6 |
| Example 2-3 | Compound 1-46 | PD13 | Compound 2-136a | 90:10 | 5.4 | 42.8 |
| Example 2-4 | Compound 1-59 | PD13 | Compound 2-103 | 90:10 | 5.4 | 43.1 |
| Example 2-5 | Compound 1-104 | PD13 | Compound 2-162 | 90:10 | 5.3 | 42.6 |
| Comparative Example 2-1 | CBP | PD13 | Compound 2-9 | 90:10 | 5.9 | 38.7 |
| Comparative Example 2-2 | Compound 1-1 | PD13 | BAlq | 90:10 | 5.9 | 38.3 |
| Comparative Example 2-3 | CBP | PD13 | BAlq | 90:10 | 6.1 | 36.1 |
| Example 2-11 | Compound 1-1 | FD19 | Compound 2-9 | 95:5 | 4.5 | 19.1 |
| Example 2-12 | Compound 1-20 | FD19 | Compound 2-48 | 95:5 | 4.7 | 19.9 |
| Example 2-13 | Compound 1-46 | FD19 | Compound 2-136a | 95:5 | 4.4 | 20.1 |
| Example 2-14 | Compound 1-59 | FD19 | Compound 2-103 | 95:5 | 4.3 | 19.8 |
| Example 2-15 | Compound 1-104 | FD19 | Compound 2-162 | 95:5 | 4.5 | 20.3 |
| Comparative Example 2-4 | ADN | FD19 | Compound 2-9 | 95:5 | 4.8 | 18.3 |
| Comparative Example 2-5 | Compound 1-166 | FD19 | $Alq_3$ | 95:5 | 4.6 | 17.8 |

TABLE 6-continued

| | Emission layer (host) | Emission layer (dopant) | Buffer layer | Weight ratio (host:dopant) | Driving voltage (V) | Efficiency (cd/A) |
|---|---|---|---|---|---|---|
| Comparative Example 2-6 | ADN | FD19 | $Alq_3$ | 95:5 | 5.0 | 16.2 |

TABLE 7

| | Emission layer (first host:second host) | Emission layer (dopant) | Buffer layer | Weight ratio (first host:second host:dopant) | Driving voltage (V) | Efficiency (cd/A) |
|---|---|---|---|---|---|---|
| Example 2-6 | Compound 1-1:CPB | PD13 | Compound 2-9 | 50:50:10 | 5.5 | 41.1 |
| Example 2-7 | Compound 1-1:Compound 1-39 | PD13 | Compound 2-48 | 50:50:10 | 5.3 | 42.3 |
| Example 2-8 | Compound 1-20:Compound 1-41 | PD13 | Compound 2-136a | 50:50:10 | 5.2 | 42.7 |
| Example 2-9 | Compound 1-113:Compound 1-60 | PD13 | Compound 2-103 | 50:50:10 | 5.4 | 42.0 |
| Example 2-10 | Compound 1-46:Compound 1-16 | PD13 | Compound 2-162 | 50:50:10 | 5.3 | 43.2 |

Referring to Tables 6 and 7, it may be seen that the organic light-emitting devices of Examples 2-1 to 2-10 had a low driving voltage and high efficiency, compared to those of the organic light-emitting devices of Comparative Examples 2-1 to 2-3, and the organic light-emitting devices of the Examples 2-11 to 2-15 had a low driving voltage and high efficiency, compared to those of the organic light-emitting devices of Comparative Examples 2-4 to 2-6.

Example 3-1: Manufacture of Blue Organic Light-Emitting Device

An anode was prepared by cutting an ITO glass substrate (manufactured by Corning), having a thickness of 1,200 Å and sheet resistance of 15 Ω/cm$^2$, to a size of 50 mm×50 mm×0.5 mm, ultrasonically cleaning the ITO glass substrate using isopropyl alcohol and pure water each for 15 minutes, and then, exposing to irradiation of UV light for 30 minutes and ozone to clean. Then, the ITO glass substrate was loaded into a vacuum deposition apparatus.

m-MTDATA was vacuum deposited on the ITO glass substrate (anode) to a thickness of 700 Å to form a hole transport layer. Then, NPB was vacuum deposited on the hole transport layer to a thickness of 100 Å to form an emission auxiliary layer.

Compound 1-166 (as a host) and FD1 (as a dopant) were co-deposited on the emission auxiliary layer at a weight ratio of 95:5 to form an emission layer having a thickness of 300 Å.

Compound 2-9 was deposited on the emission layer to form a buffer layer having a thickness of 100 Å, and then, $Alq_3$ was vacuum deposited on the buffer layer to form an electron transport layer having a thickness of 200 Å. LiF was deposited on the electron transport layer to form an electron injection layer having a thickness of 10 Å.

Al was deposited on the electron injection layer to form a cathode having a thickness of 2,000 Å, thereby completing the manufacture of an organic light-emitting device.

Examples 3-2 to 3-5 and Comparative Examples 3-1 to 3-3

Organic light-emitting devices were manufactured in the same manner as in Example 3-1, except that compounds shown in Table 8 were used in forming an emission layer and a buffer layer.

Example 3-6 to 3-10

Organic light-emitting devices were manufactured in the same manner as in Example 3-1, except that 1 wt % of F4-TCNQ was doped in forming a hole transport layer and that compounds shown in Table 8 were used in forming an emission layer and a buffer layer.

TABLE 8

| | Emission layer (host) | Buffer layer | Driving voltage (V) | Efficiency (cd/A) |
|---|---|---|---|---|
| Example 3-1 | Compound 1-166 | Compound 2-9 | 4.5 | 5.1 |
| Example 3-2 | Compound 1-164 | Compound 2-48 | 4.5 | 5.3 |
| Example 3-3 | Compound 1-178 | Compound 2-136a | 4.6 | 5.0 |
| Example 3-4 | Compound 1-164 | Compound 2-103 | 4.4 | 4.9 |
| Example 3-5 | Compound 1-178 | Compound 2-162 | 4.4 | 5.2 |
| Example 3-6 | Compound 1-165 | Compound 2-131 | 4.2 | 5.2 |
| Example 3-7 | Compound 1-171 | Compound 2-121a | 4.1 | 5.0 |

TABLE 8-continued
| | Emission layer (host) | Buffer layer | Driving voltage (V) | Efficiency (cd/A) |
|---|---|---|---|---|
| Example 3-8 | Compound 1-171 | Compound 2-180 | 4.2 | 5.0 |
| Example 3-9 | Compound 1-176 | Compound 2-13a | 4.2 | 5.2 |
| Example 3-10 | Compound 1-176 | Compound 2-242 | 4.3 | 5.1 |
| Comparative Example 3-1 | ADN | Compound 2-9 | 4.7 | 4.6 |
| Comparative Example 3-2 | Compound 1-166 | $Alq_3$ | 4.6 | 4.8 |
| Comparative Example 3-3 | ADN | $Alq_3$ | 4.9 | 4.4 |
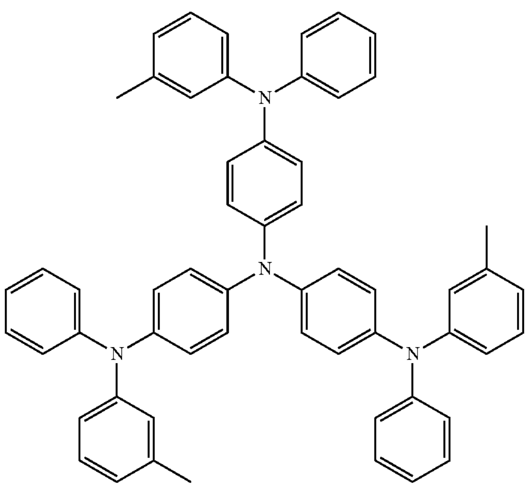
m-MTDATA
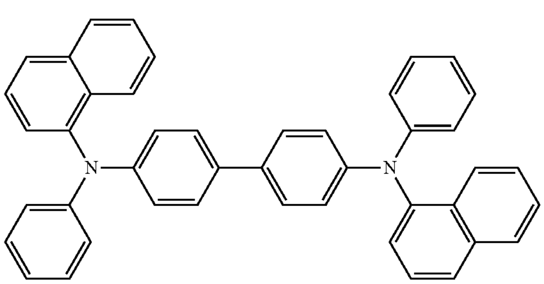
NPB
-continued
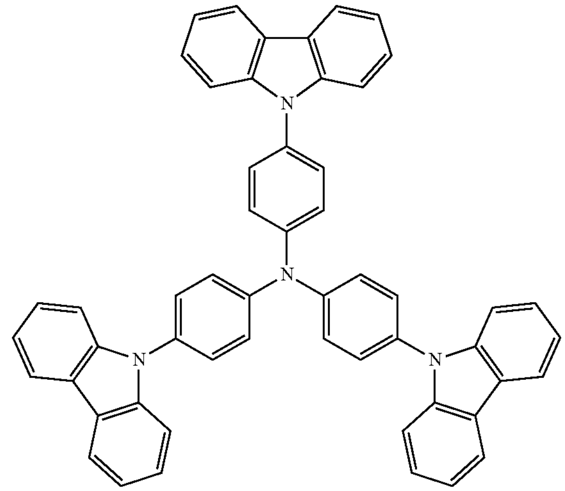
TCTA
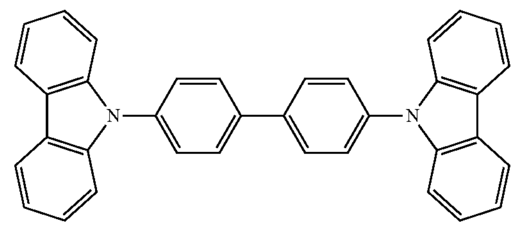
CBP
PD11
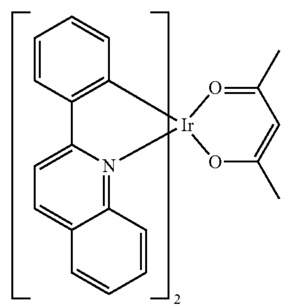
PD13
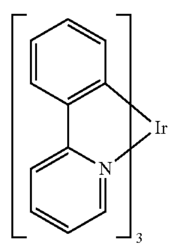
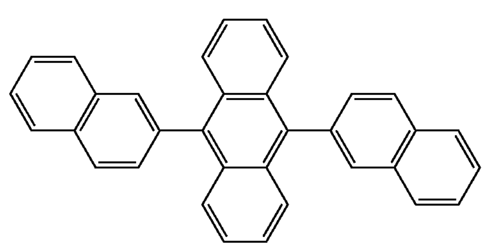
ADN -continued

FD1

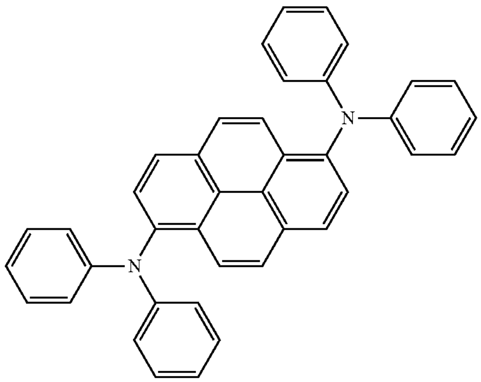

FD19

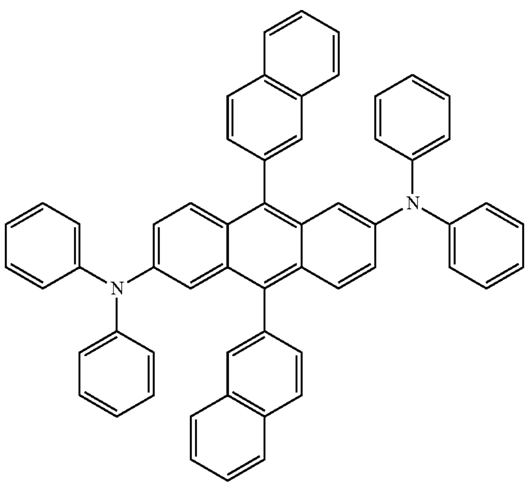

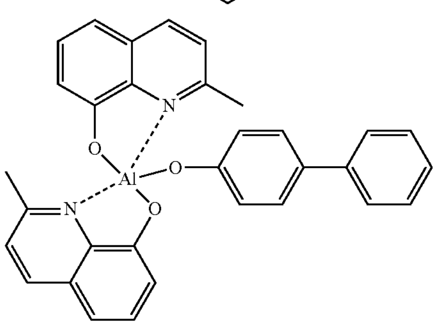

BAlq

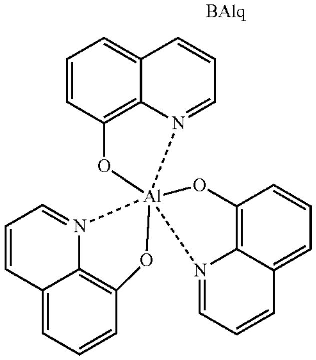

$Alq_3$

-continued

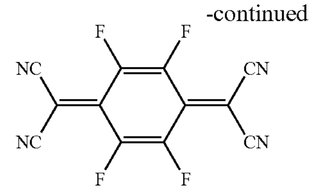

F4-TCNQ

Referring to Table 8, it may be seen that the organic light-emitting devices of Examples 3-1 to 3-10 had a low driving voltage and high efficiency, compared to those of the organic light-emitting devices of Comparative Examples 3-1 to 3-3.

According to one or more embodiments, an organic light-emitting device may have a low driving voltage and high efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device, comprising:

a first electrode;

a second electrode facing the first electrode;

an emission layer between the first electrode and the second electrode;

a hole transport region between the first electrode and the emission layer; and an electron transport region between the emission layer and the second electrode, wherein:

the emission layer includes a first compound, at least one of the hole transport region and the electron transport region includes a second compound, the first compound is represented by Formula 1A or 1B and the first compound is not Compound ST1, and the second compound is represented by Formula 2A or 2B:

<Compound ST1>

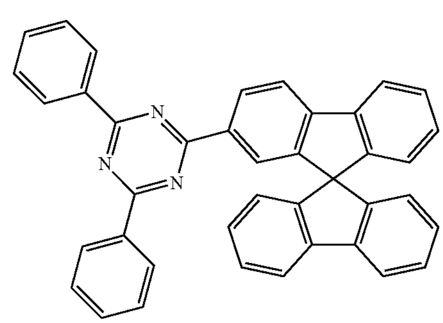

<Formula 1A>

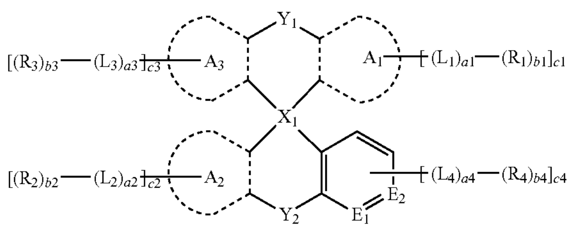

<Formula 1B>

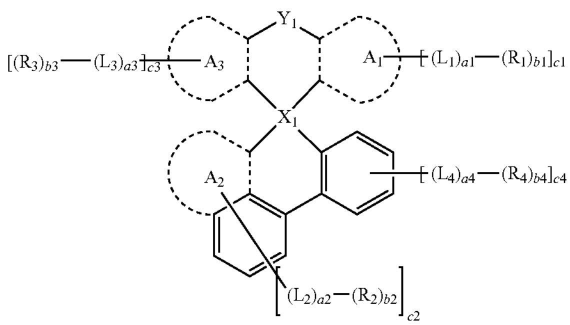

<Formula 2A>

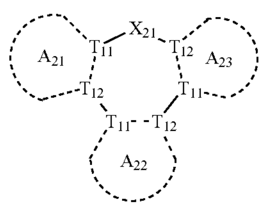

<Formula 2B>

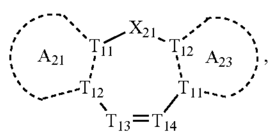

wherein, in Formulae 1A, 1B, 2A, and 2B, rings $A_1$ to $A_3$ are each independently selected from a $C_5$-$C_{60}$ carbocyclic group and a $C_1$-$C_{60}$ heterocyclic group, rings $A_1$ to $A_3$ are each condensed with a spiro-ring in Formulae 1A and 1B, rings $A_{21}$, $A_{22}$, and $A_{23}$ are each independently a $C_5$-$C_{60}$ carbocyclic group or $C_1$-$C_{60}$ heterocyclic group, each substituted with at least one *-[$(L_{22})_{a22}$-$(R_{22})_{b22}$], in which * is a bonding site to a neighboring atom, $T_{11}$ and $T_{12}$ are each independently carbon or nitrogen, two or three $T_{11}$ in Formula 2A are identical to or different from each other, $T_{13}$ is N or C($R_{27}$), $T_{14}$ is N or C($R_{28}$), two or three $T_{12}$ in Formula 2A are identical to or different from each other, two $T_{11}$ in Formula 2B are identical to or different from each other, two $T_{12}$ in Formula 2B are identical to or different from each other, $T_{11}$ and $T_{12}$ are connected to each other via a single bond or a double bond, three $T_{11}$ and three $T_{12}$ in Formula 2A are not all nitrogen and two $T_{11}$, two $T_{12}$, $T_{13}$, and $T_{14}$ in Formula 2B are not all nitrogen, rings $A_{21}$, $A_{22}$, and $A_{23}$ are each condensed with a 7-membered ring in Formulae 2A and 2B, while sharing $T_{11}$ and $T_{12}$ therewith, $X_1$ is a silicon (Si) atom or a carbon (C) atom, $Y_1$ is selected from a single bond, N[$(L_{11})_{a11}$-$(R_{11})_{b11}$], C($R_{11}$)($R_{13}$), Si($R_{11}$)($R_{13}$), O, S, and Se, $Y_2$ is selected from a single bond, N[$(L_{12})_{a12}$-$(R_{12})_{b12}$], C($R_{12}$)($R_{14}$), Si($R_{12}$)($R_{14}$), O, S, and Se, $E_1$ and $E_2$ are each independently a nitrogen (N) atom, or a carbon (C) atom substituted with *-$(L_4)_{a4}$-$(R_4)_{b4}$, in which * is a bonding site to a neighboring atom, $X_{21}$ is selected from O, S, Se, C($R_{23}$)($R_{24}$), Si($R_{23}$)($R_{24}$), and N[$(L_{21})_{a21}$-$(R_{21})_{b21}$], $L_1$ to $L_4$, $L_{11}$, $L_{12}$, $L_{21}$, and $L_{22}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, provided that $L_1$ to $L_4$ are each independently not a substituted or unsubstituted triazinylene group, a1 to a4, a11, a12, a21, and a22 are each independently an integer of 0 to 5, $R_{11}$ to $R_{14}$, $R_{21}$ to $R_{24}$, $R_{27}$, and $R_{28}$ are each independently selected from hydrogen, deuterium (-D), —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(═O)($Q_1$), —S(═O)$_2$($Q_1$), and —P(═O)($Q_1$)($Q_2$), $R_1$ to $R_4$ are each independently selected from hydrogen, deuterium (-D), —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—B(Q_1)(Q_2)$, $—C(=O)(Q_1)$, $—S(=O)_2(Q_1)$, and $—P(=O)(Q_1)(Q_2)$, provided that when a1 to a4 are each independently 0, respective $R_1$ to $R_4$ are each independently not a substituted triazinyl group, $R_{11}$ and $R_{13}$ are separate or are connected to each other to form a saturated or unsaturated ring, $R_{12}$ and $R_{14}$ are separate or are connected to each other to form a saturated or unsaturated ring, b1 to b4, b11, b12, b21, and b22 are each independently an integer of 1 to 3, c1 and c2 are each independently an integer of 0 to 8, and c3 and c4 are each independently an integer of 0 to 4, and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, and $—P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, and $—P(=O)(Q_{21})(Q_{22})$; and $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted with a $C_1$-$C_{60}$ alkyl group, a $C_1$-$C_{60}$ heteroaryl group substituted with a $C_6$-$C_{60}$ aryl group, a monovalent non-aromatic condensed polycyclic group, and a monovalent non-aromatic condensed heteropolycyclic group.

2. The organic light-emitting device as claimed in claim 1, wherein rings $A_1$ to $A_3$ in Formulae 1A and 1B are each independently selected from a benzene group, a naphthalene group, an anthracene group, a phenanthrene group, an indene group, an indenopyridine group, a fluorene group, a pyridine group, a pyrimidine group, a pyrazine group, a pyrrole group, an imidazole group, a quinoline group, an isoquinoline group, a quinazoline group, a phenanthroline group, a phenanthridine group, a furan group, a thiophene group, an indole group, an indolocarbazole group, a benzofuran group, a benzofurocarbazole group, a benzofuropyrimidine group, a benzothiophene group, a benzoxazole group, a benzothiazole group, a benzoimidazole group, a carbazole group, a dibenzofuran group, a dibenzothiophene group, a pyridoindole group, a dipyridofuran group, a dipyridothiophene group, a pyrimidobenzofuran group, a dipyridopyrrole group, and a pyrimidobenzothiophene group.

3. The organic light-emitting device as claimed in claim 1, wherein rings $A_{21}$, $A_{22}$, and $A_{23}$ in Formulae 2A and 2B are each independently selected from a benzene group, a naphthalene group, an anthracene group, an indene group, a fluorene group, a pyridine group, a pyrimidine group, a pyrazine group, a pyridazine group, a quinoline group, an isoquinoline group, a pyrrole group, a pyrazole group, an imidazole group, an oxazole group, a thiazole group, a cyclopentadiene group, a silole group, a selenophene group, a furan group, a thiophene group, an indole group, a benzoimidazole group, a benzoxazole group, a benzothiazole group, an indene group, a benzosilole group, a benzoselenophene group, a benzofuran group, a benzothiophene group, a carbazole group, a fluorene group, a dibenzosilole group, a dibenzoselenophene group, a dibenzofuran group, a dibenzothiophene group, a pyrrolopyridine group, a cyclopentapyridine group, a silolopyridine group, a selenophenopyridine group, a furopyridine group, a thienopyridine group, a pyrrolopyrimidine group, a cyclopentapyrimidine group, a silolopyrimidine group, a selenophenopyrimidine group, a furopyrimidine group, a thienopyrimidine group, a pyrrolopyrazine group, a cyclopentapyrazine group, a silolopyrazine group, a selenophenopyrazine group, a furopyrazine group, a thienopyrazine group, a naphthopyrrole group, a cyclopentanaphthalene group, a naphthosilole group, a naphthoselenothiophene group, a naphthofuran group, a naphthothiophene group, a pyrroloquinoline group, a cyclopentaquinoline group, a siloloquinoline group, a selenophenoquinoline group, a furoquinoline group, a thienoquinoline group, a pyrroloisoquinoline group, a cyclopentaisoquinoline group, a siloloisoquinoline group, a selenophenoisoquinoline group, a furoisoquinoline group, a thienoisoquinoline group, an azacarbazole group, an azafluorene group, an azadibenzosilole group, an azadibenzoselenophene group, an azadibenzofuran group, an azadibenzothiophene group, an indenoquinoline group, an indenoisoquinoline group, an indenoquinoxaline group, a phenanthroline group, and a naphthoindole group, each substituted with at least one *-[$(L_{22})_{a22}$-$(R_{22})_{b22}$], in which * is a bonding site to a neighboring atom.

4. The organic light-emitting device as claimed in claim 1, wherein:

rings $A_{21}$ $A_{22}$, and $A_{23}$ in Formulae 2A and 2B are each independently a group represented by one of the following Formulae 2-1 to 2-36, each substituted with at least one *-[$(L_{22})_{a22}$-$(R_{22})_{b22}$)], in which * is a bonding site to a neighboring atom, Formula 2-1

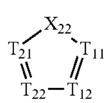

Formula 2-2

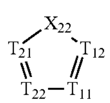

Formula 2-3

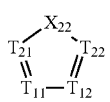

Formula 2-4

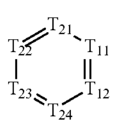

Formula 2-5

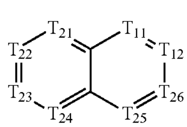

Formula 2-6

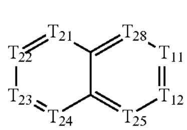

-continued

Formula 2-7

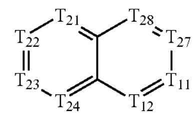

Formula 2-8

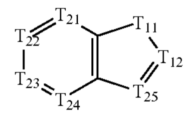

Formula 2-9

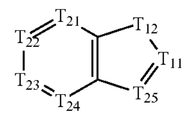

Formula 2-10

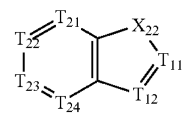

Formula 2-11

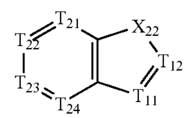

Formula 2-12

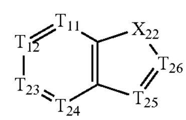

Formula 2-13

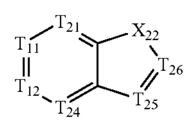

Formula 2-14

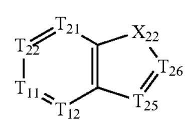

Formula 2-15

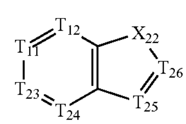

Formula 2-16

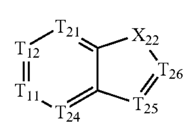

Formula 2-17

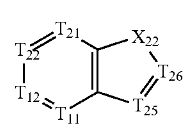

Formula 2-18

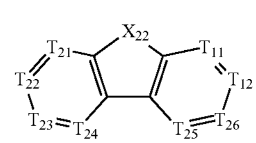

-continued
Formula 2-19
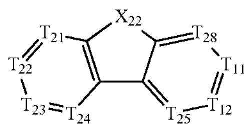
Formula 2-20
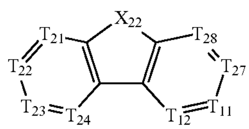
Formula 2-21
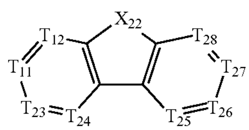
Formula 2-22
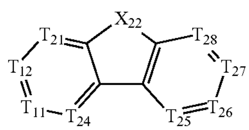
Formula 2-23
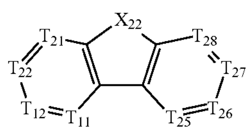
Formula 2-24
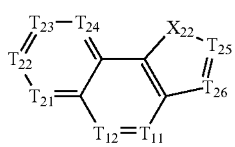
Formula 2-25
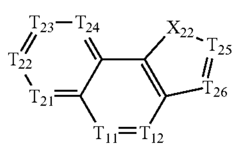
Formula 2-26
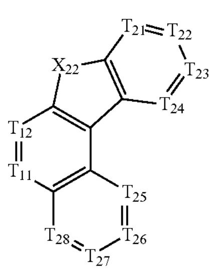
Formula 2-27
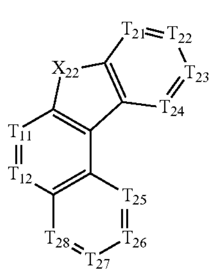
-continued
Formula 2-28
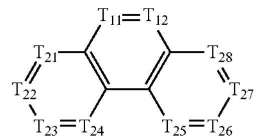
Formula 2-29
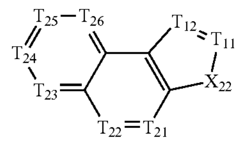
Formula 2-30
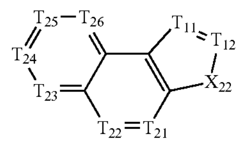
Formula 2-31
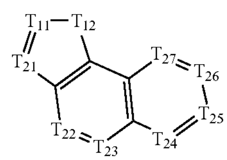
Formula 2-32
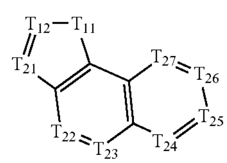
Formula 2-33
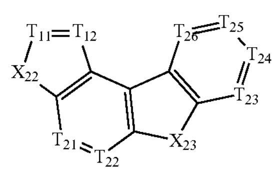
Formula 2-34
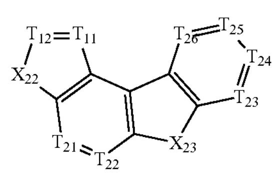
Formula 2-35
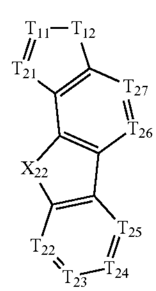

-continued

Formula 2-36

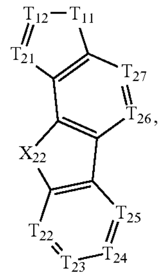

wherein, in Formulae 2-1 to 2-36, $T_{11}$ and $T_{12}$ are defined the same as those of Formulae 2A and 2B, $X_{22}$ and $X_{23}$ are each independently selected from O, S, Se, a carbon-containing moiety, a nitrogen-containing moiety, and a silicon-containing moiety, and $T_{21}$ to $T_{28}$ are each independently selected from N and a carbon-containing moiety.

5. The organic light-emitting device as claimed in claim 1, wherein, in Formulae 1A and 1B:

$Y_1$ and $Y_2$ are both a single bond, $Y_1$ is a single bond and $Y_2$ is selected from $N[(L_{12})_{a12}-(R_{12})_{b12}]$, $C(R_{12})(R_{14})$, $Si(R_{12})(R_{14})$, O, S, and Se, or $Y_1$ is selected from $N[(L_{11})_{a11}-(R_{11})_{b11}]$, $C(R_{11})(R_{13})$, $Si(R_{11})(R_{13})$, O, S, and Se, and $Y_2$ is a single bond.

6. The organic light-emitting device as claimed in claim 1, wherein $X_{21}$ in Formulae 2A and 2B is $N[(L_{21})_{a21}-(R_{21})_{b21}]$.

7. The organic light-emitting device as claimed in claim 4, wherein:

$X_{21}$ in Formulae 2A and 2B is O, S, Se, $C(R_{23})(R_{24})$, or $Si(R_{23})(R_{24})$, and at least one of rings $A_{21}$, $A_{22}$, and $A_{23}$ in Formula 2A and at least one of rings $A_{21}$ and $A_{23}$ in Formula 2B are each independently a group represented by one of Formulae 2-1 to 2-3, 2-10 to 2-27, and 2-33 to 2-36, in which $X_{22}$ or $X_{23}$ in Formulae 2-1 to 2-3, 2-10 to 2-27, and 2-33 to 2-36 is $N-[(L_{22})_{a22}-(R_{22})_{b22}]$.

8. The organic light-emitting device as claimed in claim 1, wherein, in Formulae 1A, 1B, 2A, and 2B, $L_{11}$, $L_{12}$, $L_{21}$, and $L_{22}$ are each independently selected from:

a phenylene group, a pentalenylene group, an indenylene group, a naphthylene group, an azulenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a perylenylene group, a pentaphenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzoimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group; and a phenylene group, a pentalenylene group, an indenylene group, a naphthylene group, an azulenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a perylenylene group, a pentaphenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzoimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $L_1$ to $L_4$ are each independently selected from:

a phenylene group, a pentalenylene group, an indenylene group, a naphthylene group, an azulenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a perylenylene group, a pentaphenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a guinolinylene group, an isoguinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzoimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group; and a phenylene group, a pentalenylene group, an indenylene group, a naphthylene group, an azulenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a perylenylene group, a pentaphenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoguinolinylene group, a phthalazinylene group, a naphthyridinylene group, a guinoxalinylene group, a guinazolinylene group, a cinnolinylene group, a phenanthridinylene group, an acridinylene group, a phenanthrolinylene group, a phenazinylene group, a benzoimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ are each independently selected from:

a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group.

9. The organic light-emitting device as claimed in claim 1, wherein, in Formulae 1A, 1B, 2A, and 2B, $R_{11}$ to $R_{14}$, $R_{21}$ to $R_{24}$, $R_{27}$, and $R_{28}$ are each independently selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$; and a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, and $R_1$ to $R_4$ are each independently selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, —$Si(Q_1)(Q_2)(Q_3)$, —$B(Q_1)(Q_2)$, —$C(=O)(Q_1)$, —$S(=O)_2(Q_1)$, and —$P(=O)(Q_1)(Q_2)$; and a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinol group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), wherein $Q_1$ to $Q_3$ and $Q_{31}$ to $Q_{33}$ are each independently selected from:

a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group.

10. The organic light-emitting device as claimed in claim 1, wherein the first compound is represented by one of the following Formulae 1-1 to 1-3:

<Formula 1-1>

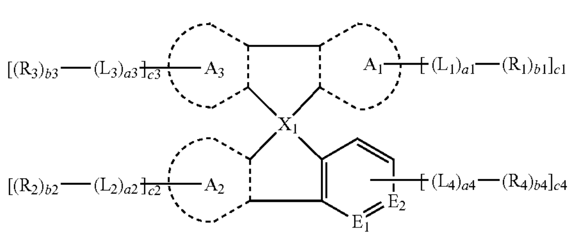

-continued

<Formula 1-2>

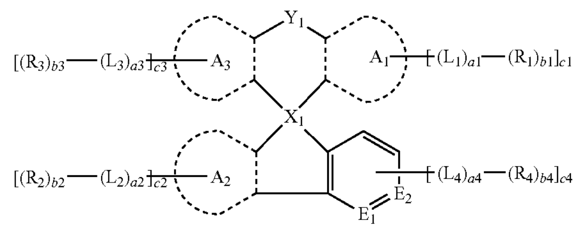

<Formula 1-3>

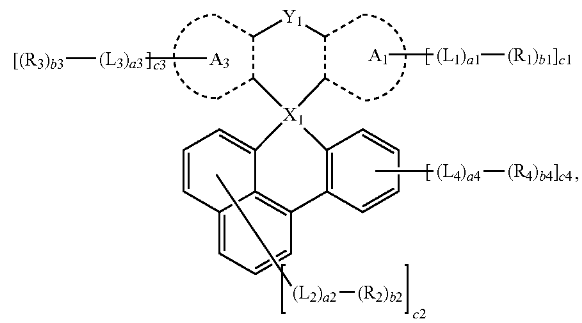

wherein, in Formulae 1-1 to 1-3, rings $A_1$ to $A_3$, $X_1$, $Y_1$, $E_1$, $E_2$, $L_1$ to $L_4$, a1 to a4, $R_1$ to $R_4$, b1 to b4, c1, c2, c4, a11, $R_{11}$, $R_{13}$, and b11 are defined the same as those of Formulae 1A and 1B, c2 is an integer of 0 to 6, and $Y_1$ is selected from N[($L_{11}$)$_{a11}$-($R_{11}$)$_{b11}$], C($R_{11}$)($R_{13}$), Si($R_{11}$)($R_{13}$), O, S, and Se.

11. The organic light-emitting device as claimed in claim 10, wherein, in Formulae 1-1 to 1-3:

ring $A_1$ is selected from a benzene group, a naphthalene group, a pyridine group, a dibenzofuran group, and a pyrimidine group, rings $A_2$ and $A_3$ are each independently selected from a benzene group, a naphthalene group, an anthracene group, a phenanthrene group, an indene group, an indenopyridine group, a fluorene group, a pyridine group, a pyrimidine group, a pyrazine group, a pyrrole group, an imidazole group, a quinoline group, an isoquinoline group, a quinazoline group, a phenanthroline group, a phenanthridine group, a furan group, a thiophene group, an indole group, an indolocarbazole group, a benzofuran group, a benzofurocarbazole group, a benzofuropyrimidine group, a benzothiophene group, a benzoxazole group, a benzothiazole group, a benzoimidazole group, a carbazole group, a dibenzofuran group, a dibenzothiophene group, a pyridoindole group, a dipyridofuran group, a dipyridothiophene group, a pyrimidobenzofuran group, a dipyridopyrrole group, and a pyrimidobenzothiophene group, and $R_1$ to $R_4$ are each independently selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$.

12. The organic light-emitting device as claimed in claim 1, wherein the emission layer includes a first host and a second host, the first host including the first compound.

13. The organic light-emitting device as claimed in claim 1, wherein:

the electron transport region includes a buffer layer, the buffer layer directly contacts the emission layer, and the buffer layer includes the second compound.

14. The organic light-emitting device as claimed in claim 1, wherein:

the emission layer includes a dopant, and the dopant includes an organometallic complex.

15. The organic light-emitting device as claimed in claim 14, wherein the organometallic complex is represented by Formula 401, in which $L_{401}$ is selected from a ligand represented by Formula 402, $$M(L_{401})_{xc1}(L_{402})_{xc2}$$ <Formula 401>

<Formula 402>

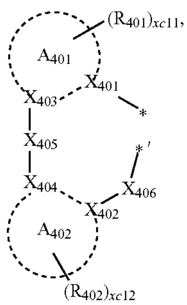

wherein, in Formulae 401 and 402,

M is selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), xc1 is 1, 2, or 3, wherein when xc1 is 2 or 3, 2 or 3 $L_{401}$ are identical to or different from each other, $L_{402}$ is an organic ligand, and xc2 is an integer of 0 to 4, wherein when xc2 is 2, 3, or 4, 2, 3, or 4 $L_{402}$ are identical to or different from each other, $X_{401}$ to $X_{404}$ are each independently nitrogen or carbon, $X_{401}$ and $X_{403}$ are connected to each other via a single bond or a double bond, and $X_{402}$ and $X_{404}$ are connected to each other via a single bond or a double bond, $A_{401}$ and $A_{402}$ are each independently a $C_5$-$C_{60}$ carbocyclic group or a $C_1$-$C_{60}$ heterocyclic group, $X_{405}$ is a single bond, *—O—*', *—S—*', *—C(=O)—*', *—N($Q_{411}$)-*', *—C($Q_{411}$)($Q_{412}$)-*', C($Q_{411}$)=C($Q_{412}$)-*', *—C($Q_{411}$)=*', or *=C($Q_{411}$)=*', in which * is a bonding site to a neighboring atom, wherein $Q_{411}$ and $Q_{412}$ are each independently hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ is a single bond, O, or S, $R_{401}$ and $R_{402}$ are each independently selected from hydrogen, deuterium, —F, —Cl, —Br, —I, -$CD_3$, —$CF_3$, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group —$Si(Q_{401})(Q_{402})(Q_{403})$, —$N(Q_{401})(Q_{402})$, —$B(Q_{401})(Q_{402})$, —$C(=O)(Q_{401})$, —$S(=O)_2(Q_{401})$, and —$P(=O)(Q_{401})(Q_{402})$, wherein $Q_{401}$ to $Q_{403}$ are each independently selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 are each independently an integer of 0 to 10, and

* and *' in Formula 402 indicate a binding site to M in Formula 401.

16. The organic light-emitting device as claimed in claim 1, wherein:

the electron transport region includes a buffer layer, an electron transport layer, and an electron injection layer, and at least one layer of the electron transport layer and the electron injection layer includes an alkaline metal, an alkaline earth metal, a rare-earth metal, an alkaline metal compound, an alkaline earth-metal compound, a rare-earth metal compound, an alkaline metal complex, an alkaline earth-metal complex, a rare-earth metal complex, or a combination thereof.

17. The organic light-emitting device as claimed in claim 1, wherein the hole transport region includes a p-dopant, and the p-dopant includes a cyano group-containing compound.

18. The organic light-emitting device as claimed in claim 1, wherein the emission layer is a first-color-light emission layer, the organic light-emitting device further includes at least one second-color-light emission layer or at least one second-color-light emission layer and at least one third-color-light emission layer, between the first electrode and the second electrode, a maximum emission wavelength of the first-color-light emission layer, a maximum emission wavelength of the second-color-light emission layer, and a maximum emission wavelength of the third-color-light emission layer are identical to or different from one another, and mixed light including first-color-light and second-color-light, or mixed light including first-color-light, second-color-light, and third-color-light is emitted.

19. The organic light-emitting device as claimed in claim 1, wherein the second compound is represented by Formula 2B.

20. The organic light-emitting device as claimed in claim 1, wherein the second compound is selected from the following compounds:

2-1a
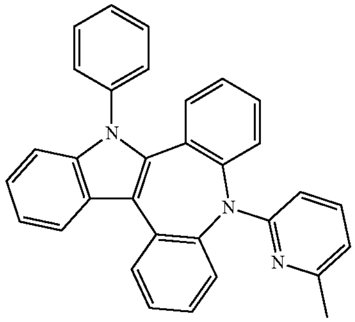
2-2a
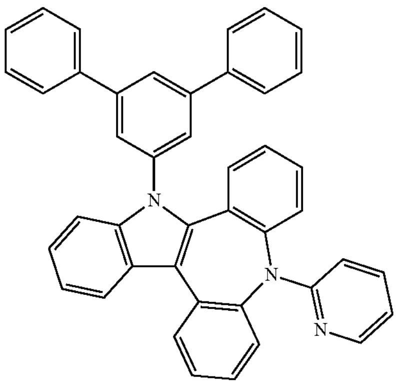
2-3a
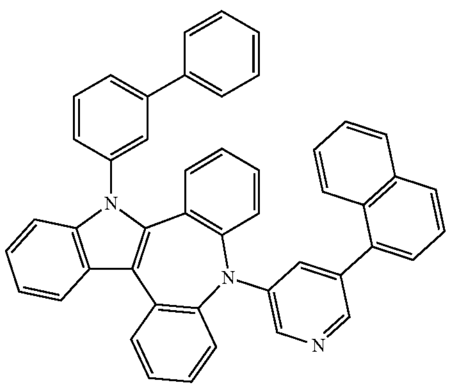
2-4a
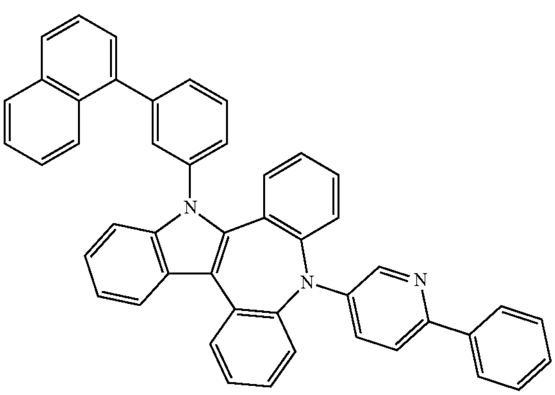
-continued
2-5a
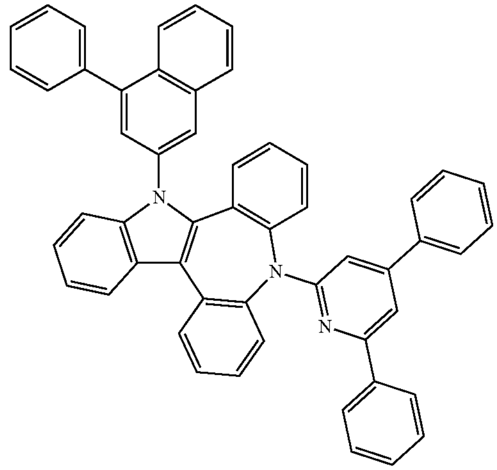
2-6a
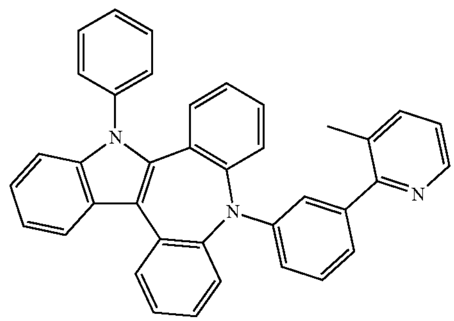
2-7a
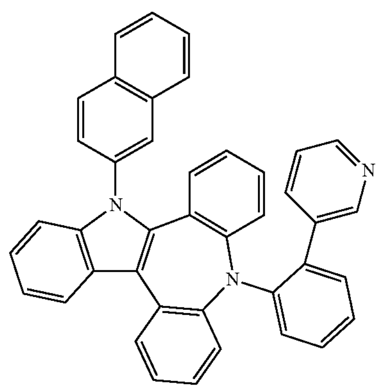
2-8a
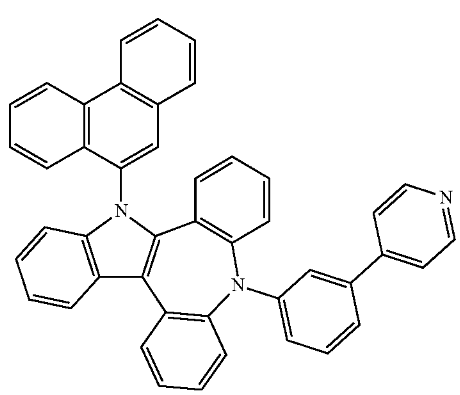

2-9a
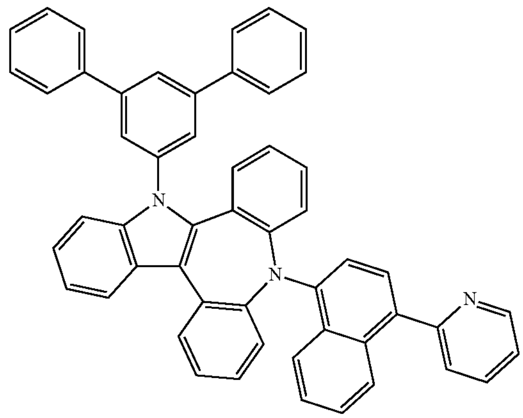
2-10a
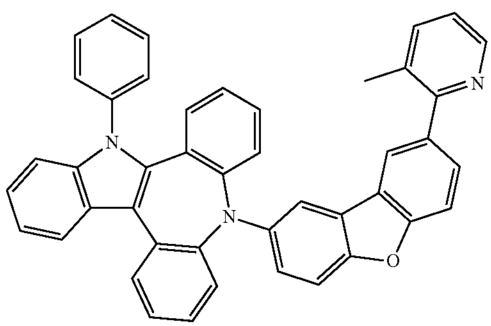
2-11a
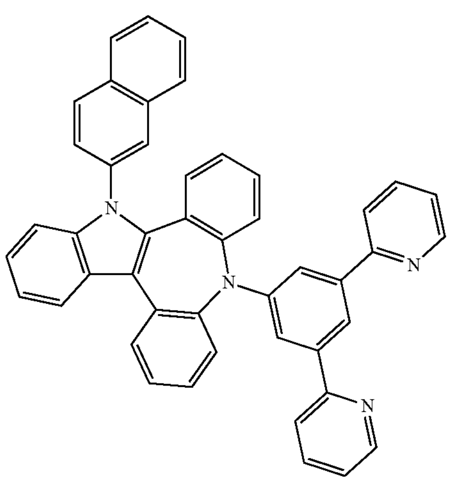
2-12a
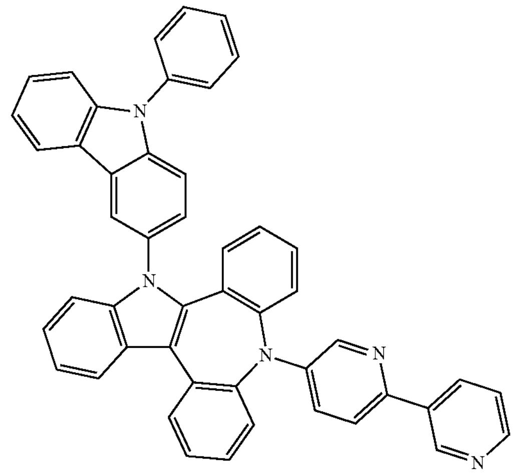
2-13a
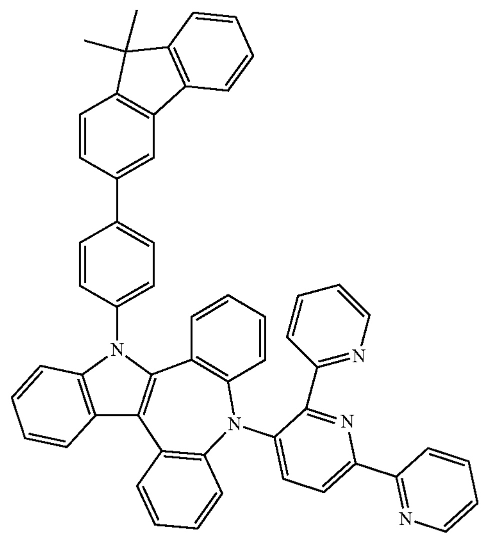
2-14a
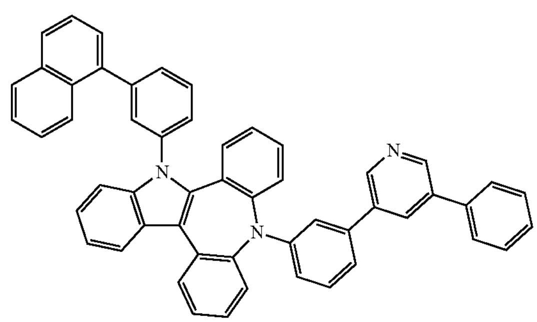

-continued
2-15a
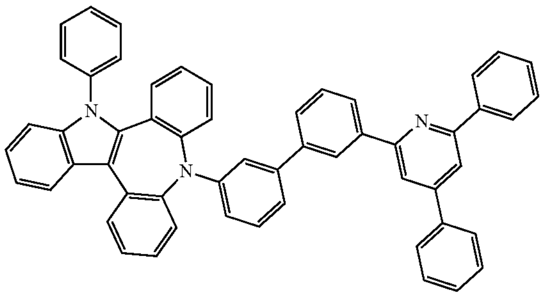
2-16a
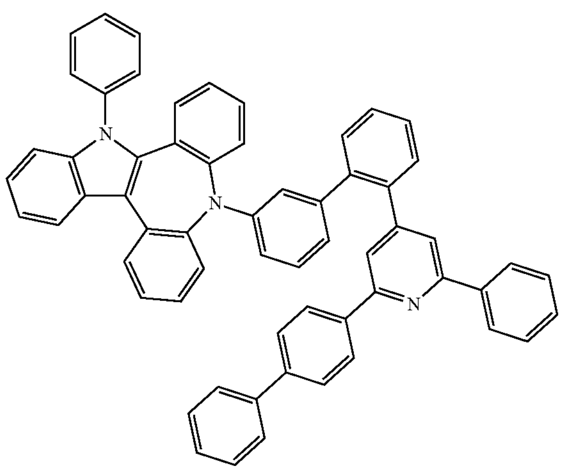
2-17a
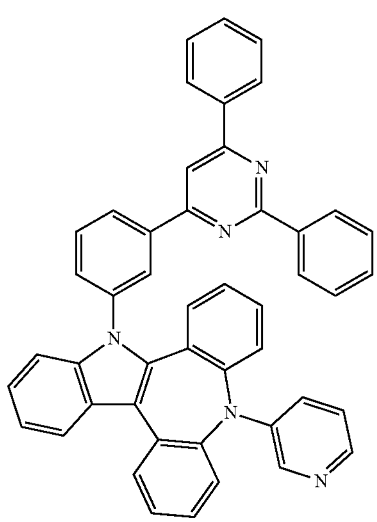
-continued
2-18a
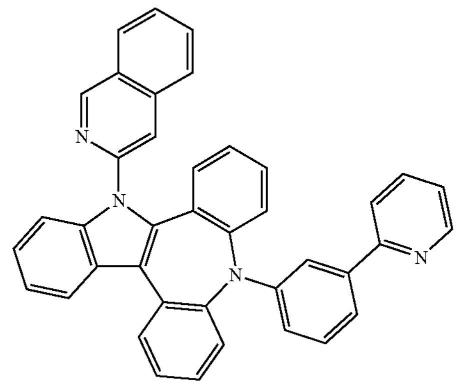
2-19a
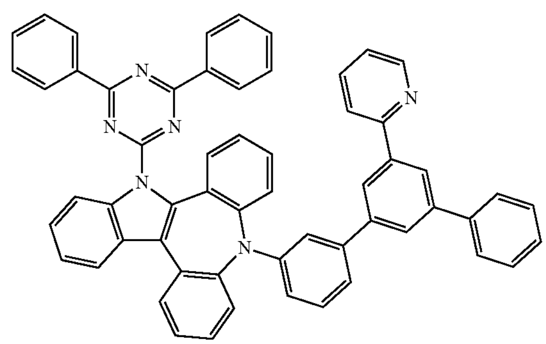
2-20a
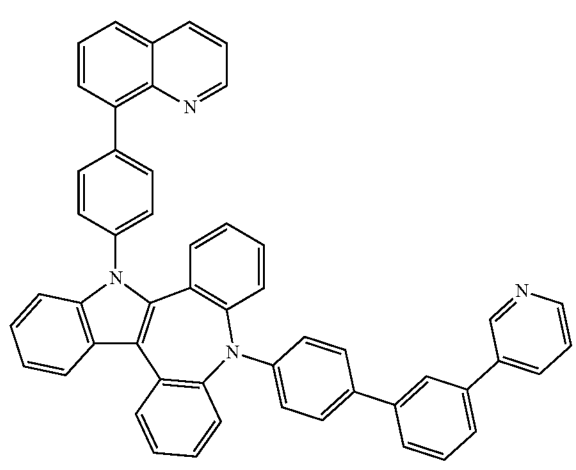

-continued
2-21a
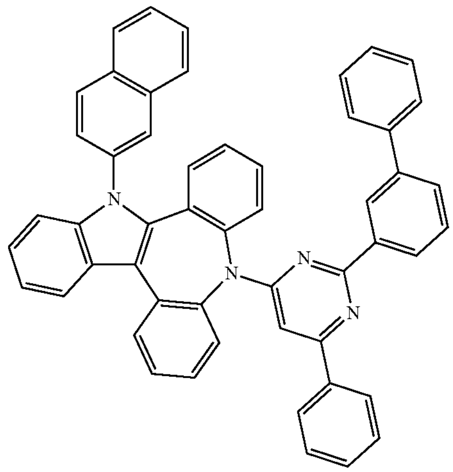
2-22a
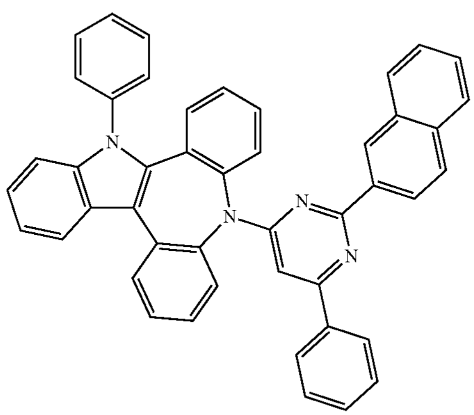
2-23a
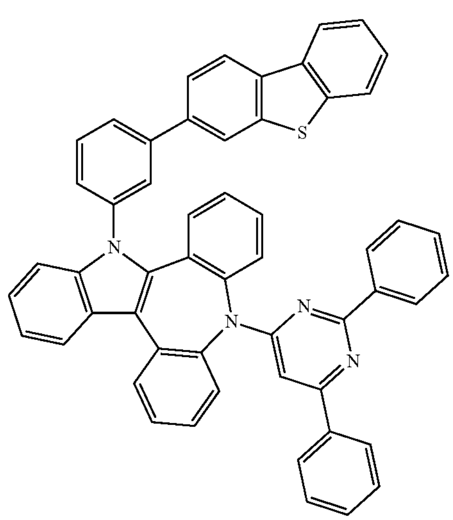
-continued
2-24a
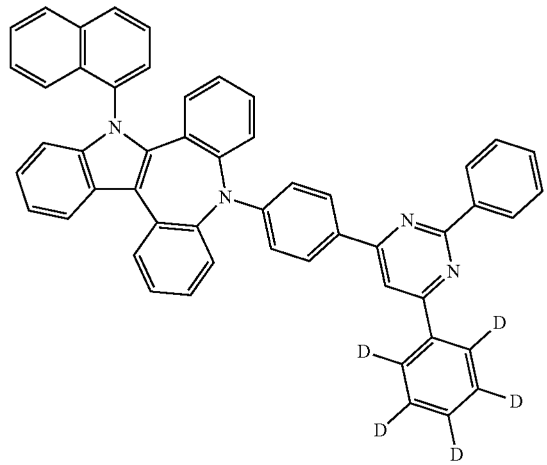
2-25a
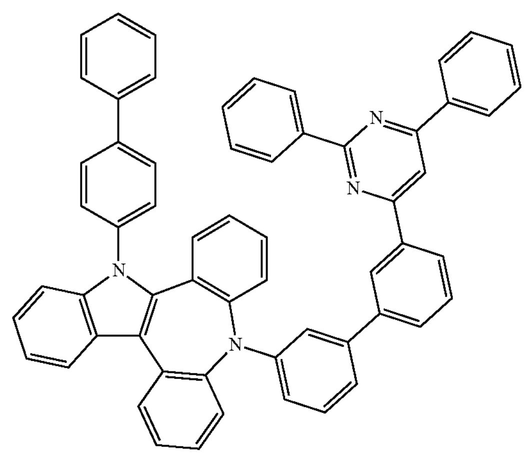
2-26a
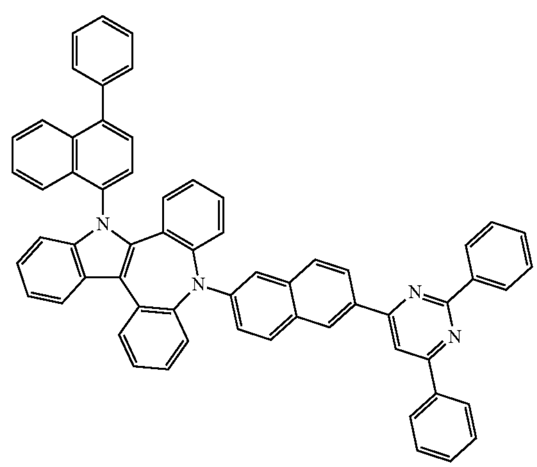

-continued
2-27a
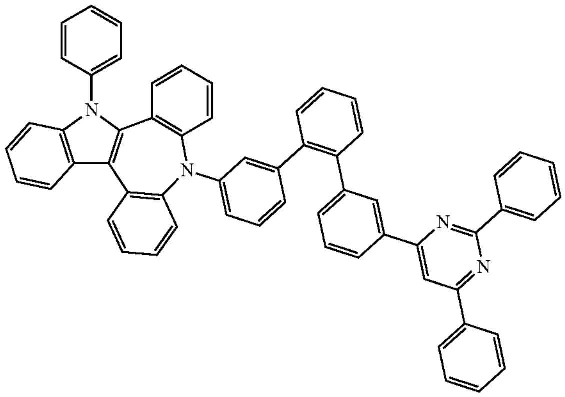
2-28a
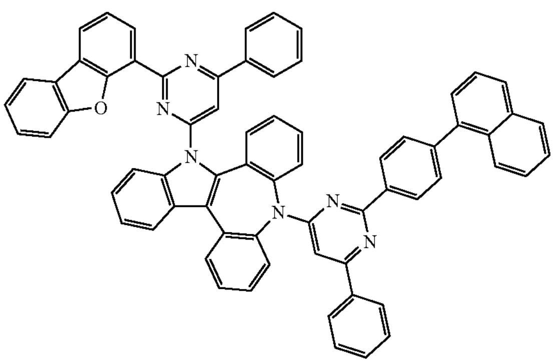
2-29a
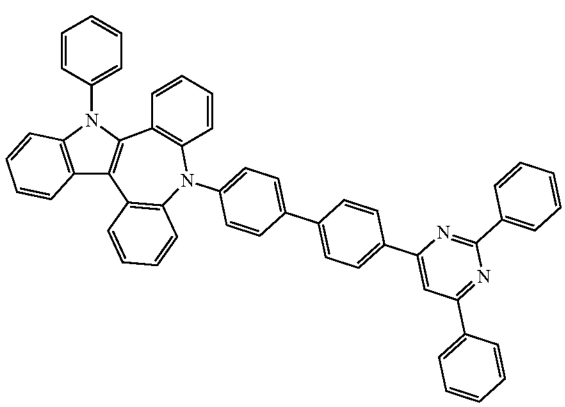
-continued
2-30a
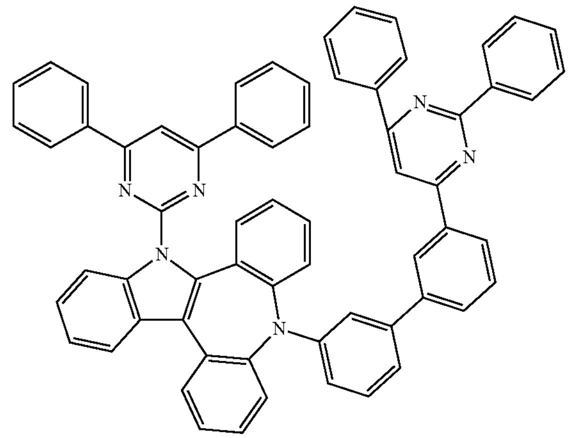
2-31a
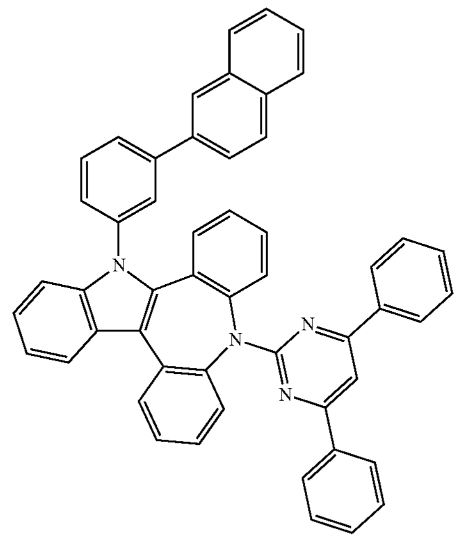
2-32a
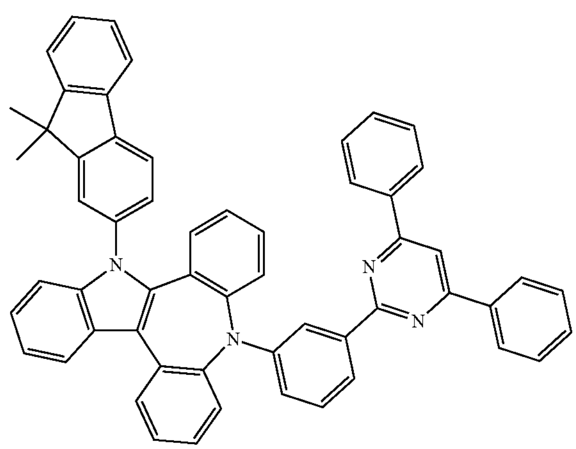

-continued
2-33a
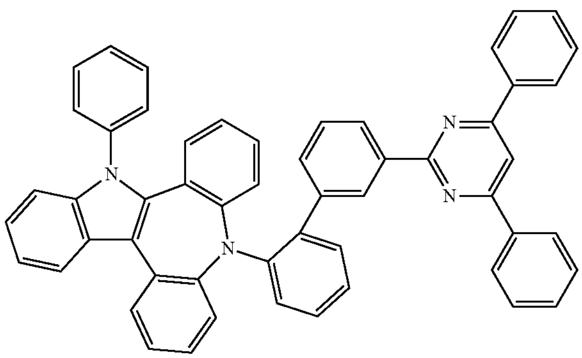
2-34a
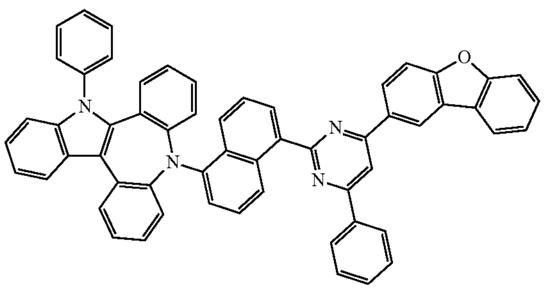
2-35a
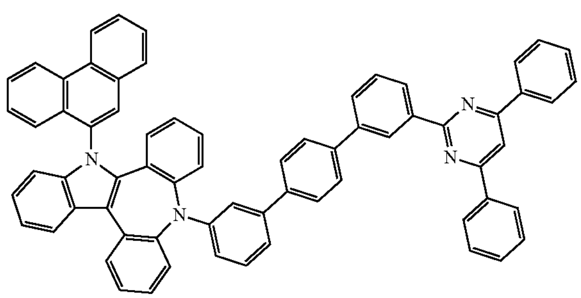
2-36a
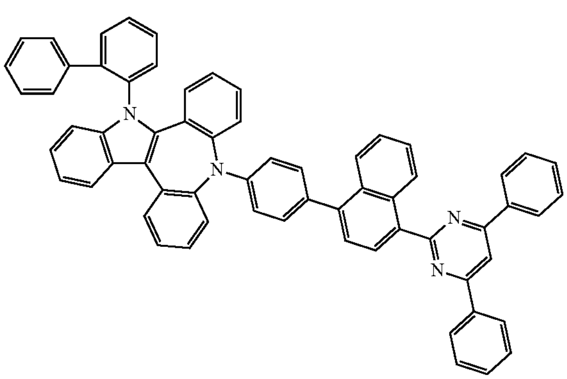
-continued
2-37a
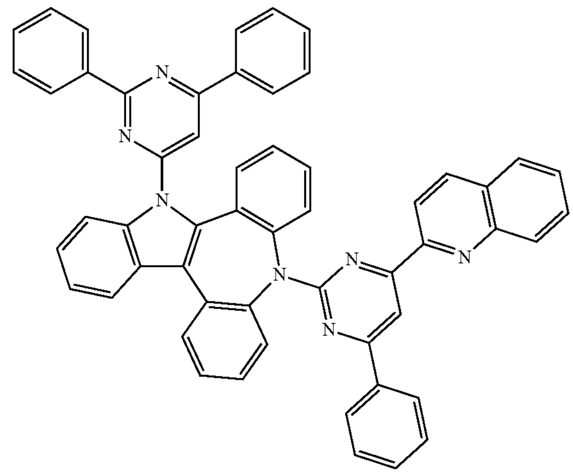
2-38a
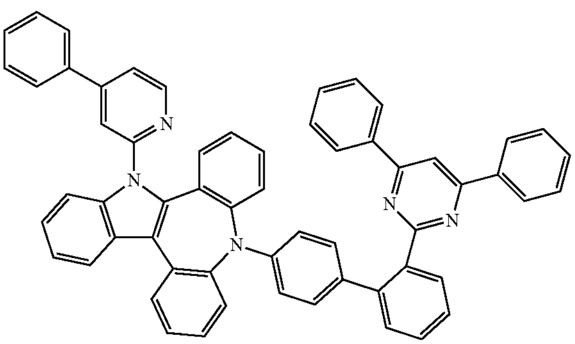
2-39a
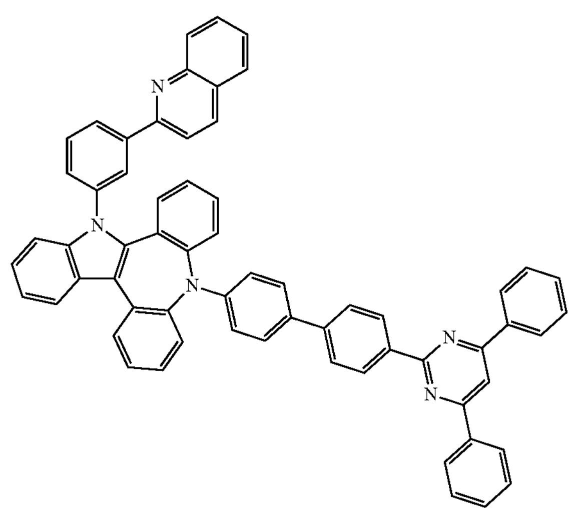

-continued
2-40a
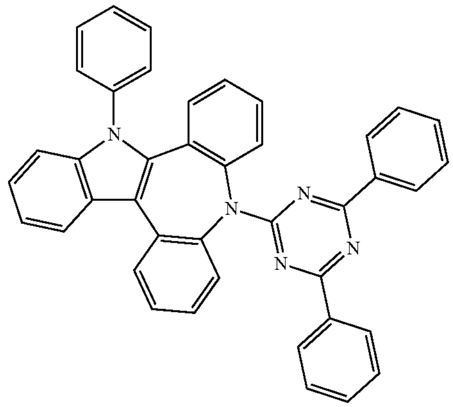
2-41a
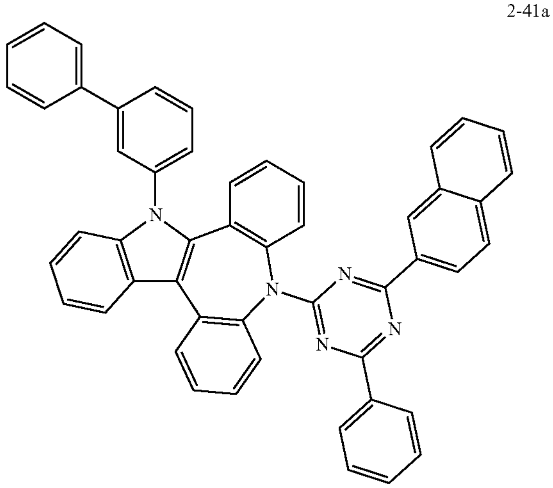
2-42a
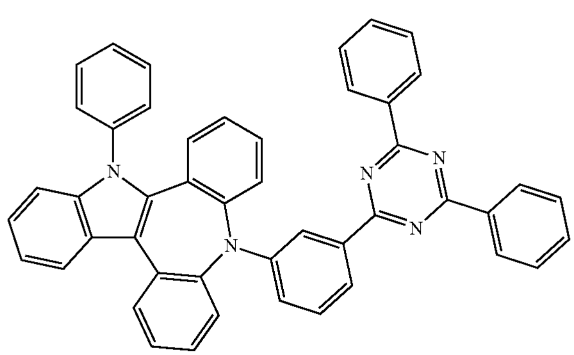
-continued
2-43a
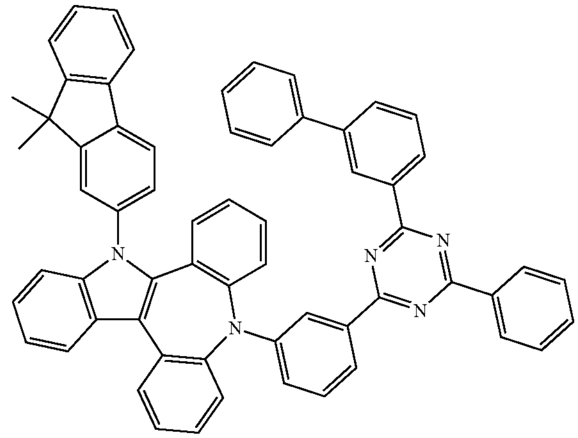
2-44a
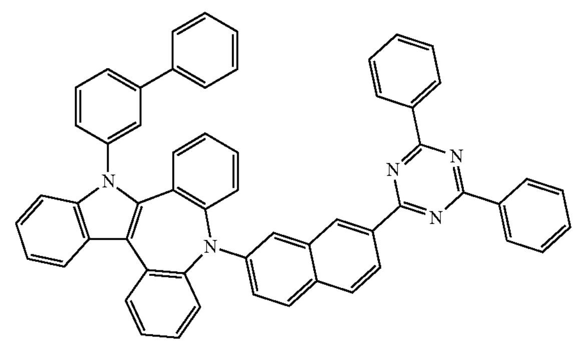
2-45a
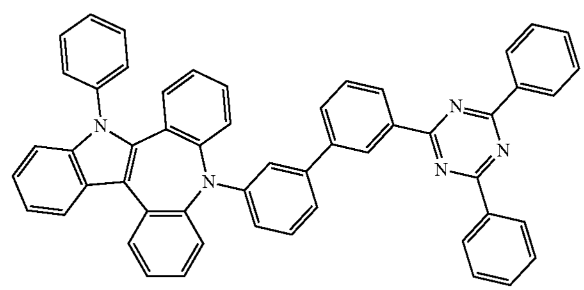
2-46a
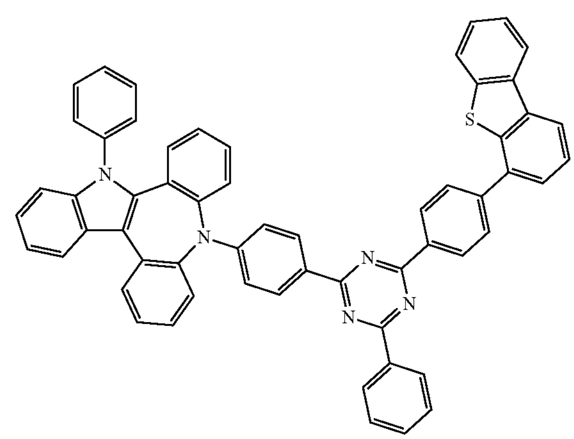

-continued
2-47a
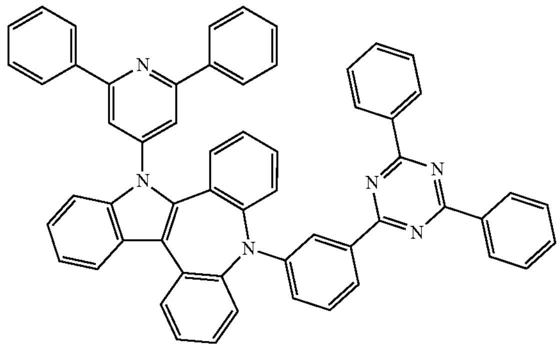
2-48a
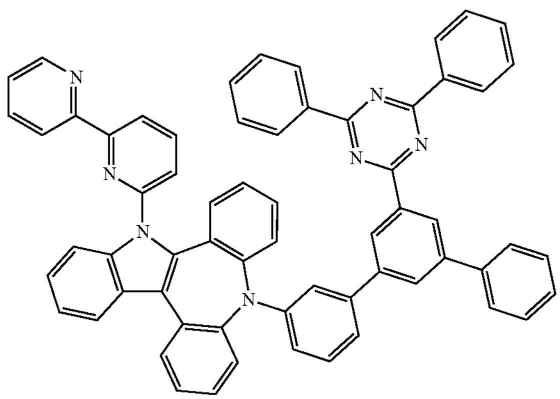
2-49a
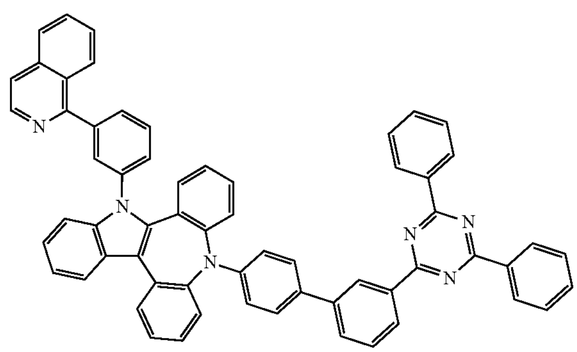
2-50a
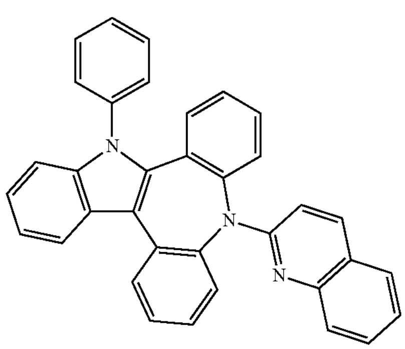
-continued
2-51a
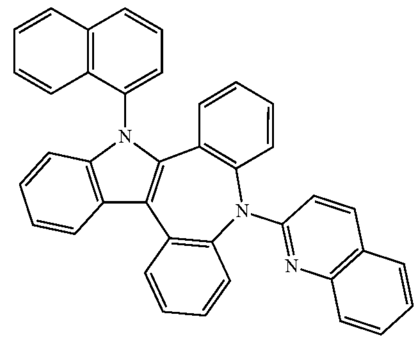
2-52a
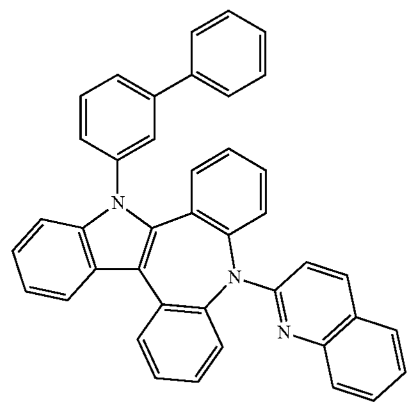
2-53a
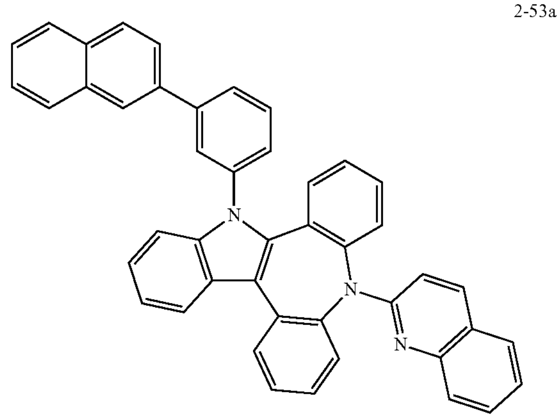
2-54a
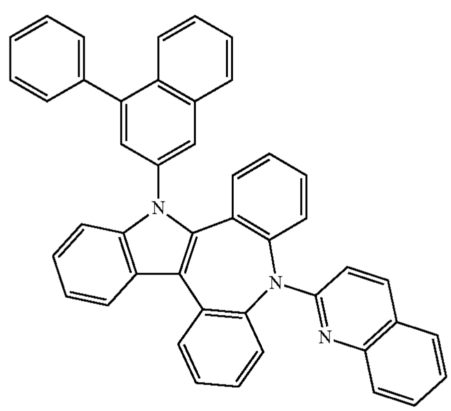

-continued
2-55a
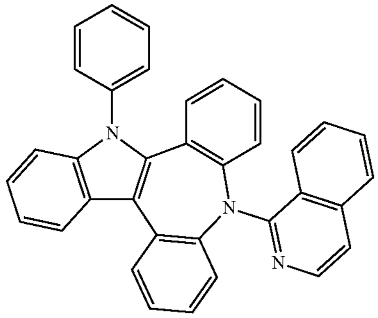
2-56a
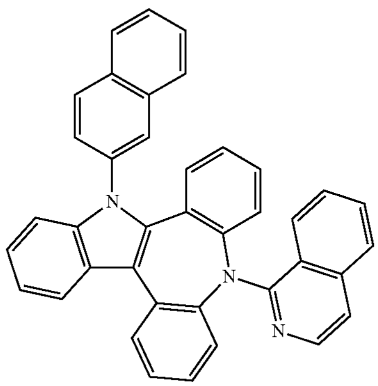
2-57a
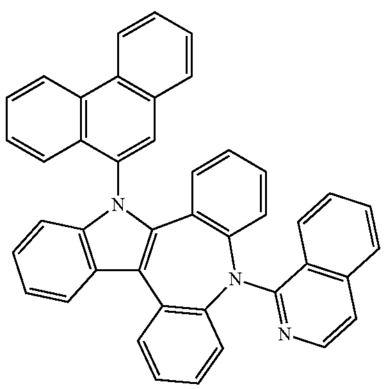
2-58a
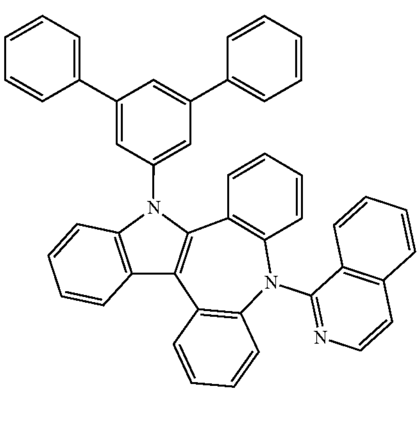
-continued
2-59a
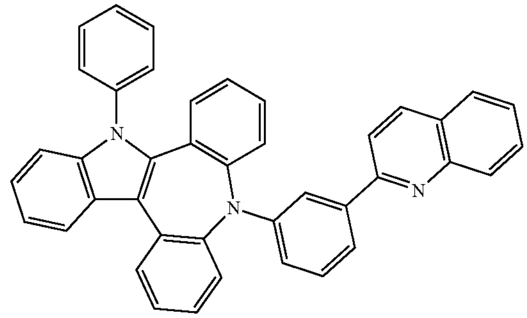
2-60a
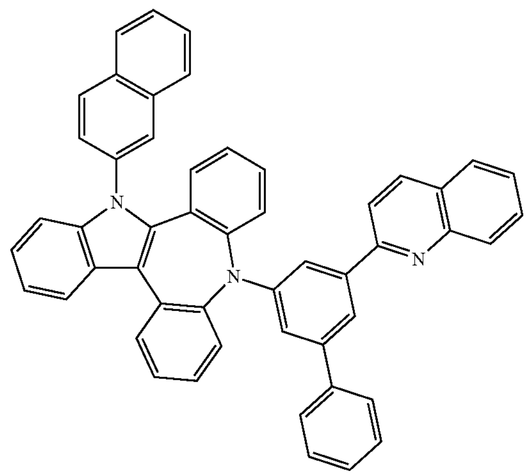
2-61a
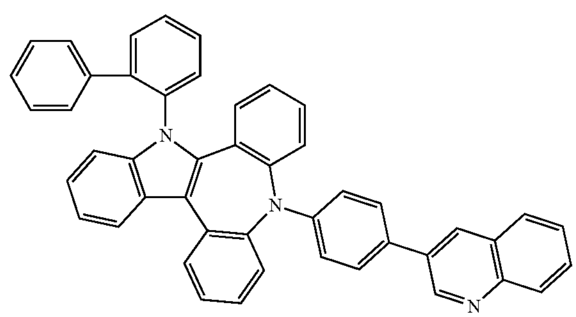

-continued
2-62a
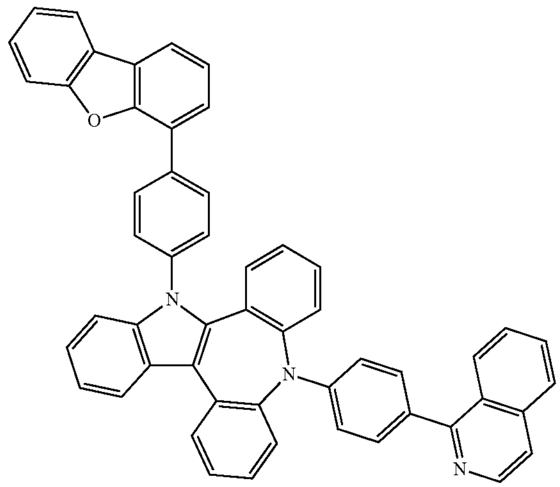
2-63a
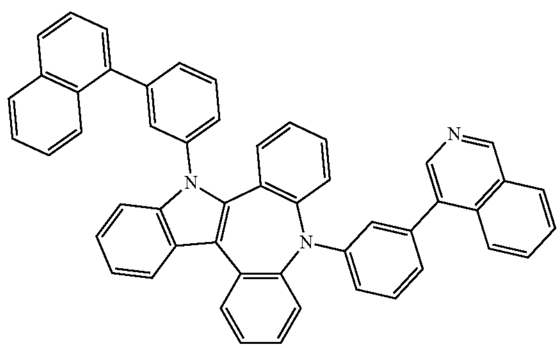
2-64a
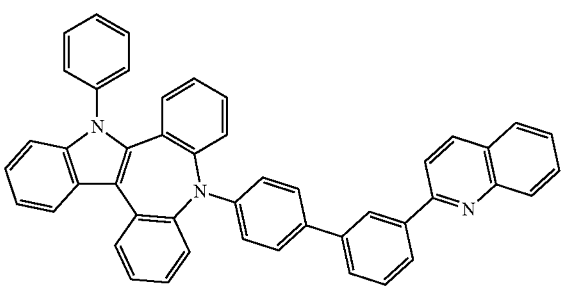
2-65a
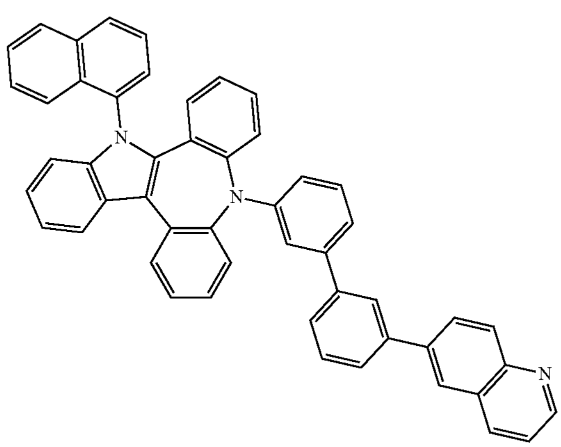
-continued
2-66a
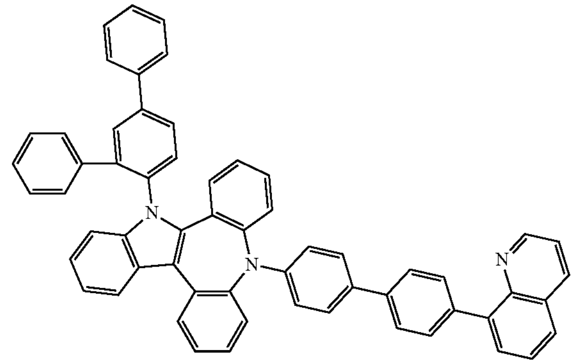
2-67a
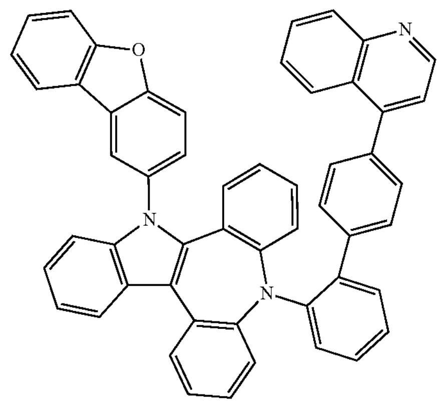
2-68a
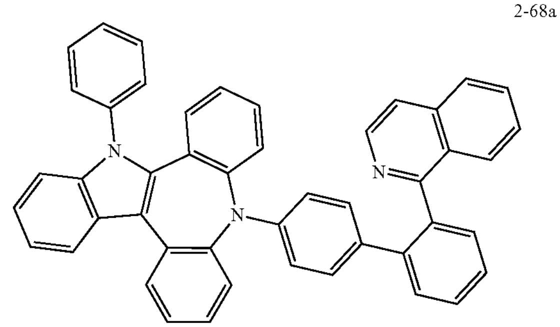
2-69a
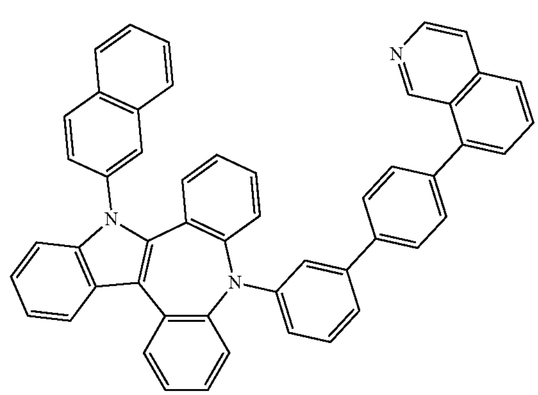

-continued
2-70a
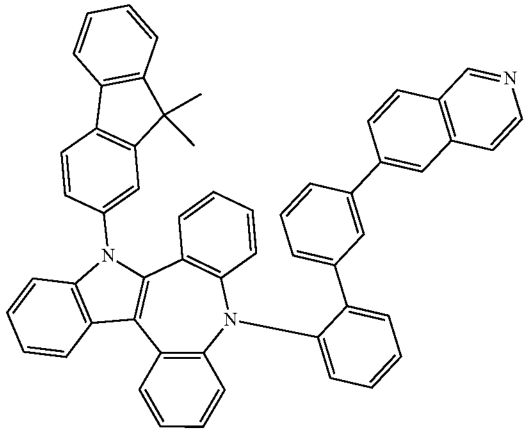
2-71a
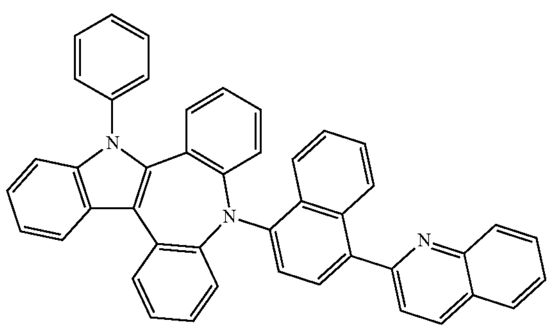
2-72a
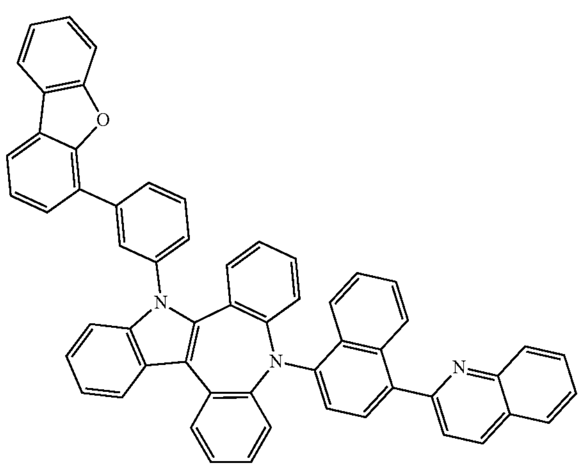
-continued
2-73a
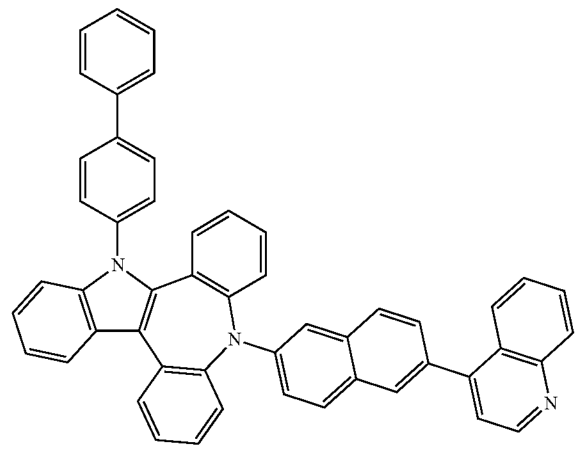
2-74a
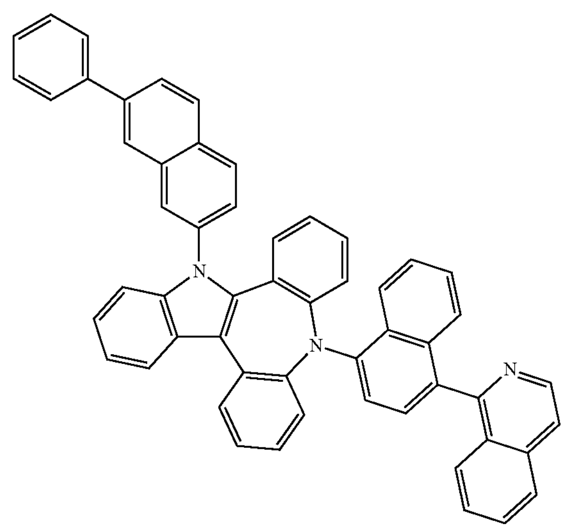
2-75a
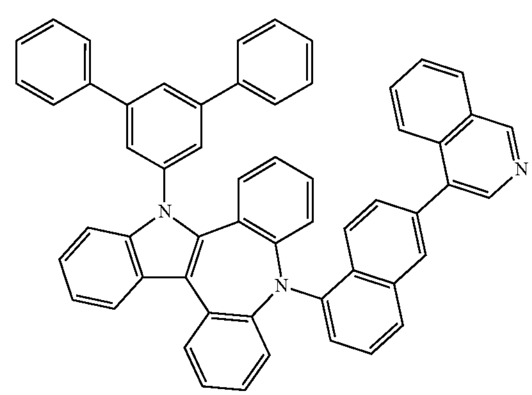

-continued
2-76a
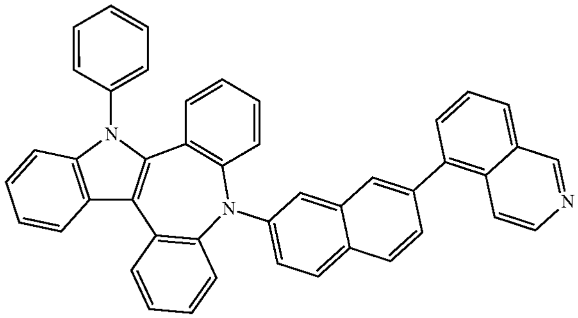
2-77a
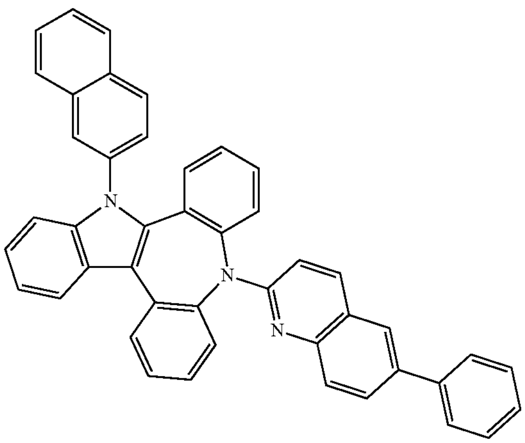
2-78a
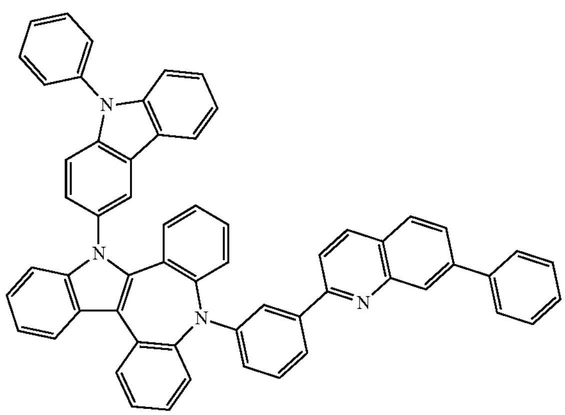
2-79a
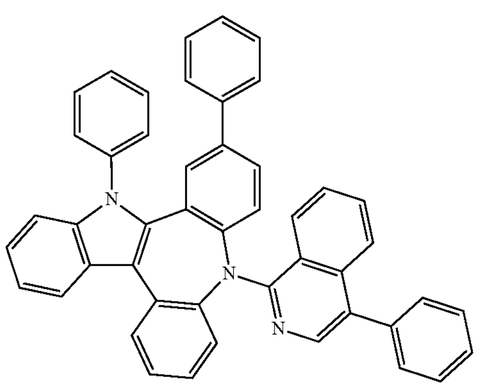
-continued
2-80a
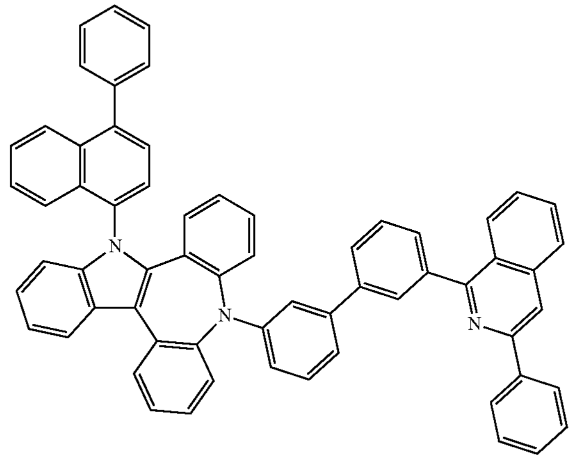
2-81a
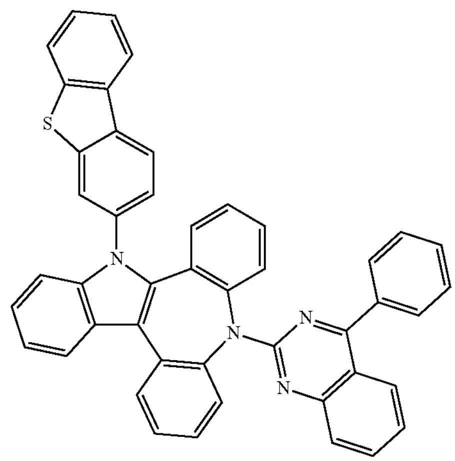
2-82a
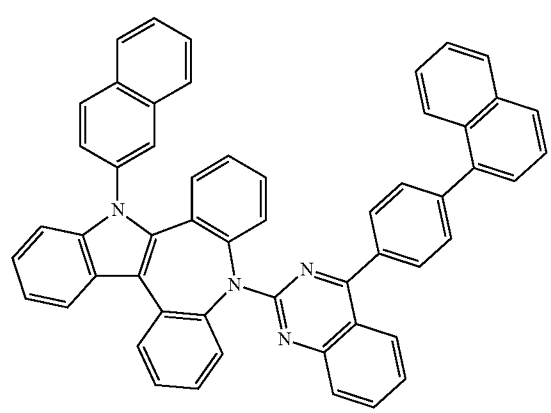

-continued
2-83a
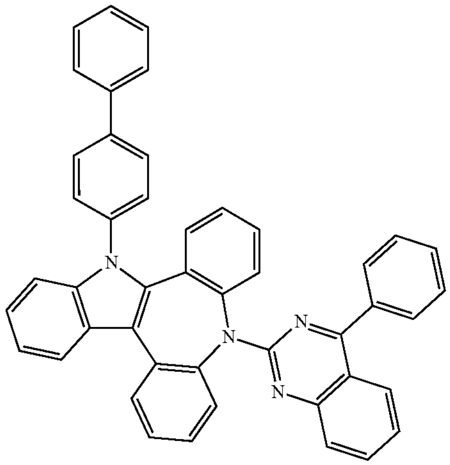
2-84a
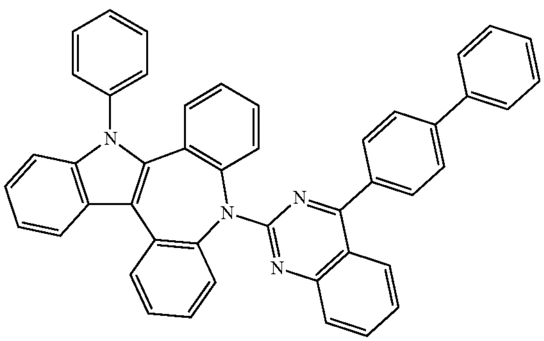
2-85a
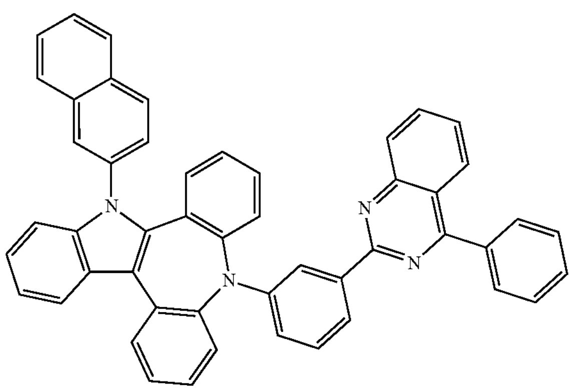
2-86a
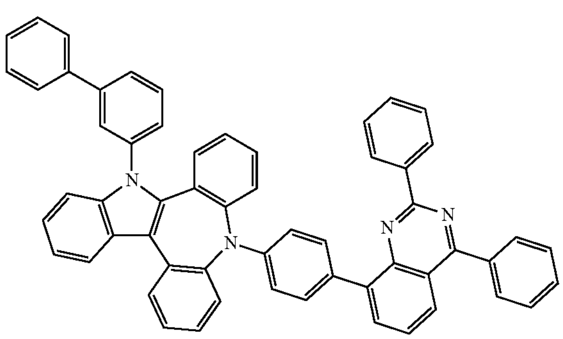
-continued
2-87a
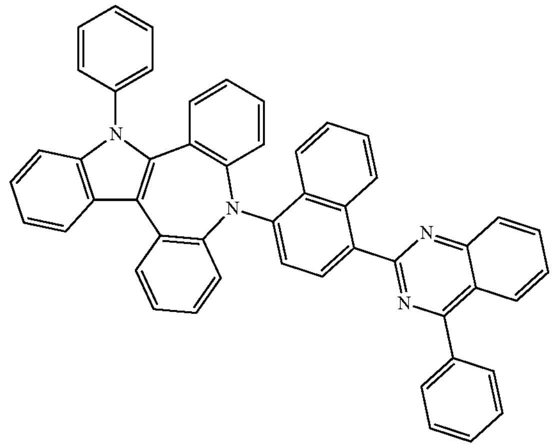
2-88a
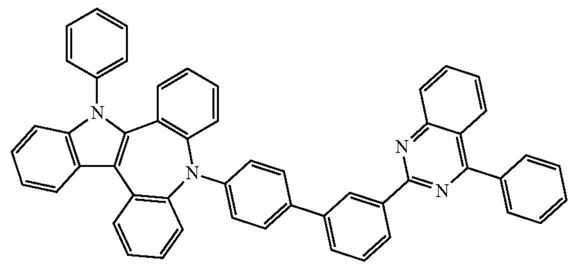
2-89a
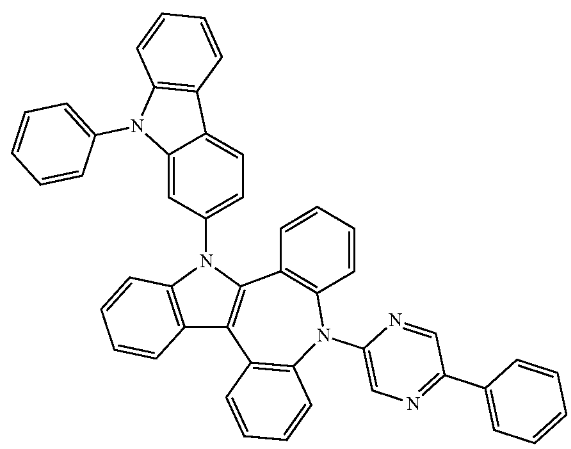
2-90a
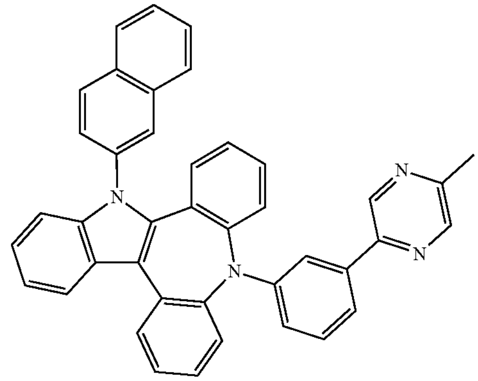

2-91a
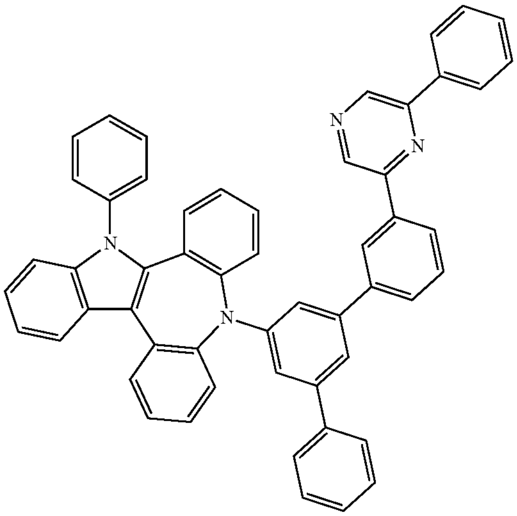
2-92a
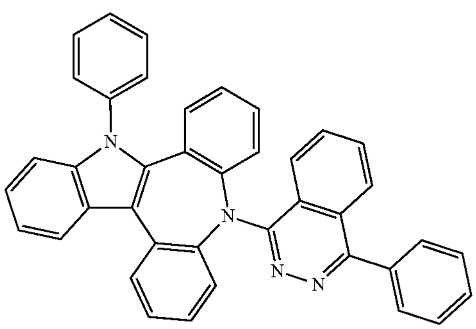
2-93a
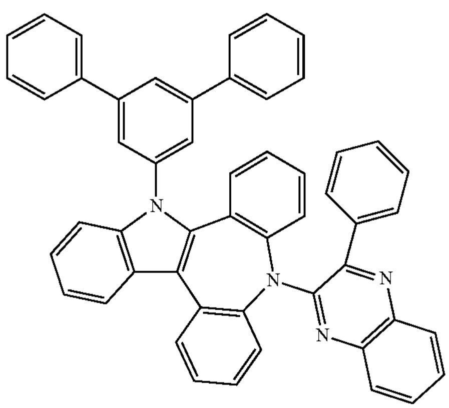
2-94a
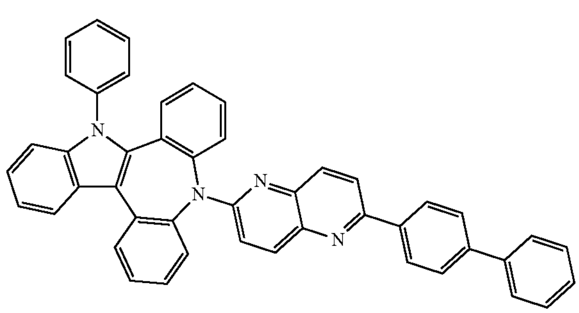
2-95a
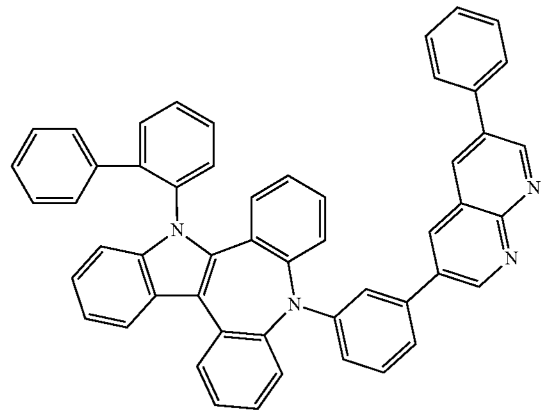
2-96a
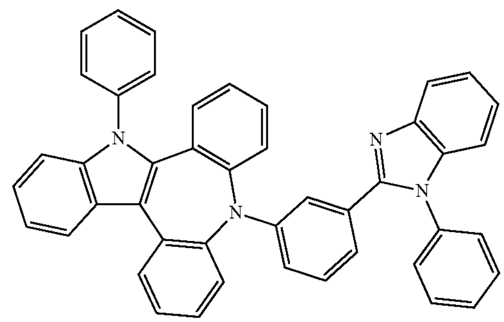
2-97a
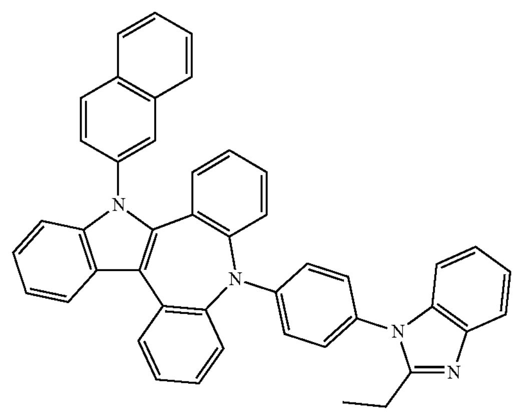
2-98a
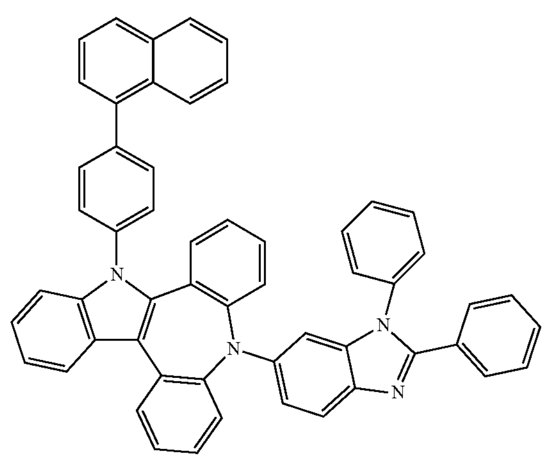

-continued
2-99a
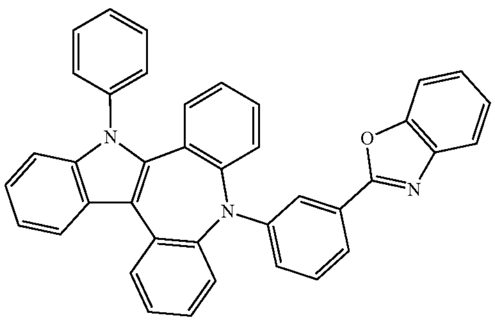
2-100a
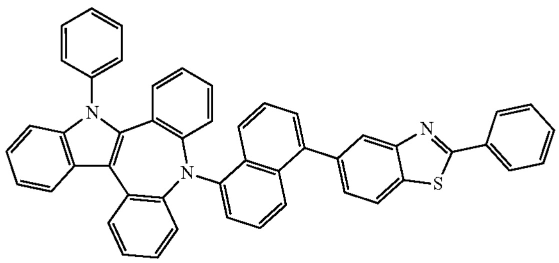
2-101a
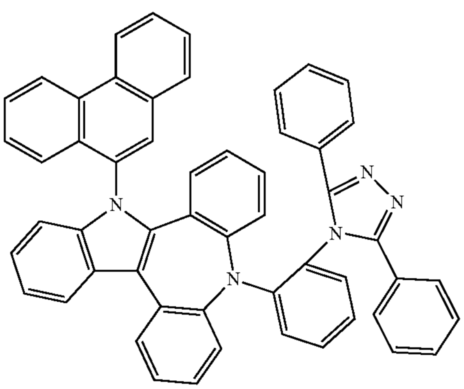
2-102a
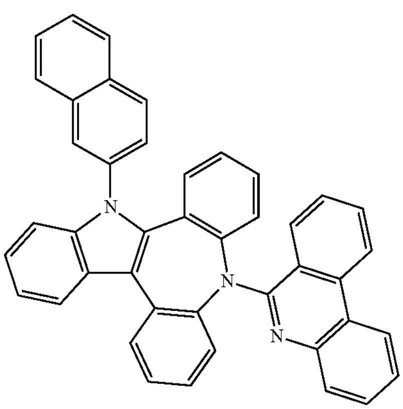
-continued
2-103a
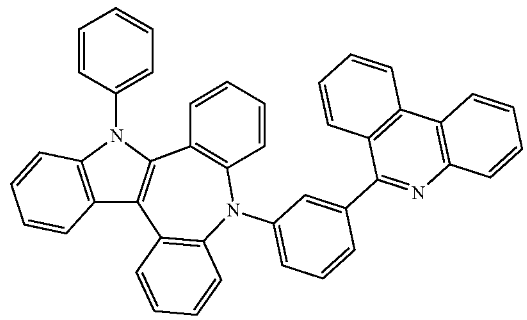
2-104a
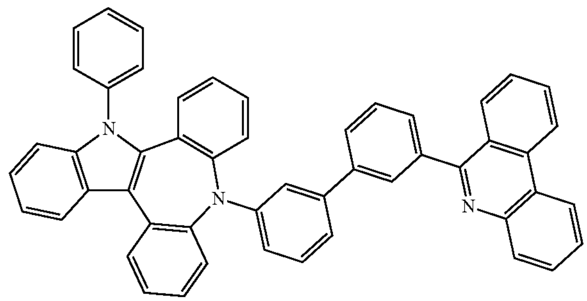
2-105a
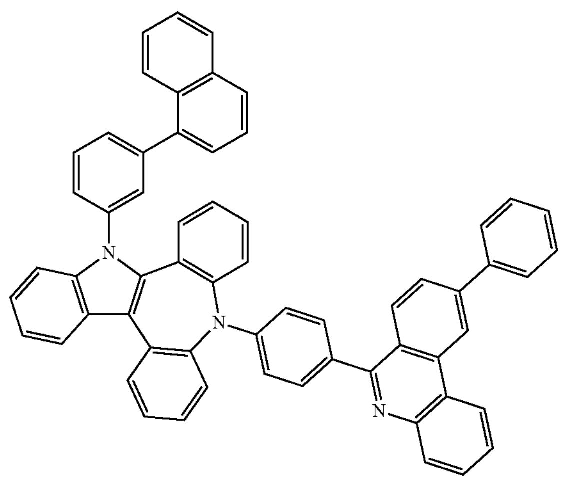
2-106a
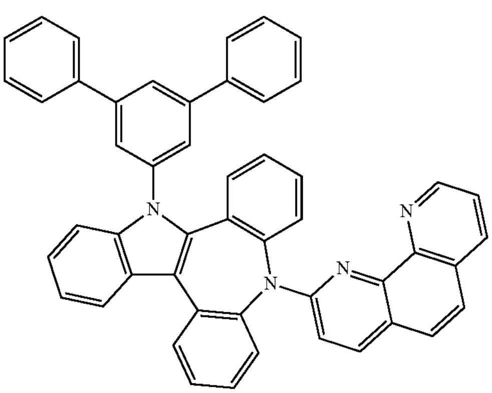

-continued
2-107a
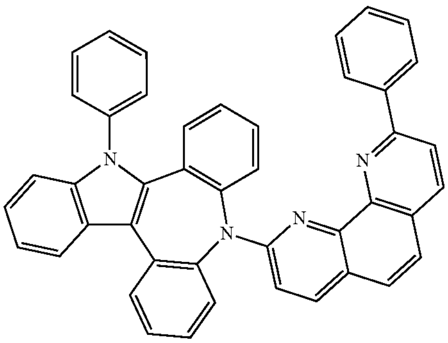
2-108a
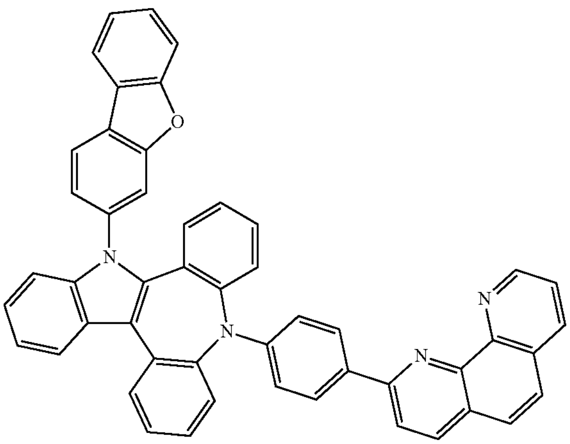
2-109a
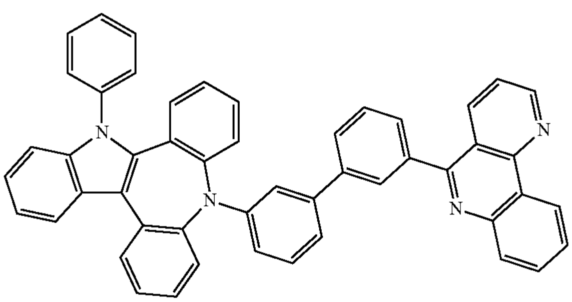
2-110a
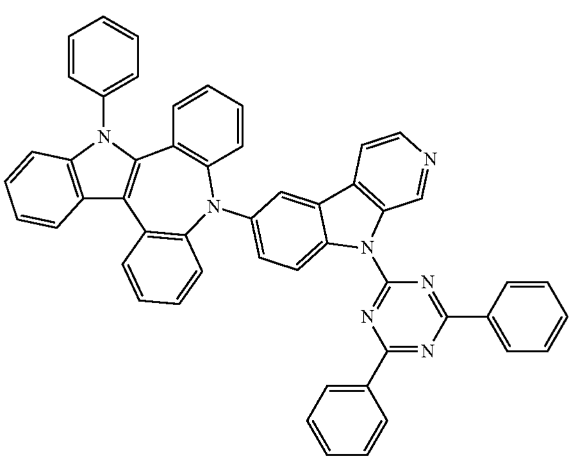
-continued
2-111a
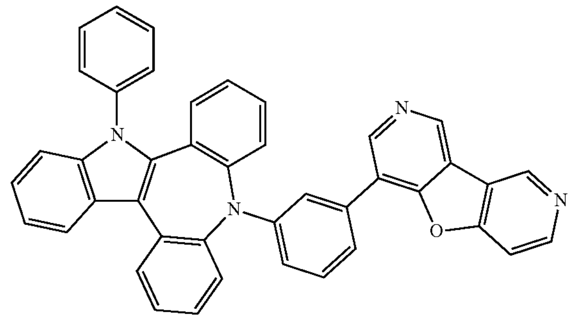
2-112a
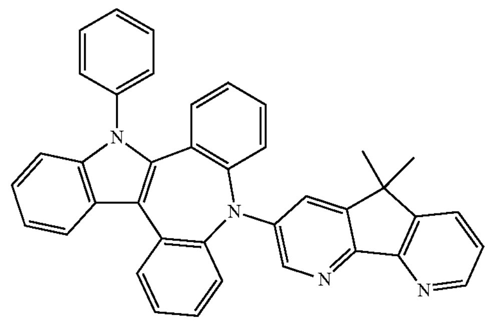
2-113a
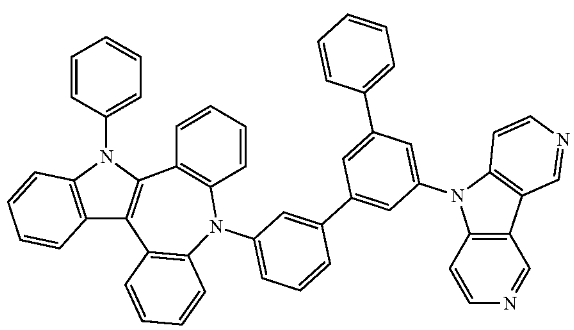
2-114a
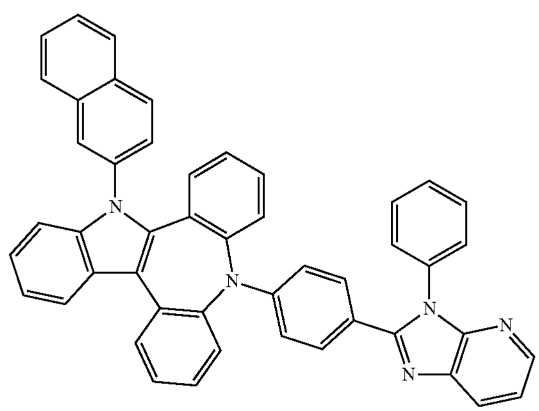

2-115a
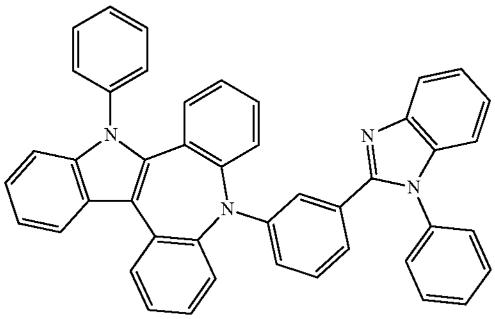
2-116a
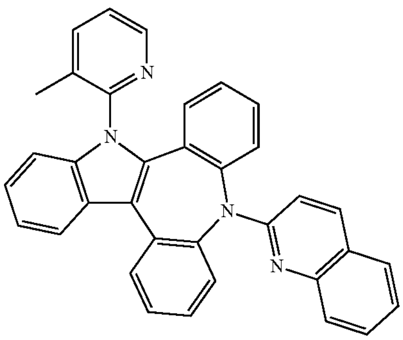
2-117a
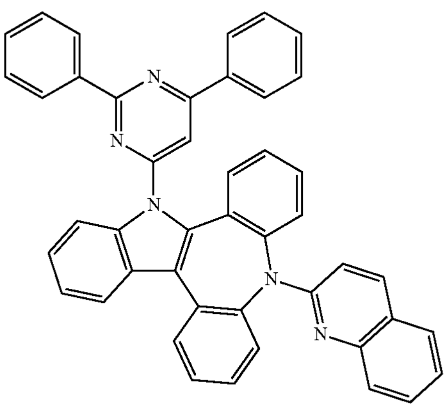
2-118a
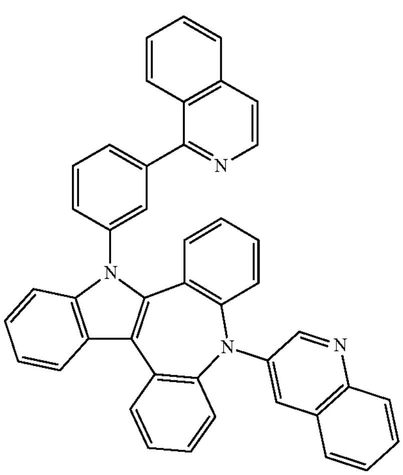
2-119a
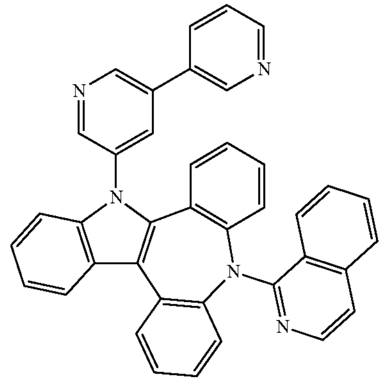
2-120a
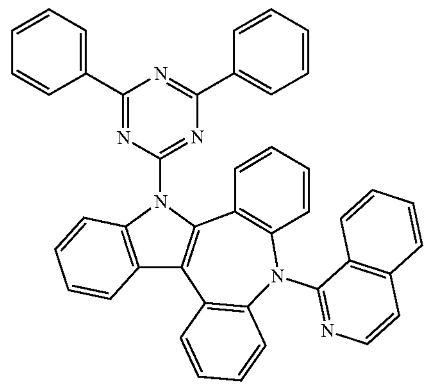
2-121a
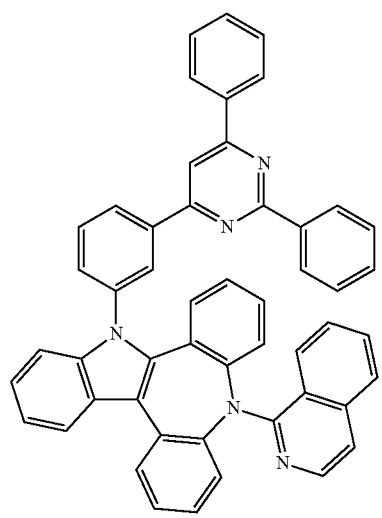

-continued
2-122a
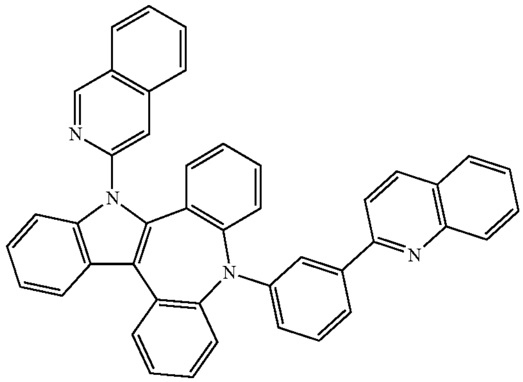
2-123a
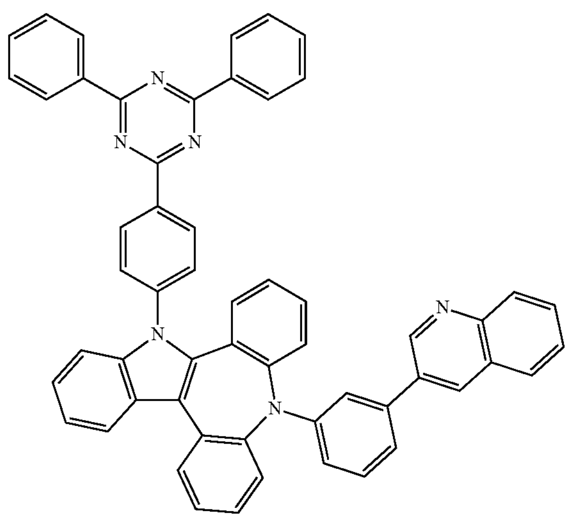
2-124a
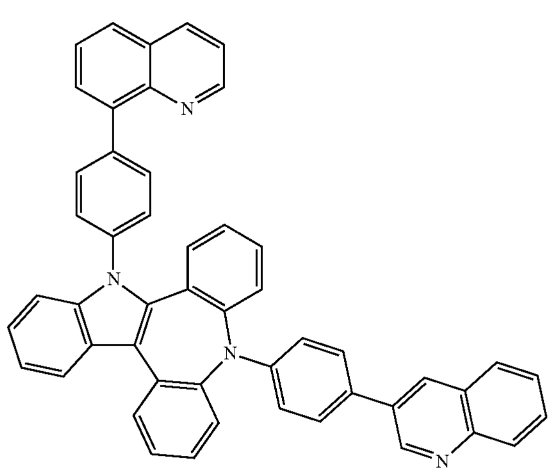
-continued
2-125a
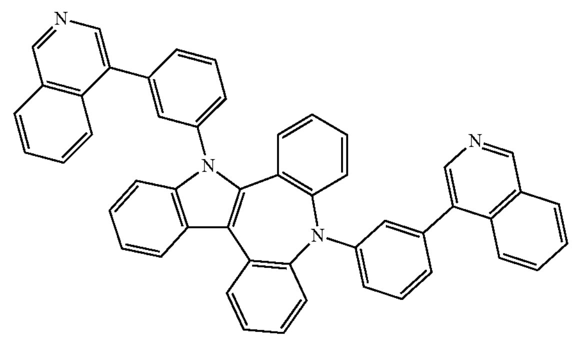
2-126a
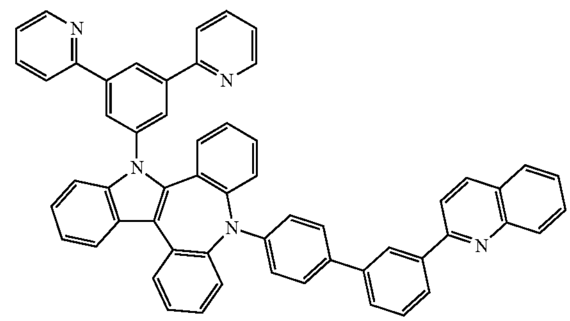
2-127a
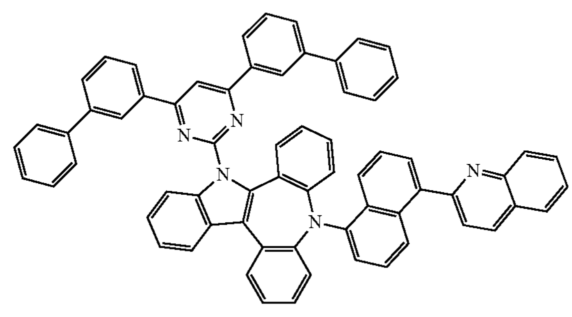
2-128a
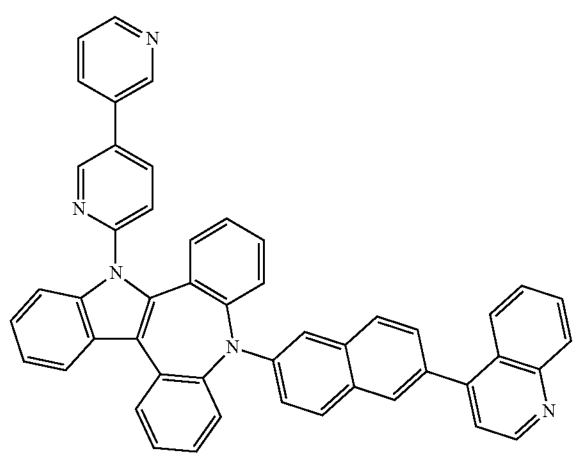

-continued
2-129a
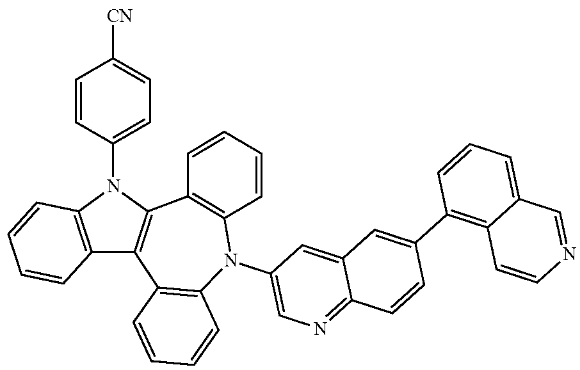
2-130a
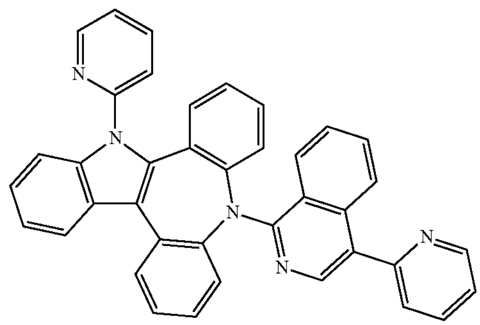
2-131a
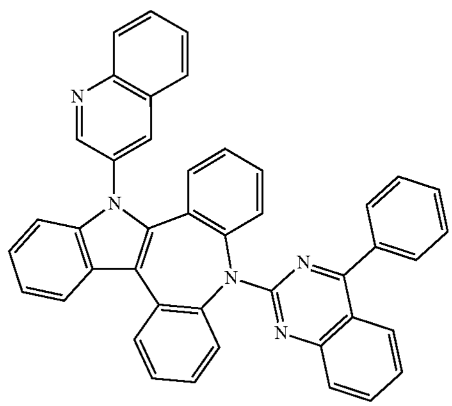
2-132a
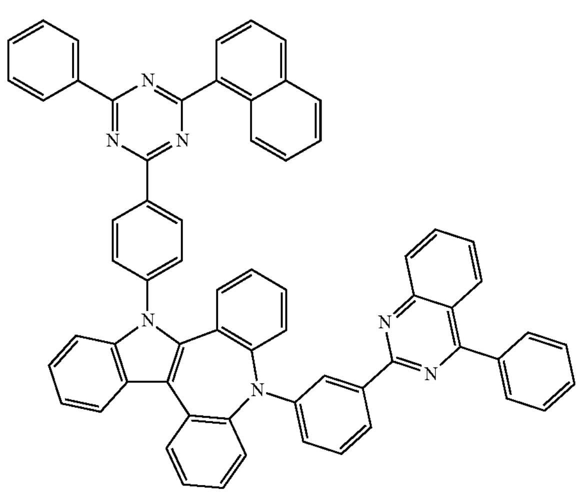
-continued
2-133a
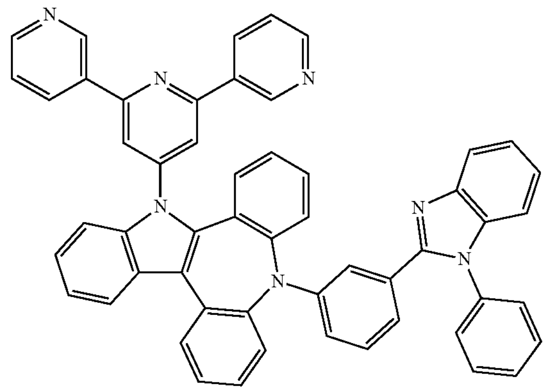
2-134a
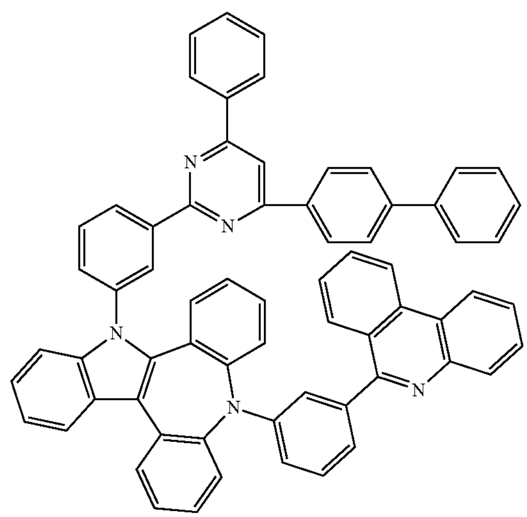
2-135a
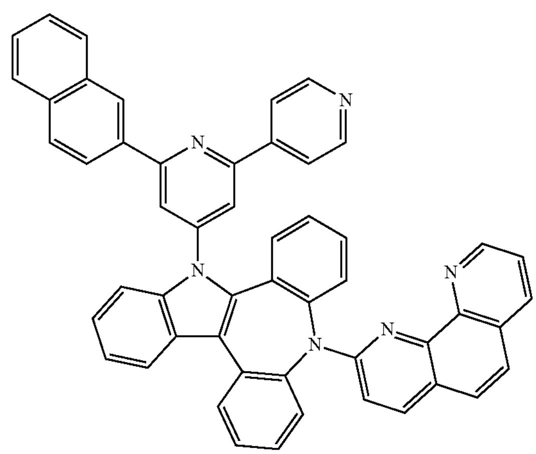

-continued
2-136a
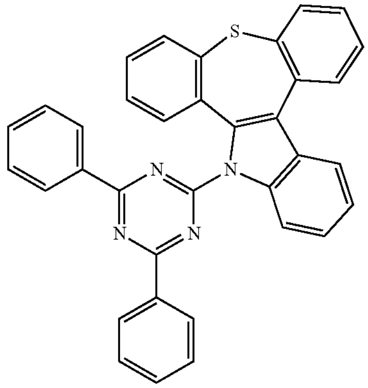
2-137a
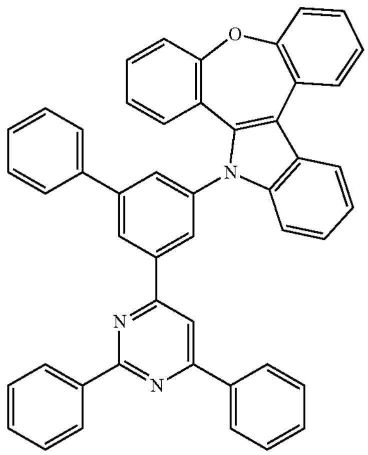
2-138a
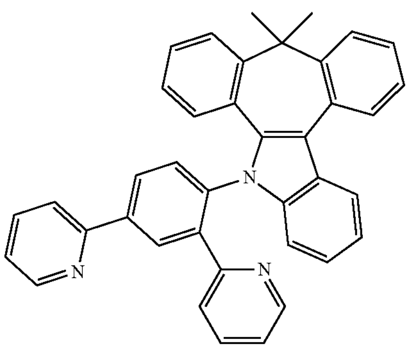
2-139a
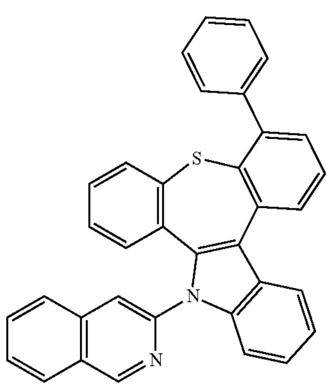
-continued
2-140a
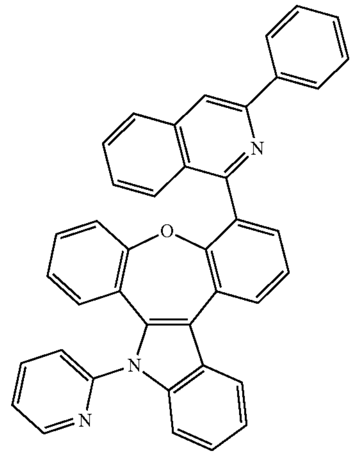
2-141a
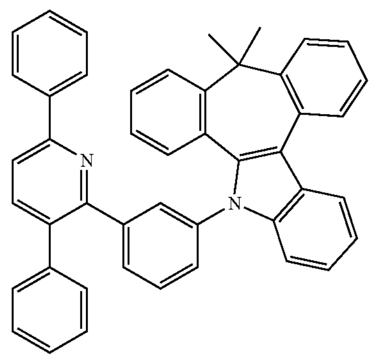
2-142a
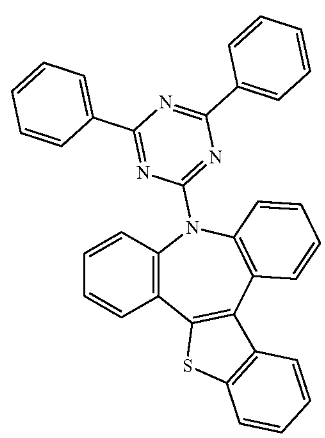

-continued
2-143a
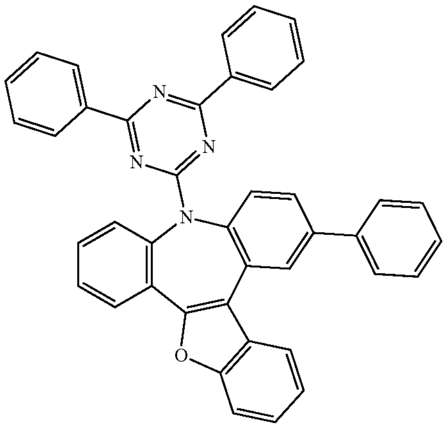
2-144a
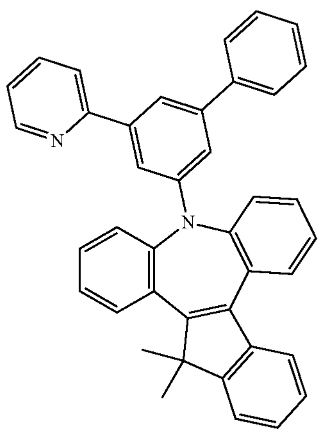
2-145a
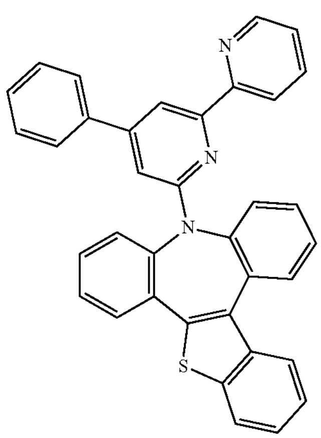
-continued
2-146a
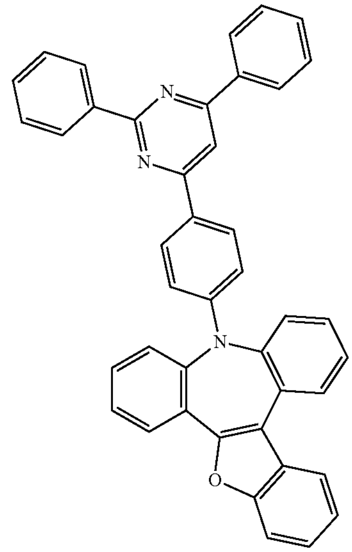
2-147a
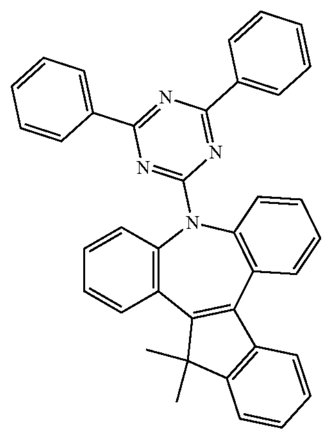
2-148a
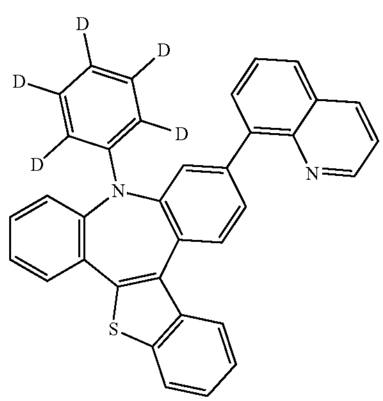

-continued
2-149a
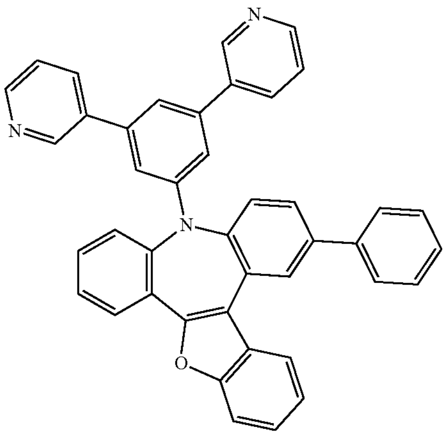
2-150a
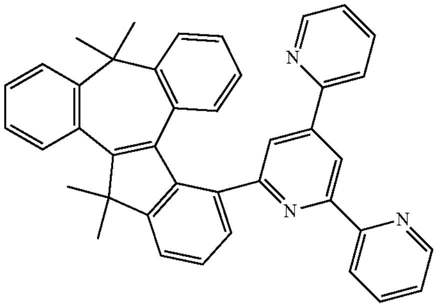
2-151a
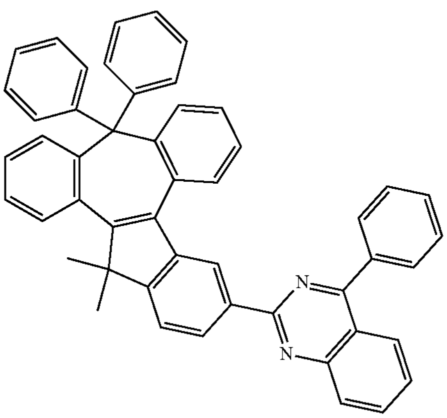
2-152a
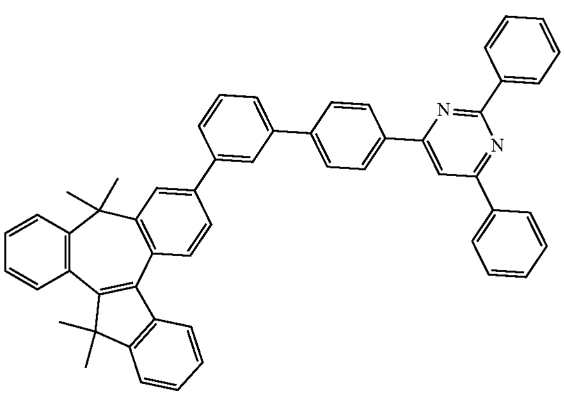
-continued
2-153a
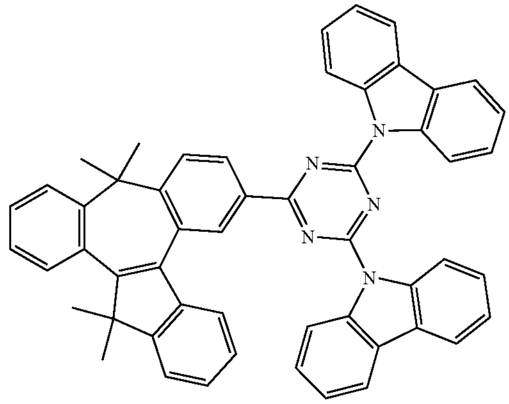
2-154a
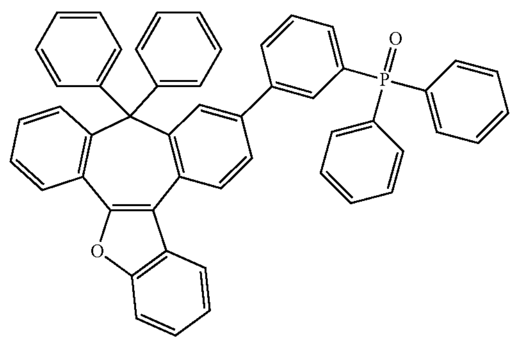
2-155a
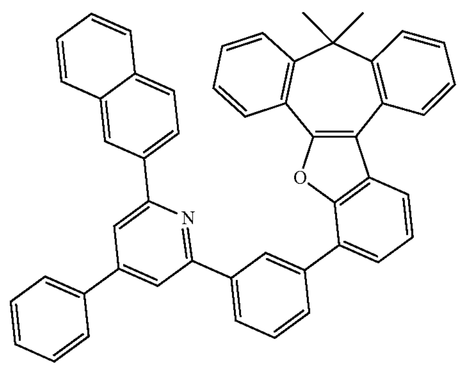
2-156a
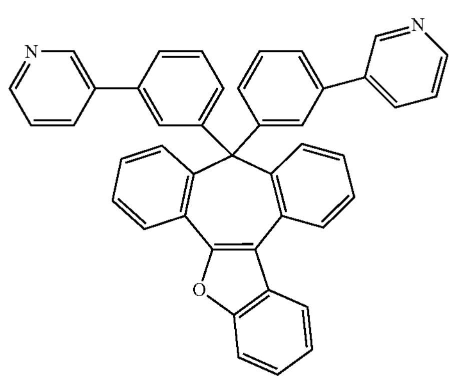

-continued
2-157a
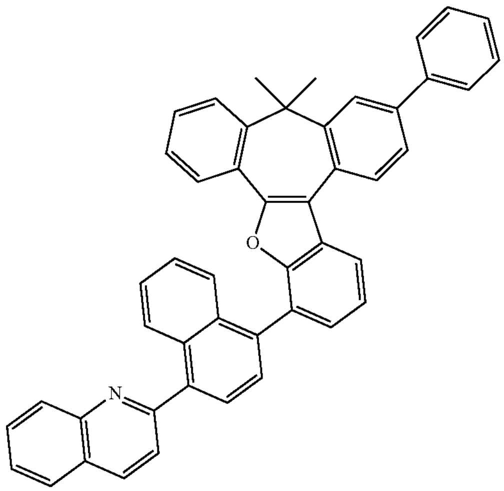
2-158a
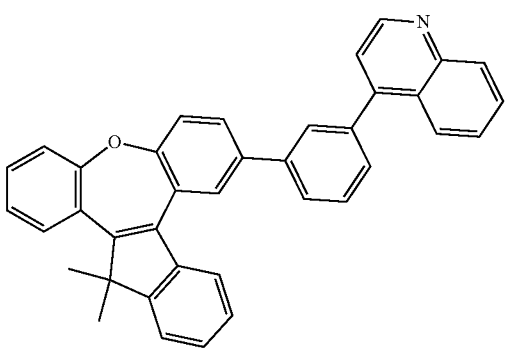
2-159a
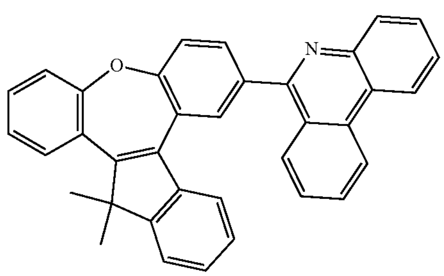
2-160a
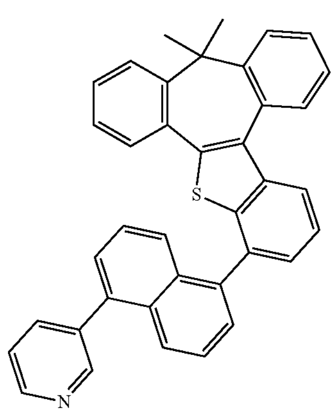
-continued
2-161a
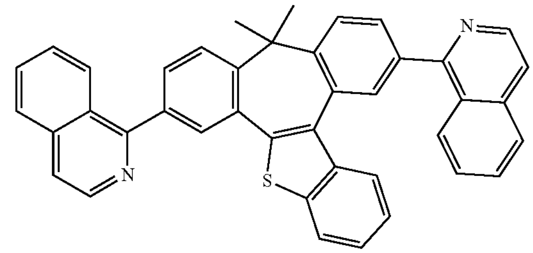
2-162a
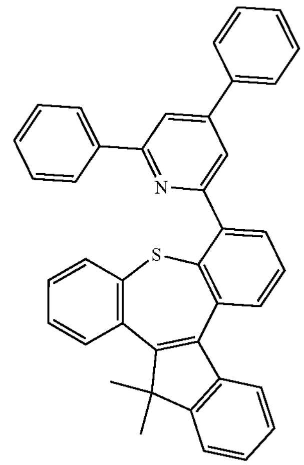
2-163a
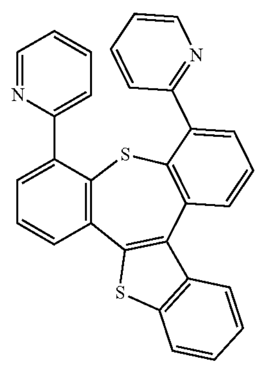
2-164a
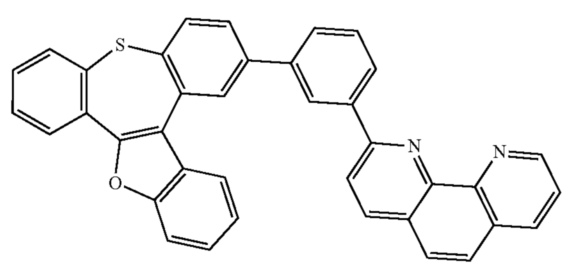
2-165a
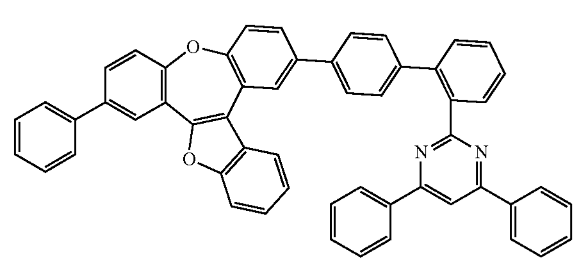

-continued
2-166a
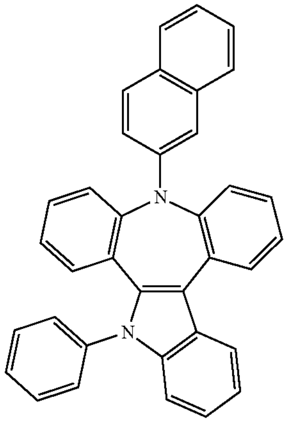
2-167a
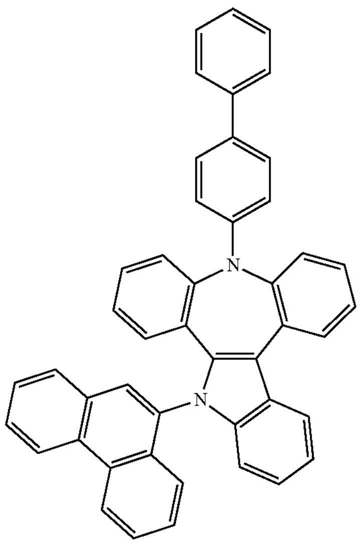
2-168a
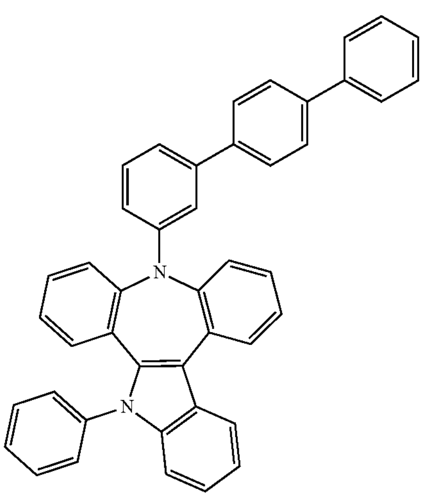
-continued
2-169a
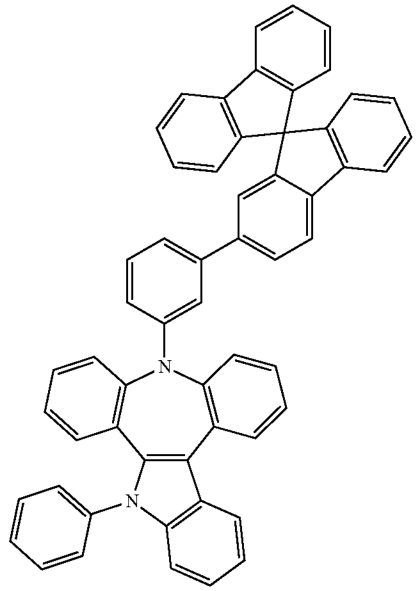
2-170a
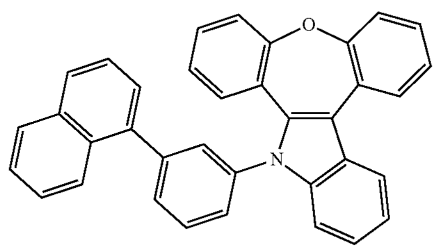
2-171a
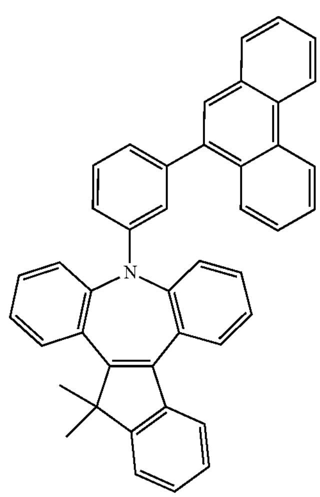

-continued
2-172a
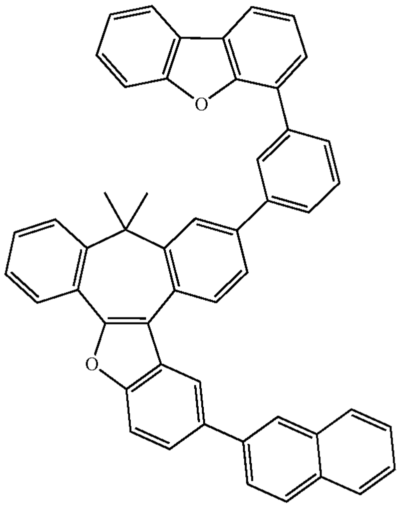
2-1
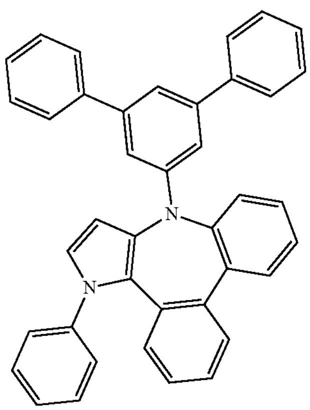
2-2
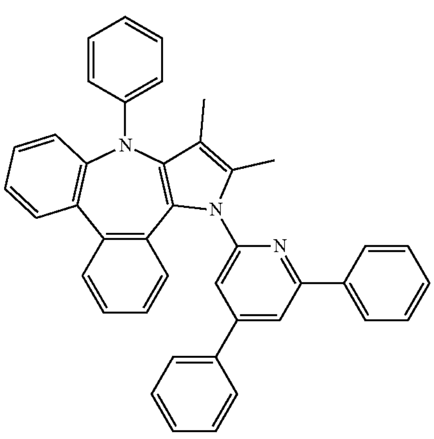
-continued
2-3
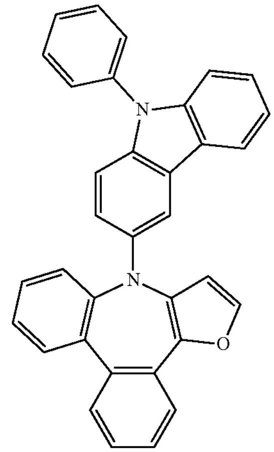
2-4
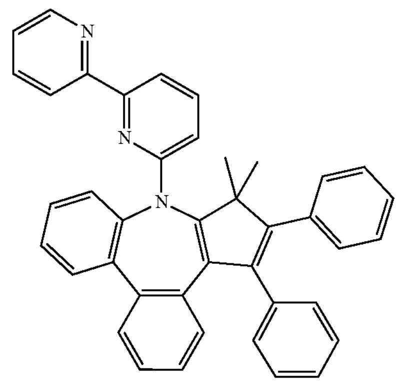
2-5
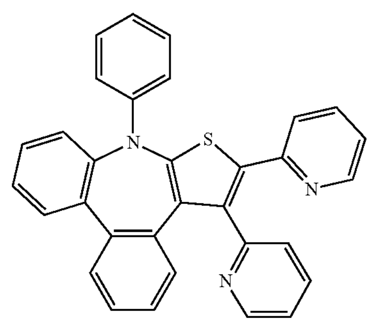
2-6
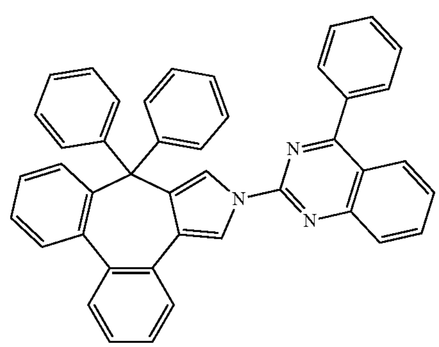

2-7
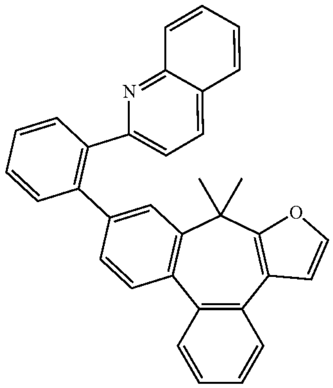
2-8
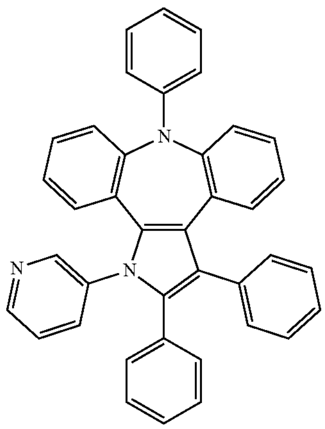
2-9
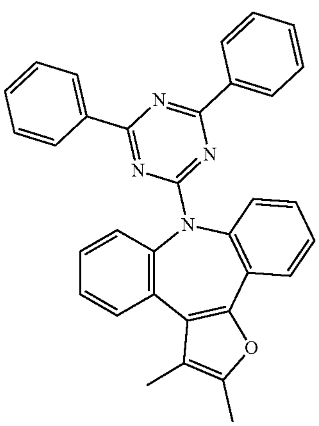
2-10
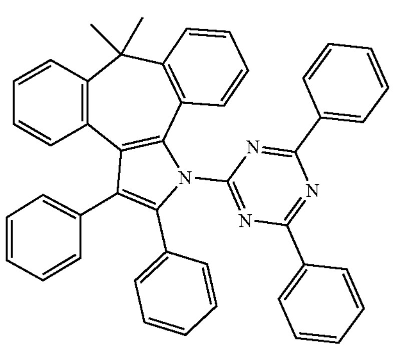
2-11
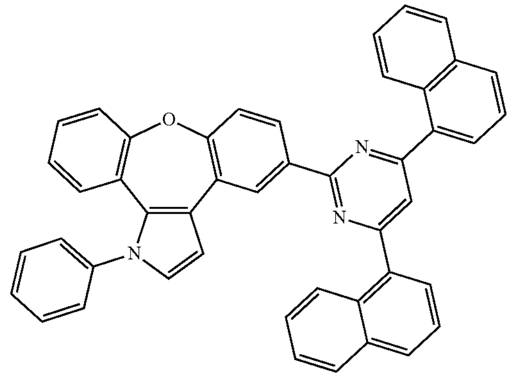
2-12
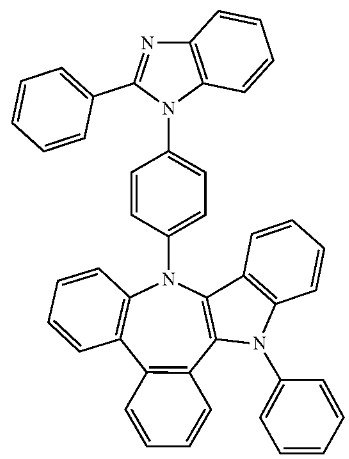
2-13
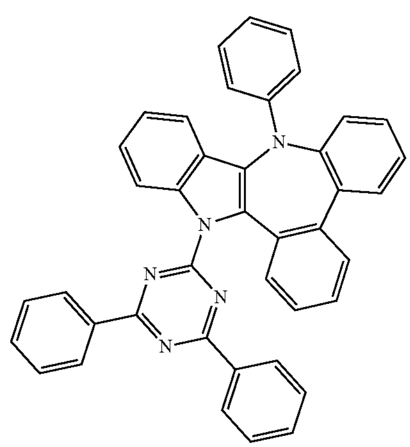

-continued
2-14
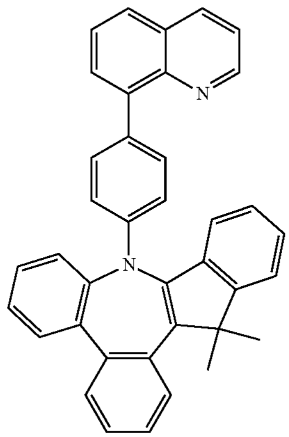
2-15
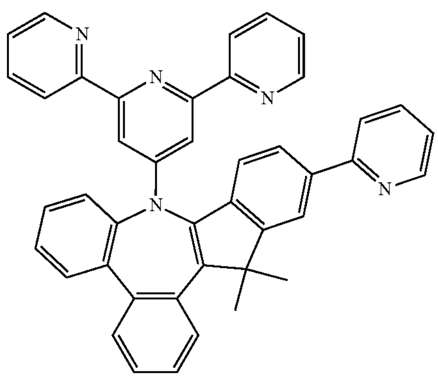
2-16
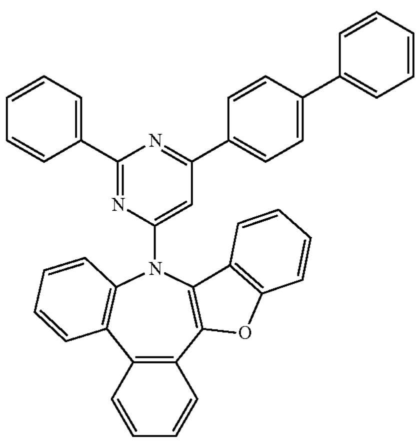
2-17
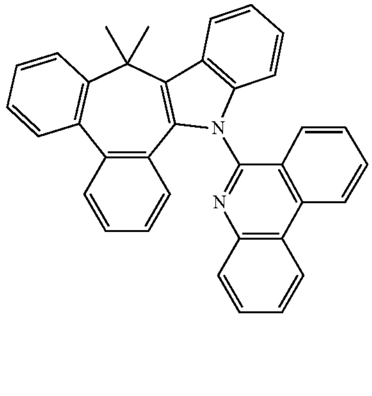
-continued
2-18
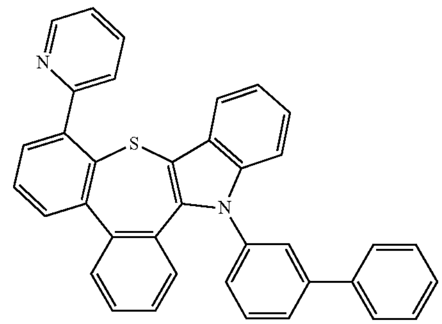
2-19
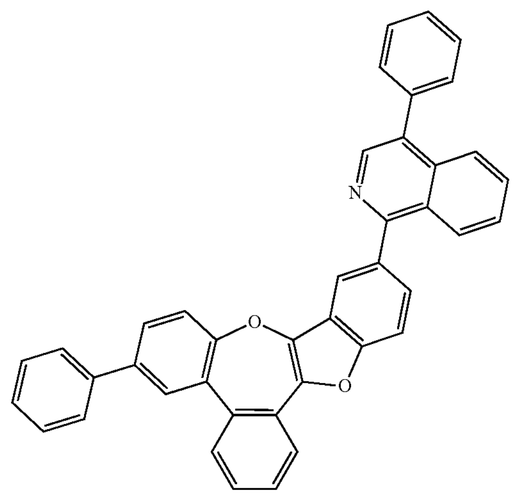
2-20
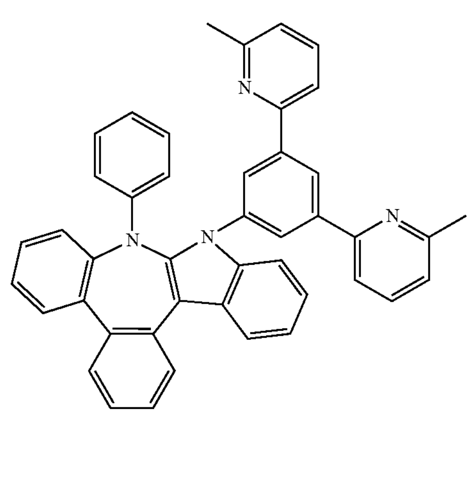

-continued
2-21
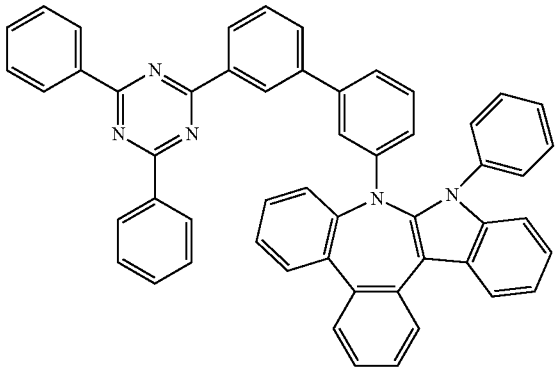
2-22
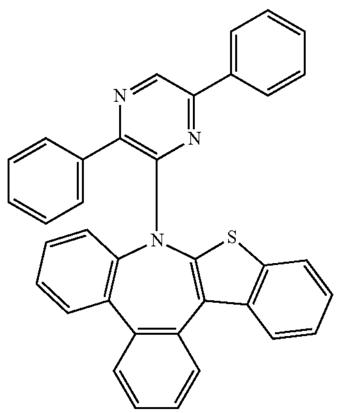
2-23
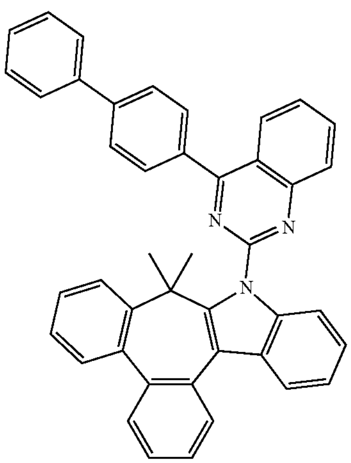
2-24
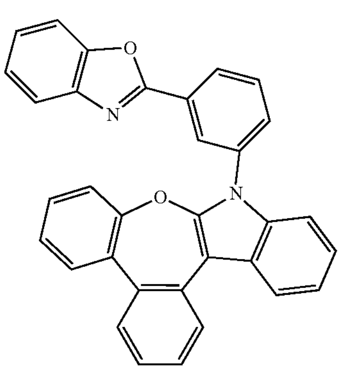
-continued
2-25
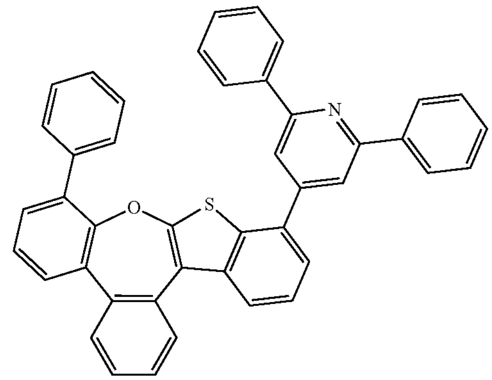
2-26
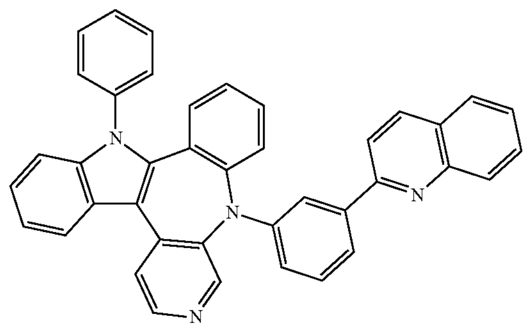
2-27
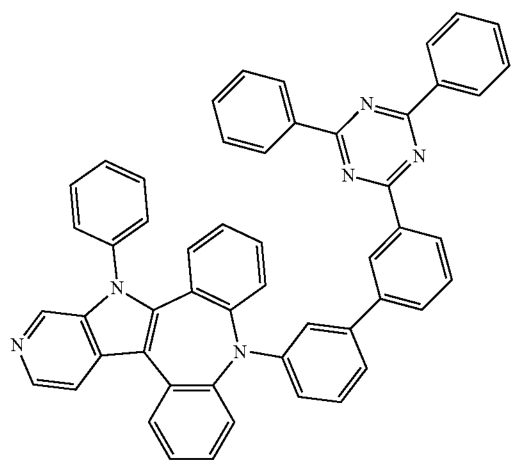
2-28
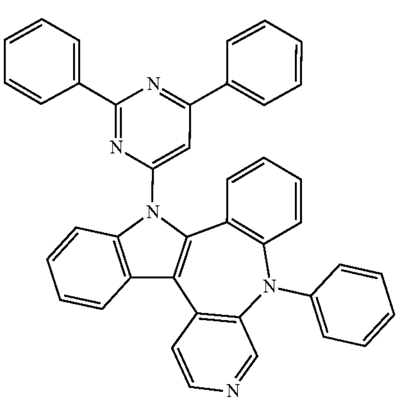

-continued
2-29
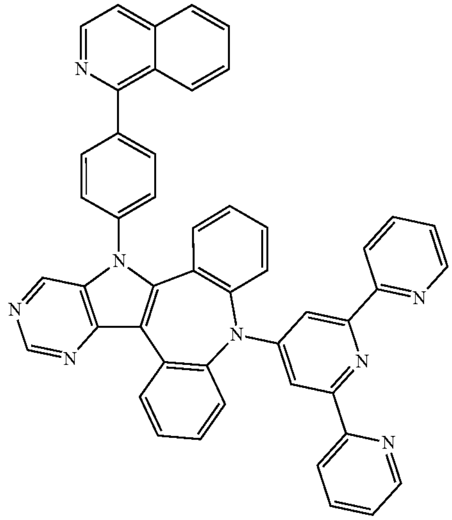
2-30
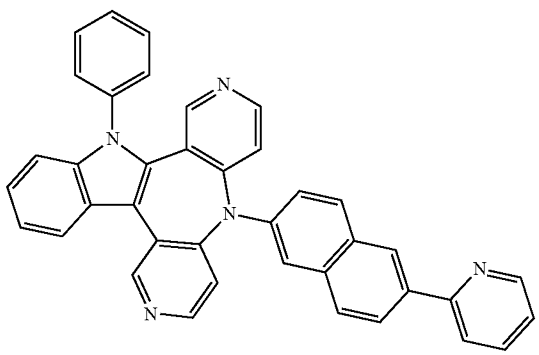
2-31
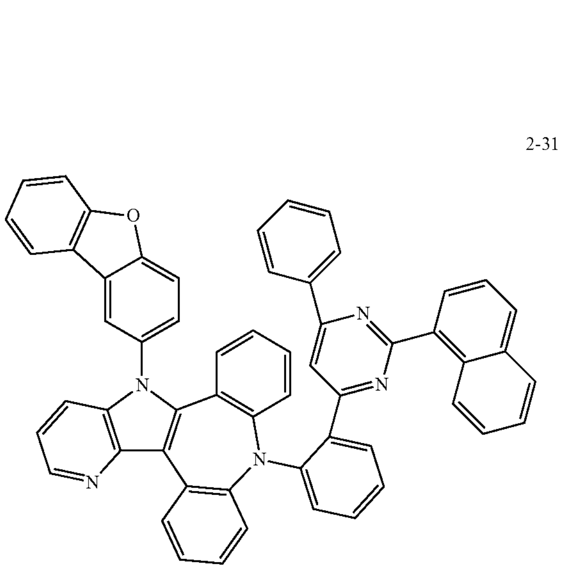
-continued
2-32
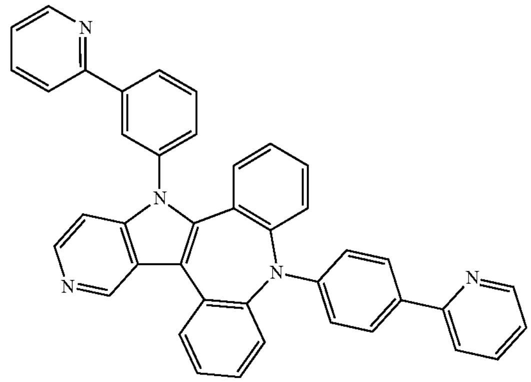
2-33
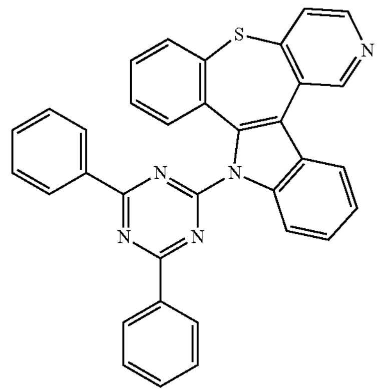
2-34
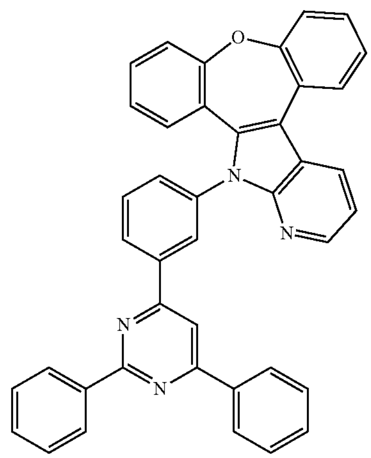
2-35
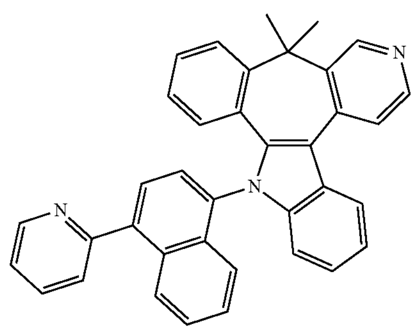

2-36
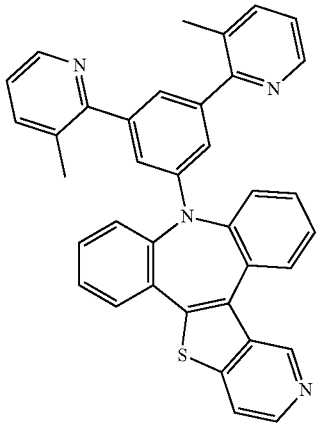
2-37
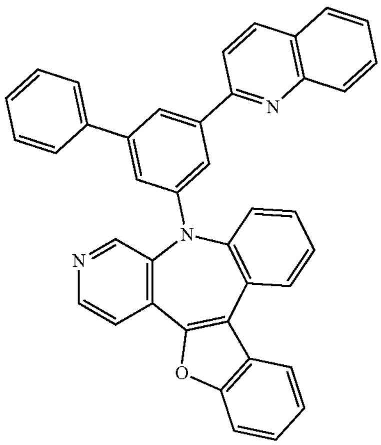
2-38
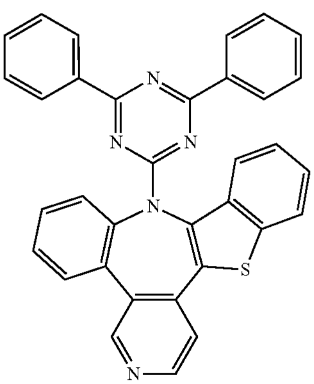
2-39
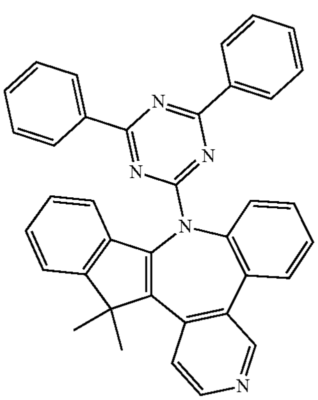
2-40
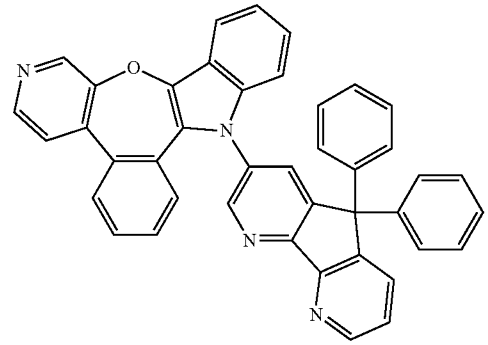
2-41
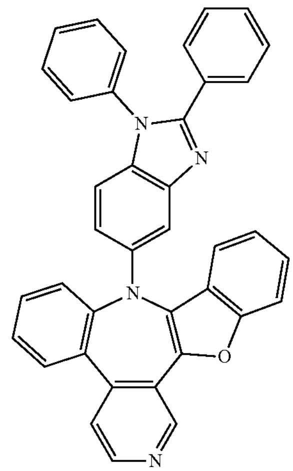
2-42
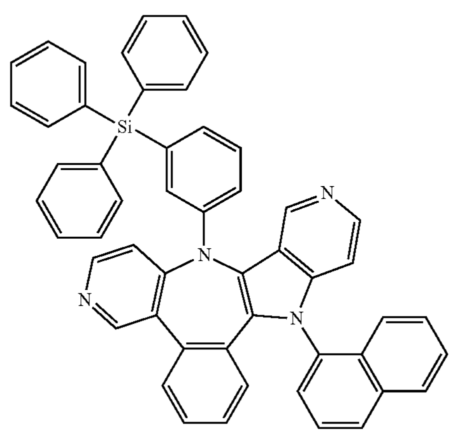

-continued
2-43
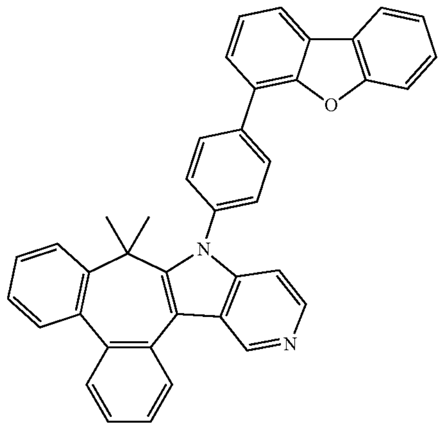
2-44
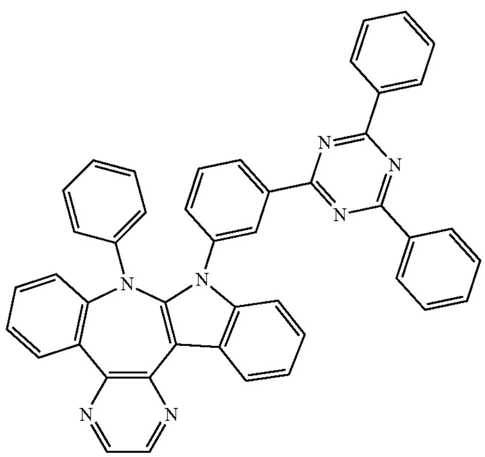
2-45
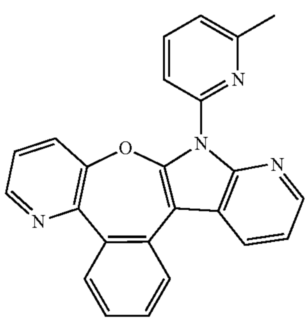
2-46
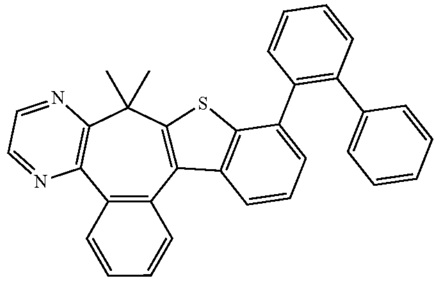
-continued
2-47
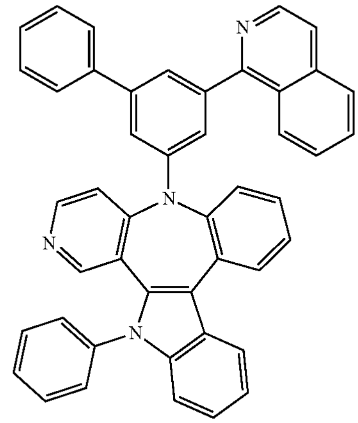
2-48
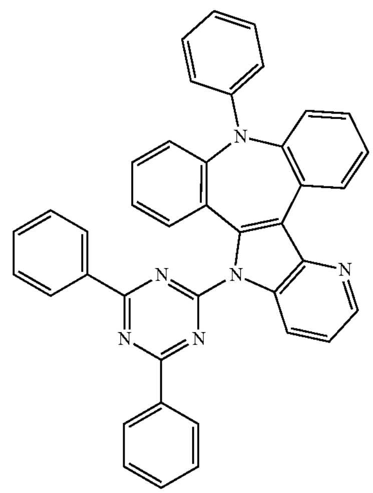
2-49
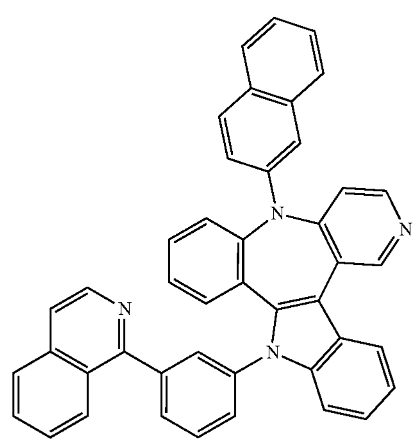

-continued
2-50
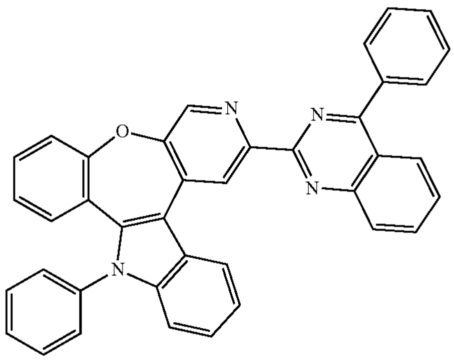
2-51
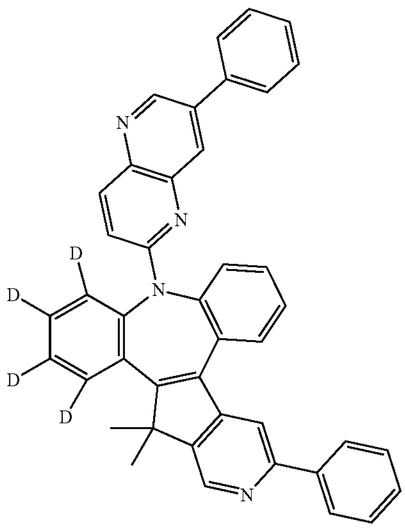
2-52
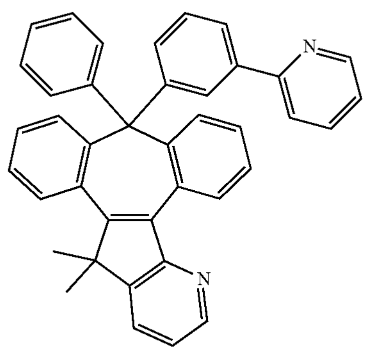
2-53
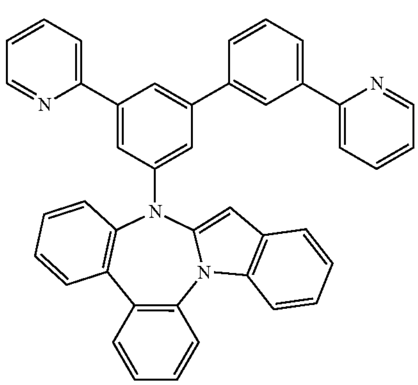
-continued
2-54
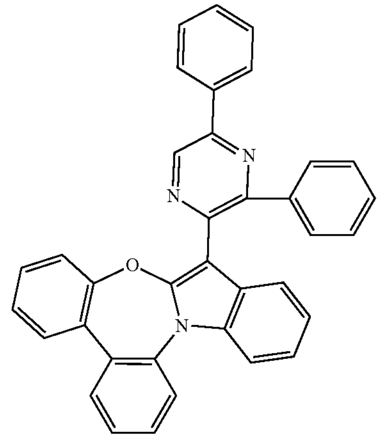
2-55
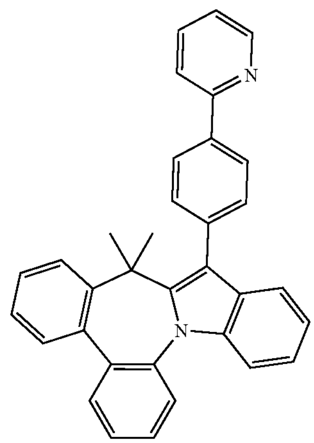
2-56
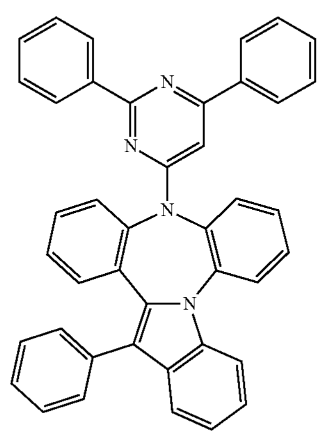

2-57
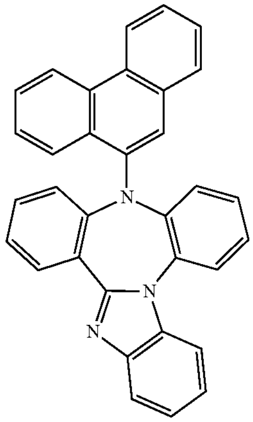
2-58
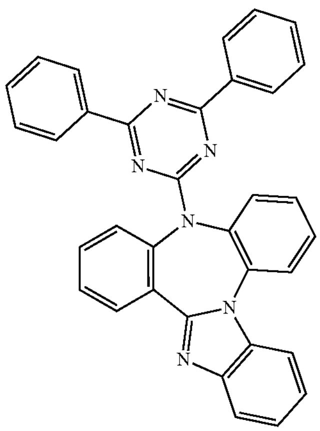
2-59
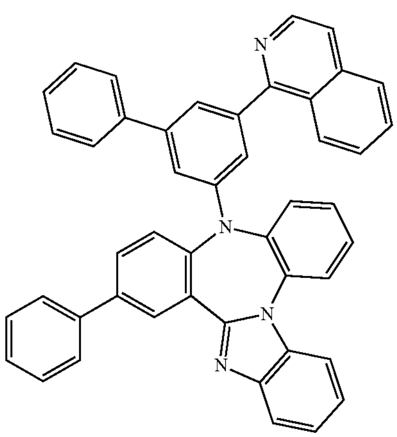
2-60
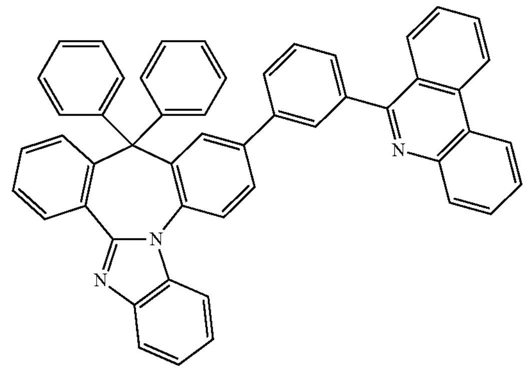
2-61
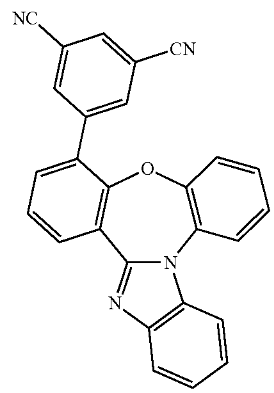
2-62
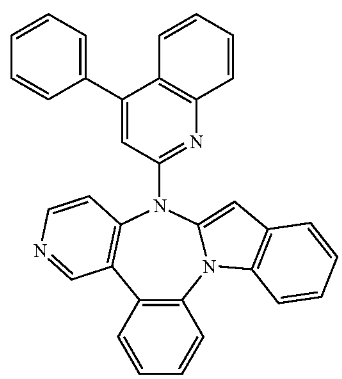
2-63
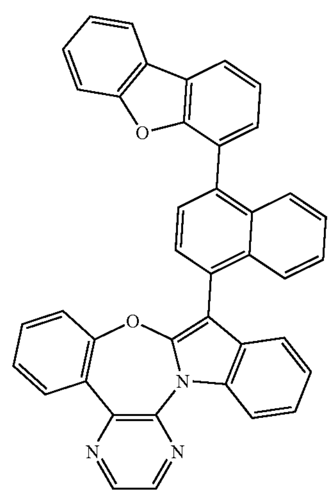

-continued
2-64
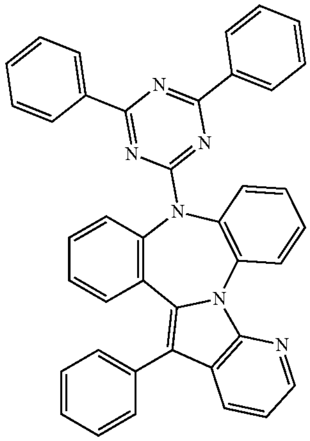
2-65
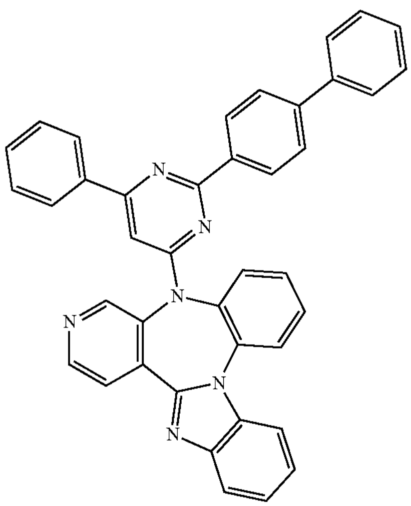
2-66
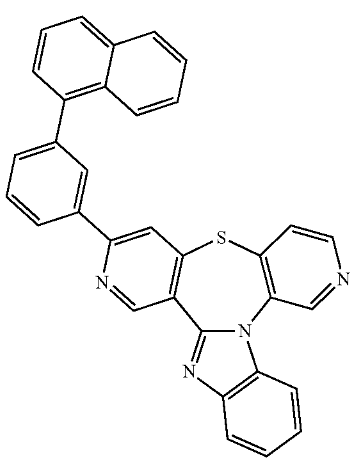
-continued
2-67
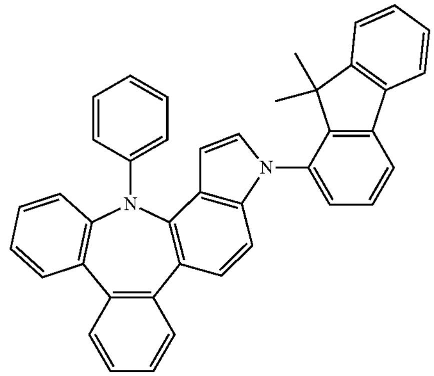
2-68
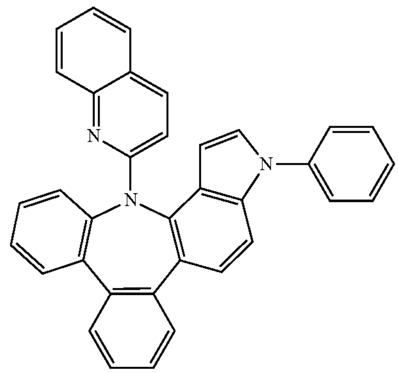
2-69
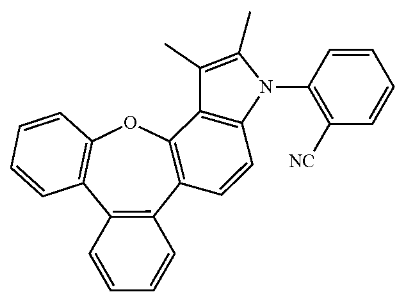
2-70
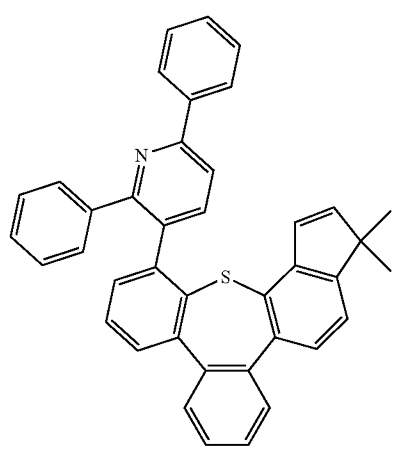

-continued
2-71
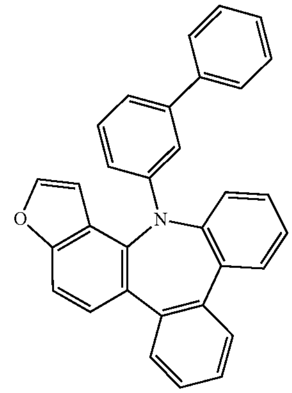
2-72
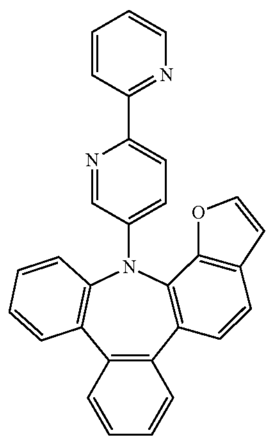
2-73
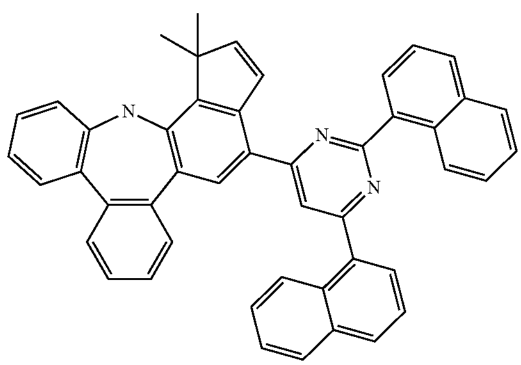
2-74
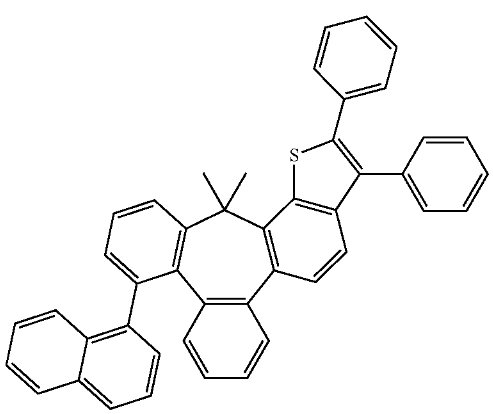
-continued
2-75
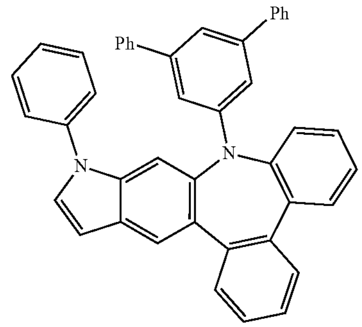
2-76
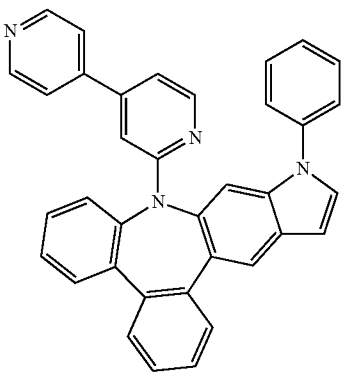
2-77
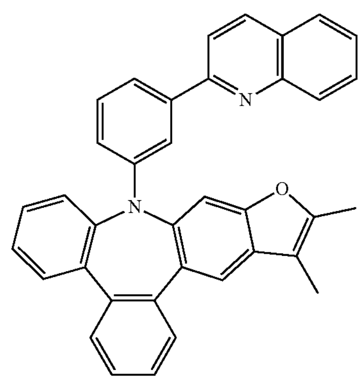
2-78
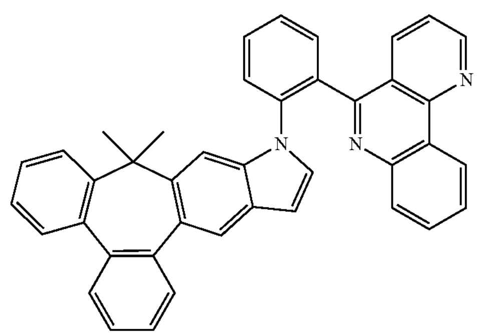

2-79
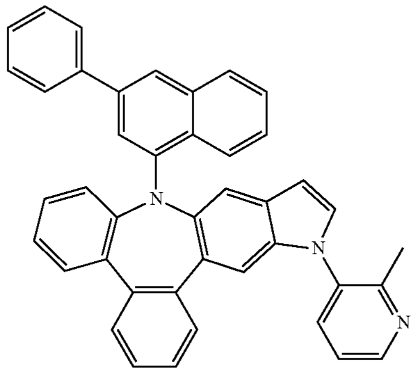
2-80
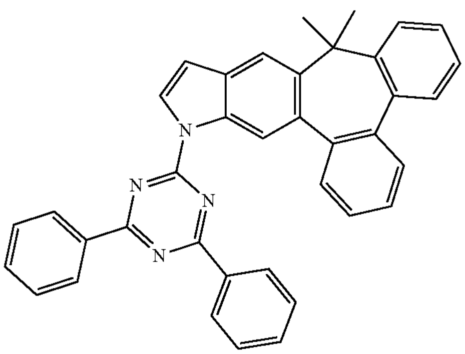
2-81
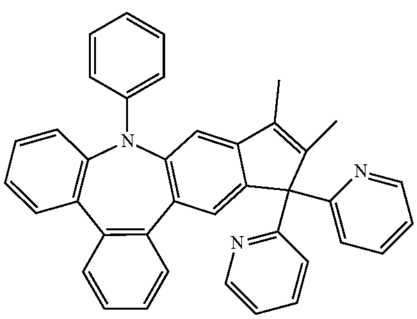
2-82
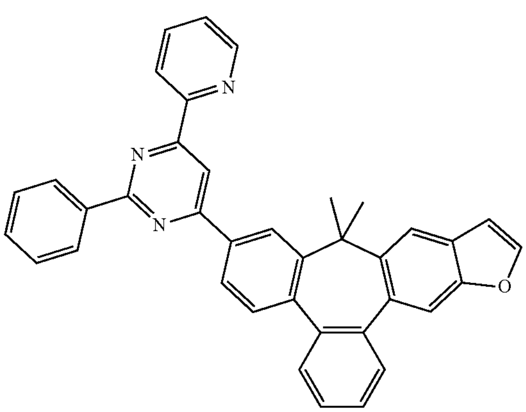
2-83
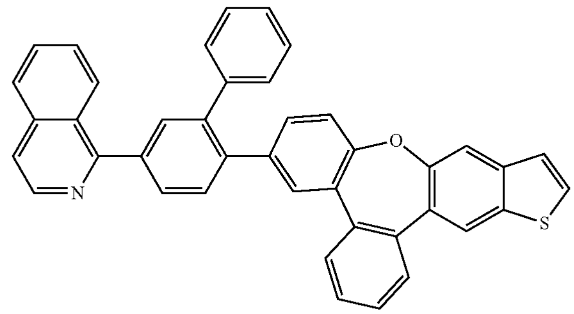
2-84
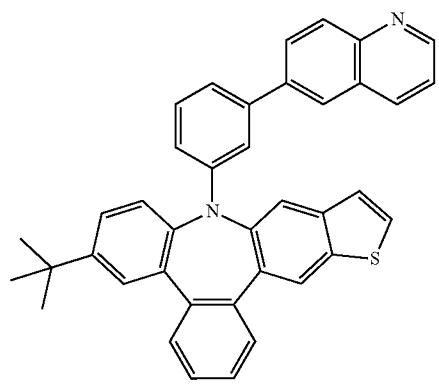
2-85
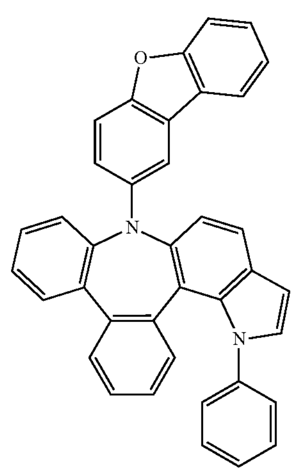

-continued
2-86
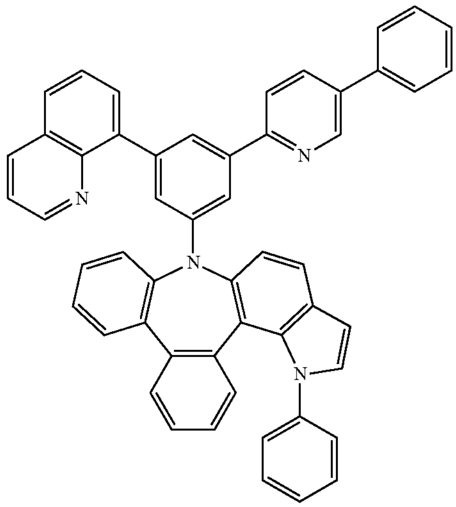
2-87
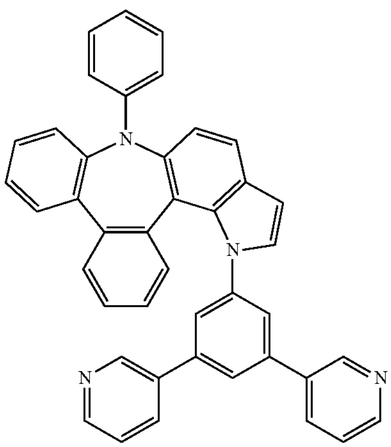
2-88
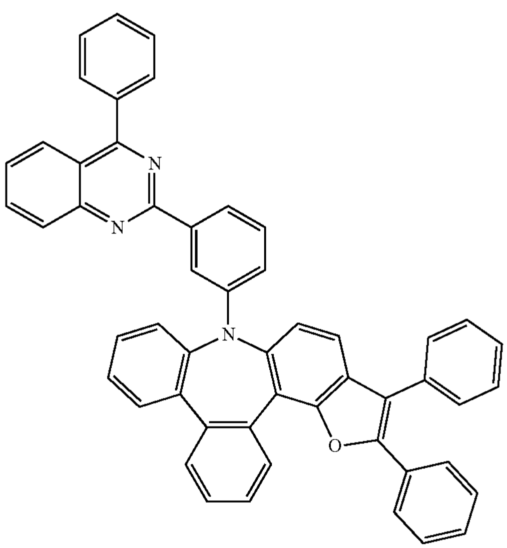
-continued
2-89
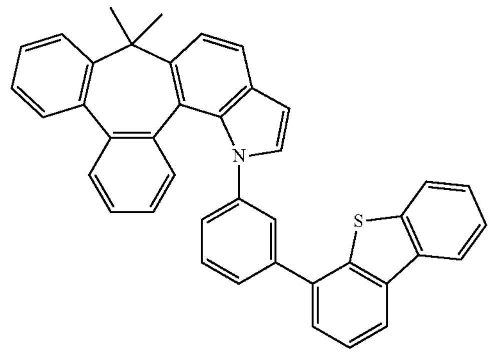
2-90
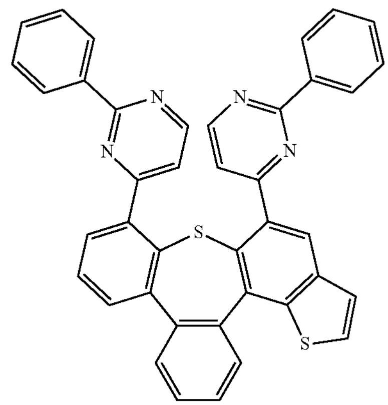
2-91
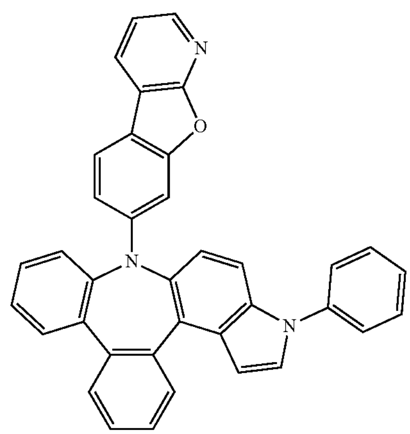
2-92
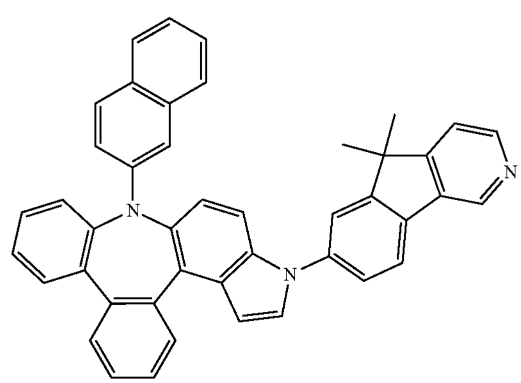

-continued
2-93
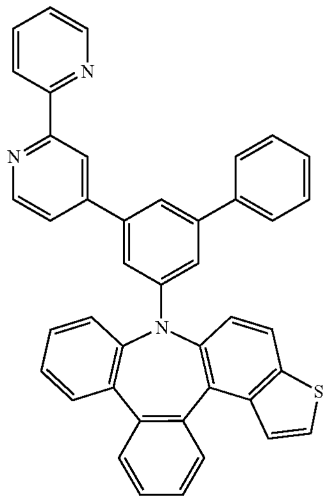
2-94
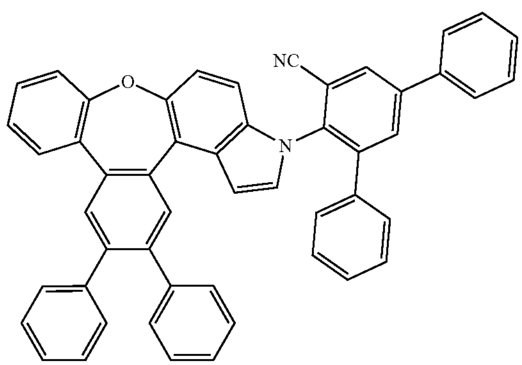
2-95
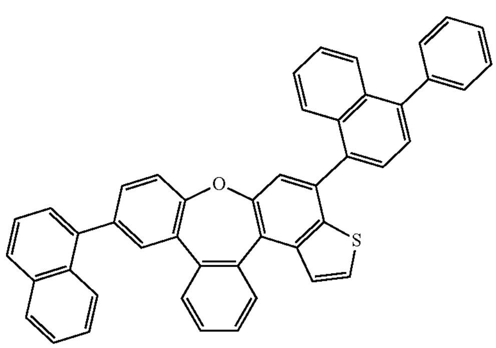
-continued
2-96
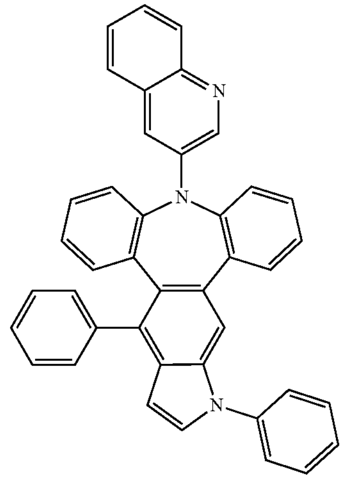
2-97
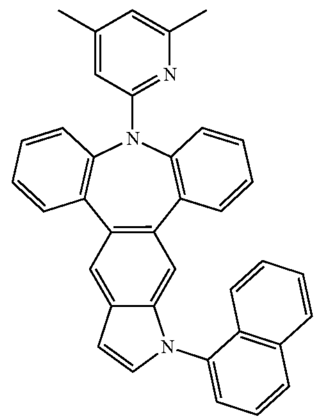
2-98
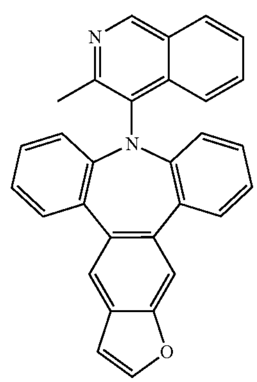
2-99
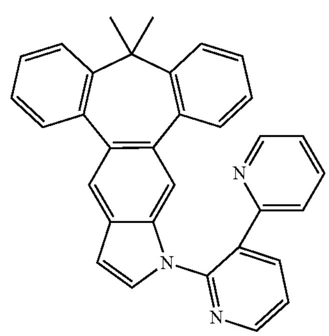

-continued
2-100
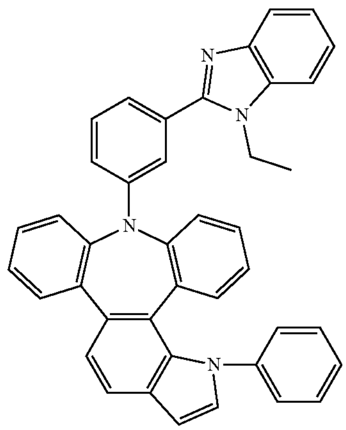
2-101
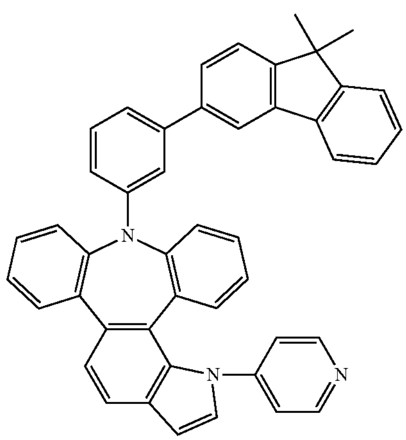
2-102
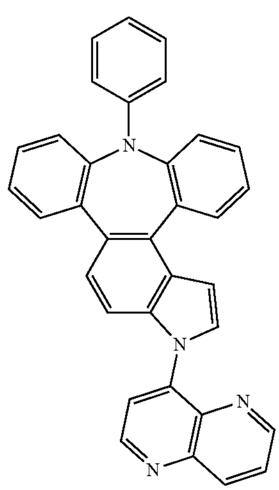
-continued
2-103
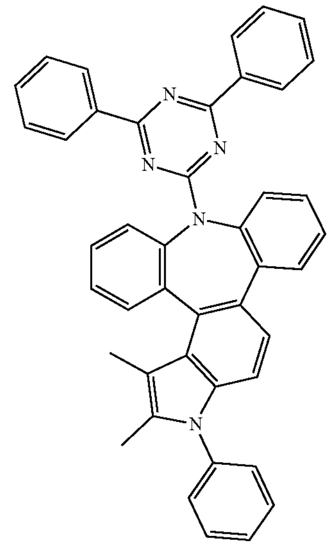
2-104
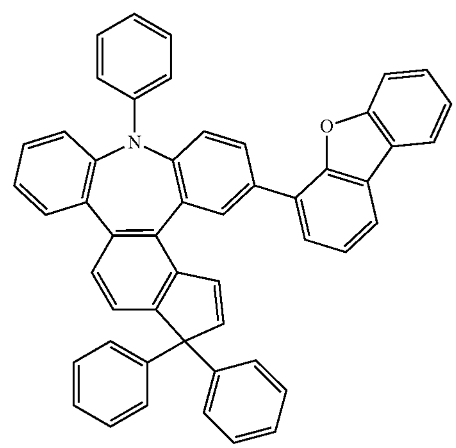
2-105
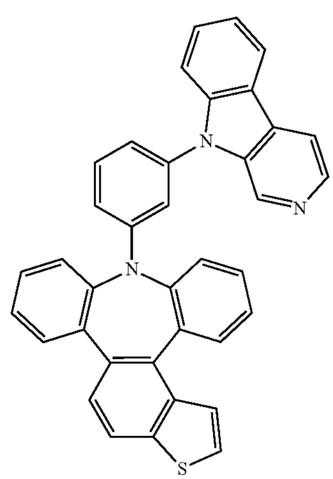

-continued
2-106
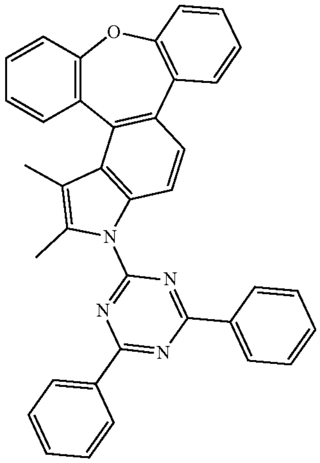
2-107
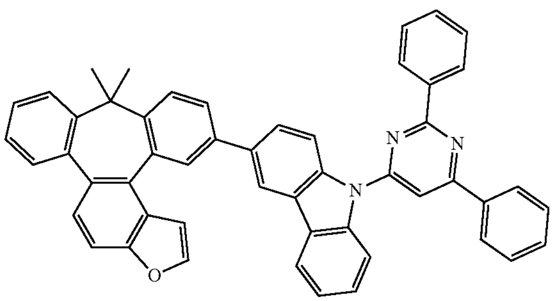
2-108
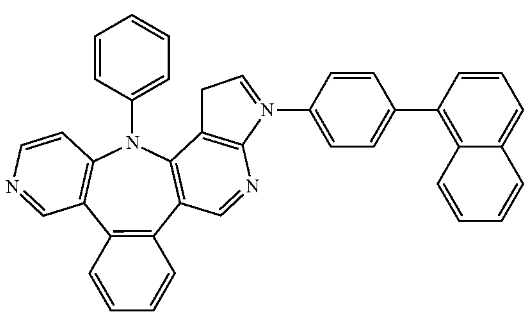
2-109
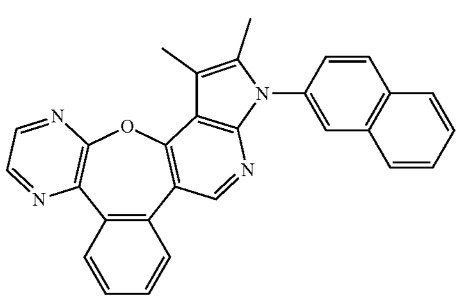
-continued
2-110
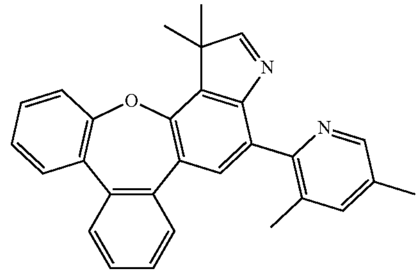
2-111
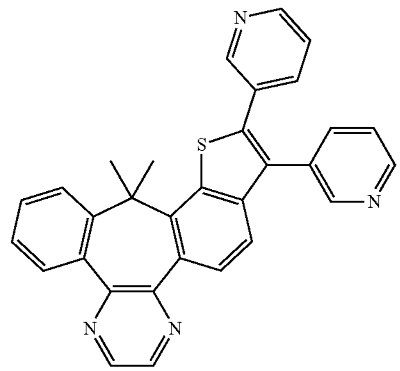
2-112
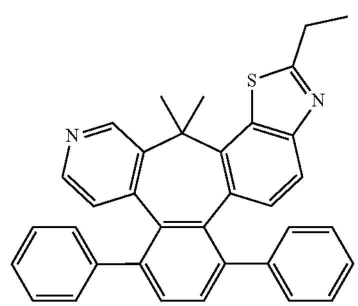
2-113
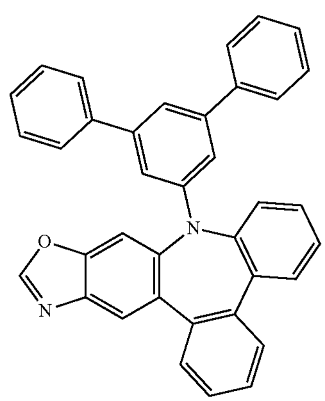

-continued
2-114
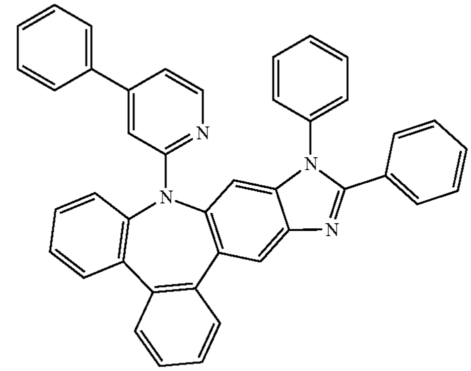
2-115
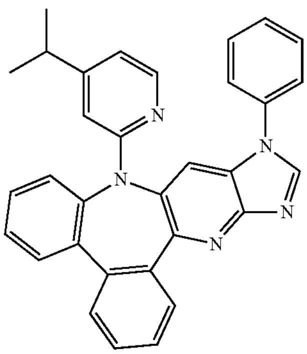
2-116
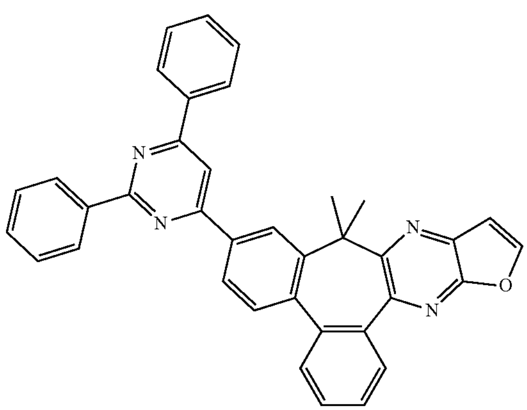
2-117
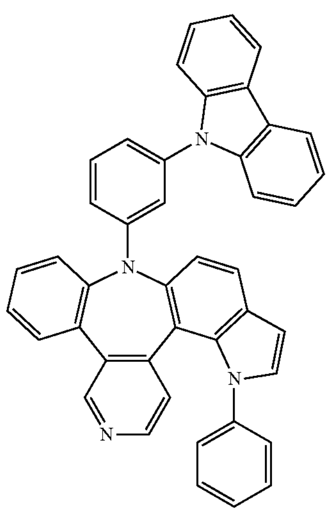
-continued
2-118
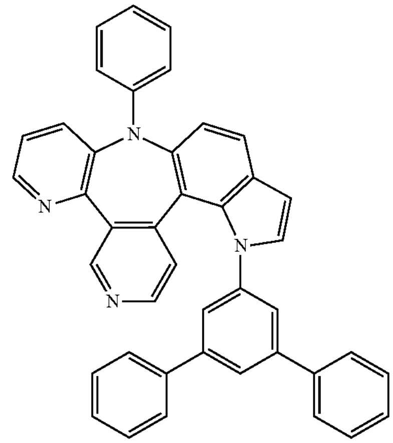
2-119
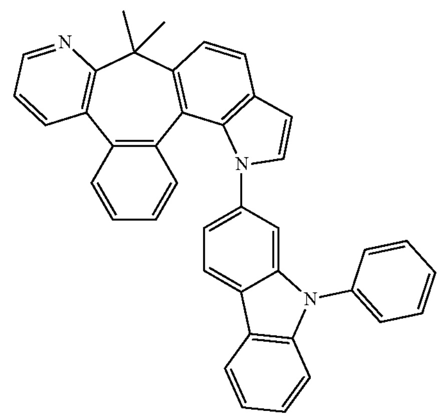
2-120
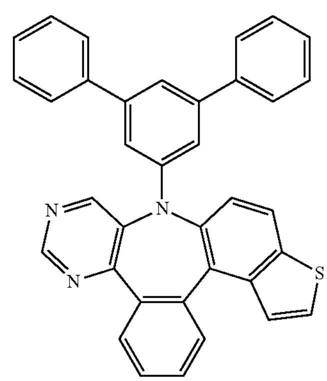

-continued
2-121
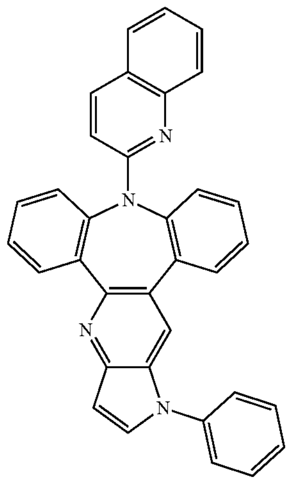
2-122
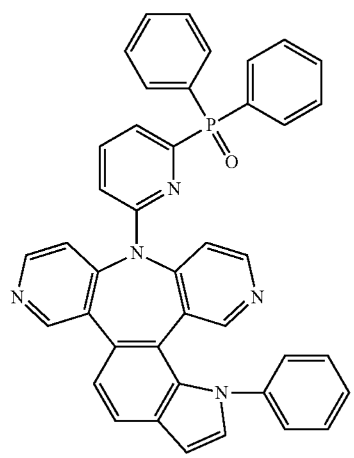
2-123
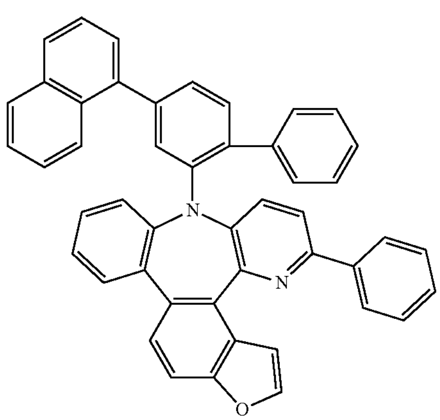
-continued
2-124
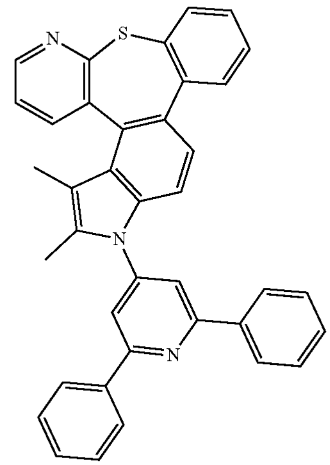
2-125
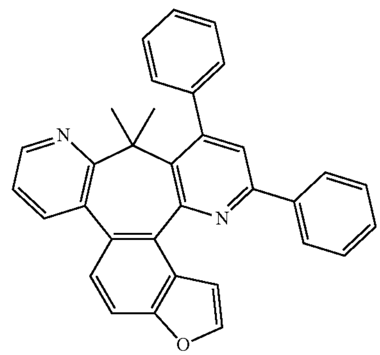
2-126
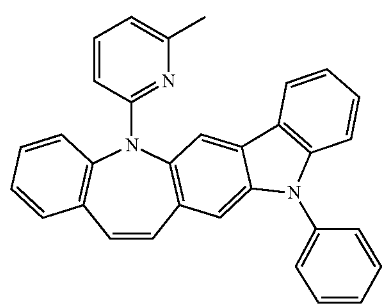
2-127
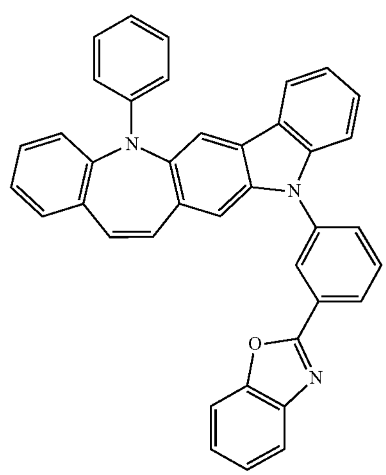

-continued
2-128
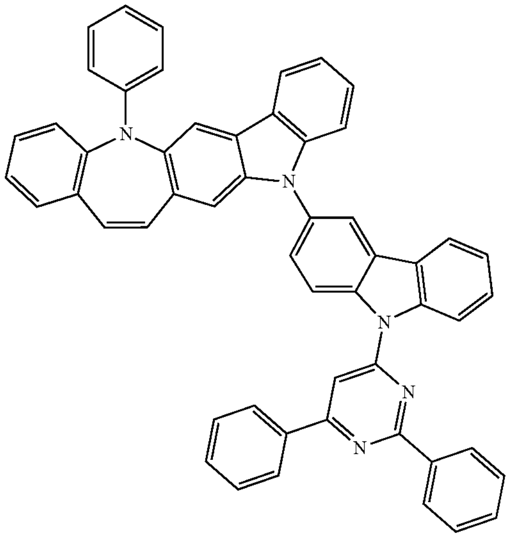
2-129
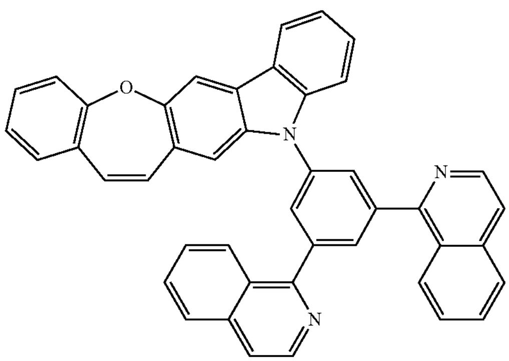
2-130
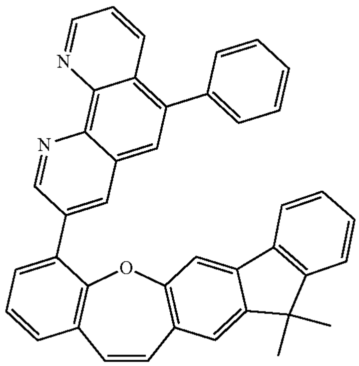
2-131
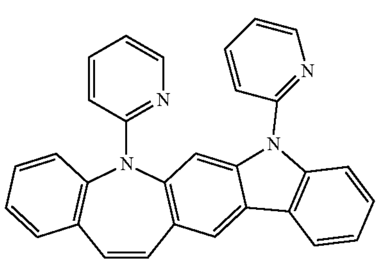
-continued
2-132
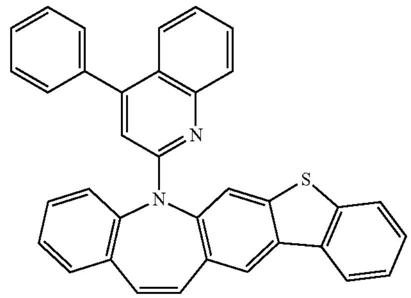
2-133
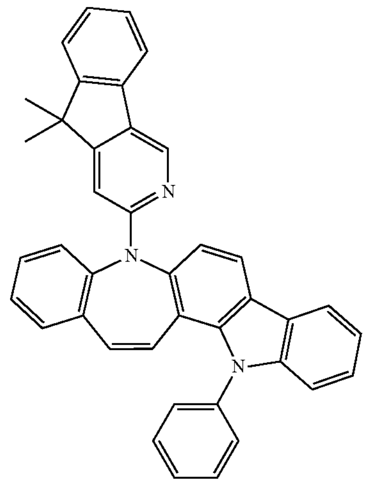
2-134
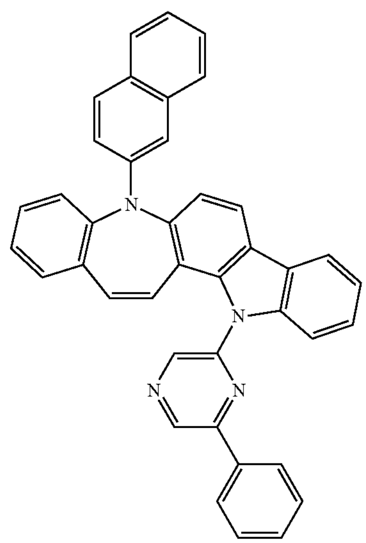
2-135
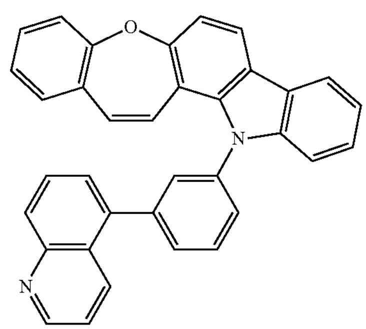

-continued
2-136
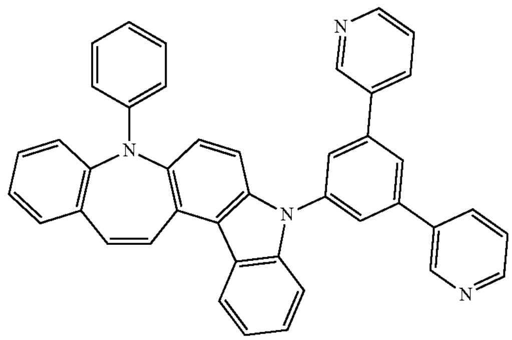
2-137
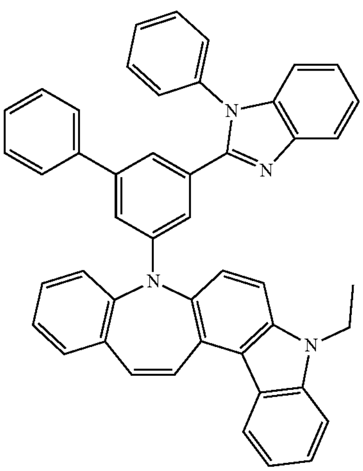
2-138
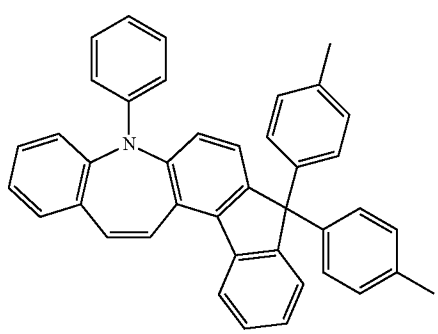
2-139
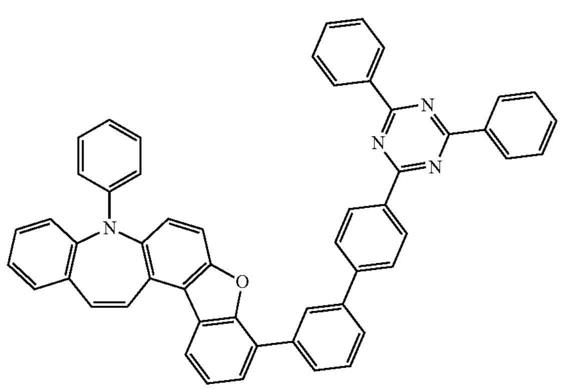
-continued
2-140
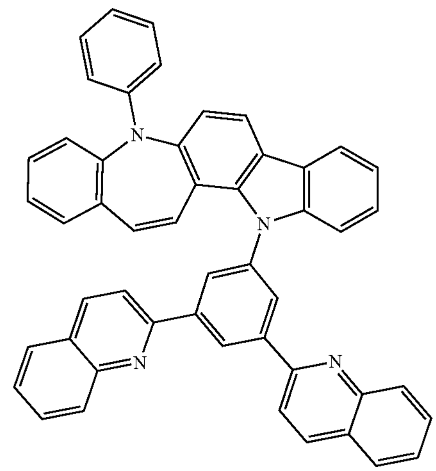
2-141
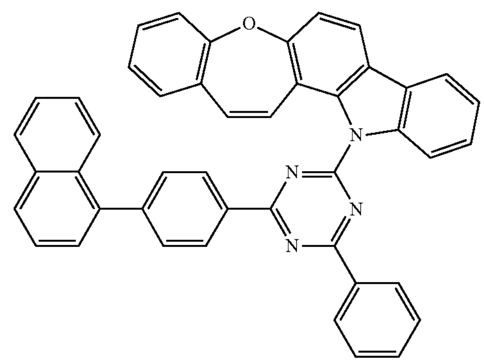
2-142
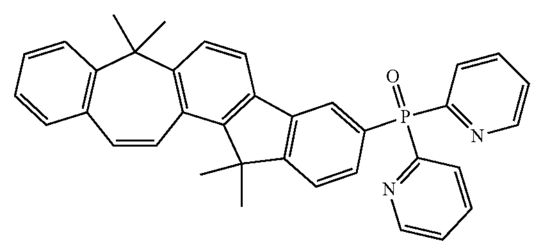
2-143
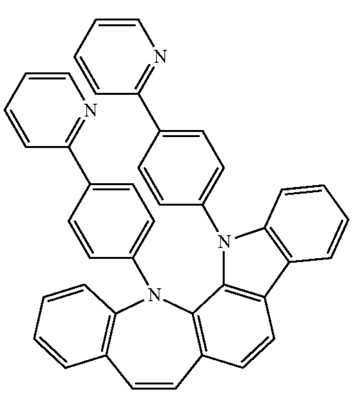

-continued
2-144
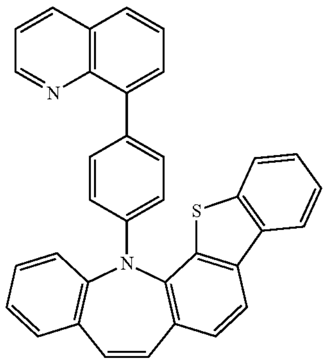
2-145
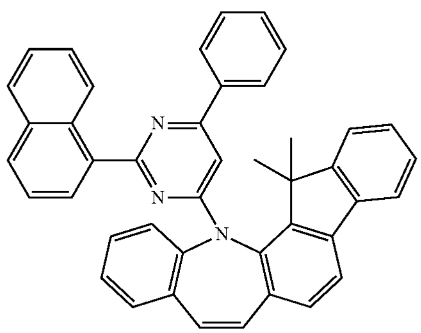
2-146
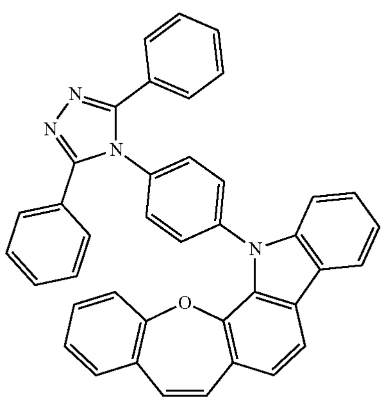
2-147
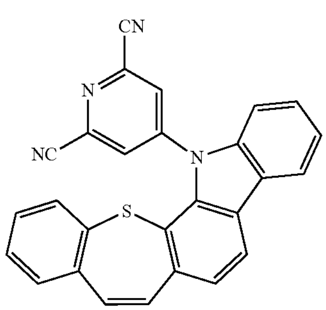
-continued
2-148
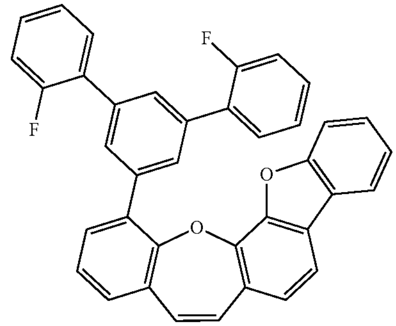
2-149
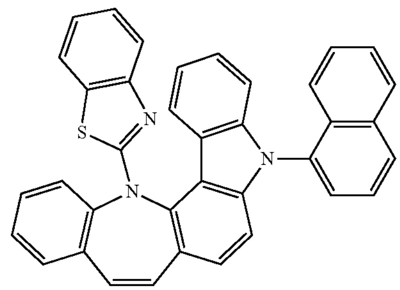
2-150
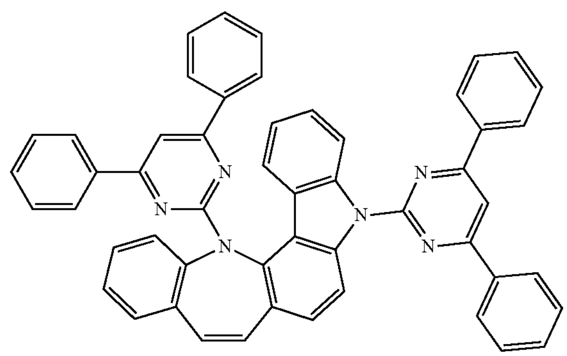
2-151
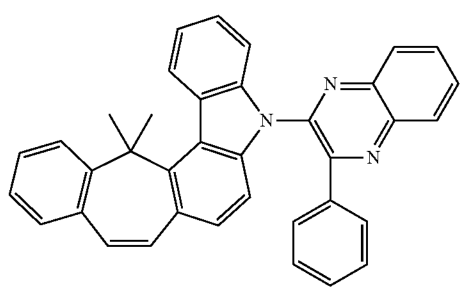

2-152
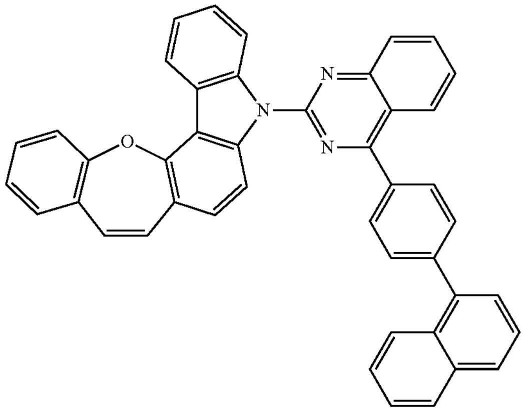
2-153
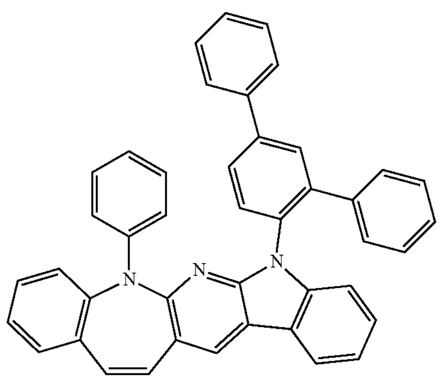
2-154
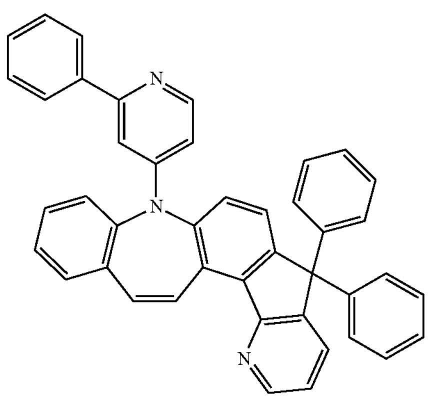
2-155
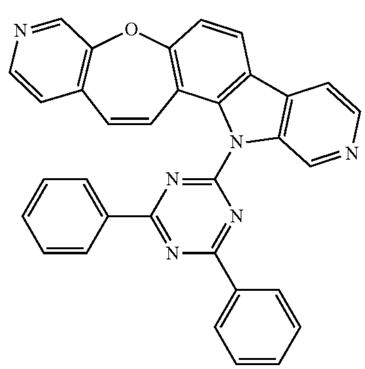
2-156
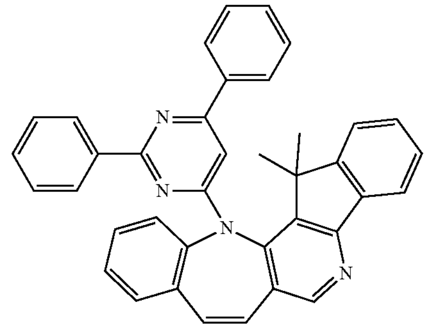
2-157
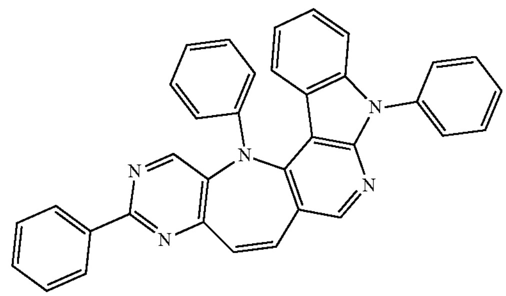
2-158
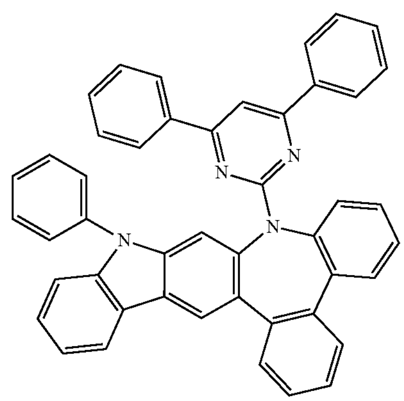
2-159
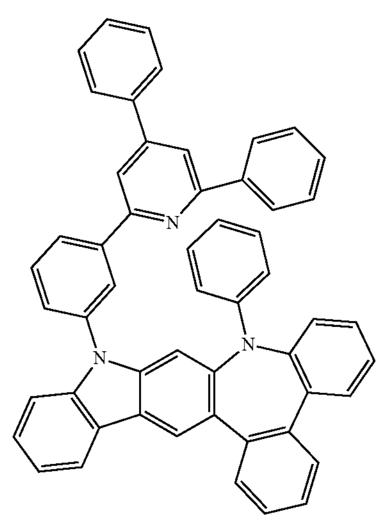

-continued
2-160
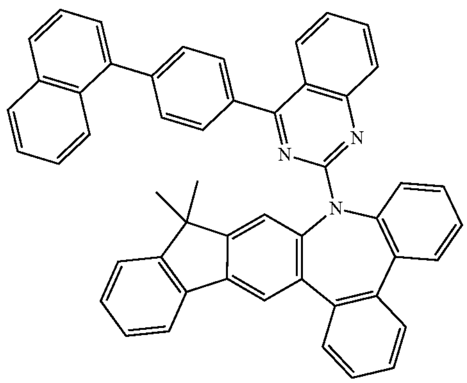
2-161
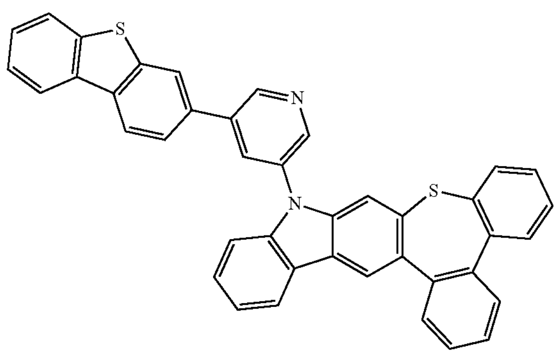
2-162
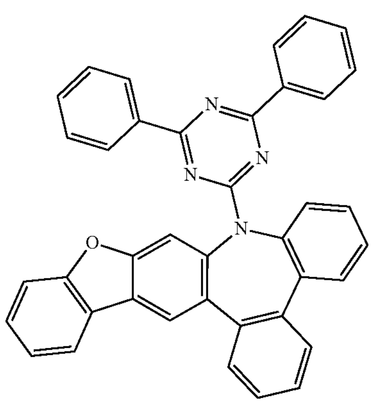
2-163
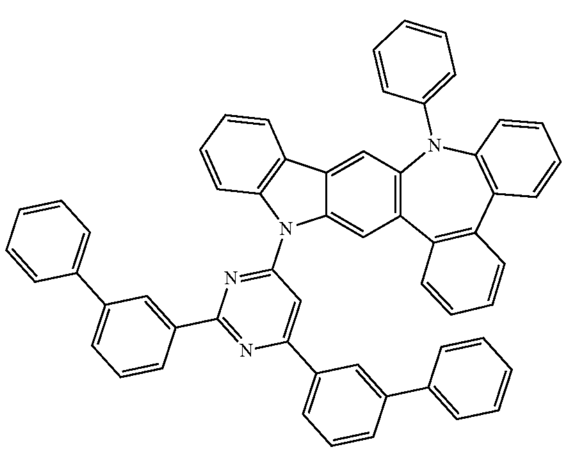
-continued
2-164
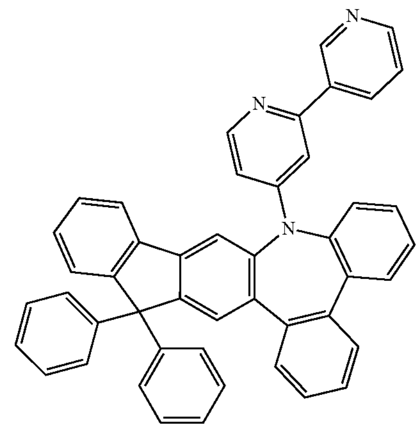
2-165
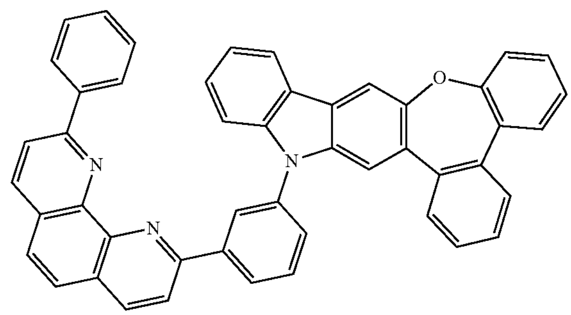
2-166
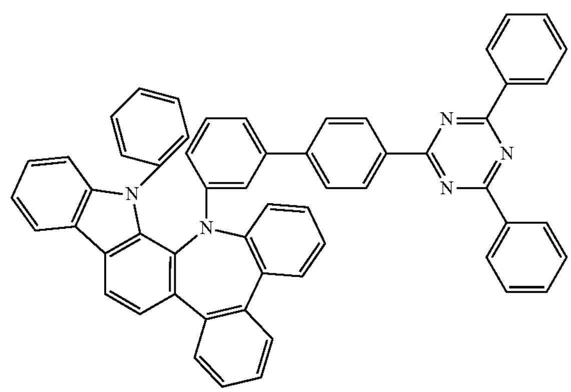
2-167
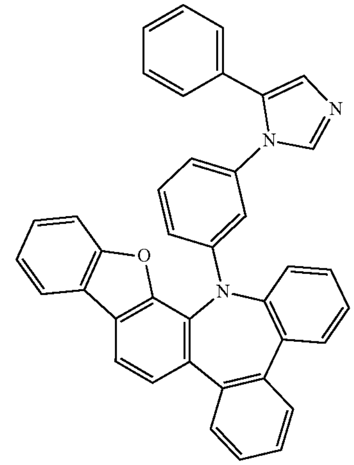

-continued
2-168
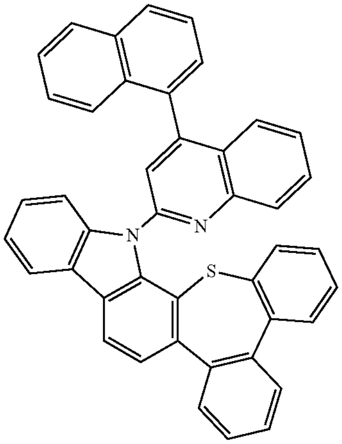
2-169
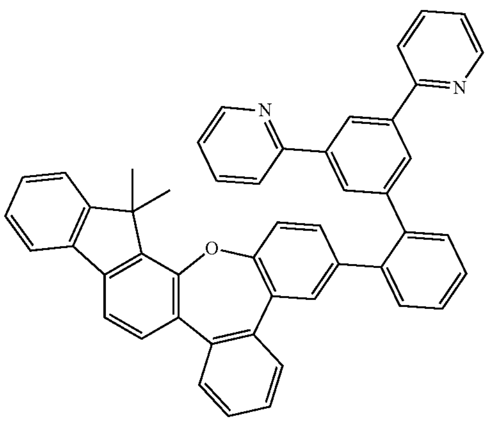
2-170
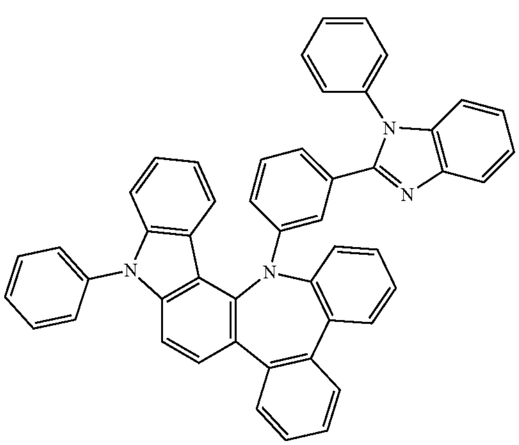
-continued
2-171
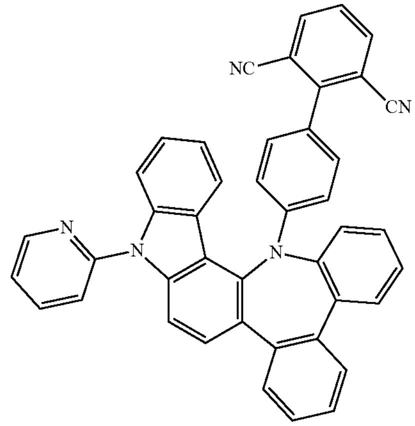
2-172
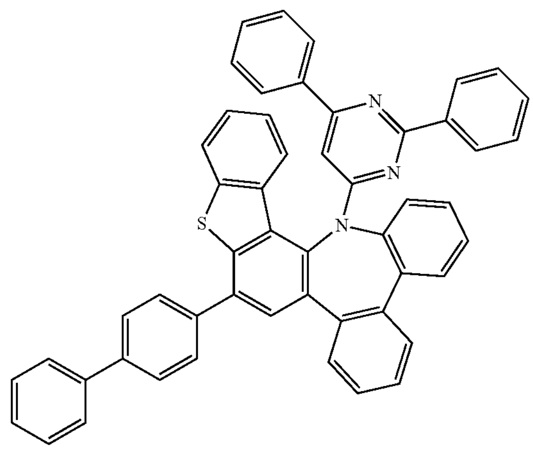
2-173
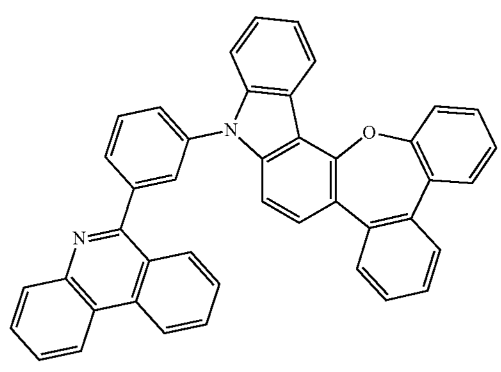

-continued
2-174
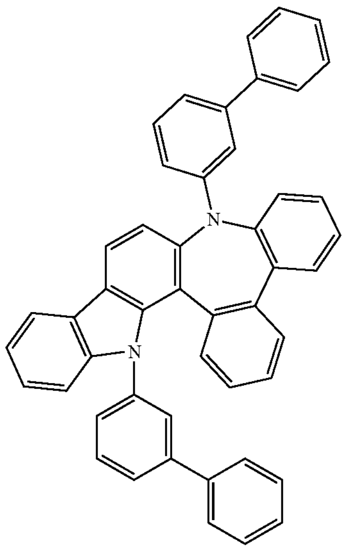
2-175
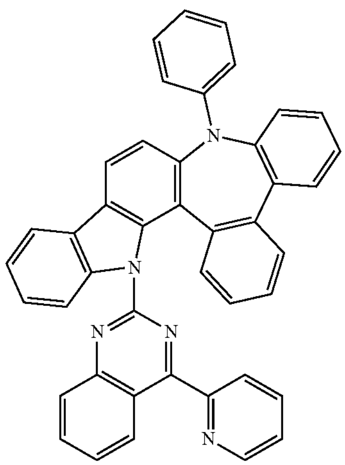
2-176
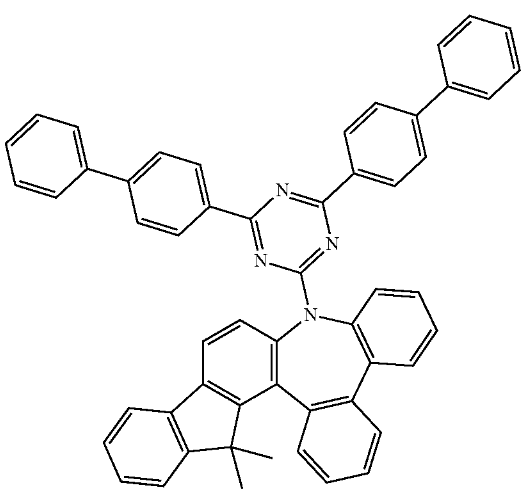
-continued
2-177
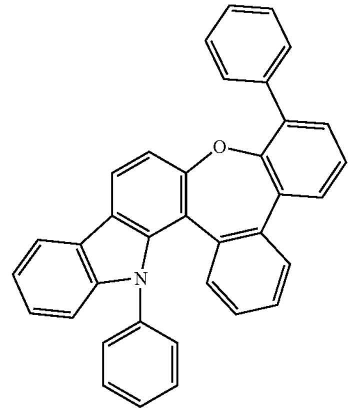
2-178
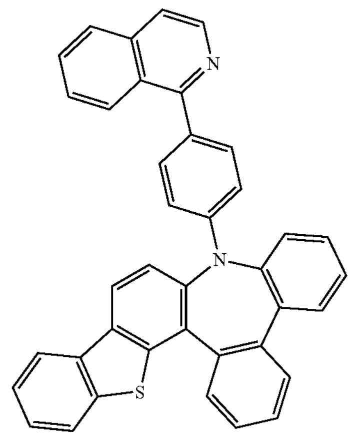
2-179
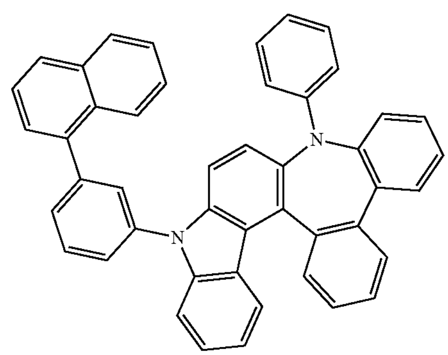
2-180
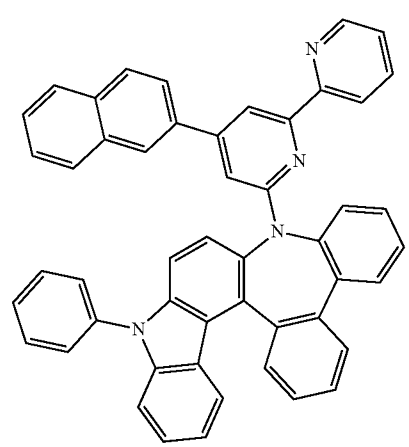

-continued
2-181
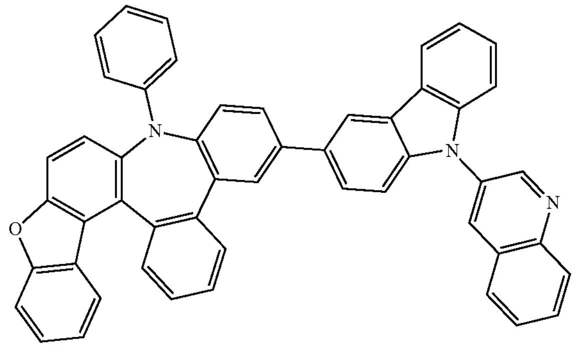
2-182
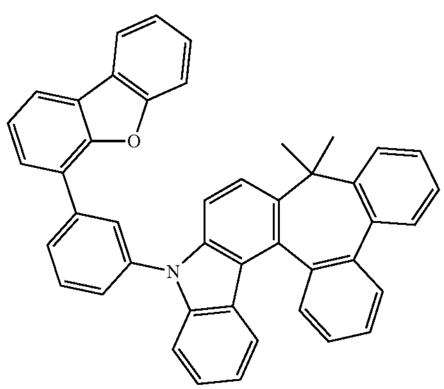
2-183
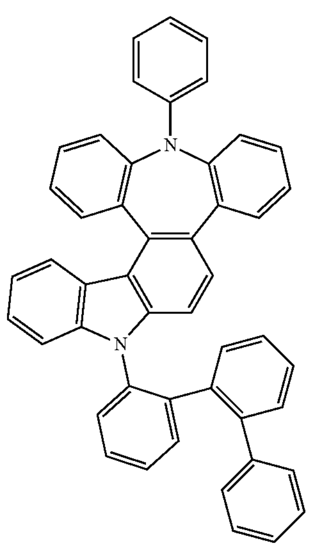
-continued
2-184
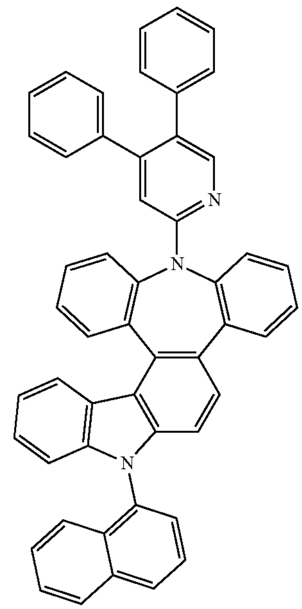
2-185
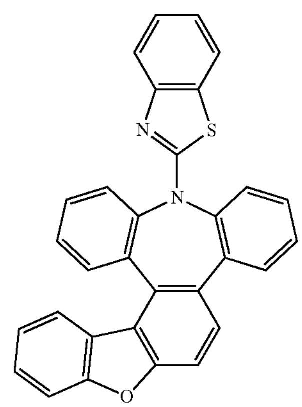
2-186
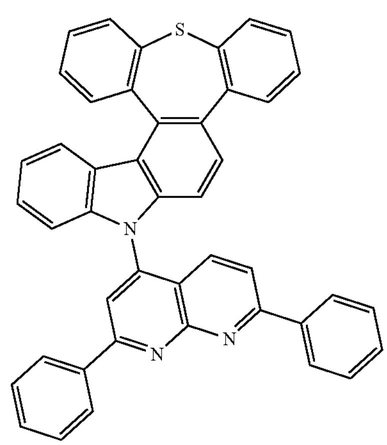

-continued
2-187
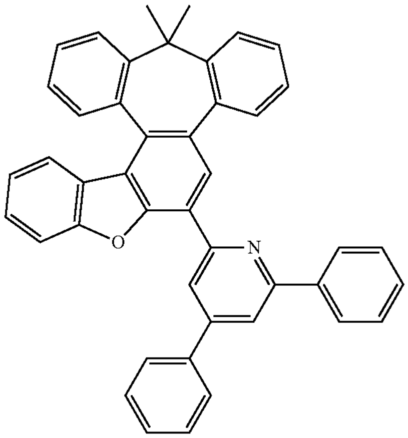
2-188
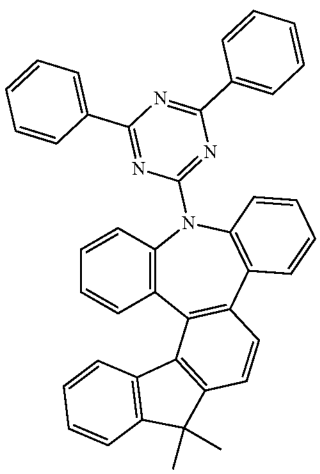
2-189
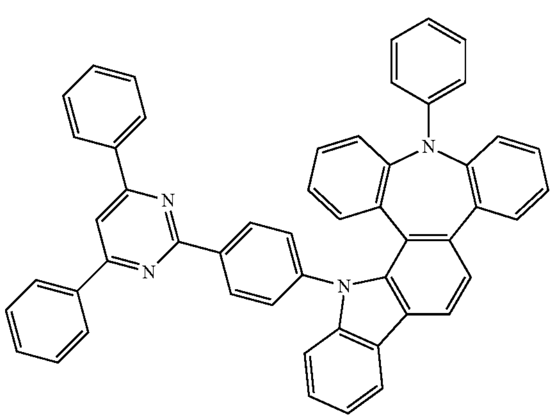
-continued
2-190
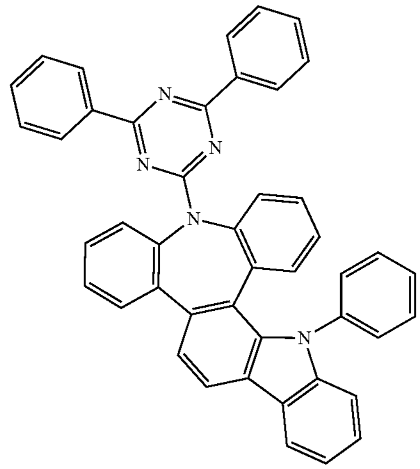
2-191
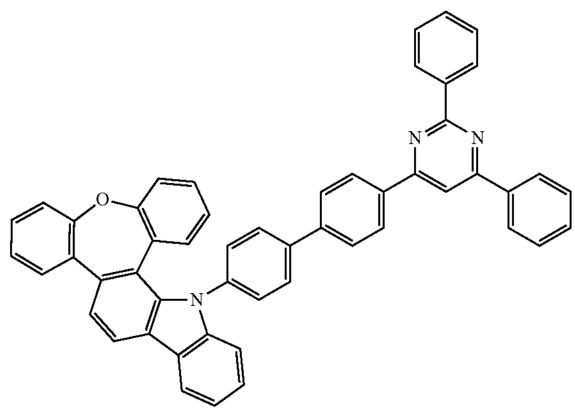
2-192
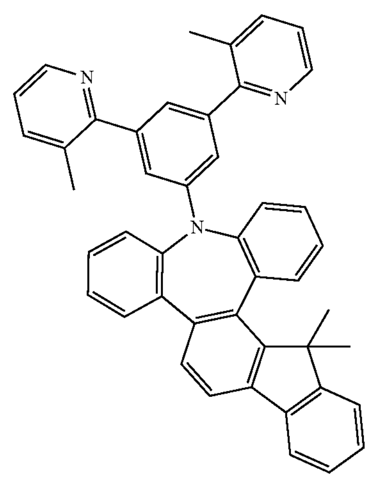

-continued
2-193
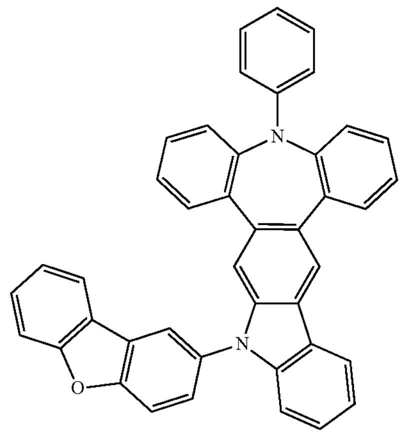
2-194
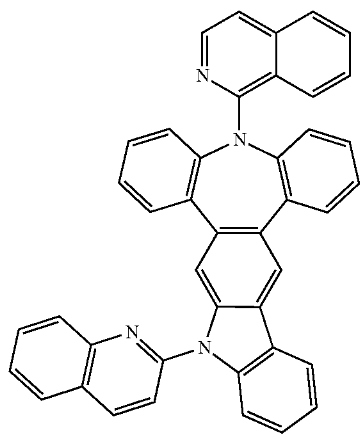
2-195
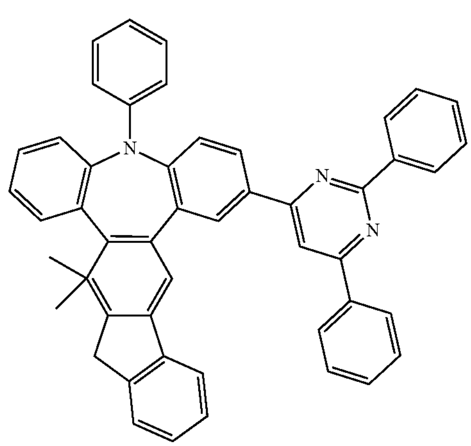
-continued
2-196
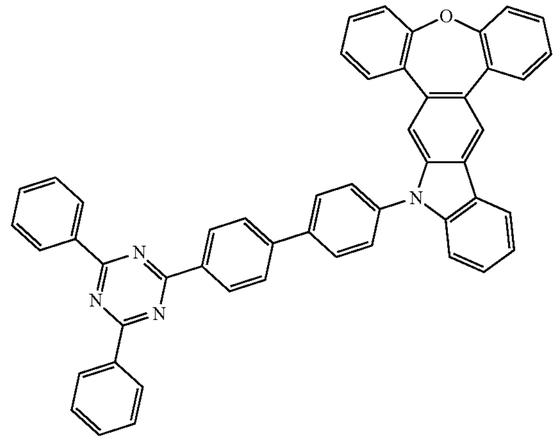
2-197
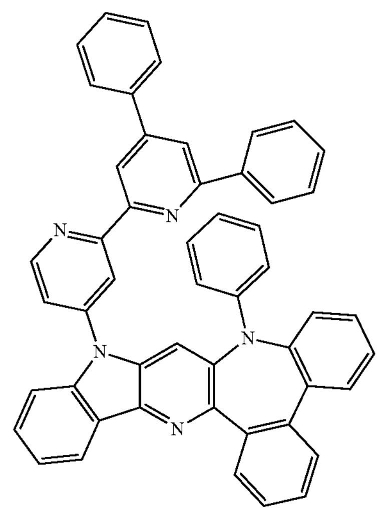
2-198
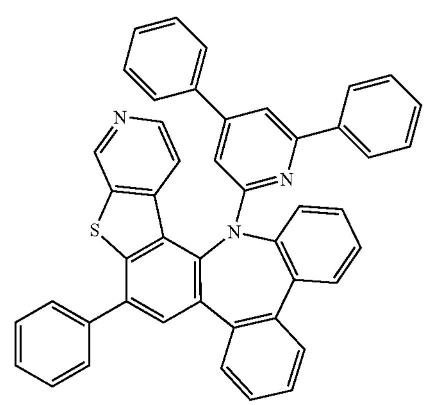

-continued
2-199
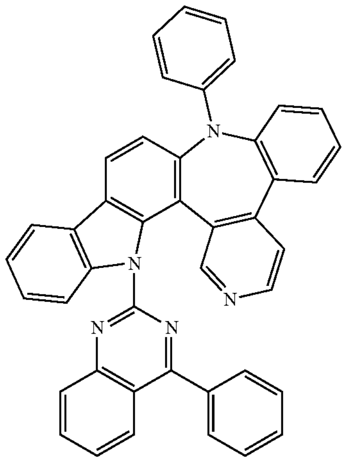
2-200
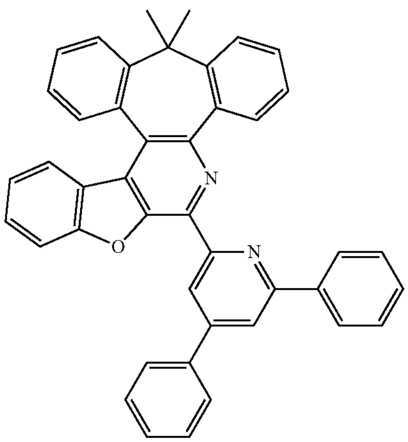
2-201
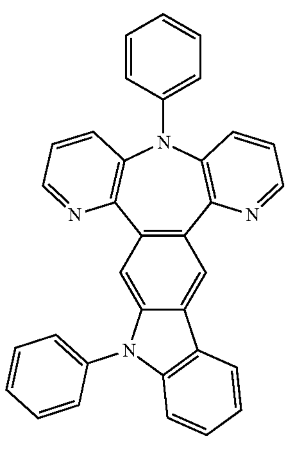
-continued
2-202
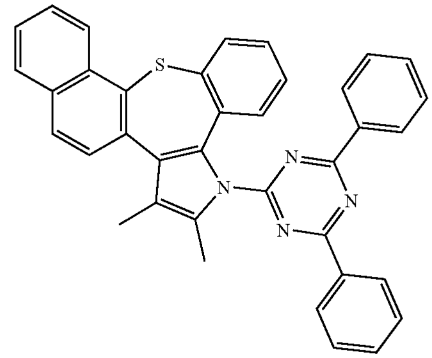
2-203
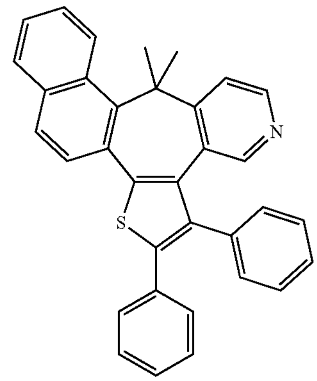
2-204
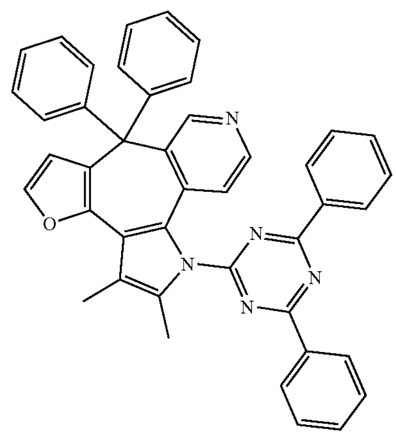
2-205
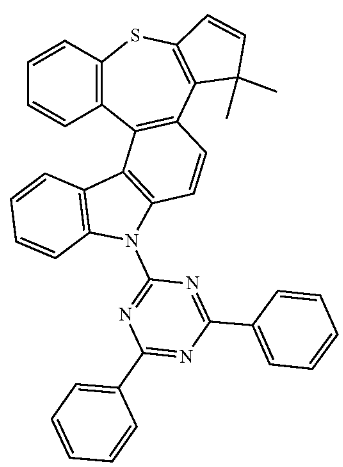

-continued
2-206
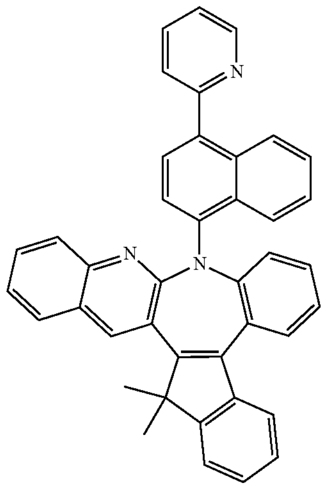
2-207
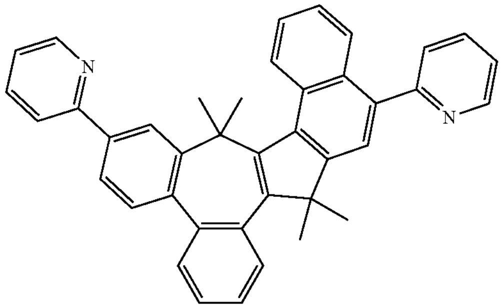
2-208
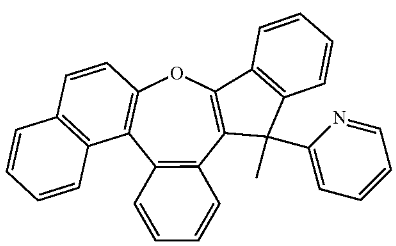
2-209
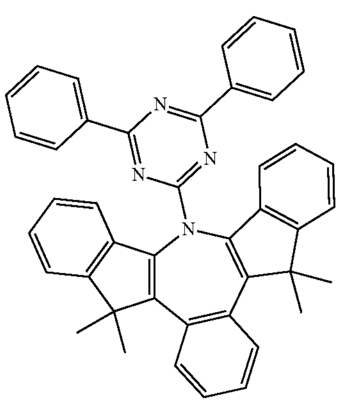
-continued
2-210
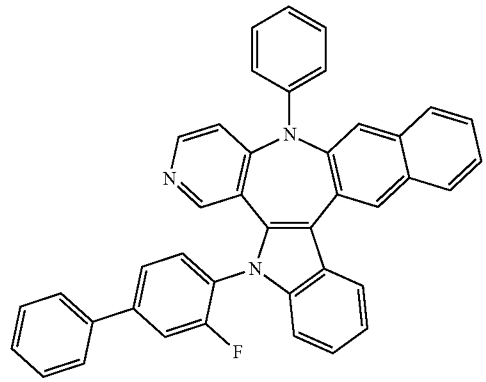
2-211
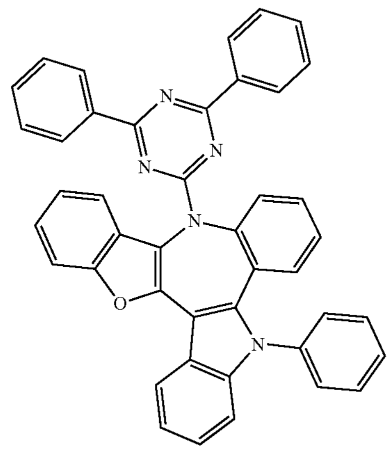
2-212
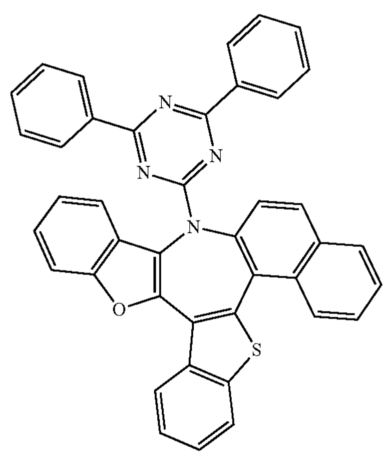

-continued
2-213
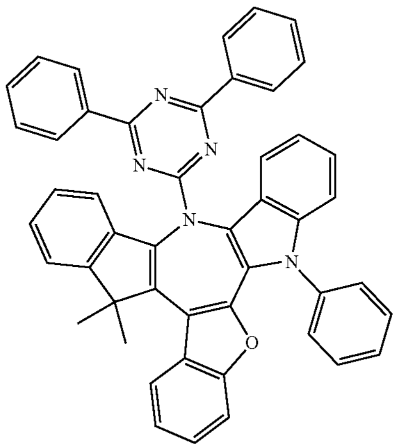
2-214
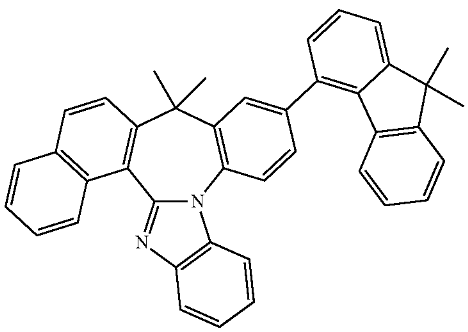
2-215
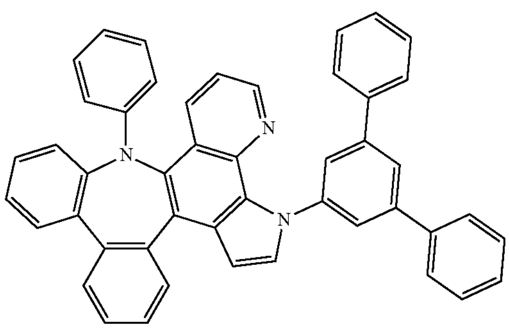
2-216
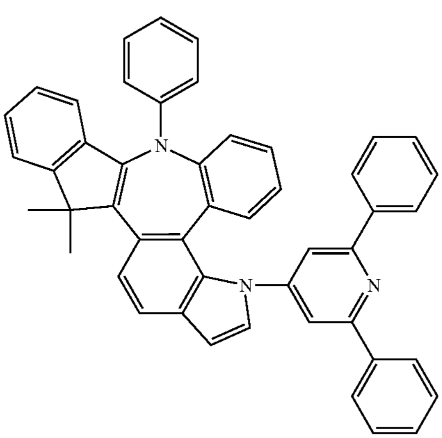
-continued
2-217
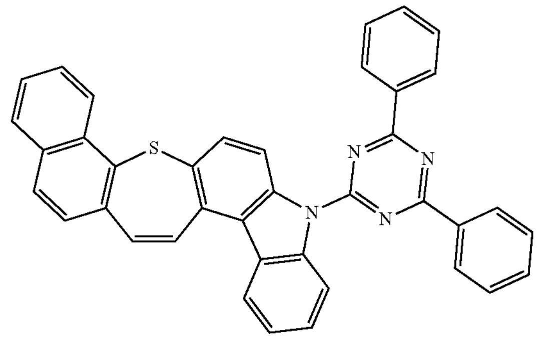
2-218
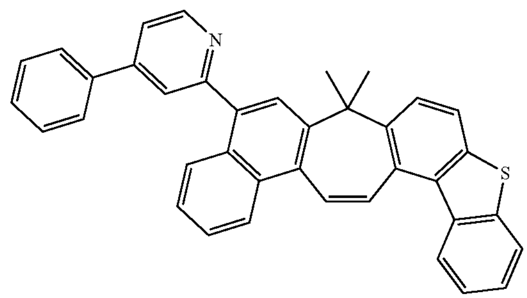
2-219
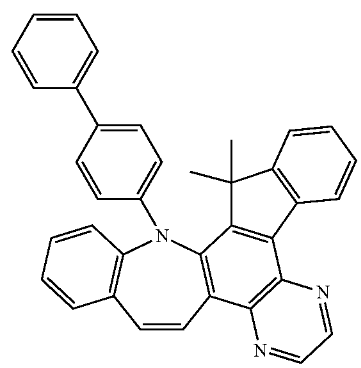
2-220
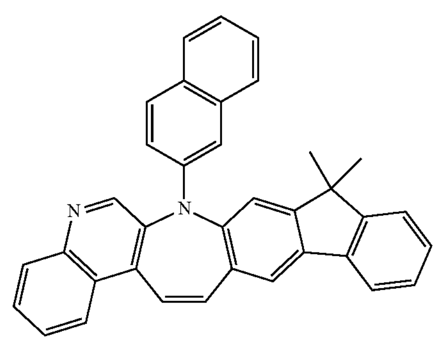

2-221
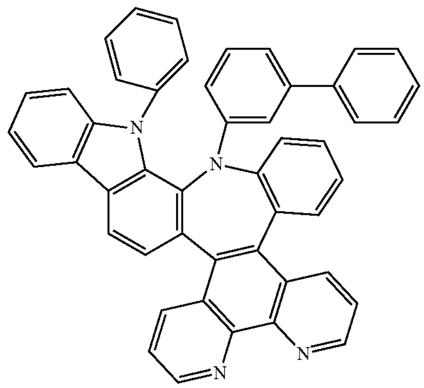
2-222
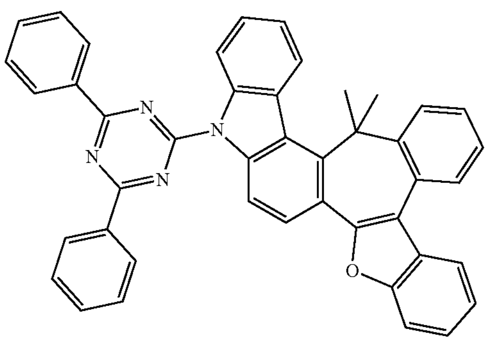
2-223
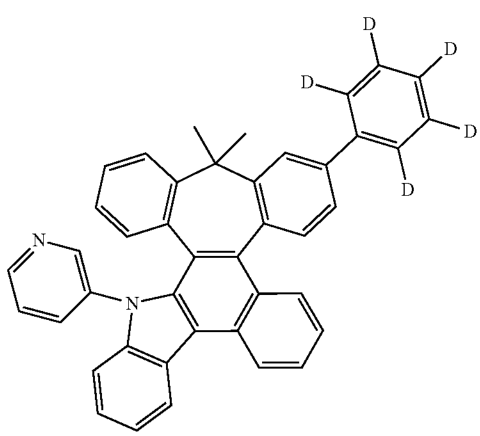
2-224
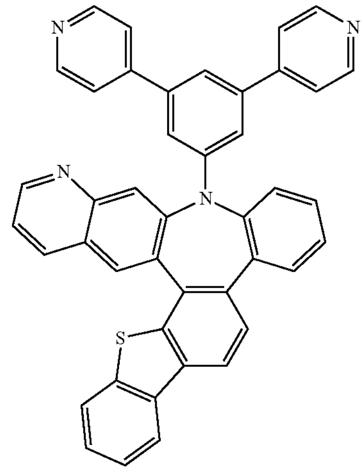
2-225
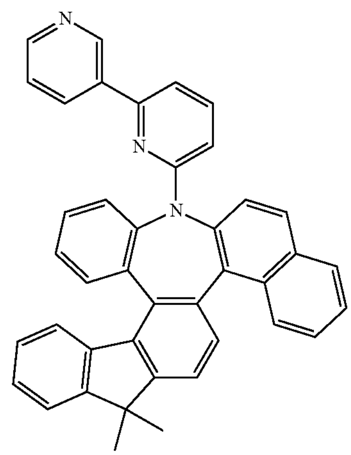
2-226
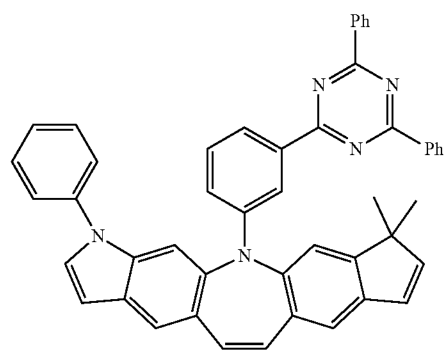
2-227
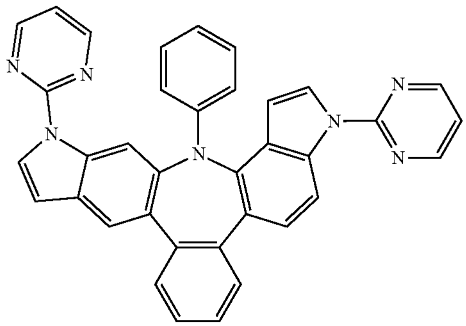

-continued
2-228
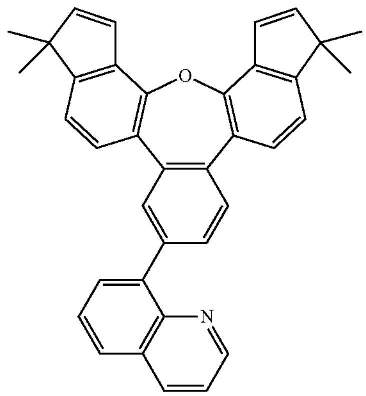
2-229
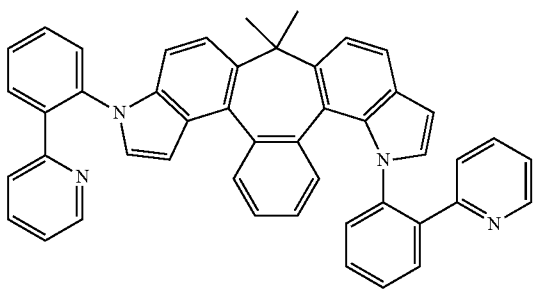
2-230
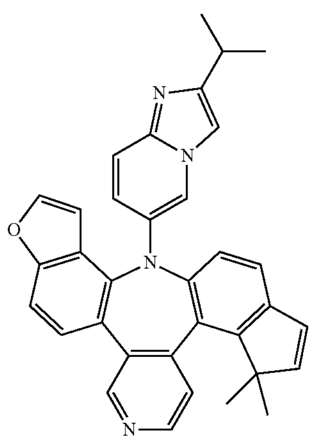
2-231
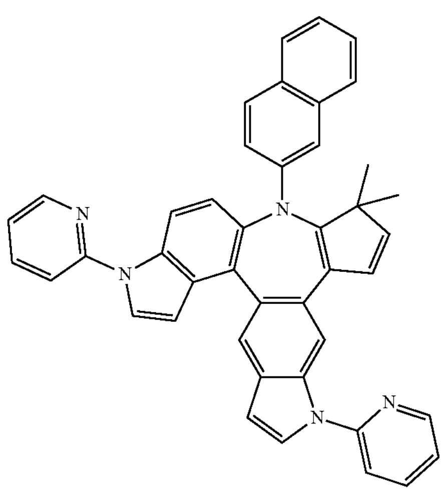
-continued
2-232
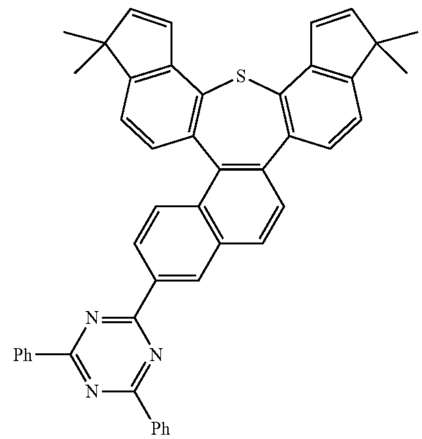
2-233
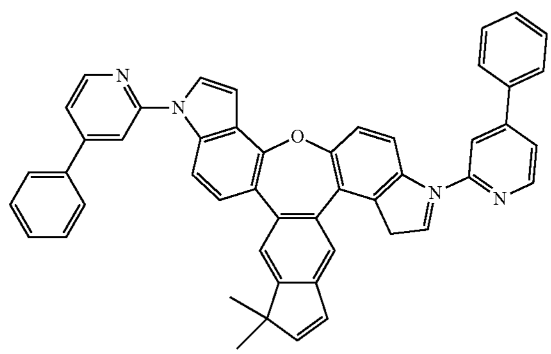
2-234
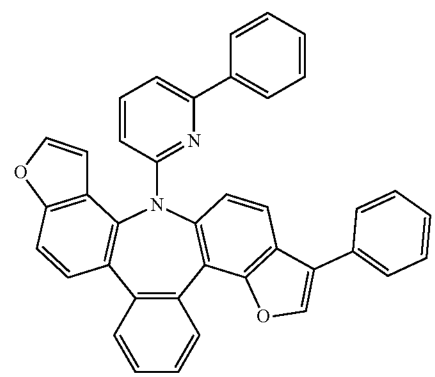
2-235
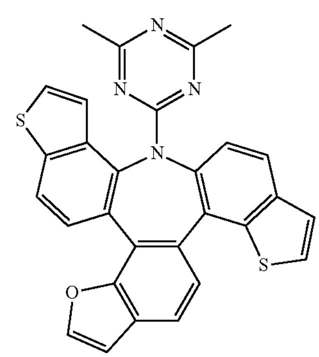

-continued
2-236
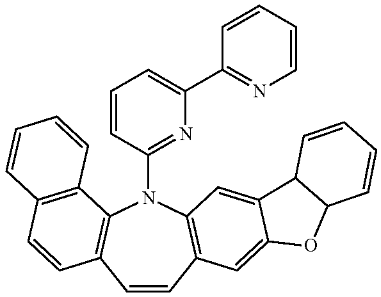
2-237
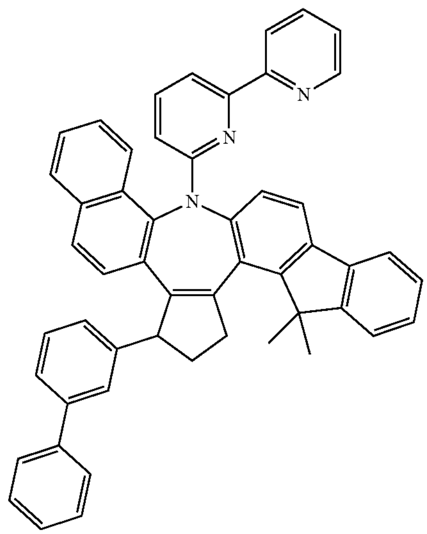
2-238
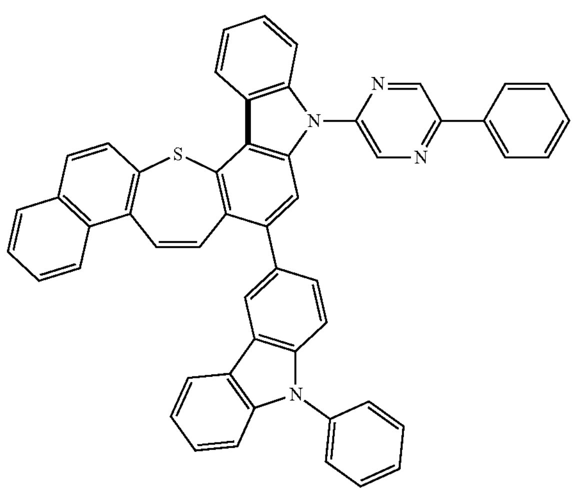
-continued
2-239
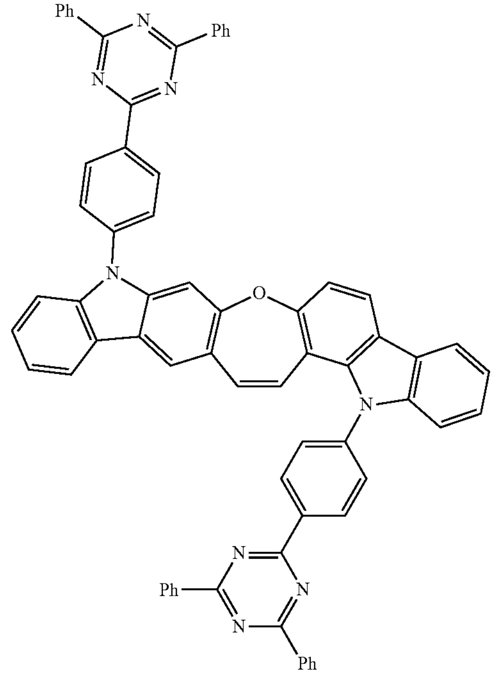
2-240
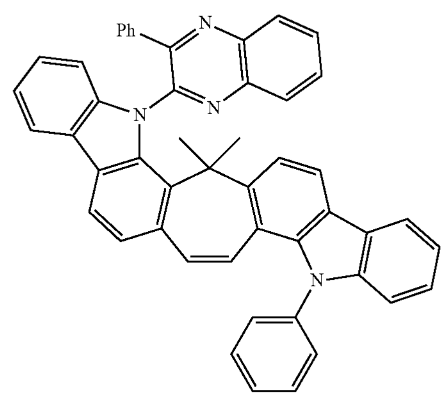
2-241
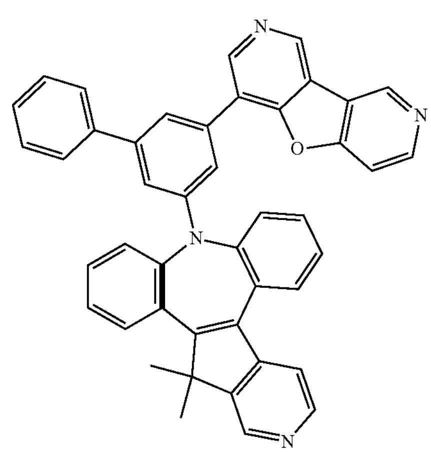

-continued
2-242
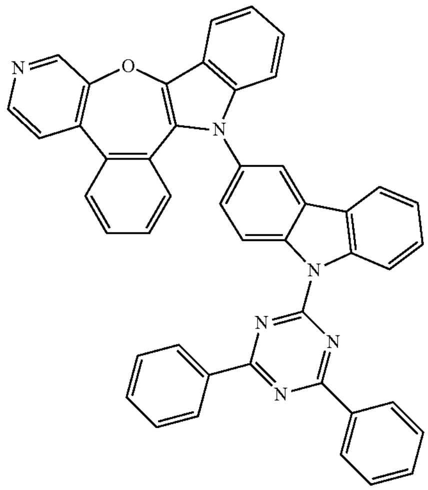
2-243
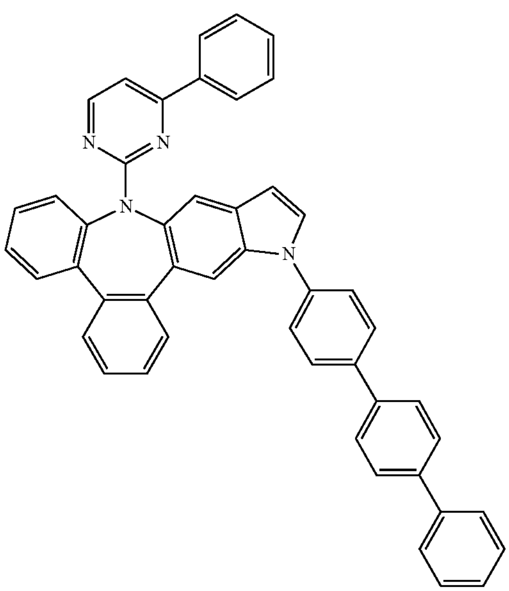
2-244
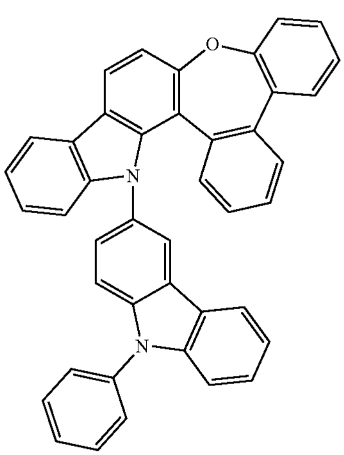
-continued
2-245
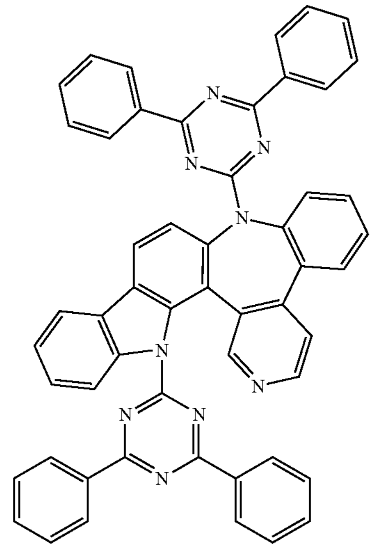
2-246
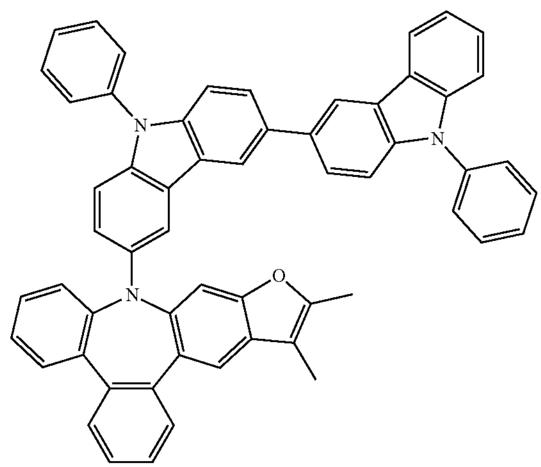
2-247
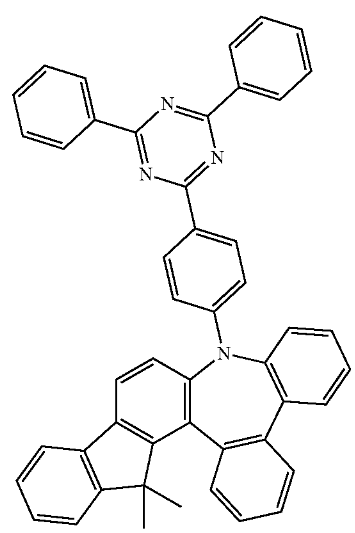

-continued
2-248
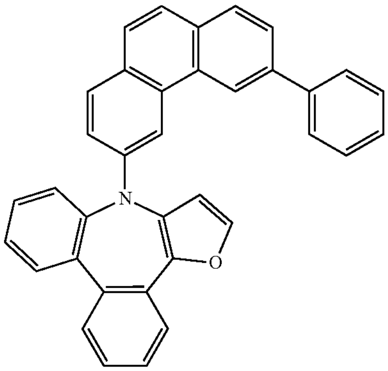
2-249
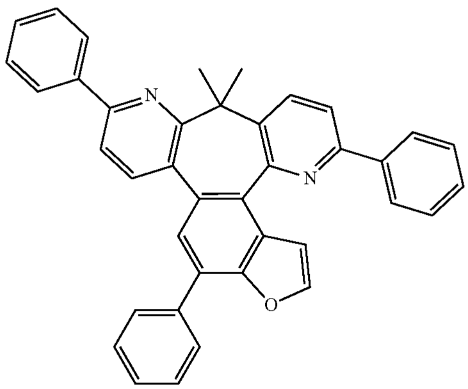
2-250
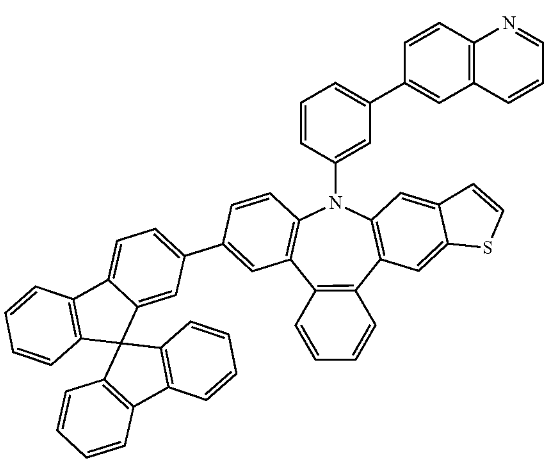
2-251
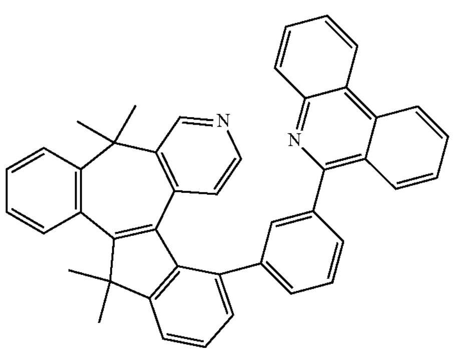
-continued
2-252
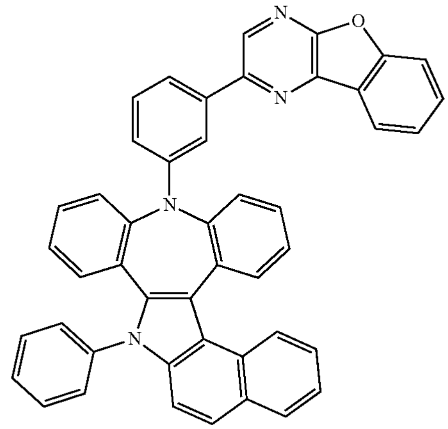
2-253
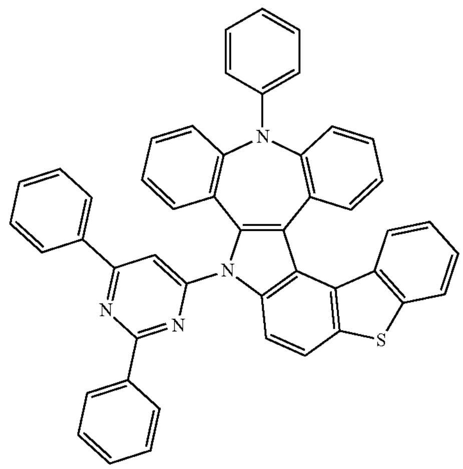
2-254
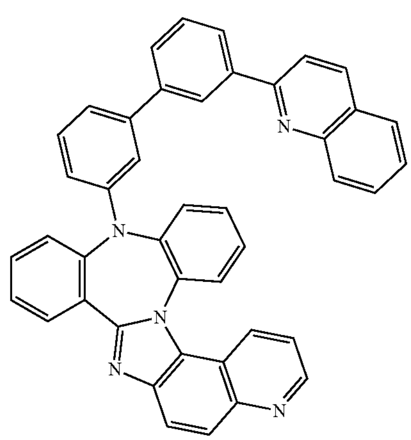

2-255
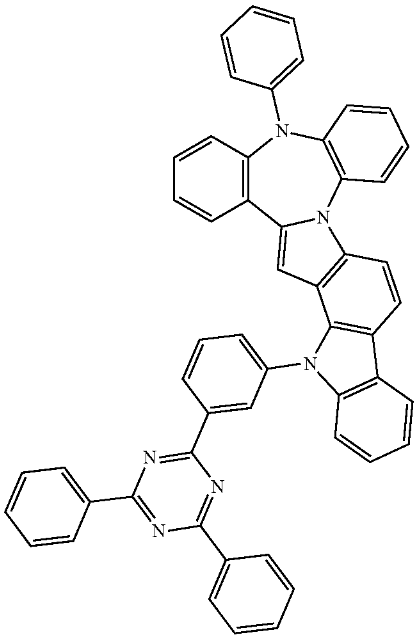
2-256
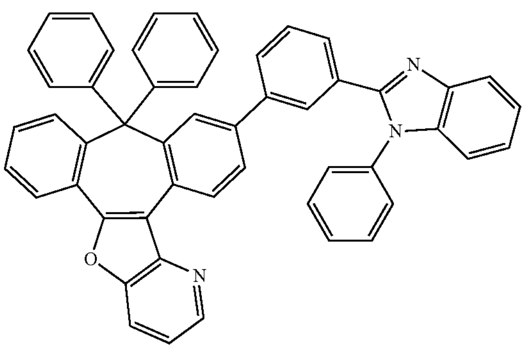
2-257
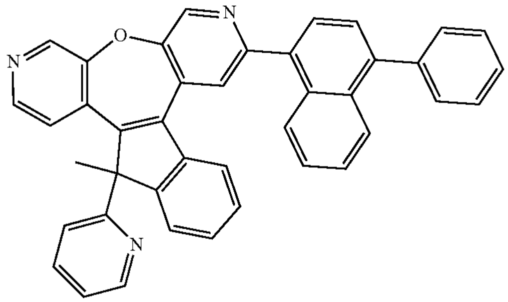
2-258
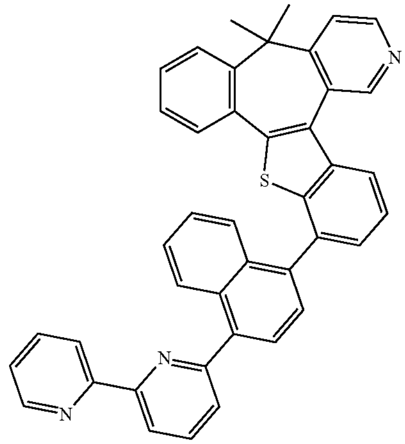
2-259
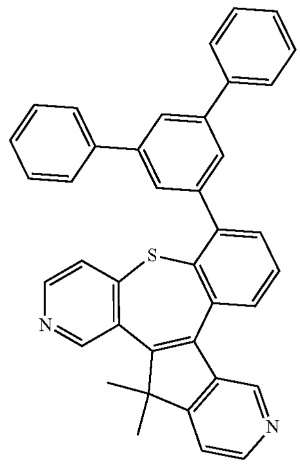
2-260
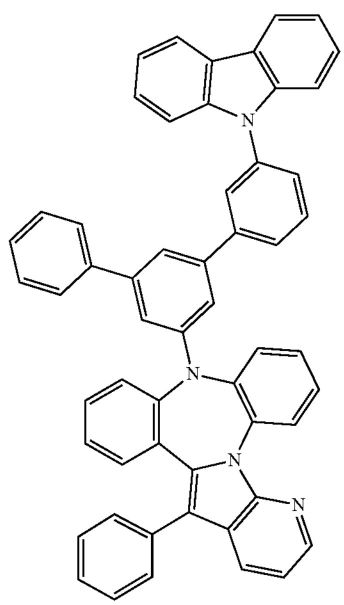

-continued
2-261
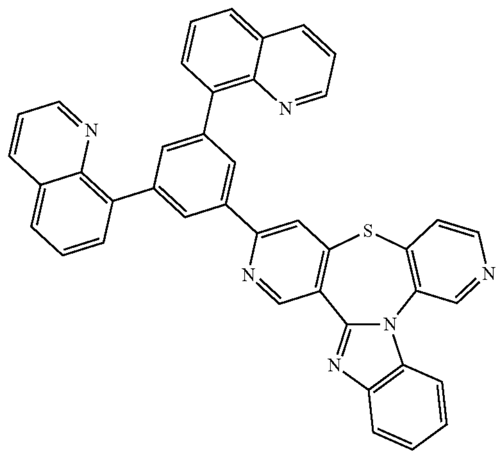
or
2-262
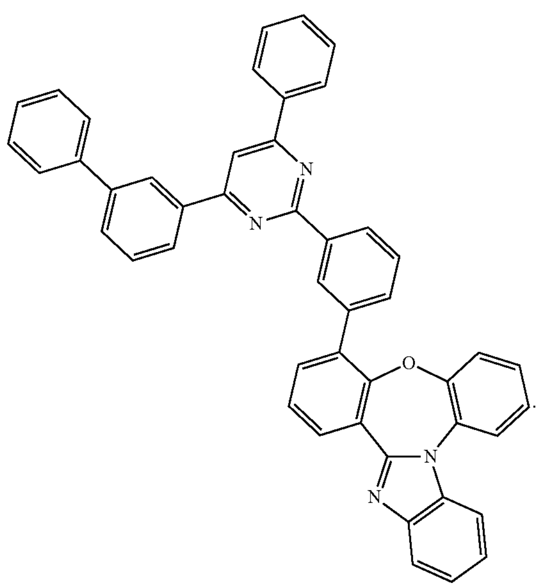
* * * * *